US005481470A

United States Patent [19]

Snead et al.

[11] Patent Number: 5,481,470

[45] Date of Patent: Jan. 2, 1996

[54] BOOLEAN LAYER COMPARISON SLICE

[75] Inventors: David E. Snead, Canyon Country; Dennis R. Smalley, Baldwin Park; Adam L. Cohen, Los Angeles; Joseph W. Allison, Valencia; Thomas J. Vorgitch, Simi Valley; Thomas P. Chen, Saugus, all of Calif.

[73] Assignee: 3D Systems, Inc., Valencia, Calif.

[21] Appl. No.: 259,333

[22] Filed: Jun. 13, 1994

Related U.S. Application Data

[63] Continuation of Ser. No. 606,191, Oct. 30, 1990, Pat. No. 5,321,622, which is a continuation-in-part of Ser. No. 331,644, Mar. 31, 1989, Pat. No. 5,184,307, which is a continuation of Ser. No. 269,801, Nov. 8, 1988, abandoned, which is a continuation-in-part of Ser. No. 182,830, Apr. 18, 1988, Pat. No. 5,059,359.

[51] Int. Cl.[6] .............................. G06F 17/50; G06F 19/00

[52] U.S. Cl. .............................................. 364/468; 395/119

[58] Field of Search ................................ 364/474.24, 476, 364/468, 512, 474.05, 413.13, 413.14, 413.15, 413.19; 264/22, 25, 40.1, 308, 250, 255; 425/174.4, 135, 150; 156/58, 273.3; 395/119, 120, 123, 155, 161

[56] References Cited

U.S. PATENT DOCUMENTS

| | | | |
|---|---|---|---|
| 4,785,399 | 11/1988 | Evans et al. | 364/512 X |
| 4,938,816 | 7/1990 | Beaman et al. | 264/22 X |
| 5,031,120 | 7/1991 | Pomerantz et al. | 364/474.24 X |
| 5,059,359 | 10/1991 | Hull | 364/476 X |
| 5,076,869 | 12/1991 | Bourell et al. | 264/125 X |
| 5,137,662 | 8/1992 | Hull | 364/476 X |
| 5,184,307 | 2/1993 | Hull | 364/474.24 |
| 5,321,622 | 6/1994 | Snead et al. | 364/474.24 |
| 5,345,391 | 9/1994 | Hull | 364/474.24 |

*Primary Examiner*—Joseph Ruggiero
*Attorney, Agent, or Firm*—Lyon & Lyon

[57] ABSTRACT

A method of and apparatus for slicing a three-dimensional object representation into a plurality of layer representations is described, wherein the layer representations are subsequently used to form the object layer-by-layer according to the principles of stereolithography. If not already provided in the object representation, a plurality of layer boundary representations are first formed, and then the boolean difference of successive layer boundary representations are computed to derive boundaries of up and down-facing regions, enabling different cure parameters to be specified for these different regions.

27 Claims, 31 Drawing Sheets

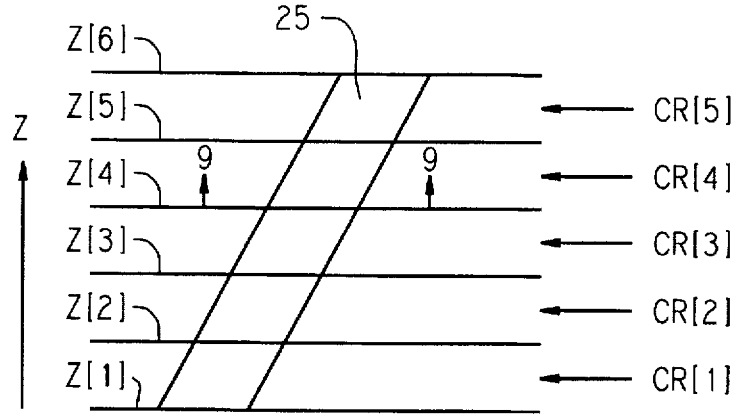
FIG. 6
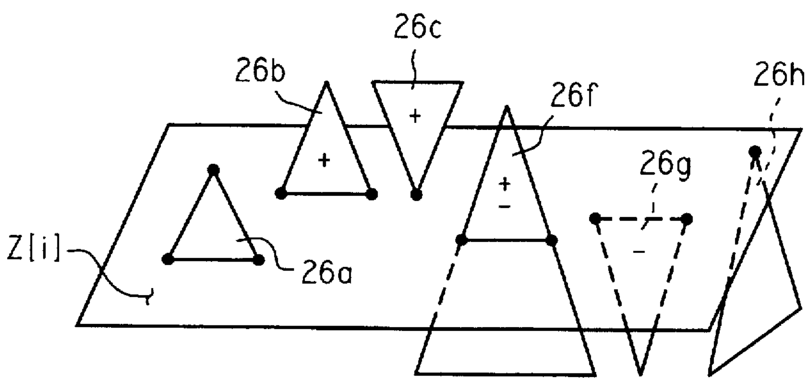
FIG. 7
FIG. 8
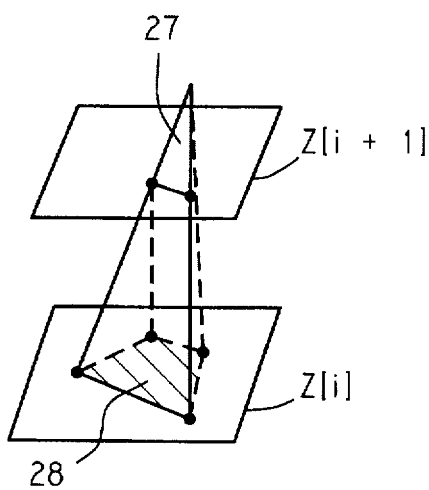

FIG. 25a
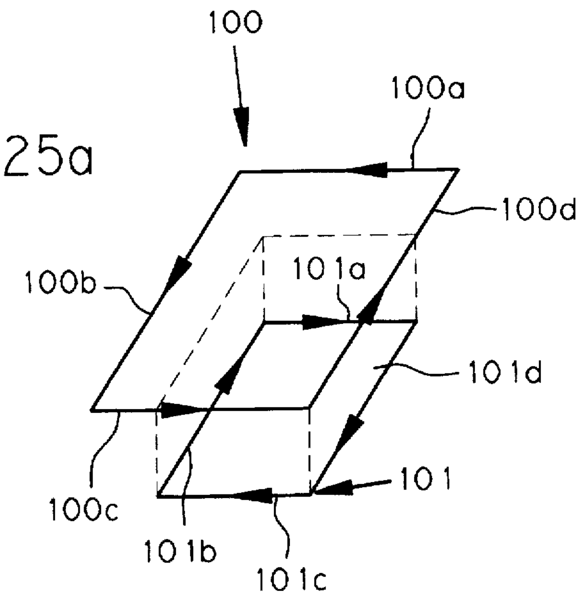
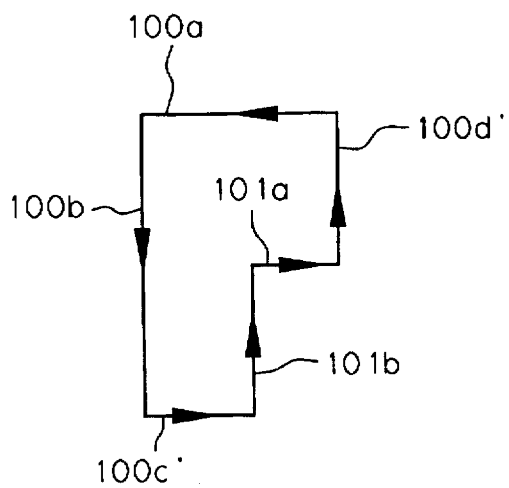
FIG. 25c
FIG. 25b
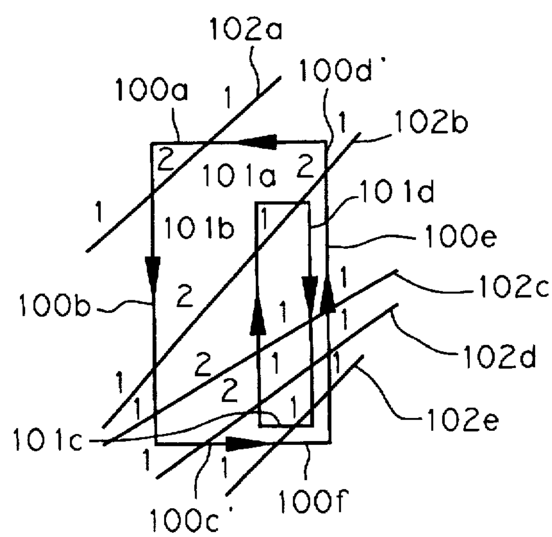

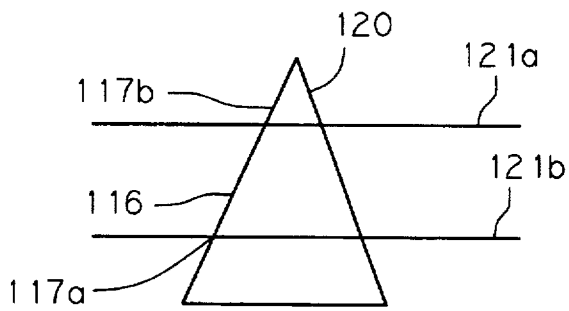
FIG. 28a
FIG. 28b
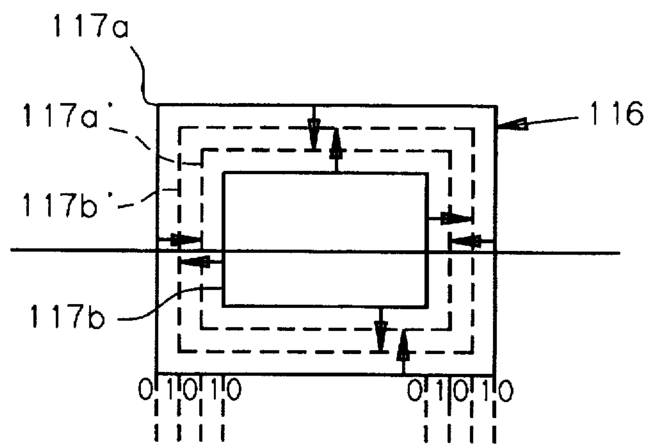
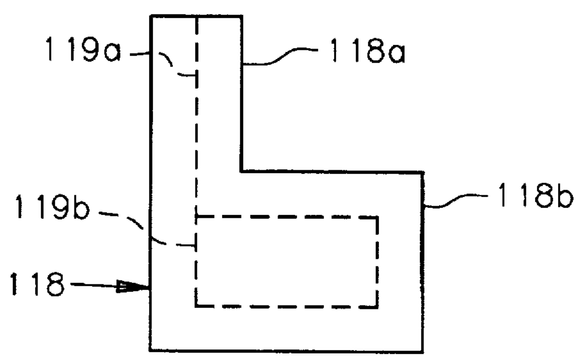
FIG. 28c

| | |
|---|---|
| FIG. 31a | FIG. 31b |
| FIG. 31c | FIG. 31d |

BOOLEAN LAYER COMPARISON SLICE

This application is a continuation of U.S. patent application Ser. No. 07/606,191 filed Oct. 30, 1990 and now U.S. Pat. No. 5,321,622, which is a continuation-in-part of U.S. patent application Ser. No. 07/331,644 filed Mar. 31, 1989 and now U.S. Pat. No. 5,184,307, which is a continuation of U.S. patent application Ser. No. 07/269,801 filed Nov. 8, 1988 and thereafter abandoned, which is a continuation-in-part of U.S. patent application Ser. No. 07/182,830 filed Apr. 18, 1988 and now U.S. Pat. No. 5,059,359.

APPENDICES

The following two appendices are affixed to this application and are hereby fully incorporated by reference herein as though set forth in full:

Appendix A: A User's Manual for SLICE Version 46

Appendix B: A Software Source Code Listing for SLICE Version 47, comprising the following software modules: S0.C, S1.C, S2.C, S3.C, S4.C, S5.C, S6.C, S.H, SCHIRIS.MAK, and SMAKE.

BACKGROUND OF THE INVENTION

I. Field of the Invention

This invention relates generally to the slicing of a three-dimensional object representation into layer representations for subsequent use in the stepwise layer-by-layer formation of the three-dimensional object through application of the principles of stereolithography, and more specifically, to the slicing of the object representation into the layer representations utilizing boolean comparisons between the borders of successive layers.

II. Background of the Invention

Several building techniques have recently become available for building three-dimensional objects in layers. One such technique is stereolithography, which is described in U.S. Pat. Nos. 4,575,330 and 4,929,402 (hereinafter the '330 and the '402 patents), the disclosures of which are hereby fully incorporated by reference herein as though set forth in full. According to the principles of stereolithography, a three-dimensional object is formed layer-by-layer in a stepwise fashion out of a material capable of physical transformation upon exposure to synergistic stimulation. In one embodiment of stereolithography, layers of untransformed material such as liquid photopolymer or the like are successively formed at the working surface of a volume of the liquid photopolymer contained in a container. The untransformed layers are successively formed over untransformed material and previously-transformed material. The process of forming these untransformed layers is known as a recoating step, and is described in detail in Ser. No. 515,479, now U.S. Pat. No. 5,174,931.

These layers are then selectively exposed to the synergistic stimulation to form successive object cross-sections. Moreover, upon transformation into the object cross-sections, the transformed material typically adheres to the previously-formed cross-sections through the natural adhesive properties of the photopolymer upon solidification. Additional details about stereolithography are available in the following co-pending U.S. patent applications, all of which, including appendices, are hereby fully incorporated by reference herein as though set forth in full:

| Application Serial No. | Filing Date | Inventor(s) | Status |
|---|---|---|---|
| 07/182,830 | Apr. 18, 1988 | Hull et al. | U.S. Pat. No. 5,059,359 |
| 07/183,016 | Apr. 18, 1988 | Modrek | U.S. Pat. No. 4,996,010 |
| 07/182,801 | Apr. 18, 1988 | Hull, et al. | U.S. Pat. No. 4,999,143 |
| 07/183,015 | Apr. 18, 1988 | Smalley | U.S. Pat. No. 5,015,424 |
| 07/268,429 | Nov. 8, 1988 | Modrek et al. | U.S. Pat. No. 5,076,974 |
| 07/268,816 | Nov. 8, 1988 | Spence | U.S. Pat. No. 5,058,988 |
| 07/268,837 | Nov. 8, 1988 | Spence et al. | U.S. Pat. No. 5,123,734 |
| 07/268,907 | Nov. 8, 1988 | Spence et al. | U.S. Pat. No. 5,059,021 |
| 07/331,644 | Mar. 31, 1989 | Hull et al. | U.S. Pat. No. 5,184,307 |
| 07/339,246 | Apr. 7, 1989 | Hull et al. | U.S. Pat. No. 5,104,592 |
| 07/365,444 | Jun. 12, 1989 | Leyden et al. | U.S. Pat. No. 5,143,663 |
| 07/414,200 | Sept. 28, 1989 | Hull et al. | Pending |
| 07/415,168 | Sept. 29, 1989 | Hull et al. | Abandoned |
| 07/429,911 | Oct. 27, 1989 | Spence et al. | Allowed |
| 07/427,885 | Oct. 27, 1989 | Spence et al. | U.S. Pat. No. 5,133,987 |
| 07/428,492 | Oct. 27, 1989 | Vorgitch et al. | Abandoned |
| 07/429,435 | Oct. 30, 1989 | Smalley et al. | U.S. Pat. No. 5,130,064 |
| 07/495,791 | Mar. 19, 1990 | Jacobs et al. | Abandoned |
| 07/515,479 | Apr. 27, 1990 | Almquist et al. | U.S. Pat. No. 5,174,931 |
| 07/545,517 | Jun. 28, 1990 | Cohen | U.S. Pat. No. 5,096,530 |
| 07/566,527 | Aug. 13, 1990 | Jacobs et al. | Abandoned. |

Additional details of stereolithography are also available in two related applications which are being filed concurrently herewith. The disclosures of these two additional applications are hereby fully incorporated by reference herein as though set forth in full.

The first of these concurrently-filed applications is U.S. patent application Ser. No. 07/606,802, now U.S. Pat. No. 5,192,469, entitled "Simultaneous Multiple Layer Curing for Forming Three-Dimensional Objects," filed by Smalley et al. This application describes methods of building high resolution objects from traditionally low-resolution combinations of building materials and synergistic stimulation, which combinations result in a minimum effective cure depth which is typically too deep to form the thin layers required for high resolution objects. This objective is accomplished by delaying the exposure of those areas on a particular cross-section that would negatively impact resolution if those areas were immediately cured upon formation of the cross-section. Resolution may be negatively impacted, for example, if, because of the cure depth involved, material below this cross-section is inadvertently cured upon exposure of these areas. Therefore, to preserve resolution, exposure of these areas is delayed, and corresponding areas which are above these areas on higher cross-sections are instead subsequently exposed, after a delay if necessary, which higher cross-sections are chosen such that the cure depth is deep enough to cure the desired areas without inadvertently curing material on lower cross-sections.

The second of these concurrently-filed applications is U.S. patent application Ser. No. 07/605,979, now U.S. Pat. No. 5,209,878, entitled "Improved Surface Resolution in Three-Dimensional Objects by Inclusion of Thin Fill Layers," filed by Smalley et al. This application describes methods for forming high resolution objects by filling the surface discontinuities inherent in three-dimensional objects formed from stereolithography with thin fill layers.

Other embodiments of stereolithography employ materials besides photopolymers such as powdered materials, thermoplastics, dry film photoresists, non-reactive preformed films or sheets, all of which share the common characteristics that they are capable of physical transformation upon exposure to an appropriate form of synergistic stimulation. Moreover, a variety of types of synergistic stimulation are possible, other than UV radiation from a laser, including infrared or $CO_2$ laser radiation, visible radiation, particle beam radiation, reactive chemical agents dispensed from ink jet type printing heads (e.g., binders and initiators) and the like. In addition, various means for selectively exposing the untransformed layers of material are possible, including rotatable scanning mirrors or the like for directing a beam of the synergistic stimulation to trace out the shape of the object layers on the untransformed layers, means such as a mask for selectively applying flood exposure to the untransformed layers, means such as a light valve, imaging system or the like, and xy tables for translating a dispenser for chemical synergistic stimulation or the like.

Various means of performing the recoating process are possible. The '330 patent describes the use of a platform coupled to a Z-stage elevator to overdip a previously-formed layer beyond the working surface as an expeditious means to perform recoating. U.S. Pat. No. 5,174,931 describes the use of a doctor blade to speed up the recoating process. U.S. patent application Ser. No. 07/495,791, abandoned, describes the use of vibrational forces to speed up the recoating process. Additional approaches, which are possible, include dispensing pre-formed sheets or films over a previously-formed layer from a roll or cartridge dispenser. Also, various means of moving the partially-formed part relative to the working surface, besides a platform coupled to a Z-stage elevator, are possible, including means for adding or extracting material from the container, or means for moving the container relative to the partially-formed part. Also, various other means of adhering the layers together, besides the natural adhesive properties of the material being used, are also possible, including pressure or heat sensitive adhesives or the like.

As can be seen from the above description, a wide variety of embodiments are included within the term "stereolithography," all having the common characteristic of being capable of forming a three-dimensional object in a step-wise layer-by-layer fashion.

As described in U.S. Pat. No. 5,184,307, a stereolithography system will typically form a three-dimensional object in accordance with a corresponding object representation, which representation may be formed in a CAD system or the like. Before such a representation can be used, however, as described in U.S. Pat. No. 5,184,307, it must be sliced into a plurality of layer representations. The stereolithography system will then, in the course of building up the object in a stepwise layer-by-layer manner, selectively expose the untransformed layers of material in accordance with the layer representations to form the object layers, and thus, the object itself.

Previous methods of forming the layer representations suffered from a number of disadvantages, however.

First, these methods typically do not make direct use of an object representation generated from a CAD system. Instead, these methods typically require that the object representation be placed into an intermediate format, i.e., a tesselated triangle format, before being useful to the stereolithography system. Because of this limitation, these methods do not have wide applicability, and can only be used with those CAD systems which have the capability of formatting the object representation appropriately. As a result, they are not presently capable of directly utilizing object representations such as CAT scans or the like, which may originate from systems presently incapable of formatting the object representations into the required format.

A second problem with these methods is that they typically assume, in furtherance of achieving computational simplicity, that all portions of a layer will overlap, and therefore, adhere to a previous layer. Therefore, because it is advantageous to slightly overcure these overlapping areas by about 6 mils beyond the specified layer thickness, these methods will overcure all portions of a layer, even those portions that do not overlap previous layers, such as down-facing regions. The result is that part accuracy, and part aesthetics, are negatively impacted, especially at the down-facing regions.

A third problem with these methods is that they are typically inflexible, being capable of specifying either an oversized object or an undersized object, but not both.[1/] However, for certain objects, only one of these techniques will be possible. For example, for a complex object, it may be impossible to sand certain, inaccessible areas, so that the undersized technique is the only reasonable one. Therefore, for these objects, past methods have not provided necessary flexibility.

[1/] As explained in U.S. Pat. No. 5,184,307, building an oversized or an undersized object enables the surface discontinuities inherent to stereolithography to be smoothed out in a subsequent post-processing step.

A fourth problem with these methods is that they sometimes introduce a vertical registration problem into a part. As explained in U.S. Pat. No. 5,184,307, in furtherance of the interest of computational simplicity, these methods generally create the borders of each layer representation at a vertical position slightly offset from the rest of the layer representation.[2/] By doing so, each object layer, once built, will be offset one layer thickness downwards from the corresponding object representation. That is, it will not be correctly vertically registered with the part. Normally, this misregistration will not be a problem if the layer thickness for all object layers is the same, since all object layers will be shifted downwards by the same amount. However, if two object representations are sliced with two different layer thicknesses and then merged and built simultaneously, then each individual object will be vertically shifted downwards by a different amount causing these individual objects to become incorrectly vertically registered relative to each other.

[2/] This ensures that the correct number of layer representations are formed. If the borders were to be created at the same vertical level as the rest of the layer, then one too many layer representations would generally be formed.

This problem can be explained more fully with the aid of FIGS. 1*a*–1*b*. FIG. 1*a* shows object representation 1*a*, and leg representations 1*b* and 1*c*. It is assumed that the object representation will be sliced at a smaller layer thickness than the layer thickness used to slice the legs.

FIG. 1*a* also shows the object and leg representations being sliced by slicing layers 2*a*–2*g* into object layer representations 3*a*–3*f*. The number of object layer representations is (correctly) one less than the number of slicing layers.

As mentioned earlier, the object layers formed from each layer representation will be displaced one layer thickness downwards from the corresponding layer representation. FIG. 1*b* shows object (and leg) layers 3*a*'–3*f*, each of which is offset one layer thickness downwards from the corresponding layer representations 3*a*–3*f* shown in FIG. 1*a*.

As indicated, layers 3*e*' and 3*f* have been moved downwards farther than layers 3a'–3d', with the result that these layers are no longer in physical contact with each other. This exemplifies the vertical misregistration problem referred to above.

A fifth problem with these methods is that they do not always generate near-flat skins (described in U.S. Pat. No. 5,184,307) in those instances where they would improve surface resolution. Instead, these methods typically only generate near-flat skins to avoid material leakage, with the result that these methods sometimes avoid creating near-flat skins which could contribute to part accuracy.

This problem can be illustrated with the aid of FIG. 2, which shows an envelope 4 of an object representation, cross-sectional outline 5a of a first object layer, and cross-sectional outline 5b of a second underlying object layer.

As indicated, there is a gap 8 between the layers which could allow leakage of untransformed material unless the gap were to be plugged with near-flat skin.

The decision whether to generate near-flat skin will be based on a comparison between normal 6, the vertical axis 7, the angle between the normal 6 and the vertical axis 7, and the minimum surface angle ("MSA").[3/] If this angle is less than the minimum surface angle, then near-flat skins will be generated to close the gap.

[3/] The MSA is the minimum angle between normal 6 and the vertical 7 which will guarantee that the cross-sections 5a and 5b will touch, closing gap 8, and preventing material from leaking out of the gap.

Therefore, in the usual case, near-flat skins will not be generated when the cross-sections 5a and 5b are touching, as shown in FIG. 3. However, even in this instance, the addition of near-flat skins would still provide a surface which more appropriately represents the object representation 4, thereby ensuring appropriate formation of an oversized or undersized object.

A sixth problem with these methods is that it is difficult to utilize techniques for achieving enhanced surface resolution, including simultaneous multiple layer transformation, as described in U.S. Pat. No. 5,192,469 filed concurrently herewith, or generation of extra fill layers, as described in U.S. Pat. No. 5,209,878, also filed concurrently herewith, with these methods. This is because the methods and techniques in these referenced applications inherently involve the comparison of cross-sectional information between two or more layers. Without a generalized layer comparison capability, the required comparisons (for the referenced applications) must be separately developed for each particular case and for each particular operation that will be performed.

A seventh problem with the vector-based implementations of these methods is that they typically overcure intersection points between border vectors describing the borders of the layers, and hatch or skin vectors describing the interior portions of the layers. Because of this overcuring, a significant distortion may be introduced at the intersection points, both because the cure depth of these points will be too deep, but also since the cure width, which increases proportionally to the cure depth, will also be too large.

Therefore, it is an object of the present invention to provide a slicing apparatus and method which is less dependent on a particular input format, and which is therefore compatible with a wider range of systems generating object representations, including CAT scan systems or the like, or CAD systems which do not necessarily provide the tesselated triangular format.

It is a further object to provide a slicing apparatus and method which distinguishes more fully between down-facing regions and the remaining areas encompassed by the layer borders, so that the overcure of the down-facing regions can be prevented.

It is a further object to provide a slicing apparatus and method which generates layer borders from portions of the object representation which are not vertically offset from those portions used to generate the interior portions of the layers.

A further object is to provide a slicing apparatus and method which is more flexible in switching between providing oversized, undersized, and average-sized parts, as well as other sizing schemes.

A further object is to provide a slicing apparatus and method which reduces or eliminates the vertical registration problem.

A further object is to provide a slicing apparatus and method which generally produces near-flat skins when they would improve the surface resolution of the object.

A further object is to provide a slicing apparatus and method which is more compatible with additional processes for improving surface resolution, including simultaneous multiple layer transformation, and the generation of thin fill layers.

A further object is to provide a slicing apparatus and method which retracts skin and/or hatch vectors from intersection points with border vectors, thereby reducing unintended overexposure of material at the intersection points.

Additional objects and advantages will be set forth in the description which follows or will be apparent to those of ordinary skill in the art who practice the invention.

SUMMARY OF THE INVENTION

To achieve the foregoing objects, and in accordance with the purpose of the invention as embodied and broadly described herein, there is provided an apparatus for and methods of slicing a three-dimensional object representation into a plurality of layer representations, comprising the steps of: overlaying the object representation with a plurality of slicing planes spaced along a slicing dimension, wherein any two successive slicing planes of the plurality bounds a layer of the object representation, the bounded layers also being successively spaced along the slicing dimension; associating each bounded layer of the object representation with the two successive slicing planes bounding the layer, the two successive planes comprising first and second slicing planes, the first slicing plane being situated lower along the slicing dimension than the second slicing plane; forming intersection segments for each bounded layer of the object representation comprising intersections between the object representation and a first selected one of the first and second slicing planes bounding the layer; forming projection segments for each bounded layer of the object representation comprising projections, onto a second selected one of the first and second slicing planes bounding the layer, of intersections between the object representation and a third selected one of the first and second slicing planes bounding the layer, which is different from the second selected one; forming a layer boundary representation for each bounded layer of the object representation comprising a boolean union of the intersection segments and the projection segments for that bounded layer; and introducing the layer boundary representation for each bounded layer into the layer representation for that layer.

BRIEF DESCRIPTION OF THE DRAWINGS

FIG. 6 illustrates the correspondence between slicing planes and cross-sections.

FIG. 7 illustrates the classification of triangles;

FIG. 8 illustrates the generation of projection regions;

FIGS. 25a–25c illustrate the implementation of the boolean differencing operation;

FIGS. 28a–28c illustrate the generation of phantom borders for skin retraction;

DESCRIPTION OF THE PREFERRED EMBODIMENTS

An overview of a first embodiment of the subject invention will now be provided. This embodiment normally builds oversized parts, but provides the capability of rapidly and flexibly building undersized parts, or average-sized parts. Moreover, this embodiment still requires that the object representation be converted into the intermediate format of tesselated triangles. However, as will be seen in the following discussions, this embodiment is still much less dependent on the triangular representation than previous slicing methods, enabling it to be used with other data formats with simple modifications. These simple modifications will also be pointed out in the following description. Also, if a tesselated triangle representation is input to this embodiment of the invention, this embodiment will round all triangle vertices to slicing layers. Rounding of triangle vertices is described in U.S. Pat. No. 5,184,307. Rounding of triangle vertices may appear, at first glance, to actually introduce distortion, and therefore, not be a desirable option. However, more thorough consideration reveals that this rounding actually preserves object features which would otherwise be lost by the slicing process. Therefore, since the enhancement to object resolution resulting from preserving object features is believed to outweigh the detrimental impact that rounding may have on resolution, rounding of vertices is performed in this embodiment.

Alternative embodiments can use non-rounded vertices if appropriate care is taken to deal with cases where features terminate between layers.

Figure 4A:
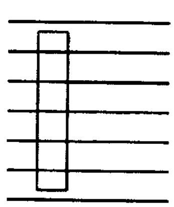
FIGS. 4a–4d illustrates how rounding of vertices can improve resolution.
Figure 4B:
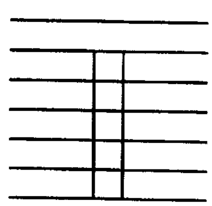

The loss of object features in the absence of rounding can be illustrated with the aid of FIGS. 4a–4d. FIG. 4a illustrates an object representation which is not rounded prior to slicing, and FIG. 4b illustrates the resultant object. As indicated, the resultant object is almost a full layer thickness shorter than the object representation, and is therefore significantly distorted.

Figure 4C:
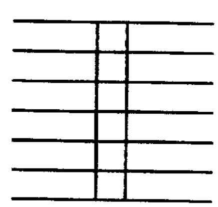
Figure 4D:
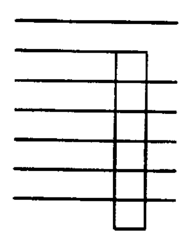

FIG. 4c, however, illustrates the object representation after rounding, and FIG. 4d illustrates the resultant object. A comparison of FIGS. 4a and 4d shows that the resultant object is only slightly larger than the object representation before rounding, and therefore, has higher accuracy.

Figures 5, 5A:
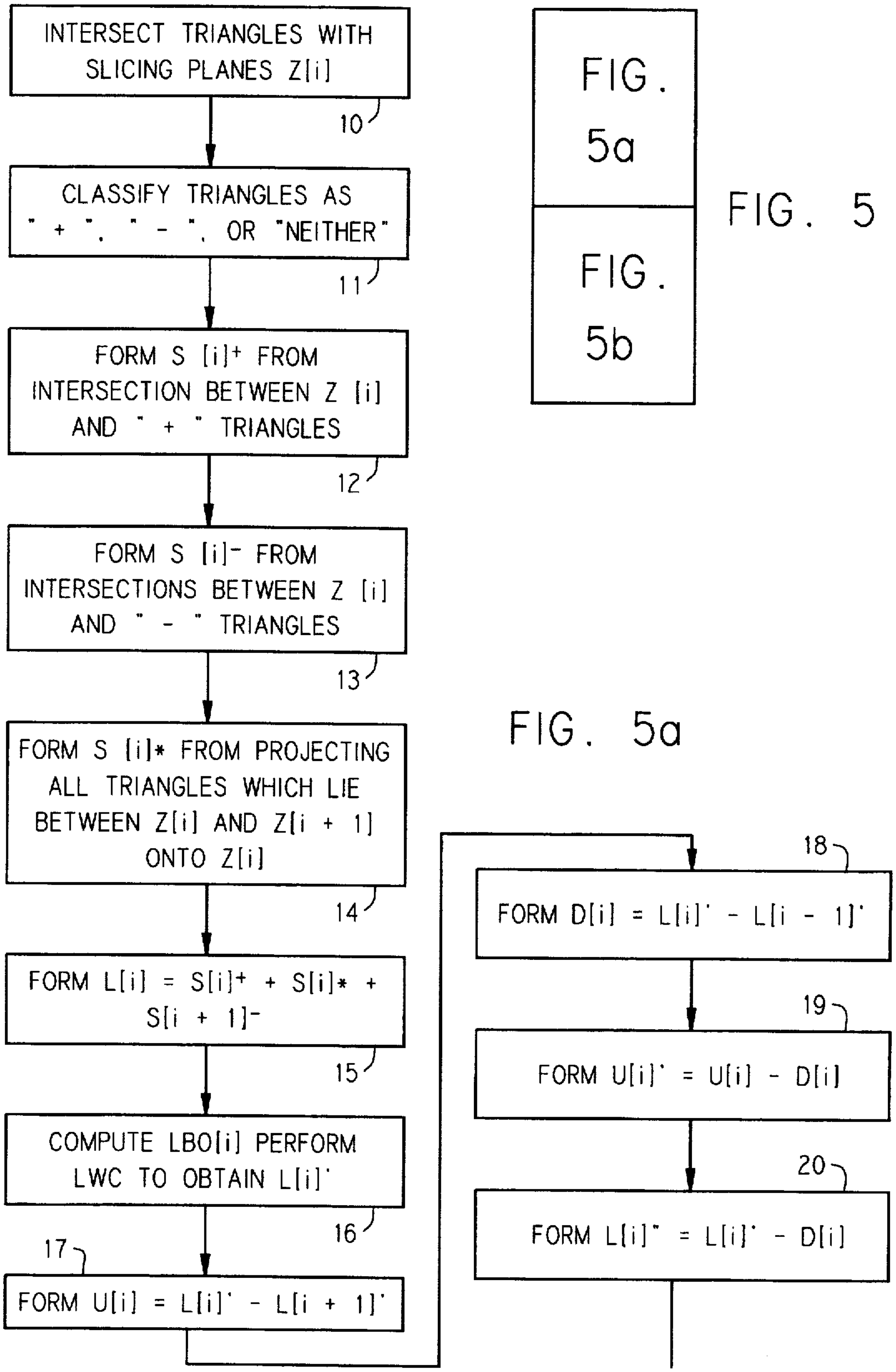
FIG. 5, comprising
FIGS. 5a–5b, is a flowchart of a first embodiment of the subject invention.

An overall flowchart for the method of the first embodiment is illustrated in FIG. 5. The first step is step 10, wherein the triangular representation is overlayed with a plurality of slicing layers z[i], spaced along a z-axis. This is conceptually shown in FIG. 6, which shows object representation 25 interlaced with slicing layers z[1]–z[6] spaced along the z-axis.

Turning back to FIG. 5, in step 11, each of the tesselated triangles of the object representation intersecting a slicing layer is then classified into "+" triangles, "– " triangles, or "neither" triangles. For a slicing plane z[i], "+" triangles are defined as those triangles which pass through the slicing plane, extending upwards, or which begin at the slicing plane, and extend upwards; "–" triangles are those triangles which pass through the slicing plane, extending downwards, or which end at the slicing plane and extend downwards; if a triangle is neither a "+" or a "–" triangle, it falls into the "neither" category. Many triangles are both "+" and "–" triangles.

Turning to FIG. 7, for example, triangles 26a–26h are shown, all of which intersect slicing plane z[i] at one or more points.

Triangle 26a will neither classify as a + or a − triangle, since it is entirely within the slicing plane and does not extend above or below it. It is therefore a "neither" triangle. Triangles 26b and 26c are both + triangles, since both begin at the slicing layer, at a line segment and a point, respectively, and extend upward. Triangle 26f is both a "+" and a "−" triangle since it fits the definition of both categories: it is a "+" triangle since it passes upward through the slicing plane (intersecting it at a line segment), and it is a "−" triangle since it also passes downward through the slicing plane. Triangles 26g and 26h are both "−" triangles since both end at the slicing plane, at a line segment and a point, respectively, and extend downward.

Turning back to FIG. 5, in step 12, for each slicing plane z[i], the method will form a border, known as S[i]+, from the intersections between the "+" triangles and the slicing plane. The process of forming a border from the intersections between triangles and planes, such as slicing planes (sometime known as slicing layers) and the like, is described in detail in U.S. Pat. No. 5,184,307.

In step 13, for each slicing plane z[i], the algorithm will also form a border, known as S[i]−, from the intersections between the "−" triangles and the slicing planes. Again, this process is described in detail in U.S. Pat. No. 5,184,307.

In step 14, for each slicing plane z[i], the algorithm will determine the projection of all triangle areas between z[i] and z[i+1] onto z[i]. The projection is defined as S[i]*. Turning to FIG. 8, this figure shows triangle 27, which is one of the triangles situated between slicing planes z[i] and z[i+1]. As shown, the projection of triangle 27 onto slicing plane z[i] is identified with reference numeral 28. Once the projections are determined, the boundaries of the projection will be determined in a manner analogous to the generation of near-flat boundaries described in detail in U.S. Pat. No. 5,184,307, which are also determined from triangular projections. These boundaries are also known as S[i]*.

Note that each object cross-section, CR[i], which is planned to be formed, corresponds with the data between two successive slicing planes z[i] and z[i+1]. This correspondence will guarantee that the correct number of cross-sections, which should equal the number of slicing planes minus one, are formed.

Figure 9:
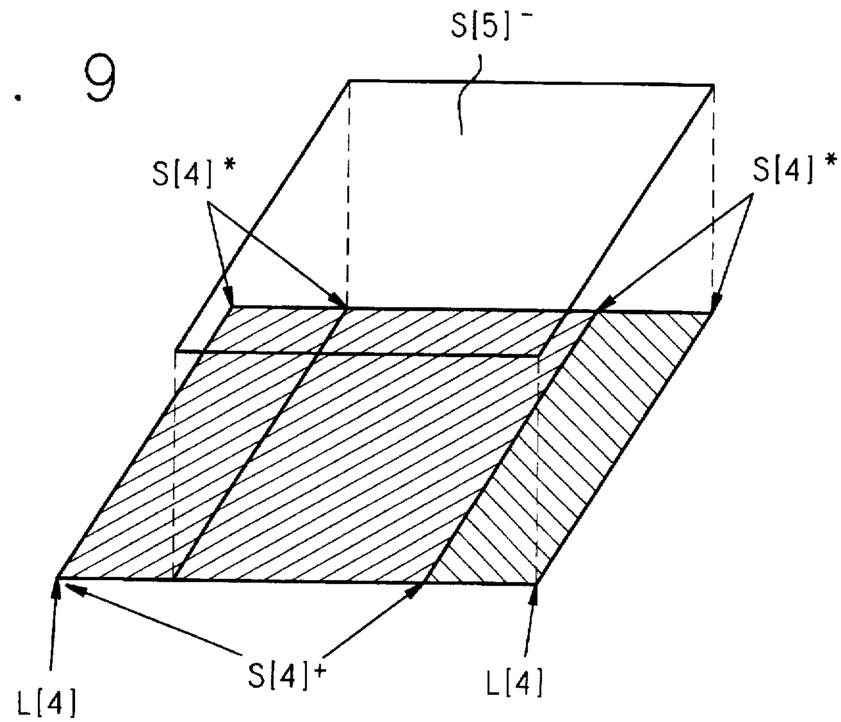
FIG. 9 illustrates the relationships between S[i]+, S[i]*, and S[i+1]–.

Turning back to FIG. 5, in step 15, for each cross-section, CR[i], layer boundary data, L[i], is formed, by taking the boolean union of S[i]+, S[i]*, and S[i+1]−. Turning to FIG. 9, which is a perspective view of plane 9—9 from FIG. 6, the generation of L[4] is shown. First, S[4]+, S[5]−, and S[4]* are generated, as shown, and then the union of these three areas is taken to determine L[4], as shown. If the above-described downshift is to be avoided, then the above data should be associated with CR[i+1] since it is used to form the portion of the object between z[i+1] and z[i].

It may seem that S[4]* is simply redundant to S[4]+ and S[5]− and therefore, is not necessary in order to form L[4]. However, in certain instances, this information is not redundant, and is required to form the layer boundaries. For example, in the case where the object 25 in FIG. 6 is tilted more radically, then there is a chance S[4]+ will not intersect S[5]− at all, so that the simple union of these two areas would be two separate non-connected regions. To avoid this occurrence, S[4]* is generated to act as a transition between S[4]+ and S[5]−, and ensure that the union of these areas will include any areas of the transition region.

Note that step 15 deliberately creates a layer boundary which is always oversized compared to the original object representation. In FIG. 9, for example, the most accurate representation of the object at slicing plane z[4] is actually S[4]+, which is smaller than L[4]. Therefore, the final object, once built, will be oversized compared to the object representation; but, as described in U.S. Pat. No. 5,184,307, this allows the object to be sanded down in a post-processing step in a way which eliminates the stairstep surface discontinuities inherent in an object formed through stereolithography. Therefore, the final object will closely approximate the original representation. The generation of undersized and average sized objects in this first embodiment will be described later on.

Turning back to FIG. 5, in step 16, line width compensation ("LWC") is performed, according to which the layer boundaries L[i], generated in step 15, are compensated for the finite cure width of the material after it transforms. Essentially, in this step, the layer boundaries are displaced inwards (towards the solid region which is being bounded) by about one-half of the cure width associated with the appropriate cure depth, so that when the beam of synergistic stimulation is directed to trace the object boundaries, and material at the boundary is transformed, the object will be the correct size. If LWC were not performed, the xy dimensions of the object would be oversized by about one cure width. LWC is explained in more detail further on. Performing LWC at this stage of processing implicitly assumes that the various types of boundaries that will be formed at later stages of the processing can all be adequately compensated by this single adjustment. Alternatively, it is possible to do additional compensating for one or more of the boundary types at a later stage. This additional compensation can be either of a positive or negative nature.

The amount of offset for the layer boundary is known as the layer boundary offset (LBO). The amount of offset is not simply one-half the beam width, but instead is one-half the cure width, which is the width of transformed material after exposure to the beam. In general, the cure width will be different from the beam width, since the cure width is dependent on cure depth, as explained in detail in U.S. Pat. No. 5,184,307. That is, as the cure depth increases, so does the cure width.

Therefore, the LBO may be different from layer to layer, since the layer thickness, and hence cure depth, may vary from layer to layer. The LBO for layer i is designated as LBO[i].

To determine the LBO for a particular layer, the desired layer thickness is first determined (determined from the difference between successive slice planes z[i] to z[i+1] or the like) and the overcure amount, typically 6 mils, is then added. The result is the expected cure depth for the layer. As described in U.S. Pat. No. 5,184,307, the overcure amount is the designated amount by which one layer is designated to penetrate into, and therefore overlap, the layer below it in order to ensure good adhesion between the layers. Once the cure depth for the layer has been determined, the program will then determine the estimated cure width based on the cure depth, and set the LBO to one-half that amount. Optionally, the down-facing regions, which will be later determined for layer i, can be given a slight negative compensation (their areas will grow) to compensate for any decrease in cure width due to a somewhat smaller cure depth.

To estimate the cure width, the plurality of previously determined data pairs may be utilized, each pair comprising an empirically measured cure depth and its corresponding cure width. As described in U.S. Pat. No. 5,184,307, these data pairs can be empirically determined from banjotops or the like. Assuming that the expected cure depth does not fall exactly on one of the cure depths in the data pairs, but instead falls between the cure depths in two successive data pairs, the cure width will be estimated simply by interpolating this value from the cure widths in the two successive data pairs. Alternatively, cure depths and widths can be determined from beam profile data and known properties of the building material.

Once the LBO has been determined, the layer boundaries are adjusted by this value. The compensated layer boundaries are designated as L[i]'.

In step 17, the process of generating up-facing boundaries for each layer is performed. As explained in U.S. Pat. No. 5,184,307, these are boundaries within the layer boundaries which encircle up-facing surfaces that happen to fall on that layer. To begin the process for each layer, the boolean subtraction between that layer and a successive higher layer is performed, which essentially determines the area on the layer which is not overlapped by the successive higher layer. The non-overlapping areas are designated as U[i].

To perform the boolean subtraction, utilization is made of a mathematical identity which results in computational efficiency. As is known, the boolean subtraction between two areas, A and B, is equal to the intersection between area A and the complement of area B:

$$A-B=A\cap(-B)$$

Therefore, to perform the boolean subtraction referred to earlier, the following computation is performed in step 17:

$$U[i]=L[i]'-L[i+1]'=L[i]'\cap(-L[i+1]')$$

Figure 10:
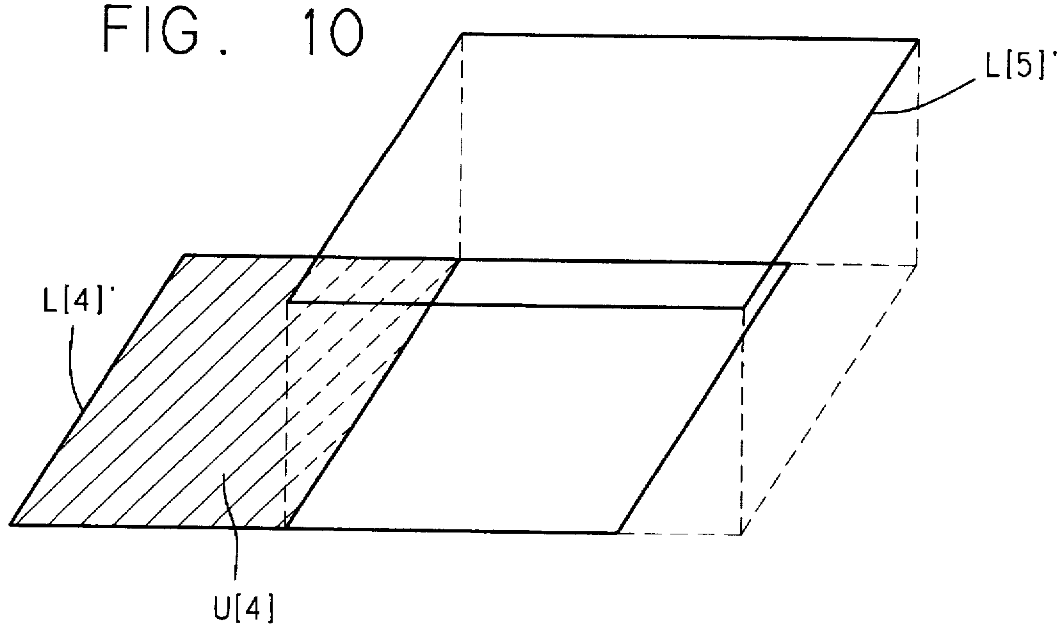
FIG. 10 illustrates the formation of U[i] from L[i]' and L[i+1]'.

As an example of this computation, FIG. 10 shows the derivation of U[4] from L[4]' and L[5]', which are taken from the example of FIG. 6. U[4] is the shaded area in FIG. 10. The complement of L[5] ' is everything but the area enclosed by L[5]'. Therefore, the intersection between this complement and L[4] ' is the area enclosed by L[4] ' excluding that portion that is also enclosed by L[5]'.

Note that U[i] represents only the first step in the determination of the up-facing areas. This is because the areas defined by U[i] might actually include down-facing areas as well as up-facing areas. Therefore, an adjustment needs to be made to U[i] to exclude down-facing areas. (As mentioned previously, it is important to distinguish down-facing areas from all other areas since they will generally not be overcured.)

Figure 11:
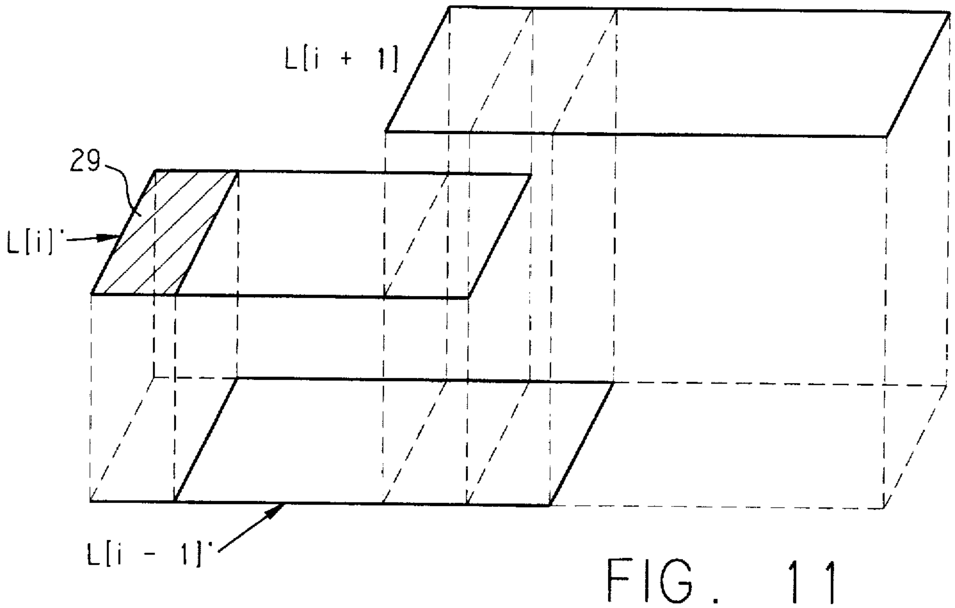
FIG. 11 illustrates the overlap between up and down-facing regions.

FIG. 11 shows an example where the area designated by numeral 29 would be included in U[i], but which should be excluded since it is also a down-facing region. This area is a down-facing region since L[i]' does not overlap L[i−1]', the next lower layer, in this region. As indicated earlier, the down-facing regions need to be excluded, since they do not overlap the next lower layer and will not therefore be adhered to it and therefor should not be over-cured. The next two steps accomplish this. Alternatively, areas that are both up-facing and down-facing can be labeled as down-facing, as is done in this embodiment, or they may be given a different designation so that areas that are only down-facing can be cured differently from those that are both up-facing and down-facing. Co-pending U.S. patent application Ser. No. 516,145 discloses the use of different cures for down-facing regions depending on whether they are also up-facing or not.

Turning back to FIG. 5, in step 18, the down-facing borders, D[i], are determined for each layer by taking the boolean difference between the compensated layer boundaries for that layer, L[i]', and the compensated layer boundaries for the previous layer boundary, L[i−1]'. In the manner indicated previously this is accomplished by taking the intersection between L[i]' and the complement of L[i−1]', according to the following formula:

$$D[i]=L[i]'-L[i-1]'=L[i]'\cap(-L[i-1]')$$

Next, in step 19, the up-facing boundaries computed in step 17, U[i], are compensated to subtract out any down-facing regions which may also be present in the up-facing regions. This is accomplished by taking, for each layer, the boolean difference between U[i] and D[i]. In the manner indicated previously, this difference is determined by taking the intersection between U[i] and the complement of D[i] as per the following formula, to compute the adjusted up-facing boundaries, U[i]':

$$U[i]'=U[i]-D[i]=U[i]\cap(-D[i])$$

Note that any region which is simultaneously both a down-facing and an up-facing region is always classified as a down-facing region. This is preferable, since this avoids overcuring these regions.

Note that, at this point, the adjusted layer boundaries, L[i]', still encompass the up-facing and down-facing regions D[i] and U[i]'. Therefore, these two areas need to be subtracted from the layer boundaries. This is accomplished in the next two steps in FIG. 5.

In step 20, the layer boundaries are adjusted again to subtract out the down-facing regions. The twice-adjusted layer boundaries, L[i]", are computed by taking the boolean difference between the compensated layer boundaries, L[i]', and the down-facing boundaries, D[i] (again, the mathematical identity discussed earlier is utilized for this purpose). In step 21, the layer boundaries are adjusted a third time to subtract out the up-facing regions. The thrice-adjusted layer boundaries, L[i]'", are computed by taking the boolean difference between the twice-adjusted layer boundaries, L[i] ", and the adjusted up-facing boundaries, U[i]'. As before, boolean differences are preferably computed using the previously-discussed mathematical identity. Note that, at this point, the following mutually exclusive, descriptive information has been computed for each cross-section: L'"[i], D[i], and U'[i].

Note that it is still desirable to separate out the up-facing boundaries from the layer boundaries and obtain mutually exclusive data even though up-facing regions will typically be cured with the same 6 mil overcure as other regions within the layer boundaries. This is desirable since separating out these areas will eliminate redundant data and thereby reduce overcure. If the up-facing boundaries were allowed to remain within the layer boundaries, then the areas within the layer boundaries would be redundantly defined. As a result, these areas may be traced more than once by the synergistic stimulation, and therefore overcured, resulting in possible distortion either through undesirable increases in the cure depth or the cure width at these areas.

Figure 12:
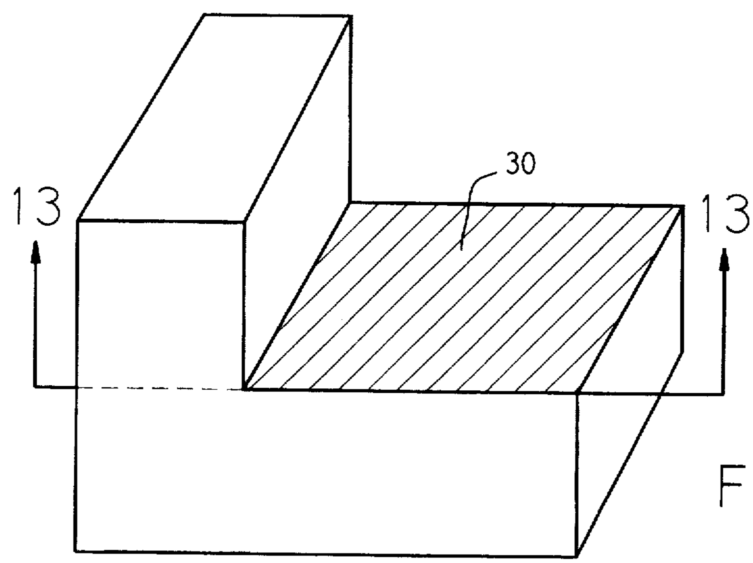
FIGS. 12–13 illustrate adjustments to up- and down-facing borders to prevent over-exposure.
Figure 13:
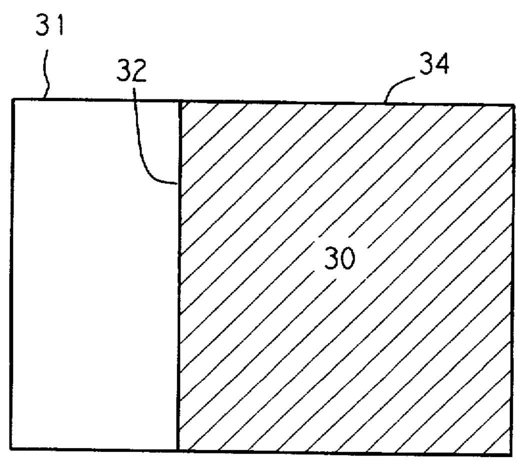

Turning now to FIGS. 12 and 13, some additional adjustments to the up-facing and down-facing boundaries must be made in order to avoid additional redundant definitions of certain areas, with the resultant possibility of over-exposure of these areas. FIG. 13 illustrates a top view of a layer of an object having an up-facing region 30. The thrice-adjusted layer boundary, L[i]'", is referenced with numeral 31, and the adjusted up-facing boundary, U[i]', is referenced with numeral 34. The areas encompassed by the layer boundary and the up-facing boundary meet, but do not overlap, along segment 32. However, if the entire area encompassed by area 30 is exposed (using skin vectors as described in U.S. Pat. No. 5,184,307) to form a transformed area, which abuts right up against segment 32, and in addition, if the entire area enclosed by boundary 31 is transformed (using hatch vectors as described in U.S. Pat. No. 5,184,307) to form a transformed area which also abuts against 32, then the material along this segment will be exposed four separate times, i.e., through exposure of areas enclosed by 31 and 34, and through exposure of layer boundary 31, and up-facing boundary 34. As indicated previously, this over-exposure should be avoided in order to prevent the resultant increase in cure width and cure depth which results. Therefore, adjustments to the up-facing and down-facing borders are useful to prevent this over-exposure. This is accomplished in steps 22 and 23.

Figure 14A:
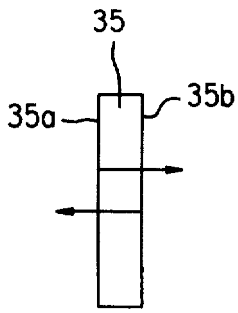
FIGS. 14a–14b illustrate the detection of an area too small to benefit from the generation of skin vectors.

An additional and very important result (in terms of system cost) of these adjustments is that they will have the beneficial effect of eliminating the generation of skin vectors for areas too small to actually require skin vectors. Turning to FIG. 14*a*, for example, the area identified by numeral 35 is assumed to represent either an up or down-facing region which is too small to benefit from the generation of skin vectors. This is so because when the synergistic stimulation traces segments 35*a* and 35*b* around the perimeter of the area, this area will be automatically transformed (due to the cure width involved) without necessitating the generation of skin vectors.

Figure 14B:
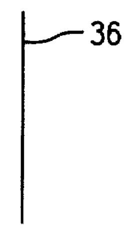

The determination of such areas can be accomplished, for example, by moving segment 35*a* to the right by one-half the cure width, while also moving segment. 35*b* to the left by one-half the cure width, as shown. As will be discussed subsequently, these steps can be accomplished by utilizing, in large measure, the LWC algorithm from step 16. If the result of migrating these segments is the collapse of the region or partial collapse, then this indicates that skin vector generation need not be performed in this region or portion of this region. As shown in FIG. 14*b*, the migration of the segments collapses the region into line segment 36, indicating that skin vectors need not be generated. The detection of these areas is performed in the next two steps of FIG. 5.

In step 22, an up boundary offset (UBO[i]) is computed for each layer in a similar manner to the computation of the LBO, i.e., by interpolating based on the value of the layer thickness plus an expected overcure amount. This value is used to offset the up-facing boundaries in the manner very similar to that described previously. The primary difference between the use of the UBO and the LBO is that the UBO is not used to form physical boundaries that will be drawn, whereas the LBO is used to form such boundaries. The UBO is used to form boundaries from which the appropriate areas for skinning and/or hatching will be determined. As such, if these areas are reduced to zero or become negative, they are simply not skinned and/or hatched.

The LBO, on the other hand, is used to offset the boundaries that will physically be formed when producing a layer of a part. As such, when areas within these boundaries reduce to zero, or become negative after the compensation associated with the LBO, a decision must be made as to whether or not it is appropriate to form the collapsed feature as a single line of cured material or whether it is more appropriate to simply remove such features from further consideration. The most preferred choice may vary from part to part or layer to layer or region of a layer to region of a layer. Therefore, the most appropriate method of making the decision may be to make it a user specified option. This decision may be made on a part by part basis, layer-by-layer basis, or a region of a layer by region of a layer basis. This difference between the use of the LBO and UBO leads to somewhat different processing routines as will be described later.

Next, the adjusted up-facing boundaries U[i]' are adjusted inwards by about one-half the UBO for that layer, UBO[i], to obtain the twice-adjusted up-facing boundaries, U[i]". Note that with the generation of U[i]", the singly adjusted up-facing boundaries U[i]', are still retained. This is because the twice-adjusted boundaries are only kept temporarily for the purpose of generating skin vectors and/or hatch vectors, and are not retained for the purpose of generating border vectors. Instead, the singly adjusted boundaries, U[i]', are kept for this purpose.

Then, in step 23, adjusted down-facing boundaries, D[i]', are computed by adjusting for a down-boundary offset, DBO, for that layer. The down boundary offset values for each layer are computed in a manner analogous to the offsets for the up boundaries in step 21 except for generally a smaller depth of cure and small corresponding width of cure, and the adjustment to the down-facing boundaries is made in a similar manner. Again, with the generation of the singly-adjusted boundaries, D[i]', the unadjusted boundaries, D[i], are still retained. This is because the adjusted boundaries are only used for the temporary purpose of generating skin vectors and/or hatch vectors, the unadjusted down-facing boundaries, D[i], being retained for the generation of the border vectors.

Note it is also possible to determine and use an additional offset value to compensate the L[i] '" or the L[i] " boundaries to produce secondary boundaries. The secondary boundaries can then be used for the generation of crosshatch (hatch) or skin (if used), wherein the original L[i] '" or L[i] " would still be used to form the physical boundaries that would enclose the hatch or skin produced from the secondary boundaries.

Finally, in step 24, vectors are generated from the boundary data as follows. First, for each layer, layer boundary vectors (LB) are generated from the thrice adjusted layer boundaries L[i]'". (This is a simple process and is simply the generation of one or more loops of vectors which trace out the boundaries.) Second, the flat up boundary (FUB) vectors are generated from the adjusted up boundaries U[i]'. Third, layer hatch (LH) vectors are generated from the twice adjusted (not thrice-adjusted) layer boundaries, L[i]", using one of the hatch generation algorithms to be described subsequently. Note that the twice-adjusted boundaries, L[i]", are used which encompass the up-facing regions but not the down-facing regions (see step 21 in FIG. 5), rather than the thrice-adjusted boundaries, L[i]'". This is because hatch vectors will have to eventually be generated for both the layer boundary and up boundary regions, and it is more efficient to generate them in one step, rather than in two steps, which would be required if L[i]'" were used here. Although generally found to be unnecessary, separate hatch vectors can be generated for the L[i] '" regions and for the U[i] ' regions instead of a single set for the combined L[i] '" and U[i]' regions. This can be done at the cost of producing additional vectors but with the benefit of yielding additional versatility in the process of actually transforming the building material. Note that the generation of hatch vectors for the down-facing regions cannot be combined with the generation of hatch vectors for the layer boundaries since these vectors for the down-facing regions will likely be given different cure depths and possibly completely different processing from that given to the LH, since a uniformly cured, non-over-cured region is desired to be formed. Fourth, the flat down boundary (FDB) vectors are then derived from the unadjusted down-facing boundaries, D[i], generally without any overcuring specified. Fifth, down hatch boundary vectors (NFDH) are formed from the down boundaries, D[i], using one of the hatch generation algorithms to be described subsequently. Sixth, the up fill vectors (FUF) are formed from the twice-adjusted up boundaries U[i]", and, then, the down fill vectors (FDF) are formed from the adjusted down boundaries, D[i]', using one of the skin vector generation algorithms described subsequently.

Note that the algorithm retains some of the vector mnemonics associated with the previous SLICE programs described in U.S. Pat. No. 5,184,307 in order to retain compatibility with the remaining computer programs, other than SLICE, which run on the PROCESS computer. The correspondence between vector mnemonics, vector description, the borders used to generate the vectors, and the order in which each vector type is generated, and then drawn, is summarized below:

| ORDER | MNEMONIC | DESCRIPTION | DERIVED FROM |
|---|---|---|---|
| 1 | LB | layer boundary | L[i]''' |
| 2 | FUB | up boundary | U[i]' |
| 3 | LH | layer hatch | L[i]" |
| 4 | FDB | down boundary | D[i] |
| 5 | NFDH | down hatch | D[i] |
| 6 | FUF | up fill | U[i]" |
| 7 | FDF | down fill | D[i]' |

Although the above-listed drawing order is preferred, other satisfactory drawing orders may be utilized. An important aspect of selecting the drawing order is to avoid drawing vectors that are not adequately supported by previously-formed portions of the object. If these unattached or loosely attached vectors are drawn prior to drawing other vectors, the transformed material forming the vectors can drift out of position or be distorted out of position before they can be adhered to other vectors. Therefore, it is usually advisable to solidify the material on a given layer in a manner which starts with the supported regions (since these regions will be adhered to the cross-section below) and then solidify the material which extends radially outward from these regions into the unsupported regions. This desired manner of formation can be implemented by comparison of adjacent cross-sections, known cure depths and widths for each vector, and known attributes of the drawing style used and of any curl reduction methods used. The above-described order reflects these considerations. Additionally, it always draws boundaries prior to their associated hatch or fill to insure that the hatch and fill will be constrained by the boundaries even if the hatch and fill should initially be unadhered.

Another possible drawing order is LH, FUF, LB, FUB, FDB, NFDH, and finally FDF. This drawing order creates the LH and FUF before their corresponding boundaries since it can be assumed that both of these vector types are used to transform material which is supported from below by material which was transformed in association with the previous cross-section. Furthermore, this drawing order has the advantage that the boundaries will not be distorted by shrinkage of the hatch and fill as the hatch and fill are formed. Therefore, it may be assumed that the boundaries will ultimately be located in more accurate positions.

The above list of vector types does not contain an up-facing hatch category. As stated previously, this is because the up-facing hatch is included in the LH of the above list. This inclusion has generally been found to be satisfactory, but the up-facing hatch can be separated out into its own category if the need or desire arises. Separating the LH into its own category is a specifiable option in the present software.

IMPLEMENTATION

Figure 15:
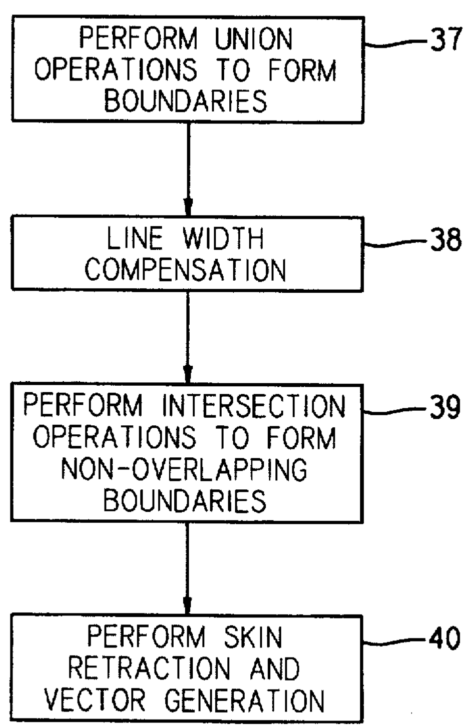
FIG. 15 is a flowchart of the method of implementing the first embodiment.

The implementation of the above embodiment will now be described. FIG. 15 illustrates an overall view of the implementation, which comprises the steps of performing union operations to form boundaries in step 37, performing line width compensation in step 38, performing difference operations to form non-overlapping boundaries in step 39, and performing skin and hatch retraction and fill and/or hatch vector generation in step 40. All these steps are presently conducted on the SLICE computer (which may be the same as the PROCESS computer), which takes the tesselated triangle formatted object representation as input, and produces vectors as output. The PROCESS computer is one with or is coupled to the SLICE computer for receiving these vectors, and then, responsive to these vectors, directs the beam of synergistic stimulation to trace out the vectors on a working surface of the material.

Figure 16:
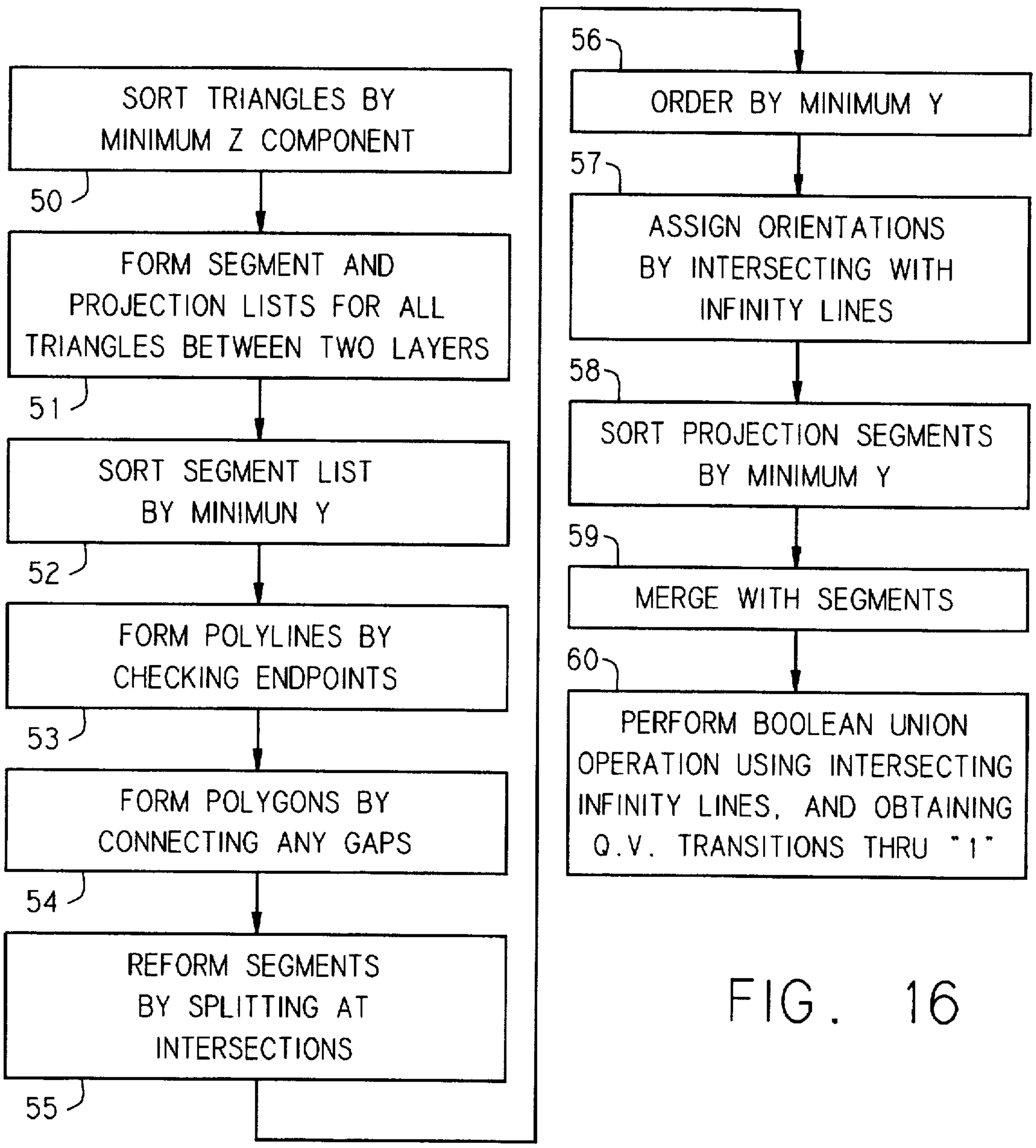
FIG. 16 is a flowchart of the detailed substeps of the method of FIG. 15.

Each of these steps will be addressed in order. The detailed substeps which make up step 37 are illustrated in FIG. 16.

First, in step 50, all the triangles are sorted by the minimum z-component of any of the triangle vertices. The z-axis is assumed to be the slicing axis, which in the first embodiment, is the vertical dimension. Therefore, this step will order the triangles along the slicing axis. It should be noted that the choice of the z-axis is arbitrary, and, assuming a cartesian coordinate system, the y or x-axis could equally have been used.

Then, in step 51, the triangles are overlayed with a plurality of slicing planes spaced along the z-axis. Then, after consideration of all the triangles between any two successive slicing planes, a segment list is generated, comprising segments generated from the intersections of all such triangles with the one of the two successive slicing planes having the smaller z-component. In addition, a projection list is generated, comprising segments generated from the projections of triangles, between the two layers, onto the smaller z-component slicing plane, with flat and vertical triangles excluded from consideration. If it is desired not to shift the reproduced object along the z-axis, both these lists are associated with the higher of the two layers after their formation. After the segment and projection segment lists have been formed for a cross-section, segment and projection lists for all the cross-sections are formed. In each instance, the segment and projection lists for a cross-section are formed from the two slicing layers which bound the cross-section. Alternatively, all the segment lists may not be generated. Initially, it is possible to generate such segment lists for the lower succeeding layer, the present layer, and the successive layer. After the appropriate computations are done for the present layer, the vectors for the present layer are stored or executed. The information for the succeeding layer is removed, followed by the layer designation being transferred upward so that was the next successive layer becomes the present layer. The process is then repeated, thereby minimizing memory and storage space usage.

Note that the segments in the projection list, upon formation, are ordered in a counter-clockwise orientation, such that in following the directions of the segments which bound a projection, the solid regions are to the left and the hollow regions are to the right of the boundary. Another way of expressing this is that the segments follow the right hand rule, whereby the segments are assumed to encircle solids in a counterclockwise direction, and to encircle hollow regions in a clockwise orientation.

Unlike the segments in the projection list, however, the segments in the segment list are not oriented upon formation. These segments are oriented in step 57, discussed subsequently.

For a given cross-section, beginning in step 52, the segment list is first operated on to clean it up, and correct for any corrupted input data. The inputted triangles are assumed to completely span the surface of the object, and to abut other triangles only at their vertices. If either or both of these assumptions are violated, the input data representing the triangles may be corrupted. This may manifest itself in the form of gaps or overlaps in the segment list. As discussed below, in step 52 and subsequent steps, these gaps are filled.

In step 52, the segments in the list are ordered according to their minimum y dimension, although the x-dimension could equally have been used. Then, in step 53, the endpoints of segments are considered in turn by comparing them with the endpoints of successive segments, and if any two endpoints match, the corresponding segments are combined to form "polylines." In step 54, the endpoints of any polylines that have not closed upon themselves to form polygons are considered in turn, and compared with the endpoints of successive unclosed polylines. If gaps are present, segments are created to fill in the gaps, considering the shortest gaps first. The result is to form polygons out of the unclosed polylines. In the closing of polylines into polygons, precautions are taken to avoid vectors which cross over other vectors. At such intersection points, both vectors are split as necessary and unoverlapping polygons are formed or one polygon and a non-overlapping polyline is formed.

In step 55, after any gaps have been filled, the longest possible segments are reformed from the polygons by combining successive collinear or nearly collinear polylines or segments where possible. A characteristic of these longer segments, unlike those used to form the polygons earlier, is that all gaps will have now been removed, and the segments will completely form polygons. Moreover, another characteristic of these longer segments is that they will not be allowed to pass over any other segment. This is accomplished by following the rule to split a segment into multiple segments at an intersection point, to avoid having any two segments cross or to have a segment pass through an intersection point with another segment.

Figure 17A:
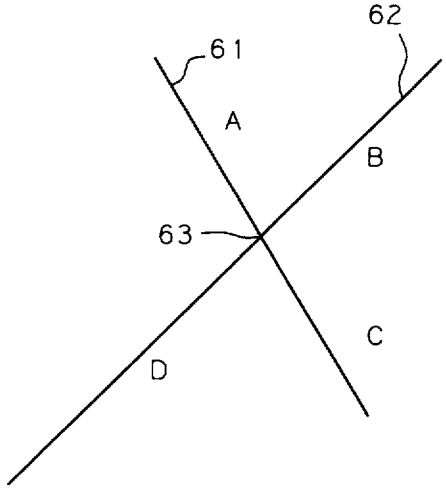
FIGS. 17a–17b illustrate the process of splitting segments at intersection points.
Figure 17B:
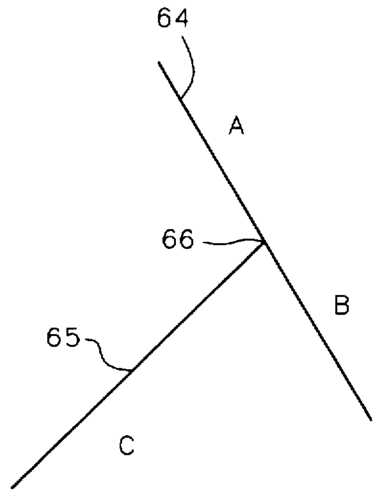

The splitting process is illustrated in FIGS. **17*a* and 17*b*. FIG. 17*a* shows segments 61 and 62 intersecting at point 63**. To avoid violating the rule mentioned earlier, the segments are divided up into the four sub-segments A, B, C, and D.

FIG. **17*b* shows another example of splitting segments 64 and 65, which intersect at 66**, except that here, the splitting is into three sub-segments, A, B, and C, rather than into four sub-segments.

Turning back to FIG. 16, in step 56, the reformed segments are ordered by their minimum y dimension.

In step 57, orientations are assigned to the segments, since, as discussed previously, unlike the segments in the projection list, these segments have not been assigned orientations. To do so, the segments are first intersected with so-called "infinity" lines (so-called because they are considered to originate at infinity), which are parallel to the x-axis (although the y- or z-axis is equally possible). Then, at each intersection point with a segment, a quantitative volume analysis ("QV analysis") is performed, and, as a result of this analysis, the segment is assigned a corresponding orientation.

To begin the QV analysis, it is assumed that an infinity line always begins in a hollow region, and that every time it intersects a segment, that it is either entering or exiting a solid region. The segments are assumed to be oriented so that to their left is solid and to their right is hollow, that is they are assumed to encircle a solid region by looping around it in a counter-clockwise orientation. This is equivalent to orienting these segments according to the right-hand rule. Again, the left-hand rule is also possible.

The quantitative volume ("QV") associated with an infinity line will vary from one point on the line to another depending on whether that portion of the infinity line is located within a hollow portion, or a solid portion. When the infinity line is in a hollow region, it is assumed to have a QV of 0, and when it is within a solid region of an object, it is assumed to have a QV of 1 (if the infinity line were located within an overlapping solid region of two objects, it would have a QV of 2, and so on). This situation of overlapping solid regions is excluded from this stage of the processing since at this stage hollow and solid regions are being determined by alternating the designation as successive boundary vectors are determined. A different algorithm is possible that could substantially process overlapping solid regions at this phase.

Each segment can only have one orientation associated with it since over its entire length it, by definition and by virtue of the previously-described splitting technique, bounds hollow on one side and solid on the other.

The ordered segments are successively overlapped with infinity lines until each segment has been assigned an orientation. Any number of infinity lines can be used, the only provision being that enough be used so that each segment will be assigned an orientation. The first infinity line may be chosen to intersect as many segments as possible. After the orientations for these segments are assigned, another infinity line is intersected with as many remaining segments as possible, orientations are assigned, and the process repeats itself until all segments have been assigned orientations.

Figure 18:
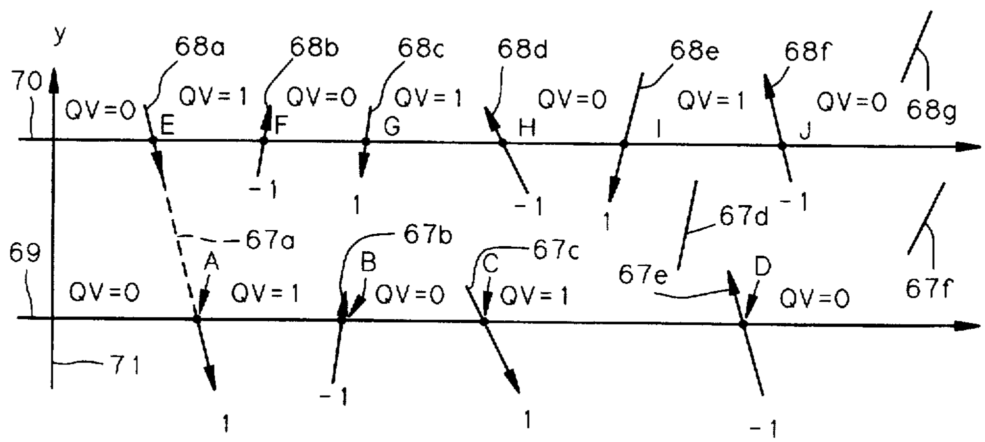
FIG. 18 illustrates the process of assigning orientations to segments.

The above process can be illustrated with the aid of FIG. 18, which shows segments **67*a*–67*f*, and 68*a*–68*g*. These segments all have at least a component parallel to the y axis and they are assumed to be ordered by minimum y, and are therefore illustrated accordingly. The y-axis is designated with numeral 71**.

First, an infinity line, designated by numeral 69, is chosen to intersect as many segments as possible. In this case, this line overlays segments **67*a*–67*f***. The actual intersections of the segments with the line are designated as A, B, C, and D.

As mentioned earlier, the origin of the infinity line is assumed to be at infinity, which is assumed to be hollow. Therefore, the infinity line at infinity is assumed to have an associated quantitative value of 0. This is indicated on the infinity line just prior to the intersection with segment **67*a*** at point A. Next, each intersection point along the infinity line is considered in turn, and QV values are successively assigned to each portion of the infinity line after intersection with a segment. If the QV value makes a transition from 0 to 1, it indicates the entry of solid. If it makes a transition from 1 to 0, it indicates the exiting of solid. The successive QV values are as shown in the figure.

Next, assuming an orientation, which indicates solid to the left and hollow to the right, the orientations of the segments are derived from the QV values on the infinity line. If the QV value makes a transition from 0 to 1 across a segment, this indicates that a solid has been entered, and following the right-hand rule, it is assumed that the segment is pointing downwards. Of course, if the QV makes a transition from 1 to 0, this indicates that a solid has been exited, and following the right-hand rule, it is assumed that the segment is pointing upwards. If the segment is pointing downwards, it will be given an orientation of 1, while if it is pointing upwards, it will be given an orientation of −1. The derived orientations are shown in the figure, as numbers below the corresponding segments. An arrow has also been added to each segment to pictorially show its derived orientation.

Next, another infinity line is drawn, identified by numeral 70 in the figure, to intersect another group of segments, identified by numerals 68*a*–68*g* in the figure. The corresponding intersection points are identified as E, F, G, H, I, and J in the figure. Then, the above analysis is repeated, to assign orientations to the intersected segments, which are indicated in the figure.

A consistency check is then performed to determine if a segment assigned an orientation by two different infinity lines has been assigned the same orientation. In FIG. 18, for example, if segments 68*a* and 67*a* were part of the same overall segment (which situation is denoted by the broken line connecting these two segments) then a check would be made to ensure that the orientations assigned by the different infinity lines to this segment are the same. This is, in fact, the case in FIG. 18. Additional checks can be performed to ensure that segments in each polygon have been assigned compatible directions.

Figure 19A:
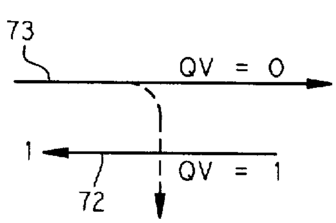
FIGS. 19a–19b illustrate the process of assigning orientations to horizontal segments.
Figure 19B:
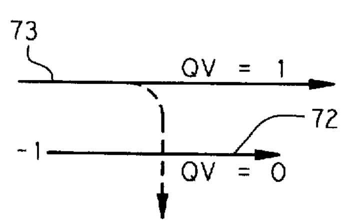
Figure 17A:
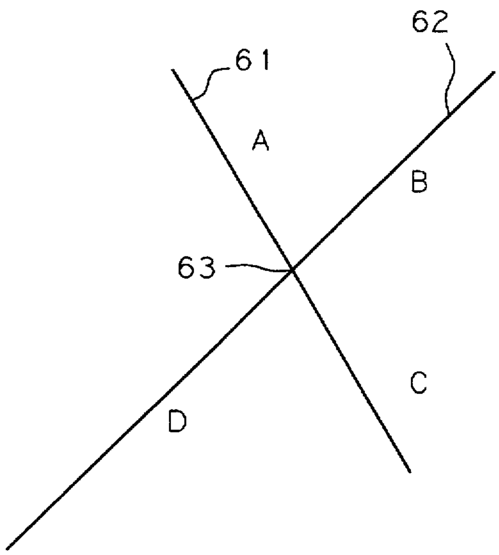
Figure 17B:
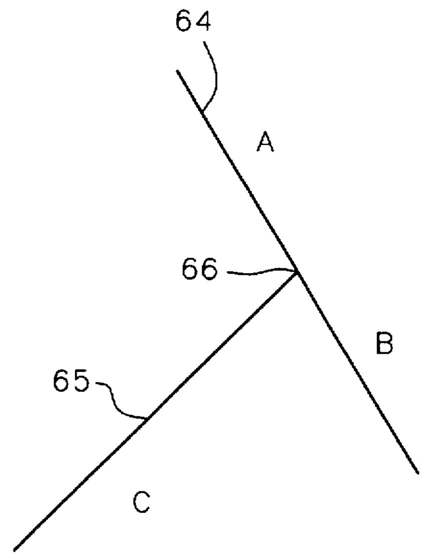
Figure 18:
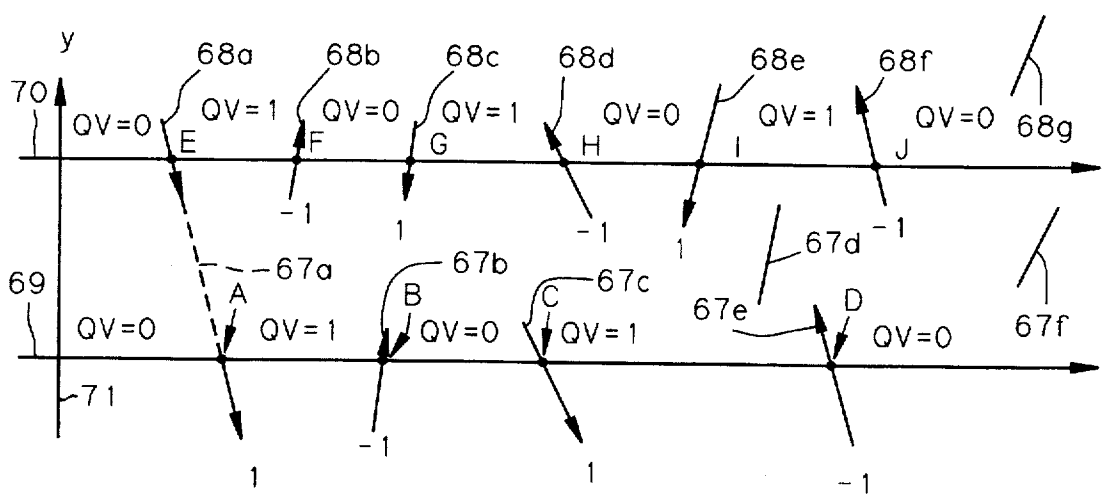

Several special cases will now be considered. The first is illustrated in FIGS. 19*a*–19*b*, where the segment 72 to be assigned an orientation is horizontal to the infinity line 73. In this instance, it will be assumed that the infinity line passes through the segment from top to bottom, as shown by the broken line in the figures, even though in reality, the infinity line follows the path indicated by the solid line in the figures. If the QV changes from 0 to 1 as in FIG. 19*a*, the segment will be assigned an orientation of 1, while if the QV changes from 1 to 0, as in FIG. 19*b*, the segment will be assigned an orientation of −1.

Another special case is where two or more segments overlap. Overlapping segments may be caused by triangles overlapping. This situation may occur as triangle vertices are rounded to slicing layers, as indicated in U.S. Pat. No. 5,184,307.

To handle this situation, an orientation value will be assigned to the overlapping segments as a whole. This value is equal to the sum of the orientations of the individual segments. In addition, a new value, a "biorientation" value, is assigned both to the individual segments and to the overlapping segment groupings. For individual segments, the biorientation value is set to 1. For segment groupings, the biorientation value will be the sum of the biorientations for the individual segments.

Figure 20A:
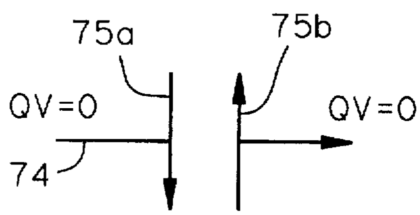
FIGS. 20a–20b illustrate the concept of bigons as representing two overlapping segments.
Figure 20B:
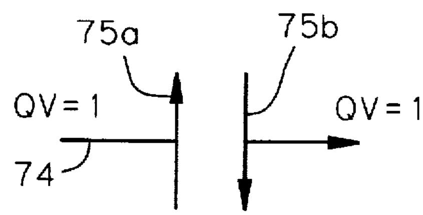

In FIG. 20*a*, for example, infinity line 74 is shown as intersecting overlapping vectors 75*a* and 75*b* (spaced apart for illustrative purposes only). As shown, the derived orientation for the grouping is 0 since there are only two vectors in the group. As indicated previously, this value is derived from the sum of the two individual orientations, which are 1 and −1, respectively. The biorientation value for the example of FIG. 20*a* will be 2, which is the sum of the biorientation values for the individual segments. The orientation for the example in FIG. 20*b* is 0 while the biorientation value of the example in FIG. 20*b* is 2. It can be seen that the biorientation value for the grouping is simply a count of the number of segments in the grouping.

Note that a grouping of two segments is considered to be a construct known as a "bigon," that is a polygon formed from two sides. Therefore, since two overlapping segments form substantially a polygon of two sides, the grouping in FIG. 20*a* is properly termed a bigon. Presently, the biorientation value for a bigon conveys another piece of information, which is whether the bigon represents a collapsed hollow or solid. At present, a bigon having a positive biorientation value is assumed to represent a collapsed solid. The bigon illustrated in FIG. 20*b* represents a collapsed hollow. In actuality, at this level of processing, both situations in FIGS. 20*a* and 20*b* would be given the same physical orientation. Therefore, although useful for understanding the process, the orientation depicted in FIG. 20*b* would not really be created in the present embodiment. All bigons are treated as enclosing a trapped positive area. Therefore, they are considered to enclose their area in a counterclockwise manner. However, at later processing stages, including the union operation to be described shortly, the two situations are treated differently due to the fact the other vectors on the layers inherently indicate that one of the bigons is within a solid region, and the other is within a hollow region. The vectors of FIG. 20*a* are drawn as a portion of the object whereas the vectors of FIG. 20*b* are not drawn since they merely represent a double exposure of a particular area.

In the differencing and intersection operations (after a complementing operation) to be described hereinafter, these bigons will be distinguished from one another by having opposite signs being assigned to their biorientation values. This is important, since it provides the ability to retain collapsed features that might otherwise be lost.

The previously depicted infinity lines were straight lines running parallel to the x-axis, with imaginary bends placed in the lines for utilization in determining orientations of segments which run parallel to the x-axis. However, it should be understood that the physically significant features of the lines are that they start at a point of known quantitative volume and that they are continuous. As such, the orientation of each of the vectors in the segment list can be determined by a single curved infinity line that intersects each of the vectors, wherein the infinity line starts at a position of known quantitative volume, and wherein the orientation of the vectors is determined by the upward or downward transition of the quantitative volume between 0 and 1. In addition, the orientation of each vector should be labeled such that the vectors are given a direction which points to the right of the direction (at the point of contact) of the infinity line when the transition is from hollow into solid and to the left when the transition is from solid into hollow.

Figure 21A:
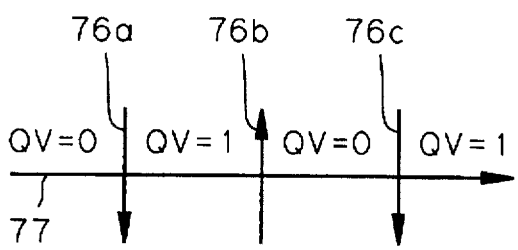
FIGS. 21a–21b illustrates the case of three overlapping segments.
Figure 21B:
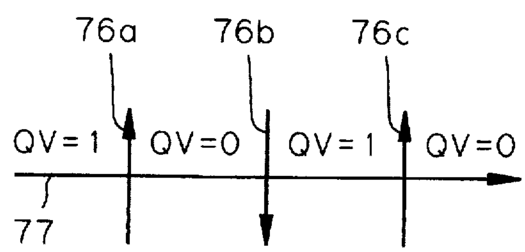

The case of three overlapping segments 76*a*, 76*b*, and 76 *c* is illustrated in FIGS. 21*a* and 21*b*. The infinity line intersecting the vectors is designated with numeral 77. FIG. 21*a* illustrates the case where the infinity line enters the grouping of three segments from a hollow, while FIG. 21*b* illustrates the case where the infinity line enters the grouping of three segments from a solid.

The segments which make up the grouping are shown spaced apart for illustrative purposes only, and the respective changes in the value of QV is shown. Note that in FIG. 21*a*, the value of the orientation is 1, all in accordance with the sum of the individual orientations, while the orientation value in FIG. 21*b* is −1.

In both cases, however, the grouping comprises both a collapsed hollow, and a collapsed solid. Therefore, the biorientation value for both cases is assumed to be 3.

This completes the discussion of the particular approach currently used to assign orientations to segments in the first embodiment. Turning back to FIG. 16, in step 58, the projection segments are sorted by minimum y, and then in step 59, merged with the segments in the segment list. Note that the segments in the projection list already have orientations assigned to them, and do not have to have orientations derived for them as per the segments in the segment list. The orientation for the vectors in the projection list is determined in a manner analogous to that used for determining orientation for the near-flat boundary vectors described in previously referenced and incorporated U.S. Pat. No. 5,184,307. Merging the segments for the two lists together paves the way for taking the union of the areas encompassed by the segments of both sets, which union, as discussed previously, will result in the formation of the layer boundaries.

In step 60, the union operations are performed. To perform the union operation, a series of infinity lines will be run through the segments in the merged list. Then, the QV value will be computed at each intersection point (here, unlike step 57, the QV values are derived from the segment orientations), and any segment where the QV makes a transition from below 1 to a value of 1 or greater, or a transition from above 1 or exactly 1 to less than 1 will be retained. All other segments will be discarded. The retained segments, as will be seen in the discussion below, will form the union of the areas encompassed by the segments in the segment and projection lists.

Figure 22A:
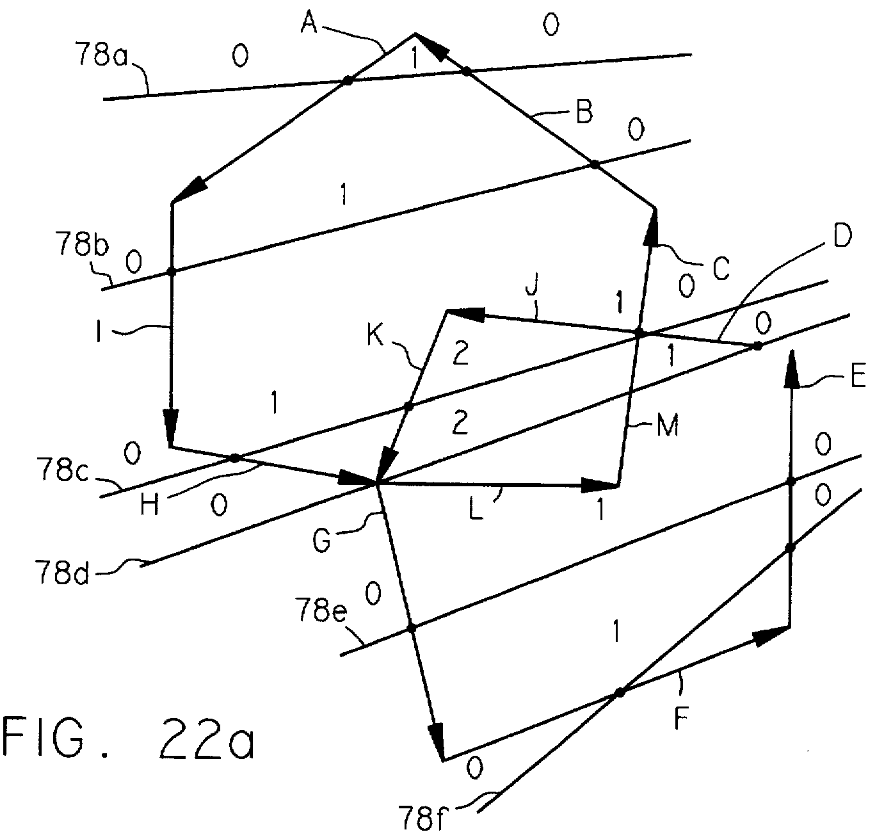
FIGS. 22a–22b illustrate the implementation of the boolean union operation.

This operation is illustrated in FIG. 22*a*, which shows segments forming two loops, one loop assumed to be formed from segments in the segment list, the other assumed to be formed from segments in the projection list. In general, there is at least some overlap (matching vectors) between those in the segment list and those in the projection list.

Figure 22B:
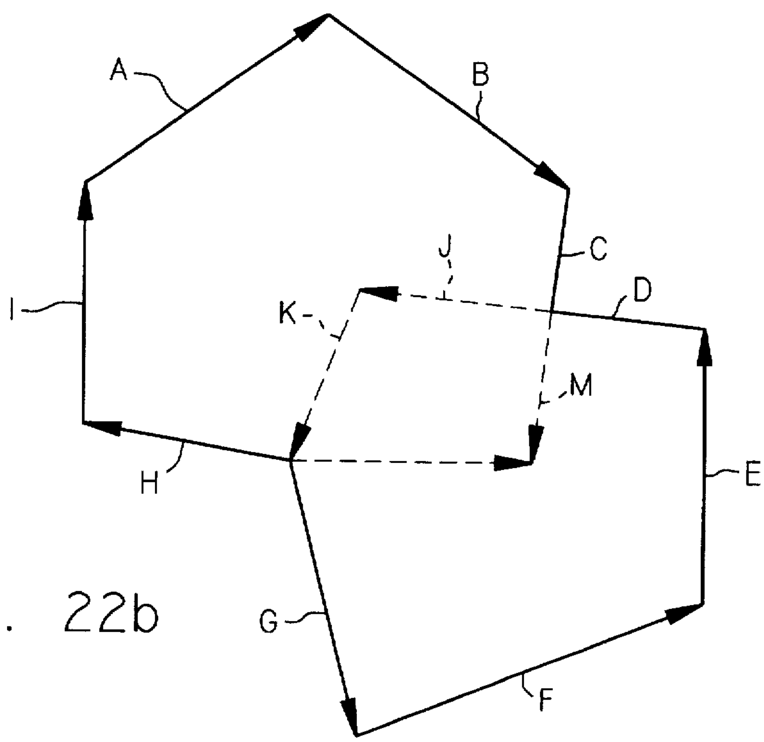

A plurality of infinity lines 78*a*–78*f* are shown intersecting the segments, and after the intersection points have been determined and located, the QV values are determined. The QV values are shown in the figure. Using the retention rule discussed previously, the retained vectors are labelled as A–I. These segments are redrawn for clarity in FIG. 22*b*, with the excluded segments, J–M, shown as dashed lines. As shown, the area encompassed by the retained segments is the union of the two areas shown in FIG. 22*a*. It should be recalled that the decision to retain or remove vectors was based on whether the transition across the vector included quantitative volume changes between at least 0 and 1 inclusive.

For the retained segments, any orientation value greater than 1 is changed to 1, and any orientation value less than −1, is changed to −1. By this process, overlapping segments are effectively discarded. Moreover, the biorientation values for these segments is reset to 1. However, note that some segment groupings will still be retained. These include bigons representing collapsed solids. Bigons representing collapsed holes are discarded. Then, the retained segments are reconnected to form polygons.

Discarding collapsed holes reflects the policy of this embodiment that solid features are considered more important for accurately representing the object than hollow features. To implement this policy, when a bigon is encountered, in the union operation, a new parameter, QV', is defined. To determine QV', the value of the biorientation parameter, rather than the orientation parameter, is added to the QV value just prior to the bigon, and the resulting value analyzed. If the transition from QV to QV' goes from below 1 to 1 or greater, the bigon is retained; otherwise, the bigon is excluded. The orientation parameter is never used since it will be 0, and will never cause a transition in the QV.

Figure 23A:
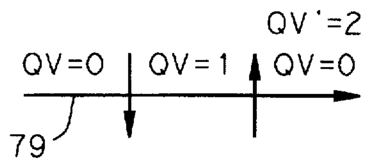
FIGS. 23a–23b illustrate the treatment of bigons in the union operation.
Figure 23B:
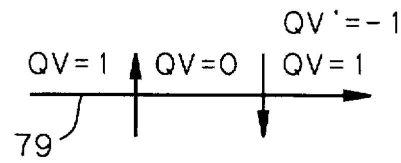

Turning to FIGS. 23*a* and 23*b*, the treatment of bigons in this union operation will be described in greater detail. These figures show bigons being intersected with infinity line 79. The value of QV will be unchanged, as indicated, on either side of the bigon since the orientation parameter is 0, but the value of QV', which is the value of QV with the biorientation parameter added to it (which in FIG. 23*a* is 2), makes a transition compared to the QV value just prior to entering the bigon to 2 (from 0) in FIG. 23*a*. As a result, the bigon is retained. The situation depicted in FIG. 23*b* is similar to that depicted in FIG. 20*b*. The biorientation of this figure is +2. Therefore, upon crossing the segment, the QV' goes from 1 to 3. Since it does not go through the range 0 to 1, this bigon would therefore be removed. As a result, in the union operation, it is seen that the bigons which form independent structure are kept while the bigons which duplicate structure are removed.

This completes the steps illustrated in FIG. 16.

Figure 24A:
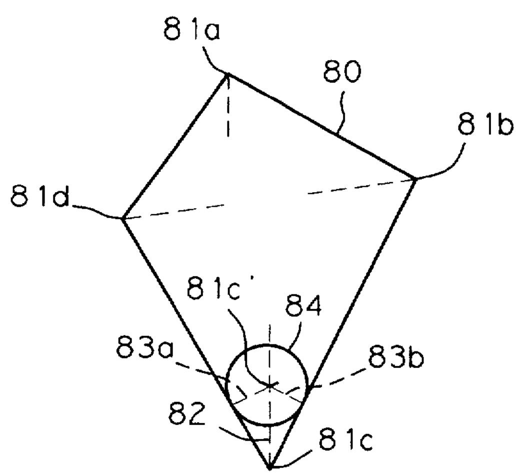
FIGS. 24a–24g illustrate the implementation of line width compensation.

Turning back to FIG. 15, in step 38, line width compensation (LWC) is next performed. First, it should be understood that the layer boundaries for each layer define a polygon, and the first step of LWC is to move the vertex points of each polygon so that the cure width of the material, which forms upon exposure to a beam of the synergistic stimulation, will be entirely encompassed within the polygon. For each vertex, a path known as a vertex bisector will be formed to define a path for the vertex to migrate along. Each bisector will be situated to bisect the angle formed at each vertex. This step is illustrated in FIG. 24*a*, which shows polygon 80, with vertices 81*a*, 81*b*, 81*c*, and 81*d*. The corresponding vertex bisectors are illustrated by the dashed lines emanating from each vertex. The vertex bisectors form the path along which each vertex will be migrated until the cure width along the border will be entirely encompassed within the border. The cure width of the material which results from the exposure of the material to the beam of the synergistic stimulation is identified by numeral 84. In the following discussion, this will be referred to as the beam trace.

Focusing on vertex 81*c* for the moment, the vertex will be migrated along the bisector to point 81*c*', which is defined as that point at which the beam trace will entirely fit within the confines of the polygon 80.

The beam trace will typically be in the shape of a circle as shown. In this instance, the migration of the vertex point, which is identified by numeral 82 in the figure, will be continued until the shortest distance from the migrated vertex point to the sides of the polygon, which shortest distance is generally along lines which are perpendicular to the sides of the polygon, identified by numerals 83*a* and 83*b* in the figure, are equal to the radius of the beam trace. This situation will generally occur, as illustrated in the figure, only after the vertex point has been migrated by more than the radius along the bisector line.

Each vertex is then adjusted in order.

Figure 24B:
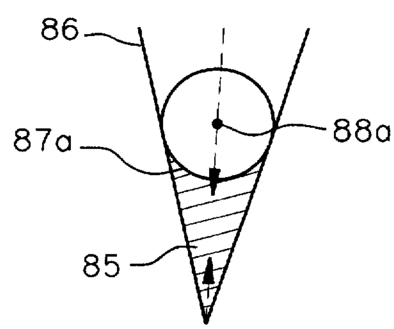

After adjusting the vertices as described above, the LWC algorithm will next perform a series of adjustments in case the vertex point may have been migrated too far. An example of this situation is shown in FIG. 24*b*, where the above approach has given rise to unacceptable migration along the bisector line at a sharp vertex. The extent of this migration is unacceptable since it may cause unacceptable distortion in the final object. For example, the shaded area in FIG. 24*b* represents the distortion in the final object, since this area, although encompassed by the layer boundary 86, will not be exposed. As indicated, this distortion can be substantial.

Therefore, to reduce the distortion which may result in these extreme cases, the LWC algorithm limits the length of migration of any vertex point to a value which is the square root of two times the radius of the beam trace:

sqrt (2)xr

Figure 24C:
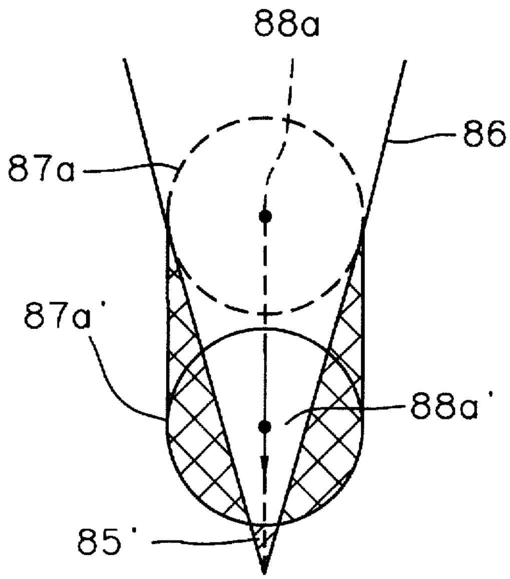

In FIG. 24*c*, for example, in which like elements are referenced with like reference numerals compared to FIG. 24*b*, the migration of the vertex point will be limited to 88*a*', and will not be allowed to proceed to 88*a*, as shown in FIG. 24*b*. When the beam trace is limited to 88*a*', the migration distance 85' is equal to the value specified above. The resultant beam trace will then be 87*a*' instead of 87*a*, as shown in FIG. 24*b*.

Note that this approach still results in some distortion, identified by the cross-hatched areas in FIG. 24*c*, and in fact even introduces some distortion. However, the intended result of limiting migration is to reduce the resultant distortion from what it was previously, and it has been found that limiting migration accomplishes this result in a wide variety of circumstances, even though distortion is not completely limited.

Comparing FIGS. 24*b* and 24*c*, for example, the total distortion in FIG. 24*c*, represented by the cross hatched areas, is still less than it was for FIG. 24*b*.

The LWC algorithm performs another adjustment to prevent undue migration. To perform this adjustment, the LWC algorithm first forms a displacement vector, defined as the vector which points from the original to the migrated vertex point. The LWC algorithm will next double the length of the displacement vector along the bisector line, and if the doubled displacement vector crosses a segment on the polygon, the migrated vertex point is adjusted back towards the original vertex point until the doubled displacement vector just touches the intersected segment.

Figure 24D:
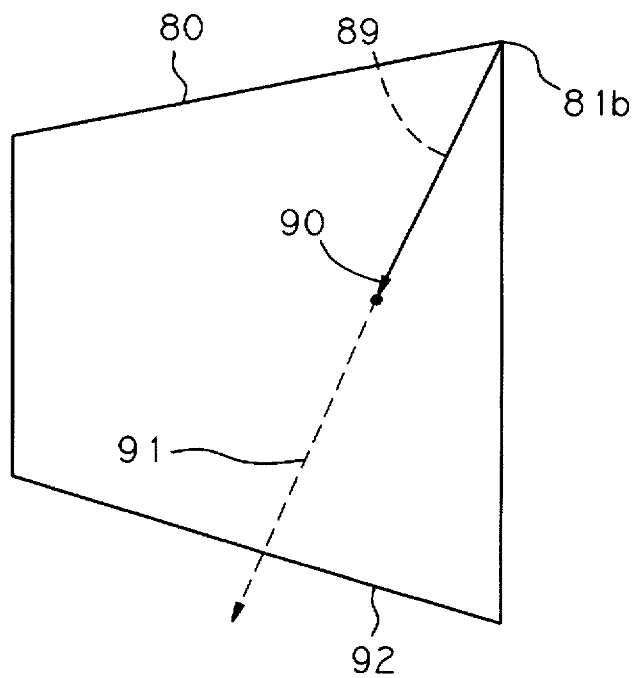
Figure 24E:
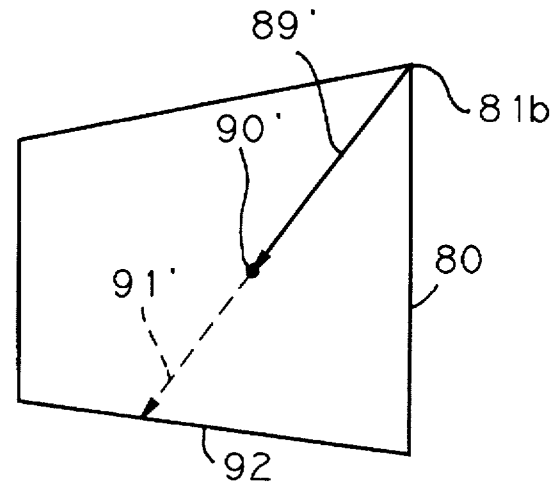

This process is illustrated in FIGS. 24*d* and 24*e*, which shows polygon 80 with vertex point 81*b*, and segment 92. As shown in FIG. 24*d*, after the vertex point has been migrated to 90, the displacement vector 89 is doubled to obtain the doubled displacement vector 91 shown in phantom. As shown, the doubled displacement vector intersects segment 92, so as shown in FIG. 24*e*, the vertex point is migrated back to 90', towards its original location, so that the resulting displacement vector 89', when doubled to obtain vector 91' (shown in phantom), does not intersect, but, in fact, just touches vector 92.

Figure 24F:
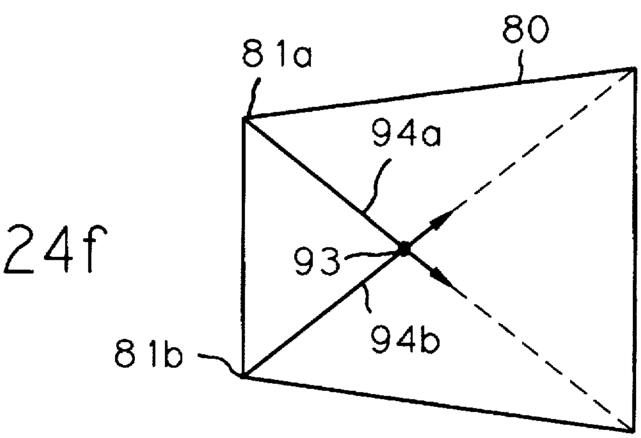

A third adjustment performed by the LWC algorithm is triggered when two displacement vectors cross, as shown in FIG. 24*f*, which shows displacement vectors 94*a* and 94*b*, for vertices 81*a* and 81*b*, respectively, crossing at intersection point 93. In this instance, the migrated vertices are moved back to the intersection point 93 so that the resulting displacement vectors do not cross each other.

Figure 24G:
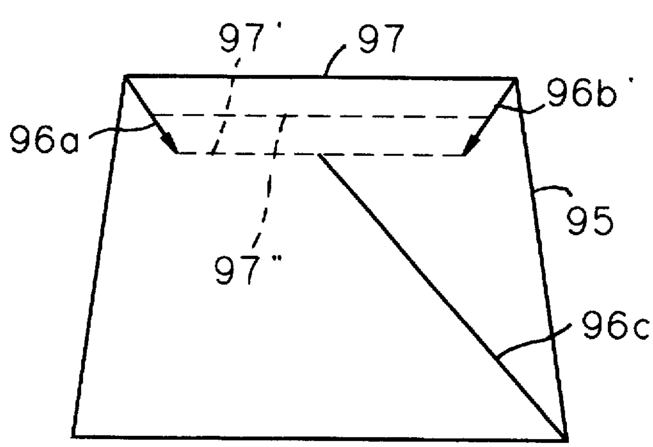

A fourth adjustment is triggered when the displacement vector crosses a compensated segment (a compensated segment is the segment that results from connecting migrated vertices). This situation is illustrated in FIG. 24*g*, which shows polygon 95, and compensated segment 97'. Segment 97' is obtained by migrating vertex points along displacement vectors 96*a* and 96*b*, and then connecting the migrated points. Also shown is displacement vector 96*c*. This displacement vector has resulted from the migration of a vertex point opposing segment 97', and has intersected the compensated segment 97'. In this instance, the LWC algorithm will move the compensated segment (not the vertex point as per the adjustments above) back towards the original segment it was derived from, keeping it parallel with the original segment, until the cross over is eliminated. In FIG. 24*g*, the original segment is designated by 97, and the moved compensated segment, designated by identifying numeral 97", is shown in phantom. As shown, the moved compensated segment is parallel with the original segment 97. Alternatively, the compensated segment 97' can be moved back towards the position of the uncompensated segment while simultaneously shortening the displacement vector 96*c* so that the final segments meet near the middle of the uncompensated region thereby resulting in a better approximation to the most proper locations of the final compensated segment.

After all the vertices have been migrated, they are connected to form the compensated segments. This completes the line width compensation process.

Turning back to FIG. 15, in step 39, a series of boolean intersections are next performed to form the non-overlapping regions U[i]', D[i], and L[i]'". The specific boolean operations which need to be performed are illustrated in FIG. 5, steps 17–21. Each of these steps comprises a boolean subtraction of one area from another or of one set of areas from another set of areas, which, as indicated previously, is equivalent to performing the boolean intersection between one area and the complement of the other. This section will explain the first embodiment of the implementation of the intersection operation. In the following discussion, it is assumed that the two polygons to be differenced are denoted as A and B.

The first step in this implementation is to take the complement of B. This is accomplished simply by breaking up the B polygon into its constituent segments, ordering the segments by their minimum z component, as described earlier, and then reversing, i.e., negating the orientation and biorientation values of each segment. For bigons representing collapsed solids, this step has the effect of turning these bigons into collapsed hollows.

The second step in this implementation is taking the intersection between A and the complement of B. To accomplish this, in a similar manner to that already described for B, polygon A is divided up into its constituent segments, and reordered by minimum z. Then, the list of segments for both A and the complement of B are merged. Upon merging the sets, crossing points of intersecting vectors are determined and the intersecting vectors are split into smaller vectors at these points. A further step then takes place on the merged segments, whereby overlapping segments are used to form segment groupings, such as bigons, which were discussed previously. A special case occurs if a first segment overlaps a second longer segment. In this instance, the second segment will be split up into a third segment of equal length to the first segment, and a fourth segment which is the remainder. The first and third segments are then combined into a bigon.

After the above steps have been accomplished, the merged segments are intersected with a plurality of spaced infinity lines, and the orientations of the segments are then used to derive the QV values associated with various portions of the infinity lines. Only if a segment triggers a transition in the QV value from below 2 through or to the number 2 (through the range of 1 to 2) will the segment be retained. All other segments will be discarded. The result is the boolean difference between the two polygons or sets of polygons.

The above differencing step is illustrated in FIG. 25. FIG. 25*a* illustrates the two polygons to be intersected, numeral 100 designating polygon A, and numeral 101 designating the complement of polygon B. As illustrated, the segments which make up polygon A, illustrated by reference numerals 100*a*, 100*b*, 100*c*, and 100*d*, are oriented in a counter-clockwise direction, while the segments which make up the complement of polygon B, identified by reference numerals, 101*a*, 101*b*, 101*c*, and 101*d*, are oriented in a clockwise direction, which is reversed from polygon A because of the complementing operation.

FIG. 25*b* illustrates these same segments after overlapping segments have been split up to form bigons, after these segments have been ordered by their minimum z component, and then intersected with a plurality of infinity lines which are sufficient in number so that each segment is intersected at least once. For example, segment 100*c* is split up into segments 100*c*' and 100*f*, and then segments 100*f* and 101*c* are merged to form a bigon. In addition, segment 100*d* is split up into segments 100*d*' and 100*e*, and then segments 100*e* and 101*d* are merged to form a bigon. The QV values associated with different portions of the infinity lines are shown directly adjacent to the corresponding portion of the infinity line. Each infinity line is assumed to originate at infinity, but unlike the union operation discussed previously, where the infinity lines were given an initial QV value of 0 (consistent with the assumption that they originated in a hollow region), here, each infinity line is given a QV value of one. This is because here, it is assumed these segments originate in a solid region, consistent with taking the complement of B.

Considering infinity line 102*a* first, the QV values associated with this line makes a transition from 1 to 2 as the line passes segment 100*b*, and makes a transition from 2 back to 1 as segment 100*a* is crossed. Therefore, these two segments will be retained.

Considering infinity line 102*b* next, the QV values associated with this line makes a transition from 1 to 2 as it crosses segment 100*b*, makes a transition from 2 back to 1 as segment 101*b* is crossed, makes a transition from 1 back to 2 as segment 101*a* is crossed, and then makes a transition from 2 back to 1 as segment 100*d*' is crossed. Therefore, segments 100*b*, 101*b*, 101*a*, and 100*d*' will be retained by virtue of this infinity line. Turning to infinity line 102*c* next, the QV value for this line makes a transition from 1 to 2 as segment 100*b* is crossed, changes from 2 back to 1 as segment 101*b* is crossed, and does not make a transition as segments 101*d* and 100*e* are crossed. (Note: These segments actually overlap each other and are shown offset from each other in the figure for illustrative purposes only. Therefore, since these segments overlap each other, and actually form a bigon as will be discussed subsequently, the QV value doesn't change.) Therefore, by virtue of this infinity line, segments 101*d* and 100*e* will be discarded.

It should be noted that the transition across the bigon will actually be more complicated than indicated above, and will take account of the biorientation value of the bigon, as discussed previously. Here, the biorientation value of the bigon will be 0. This is because the biorientation value for 101*d* will be 1, while for 100*e*, it will be −1 (reversed biorientation value as noted previously). The sum of these two values determines the biorientation value of the bigon. Therefore, the value of QV' after exiting the bigon (equal to the QV value just prior to the bigon) added to the bigon biorientation value will be 1. Since the value does not transition through or to 2, the bigon will not be retained.

Considering infinity line 102*d* next, the QV value for this line makes a transition to 2 as it passes through segment 100*c*', transitions back to 1 through segment 101*b*, and does not change as it passes through segments 101*d* and 100*e*. Moreover, the QV' value for this bigon is still 1. Therefore, by virtue of this infinity line, segment 100*c*' will be retained while decisions regarding the other crossed segments were previously made and remain uncontradicted by the present results (e.g., 101*b* to remain and 101*d* and 100*e* will be removed).

Considering infinity line 102*e* next, the QV value for this line does not make a transition as it passes through segments 100*f* and 101*c*, and also through segments 100*e* and 101*d*. In addition, the biorientation values for both these bigons will be 0. Therefore, the QV' values for these bigons will be 1. Therefore, by virtue of this infinity line, segments 100*f* and 101*c* will be discarded.

The end result is shown in FIG. 25*c*. A comparison with FIG. 25*a* shows that this polygon does, in fact, represent the boolean difference between polygons A and B.

Note that after the intersection operation, if any bigons had been retained, they would be converted back to individual segments. The orientation value for each segment while part of the bigon would be retained, but a biorientation value of 1 would be assigned to each segment.

Turning back to FIG. 15, the next implementation step to be discussed is skin retraction step 40. Skin retraction is performed during the vector generation step 24 in FIG. 5. Basically, in general terms, the net result of skin retraction is the retraction of skin vectors slightly at points where the vectors would otherwise intersect or overlay the borders used to generate these vectors. The benefits of performing skin retraction are to reduce over-exposure of certain areas, also to prevent the filling of areas too small to benefit from skin vectors and to prevent generation of excess skin vectors which must be stored and/or processed resulting in less efficient operation of the system, all of which were described previously.

Skin retraction is performed by adjusting all the borders (up-facing, or down-facing) inwards to create phantom borders while still retaining the original borders. The skin vectors and/or possibly hatch are then generated from the phantom borders using the skin generation algorithm to be discussed subsequently. The original borders are retained, since these, not the phantom borders, will be used to create the border vectors. Skin retraction, or more appropriately hatch retraction can be done in the layer borders L" or on the separate sets of layer borders L'" and up borders U' for the purpose of generating retracted hatch. This may similarly be done, as stated previously for the D borders as well.

The phantom borders are generated from the original borders, after these borders have been substantially line-width compensated, in steps 16, 22, and 23 in FIG. 5.

The adjustments made to the original borders in order to arrive at the phantom borders, is much less elaborate than line width compensation.

Basically, the only step performed is to displace, towards solid area, each border vector by the UBO or LBO value, while keeping each border vector parallel to the original border vector along with a substep of clipping vectors. Once the phantom borders are created, they will be converted into phantom segments. There is no need to split segments since crossing or overlapping segments will be processed properly by the algorithm.

Once the phantom segments have been created, the next steps are to merge them with the original border segments, and then sort the merged segments by the minimum-y dimension. Next, these segments are rotated, if necessary, in preparation of intersecting these segments with a plurality of spaced, parallel, horizontal infinity lines. Next, quantitative volume analysis is successively performed for each skin line to generate the skin vectors. As before, each infinity line is assumed to originate at infinity, which is further assumed to be a hollow, and has a quantitative volume value of zero at infinity. Next, considering each infinity line in turn, the quantitative volume value for each infinity line is incremented by the orientation value of each segment it crosses. When a transition is made from below 2 to or through 2, the generation of a skin vector at the intersection point is begun, and when a transition is made from 2 or above 2 to below 2, the generation of a previously-commenced skin vector is stopped. Note that this operation is very similar to the intersection operation described previously except boundaries are not actually fully determined.

Figure 26A:
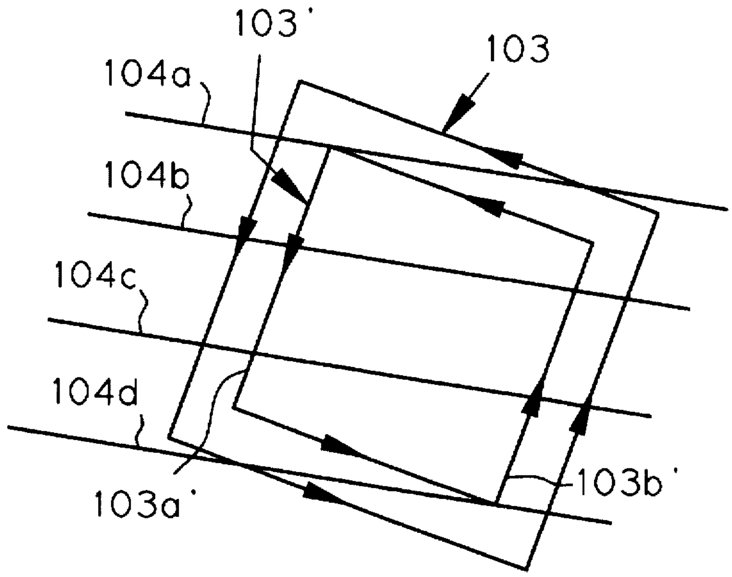
FIGS. 26a–26b illustrate skin vector generation.
Figure 26B:
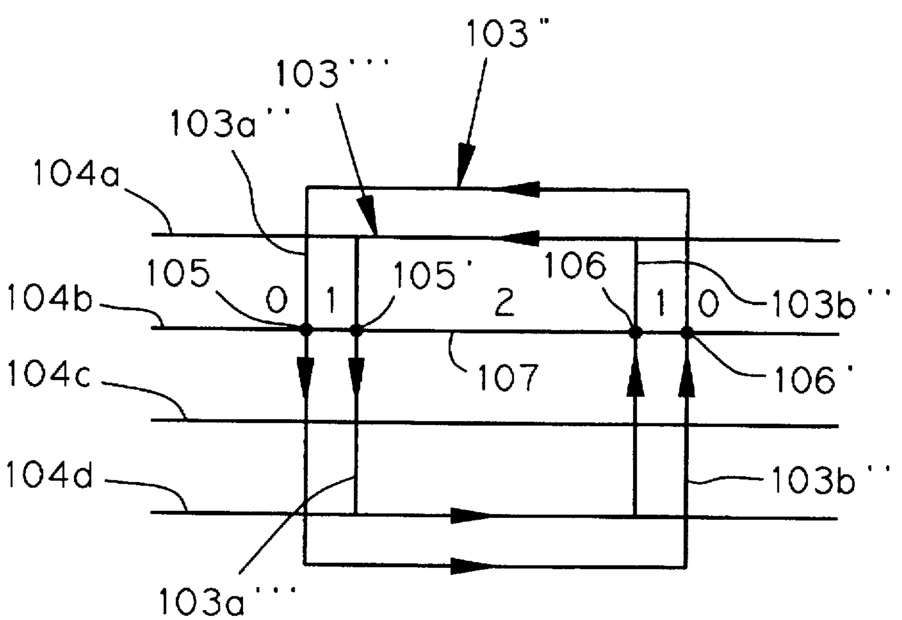

Skin vector generation is illustrated in FIGS. 26a–26b. FIG. 26a illustrates borders 103, and phantom borders 103', which may either be layer or up or down-facing borders, overlayed with infinity lines 104a, 104b, 104c, and 104d.

Presently, preferred algorithms for generating hatch and fill only do so by creating vectors parallel to the x-axis. Therefore, if hatch or skin vectors are to be generated parallel to a direction other than that of the x-axis, the boundary of the area being considered is rotated by an appropriate angle, the appropriate hatch or fill vectors are generated, then both the boundary and hatch or fill are rotated back. This is described further in U.S. Pat. No. 5,184,307, referenced earlier. This effect is shown in FIG. 26b. The rotated original borders are designated with numeral 103", and the rotated phantom borders are designated with numeral 103'".

Then, quantitative volume analysis is performed along each of the infinity lines. As indicated previously, all the lines are assumed to originate at infinity, where the quantitative volume number is 0. Then, at each intersection between a line and a segment, the quantitative volume number for the segment is incremented by the orientation value for the segment. Taking infinity line 104b as an example, at intersection point 105, the quantitative volume number for the segment is incremented by the orientation value for segment 103a" (which is 1), to arrive at a quantitative volume of 1. Next, at intersection point 105', the QV value makes a transition to 2. Therefore, at point 105', the generation of hatch or skin vector 107 is begun. Next, at point 106, the orientation number for segment 103b'" (which is −1) is added to quantitative volume number to arrive at a quantitative volume of 1. (As with previous figures, these QV values are indicated on the corresponding portion of the infinity line to which they apply). Since the quantitative volume value has made a transition from 2 or above 2 to below 2, the generation of skin vector 107 is ceased at point 106. Next at point 106', the QV value makes a transition to 0, which has no effect on the skin vector generation process. This completes the formation of skin vector 107. This analysis is successively performed for each of the infinity lines which intersect the segments.

Next, the border 103' (and the corresponding skin or hatch vectors) is rotated back to its original position. The previously-generated skin vector is also rotated along with the border.

Note that skin retraction only, and not hatch retraction, is performed in the this embodiment. However, hatch retraction could be performed as well in a similar manner to that described above for skin vector retraction, and is intended to be included within the scope of the subject invention.

Turning back to FIG. 15, in step 40, the rest of the vector types are generated, including border and hatch vectors. The border vectors are simply determined from the border segments, and the hatch vectors are determined from the border vectors in a manner similar to that described above for the generation of skin vectors, with the exception that the spacing of the hatch vectors will typically be wider than that for the skin vectors.

Figure 27A:
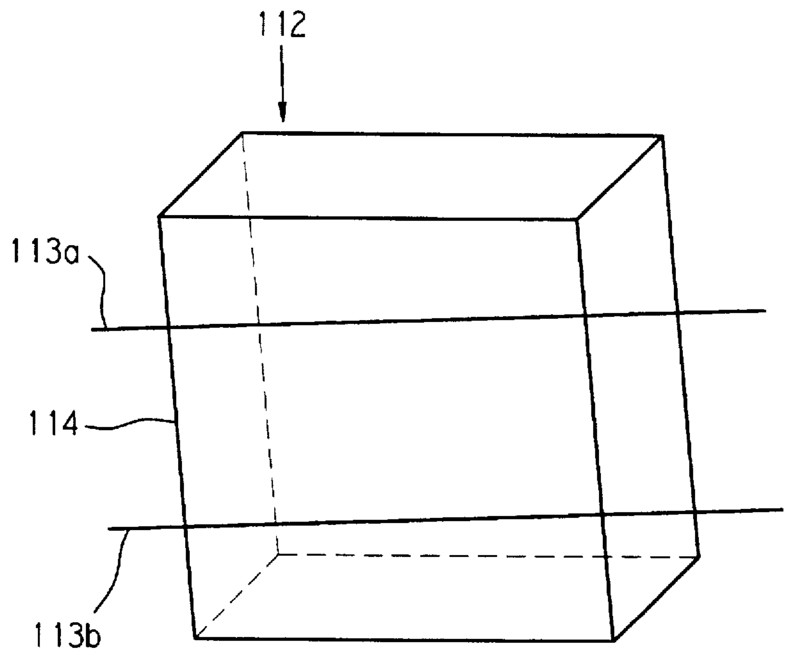
FIGS. 27a–27c illustrate the use of skin retraction to avoid skinning areas too small to benefit from it.
Figure 27B:
Figure 27C:
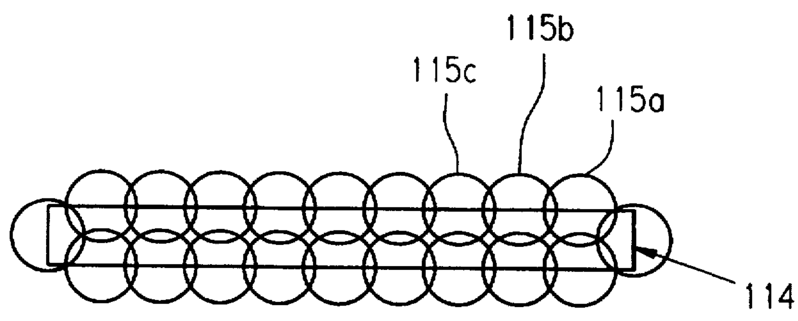

The use of skin retraction to prevent skinning of areas too small to benefit from it is illustrated in FIGS. 27a–27c. FIG. 27a illustrates skewed rectangular box 112, sliced by slicing layers 113a and 113b. Reference numeral 114 references the cross-section spanned by these two slicing layers, and FIG. 27b illustrates the layer boundary 114' for this cross-section, as viewed from above.

FIG. 27c illustrates this same area after the boundary has been traced by a beam of synergistic stimulation. As illustrated, the beam is typically moved in steps (which are greatly exaggerated), with a delay at each step, and successive beam traces, as the beam successively moves along the border, are identified with beam traces 115a, 115b, and 115c, etc. As shown, the width of each beam trace (in the actual case it would be the width of the relatively smooth line formed by the overlapping beam traces) is such as to completely fill in this area. In this instance, no skin vectors need be generated. This is somewhat analogous to the use of the MSA as described in U.S. Pat. No. 5,184,307, which served a similar purpose in deciding whether to generate skin vectors or not.

The following discussion provides further details about skin retraction. The discussion will be in terms of skin retraction, but will apply equally to hatch retraction.

Skin retraction is accomplished by moving the vertices of up or down-facing borders (already adjusted for line-width compensation while still part of the L border) inwards, then connecting the moved vertices to create phantom borders, and then generating the skin vectors from the merged set of original and phantom borders.

It is accomplished by migrating the vertices along vertex bisectors (as with LWC) until phantom borders drawn from the migrated vertices have been moved inwards by an appropriate amount (about one-half the cure width) from the original borders. If phantom borders from opposing sides touch, or cross over each other, then skin vector generation will automatically be suppressed in those areas since transitions to 2 or above 2 will not be made. Two illustrative examples are provided in FIGS. 28a–28c.

FIG. 28a illustrates a hollow four-sided pyramid 120 (only one side is visible in this sideview) framed by two slicing layers 121a and 121b to form cross-section 116. The layer boundaries for this cross-section are designated by numerals 117a and 117b. FIG. 28b illustrates a top view of these layer borders.

The phantom borders for borders 117a and 117b are shown in phantom (by dashed lines), and identified with identifying numerals 117a' and 117b'. As shown, the phantom borders cross; therefore, no skin vectors are generated. As movement is made along an infinity line which crosses the combined real and phantom borders, the transitions in QV are from 0 to 1 to 0 to 1 to 0 on one side and then 0 to 1 to 0 to 1 to 0 on the opposite side. This is indicated by the series of 0's and 1's at the bottom of the figure. Since no transitions through the range 1 to 2 occur, no skin or hatch is generated.

Another example is shown in FIG. 28c, in which the phantom border for border 118 is identified with reference numeral 119. The phantom border 119 comprises phantom borders 119a and 119b. As shown, the phantom borders for the top portion 118a of border 118, have collapsed into phantom border 119a, and are therefore discarded, while the phantom border 119b for the bottom portion 118b of the border 118 have not collapsed, and are therefore retained. As a result, skin vectors will only be generated for the area encompassed by phantom border 119b.

Next, in the creation of phantom borders, several additional steps are performed to further increase resolution and to avoid possible problems. First, the phantom borders at corners, where the angle of the corner is less than 180° as traversed through hollow, are clipped or rounded to further increase resolution, and to avoid the problem of not producing sufficient skin to prohibit possible drainage in the supposedly solid portions of these corners.

Figure 29A:
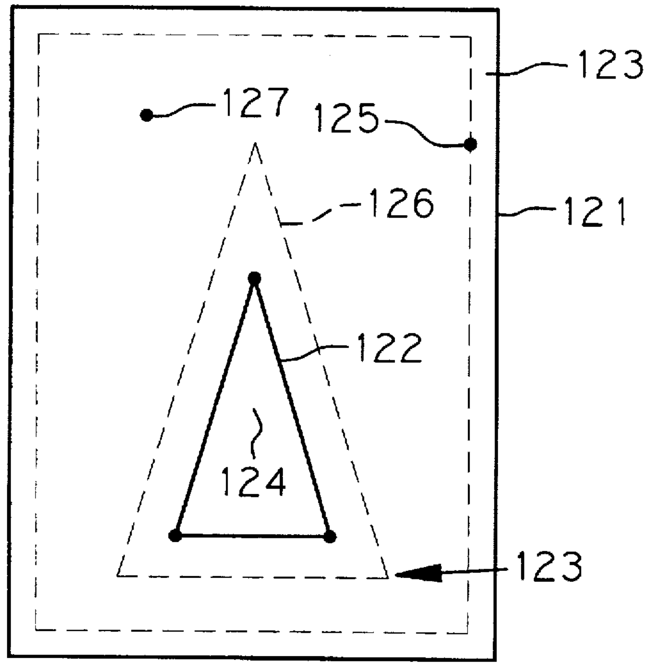
FIGS. 29a–29d and 30a–30d illustrate the clipping of phantom borders at corners.

An example of clipping is shown in FIGS. 29a–29d. FIG. 29a depicts a cross-section of an object along with various real borders and phantom borders that would be produced without utilization of clipping methods. The area 123 between outer boundary 121 and inner boundary 122 is an up-facing area of the layer and the area 124 enclosed by inner boundary 122 is a continuing area. Since area 123 is an up-facing area, skin fill vectors will be generated. However, the skin vectors will be formed in a reduced area 127 which is a subarea of area 123. This sub-area is located between outer phantom border 125 and inner phantom border 126 (drawn in phantom) due to skin retraction as discussed earlier. Phantom borders 125 and 126 are the borders which would be used to determine skin placement if clipping methods are not used. The amount of retraction used in creating phantom boundary 125 from real boundary 121, and phantom boundary 126 from real boundary 122, is typically somewhat less than the cure width associated with curing a vector to a depth equal to that which boundaries 122 and 121 will be cured with.

Figure 29B:
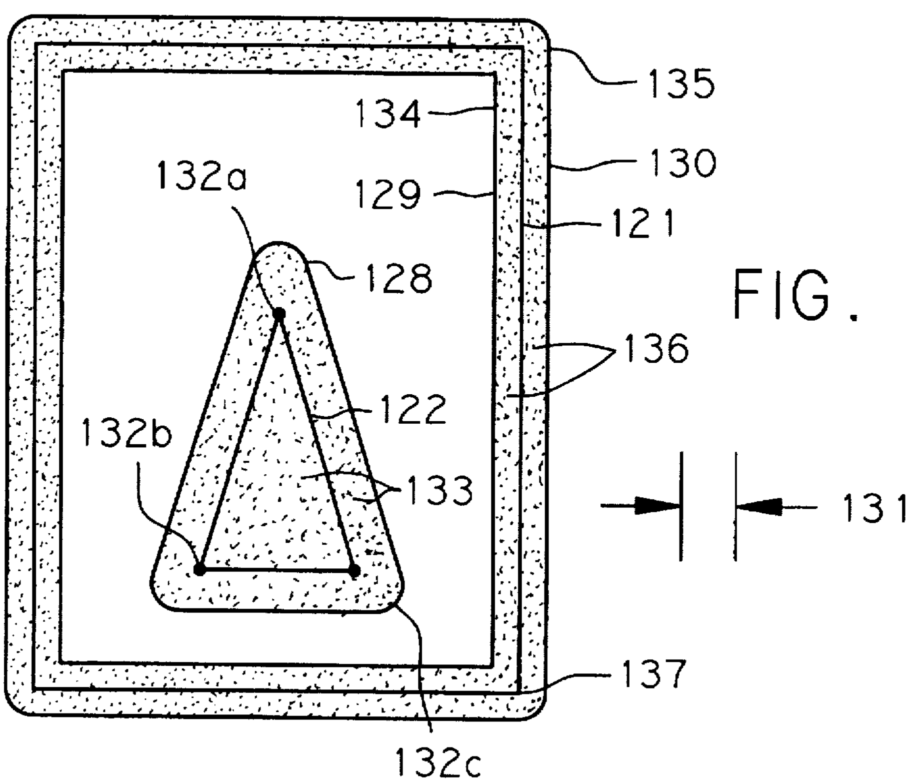

FIG. 29b depicts the same cross-section as 29a including the real cross-sectional boundaries 122 and 121. Surrounding boundary 122 is contour line 128. Contour line 128 represents the horizontal extent of cure that occurs when boundary 122 is traced with a beam of synergistic stimulation which induces a cure width of dimension 131. A contour which depicts the inner extent of cure when boundary 122 is cured is not shown since the entire area within 122 will be cured due to the size of the area and the width of cure associated with the beam. It can be seen that the extent of cure near vertices 132a, 132b, and 132c does not form sharp corners of cured material, but instead produces curved regions of cured material of radius similar to that of the cure width. The area cured when boundary 122 is exposed is represented by number 133 and is shaded by small dots. In a similar manner, when boundary 121 is exposed, the area 136 (represented by small dashes) between inner contour 134 and outer contour 135 is cured. From considering vertex 137, where two non-collinear boundary vectors meet, it can be seen that on the side of the vectors at the vertex where the angle between the vectors is greater than 180°, the extent of cured material will form a smooth curved surface whereas on the side of the vectors at the vertex where the angle is less than 180°, a sharp corner will be formed.

Figure 29C:
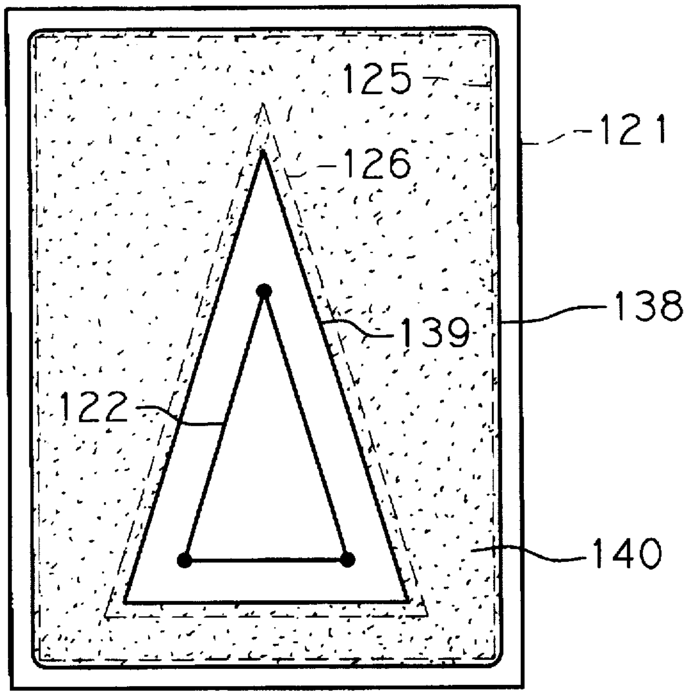
Figure 29D:
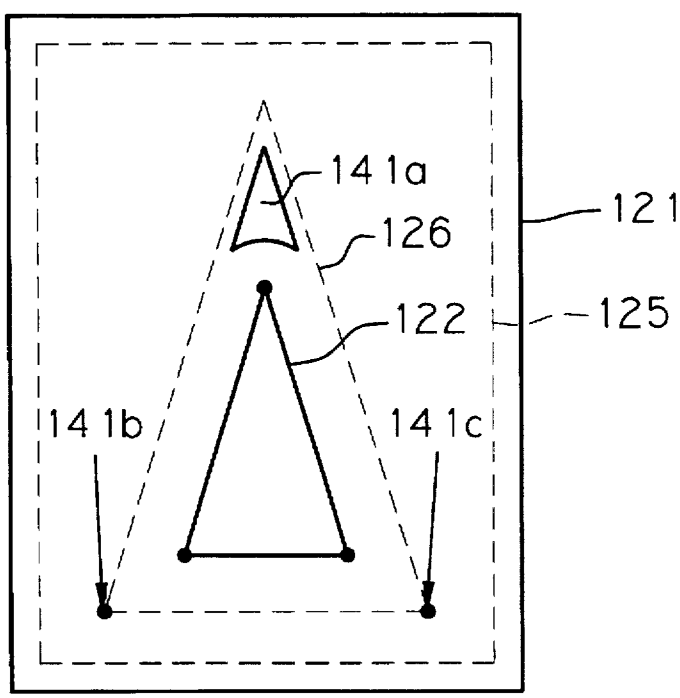

FIG. 29c depicts the same cross-section as did FIGS. 29a and 29b. Real boundaries 121 and 122 are depicted as well as phantom boundaries 125 and 126. Typically, when skin fill is exposed up to a boundary, the cured material associated with the skin fill will extend somewhat beyond the line of the boundary. When clipping methods are not used, skin fill is exposed between phantom boundaries 125 and 126. Contours 138 and 139 depict the extend of cure associated with curing the skin fill vectors up to phantom boundaries 125 and 126, respectively. Therefore, associated with the skin fill is cured material 140, extending between contours 139 and 138. This is depicted in this figure using small dots.

FIG. 29d again depicts the same cross-section, but this time, with the cured area described in association with FIGS. 29b and 29c superimposed. This superposition indicates that there are several regions 141a, 141b, and 141c, within the region that should have been entirely cured, but that did not get cured. Consideration of this Figure as well as the previous three Figures, indicates that when two non-collinear vectors meet, there is an inner and outer edge of cured material associated with the junction, the outer edge being on the side of the vectors where the angle is greater than 180°, while the inner edge is on the side of the vectors where the angle is less than 180°. When curing material along the vectors, the inner edge always forms a sharp corner and the outer edge always forms a curved region of transition from one vector to the other. This curved transition region always extends too little along the bisector of the angle, and this lack of extension becomes more severe as the inner angle becomes smaller. Therefore, when one is curing material in association with a portion of an original boundary that contains inner and outer sides, and wherein that portion of the original boundary is being offset in the direction of the outer edge of the boundary so that a secondary (phantom) boundary is formed which is to act as an inner side of a region to be cured, a difference in extent of cure occurs which results in an unexposed region of the part.

Since such uncured regions are undesired, a method of "clipping" has been developed which substantially eliminates the problems of uncured regions, at the cost of possible minor excess exposure in these regions. This method of clipping involves the creation of phantom boundaries that more closely resemble the cure that results from the exposure of the original boundaries. This correction to the phantom boundaries need only occur when the phantom boundary which is being created is offset from the original boundary toward the outer edge of a junction (of two vectors). This is how clipping is implemented in the presently preferred embodiment. Clipping is implemented when the junction is being offset in the direction of its outer edge, that is when the junction is being offset towards the side of the junction which has an angle which is greater than 180°.

It may be conceptually more convenient to literally offset all vectors, and for clipping to occur at all junctions followed by removing any negative areas which may be created. Alternatively, it may be more convenient to literally offset all vectors, recompute the intersection points, and form clipped vectors when an intersection point does not exist due to consecutive vectors no longer intersecting each other after the offset.

Figure 30A:
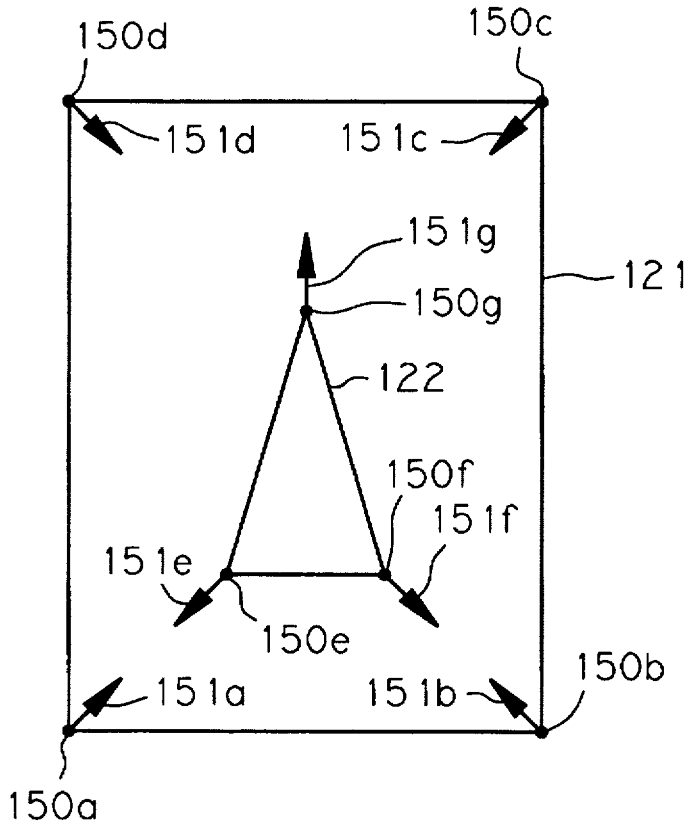
Figure 30B:
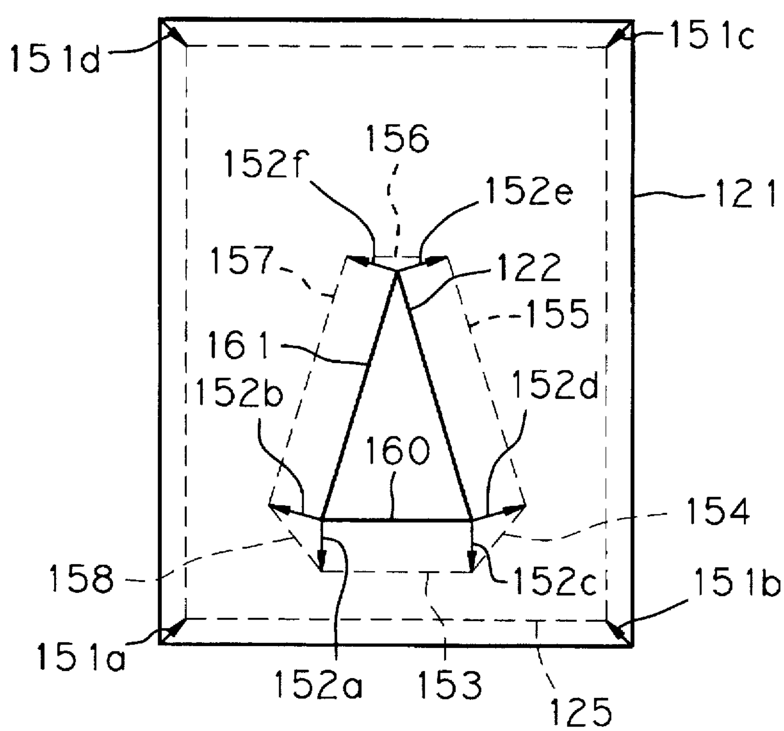
Figure 30C:
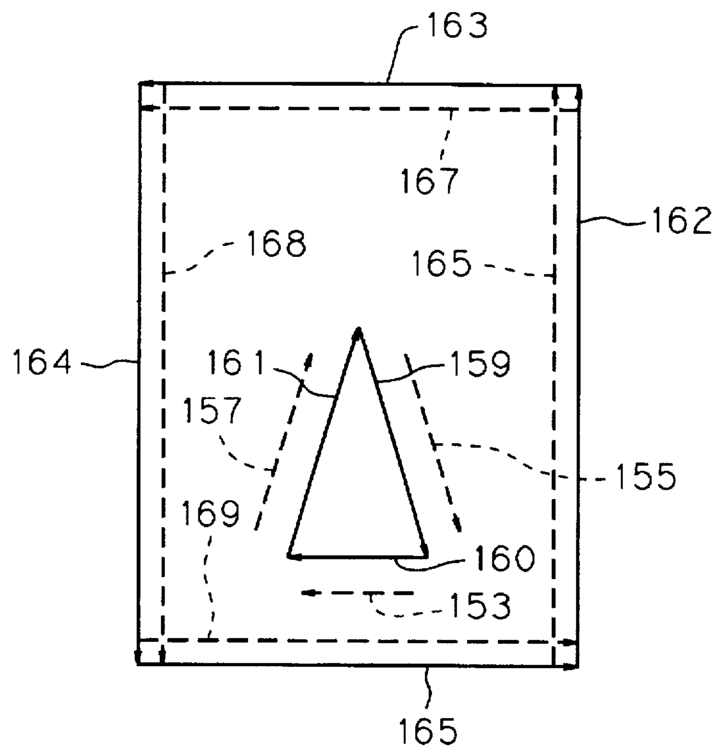
Figure 30D:
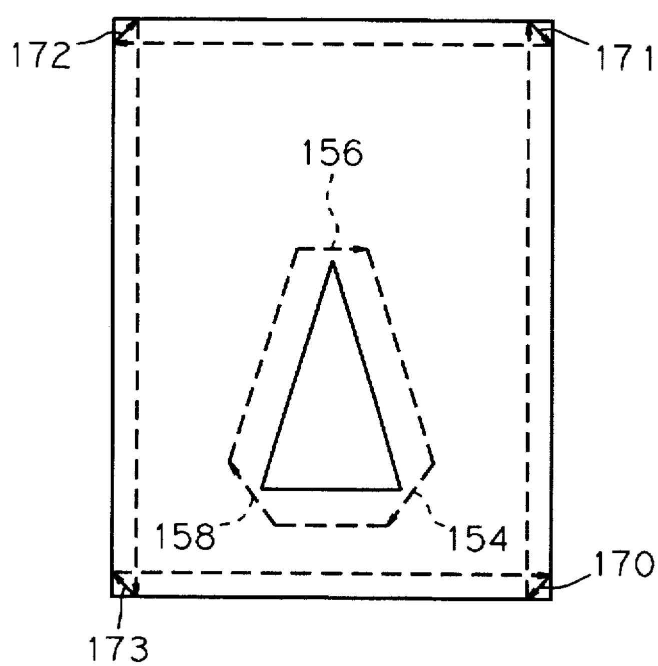
Figures 31, 31A:
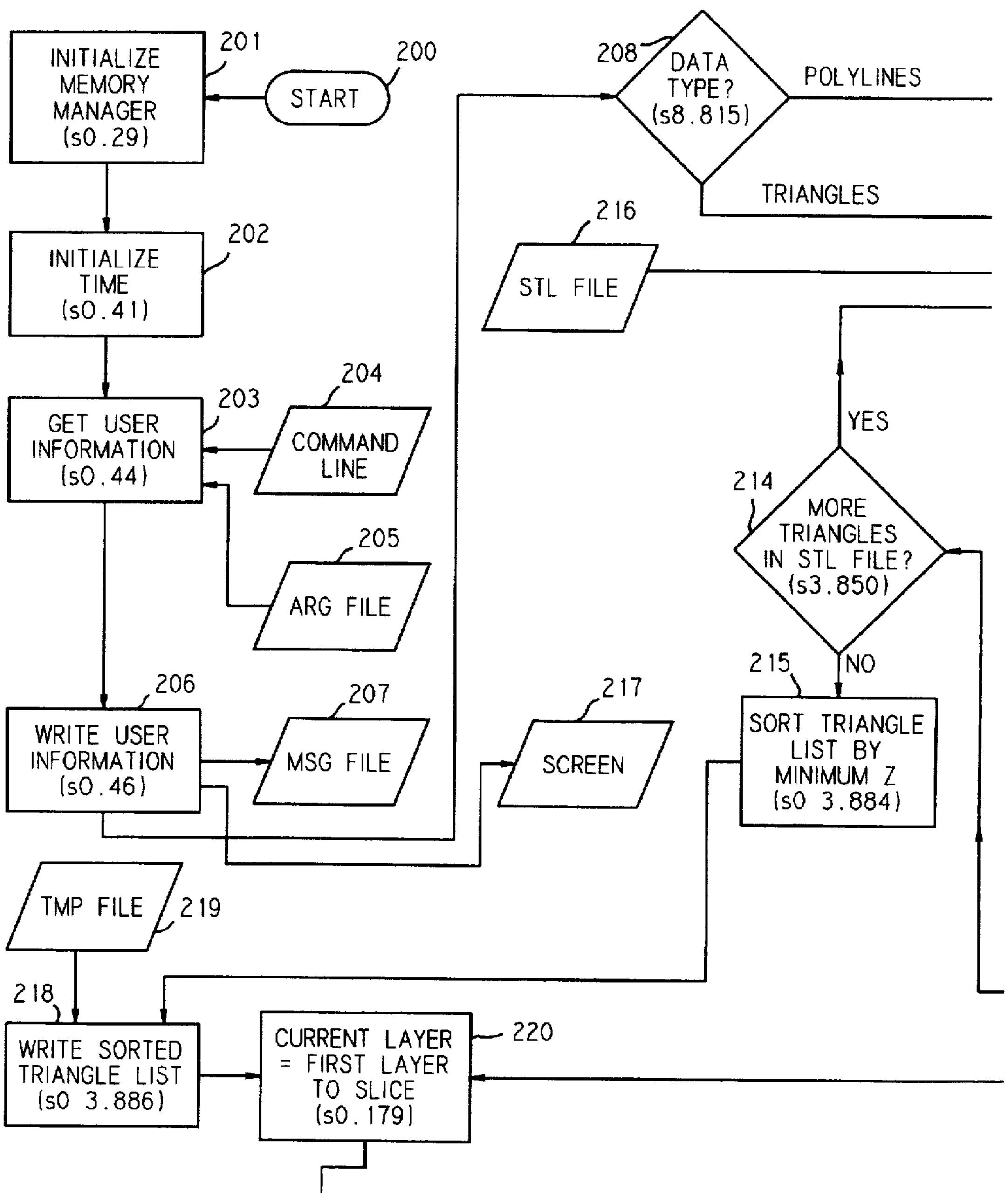
FIG. 31, comprising
FIGS. 31a–31d, is a flowchart of a second embodiment of the subject invention.
Figure 31B:
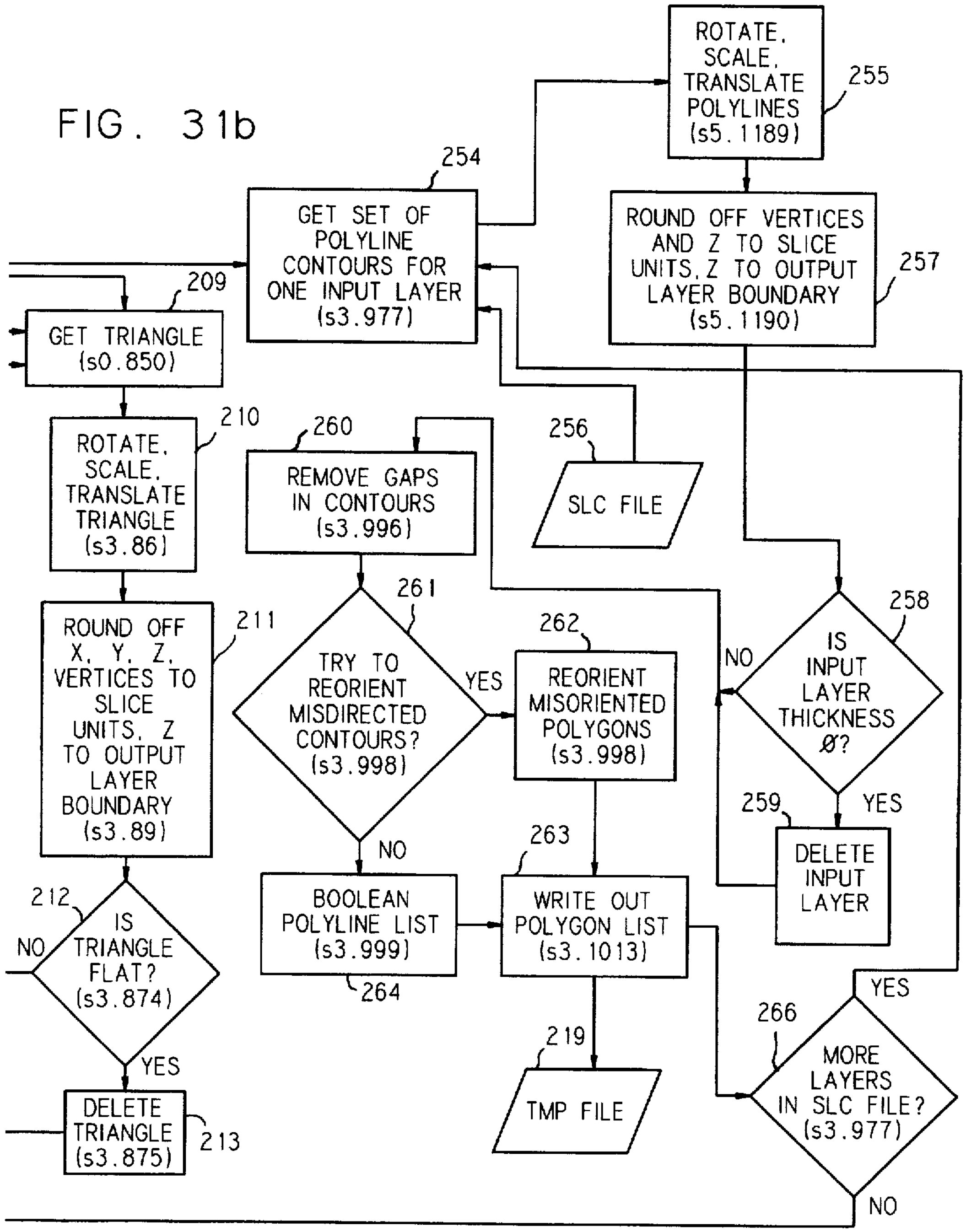
Figure 31C:
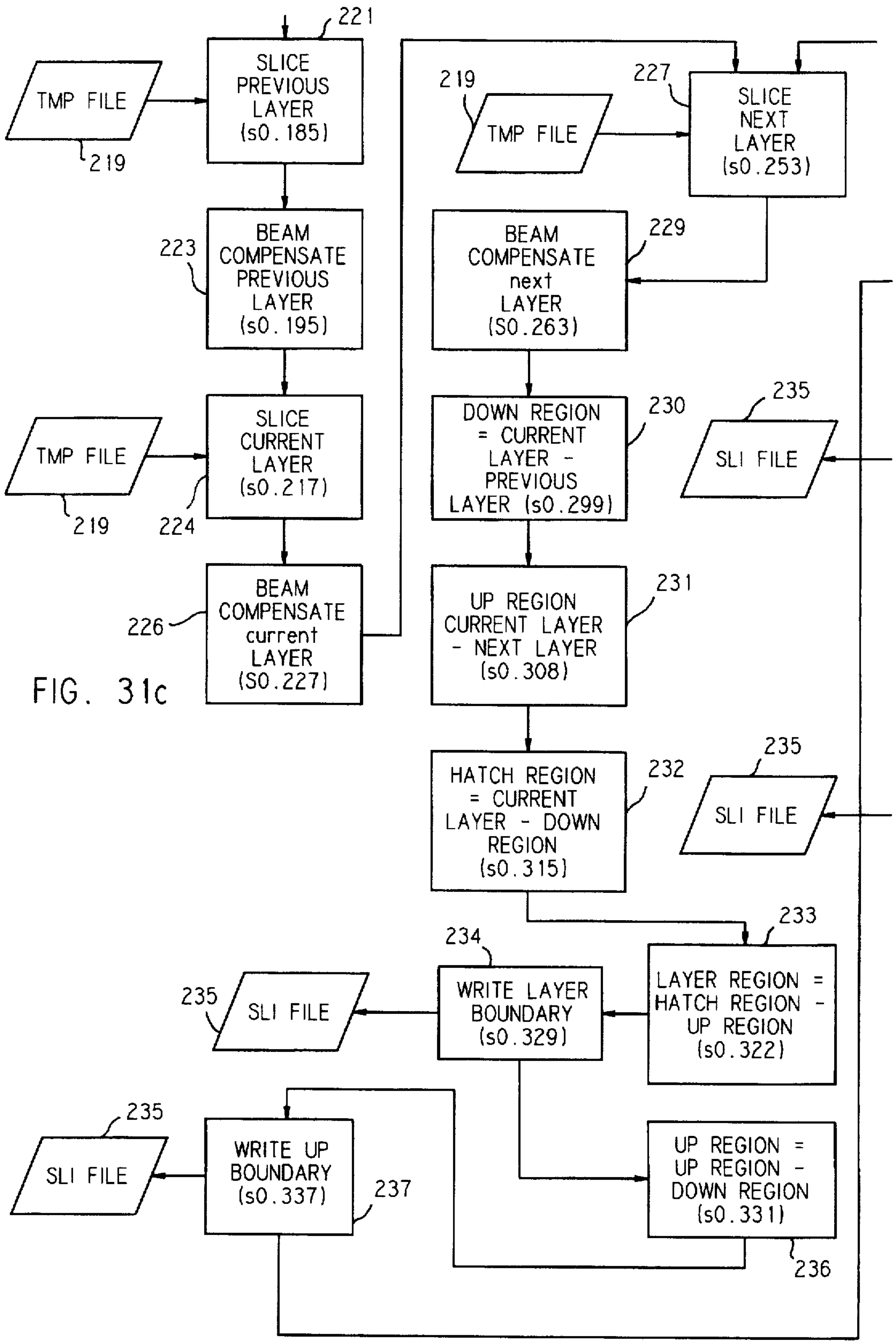
Figure 31D:
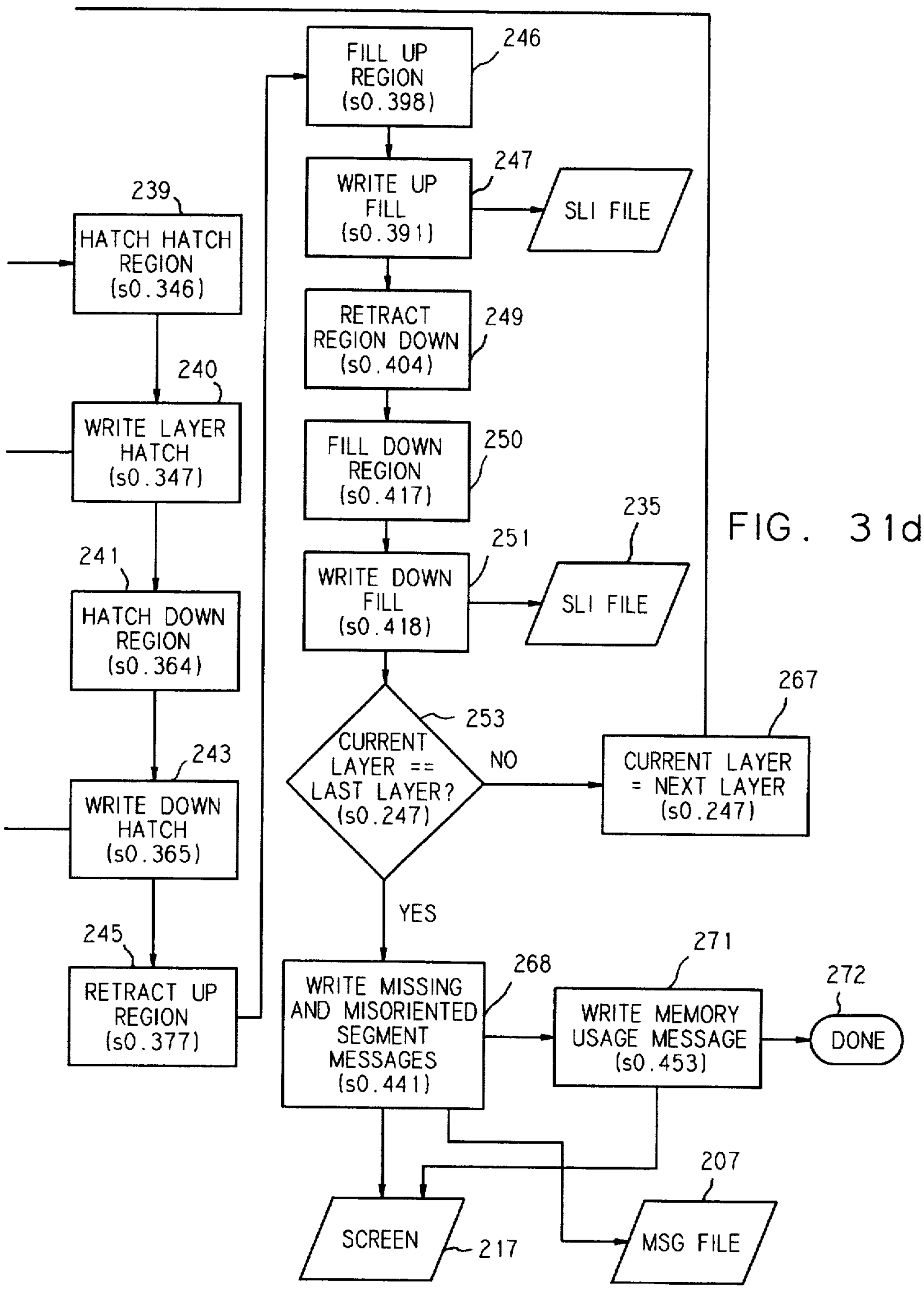

A method of implementing clipping, as applied to the example of FIGS. 29a–29d, is depicted in FIGS. 30a and 30b, along with a first alternative being described in FIGS. 30c and 30d.

FIG. 30a depicts the same cross-section as did FIGS. 29a–29d. Boundaries 121 and 122 are depicted along with vertices 150g—150g and associated vertex offset vectors 151a–151g. These offset vectors indicate the direction along which the vertices will be offset to form the phantom boundaries 125 and 126 of FIG. 29a. It can be seen that vertices 150a–150d are offset toward the inner edge of their respective junctions (toward the side which is formed by an angle less than 180°) while vertices 150e–150g are offset toward the outer edge of their respective junctions (toward the side which is formed by an angle greater than 180°). In this implementation, those vertices which are offset toward the inner edge are offset in a manner analogous to that described for cure width compensation. In other words, the vertex points are moved to the tips of their respective offset vectors. However, the vertices that are to be offset toward the outer edge are not shifted along a single displacement vector. Instead for this embodiment, each of the single angle bisecting displacement vectors 151e–151g are replaced by two displacement vectors, one associated with and perpendicular to each segment forming the junction. These two new offset vectors continue to indicate an offset to the same side of the junction as did the original offset vector. These new offset vectors are indicated in FIG. 30*b*, in which original offset vector 151*e* has been replaced by offset vectors 152*a* and 152*b*, original offset vector 151*f* has been replaced by offset vectors 152*c* and 152*d*, and original offset vector 151*g* has been replaced by offset vectors 152*e* and 152*f*. These offset vectors are formed by splitting the single vertex point into two vertex points along lines perpendicular to each junction vector individually. It can be seen in the figure that when both ends of a junction (boundary) vector are offset in this manner, this offsetting does not result in a change in length of the vector. Original boundary vectors 159, 160, and 161 become phantom vectors 155, 153, and 157, respectively. However, when a vertex is offset in this way, the original junction vectors are no longer adjacent. Instead, the splitting of the single vertex into two vertices results in the creation of an intermediate segment which connects the two vectors together. Such intermediate phantom segments are depicted in FIG. 30*b* as vectors 154, 156, and 158 for original vertices 150*f*, 150*g*, and 150*e*. These intermediate vectors are called clipping vectors since they clip off a portion of the area which would be incorporated on the inner side of the junctions if the vertices were allowed to offset in the previously described manner. It can be seen, by comparing FIGS. 29*a*, 29*b*, 30*a*, and 30*b*, that the phantom boundary comprising phantom vectors (or segments) 153–158 more closely approximates the outer extent 128 of the region cured when exposing boundary 122 than did the phantom boundary 126 obtained by the previously-described approach. This more accurate approximation forms the phantom boundary which will be used for determining the extent of cure associated with skin fill. Therefore, this more accurate approximation removes the undesirable untransformed regions 141*a*, 141*b*, and 141*c* of FIG. 29*d* that would typically be formed by the non-clipping approach described earlier.

FIGS. 30*c* and 30*d* depict another way of conceptually understanding and implementing clipping methods of skin retraction. Instead of offsetting vertices, all vectors can themselves be shifted perpendicular to themselves by the desired amount. This is indicated in FIG. 30*c* where vectors 159, 160, 161, 162, 163, 164, and 165 are the original vectors which, when offset, produce phantom vectors 155, 153, 157, 166, 167, 168, and 169 which are offset by the proper amount in the proper directions. It can be seen that all vectors retain their original length. Each boundary and phantom vector in the figure also contains an arrow head which indicates its respective orientation. Next, each pair of successive vectors, that no longer adjoin head to tail, have the gap bridged by the creation of an additional vector which is oriented in a manner compatible with the orientation of the pair. Several such bridging vectors are indicated in FIG. 30*d*. Vector 171 bridges vector 166 and 167, 172 bridges 167 and 168, 173 bridges 168 and 169, 170 bridges 169 and 166, 158 bridges 157 and 153, 154 bridges 153 and 155, and 156 bridges 155 and 157. Next, at points where vectors crossover, they are split into smaller vectors, so that independent polygons can be formed. These polygons are then evaluated to see if they should be retained for use as phantom borders for skin fill production. If a polygon is determined to contain negative area, that is if the quantitative volume associated with it is determined to be negative, it is removed from further consideration as a possible phantom border. On the other hand, if a polygon is determined to contain a quantitative volume with a positive or zero net value, it is retained as a phantom border.

An additional alternative method is to use the approach just described for offsetting entire vectors, followed by the creation of properly oriented bridging vectors for those pairs of successive vectors that no longer touch or cross each other (as described above). This is followed by the determination of intersection points (new vector heads and tails) for those pairs of successive vectors that did crossover each other, which is followed by the splitting of vectors where they crossover each other (this pertains to non-successive vectors), which is followed by the determination of consistently oriented polygons (all vectors in the polygon have compatible orientations). These polygons remain for further processing and removal of inconsistently oriented polygons, (where one or more vectors within a polygon have incompatible orientations), followed by the removal of polygons which contain negative areas. The remaining polygons are used to form the phantom boundaries which are used in determining extent of skin fill.

The computer software used to implement the first embodiment is advantageously written in the C language, and executes on an NEC, Silicon Graphics, or IBM compatible computer or the like. This computer is known as the SLICE computer, and is a component in an overall stereolithography apparatus described in any of the aforementioned co-pending applications, most notably Serial Nos. 331,644 (now U.S. Pat. No. 5,184,307); and 428,492. As described in these applications, the SLICE computer is coupled to a PROCESS computer, which, in turn, is coupled to a recoating means, and to scanning means. Alternatively, the SLICE computer and PROCESS computer may be a single computer. The recoating means typically comprises a z-stage elevator, a platform movable by the z-stage elevator in a z-direction, and a doctor blade sweepable in a plane spaced at or above a working surface of the stereolithography material. Recoating occurs by means of the PROCESS computer directing the elevator to lower the platform below the working surface by more than the desired layer thickness, raising the platform so that any excess material is within the path of the blade, and then directing the doctor blade to sweep the excess material away. The scanning means typically comprises x- and y-scanning mirrors for directing a beam of synergistic stimulation along the working surface in x- and y-directions, respectively. Scanning occurs by means of the PROCESS computer obtaining a vector from the data supplied by the SLICE computer (or alternatively from slicing the object itself and creating the vectors as needed), directing the scanning mirrors to position the beam at the tail of the vector, and then directing the scanning mirrors to move the beam to the head of the vector, at a particular velocity, whereupon the beam traces the vector on the working surface of material, and selectively transforms a desired portion of the material.

The SLICE computer typically receives a formatted object representation from an external source, and then generates the vectors from the formatted object representation. In U.S. Pat. No. 5,184,307, the external source described is a CAD system, which is assumed to have formatted a user-generated object representation in the specified format.

The SLICE computer typically generates the border, hatch, and skin vectors. However, other embodiments are possible. Ser. No. 428,492 describes a "slice on the fly" implementation, whereby the SLICE computer generates the border vectors only, and distributes hatch and skin vector generation to the PROCESS computer. Moreover, the PROCESS or SLICE computers need not be single computers, but can be a multi-processor configuration, in which parallel processing is employed. Ser. No. 428,492 describes a coupled processor configuration whereby one processor generates hatch and skin vectors, another processor performs drift and geometrical correction on the vectors, and a third processor issues positioning commands to the mirror, and monitors this positioning with respect to the desired positions. Also possible is an optical computer embodiment. Although no optical computers are presently available commercially, current research indicates they show promise in performing boolean operations optically. The proceedings of the 10th International Optical Computing Conference of 1983, contains a paper by J. Tanida and Y. Ichioka entitled "Optical Logic Array Processor" which gives further details on this topic. This referenced paper is fully incorporated by reference herein as though set forth in full.

Typically, the SLICE computer specifies the desired layer thickness for each layer, either from user input or from the data obtained from the external source, slices the object representation accordingly, and then passes this data to the PROCESS computer, which in turn directs the recoating means to provide a layer of stereolithography material having the specified layer thickness.

Because of the finite tolerance of the layer recoating process, it may not be possible to obtain a layer of material exactly of the desired layer thickness. Instead, it may only be possible to obtain a thickness which is within a few mils (i.e., 2–3 mils) of the desired thickness.

Therefore, as an alternative to the above, a "recoating on the fly" algorithm is possible (which is to be distinguished from the "slice on the fly" algorithm discussed previously), whereby recoating takes place first, the precise layer thickness is determined, and then the slicing algorithm is executed to slice the next layer representation out of the object representation, using this previously-determined layer thickness. The advantage of doing so is to ensure exact correspondence between the assumed layer thickness (which determines the exposure of the synergistic stimulation to be used to trace the layer) with the actual layer thickness. If the assumed value of thickness is greater than the actual value, then the present layer will be overcured by more than the desired amount into the previous layer, which can lead to associated distortion problems. If the assumed value of thickness is less than the actual value, then the present layer will be overcured by less than the desired amount into the next layer, which can lead to associated adherence problems. Exact correspondence between these two values will eliminate these two problems. Additionally, if a recoating method is used which is not self-compensating, as was the previously-described embodiment, then any slight error in thickness may continue to build up from layer to layer resulting in a final part whose vertical dimensions are out of tolerance.

A second and most preferred embodiment of the subject invention will now be described. This embodiment is very similar to the first embodiment. Therefore, only those aspects of the second embodiment which are deviations from the first embodiment will be emphasized.

As an overview of these deviations, a significant aspect of this embodiment is the ability to accept, as input, border representations of a three-dimensional object as opposed to just a tesselated triangle formatted object representation as per the previous embodiment. As a result, this embodiment can accept input directly from a CAT Scan system or the like, which provides input in the form of a plurality of spaced, cross-sectional scans of a three-dimensional object. Each of these cross-sectional scans will include information descriptive of the borders of each scan, and this is the information which this embodiment requires. Of course, this embodiment retains compatibility with the tesselated triangle formatted object representation as per the first embodiment, which is provided by most commercial CAD systems. Another deviation of this embodiment is the orientation values assigned to the segments. In the previous embodiment, all segments were oriented according to the right hand rule, and segments pointing downwards were assigned an orientation value of 1, while those pointing upwards were assigned an orientation value of −1. In this embodiment, this is reversed, with upward-pointing segments being assigned an orientation value of 1, and downward-pointing segments being assigned an orientation value of −1. Then, to compute the QV value along the infinity lines, at the intersection points with the segments, in the course of performing a union operation, intersection operation, hatch generation, or skin generation, the orientation values are subtracted from the QV value just prior to intersecting the segment, instead of being added to this QV value as per the previous embodiment. Therefore, the target transition values for all these operations can remain the same.

Another important aspect of this embodiment is its ability to slice larger STL files with less or no use at all of virtual memory. In this embodiment, an STL file is read, the triangles are sorted by their minimum z values, and the sorted triangle data is output to a temporary file. Then, the SLICE program only brings into memory the triangle data pertaining to a desired range of layers as opposed to holding the whole STL file in memory during the processing. After processing the various layers that a particular triangle pertains to, the triangle is discarded from memory. This reading in of only necessary triangles results in two significant benefits: (1) More memory is left available for the slicing process thereby reducing the need for memory swapping to the hard disk, and also resulting in faster slice times for files that would have required memory swapping; and (2) the need for maintaining large quantities of memory is reduced thereby reducing the cost of the computer system.

Various alternative schemes can be used that lead to various additional advantages. The first of these alternatives is to not create a sorted STL file but to instead create a table, by scanning the STL file, that contains information on how many triangles are associated with each layer. Then, each time additional triangle data is needed, the file can be scanned and triangles loaded into memory until the proper number of them have been loaded. This has somewhat of a disadvantage in processing time over the previous approach but has the advantage of not requiring hard disk space to store an extra (sorted) STL file.

A second alternative or set of alternatives is with regard to loading in as much of the STL file as possible but avoiding the need to utilize time-consuming virtual memory. The amount of memory needed to process a given layer is, to a large extent, based on the number of triangles that contribute to vector formation on that layer. Therefore, an embodiment can be used where the number of triangles associated with the necessary process for each layer can be determined. This information can then be matched to the estimated amount of additional memory needed to process the triangular data into vectors. Then, the optimum amount of input data can be read in at the optimum times in order to minimize the number of disk accesses and to maximize memory use thereby minimizing the slicing time associated with large files. For some files, these techniques will not only optimize the slicing process, but they may be necessary to ensure the ability to slice extremely large files with a reasonably priced and sized computer.

Additional features of the presently preferred embodiment are discussed in Appendix A. Some of these features, especially those associated with the large variety of user specifiable parameters, make the SLICE program extremely powerful and versatile.

This completes an overview of the major deviations. A flowchart of the second embodiment, provided as FIGS. 31*a–d* will now be discussed.

In this embodiment, functionality is provided in the form of computer software, executing on the SLICE computer. This program is also designed to be executable on the PROCESS computer as well. At present, the computer software is known as SCHLEISS, and comprises seven modules, known as S0.C to S6.C. A user's manual for SCHLEISS is provided in Appendix A, and a program listing is provided in Appendix B. The major functions performed by each module are listed in the header information contained at the beginning of the computer listing for that module, and are also provided at pp. 5–18, 20–29, and 81–118 of Appendix A. Module S0.C is the first module to be executed, and is the major module dictating the sequence in which all the remaining modules are invoked. The flowchart provided in FIGS. 31*a*–31*d* is keyed primarily to lines in the listing of S0.C.

Turning to FIGS. 31*a*–31*d*, the elliptically shaped polygons represent starting and stopping points of SCHLEISS, the rectangular-shaped polygons all represent process steps, the diamond polygons all represent decision points, and the trapezoidal-shaped polygons all represent input or output files. As indicated previously, for each process step, the flowchart indicates the particular SCHLEISS module, and the line number within that module, where that particular process step is executed.

In step 200, the SCHLEISS program is started. In step 201, the memory manager is initialized. Briefly, the memory manager allocates and deallocates memory in response to requests by the various SCHLEISS functions. The specific functions performed by the memory manager are provided on pp. 82–83 of Appendix A.

In step 202, the time counter is initialized. Briefly, this counter is incremented as the execution of the program progresses, and is used to keep track of and possibly record the execution times of the various SCHLEISS functions. The specific SCHLEISS routines to keep track of this timing are listed on pp. 83–84 of Appendix A.

In step 203, SCHLEISS obtains the specifications for slicing from the user. The specific SCHLEISS routines for obtaining this information are provided on pp. 86–88 of Appendix A.

As indicated, the user information is obtained from both command line 204 and from arg file 205. The specific parameters which can be specified in the command line, as well as the required format for the command line, are listed on pp. 32–33 of Appendix A. Another vehicle available to a user for specifying parameters is the arg file 205. The parameters that can be specified in the arg file, and the required format for this file, are set forth on pp. 41–42 of Appendix A.

In step 206, SCHLEISS writes out the user-specified parameters to both msg file 207, and screen 217. The screen is the output screen for viewing by the user, while the msg file is simply a file where this information is stored. In step 206, the same information written out to the msg file is written out to the screen. Pages 57–60 provide more detail about the format of the msg file and the screen.

In step 208, a query is made as to the type of input. As indicated previously, the input may either be in the form of triangles, or alternatively, may be in the form of border representations known as polylines.

The situation where triangles are input will be considered first. In step 209, the triangles are obtained from STL file 216. The format of the STL file is described at pp. 46–48 of Appendix A.

In step 210, the triangles are rotated, scaled, or translated according to the user-specified parameters. This step is described in more detail at pp. 54–56 of Appendix A.

Next, in step 211, the x, y, and z coordinates of all triangle vertices are rounded to slice units, and in addition, the z coordinates of all vertices are rounded to the nearest slicing plane. Only the z coordinates are so rounded since the z-axis is the assumed slicing axis. This step is referred to on pp. 7 and 120 of Appendix A.

Then, in step 212, a query is made to determine which triangles are flat triangles. Then, in step 213, all flat triangles are deleted. Flat triangles are deleted, since they are redundant to the other triangles in terms of creating layer boundaries.

In step 214, a query is made as to whether any triangles remain in the STL file. If so, a loop is made back to step 209, and steps 209–214 are repeated until no further triangles are available.

In step 215, as discussed previously with respect to the first embodiment, the triangles are sorted by the minimum z coordinate of any of their vertices.

In step 218, the sorted triangles are written out to tmp file 219. The format of the tmp file is described on pp. 54–56 of Appendix A.

In step 220, the "current layer" indicator is initialized to the first layer to slice. In the current implementation, this is the first layer of the object which is comprised of data obtained from between the first and second slicing planes. The created cross-sectional data is then associated with the z value of the upper slicing plane.

In step 221, the previous layer, i.e., region below the first slicing plane (which yields data) is sliced yielding the null set of vectors.

Slicing is done in the manner described previously with respect to the first embodiment, to obtain a net layer boundary comprising intersections between the triangles in the tmp file 219 and the two slicing planes bounding the layer. Slicing is also described at p. 69 of Appendix A.

In step 223, this boundary is beam compensated in the manner described previously with respect to the first embodiment. This step is additionally described at p. 74 of Appendix A.

Then, in steps 224 and 226, the current layer is sliced and compensated using the triangles in tmp file 219, to form a boundary for the current layer utilizing intersections between the triangles and the slicing planes bounding the layer. These compensated boundaries are the singly adjusted layer boundaries, L[i]', discussed previously.

Next, in steps 227 and 229, the next layer is sliced and beam compensated to provide a beam-compensated boundary for the next layer in the manner previously described with respect to the first embodiment.

Next, in step 230, any down-facing region associated with the current layer is computed by taking the boolean difference, in the manner described previously with respect to the first embodiment, between the layer boundaries for the current layer and the previous layer. This step is briefly discussed at p. 58 of Appendix A. The boolean difference operation is additionally described on pp. 70–72 of Appendix A. These boundaries are used to generate the FDB vectors previously described with respect to the first embodiment.

In step 231, any up-facing region for the current layer is computed, in the manner described previously with respect to the first embodiment, by taking the boolean difference between the current layer boundary and the next layer boundary.

In step 232, the hatch region for the current layer is computed as the boolean difference between the current layer boundary and the boundary for the down-facing region.

In step 233, the layer boundaries are compensated by removing any down-facing regions and any up-facing regions from the area encompassed by the hatch boundary. This is accomplished by taking the boolean difference between the hatch region and the up region. These layer boundaries are the thrice-adjusted layer boundaries, L[i]''', discussed previously, and are used to generate the LB vectors also previously described.

In step 234, the LB vectors for the current layer are written out to sli file 235. The format of the sli file is set forth on pp. 61–68 of Appendix A.

In step 236, any up-facing boundaries are adjusted to remove any down-facing regions encompassed by these boundaries. This step is performed in order to prevent the down-facing regions from getting over-cured. These boundaries are the adjusted up-facing boundaries, U[i]', discussed previously and are used to generate the FUB vectors. In step 237, the FUB vectors are written out to sli file 235.

In step 239, the hatch region is hatched in the manner described previously. Hatching is also discussed on p. 73 of Appendix A. Hatching results in the LH vectors described previously. In step 240, the LH vectors for the hatch region are written out to the sli file.

In step 241, the down-facing regions are hatched. These regions are hatched separately from the rest of the layer boundary so they will not be overcured. This step results in the NFDH vectors described previously.

In step 243, the NFDH vectors are written out to sli file 235.

In step 245, the up-facing boundaries for the up-facing regions on the current layer are retracted in the manner described previously. This step is also discussed on p. 75 of Appendix A.

In step 246, the fill vectors for the retracted up-facing boundaries are generated in the manner described previously. This results in the FUF vectors described previously. This step is also described on p. 73 of Appendix A.

In step 247, the FUF vectors are written out to sli file 235.

In step 249, the down-facing boundaries are retracted in the manner described previously. This step results in the adjusted down-facing boundaries, D[i]', described earlier.

In step 250, the fill vectors (the FDF vectors) for the down-facing regions are generated in the manner described previously, and in step 251, these vectors are written out to sli file 235.

In step 253, a query is made to determine if the current layer is the last layer in the STL file. If not, in step 267, the "current layer" indicator is set to the next layer, and steps 227, 229–234, 236–237, 239–241, 243, 245–247, 249–251, and 253, previously described, are repeated for this layer.

When all layers have been processed, in step 268, messages regarding missing or misoriented segments are written out to the output screen 217, and to msg file 207. The format of the msg file is provided on pp. 58–60 of Appendix A. The output screen is discussed on p. 57 of Appendix A.

In step 271, memory usage messages are written out to the screen and msg files. An example of these messages are shown on pp. 58–60 of Appendix A.

In step 272, the process is considered completed.

Turning back to step 208, the case where the inputted data is already in the form of layer boundaries will now be described. As indicated, the input data should be in the form of polylines, described in more detail on pp. 49–53 of Appendix A. These are obtained from SLC file 256.

In step 254, the polylines for a given layer are obtained, and in step 255, these polylines are rotated, scaled, and translated according to user-specified parameters, in a similar manner to that described previously for the triangles.

In step 257, in a manner similar to that described previously for the triangles, the polyline vertices are rounded to sli units, and the z-component of each vertex is rounded to the nearest slice layer.

In steps 258–259, all polylines having an inputted layer thickness of 0 are deleted, since these layers represent layers which have collapsed upon rounding, and which therefore, are redundant.

In step 260, any gaps in the polyline contours are filled by generating additional segments to fill in the gaps, and in step 261, a user-specified flag is checked to see if misdirected segments are to be reoriented. If so, in step 262, one attempt is made to reorient any misdirected segments in a polyline contour. This can be detected, since all segments within a polyline contour are expected to obey the right hand rule, whereby segments in a contour enclosing a solid do so in a counter-clockwise direction, while segments in a contour enclosing a hollow do so in a clockwise direction. For example, if all segments in a contour except one follow a counterclockwise oriented loop, these segments are assumed to enclose a solid, and the direction of the one segment will be changed to be consistent with the others.

If the user-specified flag is not set, a jump is made to step 264. In this step, adjusted segments are combined as much as possible. This step is described on pp. 70–72 of Appendix A.

In step 263, the polylines are written out to tmp file 219. The format of the tmp file is described on pp. 54–56 of Appendix A.

In step 266, a query is made as to whether any additional layers exist in the SLI file. If so, steps 254, 255, 257–264, and 266, described previously, are repeated for each layer in the SLI file.

Then, a jump is made to step 220, and the same process described previously, beginning with step 220, is performed using the tmp file 219.

The above completes a description of a flowchart of the implementation of the second embodiment. Next, some additional aspects of Appendix A will be described.

Pages 44–45 describe the use of the MAT file. Pages 70–72 describe the segment operations which are available in the software. Page 73 describes the operations available in the software for performing hatch and fill generation. Pages 76–80 describe error tests available in the software. Page 119 describes differences between a recent version of the software and a previous version.

Pages 81–118 provide a functional description of SCHLEISS modules S0.C to S6.C, i.e., it lists the major functions provided in each module. Again, the actual listing of the software is provided in Appendix B.

Another file, SMAKE, when executed, calls SCHIRIS-.MAK, which, in turn, appropriately combines S0.C to S6.C, and S.H.

In the previously-described embodiments, the resulting object will be oversized compared to the original representation of the object. In essence, the oversizing is not in the vertical dimension of the object formed, it is basically in the horizontal dimensions of the object formed. However, whenever a horizontal dimension is cured in excess, a corresponding one layer thickness of cured material will result in the region of excess where there should have been a cure thickness of something less than one layer thickness. As described previously, the accuracy of reproduction of an oversized object can be increased substantially by sanding off the discontinuities between layers in the regions of the object, whose design did not specify such discontinuities (corresponding to sloped regions in the original design). Objects formed by this oversized style basically have at least a portion, on each layer, of their surface that match the envelope of the object representation while the other portions of the surface of the formed object extend the solid portions of the object beyond the envelope.

There are other styles that lead to other sized objects, wherein these other sized objects have advantages in terms of object buildability, or in terms of object accuracy. One such embodiment forms undersized objects that are in essence opposite to the oversized objects previously described. Such an undersized style is disclosed in previously referenced U.S. Pat. No. 5,184,307. Objects formed by this undersized style basically have at least a portion, on each layer, of their surface that match the envelope of the object representation while the other portions of the surface of the formed object do not extend the solid portions of the object up to the envelope. A basic form of this style can be easily implemented by a slight modification to the earlier described embodiments of the present invention. The modification involves a change in the information and boolean operations used to form the initial layer boundaries for a given cross-section. These layer boundaries L[i] are derived by finding the intersection of the area of the S[i−1]+ borders with the area of the S[i]− borders. In this embodiment, the projection information is not used. After formation of all of the L[i] boundaries, the previously-described operations are used to determine the up, down, and new layer boundaries for each layer. This undersized embodiment is particularly useful when discontinuities are to be filled in. This filling in can be done by application of a post-processing technique which fills the discontinuities with material and transforms this material to become part of the final object. Alternatively, and more preferably, this filling in of discontinuities can be performed on a layer-by-layer basis as the object is being formed. Techniques for, and advantages of methods for achieving such coatings are described in previously-referenced, concurrently filed U.S. Pat. No. 5,209,878.

Another style produces objects which are more undersized than those of the previous embodiment. This style is used to build objects whose maximum solid extent does not result in the appropriately registered reproduced object and object representation envelope contacting each other. This type of sized object is useful when, after formation, the entire surface of the object is to be coated, even in areas that do not contain discontinuities, with a material (e.g., paint, powder coating, metallic coating). So that the surface of the coated object will more closely match the envelope of the object representation, the entire surface of the object must be retracted into the solid regions. This building style can be implemented by the techniques of the present invention. It requires layer comparisons (especially differencing) to offset the down-facing and up-facing features away from their original positions by the appropriate amount (this amount should be approximated by an integral number of layer thicknesses) so that the down-facing and up-facing portions of the object do not contact the object envelope. It also requires a form of LWC or boundary retraction so that horizontal solid portions of the layers can be retracted away from the object envelope.

A style calling for an averaged sized object can also be implemented based on the techniques of the present invention. This implementation involves the use of additional slicing planes which are located, one each, midway between the slicing planes used to define the positions of triangle vertices of the object representation. The initial layer boundaries L[i] are determined from intersections of the intermediate (midpoint) slicing planes with the triangles that form the representation of the object. These initial layer boundaries are processed according to the teaching previously disclosed to determine up-facing, down-facing, and net layer regions for each cross-section of the object. These initial layers boundaries are conceptually associated with the higher of the two original slicing planes which bound the vertical extent of the layer. After determination of the various net regions associated with each cross-section (or layer), an object can be formed which will be of average size as compared to the objects built by the undersized and oversized styles previously described. In other words, the discontinuities which form due to the object being reproduced on a layer-by-layer basis, wherein the layers have finite thickness, are formed half extending beyond the envelope of the object and the other half falling short of the envelope.

Figure 32A:
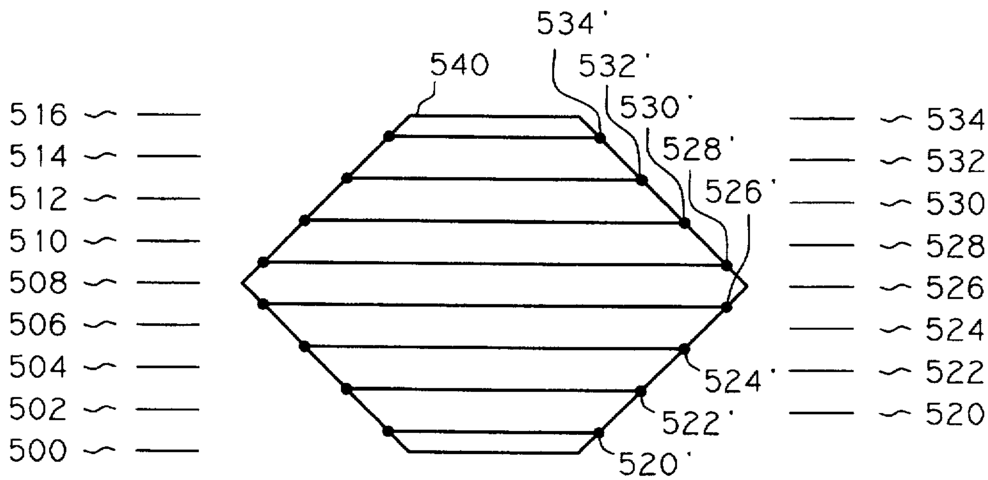
FIGS. 32a–32d illustrate the use of various building styles with the subject invention.
Figure 32B:
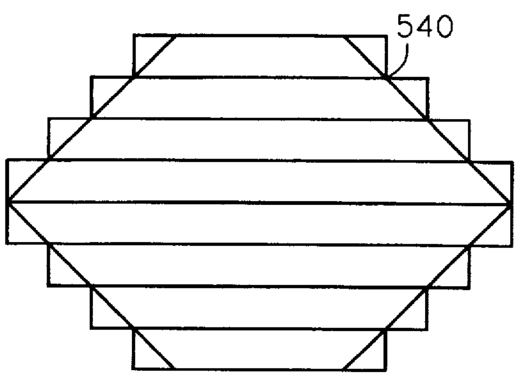
Figure 32C:
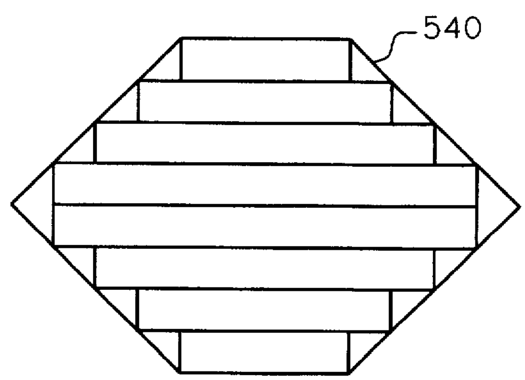
Figure 32D:
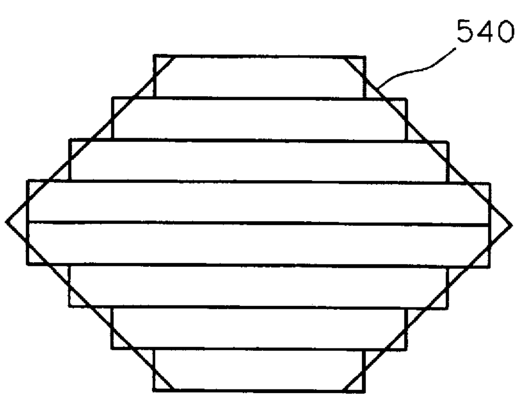

FIG. 32*a* depicts a two dimensional view (the two dimensions being the vertical dimension and one horizontal dimension) of an object envelope 540 of an object which is to be formed by stereolithography. Planes 500, 502, 504, 506, 608, 510, 512, 514, and 516 depict the vertical position of the slicing planes which bound the vertical extent of each layer to be formed and define the possible vertical locations that triangle vertices can be rounded to. Slicing planes 520, 522, 524, 526, 528, 530, 532, and 534 are additional slicing planes of the "average size" embodiment and define the vertical dimension from which intersection segments with the triangles will be obtained. The data obtained from slicing plane 520 will be associated with slicing plane 502, since it represents the average positions of the cross-sectional information between slicing planes 500 and 502. Similar upshifting of data obtained from the other intermediate slicing planes will occur. FIG. 32*b* depicts the same object envelope 540 superimposed over layers of the object formed using an oversized building style. FIG. 32*c* depicts the same object envelope 540 superimposed over layers of the object formed using an undersized building style. FIG. 32*d* depicts the same object envelope 540 superimposed over layers of the object formed using an average sized building style. Examination of these figures indicate why each style was so named. The oversized style is useful when post-processing involves material removal techniques; the undersized style is useful when post-processing or layer-by-layer processing involves filling techniques; and the average size style is useful when it is desired to have reasonably high accuracy without any additional processing.

CURE WIDTH COMPENSATION

As previously-described, if any cure width compensation is desired it can be implemented prior to the determination of the three independent regions of a layer. Alternatively, it may be implemented after the three independent regions are determined, thereby allowing different compensation values for each region. However, when following this alternative approach it is necessary to compensate the boundaries properly. When following this alternative approach, all the LB[i] vectors are compensated inward (normal compensation). The DB[i] and UB[i] vectors that were derived, as per the subject invention, from comparing the uncompensated layer boundary for a present layer to the uncompensated boundaries of the previous and next layers, respectively, should be compensated outward (reverse compensation). The DB[i] and UB[i] vectors that comprise boundaries of the present layer (before separation into three regions) are compensated inward, and the UB[i] vectors that are derived from the DB[i] vectors of the present layer (prior to compensation) are compensated inward. The amount of compensation of these vectors may differ according to the sources from which they are derived. LB[i] vectors are compensated by an amount A[i]. UB[i] and DB[i] vectors, which are derived from the uncompensated boundary of the next or previous layer, are compensated by the amount A[i]. UB[i] and DB[i] vectors, which are derived from the uncompensated boundaries of the present layer, are compensated by an amount B[i] and C[i] respectively. UB[i] vectors which are derived from the DB[i] vectors of the present layer are compensated by an amount C[i]. This compensation can be done by shifting the vectors and recalculating end points or by shifting the end points initially. The value A[i] represents one-half the width of cure associated with curing of the LB[i] vectors, B[i] represents one-half the width of cure associated with the curing of the UB[i] vectors, and C[i] represents one-half the width of cure associated with the DB[i] vectors. Since many methods utilizing the techniques of layer comparison (especially those of the concurrently-filed applications) might lead to extreme variations in cure depth (and associated cure width) this alternative approach is most preferred so that individual regions can be more accurately compensated.

These principles concerning determining how to compensate vectors after forming the final regions can be illustrated with reference to FIGS. 33*a*–33*f*, in which like elements are referenced with like reference numerals.

Figure 33A:
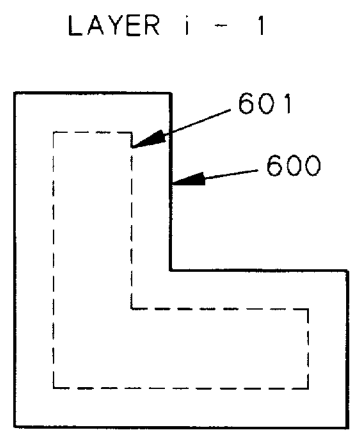
FIGS. 33a–33f illustrate an embodiment of cure width compensated to be utilized in conjunction with the subject invention.
Figure 33B:
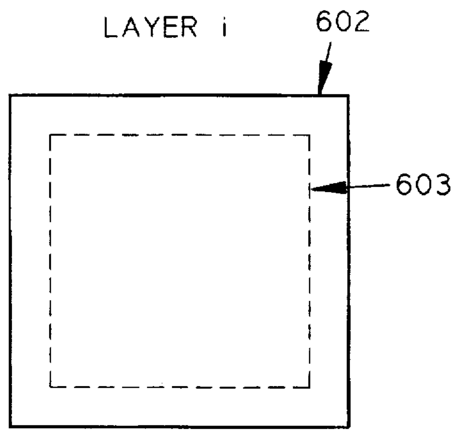
Figure 33C:
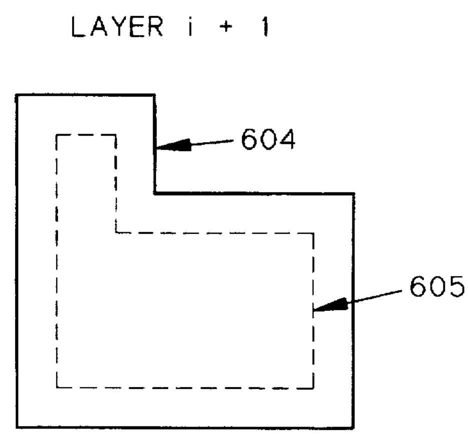

FIGS. 33*a*–33*c* illustrate the uncompensated layer boundaries, identified with reference numerals 600, 602, and 604, for layers i−1, i, and i+1, respectively, and the compensated layer boundaries, identified with reference numerals 601, 603, and 605, respectively, for these layers.

Figure 33D:
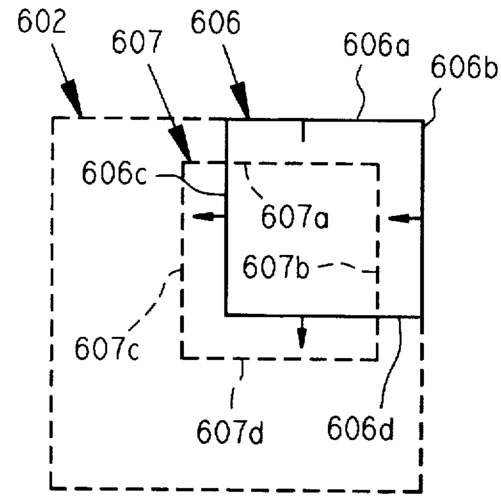

FIG. 33*d* illustrates compensating the vectors that make up the down-facing boundary for layer i. The uncompensated down-facing boundary is identified with numeral 606, and the desired compensated down-facing boundary is illustrated with numeral 607. As indicated, the vectors in the uncompensated down-facing boundary that do not touch the uncompensated layer boundary from the previous layer, identified with numerals 606*a* and 606*b*, are compensated inward to obtain compensated vectors 607*a* and 607*b*. By contrast, the vectors in the uncompensated down-facing boundary that do touch the uncompensated layer boundary from the previous layer, identified with numerals 606*c* and 606*d* in the figure, are compensated outward to obtain compensated vectors 607*c* and 607*d*.

Figure 33E:
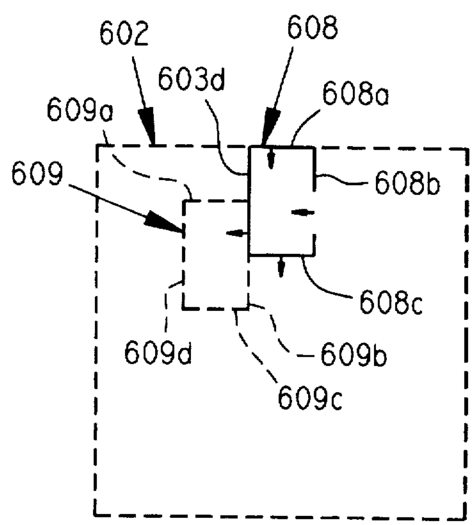

Turning to FIG. 33*e*, the compensation of the net up-facing vectors is illustrated. The uncompensated net up-facing boundary for layer i is identified with numeral 608, while the desired compensated boundary is illustrated with numeral 609. As indicated, the uncompensated net up-facing vectors which do not touch the uncompensated layer boundary from the previous layer, identified with numerals 608*a* and 608*b* in the figure, are compensated inward to obtain compensated vectors 609*a* and 609*b*, respectively. By contrast, the uncompensated net up-facing vectors which do touch the uncompensated layer boundary from the previous layer, identified with numerals 608*c* and 608*d* in the figure, are compensated outward to obtain compensated vectors 609*c* and 609*d*, respectively.

Figure 33F:
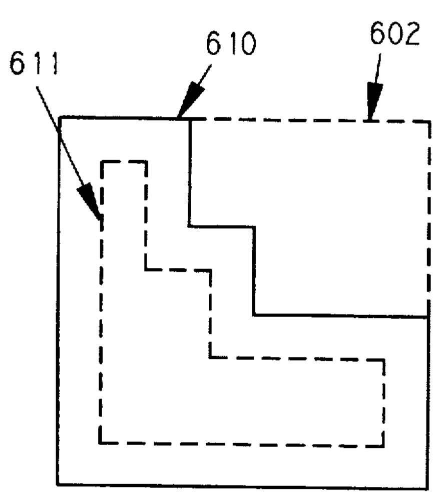

Turning to FIG. 33*f*, the uncompensated net layer boundary for layer i, identified with numeral 610, is compensated inward to obtain compensated net layer boundary 611.

While embodiments and applications of this invention have been shown and described, it should be apparent to those skilled in the art that many more modifications are possible without departing from the inventive concepts herein. The invention, therefore, is not to be restricted, except in the spirit of the appended claims.

APPENDIX A

| SECTION | BEGINNING PAGE # |
|---|---|
| 1 | P3 |
| 2 | P5 |
| 3 | P19 |
| 4 | P20 |
| 5 | P30 |
| 6 | P31 |
| 7 | P31 |
| 8 | P31 |
| 9 | P32 |
| 10 | P41 |
| 11 | P43 |
| 12 | P44 |
| 13 | P46 |
| 14 | P49 |
| 15 | P54 |
| 16 | P57 |
| 17 | P58 |
| 18 | P61 |
| 19 | P69 |
| 20 | P70 |
| 21 | P73 |
| 22 | P74 |
| 23 | P75 |
| 24 | P76 |
| 25 | P81 |
| 26 | P119 |
| 27 | P120 |

SUBJECT: SUMMARY REPORT FOR SLICE VERSION 46

REVISION 1.5

FROM: TOM C. & DAVE S.

DATE: 9/6/90

TO: GRADY, ADAM, JUSTIN, GREG ,YEHORAM.

INTRODUCTION:

This document consists of several major sections which together describe Slice version 46. The desired result is a concise and detailed description of the Slice code enabling readers to understand the contents and structure of the next generation code.

CONTENTS:

1) OVERVIEW NARRATIVE ( High Level summary )

2) PROGRAM NARRATIVE ( Middle level complexity )

3) FLOW CHART ( Overview of Middle level complexity )
( See attached flowcharts )

4) FUNCTIONAL NARRATIVES ( highly detailed descriptions )

5) LOW LEVEL FLOW CHARTS ( highly detailed diagrams )
( See attached flowcharts )

6) SOURCE CODE ( Optional - provided on request )

7) DISKS OF ALL DOCUMENTATION ( Optional on request )

8) INDEX OF ALL TERMS USED IN SLICE (Optional on request)

9) COMMAND LINE

10) ARG FILE

11) SECURITY FILE

12) MAT FILE

13) STL FILE

14) SLC FILE

15) TMP FILE
16) OUTPUT SCREEN
17) MSG FILE
18) SLI FILE
19) SLICING
20) BOOLEAN OPERATIONS ON BOUNDARIES
21) BOOLEAN OPERATIONS ON HATCH
22) BEAM COMPENSATION
23) FILL RETRACTION
24) ERROR ANALYSIS
25) SLICE FUNCTION SUMMARY
26) CHANGE FROM SLICE 36 TO SLICE 46
27) PROBLEMS IN SLICE

1.0 OVERVIEW NARRATIVE:

The overview narrative is a high level summary of the Slicing Process. Readers can see the major sections of Slice and continue on with the program narrative which is a middle level view.

To tie the overview narrative to the middle level program narrative line numbers are provided in bold type at the beginning of the line. These line numbers are tied to a chronological ordering of the Slice process as it is actually executed in the code. By observing the line number and the jumps between them , readers can know where they are and get a feel for the level of complexity in each of the descriptions.

(1 - 29) Slice begins in the main procedure.

(29 - 172) User information is processed from the command line and the argument file and sent out to the .sli , screen , and .msg files.

(172) Security check is done on the system password file.

(177 - 179) The .stl file is read in . Three formats are allowed , triangles , segments , or polylines.

(181 - 211) The .stl file is composed of triangles , read it in.

(241) The sorted , and preprocessed triangle file is sent to disk as an intermediate file waiting further processing.

(250 - 324) The .stl file is composed of segments , read it in.

(393) The sorted , and preprocessed segment file is sent to disk as an intermediate file waiting further processing.

(424 - 457) The .stl file is composed of polylines, read it in.

(459) The sorted , and preprocessed polyline file is sent to disk as an intermediate file waiting further processing.

(462) Update the user info needed to begin slicing the part.

(501 - 538) If the part is composed of triangles , then slice it. Three layers are sliced to get layer[0], layer[1], and layer[2].

(554 - 576) If the part is composed of segments or polylines , then slice it. Three layers are sliced to get layer[0], layer[1], and layer[2].

(579 - 627) After three layers of the part are acquired , each layer
undergoes beam compensation.

(629) After three layers of the part have been beam compensated, the layers are tiled. ( New procedure for anti curling. )

(629 - 651) At this point , the Boolean operations are used to generate the different types of boundaries.

(659 - 706) Now the Hatch boundaries are processed to generate the hatch lines.

(725) The Up boundaries are processed to generate the up fill skin.

(725) The Down boundaries are processed to generate the down fill skin. At this point , Slice will loop back to (501) to slice the next layer.

(732 - 768) After Slicing all layers , Slice frees up all remaining memory in use and finishes.

2.0 PROGRAM NARRATIVE:

The Program Narrative is written with a middle level complexity. By reading this narrative the software engineer should have an understanding of how Slice transform the 3 Dimensional CAD data files into 2 Dimensional slice files.

To tie the narrative to the source code, the function module where the narrative is describing is shown in BOLD type along with its source module and the line of the source module where it appears.

Where the Narrative is unable to give a detailed description of the function without too much digression into the algorithms of the code , a reference is made to the functional narrative that presents the detailed descriptions.

The program narrative is chronological in nature and goes through each section of the code in the same manner the code will execute on the computer. Therefore, the user is able to actually get a feel for how the code will execute.

Slice begins here in the main function.

1 main: void(), <s0.c 13>

Initializes the memory manager.

**6 new_memory: struct*(), <s0.c 610>**

Gets the start time in ascii format.

**9 get_time: char*(), <s0.c 959>**

Sets up a timing structure for each major function of slice to check for the processing time required for each major function.

**20 new_timing: struct*(), <s0.c 823>**

Initializes a new userinfo structure from the command line and argument file.

**29 get_userinfo: struct*(), <s1.c 456>**

Writes out the userinfo to the header of the output or .sli file.

**167 write_userinfo: struct*(), <s1.c 1414>**

Writes the userinfo to the screen and to the message file.

**172 write_parameterlist: struct*(), <s1.c 261>**

Verifies that the password is good. This feature is implemented on the SGI but not on the NEC386 or Intel386 DOS platform.

verify_password: <s1.c 1435>

Slice is now ready to load the stereolithography (.stl ) file. The .stl file can be in three different formats . They are triangle, segments, or polylines. Segments and polylines are two dimensional contour data, as opposed to triangle files which are three dimensional approximations of the desired object.

**177 get_part: struct*(), <s3.c 780>**

Range information is entered on the command line or argument file and allows the user to specify where to slice in z space.

**179 get_range2: struct*(), <s1.c 1872>**

If the .stl file is composed of triangles the routine below is activated.

**181 get_tripart: struct*(), <s3.c 828>**

Allocated a new part structure of type Triangles.

**182 new_part: struct*(), <s3.c 599>**

This routine is a loop which calls the read functions for the .stl file. A count is kept of the types of triangles read, i.e. flats , steep , or near flats.

**185 read_triangle: struct*(), <s3.c 73>**

This routine is activated if the triangle file is determined to be ascii. A check is done on the first 256 characters of the file to determine if the file is ascii or binary.

**186 read_ascii_triangle: double*(), <s3.c103>**

This routine is activated if the triangle file is determined to be binary.

**193 read_binary_triangle: double*(), <s3.c178>**

As each triangle is read the transformation of scaling, rotation , translation, mirroring, and the specific slice axis are applied if specified by the user.

198 **transform_triangle: double*(), <s3.c 222>**

As each triangle is read the vertices are swapped to slice on the x,y,or z axis . Additionally mirroring is done here if required.

199 **reorder_coordinates: double*(), <s3.c 250>**

Reorder the vertices of the triangle in ascending z value.

200 **reorder_vertices: double*(), <s3.c 292>**

Converts the x and y Cad units to Slice units and rounds z to layer boundary. The x y and z values are multiplied by the resolution value to create the slice units.

201 **round_triangle: struct*(), <s3.c 272>**

Calculates the sign of the z-normal of the triangle.

206 **calculate_znormal: struct*(), <s3.c 318>**

Sticks the triangle on the triangle list for the .stl part.

209 **append_triangle: struct*(), <s3.c 1294>**

Sorts the triangle part by minimum z.

211 **sort_tripart: struct*(), <s3.c 1345>**

Writes the sorted triangle part to a sorted disk file for processing by Slice. This creates a temporary file which is later deleted. The temporary file is called "slice.tmp" and is really a cleaned up and reorganized .stl file. However the user has no way to create this file without slicing so these files are temporary.

241 **write_tripart: struct*(), <s3.c 1223>**

Removes the sorted triangle part list from memory.

248 **delete_tripart: struct*(), <s3.c 645>**

If the .stl file is in segment format then this routine is activated.

250 **get_segpart: struct*(), <s3.c 887>**

Creates a new structure of the type Polylines to read in the segments.

251 new_part: 182

Read in a segment from the .stl file that is in segment format.

**252 read_ascii_seglist: struct*(), <s4.c 786>**

Applies a coordinate transformation to a segment represented by two points.

**259 transform_segment: double*(), <s4.c 239>**

Converts the segment from Cad units to Slice units and rounds.

260 ctos: 94

Puts the new segment into a segment structure.

**261 new_segment: struct*(), <s4.c 20>**

Appends the finished segment into a segment list.

**264 append_segment: struct*(), <s4.c 1049>**

Applies a transformation to the zmin and zmax of the segment list.

266 transform_z_extents: void(), <s2.c 83>

If the segment list is in binary, this function is activated. However this function has not yet been written. Thus currently all segment list .stl files are required to be in ascii format.

**267 read_binary_seglist: struct*(), <s4.c 837>**

At this point all the segments have been read into the seglist. Slice will now sort the segments by minimum y value.

**274 sort_seglist: struct*(), <s4.c 1004>**

Close the seglist and make it circular before sorting it.

**276 close_seglist: struct*(), <s4.c 861>**

Begin to do the sort. The sort is a merge type of sort. The sort will recursively divide the list ,sort , and then merge the sorted sublists. The smallest sublists will be just two elements whose positions will be swapped if necessary.

**sort_segments: struct*(), <s4.c 418>**

This opens or uncircularizes the segment list after sorting.

283 **open_seglist: struct*(), <s4.c 874>**

Combine equal segments to shorten the segment list. The equality of the segments are exact here since the segments were rounded to slice units earlier.

284 **condense_seglist: struct*(), <s4.c 1024>**
285 **combine_segments: struct*(), <s4.c 395>**

Duplicate segments are deleted and then free up the memory space. The duplicity of the segments are exact here since the segments were rounded to slice units earlier.

287 delete_segment: 270

Take segment list and create a polylist structure.

288 **new_polylist2: struct*(), <s5.c 923>**

Close each polyline in the polylist and append into one polylist.

299 close_polyline: 161
300 append_polyline: 164

Converts a list of polylines into a list of polygons by closing gaps. Note: degap_polylist is a large function composed of many steps which is detailed Functional Narrative 1.

304 **degap_polylist: struct*(), <s5.c 1488>**

Now reorient all the polygons in the polylist to make them consistent in describing the region of space that they occupy. They must follow the right hand rule in orientation and be consistent in the sense that you do not have a polygon that conflicts the sense of another. The whole set must be consistent. Inconsistent polygons are flipped until the whole region is consistent. Note: reorient_polylist is a large function which is detailed in Functional Narrative 1.

324 **reorient_polylist: struct*(), <s5.c 1727>**

At this point the list of polygons is properly degaped and oriented consistently. However the list may still have extra members combined from the CAD system.

To correct the situation, boolean the list with itself and do a union with itself. This removes duplicate information and produce the simplest set of polygons. Note: this is a large function which is detailed in Functional Narrative 4.
393
**boolean_polylists: struct*(), <s5.c 1678>**

Now write out the polygon list to disk in a temporary file.

416 **write_polylist2: struct*(), <s5.c 1384>**

Now delete the polylist and free up the memory.

421 delete_polylist: 319

This section is activated if the .stl file is in polyline format.

424 **get_polypart: struct*(), <s3.c 948>**

Initialize a structure of type Polylines to hold the .stl file.

425 new_part: 182

If the file is ascii then the following function is activated. The function reads in one layer of the polyline list.

428 **read_ascii_polylist: struct*(), <s5.c 1180>**

Creates a new polylist and polyline structures to hold the .stl input.

432 new_polylist: 150
433 new_polyline: 153

Apply the coordinate transformation to the polyline vertex.

434 **transform_vertex: double*(), <s5.c 174>**

Converts the Cad units of the vertices to Slice units.

435 ctos: 94

Creates a new structure to hold the transformed vertex and appends to the polyline .

436 new_vertex: 156
437 append_vertex: 159

Appends the polyline to the polylist.

438 append_polyline: 164

Applies a coordinate transformation to the z extents of the polylist.

439 transform_z_extents: 266

The following function is activated if the input .stl file is binary.

440 **read_binary_polylist: struct*(), <s5.c 1245>**

Creates a new polylist and polyline structures to hold the .stl input.

443 new_polylist: 150
444 new_polyline: 153

Apply the coordinate transformation to the polyline vertex.

445 transform_vertex: 434

Converts the Cad units of the vertices to Slice units.

446 ctos: 94

Creates a new structure to hold the transformed vertex and appends to the polyline .

447 new_vertex: 156
448 append_vertex: 159

Appends the polyline to the polylist.

450 append_polyline: 164

Applies a coordinate transformation to the z extents of the polylist.

452 transform_z_extents: 266

Now Slice has read in one layer of the polylist in either ascii or binary. Now Slice will close the list and make the polylist circular.

454 **close_polylist: struct*(), <s5.c 1437>**
455 close_polyline: 161

Degap the polylist to form polygons from the polylines. Note: The degap polylist function is large and is detailed in Appendix XXX.

456 degap_polylist: 304

Now the polylist is rounded and degaped. A reorient is done on the polylist to make all the polygons consistent with the right hand rule and consistent with each other. Note: The reorient_polylist function is large and is detailed in Functional Narrative 1.

457 reorient_polylist: 324

Now do a self boolean union of the polylist to simplify the input data to its most non redundant representation. Note: repetitive data notation is removed with a self boolean union operation.

458 boolean_polylists: 393

Write the polylist is out to a temporary file on the disk.

459 write_polylist2: 416

Updates "zmin" and "zmax" information in the userinfo structure.

462 **update_userinfo: struct*(), <s1.c 1384>**

At this point the program has completed inputting of the .stl file and is ready to begin the Slicing operation.

The get_range1 function correlates the level number n with the range information for that level. Such range information for example would be the layer thickness, range layer number, beam offset, up fill offset, and down fill offset.

501 **get_range1: struct*(), <s1.c 1855>**

Slicing begins on the part at the given layer number between "zmin" and "zmax". The present slicing algorithm uses 2 slices per layer. A slice is taken at the bottom of the layer and a slice is taken at the top of the layer. The two slices contain all the layer information.

The slicing loop processes three layers for the first iteration and 1 layer for each iteration afterwards. Therefore, 6 actual slices are done for the first iteration with 2 slices taken every iteration afterwards. Three layers are processed before the actual boolean operations. They are identified as layer[0], layer[1], and layer[2]. The following functions apply to all three layers.

502 **slice_part: struct*(), <s3.c 1010>**

If the .stl file is a triangle, the following function is activated.

**504 slice_tripart: struct*(), <s3.c 1036>**

This function reads the sorted temporary disk file at the z level for the layer.

**505 read_tripart: struct*(), <s3.c 1198>**

As each triangle for the layer is read in , it is sliced and put into a segment list. The following function preforms the slice at the top and the slice at the bottom of the layer. Two segment lists are created , sla the bottom segment list , and slb the top or projection segment list.

**525 double_slice_triangle: struct*(), <s3.c 368>**

This function determines the points ( head and tail ) at which the given z layer intersects the triangle. The segment is then appended to the segment list.

526 slice_triangle: 515

After the sliced segment list is created , the segment list is processed in the familiar order as follows:

*For sla:*

*1) sort_seglist*
*2) condense_seglist*
*3) new_polylist2*
*4) degap_polylist*
*5) reorient_polylist*
*6) boolean_polylists*

*For slb:*

*1) sort_seglist*
*2) condense_seglist*
*3) split_seglist*
*4) boolean_seglist*
*5) new_polylist2*

Finally, after both sla and slb have gone through the above processes, Slice performs a union_polylists on both seglists. This function performs the boolean union or ( A + B ) on two polylists. It will be described fully in Functional Narrative 2.

**538 union_polylists: struct*(), <s5.c 1777>**

If the .stl file is comprised of segments or polylines then the following function will be exercised. It will slice through a list of polylines at a given level z and return the list of polylines at that level.

**554 slice_polypart: struct*(), <s3.c 1132>**

Reads the polylines from the disk file from a specified z level and appends them to a new polylist structure. The polylines are closed to form circular linked lists. Note the polylines read in may represent several z levels since the .stl file may have a different slice thickness represented than the slice thickness for the z range. Thus if the user's .stl file is represented in 5 mil layers and the range z thickness is 20 mils , 4 layers will be read in from the disk file. These four layers are later unioned to create the composite layer information.

**555 read_polypart: struct*(), <s3.c 1246>**
576 union_polylists: 538

At this point layer[0],layer[1],and layer[2] have been sliced. Linewidth compensation is done next before proceeding to the boolean operations for the different layer types. Each layer now has correctly oriented and complete polygons and is ready for beam compensation.

**579 layer_compensate: struct*(), <s5.c 1962>**

To start Linewidth compensation ( LWC ) duplicate vertices in the polylist are marked in the following function.

**581 dupmark_polylist: struct*(), <s5.c 1914>**

In the beam compensation process , there are 4 major functions, "adjust0_polylist", "adjust1_polylist", "adjust2_polylist", and "adjust3_polylist". Each additional function does some extra adjustment that the previous function could not handle. Simple polygons will only require the "adjust0_polylist". As the polygons increase in complexity additional adjustments will come into play.

"Adjust0_polylist" establishes the initial displacement vector along the angular bisector of each vertex of the polygon. This displacement is the laser beam radius entered by the user.

**582 adjust0_polylist: struct*(), <s5.c 2039>**
583 new_polylist: 150
**584 adjust0_polygon: struct*(), <s5.c 598>**

"Adjust1_polylist" checks if the double of any displacement vector crosses a segment of the uncompensated polygon. If it does , the displacement vector will be shrunk to half its initial displacement. These adjustment routines include some complicated algorithms that will be described in the Slice function summary section.

601 **adjust1_polylist: struct*(), <s5.c 2059>**
602 adjust1_polygons: void(), <s5.c 680>

The following two functions are in the adjust1_polygons function. They will be described in the Slice function summary.

606 parallel_intersection: 348
608 nonparallel_intersection: 351

If two displacement vectors of the initial displacement cross, then both displacement vectors will be shrunk to their intersection point.

611 **adjust2_polylist: struct*(), <s5.c 2085>**
612 adjust2_polygons: void(), <s5.c 735>

"Parallel_intersection" is in the "adjust2_polygons" function. It will be described in the Slice function summary.

614 parallel_intersection: 348

If a displacement vector of the compensated polygon crosses a compensated segment , the two displacement vectors which produced this segment are shrunk so that the segment passes through the head of the intrusive displacement vector and is as parallel as possible to its uncompensated counterpart.

617 **adjust3_polylist: struct*(), <s5.c 2114>**
618 adjust3_polygons: void(), <s5.c 788>

The following functions are in the "adjust3_polylist" function and will be described in the Slice function summary.

619 aside: int(), <s2.c 604>
620 distplsq: double(), <s2.c 318>
621 **twoline_intersection: struct*(), <s2.c 466>**
622 round: 97
623 **ptline_intersection: struct*(), <s2.c 488>**

After the polylist has undergone all four adjustments it is sent to the compact_polylist function. This function combines intersection polygons into one and gets rid of extra vertices in the polygons of a list.

626 compact_polylist: 386

The smooth polylist gets rid of unnecessary vertices in the polygons of a list. The middle vertex in a set of three collinear vertices is removed according to the error tolerance set by "eps".

627 smooth_polylist: 389

After compensation and before the boolean operations , we can perform a tiling function which is a boolean intersection between a mask of tiles and the layer. This procedure is an aid in reducing cure deformation.

**629 tile_polylist: struct*(), <s1.c 1516>**

At this point Slice has three layers worth of information and is ready to process the different border types. The following boolean operations are as follows for the different layer types:

*1) Downboundaries = difference_polylists(layer[1],layer[0])*

*2) Upboundaries = difference_polylists(layer[1],layer[2])*

*3) Hatchboundaries = difference_polylists(layer[1], downboundary)*

*4) Layerboundaries = difference_polylist(hatchboundary, upboundary)*

*5) Upboundaries = difference_polylists (upboundary, downboundary)*

After the generation of the boundary types , the write_polylist function is used to write out the following:

1) Block information

2) LB or Layer borders.

3) UB or Up borders.

**651 write_polylist: struct*(), <s5.c 1337>**

At this point slice performs the hatching on the Hatchboundaries. The hatch_polylist and hatch_seglist functions are not detailed here but are explained in the low level report. Also the deflat_seglist and the resort_seglist2 functions which play a part in the hatching function will be detailed later in the low level report.

```
659        hatch_polylist: struct*(), <s6.c 370>
667             deflat_seglist: struct*(), <s4.c 1349>
671             hatch_seglist: struct*(), <s6.c 451>
678                       resort_seglist2: struct*(), <s4.c 966>
```

Now Slice writes out the hatch line information ( LH ) to the .sli file.

```
691        write_hatchlinelist: struct*(), <s6.c 394>
698             write_hatchline: struct*(), <s6.c 210>
```

Slice deletes the hatch line list and free up memory.

```
704        delete_hatchlinelist: struct*(), <s6.c 313>
705             delete_hatchline: 688
706             free_memory: 58
```

Now Slice writes out the downboundaries (DB) segments to the .sli file. Then the Down hatch is computed and written out to the .sli file. Next we retract the up boundary to create the borders used to generate up skin. The fill_retract function uses the adjust0_polylist function.

```
23         fill_retract: struct*(), <s5.c 1997>
725             adjust0_polylist: 582
```

Use the hatch_polylist function to generate the up fill and then write the up fill to the .sli file. ( UF )

Next retract the down boundary to create the borders used to generate down skin. The fill_retract function uses the adjust0_polylist function.

```
23         fill_retract: struct*(), <s5.c 1997>
725             adjust0_polylist: 582
```

Then use the hatch_polylist function to generate the down fill and then write the down fill to the .sli file. ( DF )

At this point Slice is through one iteration of the Slicing loop and reassigns the loop variables to do the next layer in the loop. At the end of slicing we free up the rest of memory and perform the deleting functions below:

```
                delete_tripart: 248
                delete_polypart: struct*(), <s3.c 663>
                     delete_polylist: 319
                free_memory: 58
                memory: 72
           write_timing: void(), <s0.c 867>
                time: 10
                dump: 23
           delete_timing: struct*(), <s0.c 856>
                free_memory: 58
           timing: 166
           delete_userinfo: struct*(), <s1.c 359>
                delete_polylist: 319
                delete_tileinfo: int(), <s1.c 1488>
                     free_memory: 58
                delete_transformation: struct*(), <s2.c 1055>
                     free_memory: 58
                     memory: 72
                delete_hatchinfolist: 145
                delete_rangelist: struct*(), <s1.c 1951>
                     delete_range: 57
                     free_memory: 58
                delete_curelist: struct*(), <s1.c 2161>
                     delete_cure: struct*(), <s1.c 2019>
                     memory: 72
                delete_parameterlist: struct*(), <s1.c 209>
                     delete_parameter: struct*(), <s1.c 33>
                          strlen: 44
                          free_memory: 58
                     free_memory: 58
           memory_allocated: int(), <s0.c 807>
           dump_memory: void(), <s0.c 751>
                dump: 23
                errexit: 8
           delete_stream: 15
           *************   SLICE HAS FINISHED !!!   ***************
```

3.0 HIGH LEVEL FLOW CHARTS ( See attached flowcharts )

3.1 MAIN FLOWCHART
This flowchart gives the overview of the slice code.

3.2 LAYER SLICING
This flowchart shows how a layer is generated from the triangle or contour data.

3.3 BOOLEAN OPERATION ON BOUNDARIES
This flowchart gives the main routines for the boolean operations of union, intersection, and difference.

3.4 HATCHING OF BOUNDARIES
This flowchart shows how the hatch and fill vectors are generated.

4.0 FUNCTIONAL NARRATIVES:

FUNCTIONAL NARRATIVE 1

FUNCTION NAME: degap_polylist()

PURPOSE: Converts a list of polylines to a list of polygons by closing
gaps in order of their size. ( smallest gaps closed first )

RETURNS: Returns the list of polygons.

FUNCTION: A list of polylines "pla" is passed to this function.

**304 degap_polylist: struct*(), <s5.c 1488>**

The time function is called to record the timing for this function.

305 time: 10

The polylist "plb" is created from the input polylist "pla".

306 new_polylist: 150

The delink_polyline and append_polyline functions copy polylines which are already closed to "plb". Therefore you are left with two polylists , "pla" which has only open polylines and "plb" which has polylines that are already closed.

**307 delink_polyline: struct*(), <s5.c 485>**
308 append_polyline: 164

The remaining polylines in "pla" are checked against each other in the following fashion:

1) First the first vertex in the first polyline is checked against the last vertex in every other polyline. If a gap is found , then the smallest gap is identified and assigned a value of 0.

2) If ignorient is true , the first vertex in the first polyline is check against the first vertex in every other polyline. If a gap is found , then the smallest gap is identified and assigned a value of -1.

3) If ignorient is true , the last vertex in the first polyline is check against the last vertex in every other polyline.

If a gap is found , then the smallest gap is identified and assigned a value of 1.

If no gaps are found , then the program breaks out of the function. If the polyline is compared against itself , then close the polyline and add it to the "plb" list.

```
309                      sq: double(), <s2.c 59>
310                      errexit: 8
311                      close_polyline: 161
```

If the gap type is -1 or 1 ( i.e. ) not 0 , then reverse the order of the polyline.

```
312                 reverse_polyline: struct*(), <s5.c 558>
```

Now join the polyline, ( connect the gap ) and check the next polyline in the list.

```
313                      join_polylines: struct*(), <s5.c 507>
314                          delete_vertex: 162
315                       delete_polyline: struct*(), <s5.c 383>
316                              delete_vertex: 162
317                              free_memory: 58
```

If any polylines are left in "pla" then merge the rest of the polylines to "plb".

```
318                 merge_polylists: struct*(), <s5.c 2140>
319                      delete_polylist: struct*(), <s5.c 1116>
320                              delete_polyline: 315
321                              free_memory: 58
322                              memory: 72
323                      delete_polylist: 3190
```

Return the polylist "plb" which has all gaps closed.

FUNCTIONAL NARRATIVE 2

FUNCTION NAME: union_polylists()

PURPOSE: Performs the boolean union of two polylists.

RETURNS: Returns the union of two polylists.

FUNCTION: Two polylists , "pla" and "plb are passed into this function. If the 1st and 2nd bit of the save flag are set then the original polylists are saved , else they are destroyed.

```
538                  union_polylists: struct*(), <s5.c 1777>
```

The timing function is called to record the elapsed time for the execution of this function.

```
539                       time: 10
540                       errexit: 8
```

If either "pla" or "plb" is the null set , then the other polylist is returned. If the save flag bits are not set , then the input lists are deleted.

```
541                       delete_polylist: 319
```

A new polylist is created from an input polylist.

```
542                       new_polylist1: struct*(), <s5.c 892>
543                            allocate_memory: 21
544                            errexit: 8
545                            new_polyline1: struct*(), <s5.c 287>
546                                 allocate_memory: 21
547                                 errexit: 8
548                            new_vertex1: struct*(), <s5.c 39>
549                                      allocate_memory: 21
550                                      errexit: 8
551                                 append_vertex: 159
552                            append_polyline: 164
```

If both polylist are not null , then they are passed to the boolean polylist routine to perform the union operation. NOTE: See the boolean_polylist function narrative to understand the boolean_polylist function.

```
553                       boolean_polylists: 393
```

The union of "pla" and "plb" is returned.

FUNCTIONAL NARRATIVE 3

FUNCTION NAME: boolean_polylists()

PURPOSE: Performs a union , difference , or intersection boolean operation
on the input polylists depending on the condition of the operation flag
and the orient flag.

FUNCTION: Two polylists "pla" and "plb" are passed along with the operation and orient flag into the function. If op ==1 and orient ==1 then a union is performed. If op == 2 and orient == 1 then the intersection is performed. If op == 2 and orient == -1 then the difference is done.

393 **boolean_polylists: struct*(), <s5.c 1678>**

The time function is called to record the elapsed time .

394 time: 10

The polylist "pla" is made into the seglist "sla".

397 new_seglist2: 326

Polylist "pla" is removed.

399 delete_polylist: 319

Polylist "plb" is made into a new seglist "slb" with the orientation determined by the orient flag. If the orient flag is -1 then as the segment list is created the heads and tails of the segments are flipped. Next both seglists are dumped into one seglist in the merge function.

400 **merge_seglists: struct*(), <s4.c 1370>**
401 delete_seglist: 269

The sort seglist sorts the segment list by the following items:

a) by min y point
b) by min x point
c) by the greater slope
d) by the lesser y of 2nd endpoint
e) by the lesser x of 2nd endpoint If item a is equal , then criteria b is used and so on down the line.

402 sort_seglist: 274

Next equal segments are combined into a single segment with the orient and biorient field being increased every time a new segment is added.

403 condense_seglist: 284

Splits segments in the list at the intersections of the segments. This function is explained in detailed in the functional narrative for the split_seglist routine.

404 split_seglist: 337

The interesting thing here is that the boolean_seglist function can do the boolean union and intersection without connectivity information and with out knowing that one segment belongs to one polygon and that another segment belongs to a different polygon. Based upon the qvinf and op values , the segments in list "sla" will each be intersected by a imaginary horizontal line and depending upon qvleft ,qright, the segment orientation and op value the segment will be either kept or marked for deletion. Then resort_seglist1 is called to transfer the processed segments into the finished seglist "slb". This process is repeated with a new y max interval being calculated by resort_seglist1 every time until the seglist "sla" is emptied.

405 boolean_seglist: struct*(), <s4.c 1128>

The time function is called to record the elapsed time needed to do this function.

406 time: 10

A new seglist "slb" is created for holding segments which fit into a y interval from seglist "sla".

407 new_seglist: 256
408 delete_segment: 270

The resort_seglist1 function will move segments from seglist "sla" which can be intersected by a certain y interval which is defined to seglist "slb". The resort_seglist1 function will return a y interval which will be used in the boolean_seglist routines to block off the next section of segments in the "sla" segment list for processing.

409 resort_seglist1: 376
410 errexit: 8

Finally the finished seglist "slb" is again sorted.
The sort seglist sorts the segment list by the following items:

a) by min y point
b) by min x point
c) by the greater slope
d) by the lesser y of 2nd endpoint
e) by the lesser x of 2nd endpoint If item a is equal , then criteria b is used and so on down the line.

411 sort_seglist: 274

The now sorted segment list "slb" is returned from the boolean_seglist function. Now the segment list is reconverted to a polylist.

412 new_polylist2: 288

The compact_polylist function will combine similar vertices of polygon into a single vertex.

413 compact_polylist: 386

The smooth_polylist function will remove the middle vertex in any set of three collinear vertices . The spatial error tolerance is "eps".

414 smooth_polylist: 389

The finished polylist is now returned from boolean_polylist function

FUNCTIONAL NARRATIVE 4

FUNCTION NAME: reorient_polylist()

PURPOSE: The reorient polylist function will go through a set of polygons
and make them all consistent with the right hand rule. As an example if
you have a set of polygons that is a circle within a circle, the outer
circle should orient counterclockwise and the inner circle should orient
clockwise to be a consistent set. Due to bad input data , if the inner
circle was oriented counterclockwise , then you would have a solid in a
solid and the inner circle would not be necessary. To exist the inner
circle would have to be oriented clockwise.

FUNCTION: The reorient_polylist function will accept a set of polygons
and check the orientation of all the polygons in the set to make them
consistent. The outer most polygons are checked first and the inner most
polygons are checked last.

324 reorient_polylist: struct*(), <s5.c 1727>

The time function is called to check the elapsed time for this function.

```
                        time: 10
```

The input list of polygons is turned into a list of segments for processing.

```
                        new_seglist2: struct*(), <s4.c 620>
                             allocate_memory: 21
                             errexit: 8
                             new_segment2: struct*(), <s4.c 83>
                                  allocate_memory: 21
                                  errexit: 8
                             append_segment: 264
                             round2: 129
```

The input set of polygons is removed.

```
                        delete_polylist: 319
```

The seglist is sorted by the following rules:
If the first sort parameter is equal then use the second , if the second
parameter is equal , then use the third and so on.

a) sorted by minimum 1st pt y value.
b) sorted by minimum 1st pt x value.
c) sorted by the greater segment slope.
d) sorted by the second pt y value.
e) sorted by the second pt x value.

```
                        sort_seglist: 274
```

The condense_seglist function will combine segments with identical endpoints
and update the orient and biorient flags. The orient flag show the difference
of segments oppositely opposed and the biorient flag keeps a count of the
total number of segments.

```
                        condense_seglist: 284
```

The split_seglist function will split all intersecting segments in a list
and combine equal segments into compound segments. The split_seglist
function is defined in more detail in the split_seglist narrative.

```
337          split_seglist: struct*(), <s4.c 1254>
338              dump_seglist: void(), <s4.c 710>
339                  dump: 23
340                  errexit: 8
341                  dump_segment: void(), <s4.c 155>
342                      dump: 23
343                      errexit: 8
344              dump: 23
345              time: 10
346              dump_segment: 341
347              delete_segment: 270
348              parallel_intersection:   struct*(),
<s2.c 390>
349                  exbetween: int(), <s2.c 570>
350                  errexit: 8
351              nonparallel_intersection: struct*(),
<s2.c 362>
352                  round: 97
353                  exbetween: 349
354                  inbetween: int(), <s2.c 587>
355              split_segment: struct*(), <s4.c 350>
356                  new_segment2: 329
357                  compare_segments: 278
358                  delink_segment: struct*(), <s4.c
199>
359                  preorder_segment:   struct*(),
<s4.c 283>
360                      compare_segments: 278
361                      combine_segments: 285
362                  combine_segments: 285
363                  postorder_segment:  struct*(),
<s4.c 316>
364                      compare_segments: 278
365                      combine_segments: 285
366                  errexit: 8
367              DEBUG: 2
368              timing: 166
369              ui: 18
```

The reorient_seglist function will take a list of segments and make sure
that alternate segments along a chosen y interval will have opposite
orientations. This is saying that when crossing into a solid surface
boundary , you must exit the solid surface boundary before encountering
another solid surface boundary.

```
370                 reorient_seglist: struct*(), <s4.c 1182>
371                         time: 10
372                         dump_seglist: 338
373                         dump: 23
374                         new_seglist: 256
375                         errexit: 8
```

Resort_seglist1 will move all segments that are below a previous y min into a holding segment list "slb" and return a new y min interval along with the segment list "sla" for orientation testing. Once the segments along the chosen y interval are tested for their correct orientation , the marked segment list is resorted and the marked segments transferred to "slb".
This continues in new intervals of y min until "sla" is emptied.

```
376                         resort_seglist1:  struct*(),  <s4.c
891>
377                             delete_segment: 270
378                             delink_segment: 358
379                             append_segment: 264
380                             delete_seglist: 269
381                             compare_segments1: int(), <s4.c
535>
382                             preorder_segment: 359
383                         dump_segment: 341
384                         sort_seglist: 274
385                     new_polylist2: 288
```

Equal vertex points in the polylist are combined.

```
386                 compact_polylist: struct*(), <s5.c 1636>
387                     merge_polygons: struct*(), <s5.c 537>
388                             delete_polyline: 315
```

Removes the middle point in any set of three collinear vertices using
eps as tne spatial error tolerance.

```
389                     smooth_polylist: struct*(), <s5.c 1606>
390                         between: int(), <s2.c 549>
```

```
                        inbetween: 354
                    delete_vertex: 162
```

The polylist is returned after reorientation.

5.0 LOW LEVEL FLOWCHARTS ( See attached flowcharts )

5.1 BOOLEAN_SEGLIST
This flowchart reveals the boolean operation of segment lists.

5.2 SPLIT_SEGMENT
This flowchart shows how a segment is split.

5.3 SPLIT_SEGLIST
This flowchart shows how the segments in a segment list are split when they cross each other.

5.4 REORIENT_SEGLIST
This flowchart shows how the misoriented segments in the segment list get reoriented.

5.5 REMAINING FLOWCHARTS
The remaining flowcharts for each routine in the SLICE program are on disk.

6.0 SOURCE CODE ( Optional on request. )

7.0 DISKS OF ALL DOCUMENTATION ( Optional on request. )

8.0 INDEX OF ALL TERMS USED IN SLICE ( Optional on request. )

9.0 COMMAND LINE

The command line contains the user information to run the SLICE program. It takes a list of parameters where each parameter consists of a name preceded by a dash and a list of values. All parameters can be shifted to the argument file (which acts as a command line overflow) except "-p" which invokes the argument file itself.

9.1 PARAMETER LIST

The parameters along with their range of values (in angle brackets <>) are given in the following table where <¦> means "or", n*<> means "n" values of the indicated type, and capitalized values are taken literally. The parameters which are primarily used for debugging or by power users or which the casual user need not alter from their default values are marked as class B. Those which are commonly used are marked as class A. Parameters and their values (except for file names) can be given in either lower or upper case.

```
-help < ¦T¦F>      Show help screens?
                   blank,T:  true
                   F:  false
                   Default:  T
                   Class:  A
-debug <int>       Debugging bit flags.
                   int:  decimal integer
                   Default:  0
                   Class:  B
-timing < ¦T¦F>    Show elapsed time for key functions?
                   blank,T:  true
                   F:  false
                   Default:  F
                   Class:  B
-data <T¦P¦S>      Input data type:
                   T:  triangles
                   P:  polylines
                   S:  segments.
                   Default:  T
                   Class:  A
-warn < ¦T¦F>      Continue executing after warnings?
                   blank,T:  true
                   F:  false
                   Default:  T
                   Class:  B
-bo < ¦T¦F>        Borders only (no hatch or fill)?
                   blank,T:  true
                   F:  false
                   Default:  F
```

```
                    Class:  B
-lo < |T|F>         Layers only (no layer differencing)?
                    blank,T:  true
                    F:  false
                    Default:  F
                    Class:  B
-xmin <float>       Minimum x value of data window.
                    float:  integer or floating point number
                    Default:  -infinity
                    Class:  B
-xmax <float>       Maximum x value of data window.
                    float:  integer or floating point number
                    Default:  infinity
                    Class:  B
-ymin <float>       Minimum y value of data window.
                    float:  integer or floating point number
                    Default:  -infinity
                    Class:  B
-ymax <float>       Maximum y value of data window.
                    float:  integer or floating point number
                    Default:  infinity
                    Class:  B
-zmin <float>       Bottom of initial layer.  If zmin is less than
                    the bottom of layer lmin, zmin will be reset to
                    the bottom of layer lmin.
                    float:  integer or floating point number
                    Default:  bottom of part
                    Class:  B
-zmax <float>       Top of final layer.  If zmax is greater than the
                    top of layer lmax, zmax will be reset to the top
                    of layer lmax.
                    float:  integer or floating point number
                    Default:  top of part
                    Class:  B
-lmin <float>       Initial layer number.  If the bottom of layer
                    lmin is less than zmin, lmin will be reset to the
                    layer whose bottom is zmin.
                    float:  integer or floating point number
                    Default:  first layer of part
                    Class:  B
-lmax <float>       Final layer number.  If the top of layer lmax is
                    greater than zmax, lmax will be reset to the
                    layer whose top is zmax.
                    float:  integer or floating point number
                    Default:  last layer of part
                    Class:  B
-style <U|L|M|H|O>  Slicing style:
                    U:  undersize part
                    L:  one cut per layer at bottom
                    M:  one cut per layer in middle
                    H:  one cut per layer at top
```

```
                  O:  oversize part
                  Default:  O
                  Class:  B
-raw < |T|F>      Raw cuts of triangle file only?
                  blank,T:  true
                  F:  false
                  -raw T is equivalent to
                  -lo T -bo T -style -1 -reorient F -lboalg 0
-dfoalg 0
                  -ufoalg 0
                  Default:  F
                  Class:  B
-res <float>      Resolution scale factor
                  (number of slice units per cad unit).
                  float:  integer or floating point number
                  Default:  5000/inch
                  Class:  A
-resratio <float> Multiplies the resolution for intermediate
                  calculations in the x and y directions, (ie.,
                  xres=yres=resratio*res)
                  float:  integer or floating point number
                  Default:  3
                  Class:  A
-unit <I|M|C|float> Cad unit.
                  I:  inches
                  M:  millimeters
                  C:  centimeters
                  float:  integer or floating point number
                  Default:  I
                  Class:  A
-reorient < |T|F> Reorient misoriented boundaries?
                  blank,T:  true
                  F:  false
                  Default:  T
                  Class:  A
-overcure <float> Overcure amount?
                  float:  integer or floating point number
                  Default:  .006 in
                  Class:  A
-r <file> < |A|B> < |0|1>  Input file
                  1st field:  file name
                    file:  input file name
                  2nd field:  file format
                    blank,B:  binary
                    A:  ascii
                  3rd field:  numberic byte order
                    blank,0:  lowest byte first
                    1:  lowest byte last
                  Default:  none B 0
                  Class:  A
-w < |file> < |A|B> < |0|1>  Output file
```

```
                   1st field:  file name
                     blank:  output file has same base name as read
                     file but an extension of .sli
                     file:  file name
                   2nd field:  file format
                     blank,B:  binary
                     A:  ascii
                   3rd field:  numeric byte order
                     blank,0:  lowest byte first
                     1:  lowest byte last
                   Default:  blank B 0
                   Class:  A
-m < |file>        Message file name.
                   blank:  output file has same base name as read
                   file but an extension of .msg
                   file:  file name
                   Default:  blank
                   Class:  A
-p < |F|file>      Parameter or argument file.
                   blank:  output file has same base name as read
file but
                   an extension of .arg
                   F:  no message file
                   file:  file name
                   Default:  F
                   Class:  A
-s < |T|F>         Display screen messages?
                   blank,T:  true
                   F:  false
                   Default:  T
                   Class:  A
-i < |file>        Internal data file.
                   blank:  slice.tmp
                   file:  file name
                   Default:  blank
                   Class:  A
-mat < |file>      Material file
                   blank:  no material file
                   file:  file name
                   Default:  blank
                   Class:  A
-sec < |file>      Security file containing password.
                   blank:  no security file
                   file:  file name
                   Default:  blank
                   Class:  A
-eps <float>       Spatial error tolerance.
                   float:  integer or floating point number
                   Default:  .5/res
                   Class:  A
-byteorder <0|1>   Machine byte order.
```

```
                    0:  lowest byte first
                    1:  lowest byte last
                    Default:  if IRIS 1 else 0
                    Class:  A
-carriage < |T|F>   Add carriage return to new line?
                    blank,T:  true
                    F:  false
                    Default:  if DOS T, else F
                    Class:  B
-hx 3*<float>       Horizontal hatch spacing, initial offset,
                    successive layer shift.
                    float:  integer or floating point number
                    -hx #1 #2 #3 is equivalent to:
                    -lh 0 #1 #2 #3 -dh 0 #1 #2 #3
                    Default:  0 0 0
                    Class:  A
-hy 3*<float>       Vertical hatch spacing, initial offset,
                    successive layer shift.
                    float:  integer or floating point number
                    -hx #1 #2 #3 is equivalent to:
                    -lh 90 #1 #2 #3 -dh 90 #1 #2 #3
                    Default:  0 0 0
                    Class:  A
-ha 3*<float>       60/120 hatch spacing, initial offset,
                    successive layer shift.
                    float:  integer or floating point number
                    -ha #1 #2 #3 is equivalent to:
                    -lh 60 #1 #2 #3 -dh 60 #1 #2 #3
                    -lh 120 #1 #2 #3 -dh 120 #1 #2 #3
                    Default:  0 0 0
                    Class:  A
-ht 3*<float>       0/60/120 hatch spacing, initial offset,
                    successive layer shift.
                    float:  integer or floating point number
                    -ht #1 #2 #3 is equivalent to:
                    -lh 0 #1 #2 #3 -dh 0 #1 #2 #3
                    -lh 60 #1 #2 #3 -dh 60 #1 #2 #3
                    -lh 120 #1 #2 #3 -dh 120 #1 #2 #3
                    Default:  0 0 0
                    Class:  A
-fx 3*<float>       Horizontal fill spacing, initial offset,
                    successive layer shift.
                    float:  integer or floating point number
                    -fx #1 #2 #3 is equivalent to:
                    -df 0 #1 #2 #3 -uf 0 #1 #2 #3
                    Default:  0 0 0
                    Class:  A
-fy 3*<float>       Vertical fill spacing, initial offset,
                    successive layer shift.
                    float:  integer or floating point number
                    -fy #1 #2 #3 is equivalent to:
```

```
                      blank,T:  true
                      F:  false
                      -x is equivalent to:
                      -axis X
                      Default:  F
                      Class:  A
-y < |T|F>            Slice axis is y?
                      blank,T:  true
                      F:  false
                      -y is equivalent to:
                      -axis Y
                      Default:  F
                      Class:  A
-z < |T|F>            Slice axis is z?
                      blank,T:  true
                      F:  false
                      -z is equivalent to:
                      -axis Z
                      Default:  T
                      Class:  A
-mirror < |T|F>       Mirror image?  (Swap nonslice axes?)
                      blank,T:  true
                      F:  false
                      Default:  if axis is z? F, else T
                      Class:  A
-rx <float>           Rotation about x axis.
                      float:  integer or floating point number
                      Default:  0
                      Class:  A
-ry <float>           Rotation about y axis.
                      float:  integer or floating point number
                      Default:  0
                      Class:  A
-rz <float>           Rotation about z axis.
                      float:  integer or floating point number
                      Default:  0
                      Class:  A
-tx <float>           Translation along x axis.
                      float:  integer or floating point number
                      Default:  0
                      Class:  A
-ty <float>           Translation along y axis.
                      float:  integer or floating point number
                      Default:  0
                      Class:  A
-tz <float>           Translation along z axis.
                      float:  integer or floating point number
                      Default:  0
                      Class:  A
-sx <float>           Scaling along x axis.
                      float:  integer or floating point number
```

```
                  Default:  1
                  Class:  A
-sy <float>       Scaling along y axis.
                  float:  integer or floating point number
                  Default:  1
                  Class:  A
-sz <float>       Scaling along z axis.
                  float:  integer or floating point number
                  Default:  1
                  Class:  A
-scl <float>      Scaling along x, y, and z axes.
                  float:  integer or floating point number
                  -scl #1 is equivalent to:
                  -sx #1 -sy #1 -sz #1
                  Default:  1
                  Class:  A
-range <float>    Minimum z value of range.
                  float:  integer or floating point number
                  Default:  first range:  0
                  Class:  A
-zs <float>       Layer thickness for current range.
                  float:  integer or floating point number
                  Default:  .01
                  Class:  A
-lbo < |float>    Layer border offset for current range.
                  blank:  derive from material file if a material
                  file has been declared, else use value from
                  previous range if not on first range, else set to
                  0.
                  float:  integer or floating point number
                  Default:  If lbo is absent for a given range,
                  lbo value of previous range
                  If lbo value is blank
                  Class:  A
-dfo < |float>    Down fill border offset for current range.
                  blank:  derive from material file if a material
                  file has been declared, else use value from
                  previous range if not on first range, else set to
                  0.
                  float:  integer or floating point number
                  Default:  0
                  Class:  A
-ufo < |float>    Up fill border offset for current range.
                  blank:  derive from material file if a material
                  file has been declared, else use value from
                  previous range if not on first range, else set to
                  0.
                  float:  integer or floating point number
                  Default:  0
                  Class:  A
-slcalg <0|1>     Slicing algorithm number.
```

```
                  0:  turn slicing off.
                  1:  turn slicing on.
                  Default:  1
                  Class:  B
-lboalg <0¦1>     Layer border offset algorithm number.
                  0:  turn offset off.
                  1:  turn offset on.
                  Default:  1
                  Class:  A
-dfoalg <0¦1>     Down fill border offset algorithm number.
                  0:  turn offset off.
                  1:  turn offset on.
                  Default:  1
                  Class:  A
-ufoalg <0¦1>     Up fill border offset algorithm number.
                  0:  turn offset off.
                  1:  turn offset on.
                  Default:  1
                  Class:  A
```

9.2 PARAMETER ORDER

Due to interparameter dependencies, the following input parameter order must be followed:

The set of parameters {help, debug, timing, reorient, bo, lo, style, raw, sclalg,lboalg, dfoalg, ufoalg, r,w,m,p,s, sec,i,ro,mirror, lmin,lmax ,rz,sx,sy,tx,ty,tz,warn } can occur anywhere. The parameter {data} must precede the parameters {sz,scl,rx,ry,axis,x,y,z}. The parameters {unit,resratio} must precede the parameter {res} which must precede the parameters {hx,hy,ha,ht,fx,fy,h,lh,dh,f,df,uf,xmin,xmax,ymin,ymax}. The parameters {unit,resratio} must precede the parameter {res} which precedes the parameters {eps,overcure,mat} which precedes the parameters {range,zs,lbo,dfo,ufo} which precedes the parameters {zmin,zmax}. Failure to observe the proper parameter order results in an error message by SLICE and termination of program execution.

10.0 ARGUMENT FILE (.ARG)

The argument or parameter file contains any additional user information to run the SLICE program beyond that which is present in the command line. Any information in this file could be put on the command line; however for a lot of arguments the command line becomes unwieldy and besides in DOS the command line is limited to 128 characters. Information in this file is spliced into the command line at the point that this file is invoked. This file is typically given the extension ARG.

10.1 FILE STRUCTURE

The following gives a hierarchical description of the structure of the ARG file.

```
ARG FILE:
  LIST OF PARAMETERS

PARAMETER:
  -NAME
  LIST OF VALUES

NAME:
  ascii characters terminated with a blank

VALUE:
  ascii characters terminated with a blank
```

This format is not line sensitive and new lines may be inserted anywhere a blank is called for. Also comments may be inserted into the file by enclosing them in /* ... */ or // ... \n (ie., // to the end of the line).

10.2 PARAMETER LIST

The list of parameters is given in the discussion of the command line.

10.3 EXAMPLE

The following gives the argument file for a tetrahedron (wedge) with vertices at (0,0,0), (1,0,0), (0,1,0), and (0,0,1).

```
-r wedge.stl            // input STL file
-w wedge.sli            // output SLI file
-m wedge.msg            // message MSG file
-res 1000               // slice resolution
-zs .05                 // layer thickness of 50 mils.
-ht .05                    // triangle hatch pattern with 50 mil
```

11.0 SECURITY FILE (.SEC)

The ascii security file contains an 8 digit hexadecimal number which encrypts the computer identification number (system ID number) and serves as a password permitting user access. The security file usually carries the extension SEC.

12.0 MATERIAL FILE (.MAT)

The material file gives the cure width as a function of laser power and step period. The material file usually carries the extension MAT.

12.1 FILE STRUCTURE

The following gives a hierarchical description of the structure of the MAT file using the abbreviations:

```
(int):   integer
(float):  floating point
\n:      new line

MAT FILE:
  COMMENT LINE
  laser power in milliwatts (float) \n
  number of data samples (int) \n
  LIST OF SAMPLES

COMMENT LINE
  ! ascii characters \n

SAMPLE
  step period in dekamicroseconds (float) \n
  cure depth in inches (float) \n
  cure width .006 inches above bottom of bullet (float) \n
  cure width at top of bullet (float) \n
```

12.2 EXAMPLE

```
! MATERIAL 3.60 UNITS=INCH
11.1700
5
240.000
0.03100
0.00179
0.00406
120.000
0.02750
0.00179
0.00383
60.0000
0.02200
0.00179
0.00342
30.0000
0.01750
0.00179
```

```
0.00305
15.0000
0.01200
0.00179
0.00253
```

13. STEREOLITHOGRAPHY FILE (.STL)

SLICE accepts two types of triangle data input: ascii and binary. The file consists of a list of triangles (each consisting of a normal and three vertices) which tessellate the surface of the part. These triangle files are typically given a file extension of STL. The normal information is redundant (it can be rederived from the triangle vertices) and is not used by SLICE.

13.1 ASCII FORMAT

13.1.1 FILE STRUCTURE

The following gives a hierarchical description of the structure of the ascii STL file using the abbreviations:

```
(float):   ascii floating point number terminated with a blank
(string):  ascii characters terminated with a blank
\n:        new line

STL FILE:
  solid PART NAME          \n
  LIST OF TRIANGLES
  endsolid                 \n

TRIANGLE:
  facet normal  UNIT NORMAL VECTOR \n
    outer loop                     \n
      vertex    VERTEX 1           \n
      vertex    VERTEX 2           \n
      vertex    VERTEX 3           \n
    endloop                        \n
  endfacet                         \n

UNIT NORMAL VECTOR:
  x component (float)
  y component (float)
  z component (float)

VERTEX:
  x component (float)
  y component (float)
  z component (float)

PART NAME:
  (string)
```

13.1.2 EXAMPLE

The following gives the file for a tetrahedron (wedge) with vertices at (0,0,0), (1,0,0), (0,1,0), and (0,0,1):

```
solid WEDGE
  facet normal  -5.00000000   0.00000000   0.00000000
    outer loop
      vertex     0.00000000   0.00000000   0.00000000
      vertex     0.00000000   0.00000000   5.00000000
      vertex     0.00000000   5.00000000   0.00000000
    endloop
  endfacet
  facet normal   0.00000000   0.00000000  -5.00000000
    outer loop
      vertex     0.00000000   0.00000000   0.00000000
      vertex     0.00000000   5.00000000   0.00000000
      vertex     5.00000000   0.00000000   0.00000000
    endloop
  endfacet
  facet normal   0.00000000  -5.00000000   0.00000000
    outer loop
      vertex     0.00000000   0.00000000   5.00000000
      vertex     0.00000000   0.00000000   0.00000000
      vertex     5.00000000   0.00000000   0.00000000
    endloop
 endfacet
  facet normal   0.57735027   0.57735027   0.57735027
    outer loop
      vertex     0.00000000   0.00000000   5.00000000
      vertex     5.00000000   0.00000000   0.00000000
      vertex     0.00000000   5.00000000   0.00000000
    endloop
  endfacet
endsolid WEDGE
```

13.2 BINARY FORMAT

13.2.1 FILE STRUCTURE

The following gives a hierarchical description of the structure of the binary STL file using the abbreviations:

```
(int1):     1 byte integer
(int2):     2 byte integer
(int4):     4 byte integer
(float4):   4 byte floating point
(charN):    N ascii characters
(N):        N bytes
```

```
STL FILE:
  HEADER (char80)
  NUMBER OF FACETS (int4)
  LIST OF TRIANGLES
```

```
TRIANGLE (50):
  UNIT NORMAL VECTOR (12)
  VERTEX 1 (12)
  VERTEX 2 (12)
  VERTEX 3 (12)
  ATTRIBUTE (int2)

UNIT NORMAL VECTOR (12):
  x component (float4)
  y component (float4)
  z component (float4)

VERTEX (12):
  x component (float4)
  y component (float4)
  z component (float4)

ATTRIBUTE (int2):
  0
```

13.2.3 EXAMPLE

The following gives the file for a tetrahedron (wedge) with vertices at (0,0,0), (1,0,0), (0,1,0), and (0,0,1):

```
  0 7765646765 2020202020 2020202020 2020202020 wedge
 20 2020202020 2020202020 2020202020 2020202020
 40 2020202020 2020202020 2020202020 2020202020
 60 2020202020 2020202020 2020202020 202020201a                    .
 80 0400000000 0080bf0000 0000000000 0000000000 ....................
100 0000000000 0000000000 0000000000 000000803f ...................?
120 0000000000 00803f0000 0000000000 0000000000 .......?............
140 0000000080 bf00000000 0000000000 0000000000 ....................
160 0000000080 3f00000000 0000803f00 0000000000 .....?.......?......
180 0000000000 0000000000 80bf000000 0000000000 ....................
200 0000000000 00803f0000 0000000000 0000000000 .......?............
220 0000803f00 0000000000 000000003a cd133f3acd ...?..........:..?:.
240 133f3acd13 3f00000000 0000000000 00803f0000 .?:..?...........?..
260 803f000000 0000000000 0000000000 00803f0000 .?...............?..
280 00000000                                        ....
```

14.0 STEREOLITHOGRAPHY CONTOUR FILE (.SLC)

SLICE accepts two types of contour data input: ascii and binary. The file consists of a list of layers in ascending z order. Each layer is comprised of a list of contours given as polylines. Each polyline is a list of points. The data for a given layer is assumed to apply until the next layer is reached, i.e, the maximum z value for a layer is assumed to be just below the minimum z value for the next layer. The minimum z value of the first layer is assumed to be the minimum z value of the part. The vertices in a contour which surrounds a solid region of the part must be given in a counterclockwise order while those contours which surround an empty region or hole are given in a clockwise order. This ordering keeps the solid region to the left and empty region to the right as the contour is traversed in the given vertex order. To ensure closure of the contour (i.e., to insure a polygon) the first and last points of the contour must be equal. These contour files are typically given a file extension of SLC. In addition to these contour files consisting of polylines, an ascii segment file format is provided primarily for debugging purposes such as rerouting segment output in the SLI file back to the input. The segments are oriented so that the solid region is to the left and empty region to the right of the segments when viewed from tail to head.

14.1 POLYLINE ASCII FORMAT

14.1.1 FILE STRUCTURE

The following gives a hierarchical description of the structure of the ascii SLC file using the abbreviations:
(number): ascii integer or numbering point number terminated with a blank (string): ascii characters terminated with a blank
\n: new line

```
SLC FILE:
  LIST OF COMMENT LINES
  LIST OF LAYERS
  L MAXIMUM VALUE

COMMENT LINE
  !ascii characters

LAYER:
  L LAYER VALUE \n
  LIST OF CONTOURS

CONTOUR:
  LIST OF VERTICES \n
```

VERTEX:
  X COMPONENT (number)
  Y COMPONENT (number) \n

LAYER VALUE:
  z value at bottom of layer (number)

MAXIMUM VALUE:
  z value at top of part (number)

14.1.2 EXAMPLE

This example gives a cube with a centered cubical hole with data given in inches. The eight vertices of the cube are located at (1,1,1), (1,1,4), (1,4,1), (1,4,4), (4,1,1), (4,1,4), (4,4,1), and (4,4,4). The eight vertices of the cubical hole are at (2,2,2), (2,2,3), (2,3,2), (2,3,3), (3,2,2), (3,2,3), (3,3,2), and (3,3,3).

```
! WEDGE
L 1.0
1.0 1.0
4.0 1.0
4.0 4.0
1.0 4.0
1.0 1.0

L 2.0
1.0 1.0
4.0 1.0
4.0 4.0
1.0 4.0
1.0 1.0

2.0 2.0
2.0 3.0
3.0 3.0
3.0 2.0
2.0 2.0

L 3.0
1.0 1.0
4.0 1.0
4.0 4.0
1.0 4.0
1.0 1.0

L 4.0
```

14.2 POLYLINE BINARY FORMAT

14.2.1 FILE STRUCTURE

```
The following gives a hierarchical description of the structure of
the binary SLC file using the abbreviations:
(int1):     1 byte integer
(int2):     2 byte integer
(int4):     4 byte integer
(float4):   4 byte floating point

SLC FILE:
  HEADER
  hexadecimal 1a (int1)
  DATA FORMAT (int1)
  DATA UNIT (int1)
  DATA TYPE (int1)
  LIST OF LAYERS
  maximum z value of part (float4)
  TERMINATION FLAG

HEADER:
  list of any ascii characters except hexadecimal 1a

DATA FORMAT:
  one of the following (int1):
  0:  IEEE 4 byte floating point format -- low byte first
  1:  IEEE 4 byte floating point format -- low byte last

DATA UNIT:
  one of the following (int1):
  0:  inches
  1:  millimeters
  2:  centimeters

DATA TYPE:
  0 (int1)

LAYER:
  minimum z value (float4)
  LIST OF CONTOURS
  TERMINATION FLAG

CONTOUR:
  LIST OF VERTICES
  TERMINATION FLAG

VERTEX:
  x value (float4)
  y value (float4)

TERMINATION FLAG:
  hexadecimal fffffff (int4)
```

14.2.2 EXAMPLE:

This example gives a cube with a centered cubical hole with data given in inches and the data format in IEEE 4 byte floating point format with low byte first. The eight vertices of the cube are located at (1,1,1), (1,1,4), (1,4,1), (1,4,4), (4,1,1), (4,1,4), (4,4,1), and (4,4,4). The eight vertices of the cubical hole are at (2,2,2), (2,2,3), (2,3,2), (2,3,3), (3,2,2), (3,2,3), (3,3,2), and (3,3,3).

The following is a hex dump of the SLC file.
The floating point numbers 1, 2, 3, and 4 encode as hexadecimal (lowest byte on left) 0000803f, 00000040, and 00004040, and 00008040, binary (lowest bit on left) 00000000000000000000000111111100, 00000000000000000000000000000010, 00000000000000000000001000000010, and 00000000000000000000000100000010 respectively:

```
  0 5468726565 20696e6368 2063756265 2077697468 Three inch cube with
 20 206f6e6520 696e636820 686f6c651a 0000000000  one inch hole......
 40 803f000080 3f0000803f 0000804000 00803f0000 .?...?...?...@...?..
 60 8040000080 400000803f 0000804000 00803f0000 .@...@...?...@...?..
 80 803fffffff ffffffffff 0000004000 00803f0000 .?...........@...?..
100 803f000080 400000803f 0000804000 0080400000 .?...@...?...@...@..
120 803f000080 400000803f 0000803fff ffffff0000 .?...@...?...?......
140 0040000000 4000000040 0000404000 0040400000 .@...@...@..@@..@@..
160 4040000040 4000000040 0000004000 000040ffff @@..@@...@...@...@..
180 ffffffffff ff00004040 0000803f00 00803f0000 ........@@...?...?..
200 8040000080 3f00008040 0000804000 00803f0000 .@...?...@...@...?..
220 8040000080 3f0000803f ffffffffff ffffff0000 .@...?...?..........
240 8040ffffff ff                               .@....
```

14.3 SEGMENT ASCII FORMAT

14.3.1 FILE STRUCTURE

The following gives a hierarchical description of the structure of the ascii segment SLC file using the abbreviations:
(number): ascii integer or numbering point number terminated with a blank (string): ascii characters terminated with a blank
\n: new line

```
SLC FILE:
  LIST OF COMMENT LINES
  LIST OF LAYERS
  L MAXIMUM VALUE

COMMENT LINE
  !ascii characters

LAYER:
  L LAYER VALUE \n
  LIST OF CONTOURS
```

```
CONTOUR:
  LIST OF SEGMENTS \n

VERTEX:
  x component of tail of segment (number)
  y component of tail of segment (number)
  x component of head of segment (number)
  y component of head of segment (number) \n

LAYER VALUE:
  z value at bottom of layer (number)

MAXIMUM VALUE:
  z value at top of part (number)
```

14.3.2 EXAMPLE

This example gives a cube with a centered cubical hole with data given in inches. The eight vertices of the cube are located at (1,1,1), (1,1,4), (1,4,1), (1,4,4), (4,1,1), (4,1,4), (4,4,1), and (4,4,4). The eight vertices of the cubical hole are at (2,2,2), (2,2,3), (2,3,2), (2,3,3), (3,2,2), (3,2,3), (3,3,2), and (3,3,3).

```
! WEDGE
L 1.0
1.0 1.0 4.0 1.0
4.0 1.0 4.0 4.0
4.0 4.0 1.0 4.0
1.0 4.0 1.0 1.0

L 2.0
1.0 1.0 4.0 1.0
4.0 1.0 4.0 4.0
4.0 4.0 1.0 4.0
1.0 4.0 1.0 1.0
2.0 2.0 2.0 3.0
2.0 3.0 3.0 3.0
3.0 3.0 3.0 2.0
3.0 2.0 2.0 2.0

L 3.0
1.0 1.0 4.0 1.0
4.0 1.0 4.0 4.0
4.0 4.0 1.0 4.0
1.0 4.0 1.0 1.0

L 4.0
```

15.0 INTERMEDIATE TEMPORARY FILE (.TMP)

This binary file is used by SLICE to hold either the transformed, rounded off, and sorted list of triangles if the input data is faceted or the transformed, rounded off, and correctly oriented list of polygons if the input data is contoured.

15.1 TRIANGLE DATA

Before being written to the TMP file, the input triangle list is cleaned up: Triangles are rotated, scaled, translated, coordinate permutated, and rounded off to slice units and the z coordinate to the nearest layer boundary. Flat triangles and those lying outside the total slice range are eliminated. The vertices of the triangle are permutated so the that the first vertex holds the minimum z value and the third vertex holds the maximum z value. The "orient" field holds the orientation of the triangles (1: counterclockwise, right handed; -1: clockwise, left handed). The triangles are sorted by the minimum z value of the first vertex, or if they are equal, by the minimum z value of the third vertex, or if they are equal, by the maximum sign of the z component of the normal.

15.1.1 FILE STRUCTURE

The following gives a hierarchical description of the structure of the binary TMP file for triangles using the abbreviations:

```
(int1):    1 byte integer
(float4):  4 byte floating point

TMP FILE:
  LIST OF TRIANGLES

TRIANGLE (38):
  VERTEX with minimum z value (12)
  VERTEX with median z value  (12)
  VERTEX with maximum z value (12)
  ORIENTATION (1)
  NORMAL DIRECTION (1)

VERTEX (12):
  x coordinate (float4)
  y coordinate (float4)
  z coordinate (float4)

ORIENTATION (int1):
  order of triangle vertices:
  -1:  clockwise (left handed)
```

```
   1:  counterclockwise (right handed)

NORMAL DIRECTION (int1):
  direction of triangle normal:
  -1:  downward
   0:  horizontal
   1:  upward
```

15.1.2 EXAMPLE:

The following gives the TMP file for a tetrahedron (wedge) with vertices at (0,0,0), (1,0,0), (0,1,0), and (0,0,1).

```
  0 00803b4500 0000000000 0000000000 0000803b45 ..;E..............;E
 20 0000000000 0000000000 000000007a 4401010000 ..............zD....
 40 0000000000 0000000000 00803b4500 0000000000 ............;E......
 60 0000000000 0000000000 00007a4401 0000000000 ............zD......
 80 0000000000 0000000000 000000803b 4500000000 ..............;E....
100 0000000000 0000000000 7a44ff00              ..........zD..
```

15.2 POLYLINE DATA

Before being written to the TMP file, the input contour list is cleaned up:
Contours are rotated, scaled, translated, and rounded off to slice units and the z value is rounded off to the nearest layer boundary. Those input layers lying outside the total slice range are eliminated. Any gaps in the contour list are closed, and the resulting polygons are either booleaned or alternately oriented.

15.2.1 FILE STRUCTURE

The following gives a hierarchical description of the structure of the binary TMP file for polylines using the abbreviations:

```
(int1):     1 byte integer
(int):      2 or 4 byte integer (machine dependent)
(float4):   4 byte floating point

TMP FILE:
  LIST OF LAYERS

LAYER:
  minimum z value (float4)
  maximum z value (float4)
  number of polylines (int)
  LIST OF POLYLINES

POLYLINE:
  is polyline closed? (0 or 1) (int1)
  number of vertices (int)
  LIST OF VERTICES
```

```
VERTEX:
  x component of vertex (float4)
  y component of vertex (float4)
```

15.2.2 EXAMPLE:

The following gives the TMP file for a cube with a centered cubical hole with data given in inches. The eight vertices of the cube are located at (1,1,1), (1,1,4), (1,4,1), (1,4,4), (4,1,1), (4,1,4), (4,4,1), and (4,4,4). The eight vertices of the cubical hole are at (2,2,2), (2,2,3), (2,3,2), (2,3,3), (3,2,2), (3,2,3), (3,3,2), and (3,3,3).

```
  0 00007a4400 00fa440100 0104000000 7a4500007a ..zD...D.......zE..z
 20 4500007a44 00007a4500 007a440000 7a4400007a E..zD..zE..zD..zD..z
 40 4500007a44 0000fa4400 803b450200 0104000000 E..zD...D..;E.......
 60 7a4500007a 4500007a44 00007a4500 007a440000 zE..zE..zD..zE..zD..
 80 7a4400007a 4500007a44 0104000080 3b450000fa zD..zE..zD.....;E...
100 440000fa44 0000fa4400 00fa440080 3b4500803b D...D...D...D..;E..;
120 4500803b45 00803b4500 007a450100 0104000000 E..;E..;E..zE.......
140 7a4500007a 4500007a44 00007a4500 007a440000 zE..zE..zD..zE..zD..
160 7a4400007a 4500007a44                       zD..zE..zD
```

16.0 OUTPUT SCREEN

The screen output is identical to the message file.

17.0 MESSAGE FILE (.MSG)

The message file gives a summary of the actions taken by SLICE. The message file usually carries the extension MSG.

17.1 FILE STRUCTURE

MSG FILE:
  !input parameters
  !parameters needed by the MERGE program
  triangle breakdown
  data extents in x, y, and z
  layer extents in z
  layer by layer activity
  number of layers with missing segments (indicates missing triangles) number of layers with misoriented segments (indicates misoriented triangles) memory allocation message termination time

17.1.1 LAYER BY LAYER ACTIVITY

The single line processing message put out by SLICE give the layer index referenced to the bottom of the part (the first layer of the part has an index value of 1), the z value range of the layer in both cad and slice units, and the time since SLICE started executing.

The message type and corresponding actions are:

Slicing layer n: Cuts the triangles pertinent to layer n and forms a polygonal representation of same.
Compensating layer n: Adjusts the polygonal boundaries of layer n to account for a finite line width. Generating down layer n: Differences the current layer and the one right below it to generate a boundary for the down region of layer n.
Generating up layer n: Differences the current layer and the one right above it to generate a boundary for the up region of layer n.
Hatching layer n: Hatches layer n. Retracting up layer n: Retracts the boundary of the up region of layer n.
Filling up layer n: Skin fills the up region of layer n.
Retracting down layer n: Retracts the boundary of the down region of layer n. Filling down layer n: Skin fills the down region of layer n.

17.2 EXAMPLE

The following gives the argument file for a tetrahedron (wedge) with vertices at (0,0,0), (1,0,0), (0,1,0), and (0,0,1).

```
!-ver 43 -p wedge.arg -unit inches -r wedge.stl -w wedge.sli -m
wedge.msg
!-res 1000 -zs .05 -ht .05 -fx .004 -axis z -sx .5 -sy .5 -sz .5
-lbo .005
!-ufo .003 -dfo .003 -range 0.00 -zs .05 -range 0.20 -zs .10 -range
0.40
!-zs .20 -range 0.80 -zs .05
!SLICE= -VER 43 -RES 1000 -ZS 50

4 TRIANGLES:
1 flat downfacing triangle
0 flat upfacing triangles
0 nearflat downfacing triangles
1 nearflat upfacing triangle
2 steep triangles

DATA EXTENTS:
0 <= x <= 0.5
0 <= y <= 0.5
0 <= z <= 0.6

7 LAYERS:
1 <= n <= 7
0.000 <= z <= 0.600  (cad units)
0 <= z <= 600  (SLICE units)

Slicing layer 0 (-0.050-0.000, -50-0) at 00:00:05
Compensating layer 0 (-0.050-0.000, -50-0) at 00:00:05
Slicing layer 1 (0.000-0.050, 0-50) at 00:00:05
Compensating layer 1 (0.000-0.050, 0-50) at 00:00:05
Slicing layer 2 (0.050-0.100, 50-100) at 00:00:05
Compensating layer 2 (0.050-0.100, 50-100) at 00:00:05
Generating down layer 1 (0.000-0.050, 0-50) at 00:00:05
Generating up layer 1 (0.000-0.050, 0-50) at 00:00:05
Hatching down layer 1 (0.000-0.050, 0-50) at 00:00:05
Retracting down layer 1 (0.000-0.050, 0-50) at 00:00:05
Filling down layer 1 (0.000-0.050, 0-50) at 00:00:05
Slicing layer 3 (0.100-0.150, 100-150) at 00:00:06
Compensating layer 3 (0.100-0.150, 100-150) at 00:00:06
Generating down layer 2 (0.050-0.100, 50-100) at 00:00:06
Generating up layer 2 (0.050-0.100, 50-100) at 00:00:06
Hatching layer 2 (0.050-0.100, 50-100) at 00:00:06
Retracting up layer 2 (0.050-0.100, 50-100) at 00:00:06
Filling up layer 2 (0.050-0.100, 50-100) at 00:00:06
Slicing layer 4 (0.150-0.200, 150-200) at 00:00:06
Compensating layer 4 (0.150-0.200, 150-200) at 00:00:06
Generating down layer 3 (0.100-0.150, 100-150) at 00:00:06
Generating up layer 3 (0.100-0.150, 100-150) at 00:00:06
Hatching layer 3 (0.100-0.150, 100-150) at 00:00:07
Retracting up layer 3 (0.100-0.150, 100-150) at 00:00:07
Filling up layer 3 (0.100-0.150, 100-150) at 00:00:07
```

```
Slicing layer 5 (0.200-0.300, 200-300) at 00:00:07
Compensating layer 5 (0.200-0.300, 200-300) at 00:00:07
Generating down layer 4 (0.150-0.200, 150-200) at 00:00:07
Generating up layer 4 (0.150-0.200, 150-200) at 00:00:07
Hatching layer 4 (0.150-0.200, 150-200) at 00:00:07
Retracting up layer 4 (0.150-0.200, 150-200) at 00:00:07
Filling up layer 4 (0.150-0.200, 150-200) at 00:00:07
Slicing layer 6 (0.300-0.400, 300-400) at 00:00:07
Compensating layer 6 (0.300-0.400, 300-400) at 00:00:08
Generating down layer 5 (0.200-0.300, 200-300) at 00:00:08
Generating up layer 5 (0.200-0.300, 200-300) at 00:00:08
Hatching layer 5 (0.200-0.300, 200-300) at 00:00:08
Retracting up layer 5 (0.200-0.300, 200-300) at 00:00:08
Filling up layer 5 (0.200-0.300, 200-300) at 00:00:08
Slicing layer 7 (0.400-0.600, 400-600) at 00:00:08
Compensating layer 7 (0.400-0.600, 400-600) at 00:00:08
Generating down layer 6 (0.300-0.400, 300-400) at 00:00:08
Generating up layer 6 (0.300-0.400, 300-400) at 00:00:08
Hatching layer 6 (0.300-0.400, 300-400) at 00:00:08
Retracting up layer 6 (0.300-0.400, 300-400) at 00:00:08
Filling up layer 6 (0.300-0.400, 300-400) at 00:00:08
Slicing layer 8 (0.600-0.800, 600-800) at 00:00:09
Compensating layer 8 (0.600-0.800, 600-800) at 00:00:09
Generating down layer 7 (0.400-0.600, 400-600) at 00:00:09
Generating up layer 7 (0.400-0.600, 400-600) at 00:00:09
Hatching layer 7 (0.400-0.600, 400-600) at 00:00:09
Retracting up layer 7 (0.400-0.600, 400-600) at 00:00:09
Filling up layer 7 (0.400-0.600, 400-600) at 00:00:09

Maximum memory allocation = 11094 bytes
Total memory allocation = 112002 bytes
SLICE TERMINATED NORMALLY AT 00:00:09!
```

18.0 SLI FILE (.SLI)

SLICE write out two type of vector output files: ascii and binary. The output file consists of a header followed by a list of layers. Each layer consists of a list of vector blocks consisting of a vector type and a list of vectors.

18.1 ASCII FORMAT

18.1.1 FILE STRUCTURE

The following gives a hierarchical description of the structure of the ascii SLI file using the abbreviations:

```
(integer): ascii integer terminated with a blank
\n:        new line

SLI FILE:
  LIST OF COMMENT LINES
  LIST OF LAYER BLOCKS

COMMENT LINE:
  ! ascii characters \n

LAYER BLOCK:
  L LAYER VALUE \n
  LIST OF VECTOR BLOCKS

LAYER VALUE:
  z value at top of layer (integer)

VECTOR BLOCK:
 BLOCK TYPE \n
 LIST OF  VECTORS

VECTOR:
  X COMPONENT OF TAIL OF VECTOR (integer)
  Y COMPONENT OF TAIL OF VECTOR (integer)
  X COMPONENT OF HEAD OF VECTOR (integer)
  Y COMPONENT OF HEAD OF VECTOR (integer)
  \n

BLOCK TYPE:
  One of the following: (Note that due to compatibility with the
MERGE program,
  the current mnemonics for the block types are suboptimal.  The
proposed
  optimal mnemonics are enclosed in parentheses.)
  LB    - layer border (LB)
  LH    - layer hatch (LH)
  NFUF  - layer fill (LF) (not used at present)
```

```
FUB   - up border (UB)
NFUH  - up hatch (UH) (not used at present)
FUF   - up fill (UF)
FDB   - down border (DB)
NFDH  - down hatch (DH)
FDF   - down fill (DF)
```

The following gives the SLI file for a tetrahedron (wedge) with vertices at
(0,0,0), (1,0,0), (0,1,0), and (0,0,1). It is sliced at a resolution of 1000,
a triangular hatch spacing of .1, a y fill spacing of .05, and a z layer
thickness of .2

18.1.2 EXAMPLE

```
!SLICE= -VER 38 -RES 1000 -ZS 200

L 200
FDB
 1000 0 0 0
 0 0 0 1000
 0 1000 1000 0
NFDH
 0 100 900 100
 800 200 0 200
 0 300 700 300
 600 400 0 400
 0 500 500 500
 400 600 0 600
 0 700 300 700
 200 800 0 800
 0 900 100 900
NFDH
 924 0 952 48
 878 122 808 0
 693 0 805 195
 732 268 577 0
 462 0 659 341
 586 414 346 0
 231 0 512 488
 439 561 115 0
 0 0 366 634
 293 707 0 200
 0 400 220 780
 146 854 0 600
 0 800 73 927
NFDH
 924 0 820 180
 546 454 808 0
```

```
 693 0 273 727
 0 1000 577 0
 462 0 0 800
 0 600 346 0
 231 0 0 400
 0 200 115 0
FDF
 950 0 950 50
 900 100 900 0
 850 0 850 150
 800 200 800 0
 750 0 750 250
 700 300 700 0
 650 0 650 350
 600 400 600 0
 550 0 550 450
 500 500 500 0
 450 0 450 550
 400 600 400 0
 350 0 350 650
 300 700 300 0
 250 0 250 750
 200 800 200 0
 150 0 150 850
 100 900 100 0
 50 0 50 950
L 400
LB
 600 0 0 0
 0 0 0 600
 0 600 600 0
FUB
 0 800 800 0
 800 0 600 0
 600 0 0 600
 0 600 0 800
LH
 0 100 700 100
 600 200 0 200
 0 300 500 300
 400 400 0 400
 0 500 300 500
 200 600 0 600
 0 700 100 700
LH
 693 0 732 68
 659 141 577 0
 462 0 586 214
 512 287 346 0
 231 0 439 361
 366 434 115 0
```

```
 0 0 293 507
 220 580 0 200
 0 400 146 653
 73 727 0 600
LH
 693 0 547 253
 273 527 577 0
 462 0 0 800
 0 600 346 0
 231 0 0 400
 0 200 115 0
FUF
 750 0 750 50
 700 100 700 0
 650 0 650 150
 600 200 600 0
 550 50 550 250
 500 300 500 100
 450 150 450 350
 400 400 400 200
 350 250 350 450
 300 500 300 300
 250 350 250 550
 200 600 200 400
 150 450 150 650
 100 700 100 500
 50 550 50 750
L 600
LB
 400 0 0 0
 0 0 0 400
 0 400 400 0
FUB
 0 600 600 0
 600 0 400 0
 400 0 0 400
 0 400 0 600
LH
 0 100 500 100
 400 200 0 200
 0 300 300 300
 200 400 0 400
 0 500 100 500
LH
 577 0 586 14
 512 88 462 0
 346 0 439 161
 366 234 231 0
 115 0 293 307
 220 380 0 0
 0 200 146 454
```

```
 73 527 0 400
LH
 577 0 546 54
 273 327 462 0
 346 0 0 600
 0 400 231 0
 115 0 0 200
FUF
 550 0 550 50
 500 100 500 0
 450 0 450 150
 400 200 400 0
 350 50 350 250
 300 300 300 100
 250 150 250 350
 200 400 200 200
 150 250 150 450
 100 500 100 300
 50 350 50 550
L 800
LB
 200 0 0 0
 0 0 0 200
 0 200 200 0
FUB
 0 400 400 0
 400 0 200 0
 200 0 0 200
 0 200 0 400
LH
 0 100 300 100
 200 200 0 200
 0 300 100 300
LH
 346 0 366 34
 293 107 231 0
 115 0 220 180
 146 254 0 0
 0 200 73 327
LH
 346 0 273 127
 0 400 231 0
 115 0 0 200
FUF
 350 0 350 50
 300 100 300 0
 250 0 250 150
 200 200 200 0
 150 50 150 250
 100 300 100 100
 50 150 50 350
```

```
L 1000
FUB
 200 0 0 0
 0 0 0 200
 0 200 200 0
LH
 0 100 100 100
LH
 115 0 146 54
 73 127 0 0
LH
 115 0 0 200
FUF
 150 0 150 50
 100 100 100 0
 50 0 50 150
```

18.2 BINARY FORMAT

18.2.1 FILE STRUCTURE

The following gives a hierarchical description of the structure of the binary SLI file using the abbreviations:

```
(int1):    1 byte integer
(int2):    2 byte integer
(int4):    4 byte integer
(float4):  4 byte floating point

SLI FILE:
  LIST OF COMMENT LINES
  0x1a (int1)
  TWO BYTE INTEGER ORDER
  FOUR BYTE INTEGER ORDER
  MACHINE ID
  LIST OF LAYER BLOCKS

COMMENT LINE:
  ascii characters starting with ! and ending with \n

TWO BYTE INTEGER ORDER:
  low byte number (1 or 2) (int1)
  high byte number (1 or 2) (int1)

FOUR BYTE INTEGER ORDER:
  lowest byte number (1, 2, 3, or 4) (int1)
  next to lowest byte number (1, 2, 3, or 4) (int1)
  next to highest byte number (1, 2, 3, or 4) (int1)
  highest byte number (1, 2, 3, or 4) (int1)

MACHINE ID:
```

```
  Machine identification (int1)

LAYER BLOCK:
  0 (int1)
  layer value (int2)
  LIST OF VECTOR BLOCKS

VECTOR BLOCK:
  block type (int1)
  total number of coordinate components in list of vectors (int2)
  LIST OF VECTORS

VECTOR:
  x component of tail of vector (int2)
  y component of tail of vector (int2)
  x component of head of vector (int2)
  y component of head of vector (int2)

BLOCK TYPE:
  One of the following (int1)
   1   - layer border
   2   - layer hatch
   5   - layer fill (not used at present)
  12   - up border
   4   - up hatch (not used at present)
  14   - up fill
   9   - down border
   7   - down hatch
  11   - down fill
```

18.2.2 EXAMPLE:

The following gives the SLI file for a tetrahedron (wedge) with vertices at (0,0,0), (1,0,0), (0,1,0), and (0,0,1). It is sliced at a resolution of 1000, a triangular hatch spacing of .1, a y fill spacing of .05, and a z layer thickness of .2

```
  0 21534c4943 453d202d56 4552203338 202d524553 !SLICE= -VER 38 -RES
 20 2031303030 202d5a5320 3230300d0a 1a01020102  1000 -ZS 200.......
 40 03047f00c8 00090c00e8 0300000000 0000000000 ....................
 60 000000e803 0000e803e8 0300000724 0000006400 ..............$...d.
 80 8403640020 03c8000000 c80000002c 01bc022c01 ..d. ........,...,.
100 5802900100 0090010000 f401f401f4 0190015802 X..................X.
120 0000580200 00bc022c01 bc02c80020 0300002003 ..X.....,.....  ... .
140 0000840364 0084030734 009c030000 b80330006e ....d....4........0.n
160 037a002803 0000b50200 002503c300 dc020c0141 .z.(........%........A
180 020000ce01 0000930255 014a029e01 5a010000e7 ..........U.J...Z....
200 0000000002 e801b70131 0273000000 000000006e ..........1.s........n
220 017a022501 c3020000c8 0000009001 dc000c0392 .z.%.................
240 0056030000 5802000020 0349009f03 0720009c03 .V...X... .I.... ...
260 00003403b4 002202c601 28030000b5 0200001101 ..4..."...(.........
280 d7020000e8 0341020000 ce01000000 0020030000 ......A.........  ...
300 58025a0100 00e7000000 0000900100 00c8007300 X.Z.................s.
320 00000b4c00 b6030000b6 0332008403 6400840300 ...L.......2...d....
```

```
340 0052030000 5203960020 03c8002003 0000ee0200 .R...R... ... ......
360 00ee02fa00 bc022c01bc 0200008a02 00008a025e .......,...........^
380 0158029001 5802000026 0200002602 c201f401f4 .X...X...&...&......
400 01f4010000 c2010000c2 0126029001 5802900100 ...........&...X....
420 005e010000 5e018a022c 01bc022c01 0000fa0000 .^...^...,...,......
440 00fa00ee02 c8002003c8 0000009600 0000960052 ....... ...........R
460 0364008403 6400000032 0000003200 b603009001 .d...d...2...2......
480 010c005802 0000000000 0000000000 0000580200 ...X.............X..
500 0058025802 00000c1000 0000200320 0300002003 .X.X........ . ... .
520 0000580200 0058020000 0000580200 0058020000 ..X...X.....X...X...
540 2003021c00 00006400bc 0264005802 c8000000c8 ......d...d.X......
560 0000002c01 f4012c0190 0190010000 90010000f4 ...,...,............
580 012c01f401 c800580200 0058020000 bc026400bc .,.....X...X.....d..
600 02022800b5 020000dc02 440093028d 0041020000 ..(.......D.....A...
620 ce0100004a 02d6000002 1f015a0100 00e7000000 ....J.......Z.......
640 b70169016e 01b2017300 0000000000 002501fb01 ..i.n...s.......%...
660 dc00440200 00c8000000 900192008d 024900d702 ..D.............I...
680 0000580202 1800b50200 002302fd00 11010f0241 ..X........#.......A
700 020000ce01 0000000020 0300005802 5a010000e7 ......... ...X.Z....
720 0000000000 90010000c8 0073000000 0e3c00ee02 ............s....<...
740 0000ee0232 00bc026400 bc0200008a 0200008a02 ....2...d...........
760 96005802c8 0058020000 2602320026 02fa00f401 ..X...X...&.2.&.....
780 2c01f40164 00c2019600 c2015e0190 0190019001 ,....d.......^.......
800 c8005e01fa 005e01c201 2c01f4012c 012c01fa00 ..^...^...,....,.,...
820 5e01fa0026 02c8005802 c800900196 00c2019600 ^...&...X...........
840 8a026400bc 026400f401 3200260232 00ee020058 ..d...d...2.&.2....X
860 02010c0090 0100000000 0000000000 0000009001 ....................
880 0000900190 0100000c10 0000005802 5802000058 .............X.X...X
900 0200009001 0000900100 0000009001 0000900100 ....................
920 0058020214 0000006400 f401640090 01c8000000 .X......d...d.......
940 c80000002c 012c012c01 c800900100 0090010000 ...,.,.,...........
960 f4016400f4 0102200041 0200004a02 0e00000258 ..d.... .A...J.....X
980 00ce010000 5a010000b7 01a1006e01 ea00e70000 .....Z.......n......
1000 0073000000 25013301dc 007c010000 00000000c8 .s...%.3...|........
1020 009200c601 49000f0200 0090010214 0041020000 .....I...........A...
1040 2202360011 014701ce01 00005a0100 0000005802 ".6...G.....Z.....X.
1060 00009001e7 0000007300 00000000c8 000e2c0026 .........s.........,.&
1080 0200002602 3200f40164 00f4010000 c2010000c2 ...&.2...d..........
1100 0196009001 c800900100 005e013200 5e01fa002c ............^.2.^...,
1120 012c012c01 6400fa0096 00fa005e01 c8009001c8 .,.,.d.......^......
1140 00c8009600 fa009600c2 016400f401 64002c0132 ............d...d.,.2
1160 005e013200 2602002003 010c00c800 0000000000 .^.2.&.. ...........
1180 0000000000 0000c80000 00c800c800 00000c1000 ....................
1200 0000900190 0100009001 0000c80000 00c8000000 ....................
1220 0000c80000 00c8000000 9001020c00 000064002c .................d.,
1240 016400c800 c8000000c8 0000002c01 64002c0102 .d...........,.d.,..
1260 14005a0100 006e012200 25016b00e7 0000007300 ..Z...n.".%.k.....s.
1280 0000dc00b4 009200fe00 0000000000 00c8004900 ..................I.
1300 4701020c00 5a01000011 017f000000 9001e70000 G....Z..............
1320 0073000000 0000c8000e 1c005e0100 005e013200 .s..........^...^.2.
1340 2c0164002c 010000fa00 0000fa0096 00c800c800 ,.d.,...............
1360 c800000096 0032009600 fa0064002c 0164006400 ......2.....d.,.d.d.
1380 3200960032 005e0100e8 030c0c00c8 0000000000 2...2.^.............
1400 0000000000 000000c800 0000c800c8 0000000204 ....................
1420 0000006400 6400640002 0800730000 0092003600 ...d.d.d....s.....6.
1440 49007f0000 0000000204 0073000000 0000c8000e I..........s........
1460 0c00960000 0096003200 6400640064 0000003200 ........2.d.d.d...2.
1480 0000320096 00                                ..2...
```

19.0 SLICING

19.1 SLICING TRIANGLE INPUT

The triangle list is sliced as follows:
Each output layer has both a minimum and a maximum value.
Slice any triangles having more than one point in this layer at the zmin and zmax value. These truncated triangles form either triangles or trapezoids. Form a segment list (referred to as the "cut" list) from all the segments sliced at zmin. Project the triangles or trapezoids forming the surface of the part at that layer onto the z=zmin plane, reorient them so that the vertex order is counterclockwise as viewed from above, and add their sides to a second segment list (referred to as the "projected" segment list).

Perform the following operations on the cut segment list:
Sort segments by minimum y (as detailed in section 12.3)
Combine identical segments . Connect the segments into polylines.
Close any gaps by connecting the closest polyline ends first (this results in a set of polygons).
If the "reorient" flag is set, ensure the alternate orientation of nested polygons, otherwise boolean the set of polygons.

Perform the following operations on the projected segment list:
Sort segments by minimum y. Combine identical segments.
Split segments at their intersections with each other.
Boolean the segment list. Convert the segment list to a list of polygons.

Union the cut polygon list with the projected polygon list.
Line width compensate the layer

19.2 SLICING CONTOUR INPUT

The input contour list is sliced as follows:

First ensure that the input data layers are clean:
Remove any gaps from the input contour layer by connecting the closest contour ends first. If the "reorient" flag is set, ensure the alternate orientation of nested polygons, otherwise boolean the set of polygons.

Now:
To form each output layer, union the input layers which overlap it in z. Line width compensate this output layer.

20.0 BOOLEAN OPERATION ON BOUNDARIES

20.1 LAYER REPRESENTED AS SET OF POINTS WITH BOUNDARY

A layer may be represented by a set of points in the plane which are bounded by polygons. The polygons satisfy the right hand rule, that is, as the polygon is traversed in the given vertex order, the region to the left is included in the set of points, while the region to the right is outside the set of points.
Points on the boundary are considered to be part of the set, except when the associated polygon is a degenerate hole (i.e.,the limit of a clockwise polygon as the area goes to 0). Degenerate polygons are allowed as limiting cases, and still retain their orientation. The boolean operation of union, intersection,and difference may be performed on pairs of layers by manipulating their boundary representations. As such each layer may be considered an element of a boolean algebra and pairs of layers may be combined using the binary boolean operations of union, intersection, and difference.

20.2 SEGMENT REPRESENTATION

For computational purposes, the polygonal boundaries of the planar set of points may be broken down into a set of segments. Segments have a direction: they precede from tail to head. Four attributes are used to represent segments: a first endpoint, a second endpoint, an orientation count, and a biorientation count (needed later for the boolean operations). The segment endpoints are ordered so that the y value of the first endpoint is less than that of the second endpoint. If the two y values of the endpoints are equal, the x value of the first endpoint should be less than the x value of the second endpoint. If the tail of the segment is equal to the first endpoint, the orientation of the segment is 1, otherwise it is -1. The biorientation of each segment is set to 1.

20.3 SEGMENT LIST

Segments are maintained in a segment list in an order that facilitates the boolean operation. The sequential order criteria for a pair of segments are as follows. If and only if a criterion is insufficient for ordering should the next criterion be invoked. Minimum y value of the first endpoint. Minimum x value of the first endpoint. Minimum sign of the slope measured from first to second endpoint. Maximum slope value (minimum absolute slope value for negative slopes). Minimum y value of the second endpoint. Minimum x value of the second endpoint.

20.4 SPLITTING AND COMBINING SEGMENTS

The set of segments is simplified by splitting segments at each point of intersection with each other if that intersection point is not interior to a continuous set of intersection points. After this splitting operation, any two segments in the set should either have no points in common, one endpoint in common, or all points in common. Segments having identical endpoints are combined into compound segments by adding their orientation and biorientation counts. With the given representation, simple segments are also compound segments but not vice versa. Compound segments with an orientation count of 0 represent a collection of bigons equal in number to half the absolute value of the biorientation count. These bigons are two sided degenerate polygons of zero area and represent the limit of valid polygons whose vertices have become collinear. Bigons maintain a positive (counterclockwise, right handed) or negative (clockwise, left handed) orientation which is arbitrarily bestowed and signaled by the sign of the biorientation count. Initially when the set of segments is created (from other than a boolean operation) all bigon orientation are assumed positive. Only through the boolean operation of differencing are bigons of negative orientation introduced.

20.5 QUANTITATIVE VOLUME

Define a quantitative volume for the points in the plane as follows:

If the point is not on a compound segment, the quantitative volume of the point is equal to the quantitative volume of the point at infinity minus the sum of the orientation counts of those nonhorizontal segments which interiorly intersect a horizontal line of constant y from negative infinity to the point. (If the segment is crossed at an endpoint, only add half the orientation count to this sum.) If the point is on a compound segment with an orientation of zero, the quantitative volume is equal to the quantitative volume of the region adjacent to the segment plus half the biorientation count. (Note that compound segments with orientations of 0 represent a collection of bigons and the quantitative volume on this compound segment is equal to the quantitative volume inside the collection of polygons which in the limit become these bigons.) If the point is on a compound segment with nonzero orientation, the quantitative volume is undefined. The quantitative volume is constant for any connected open region in the plane.

20.6 BOOLEAN REDUCTION

The list of compound segments may be reduced to a simplest form as follows: Associated with each compound segment in the plane are two regions -- to the left and the right of the segment. Keep those segments with a nonzero orientation where one of its associated regions has a quantitative volume less than a given target transition value and the other has a quantitative volume of the transition value or greater. Keep those segments with zero orientation where the regions to either side of the segment have a quantitative volume less than a given transition value and the quantitative volume on the compound segment is equal to the transition value or greater (or vice versa). Discard all other compound segments.

Now discard any segment with a biorientation count less than or equal to 0. Reduce the orientation count of any segment with a positive orientation to 1 and negative orientation to -1. If the orientation is not 0, set the biorientation equal to 1; otherwise set it equal to 2.

The list of compound segments thus represent a list of simple segments and bigons -- two overlapping oppositely directed simple segments.

20.7 UNION:

The union of two sets of segments is found as follows:
Merge segments from both sets into one set. Split and combine segments. Perform a boolean reduction with the quantitative volume at infinity set to 0 and the target transition value set to 1.

20.8 INTERSECTION:

The intersection of two sets of segments is found as follows:
Merge segments from both sets into one set. Split and combine segments. Perform a boolean reduction with the quantitative volume at infinity set to 0 and the target transition value set to 2.

20.9 DIFFERENCE:

The difference of two sets of segments is found as follows:
Negate the orientation and biorientation counts of all segments in the second set. Merge segments from both sets into one set.
Split and combine segments. Perform a boolean reduction with the quantitative volume at infinity set to 1 and the target transition value set to 2.

21.0 BOOLEAN OPERATIONS ON HATCH AND FILL

21.1 INTRODUCTION

Rotate the boundary segment list so that the hatch direction is parallel to the positive x axis. Sort the boundary segment list by minimum y. The operation of union or intersection is performed. The resultant list of hatch lines composed of hatch vectors is rotated back to the original hatch direction. The output order of the hatch vectors is as follows: Output the first hatch vector of the first hatch line. Output the first hatch vector of the second hatch line but reverse the endpoints. Continue outputting the remaining first vector of the successive hatch lines, reversing the order of every other one. When done, redo the procedure but start from the bottom of the hatch line list and proceed in the opposite direction.

21.2 UNION

The union operation is performed to generate hatch vectors or fill vectors where no retraction of the fill boundary has occurred.

For each hatch line y level trace a line from negative infinity through the segment list. To every point of the hatch line is assigned a quantitative volume. Initially the quantitative volume is 0. When the hatch line crosses a segment at other than the endpoint, the orientation count is added to the quantitative volume. For endpoint crossings, add half the orientation count. Those stretches having quantitative volumes of 1 or more become hatch vectors associated with a given hatch line and are elements of the union.

21.3 INTERSECTION

The intersection operation is performed to generate fill vectors where retraction of the fill boundary has occurred in which case the boundary segments of this operation represent the collection of boundary segments from both the nonretracted and the retracted boundaries.

For each hatch line y level trace a line from negative infinity through the segment list. To every point of the hatch line is assigned a quantitative volume. Initially the quantitative volume is 0. When the hatch line crosses a segment at other than the endpoint, the orientation count is added to the quantitative volume. For endpoint crossings, add half the orientation count. Those stretches having quantitative volumes of 2 or more become hatch vectors and are elements of the intersection.

22.0 BEAM COMPENSATION

22.1 PURPOSE

The purpose of beam width compensation is to correct for the radius of the laser beam when a boundary in a given layer is traced.

22.2 ALGORITHM:

Assume a beam compensation amount (i.e., beam radius) of "r". The set of point comprising the part on each layer is bounded be a set of polygons.

For each vertex of each polygon, locate an offset point along the interior bisector of the vertex at a distance "d" equal to the distance to the center of a circle of radius "r" tangent to the two lines through the given vertex and each adjacent vertex respectively. If "d" exceeds sqrt(2)*r, shrink it to sqrt(2)*r. For endpoints of polylines this offset is equal to "r" and is perpendicular to the end segment. These offset points comprise the vertices of the beam width compensated polygon. The vector joining the vertex of the original polygon to the corresponding vertex of the compensated polygon is referred to as a displacement vector.

If the double of a displacement vector crosses a segment of an original polygon of the same type, shrink it so its double just touches the segment.

If two displacement vectors (from polygons of the same type) cross, shrink them to their intersection point.

If a displacement vector crosses a segment of a compensated polygon , retract the compensated segment (by shrinking its two displacement vectors) so that the intrusive displacement vector just touches the compensated segment and the compensated segment is as parallel as possible to its original counterpart.

23.0 FILL RETRACTION

23.1 RATIONALE

The purpose of retracting the fill borders is to reduce the amount of fill drawn.

23.2 ALGORITHM

Assume a fill retraction distance of "r". For each vertex of each polygon, locate an offset point along the interior bisector of the vertex at a distance "d" equal to the distance to the center of a circle of radius "r" tangent to the two lines through the given vertex and each adjacent vertex respectively. For endpoints of polylines this offset is equal to "r" and is perpendicular to the end segment. These offset points comprise the vertices of the fill boundary retracted polygon. Perform a hatch intersection of the original polygon with the retracted one.

24.0 ERROR ANALYSIS

This section calculates the error in quantities which are derived from point locations having an error in their specification. The technique involved here is propagation of variance: the variance of derived quantities are related to the variance in location of the points involved.

24.1 TEST THAT TWO LINE SEGMENTS ARE PARALLEL:

Assume two line segments in the plane are parallel in the absence of any error in endpoint location. The first segment is bounded by the points mA and mB, the second segment by mC and mD. In the presence of error these same segments are bounded by the points A and B, and C and D.

```
where A=mA+eA,
      B=mB+eB,
      C=mC+eC,
      D=mD+eD,
```

where eA, eB, eC, and eD are small errors in the point location. The x and y components of the point location errors are assumed to have identical statistics (they share an identical probability density function) symmetric about 0 (which implies that the expected value or mean of the error raised to any odd power is 0) and a variance (standard deviation squared) of v:

```
ie., E(eAx^n)=0,
     E(eAy^n)=0,
     E(eBx^n)=0,
     E(eBy^n)=0,
     E(eCx^n)=0,
     E(eCy^n)=0,
     E(eDx^n)=0,
     E(eDy^n)=0,
     E(eAx^2)=Var(eAx)=v,
     E(eAy^2)=Var(eAy)=v,
     E(eBx^2)=Var(eBx)=v,
     E(eBy^2)=Var(eBy)=v,
     E(eCx^2)=Var(eCx)=v,
     E(eCy^2)=Var(eCy)=v,
     E(eDx^2)=Var(eDx)=v,
     E(eDy^2)=Var(eDy)=v,
```

where n is any odd integer.

Ideally, to test if the two segments are parallel we would calculate the cross product

```
mCROSS=(mAx-mBx)*(mCy-mDy)-(mAy-mBy)*(mCx-mDx)
```

and compare it with 0.

However the values of mA, mB, mC, and mD are unknown and the corresponding cross product using the actual points

```
CROSS=(Ax-Bx)*(Cy-Dy)-(Ay-By)*(Cx-Dx)
```

will only be close to 0 for these segments.

The variance of the cross product

```
V=Var(CROSS)
```

induced by the error in point location gives us a measure of this nearness to 0. If

```
CROSS <= sqrt(V),
```

the line segments are considered parallel, otherwise they are classified as nonparallel. It thus remains to find a formula for V.

Now the variance in terms of the expectation or mean value of any random variable is:

```
Var(x)=E((x-E(x))^2).
```

Expectation distributes over the sum of random variables as:

```
E(x+y)=E(x)+E(y).
```

The expected value of a constant is:

```
E(c)=c.
```

Expectation distributes over the product of independent random variables as:

```
E(x*y)=E(x)*E(y).
```

The variables mA, mB, mC, and mD are constants while eA, eB, eC, and eD are independent random variables.

Now using the above rules we get:

```
E(CROSS)=E((Ax-Bx)*(Cy-Dy)-(Ay-By)*(Cx-Dx))
        =(mAx-mBx)*(mCy-mDy)-(mAy-mBy)*(mCx-mDx)
        =mCROSS
        =0 (since the two line segments are parallel).
```

```
V=Var(CROSS)
 =E((CROSS-E(CROSS))^2)
 =2*v*(4*v+(mAx-mBx)^2+(mAy-mBy)^2+(mCx-mDx)^2+(mCy-mDy)^2).
```

Since these mean point values are unknown, we replace them by their best estimates -- their actual values -- to yield a cross product variance of

```
V=2*v*(4*v+(Ax-Bx)^2+(Ay-By)^2+(Cx-Dx)^2+(Cy-Dy)^2).
```

24.2 TEST THAT THREE POINTS ARE COLLINEAR:

Assume that three points in the plane are collinear in the absence of any error in endpoint location. The points are mA, mB, and mC. In the presence of error these same points become A, B, and C.

```
where A=mA+eA,
      B=mB+eB,
      C=mC+eC,
```

where eA, eB, and eC are small errors in the point location. The x and y components of the point location errors are assumed to have identical statistics (they share an identical probability density function) symmetric about 0 (which implies that the expected value or mean of the error raised to any odd power is 0) and a variance (standard deviation squared) of v:

```
ie., E(eAx^n)=0,
     E(eAy^n)=0,
     E(eBx^n)=0,
     E(eBy^n)=0,
     E(eCx^n)=0,
     E(eCy^n)=0,
     E(eAx^2)=Var(eAx)=v,
     E(eAy^2)=Var(eAy)=v,
     E(eBx^2)=Var(eBx)=v,
     E(eBy^2)=Var(eBy)=v,
     E(eCx^2)=Var(eCx)=v,
     E(eCy^2)=Var(eCy)=v,
```

where n is any odd integer. Ideally, to test if the three points are collinear we would calculate the cross product

```
mCROSS=(mAx-mBx)*(mCy-mBy)-(mAy-mBy)*(mCx-mBx)
```

and compare it with 0.

However the values of mA, mB, mC are unknown and the corresponding cross product using the actual points

```
CROSS=(Ax-Bx)*(Cy-By)-(Ay-By)*(Cx-Bx)
```

will only be close to 0 for these points.

The variance of the cross product

```
V=Var(CROSS)
```

induced by the error in point location gives us a measure of this nearness to 0. If

```
CROSS <= sqrt(V),
```

the three points are considered collinear, otherwise they are classified as noncollinear. It thus remains to find a formula for V.

Now the variance in terms of the expectation or mean value of any random variable is:

```
Var(x)=E((x-E(x))^2).
```

Expectation distributes over the sum of random variables as:

```
E(x+y)=E(x)+E(y).
```

The expected value of a constant is:

```
E(c)=c.
```

Expectation distributes over the product of independent random variables as:

```
E(x*y)=E(x)*E(y).
```

The variables mA, mB, and mC are constants while eA, eB, and eC are independent random variables.

Now using the above rules we get:

```
E(CROSS)=E((Ax-Bx)*(Cy-By)-(Ay-By)*(Cx-Bx))
        =(mAx-mBx)*(mCy-mBy)-(mAy-mBy)*(mCx-mBx)
        =mCROSS
        =0 (since the three points are collinear).

V=Var(CROSS)
 =E((CROSS-E(CROSS))^2)
 =2*v*(3*v+(mAx-mBx)^2+(mAy-mBy)^2+(mCx-mBx)^2+(mCy-mBy)^2
          -(mAx-mBx)*(mCx-mBx)-(mAy-mBy)*(mCy-mBy)).
```

Since these mean point values are unknown, we replace them by their best estimates -- their actual values -- to yield a cross product variance of

```
V=2*v*(3*v+(Ax-Bx)^2+(Ay-By)^2+(Cx-Bx)^2+(Cy-By)^2
        -(Ax-Bx)*(Cx-Bx)-(Ay-By)*(Cy-By)).
```

25. SLICE FUNCTION SUMMARY

This section gives a synopsis of the input and return variables of each function (the variable names are given in quotes). Each section begins with a source file name (S?.C) and the object types treated in that source file. The summary is grouped according to the most salient object which the function manipulates.

25.1 S0.C: MAIN, MISCELLANEOUS, MEMORY, TIMING, STRING.

main: Uses "argc" command line arguments "argv" to run SLICE and loops over the slice layers. This routine works as follows:
The memory manager is initialized. The user information is gotten from the command line and the ARG file. The relevant user information is written to the SLI file. The user information is written to the screen and message files. The part is read from either the STL (for facets) or the SLC (for contours)
file. The facet data is sorted and stored in the TMP file.
Gaps are closed and reoriented (if necessary) and the contour data is stored in the TMP file. The data extents are written to the screen and message files. If the "layersonly" option is set (for debugging purposes) the layers loop from the minimum to the maximum layer and slices, compensates, hatches, and writes out the layers one by one.

If the "layersonly" option is not set then the following code is executed: The current layer is set to the first layer in the part.
The previous layer is sliced and line width compensated.
The current layer is sliced and line width compensated.
The next layer is sliced and line width compensated. The current layer value is written to the SLI file. The boundary of the down region is generated by differencing the current and previous layers. The boundary of the up region is generated by differencing the current and next layers. The hatch boundary is generated by differencing the current layer and down boundary. The layer boundary is generated by differencing the hatch boundary and up boundary and written to the SLI file. The up boundary is shrunk by differencing the up boundary and the down boundary
and written to the SLI file. The hatch boundary is hatched and the hatch written to the SLI file. The down boundary is written to the SLI file. The down boundary is hatched and the hatch written to the SLI file. The up boundary is retracted, skin filled, and the fill written to the SLI file. The down boundary is retracted, skin filled, and the fill written to the SLI file.
The next layer become the current layer and the above process starting with the slicing of the next layer repeats itself until the last layer has been processed.

Note that all of the above actions generates a message to the screen and message file given the type of action, the layer number, the extents of the layer both in cad and slice units and the time elapsed since SLICE started executing. The number of layers having missing or misoriented border segments is displayed on the screen and message file. The memory allocation is displayed on the screen and in the message file. A final elapsed time message is displayed on the screen and in the message file.

25.1.1 MISCELLANEOUS: Miscellaneous functions help_screen: Displays the help screen with version number "version".

25.1.2 MEMORY: Memory manager

25.1.2.1 USAGE
The purpose of the memory manager is to keep track of dynamically allocated memory. It signal the user if the machine cannot allocate more memory, or if the program attempts to overdeallocate memory.

25.1.2.2 STRUCTURE
LONG total: number of bytes currently allocated
INT maxbytes: size of largest allocation so far
INT *count: allocations per block size
LONG maxtotal: max number of bytes simultaneously allocated
LONG supermaxtotal: number of bytes ever allocated

25.1.2.3 MACROS allocate: allocate structure of "type"

allocate_string: allocate a string of length "n"

deallocate: free structure at "p"

deallocate_string: free string "s"

25.1.2.4 FUNCTIONS new_memory: Allocates and initializes the memory manager "m" with "maxbytes" count bins and returns "m".

delete_memory: Deletes the memory manager "m" and returns NULL.

allocate_memory: Allocates a block of "nbytes" bytes from the memory manager "m" and returns a pointer to it.

free_memory: Deallocates "nbytes" bytes at position "p" from the memory manager "m".

dump_memory: Dumps out the memory manager "m".

memory_allocated: Return TRUE if any memory is allocated by the memory manager "m", FALSE otherwise.

25.1.3 TIMING: Timing for major routines

25.1.2.1 USAGE
The purpose of the timing object is to keep track of the time spent in critical function as well as inform the user of the timing progress of the code.

25.1.3.2 STRUCTURE

TIME_T start: start time of program
TIME_T stop: stop time of program
DOUBLE main: duration of main routine
DOUBLE get_userinfo: duration of get_userinfo routine
DOUBLE get_part: duration of get_part routine
DOUBLE slice_part: duration of slice_part routine
DOUBLE boolean_seglist: duration of boolean_seglist routine
DOUBLE reorient_seglist: duration of reorient_seglist routine
DOUBLE split_seglist: duration of split_seglist routine
DOUBLE new_polylist2: duration of new_polylist2 routine
DOUBLE degap_polylist: duration of degap_polylist routine
DOUBLE boolean_polylists: duration of boolean_polylists routine
DOUBLE reorient_polylist: duration of reorient_polylist routine
DOUBLE union_polylists: duration of union_polylists routine
DOUBLE intersect_polylists: duration of intersect_polylists routine
DOUBLE difference_polylists: duration of difference_polylists routine
DOUBLE layer_compensate: duration of layer_compensate routine
DOUBLE fill_retract: duration of fill_retract routine
DOUBLE hatch_polylist: duration of hatch_polylist routine
DOUBLE sort_tripart: duration of sort_tripart routine
DOUBLE sort_seglist: duration of sort_seglist routine

25.1.3.3 MACROS

None.

25.1.3.4 FUNCTIONS new_timing: Allocates and initializes the timing structure "t" and returns it.

delete_timing: Deallocates a timing structure "t" and returns NULL;

write_timing: Writes the timing structure "t".

dump_timing: Dumps the timing structure "t".

get_time: Puts the elapsed time into a string "s". Call with NULL to initialize. String length must be at least 9 bytes long. Returns "s".

25.1.4 STRING: string

25.1.4.1 USAGE

String is a null terminated array of ascii characters.

25.1.4.2 STRUCTURE

Null terminated array of ascii characters.

25.1.4.3 MACROS streq: tests for equality of strings "s" and "t"

btoa: converts boolean "n" to ascii string fgets_: gets a NULL terminated string "buffer" of "nchars" chars from file "file"

25.1.4.4 FUNCTIONS strget: Returns a copy of the string "s0".

strtail: Replaces tail of string "s" with a new tail "tail" beginning at character "c" and returns "s".

strieq: Returns TRUE if two strings "s" and "t" are equal irrespective of case, FALSE otherwise.

strlwr: Converts a string "s" to lower case and returns it.

strupr: Converts a string "s" to upper case and returns it.

25.2 S1.C: PARAMETER, PARAMETERLIST, USERINFO, TILEINFO, HATCHINFO, HATCHINFOLIST, RANGE, RANGELIST, CURE, CURELIST.

25.2.1 PARAMETER: command line or argument file parameter

25.2.1.1 USAGE

The parameter structure contains the name of an input parameter and a list of its values.

25.2.1.2 STRUCTURE
CHAR *name: name
CHAR *value[10]: values
PARAMETER *prev: previous parameter in list PARAMETER *next: next parameter in list
PARAMETERLIST *parent: parent list

25.2.1.3 MACROS
None.

25.2.1.4 FUNCTIONS new_parameter: Allocates and initializes a new parameter "p" and returns it.

delete_parameter: Deletes a parameter "p" and returns NULL.

get_parameter: Returns the next parameter from the command line "argv".

read_parameter: Returns the next parameter from a stream "stream".

dump_parameter: Dumps a parameter "p".

write_parameter: Writes a parameter "p" to a stream "stream" and returns "p".

append_parameter: Appends a parameter "p" to a parameter list "list" and returns "list".

25.2.2 PARAMETERLIST: List of command line parameter

25.2.2.1 USAGE

The Parameterlist structure is a linked list of the parameter blocks and so contains all the input information from the command line and the ARG file.

25.2.2.2 STRUCTURE

PARAMETER *first: first parameter in list
PARAMETER *last: last parameter in list

25.2.2.3 MACROS

None.

25.2.2.4 FUNCTIONS new_parameterlist: Allocates and initializes a new parameter list "list" and returns it.

delete_parameterlist: Deallocates a parameter list "list" and returns NULL.

dump_parameterlist: Dumps the parameter list "pl".

write_parameterlist: Writes the parameter list "pl" to a stream "stream" and returns "pl".

25.2.3 USERINFO: Specifications for slicing 25.2.3.1 USAGE

The user information block contains the information needed for the proper slicing of the part. The information is either input directly by the user (on the command line or in the ARG file) or derived from the user's input.

25.2.3.2 STRUCTURE

```
CHAR *version:  program version number
ULONG password:  password
BOOLEAN timing:  do timing of key functions?
INT data:  0)tris 1)segs 2)polylines 3) polygons
BOOLEAN warn:  keep going after warnings?
INT byteorder:  machine format 0)386 1)IRIS
BOOLEAN carriage:  carriage return after new line?
BOOLEAN reorient:  reorient segments if necessary?
INT debug:  debugging flags
INT slcalg:  slice algorithm number
INT lboalg:  layer border offset algorithm number
INT dfoalg:  down fill offset algorithm number
INT ufoalg:  up fill offset algorithm number
INT axis:  slice axis
BOOLEAN mirror:  mirror image?
INT nz:  number of layers
INT lmin:  initial layer number
INT lmax:  final layer number
DOUBLE3 min:  first slice level
DOUBLE3 max:  last slice level
POLYLIST *window:  bounding polylist data window
POLYLIST *tile:  bounding polylist data window
DOUBLE2_ maxdim:  maximum slice units
DOUBLE2_ res:  horizontal resolution
DOUBLE resratio:  finer res factor for intermediate calcs
DOUBLE unit:  cad unit as fraction of inch
DOUBLE2_ eps:  spatial error tolerance
DOUBLE overcure:  overcure amount
BOOLEAN layeronly:  no up or down borders or fill?
BOOLEAN bordersonly:  no hatch or fill?
INT  style:    -2)undersize  -1)lowcut  0)midcut  /*   1)highcut
2)oversize
BOOLEAN raw:  raw cuts only?
TRANSFORMATION *transformation:  coordinate transformation
STREAM *input:  input (STL) file
```

STREAM *output: output (SLI) file
STREAM *message: message (MSG) file
STREAM *screen: screen
STREAM *parameter: parameter (ARG) file
STREAM *internal: internal (TMP) triangle file
STREAM *material: material (MAT) file
STREAM *security: password file
TILEINFO *tileinfo: tiling information
HATCHINFOLIST *layerhatch: specs for layer hatch
HATCHINFOLIST *downhatch: specs for down hatch
HATCHINFOLIST *uphatch: specs for up hatch
HATCHINFOLIST *downfill: specs for down fill
HATCHINFOLIST *upfill: specs for up fill
RANGELIST *rangelist: range information
CURELIST *curelist: cure information
PARAMETERLIST *parameterlist: input parameter list

25.2.3.3 MACROS

None.

25.2.3.4 FUNCTIONS new_userinfo: Allocates and initializes a new user information specification "ui" and returns it.

delete_userinfo: Deletes the user information "ui" except streams and returns "ui".

dump_userinfo: Dumps the user information "ui".

get_userinfo: Allocates and initializes a new userinfo specification
from the command line "argv" and argument file and returns it.
The parameter input order is:
Occur anywhere:
{help,debug,timing,reorient,bo,lo,style,raw,sec
lboalg,dfoalg,ufoalg,r,w,m,p,s,i,ro,mirror,
lmin,lmax,rz,sx,sy,tx,ty,tz,warn}
{data} < {sz,scl,rx,ry,axis,x,y,z}
{unit,resratio} < {res}
  < {hx,hy,ha,ht,fx,fy,h,lh,dh,f,df,uf,xmin,xmax,ymin,ymax}
{unit,resratio} < {res} < {eps,overcure,mat}
  < {range,zs,lbo,dfo,ufo} < {zmin,zmax}
This routine works as follows:
The command line contains the user information to run the SLICE program. It takes a list of parameters where each parameter consists of a name preceded by a dash and a list of values. All parameters can be shifted to the ARG file (which acts as a command line overflow) except "-p" which invokes the argument file itself. See the command line section for a list of these parameters.

update_userinfo: Updates the start and stop layer in the user information block "ui" using the extents of the part "part" and returns "ui".

write_userinfo: Writes out the user information "ui" needed by the MERGE program to the output file "stream" and returns "ui".

verify_password: Verifies that the password "password" is good, returning TRUE or FALSE.

25.2.4 TILEINFO: Tile information block.

25.2.4.1 USAGE

The tile information block contains the information needed for the proper tiling of the part. Tiling is used the reduce the curl of the part.

25.2.4.2 STRUCTURE

DOUBLE size: dimension of one tile
DOUBLE gap: size of gap between tiles
DOUBLE offset: offset of initial tile pattern
DOUBLE shift: shift in tile pattern for next layer
DOUBLE spacing: distance between tile centers

25.2.4.3 MACROS

None.

25.2.4.4 FUNCTIONS new_tileinfo: Allocates and initializes a new tile information specification "ti" with the tile size "size", intertile gap "gap", initial offset of tile pattern "offset", and successive layer tile pattern shift "shift". Returns "ti".

delete_tileinfo: Deletes the tile information block "ti" and returns NULL.

dump_tileinfo: Dumps the tiling information block "ti".

tile_polylist: Tiles a layer of polylines "pla" with the tile information "ti" and returns "pla".

25.2.5 HATCHINFO: Specifications for hatching

25.2.5.1 USAGE

The hatchinfo block contains the information for generating hatch and filling one direction.

25.2.5.2 STRUCTURE
DOUBLE angle: hatch direction angle
DOUBLE2 vector: unit vector in hatch direction
DOUBLE spacing: spacing of hatch lines
DOUBLE offset: offset of hatch line pattern
DOUBLE shift: shift in hatch pattern for next layer
HATCHINFO *prev: previous hatch information block in list
HATCHINFO *next: next hatch information block in list
HATCHINFOLIST *parent: parent list

25.2.5.3 MACROS

None

25.2.5.4 FUNCTIONS new_hatchinfo: Allocates and initializes a new hatch information specification "hi" with hatch angle "angle", spacing "spacing", initial hatch pattern offset "offset", and successive layer hatch pattern shift "shift". Returns "hi".

new_hatchinfo1: Allocates and initializes a new hatch information specification "hia" by copying another specification "hib" and returns "hia".

delete_hatchinfo: Deletes the hatching information block "hi" and returns NULL.

dump_hatchinfo: Dumps the hatching information block "hi".

append_hatchinfo: Appends a hatching information block "hi" to the hatching information list "list" and returns "list".

25.2.6 HATCHINFOLIST: List of hatch information blocks.

25.2.6.1 USAGE

The hatch information list links the hatch information blocks and thus contains all information needed for the proper hatching and filling of the part.

25.2.6.1 STRUCTURE

HATCHINFO *first: first hatch information block
HATCHINFO *last: last hatch information block

25.2.6.3 MACROS

None.

25.2.6.4 FUNCTIONS new_hatchinfolist: Allocates and initializes a new hatching information list "list" and returns it.

delete_hatchinfolist: Deallocates a hatchinfo list "list" and returns NULL.

dump_hatchinfolist: Dumps a hatching information list "list".

25.2.7 RANGE: Range information block

25.2.7.1 USAGE

The purpose of the range block is to hold slicing information pertinent to a single z interval.

25.2.7.2 STRUCTURE

DOUBLE zmin: layer commensurate minimum z value
INT lmin: first layer number in range
DOUBLE zs: layer thickness
DOUBLE lbo: layer beam width compensation
DOUBLE ufo: up fill beam offset
DOUBLE dfo: down fill beam offset
RANGE *prev: previous range information block in list
RANGE *next: next range information block in list
RANGELIST *parent: parent list

25.2.7.3 MACROS

None.

25.2.7.4 FUNCTIONS new_range: Allocates and initializes a new range information block "r" with a minimum layer index "lmin", minimum z value "zmin", layer thickness "zs", line width compensation "lbo", down fill retraction "dfo", and up fill retraction "ufo". Returns "r".

delete_range: Deletes a range information block "r" and returns NULL.

dump_range: Dumps a range information block "r".

append_range: Adds a new range information block "r" to the range information list "rl" and returns "rl".

get_rangel: Returns the range information block for a given layer index "n" from the range list "rl".

get_range2: Returns the range information block for a given z value "z" from the range list "rl". The sign "sign" indicates that the actual z value is just below or just above the input z value "z".

get_zlevel: Returns the z value at a fraction "frac" into layer number "n" (from bottom) from the range list "rl".

get_layer_number: Returns the layer number for a given z value "z" from the range list "rl". The sign "sign" indicates that the actual z value is just below or just above the input z value "z".

25.2.8 RANGELIST: List of range blocks.

25.2.8.0 RANGELIST

The rangelist contains the list of ranges and range information for the part.

25.2.8.2 STRUCTURE

RANGE *first: first range
RANGE *last: last range

25.2.8.3 MACROS

None.

25.2.8.4 FUNCTIONS new_rangelist: Allocates and initializes a new range information list "rl and returns it.

delete_rangelist: Deallocates a range information list "rl" and returns NULL.

dump_rangelist: Dumps a range information list "rl".

25.2.9 CURE: Specifications for curing

25.2.9.1 USAGE

The purpose of the cure information block is to related the cure depth to cure width for proper line width compensation and fill retraction.

25.2.9.2 STRUCTURE

DOUBLE depth: cure depth

DOUBLE width: cure width
CURE *prev: previous cure information block in list
CURE *next: next cure information block in list
CURELIST *parent: parent list 25.2.9.3 MACROS

None.

25.2.9.4 FUNCTIONS new_cure: Allocates and initializes a new cure information block "cure" given a cure depth "depth" and a cure width "width". Returns "cure".

delete_cure: Deletes a cure information block "cure" and returns NULL.

dump_cure: Dumps a cure information block "cure".

add_cure: Adds a cure information block "ca" to the cure list "list" and returns "list".

get_cure_width: Returns the cure width from the cure depth "depth" in the cure information list "curelist".

25.2.10 CURELIST: List of cure information blocks.

25.2.10.1 USAGE

The cure information list links the cure information blocks and thus contains all information needed for the proper curing of the part.

25.2.10.2 STRUCTURE

CURE *first: first cure information block
CURE *last: last cure information block 25.2.10.3 MACROS

None.

25.2.10.4 FUNCTIONS new_curelist: Allocates and initializes a new cure information list "curelist" and returns it.

delete_curelist: Deallocates the cure information list "curelist" and returns NULL.

dump_curelist: Dumps a cure information list "curelist".

read_curelist: Returns a cure information list read from the material file "stream".

25.3 S2.C: DOUBLE, DOUBLE2, FILE, STREAM, TRANSFORMATION

25.3.1 DOUBLE:

25.2.6.1 USAGE

The double structure holds the double precision floating point value.

25.3.1.2 STRUCTURE double/* floating point double precision

25.3.1.3 MACROS equal: test for equality of two numbers within a tolerance
stoc: converts from slice to cad units

25.3.1.4 FUNCTIONS floor2: Returns the largest integer less than then the argument "a".

ceil2: Returns the smallest integer greater than the argument "a".

sq: Returns the square of a number "x".

round: Rounds a number "a" to the nearest integer values.

transform_z_extents: Applies a coordinate transformation "f" to two z numbers "zmin" and "zmax".

ctos: Converts value in cad units "cad_value" along x, y, or z axis "axis" (with roundoff to nearest layer boundary if "layer_roundoff" is TRUE) to slice units

25.3.2 DOUBLE2: point in 2 space.

25.3.2.1 USAGE

The hatch information list links the hatch information blocks and thus contains all information needed for the proper hatching and filling of the part.

25.3.2.2 STRUCTURE

DOUBLE x: first component
DOUBLE y: second component 25.3.2.3 MACROS collinear: tests for 3 point collinearity within a tolerance
eq2: tests for exact equality 25.3.2.4 FUNCTIONS distsq: Returns the squared distance between two points "a" and "b".

round2: Rounds a point "a" to nearest integer value and returns it.

add: Returns the sum of vectors "a" and "b".

neg: Returns the negative of vector "a".

sub: Returns the difference of vectors "a" and "b".

mul: Returns the product of scalar "a" and vector "b".

dvd: Returns the quotient of vector "a" and scalar "b".

dot: Returns the dot product of two vectors "a" and "b".

cross: Returns the cross product of two vectors "a" and "b".

normalize: Returns the unit vector corresponding to "a".

average: Returns the average of points "a" and "b".

distplsq: Returns the squared distance from point "o" to a line thru points "a" and "b".

nonparallel_intersection: Returns the rounded off point of intersection of a segment from point "a0" to point "a1" with a segment from point "b0" to point "b1" if the intersection point is interior to one (and only one) of the segments. Returns NULL otherwise or if the segments are exactly parallel.

parallel_intersection: Returns one of the endpoints "o0" of the region of intersection of a line segment from "a0" to "a1" with a line segment from "b0" to "b1" which are assumed parallel. Calculates both endpoints of the intersection region if "o1" is not NULL. Intersection points must be interior to at least one of the segments or NULL is returned.

twoline_intersection: Returns the rounded off point of intersection "o" of a line through points "a0" and "a1" with a line through points "b0" and "b1".

ptline_intersection: Returns the rounded off point of intersection "o" of a line through point "a" with a line through points "b" and "c" where the line through "a" is parallel to a line through points "c" and "d".

between: Returns a point "o" if it lies between points "a" and "b" inclusive of "a" and "b" with spatial tolerance "eps". Returns NULL otherwise.

exbetween: Returns TRUE if a point "o" lies within a rectangle formed by points "a" and "b" at its opposite corners. Returns FALSE otherwise. The point "o" may lie on the boundary of the rectangle, but may not be equal to either "a" or "b".

inbetween: Returns TRUE if a point "o" lies within or on the boundary of a rectangle formed by points "a" and "b" at its opposite corners. Returns FALSE otherwise.

aside: Returns 0 if the three points "a", "o", and "b" lie on a straight line with spatial tolerance "eps", -1 if "o" lies to the right of a directed line thru "a" and "b", 1 if "o" lies to the left of a directed line thru "a" and "b".

25.3.3 FILE: file

25.3.3.1 USAGE

This structure contains the pointer to a file.

25.3.3.2 STRUCTURE

Pointer to file

25.3.3.3 MACROS

None.

25.3.3.4 FUNCTIONS fread_: Reads up to "count" items of "size" bytes from the input file "file" and stores them in "buffer". The byte order is reversed if "reverse" is TRUE. Returns the number of full items actually read.

fwrite_: Writes up to "count" items of length "size" from "buffer" to the output "file". Reverses the bytes order if "reverse" is TRUE. Returns the number of full items actually written.

25.3.4 STREAM: input/output

25.3.4.1 USAGE

The purpose of the stream structure is to contain additional information about a file.

25.3.4.2 STRUCTURE

CHAR *name: name of file
FILE *file: pointer to file
BOOLEAN read: read? (not write?)
INT format: 0,ascii,binary
INT byteorder: byte order (0:low first, 1:low last)
INT count: number of character written on line

25.3.4.3 MACROS

None.

25.3.4.4 FUNCTIONS new_stream: Allocates and initializes a new stream "stream" with a given file name "name", a read status "read", format (ascii, binary) "format", and byte order "byteorder". Bypasses the memory manager.

delete_stream: Deallocates a stream "stream".

dump_stream: Dumps the stream information from "stream".

rewind_stream: Rewinds a write stream "stream" and changes read/write status.

read_word: Returns the next word of text "word" from file "stream". If there are no more words in the file, a NULL is returned. Skips over comments which are delimited by / * ... * / or / / ... \n (same as C and C++).

read_line: Returns the next line of text "line" from file "stream". Returns a blank line if end of file is reached.

dump: Same as printf but writes to the screen and message files.

errexit: Displays an error message and exits (argument list is the same as that of printf).

25.3.5 TRANSFORMATION: coordinate transformation.

25.3.5.1 USAGE

The purpose of the transformation structure is the perform a rotation, scaling, and translation of the part.

25.3.5.2 STRUCTURE

BOOLEAN unit: unit matrix?
DOUBLE matrix[4][4]: matrix components

25.3.5.3 MACROS

None.

25.3.5.4 FUNCTIONS new_transformation: Allocates and initializes a data coordinate transformation "t".

delete_transformation: Deletes a coordinate transformation "t" and returns NULL.

dump_transformation: Dumps a coordinate transformation "t".

update_transformation: Updates the coordinate transformation "t" with rotation "rx", "ry", "rz", scaling "sx", "sy", "sz", and translation "tx", "ty", and "tz" in the x, y, and z directions respectively.

25.4 S3.C: TRIANGLE, PART.

25.4.1 TRIANGLE: triangle.

25.4.1.1 USAGE

The triangle structure holds the information about the triangular facets which specify the surface of the part to be sliced.

25.4.1.2 STRUCTURE

FLOAT3 pt[3]: vertices
SIGN orient: vertex order (1:ccw, -1:cw)
SIGN znorm: sign of z component of normal
TRIANGLE *prev: previous triangle in list
TRIANGLE *next: next triangle in list
PART *parent: parent list

25.4.1.3 MACROS

None.

25.4.1.4 FUNCTIONS new_triangle: Allocates and initializes a new triangle "t".

delete_triangle: Deallocates the triangle "t" and returns NULL.

dump_triangle: Dumps the triangle "t".

read_triangle: Returns one triangle read from the input stream "stream" with user information "ui".

read_ascii_triangle: Returns the triangle vertices "o" read in from the ascii STL file "stream".

read_binary_triangle: Returns the triangle vertices "o" read in from the binary STL file "stream".

transform_triangle: Returns the triangle vertices "o" after the application of a coordinate transformation "f".

reorder_coordinates: Returns the reordered vertex coordinates of triangle "o" so that the slice axis "axis" is z (mirrored if "mirror" is TRUE). If reflection takes place, the sign of "orient" is reversed.

round_triangle: Rounds off the triangle vertices "o" to the nearest slice layer and returns the associated triangle.

reorder_vertices: Reorders the triangle vertices "o" in ascending z value where "orient" gives the vertex order (1: counterclockwise, -1: clockwise)

calculate_znormal: Calculates the sign of the z component of the normal of triangle "t".

single_slice_triangle: Slices the given triangle "t" and adds the resulting segment to the list "seglist". Zero length segments are suppressed. "where" determines the z value of the slice.
-1) just above "zmin"
 0) average of "zmin" and "zmax".
-1) just below "zmax"

double_slice_triangle: Slices the given triangle "t" at the bottom and top of a layer ("zmin" and "zmax", respectively). The segment from the bottom slice is added to the segment list "sla". The bottom and top slices are used to form a polygon, the projection of which onto a plane of constant z is decomposed into its constituent segments and added to the segment list "slb". Zero length segments are suppressed.

slice_triangle: Returns the rounded off two point segment at which a given z level "z" slices through a triangle "t". If "above" is TRUE, triangle is sliced just above "z", else triangle is sliced just below "z". Returns the slice segment "s". If z is above or below the triangle or cuts only one point of the triangle at the top or bottom, a NULL is returned.

sort_triangles: Sorts the circularly linked triangle list "ta".

bisect_triangles: Splits the circularly linked triangle list "ta" into two lists "ta" and "tb". "ta" is altered, "tb" is returned.

merge_triangles: Merges the two sorted circularly linked triangle lists "ta" and "tb" which are subsequently destroyed.

compare_triangles: Returns -1, 0, or 1 if triangle "ta" should come before, at same spot, or after triangle "tb" in triangle list.

25.4.2 PART:

25.4.2.1 USAGE

The part structure holds the linked lists of either triangles or contours which specify the part.

25.4.2.1 STRUCTURE

INT type: input data type
STREAM *file: internal data file
DOUBLE3 min: minimum x,y,z
DOUBLE3 max: maximum x,y,z
LONG triangles: number of triangles
LONG downflats: number of horizontal downfacing triangles
LONG upflats: number of horizontal upfacing triangles
LONG downnearflats: number of tilted downfacing triangles
LONG upnearflats: number of tilted upfacing triangles
LONG steeps: number of vertical triangles
INT layers: number of layers
INT missing: number of layers with missing segments
INT misoriented: number of layers with misoriented segments
BOOLEAN inwindow: any section of part within data window?
TRIANGLE *tfirst: initial triangle in list
TRIANGLE *tlast: final triangle in list
POLYLIST *plfirst: initial polylist in list
POLYLIST *pllast: final polylist in list

25.4.2.3 MACROS

None.

25.4.2.4 FUNCTIONS new_part: Allocates and initializes a new part "part" with the data type "type" (TRIANGLES, SEGMENTS, or POLYLINES) and intermediate part file "file".

delete_part: Deallocates the part "part" and returns NULL.

delete_tripart: Deallocates the triangle list defining the part "part" and returns NULL.

delete_polypart: Deallocates the list of polyline lists defining the part "part" and return NULL.

dump_part: Dumps the part "part".

dump_tripart: Dumps the triangle list defining the part "part".

dump_polypart: Dumps the list of polyline lists defining the part "part".

get_part: Returns the part read from the input file "stream" using the user information "ui".

get_tripart: Reads the triangle defined part from the STL file "stream" between the z values of "zlow" and "zhigh" using the user information "ui". Writes the part to the internal file in sorted order and deletes the triangle list of the part. Returns the part. The routine works as follows: Triangles are read in from the ascii or binary STL file, transformed (ie. rotated, scaled, and translated), the x and y coordinates are rounded off to the nearest x-y slice resolution, and the z coordinate rounded off first to the nearest z slice resolution and then to the nearest layer boundary. Flat triangles are discarded. The triangles are sorted by the minimum z value of the first vertex, or if they are equal, by the minimum z value of the third vertex, or if they are equal, by the maximum sign of the z component of the normal. The triangle list is written out to the TMP file and deleted from the part structure. The extents of the part (which includes any deleted triangles) is determined as the facets are read in.

get_segpart: Reads the segment defined part from the SLC file "stream" between the z values of "zlow" and "zhigh" using the user information "ui" and converts the part to a list of polyline lists. Writes the part to the internal file and deletes the list of polyline lists of the part. Returns the part.

get_polypart: Reads the polyline defined part from the SLC file "stream" between the z values of "zlow" and "zhigh" using the user information "ui". Writes the part to the internal file and deletes the list of polyline lists of the part. Returns the part. This routine functions as follows: Polylines are read in from the ascii or binary SLC file, transformed (ie. rotated, scaled, and translated), the x and y coordinates are rounded off to the nearest x-y slice resolution, and the z coordinate rounded first to the nearest z slice resolution and then to the nearest z layer boundary. If the input layer thickness is 0, the input layer is discarded. Gaps are filled in by connecting the closest polyline endpoints first. If the reorientation flag is set, the polygons are alternately oriented (any polygon immediately nested inside another must have the opposite orientation -- outermost polygons must have a counterclockwise orientation) or booleaned otherwise. The resultant cleaned up polygon lists are written out to the TMP file and deleted from the part structure. The extents of the part (which includes any deleted layers) is determined as the contours are read in.

slice_part: Slices through the part "part" at a given layer number "layerno" between the z values of "zmin" and "zmax" using the user information "ui". Returns a list of polylines which represent the boundaries on the given layer.

slice_tripart: Slices through the triangle list of the part "part" on a given layer "layerno" of the slice axis between "zmin" and "zmax" using the user information "ui" and returns a list of polylines representing the boundaries of the given layer. This routine functions as follows: All triangles whose minimum z value is less than the maximum z value of the layer is read from the TMP file. Each triangle is cut at the top and bottom of the given layer. The segments making up the bottom cut are put into the list "sla". Each triangle truncated at the bottom and top of the layer forms a trapezoid (or in the limiting case, another triangle). The trapezoids are projected onto the z=zmin plane and reoriented if necessary so that the vertex order is counterclockwise as viewed from above. The four sides of the projected trapezoid are added to the segment list "slb". Segment list "sla" is sorted by minimum y of first endpoint, or if equal, by minimum x of first endpoint, or if equal, by minimum sign of slope, or if equal, by maximum slope, or if equal, by minimum y of second endpoint, or if equal, by minimum x of second endpoint; equal simple segments (except for orientation) are merged into compound segments. The "sla" segment list is formed into a new set of polylines "pla", which are reoriented if necessary to make pairwise connections if the reorientation flag is set. Gaps are filled in by connecting the closest polyline endpoints first. If the reorientation flag is set, the polygons are alternately oriented (any polygon immediately nested inside another must have the opposite orientation -- outermost polygons must have a counterclockwise orientation) or booleaned otherwise. Segment list "slb" is sorted (as above), and equal simple segments are merged into compound segments. The set of segments is simplified by splitting segments at each point of intersection with each other if that intersection point is not interior to a continuous set of intersection points. The segment list is booleaned and reformed into a new list of polygons "plb". The two polygon lists "pla" and "plb" are unioned.

slice_polypart: Using the user information "ui", reads in the input layers of the part "part" from the intermediate file which impinge on the z interval between "zmin" and "zmax" and combines them to form the output layer numbered "layerno". Returns the output layer as a polyline list. This routine functions as follows: All input layers whose minimum z values are less than the maximum z value of the output layer are read from the TMP file. The output layer is equal to the union of those input layers of nonzero thickness whose z range overlaps the z range of the output layer as well as those input layers of zero thickness whose z value is inside or at the minimum value of the z range of the output layer.

read_tripart: Reads in all triangles from the intermediate file "stream" of sorted triangles containing a given z level "z" and appends them to the triangle list of the part "part". Returns "part".

write_tripart: Writes out the triangle list of the part "part" to the intermediate file "stream" of sorted triangles. Returns "part".

read_polypart: Reads in all polyline lists from the intermediate data file "stream" whose z values are less than a given z level "z" and appends them to the list of polyline lists of the part "part". Returns "part".

append_triangle: Appends triangle "t" to the part "part".

append_polylist: Appends polyline list "pl" to the part "part".

sort_tripart: Sorts the triangles in the triangle list defining the part "part" by minimum z, or if equal, by maximum z, or if equal by the maximum sign of the normal. (This last criterion is used since an upfacing triangle borders a lower piece of the part than a downfacing triangle.) This routine works as follows:
The double linked triangle list is first circularly linked. If the list contains more than two triangles, it is split in half and each half sorted; the two sublists are then interleaved to form one sorted list. If the list contains only two elements, they are swapped if they are out of order. Lastly, the circular link is broken.

25.5 S4.C: SEGMENT, SEGLIST.

25.5.1 SEGMENT: Polygonal segment.

25.5.1.1 USAGE

The segments give the boundary information for each layer of the part and are needed both for boolean operations on layers and hatching layers.

25.5.1.2 STRUCTURE

DOUBLE2 pt[3]: low, intermediate, and high pts of segment
FLAGS mark: bit flags
INT orient: orientation count (<0:down, >0:up)
INT biorient: biorientation count (<0:cw, >0:ccw)
SEGMENT *prev: previous segment in segment list
SEGMENT *next: next segment in segment list
SEGLIST *parent: parent list

25.5.1.3 MACROS

None.

25.5.1.4 FUNCTIONS new_segment: Allocates and initializes a new segment "s" and returns it.

new_segment1: Allocates and initializes a new segment "sa" from an old segment "sb".

new_segment2: Allocates and initializes a new segment "s" from two points representing the "tail" and "head" of the segment, an orientation "orient", a biorientation "biorient", and bit flags "mark". If "orient" is positive, the tail of the segment is assumed to be "tail" and head "head"; if "orient" is negative the tail of the segment is assumed to be "head" and the head "tail".

renew_segment: Returns segment "s" after ensuring that the endpoints are correctly ordered.

delete_segment: Deallocates a segment "s" and returns NULL.

deplete_segment: Deletes a simple segment of orientation "orient" from a compound segment "s".

dump_segment: Dumps a segment "s".

dump_segment_view: Dumps a segment "s" suitable for the view program.

delink_segment: Removes a segment "s" from its segment list.

transform_segment: Applies a coordinate transformation "f" to a segment represented by two points "o".

insert_segment: Inserts segment "sb" into a segment list just after "sa".

preorder_segment: Inserts segment "sa" into segment list somewhere before "sb" maintaining the proper order of the segment list.

postorder_segment: inserts segment "sb" into segment list somewhere after "sa" maintaining the proper order of the segment list.

split_segment: Splits a segment "sa" at a given point "o" into two segments and reorders the two segments into the segment list. Returns the earliest segment in the list impacted by the split.

combine_segments: Combines two coincident segments "sa" and "sb" into the first segment "sa" and returns "sa".

sort_segments: Sorts the circular segment list starting at segment "sa" and return "sa".

bisect_segments: Splits the circular segment list starting at segment "sa" into two lists "sa" and "sb". The list starting at "sa" is altered; the list starting at "sb" is returned.

merge_segments: Merges the two sorted circular segment lists starting at "sa" and "sb" which are subsequently destroyed. Returns the merged list.

compare_segments: Returns -1, 0, or 1 if segment "sa" should be earlier, at same location, or later in list than segment "sb". Return of 0 indicates identical segments. The segments are ordered by the lesser y value of an intermediate point on the segment, or if equal by the lesser x value, or if equal by the greater segment slope, of if equal by the lesser y value of the 2nd endpoint, or if equal by the lesser x value of the 2nd endpoint.

compare_segments1: Returns -1, 0, or 1 if segment "sa" should be earlier, at same location, or later in list than segment "sb". The segments are ordered by the lesser x value of an intermediate point on the segment, or if equal by the greater segment slope.

compare_segments2: Returns -1, 0, or 1 if segment "sa" should be earlier, at same location, or later in list than segment "sb". The segments are ordered by the lesser x value of an intermediate point on the segment.

25.5.2 SEGLIST: list of polygonal segments

25.5.2.1 USAGE

The seglist structure gives the linked list of segments which specify the boundaries on each layer.

25.5.2.2 STRUCTURE

```
SEGMENT *first:  first segment in list
SEGMENT *last:  last segment in list
INT layerno:  layer number (starts at 1)
DOUBLE3 min:  minimum x,y,z for layer
DOUBLE3 max:  maximum x,y,z for layer
```

25.5.2.3 MACROS

None.

25.5.2.4 FUNCTIONS new_seglist: Allocates and initializes the segment list "sl" with the layer number "layerno" and bottom and top z values "zmin" and "zmax".

new_seglist1: Allocates and initializes the segment list "sla" by copying the segment list "slb".

new_seglist2: Allocates and initializes the segment list "sl" with the polyline list "pl". Points are rotated by the rotation vector "rot" and if "orient" is -1, the point order of the polylines is reversed. Returns "sl".

delete_seglist: Deallocates the segment list "sl".

dump_seglist: Dumps a segment list "sl".

dump_partial_seglist: Dumps a segment list "sl" up to (but not including) segment "s1".

dump_seglist_view: Dumps a segment list "sl" suitable for the view program.

read_ascii_seglist: Reads in list of segments in ascii format for one layer from the input stream "stream".

read_binary_seglist: Reads in list of segments in binary format for one layer from the input stream "stream".

segment_count: Returns the number of segments in a segment list "sl".

close_seglist: Circularizes a segment list "sl" by linking the first and last segments.

open_seglist: Opens a closed segment list "sl" by deleting the link between the first and last segments.

resort_seglist1: Resorts a sublist of segment list "sla" starting at segment "sy" at a y value which maximizes the size of this sublist. Any segments prior to "sy" which do not impinge on this y value are deleted if they have been marked for deletion by the "boolean_seglist" routine, otherwise they are moved to segment list "slb". Returns "sla" and computes a new "sy" just beyond the aforementioned sublist.

resort_seglist2: Resorts those segments at the front of the segment list "sla" which impinge on a given y value "y". Segments are sorted by the x value of the point of intersection of the segment and this y line. Recomputes "sy" -- the first segment in the list just higher than "y". Returns "sla".

sort_seglist: Returns the sorted segment list "sl". The segment list is sorted by the minimum y of a median point (usually the first endpoint) , or if equal, by the minimum x of a median point, or if equal, by the minimum sign of the slope, or if equal, by the maximum slope, or if equal, by the minimum y of second endpoint, or if equal, by the minimum x of second endpoint. The segment list is returned. This routine works as follows:
The double linked segment list is first circularly linked. If the list contains more than two segments, it is split in half and each half sorted; the two sublists are then interleaved to form one sorted list. If the list contains only two elements, they are swapped if they are out of order. Lastly, the circular link is broken.

condense_seglist: Condenses the segment list "sl" by combining equal segments into compound segments. Segments have an orientation and biorientation field -- these quantities are simply added to combine the two segments.

append_segment: Appends a segment "s" to the segment list "sl" and updates the extents of the segment list if "update" is TRUE.

append_polygon: Makes segments from a list of points which represent the vertices of a polygon and appends them to a segment list "sl". Zero length segments are suppressed. The segment list "sl" is returned.

boolean_seglist: Returns the boolean of a segment list "sla" with transition quantitative volume "op" and quantitative volume at infinity of "qvinf". Segments separating regions of quantitative volume less than "op" and greater or equal to "op" are kept, the others are deleted. This routine works as follows:
The segment list is ordered as above. Find the maximum set of segments at the beginning of the list which share at least one common y value. If they share an interval of y values, choose the minimum one, say ymin.
Find a point on each segment of this subset whose y coordinate is ymin -- call his a median point.
Resort this subset of segments by the segment sort criteria with the median point in place of the first point.
Calculate the quantitative volume along the y=ymin line from -infinity to +infinity across each segment decreasing it by the orientation count of each segment as it crosses each segment and increasing it by half the biorientation count on those segments having an orientation count of 0. For treating horizontal segments this y=ymin line may be thought to be increased just slightly so that the given quantitative volume is that just above the segment and the value just below the segment is deceased by the orientation count, and if the orientation count is 0, by half the biorientation count on the segment itself. Mark those segments showing a change in the quantitative volume from below the target value to the target value or greater with a keep flag; otherwise mark the segment with a delete flag.
Starting with the first segment in the list that has not been processed yet, find the maximum set of sequential segments which share least one common y value. If they share an interval of y values, choose the minimum one, say ymin.
Cut the segment list with this ymin value from the beginning of the list through this new subset. Delete those segments below ymin that have been earmarked for deletion. Move those segments below ymin to a final output list which have been earmarked for retention.
Assess the quantitative volume (as above) and mark new segments in the subset with keep or delete flags. If any segment has an inconsistent retention or deletion status from one pass to the next, output an error message and halt the code execution.
Get the next group of segments with a common y intercept and repeat the above procedure until the original list is exhausted.
Now discard any segment with a biorientation count less than or equal to 0. Reduce the orientation count of any segment with a positive orientation to 1 and negative orientation to -1. If the orientation is not 0, set the biorientation equal to 1; otherwise set it equal to 2.

reorient_seglist: Ensures alternate segment orientations when crossing the segment list "sla" with horizontal lines. If any segments are reoriented, "misoriented" is set to TRUE. The quantitative volume at infinity is 0. The corrected segment list "sla" is returned.

split_seglist: Splits all segments in a list "sl" at their intersection with each other. Segments overlapping over a region are split at the endpoints of the region. Combines equal segments into compound segments. Returns a list of noncrossing segments "sl". This routine works as follows:
The segment list is scanned in an outer (segment "sa") and an inner (segment "sb") loop. If segment "sa" has a zero orientation and biorientation, it is deleted. If segment "sb" has a zero orientation and biorientation, it is deleted. If the two segments are parallel and overlap they are split at one of the endpoints of the intersection interval. If the two segments are nonparallel but cross, they are split at the intersection point.
The resulting smaller segments are reintegrated into the list in proper order or combined with an identical segment in the list.
If only "sb" has been split, set a new "sb" equal to the earlier of the two subsegments of the original "sb" and repeat the "sb" loop.
If "sa" has been split, set a new "sa" equal to the earlier og the two subsegments of the original "sa" and "sa" loop.
If no split has occurred loop to the next "sb".
After loop "sa" is finished, if any segments have been split, reloop over "sa" only skip over those segments which have not been split in the last round. Loop "sb" over all the segments.
Reiterate, until a pass through the list results in no new splits.

deflat_seglist: Replaces all horizontal segments by two zero length segments equal to the endpoints of the original segments in the segment list "sl"

merge_seglists: Merges two segment lists "sla" and "slb" into one segment list "sla" and destroys the original lists. Returns "sla".

25.6 S5.C: VERTEX, POLYLINE, POLYLIST.

25.6.1 VERTEX: vertex of a polyline or polygon

25.6.1.1 USAGE

The vertex structure gives the information for each vertex or point of the polylines and polygons.

25.6.1.2 STRUCTURE

DOUBLE2 pt: value of vertex
FLAGS mark: bit flags
VERTEX *sibling: link to uncompensated vertex
VERTEX *prev: previous vertex in list
VERTEX *next: next vertex in list
POLYLINE *parent: parent list

25.6.1.3 MACROS

None.

25.6.1.4 FUNCTIONS new_vertex: Allocates and initializes a new polyline vertex "v" and returns it.

new_vertex1: Allocates and initializes a new polyline vertex "va" by copying an old one "vb". Returns "va".

new_vertex2: Allocates and initializes a new polyline vertex "v" with a value "value", bit information "mark", and associated uncompensated vertex "sibling".

delete_vertex: Deallocates the polyline vertex "v" and returns NULL.

dump_vertex: dumps the polyline vertex "v".

write_two_vertices: Writes the two vertices "va" and "vb" of a polyline scaled by the resolution ratio. to a stream "stream".

transform_vertex: applies a coordinate transformation "f" to the vertex value "o".

prepend_vertex: Prepends a vertex "v" to the beginning of a polyline "p" and updates the polyline extents if "update" is TRUE. Returns "p".

append_vertex: Appends a vertex "v" to the end of a polyline "p" and updates the polyline extents if "update" is TRUE. Returns "p".

25.6.2 POLYLINE: polyline or polygon

25.6.2.1 USAGE

The polyline structure holds each polyline or polygon as a linked list of vertices. Polylines are represented as open linked lists while polygons are circularly linked. They are needed for both the line width compensation and fill retraction.

25.6.2.2 STRUCTURE

VERTEX *first: first vertex of polyline
VERTEX *last: last vertex of polyline
DOUBLE2 min: minimum x and y of polyline
DOUBLE2 max: maximum x and y of polyline
POLYLINE *prev: previous polyline in list
POLYLINE *next: next polyline in list
POLYLIST *parent: parent list

25.6.2.3 MACROS

None.

25.6.2.4 FUNCTIONS new_polyline: Allocates and initializes a new polyline "p".

new_polyline1: Allocates and initializes a new polyline "pa" from an old polyline "pb" and returns "pa".

new_polygon: Makes a polygon "p" from a NULL terminated set of points and returns "p".

delete_polyline: Deallocates the polyline "p" and returns NULL.

dump_polyline: dumps the polyline "p".

vertex_count: Returns the number of vertices in a polyline "p".

close_polyline: Closes a polyline "p" by linking its first and last vertices to form a polygon.

delink_polyline: Decouples a polyline "p" from its polyline list.

join_polylines: Merges two nonempty open polylines "pa" and "pb" into one polyline "pa". Deletes one of the endpoints if "ident" is TRUE to avoid point duplication.

merge_polygons: Merges two polygons "pa" and "pb" at the respective vertices "va" and "vb" into one polygon "pa". Returns "pa".

reverse_polyline: Reverses the vertex order in a polygon "p".

adjust0_polygon: Establishes the initial displacement vectors for beam compensation along the angular bisector of each vertex of the uncompensated polygon "pu" of length equal to the distance from the original vertex to the center of an imaginary circle of radius "rb" tangent to the two lines formed by extending the two adjacent border segments (but limited to "maxadj"). If "clip" is TRUE, two displacement vectors are drawn for angles greater then 180 degrees, perpendicular to each of the adjacent border segments of length "rb". Returns the compensated polygon derived from "pu".

adjust1_polygons: If the double of any displacement vector of the compensated polygon "pca" crosses a segment of the uncompensated counterpart of the compensated polygon "pcb", the displacement vector is shrunk to half the distance to the crossing point. This adjusts "pca".

adjust2_polygons: If any displacement vector of the compensated polygon "pca" compensated polygon "pca" crosses a displacement vector of the compensated polygon "pcb", both displacement vectors are shrunk to their intersection point. This adjusts "pca".

adjust3_polygons: If any displacement vector of the compensated polygon "pca" crosses a segment of the compensated polygon "pcb", the two displacement vectors which give rise to this segment are shrunk so that the segment passes through the head of the intrusive displacement vector and the compensated segment is as parallel as possible to its uncompensated counterpart. This adjusts "pca".

25.6.3 POLYLIST: List of polylines or polygons.

25.6.3.1 USAGE

The polylist structure holds the list of polylines or polygons which form the boundary of the part on a layer.

25.6.3.2 STRUCTURE

POLYLINE *first: first polyline in list
POLYLINE *last: last polyline in list
INT layerno: absolute layer number or layer index
DOUBLE3 min: minimum x,y,z for layer
DOUBLE3 max: maximum x,y,z for layer
POLYLIST *prev: previous polylist in list
POLYLIST *next: next polylist in list
PART *parent: parent list

25.6.3.3 MACROS

None.

25.6.3.4 FUNCTIONS new_polylist: Allocates and initializes the polyline list "pl" with a layer index "layerno", a bottom z value of "zmin" and a top z value of "zmax". Returns "pl".

new_polylist1: Allocates and initializes the polyline list "pla" with the polyline list "plb" and returns "pla".

new_polylist2: Allocates and initializes the polyline list "pl" with the segment list "sl" and empties "sl" in the process. The segment directions are ignored if "ignorient" is TRUE. If "closed" is TRUE, the segment list is certified gap free. If any misoriented segments are found, "misoriented" is set to TRUE. Returns "pl".

delete_polylist: Deallocates list of polylines "pl" and returns NULL.

dump_polylist: Dumps the polyline list "pl".
d read_ascii_polylist: Reads in polyline list in ascii format for one data layer from the input stream "stream".

read_binary_polylist: Reads in polyline list in binary format for one layer from the input stream "stream".

write_polylist: Writes out the polyline list "pl" as a list of segments in *.sli segment format to a file "stream" with block type header "type". Reruns "pl".

write_polylist2: Writes out the polygon list "pl" to the intermediate stream "stream" and returns "pl".

polyline_count: Returns the number of polylines in a list "pl".

close_polylist: Closes all polylines in a list "pl" by linking their first and last vertices. Deletes any duplicate endpoints. Returns "pl".

append_polyline: Appends the polyline "p" to the polyline list "pl" and
returns "pl".

degap_polylist: Converts a list of polylines "pla" to a list of polygons by closing gaps in order of their size (smallest first). Returns the list of polygons.

smooth_polylist: Gets rid of unnecessary vertices in the polygons of a list "pl" by eliminating the middle point in any set of three collinear successive vertices. "eps" is the spatial error tolerance. Returns "pl".

compact_polylist: Combines intersecting polygons into one and gets rid of unnecessary vertices in the polygons of a list "pl". Returns "pl".

boolean_polylists: Returns the boolean union if "op"==1 and "orient"==1, intersection if "op"==2 and "orient"==1, or difference if "op"==2 and "orient"==-1 of two lists of polygons "pla" and "plb". The two polyline lists "pla" and "plb" are converted into segment lists and merged into a single segment list. The endpoints of the segments are arranged so that the first endpoint has the minimum y value, or if equal, the minimum x value.
The segment list is sorted by the minimum y of the first endpoint, or if equal, by the minimum x of the first endpoint, or if equal, by the minimum sign of the slope, or if equal, by the maximum value of the slope, or if equal, by the minimum y of the second endpoint, or if equal, by the minimum x of the second endpoint.
Equal simple segments (except for orientation) are merged into compound segments (structures which keep track of multiple overlapping segments). The set of compound segments is simplified by splitting segments at each point of intersection with each other if that intersection point is not interior to a continuous set of intersection points. Any equal compound segments are merged. The segment list is booleaned.
The segment list is reformed into a list of polygons.
The polygons are simplified by deleting the middle of three collinear vertices.

reorient_polylist: Returns the boolean union of a set of polygons "pl" which get redirected in order to keep all of them in the union. If any reorientations occur, "misoriented" is set to TRUE.

union_polylists: Returns the union of two polygon lists "pla" and "plb". The original polygon lists are destroyed unless the 1st and 2nd bits of "save" are set. This function calls the boolean_polylists function with a quantitative volume at infinity of 0 and a transitional quantitative volume of 1.

intersect_polylists: Returns the intersection of two polygon lists "pla" and "plb". The original polygon lists are destroyed unless the 1st and 2nd bits of save are set. This function calls the boolean_polylists function with a quantitative volume at infinity of 0 and a transitional quantitative volume of 2.

difference_polylists: Returns the difference of two polygon lists "pla" and "plb". The original polygon lists are destroyed unless the 1st and 2nd bits of save are set. This function calls the boolean_polylists function with a quantitative volume at infinity of 1 and a transitional quantitative volume of 2.

dupmark_polylist: Marks duplicate vertices in a list of polygons "pl".

layer_compensate: Line width compensates a polygon list "plu" an amount "r" using algorithm "alg" and maximum adjustment "maxadj". The input list is destroyed. The compensated polygon list is returned. This routine works as follows:
First an initial displacement vector for beam compensation along the angular bisector of each vertex of the uncompensated polygon of the list is established of length equal to the distance from the original vertex to the center of an imaginary circle of radius "r" tangent to the two lines formed by extending the two adjacent border segments (but limited to "maxadj"). Two displacement vectors are drawn for angles greater then 180 degrees, perpendicular to each of the adjacent border segments of length "r". Second, if the double of any displacement vector of any compensated polygon crosses a segment of an uncompensated polygon, the displacement vector is shrunk to half the distance to the crossing point. Third, if two displacement vectors cross, both displacement vectors are shrunk to their intersection point. Forth, if any displacement vector of crosses a segment of a compensated polygon, the two displacement vectors which gave rise to this segment are shrunk so that the segment passes through the head of the intrusive displacement vector and the compensated segment is as parallel as possible to its uncompensated counterpart. Next, any pairs of polygons which touch each other are merged
into one. Extraneous vertices are eliminated by deleting the middle vertex of any three successive collinear vertices.

fill_retract: Retracts a polygon list "plu" an amount "r" using algorithm "alg" and maximum adjustment "maxadj". The input list is destroyed. The merger of the retracted and unretracted polygon lists is returned. This routine works as follows:
First an initial displacement vector for fill retraction along the angular bisector of each vertex of the uncompensated polygon of the list is established of length equal to the distance from the original vertex to the center of an imaginary circle of radius "r" tangent to the two lines formed by extending the
two adjacent border segments (but limited to "maxadj"). Next the retracted and unretracted polygon lists are merged (later when the hatching actually takes place, the intersection of these two regions will be hatched.)

adjust0_polylist: Establishes the initial displacement vector for beam compensation along the angular bisector of each vertex of the uncompensated polygons of polygon list "pl" at distance "rb" (but limited if "maxadj" is TRUE). Returns the compensated polygon "pc". Returns the list of compensated polygons.

adjust1_polylist: If the double of any displacement vector in the polygon list "pl" crosses an uncompensated segment, the displacement vector is shrunk to half the distance to the crossing point. Returns the compensated polygon list.

adjust2_polylist: If two displacement vectors of the compensated polygon list, both displacement vectors are shrunk to their intersection point. Returns the compensated list of polygons.

adjust3_polylist: If a displacement vector of the compensated polygon list crosses an compensated segment, the two displacement vectors which give rise to this segment are shrunk so that the segment passes through the head of the intrusive displacement vector and the compensated segment is as parallel as possible to its uncompensated counterpart. Returns the compensated list of polygons.

merge_polylists: Merges two polyline lists "pla" and "plb" into one polyline list and destroys the original lists.

25.7 S6.C: HATCHSEGMENT, HATCHLINE, HATCHLINELIST.

25.7.1 HATCHSEGMENT: hatch segment

25.7.1.1 USAGE

The hatchsegment structure contains the information for one hatch or fill vector.

25.7.1.2 STRUCTURE

DOUBLE tail: tail of hatch segment
DOUBLE head: head of hatch segment
HATCHSEGMENT *prev: previous hatch segment in list
HATCHSEGMENT *next: next hatch segment in list
HATCHLINE *parent: parent hatch line

25.7.1.3 MACROS

None.

25.7.1.4 FUNCTIONS new_hatchsegment: Allocates and initializes a new hatch segment "s" with the tail and head values "tail" and "head".

delete_hatchsegment: Deallocates the hatch segment "s" and returns NULL.

dump_hatchsegment: Dumps the hatch segment "s" and returns NULL.

append_hatchsegment: Appends a hatch segment "s" to the hatch line "hl".

25.7.2 HATCHLINE: hatch line (list of hatch segments).

25.7.2.1 USAGE

The hatchline structure is used to group collinear hatch vectors.

25.7.2.2 STRUCTURE

HATCHSEGMENT *first: first hatch segment
HATCHSEGMENT *last: last hatch segment
DOUBLE y: y value
HATCHLINE *prev: previous hatch line in list
HATCHLINE *next: next hatch line in list
HATCHLINELIST *parent: parent list

25.7.2.3 MACROS

None.

25.7.2.4 FUNCTIONS new_hatchline: Generates the hatch segments corresponding to a given "y" level from a set of boundary segments "sl" at a given boolean level "op" (1: union, 2: intersection). The hatch segments are linked together into a hatchline "hl" which is returned.

delete_hatchline: Deallocates a hatchline "hl" and returns NULL.

dump_hatchline: Dumps the hatch line "hl".

write_hatchline: Writes out the hatch line "hl" in *.sli segment format to stream "stream" with a given rotation characterized by the unit hatch vector "rot" and scaling "scale" and endpoint reversed if "reverse" is TRUE. Deletes the hatch segments which are written out.

size_hatchline: Returns the number of segments in the hatchline "hl".

append_hatchline: Appends hatchline "hl" to the hatchline list "hll" and returns "hll".

25.7.3 HATCHLINELIST: list of hatch lines.

25.7.3.1 USAGE

The hatchlinelist structure contains all the hatchlines for a given hatch or fill direction for a given output block.

25.7.3.2 STRUCTURE

DOUBLE2 rot: unit hatch vector
DOUBLE spacing: spacing of hatch lines
DOUBLE offset: offset of hatch line pattern
HATCHLINE *first: first hatch line in list
HATCHLINE *last: first hatch line in list 25.7.3.3 MACROS

None.

25.7.3.4 FUNCTIONS new_hatchlinelist: Allocates and initializes the hatchline list "hll" with a rotation "rot", line spacing "spacing", and hatch line pattern offset "offset". Returns "hll".

delete_hatchlinelist: Deallocates the hatch line list "hll" and returns NULL.

dump_hatchlinelist: Dumps the hatchline list "hll".

hatch_polylist: Generates a list of hatchlines given a list of polylines "pl", some hatching information "hi", and a binary boolean operation "op" (1:union; 2:intersection). Returns the list of hatchlines. This routine works as follows:
The polygon list is rotated by the hatch angle (this keeps the hatching horizontal) and converted into a list of segments. The endpoints of the segments are arranged so that the first endpoint has the minimum y value, or if equal, the minimum x value. The segment list is sorted by the minimum y of the first endpoint, or if equal, by the minimum x of the first endpoint, or if equal, by the minimum sign of the slope, or if equal, by the maximum value of the slope, or if equal, by the minimum y of the second endpoint, or if equal, by the minimum x of the second endpoint. Any flat segments are converted into two point segments at the endpoints of the original segment. The segment list is hatched in either a union or intersection mode ("hatch_seglist") and the list of hatchlines returned.

write_hatchlinelist: Writes out the hatchline list "hll" as segments in *.sli segment format to the file "stream" with a given block type "type". Returns "hll". This routine works as follows: Each hatchline in the hatchline list is comprised of hatch segments. The list is scanned from top to bottom and the first segment of each hatch line is rotated to the hatch angle and output to the SLI file. Every other segment is printed out in reverse order for drawing optimization. The list is next scanned from bottom to top and the next segment of each hatch line is rotated to the hatch angle and output (every other one in reverse order). These alternate scans are repeated until all the hatch segments have been output.

size_hatchlinelist: Returns the number of segments in a hatch line list "hll".

hatch_seglist: Hatches the boundary segment list "sl" with the operation "op" (1:union, 2:intersection). The hatch direction is "rot", the hatch spacing is "spacing", and the offset of the hatch pattern is "offset". "sl" is decimated in the process. The generated hatchline list is returned. The routine works as follows: All the border segments have already been rotated so that the hatchlines are flat. The y values of the hatchlines intersecting the polygons on the layer are generated and for a given hatch y level, the segments at the beginning of the segment list which intersect the given hatch y level are sorted. The quantitative volume along the hatch line at the given y level is determined as follows: The quantitative volume starts at 0. When a segment is crossed, the quantitative volume is reduced by double the orientation count of the segment unless an endpoint is crossed, in which case it is reduced by the orientation count itself. If a union is being performed the target transition quantitative volume is 2; for an intersection that value becomes 4. When the actual quantitative volume changes from below the target value to the target value or above the hatchline is turned on (this marks the beginning of a hatch segment). If the hatchline changes from the target value or above to below the target value, the hatchline is turned off (this marks the end of a hatch segment).
Proceeding through all the pertinent y value, results in a collection of hatch line each of which is comprised of one or more hatch segments which are returned from this routine.

26.0 CHANGES IN SLICE FROM VERSION 36 TO VERSION 46:

Changes and corrections have been made to the SLICE code in the following areas: Updating and correcting of comments and routine headers. Inconsistency in the boolean algorithm's treatment of bigons corrected. Routines moved from S1.C to S2.C to even up source code file lengths. Tiling routines inserted to support curl suppression. Argument in call to get_range1 corrected in main. Never called merge_polylists call deleted in degap_polylist. Argument of delete_range called in append_range corrected. Allowance of header in ascii SLC file. Z value of triangle vertices rounded to z slice units before roundoff to layer boundary. Tightening of parameter value defaults on command line and argument file. Doubles changed to floats in TMP file.
Parameter dz renamed zs for compatibility with old slice.
Fixed wrong direction offset in y hatch pattern.

27.0 PROBLEMS

27.1 OUTPUT LAYER ROUNDOFF OF TRIANGLES

27.1.1 PROBLEM

Currently the z values of triangles are rounded off to output layer boundaries and flat triangles discarded. This may lead to loss of information and even part breakup.

27.1.2 SOLUTION

Round off the triangle z coordinates only to the z slice resolution. The information from flat triangles goes into the projected segment list for that layer. If the flat triangle lies on a layer boundary and faces downward, include the information in the layer above it. If the flat triangle lies on a layer boundary and faces upward include the information in the layer below it. If a flat triangle lies at the top or bottom of the part, it should face downward or upward respectively.

27.2 OUTPUT LAYER ROUNDOFF OF INPUT CONTOUR LAYERS

27.2.1 PROBLEM

Currently the z values of input contour layers are rounded off to output layer boundaries and layers collapsed to a single z value discarded. This may lead to loss of information and even part breakup.

27.1.2 SOLUTION

Round off the input contour layer z coordinate only to the z slice resolution. The output layer is equal to the union of those input layers of nonzero thickness whose z range overlaps the z range of the output layer as well as those input layers of zero thickness whose z value is inside or at the minimum value of the z range of the output layer.

27.3 INTERFACE WITH THE MERGE PROGRAM

27.3.1 PROBLEM

Normally, all user input values into SLICE would be written to the screen, the MSG file, and the STL file as initial comments. However, the MERGE program can only accept 255 characters of comment which in general would be exceeded since SLICE currently sports more parameters than the previous nonboolean versions. Thus the comment block in the MSG file has been restricted to those parameters which are needed for further processing to avoid overflowing the 255 character limit. Thus only a partial parameter subset is written to the SLI and hence to the .R file which the MERGE program generates. Someone looking at the .R file therefore cannot determine all the slicing parameters.

27.3.2 SOLUTION

Increase the size of the comment block in MERGE to handle the addition parameters. If that is not possible (due to string size limits in PASCAL), increase the number of comment blocks that MERGE can handle.

Express Mail No.
HB435920243US

APPENDIX B

```
/*******************************************************                        *
SO         N, MISCELLANEOUS, MEMORY, TIMING, STRING.
**         *************************************************************************/

#de______ ___IN
#include "s.h"

/*****************************************************************************
main:  Uses "argc" command line arguments "argv" to run schleiss and loops over
the slice layers
******************************************************************************/

VOID main (argc, argv)
INT argc;                      /* number of command line argments              */
CHAR **argv;                   /* command line arguments                       */
  {
  PART *part;                  /* part                                         */
  INT layerno;                 /* layer number                                 */
  HATCHLINELIST *hatchfill;    /* hatch or fill vectors                        */
  HATCHINFO *hi;               /* hatch  or fill information block             */
  UCHAR layer_code=L;          /* layer code                                   */
  USHORT layer_value;          /* value of layer                               */
  DOUBLE z[4];                 /*   .nimum z value of sequential slice layers  */
  POLYLIST *layer[3];          /*  _equential layers                           */
  POLYLIST *layerbndry=NULL;   /* boundary for layer region                    */
  POLYLIST *hatchbndry=NULL;   /* boundary for layer hatch                     */
  POLYLIST *downbndry=NULL;    /* boundary for down region, hatch, fill        */
  POLYLIST *upbndry=NULL;      /* boundary for up region and fill              */
  RANGE *range[3];             /* sequential ranges                            */
  CHAR time_str[9];            /* string for time                              */
  DOUBLE sqrt2;                /* square root of 2                             */
  static CHAR ctrlz_block[8]=(CTRLZ,1,2,1,2,3,4,0x7f);
```

```
 if (argc<2)
   {
   printf("\nSLICE version %s\n",VERSION);
   printf("For help type: schleiss -help\n");
   exit(0);
   }
 sqrt2=sqrt(2.);
 memory=new_memory(_,0);
 get_time(_);
 timing=new_timing(_);
 range[0]=range[1]=range[2]=NULL;
 layer[0]=layer[1]=layer[2]=NULL;
 ui=get_userinfo(argv);
 /*write_parameterlist(ui->output,ui->parameterlist);*/
 write_userinfo(ui->output,ui);
 if (ui->output->format==BINARY)
   fwrite(ctrlz_block,sizeof(CHAR),8,ui->output->file);
 if (ui->screen)
   {
   write_parameterlist(ui->screen,ui->parameterlist);
   write_userinfo(ui->screen,ui);
   }
 if (ui->message)
   {
   write_parameterlist(ui->message,ui->parameterlist);
   write_userinfo(ui->message,ui);
   }
#ifdef SEC
  if (!verify_password(ui->password))
    errexit("ERROR #0000:  UNAUTHORIZED COPY OF SLICE");
#endif
  part=get_part(ui->input,ui);
  switch (ui->data)
    {
    case TRIANGLES:
      dump("\n%ld TRIANGLE%s:\n",part->triangles,part->triangles==1?"":"S");
      dump("%ld flat downfacing triangle%s\n",
        part->downflats,part->downflats==1?"":"s");
      dump("%ld flat upfacing triangle%s\n",
        part->upflats,part->upflats==1?"":"s");
      dump("%ld tilted downfacing triangle%s\n",
        part->downtilteds,part->downtilteds==1?"":"s");
      dump("%ld tilted upfacing triangle%s\n",
        part->uptilteds,part->uptilteds==1?"":"s");
      dump("%ld vertical
triangle%s\n",part->verticals,part->verticals==1?"":"s");
      break;
    case SEGMENTS:
    case POLYLINES:
      dump("%d LAYER%s\n",part->layers,part->layers==1?"":"S");
      break;
```

```
  }
dump("\nDATA EXTENTS:\n");
dump("%lg <= x <= %lg\n",stoc(part->min.x,X),stoc(part->max.x,X));
dump("%lg <= y <= %lg\n",stoc(part->min.y,Y),stoc(part->max.y,Y));
dump("%lg <= z <= %lg\n",stoc(part->min.z,Z),stoc(part->max.z,Z));
if (!part->inwindow) goto done;
ui=update_userinfo(ui,part);
if (ui->debug&1) {DUMP("\n*000: USERINFO:\n");  DUMP_USERINFO(ui);}
if (ui->nz<=0)
  {
  dump("NO LAYERS\n");
  goto done;
  }
if (ui->debug&2) {DUMP("\n*001: PART:\n"); DUMP_PART(part);}

dump("\n%d LAYER%s:\n",ui->nz,ui->nz==1?"":"S");
dump("%d <= n <= %d\n",ui->lmin,ui->lmax);
dump("%.3lf <= z <= %.3lf  (CAD units)\n",stoc(ui->min.z,Z)
,stoc(ui->max.z,Z));
dump("%.0lf <= z <= %.0lf  (SLICE units)\n\n",ui->min.z,ui->max.z);

if (ui->slcalg==0) goto done;
if (ui->layeronly)
  {
  for (layerno=ui->lmin, z[0]=ui->min.z; layerno<=ui->lmax;
    layerno++, z[0]=z[1])  /* loop over layers */
    {
    range[0]=get_rangel(ui->rangelist,layerno);
    z[1]=z[0]+range[0]->zs;

    dump("Slicing layer %d (%.3lf-%.3lf, %.0lf-%.0lf) at %s\n",
    layerno,stoc(z[0],Z),stoc(z[1],Z),z[0],z[1],get_time(time_str));
    layerbndry=slice_part(layerno,z[0],z[1],part,ui);
    if (ui->debug&4)
      {
      DUMP("\n*002: UNCOMPENSATED LAYERBNDRY:\n");
      DUMP_POLYLIST(layerbndry);
      }
    if (ui->lboalg && range[0]->lbo)
      {
      dump("Compensating layer %d (%.3lf-%.3lf, %.0lf-%.0lf) at %s\n",
      layerno,stoc(z[0],Z),stoc(z[1],Z),z[0],z[1],get_time(time_str));
      layerbndry=layer_compensate(layerbndry,range[0]->lbo,ui->lboalg
      ,sqrt2*range[0]->lbo);
      if (ui->debug&4)
        {
        DUMP("\n*003: COMPENSATED LAYERBNDRY:\n");
        DUMP_POLYLIST(layerbndry);
        }
      }
    if (ui->tileinfo)
      {
```

```
    dump("Tiling layer %d (%.3lf-%.3lf, %.0lf-%.0lf) at %s\n",
    layerno,stoc(z[0],Z),stoc(z[1],Z),z[0],z[1],get_time(time_str));
    layerbndry=tile_polylist(layerbndry,ui->tileinfo);
    if (ui->debug&4)
      {
      DUMP("\n*093: TILED LAYERBNDRY:\n");
      DUMP_POLYLIST(layerbndry);
      }
    }

  if (layerbndry->first)    /* write block header */
    {
    layer_value=(USHORT)(z[1]);
    if (ui->output->format==ASCII)
      fprintf(ui->output->file,"%s %d\n",block_type[L],layer_value);
    else
      {
      fwrite_(&layer_code,sizeof(UCHAR),1,ui->output->file
      ,ui->output->byteorder!=ui->byteorder);
      fwrite_(&layer_value,sizeof(USHORT),1,ui->output->file
      ,ui->output->byteorder!=ui->byteorder);
      }
    write_polylist(ui->output,layerbndry,LB);
    }

  if (ui->layerhatch->first)
    {
    dump("Hatching layer %d (%.3lf-%.3lf, %.0lf-%.0lf) at %s\n",
    layerno,stoc(z[0],Z),stoc(z[1],Z),z[0],z[1],get_time(time_str));
    for (hi=ui->layerhatch->first; hi; hi=hi->next)
      {
      if (hi->spacing<=0.) continue;
      hatchfill=hatch_polylist(layerbndry,hi,1);
      write_hatchlinelist(ui->output,hatchfill,LH);
      hatchfill=delete_hatchlinelist(hatchfill);
      } /* hi */
    }
  layerbndry=delete_polylist(layerbndry);
  }
}

else  /* if (!layeronly) */
  {
  layerno=ui->lmin;
  z[1]=ui->min.z;
  range[0]=get_rangel(ui->rangelist,layerno-1);
  z[0]=z[1]-range[0]->zs;
  range[1]=get_rangel(ui->rangelist,layerno);
  z[2]=z[1]+range[1]->zs;

  dump("Slicing layer %d (%.3lf-%.3lf, %.0lf-%.0lf) at %s\n",
  layerno-1,stoc(z[0],Z),stoc(z[1],Z),z[0],z[1],get_time(time_str));
```

```
layer[0]=slice_part(layerno-1,z[0],z[1],part,ui);
if (ui->debug&4)
  {
  DUMP("\n*004: UNCOMPENSATED LAYER[0]:\n");
  DUMP_POLYLIST(layer[0]);
  }
if (ui->lboalg && range[0]->lbo)
  {
  dump("Compensating layer %d (%.3lf-%.3lf, %.0lf-%.0lf) at %s\n",
  layerno-1,stoc(z[0],Z),stoc(z[1],Z),z[0],z[1],get_time(time_str));
  layer[0]=layer_compensate(layer[0],range[0]->lbo,ui->lboalg
  ,sqrt2*range[0]->lbo);
  if (ui->debug&4)
    {
    DUMP("\n*005: COMPENSATED LAYER[0]:\n");
    DUMP_POLYLIST(layer[0]);
    }
  }
if (ui->tileinfo)
  {
  dump("Tiling layer %d (%.3lf-%.3lf, %.0lf-%.0lf) at %s\n",
  layerno-1,stoc(z[0],Z),stoc(z[1],Z),z[0],z[1],get_time(time_str));
  layer[0]=tile_polylist(layer[0],ui->tileinfo);
  if (ui->debug&4)
    {
    DUMP("\n*095: TILED LAYERBNDRY:\n");
    DUMP_POLYLIST(layer[0]);
    }
  }

dump("Slicing layer %d (%.3lf-%.3lf, %.0lf-%.0lf) at %s\n",
layerno,stoc(z[1],Z),stoc(z[2],Z),z[1],z[2],get_time(time_str));
layer[1]=slice_part(layerno,z[1],z[2],part,ui);
if (ui->debug&4)
  {
  DUMP("\n*006: UNCOMPENSATED LAYER[1]:\n");
  DUMP_POLYLIST(layer[1]);
  }
if (ui->lboalg && range[1]->lbo)
  {
  dump("Compensating layer %d (%.3lf-%.3lf, %.0lf-%.0lf) at %s\n",
  layerno,stoc(z[1],Z),stoc(z[2],Z),z[1],z[2],get_time(time_str));
  layer[1]=layer_compensate(layer[1],range[1]->lbo,ui->lboalg
  ,sqrt2*range[1]->lbo);
  if (ui->debug&4)
    {
    DUMP("\n*007: COMPENSATED LAYER[1]:\n");
    DUMP_POLYLIST(layer[1]);
    }
  }
if (ui->tileinfo)
  {
```

```
  dump("Tiling layer %d (%.31f-%.31f, %.01f-%.01f) at %s\n",
  layerno,stoc(z[1],Z),stoc(z[2],Z),z[1],z[2],get_time(time_str));
  layer[1]=tile_polylist(layer[1],ui->tileinfo);
  if (ui->debug&4)
    {
    DUMP("\n*097: TILED LAYERBNDRY:\n");
    DUMP_POLYLIST(layer[1]);
    }
  }

for (layerno=ui->lmin; layerno<=ui->lmax; layerno++)  /* loop over layers*/

  {
  range[2]=get_rangel(ui->rangelist,layerno+1);
  z[3]=z[2]+range[2]->zs;
  dump("Slicing layer %d (%.31f-%.31f, %.01f-%.01f) at %s\n",
  layerno+1,stoc(z[2],Z),stoc(z[3],Z),z[2],z[3],get_time(time_str));
  layer[2]=slice_part(layerno+1,z[2],z[3],part,ui);
  if (ui->debug&4)
    {
    DUMP("\n*008: UNCOMPENSATED LAYER[2]:\n");
    DUMP_POLYLIST(layer[2]);
    }
  if (ui->lboalg && range[2]->lbo)
    {
    dump("Compensating layer %d (%.31f-%.31f, %.01f-%.01f) at %s\n",
    layerno+1,stoc(z[2],Z),stoc(z[3],Z),z[2],z[3],get_time(time_str));
    layer[2]=layer_compensate(layer[2],range[2]->lbo,ui->lboalg
    ,sqrt2*range[2]->lbo);
    if (ui->debug&4)
      {
      DUMP("\n*009: COMPENSATED LAYER[2]:\n");
      DUMP_POLYLIST(layer[2]);
      }
    }
  if (ui->tileinfo)
    {
    dump("Tiling layer %d (%.31f-%.31f, %.01f-%.01f) at %s\n",
    layerno+1,stoc(z[2],Z),stoc(z[3],Z),z[2],z[3],get_time(time_str));
    layer[2]=tile_polylist(layer[2],ui->tileinfo);
    if (ui->debug&4)
      {
      DUMP("\n*099: TILED LAYER[2]:\n");
      DUMP_POLYLIST(layer[2]);
      }
    }

  /* write block header */
  layer_value=(USHORT)(z[2]);
  if (ui->output->format==ASCII)
    fprintf(ui->output->file,"%s %d\n",block_type[L],layer_value);
  else
```

```
  {
  fwrite_(&layer_code,sizeof(UCHAR),1,ui->output->file
  ,ui->output->byteorder!=ui->byteorder);
  fwrite_(&layer_value,sizeof(USHORT),1,ui->output->file
  ,ui->output->byteorder!=ui->byteorder);
  }

/* generate boundaries */
dump("Generating down layer %d (%.3lf-%.3lf, %.0lf-%.0lf) at %s\n",
layerno,stoc(z[1],Z),stoc(z[2],Z),z[1],z[2],get_time(time_str));
downbndry=difference_polylists(layer[1],layer[0],1);
if (ui->debug&4)
  {
  DUMP("\n*010: DOWNBNDRY=LAYER[1]-LAYER[0]:\n");
  DUMP_POLYLIST(downbndry);
  }

dump("Generating up layer %d (%.3lf-%.3lf, %.0lf-%.0lf) at %s\n",
layerno,stoc(z[1],Z),stoc(z[2],Z),z[1],z[2],get_time(time_str));
upbndry=difference_polylists(layer[1],layer[2],3);
upbndry=difference_polylists(upbndry,downbndry,2);
if (ui->debug&4)
  {
  DUMP("\n*011: UPBNDRY=LAYER[1]-LAYER[2]-DOWNBNDRY:\n");
  DUMP_POLYLIST(upbndry);
  }

if (ui->nhatch==1) hatchbndry=new_polylist1(_,layer[1]);
layerbndry=difference_polylists(layer[1],downbndry,3);
if (ui->nhatch==2) hatchbndry=new_polylist1(_,layerbndry);
layerbndry=difference_polylists(layerbndry,upbndry,2);
if (ui->nhatch==3) hatchbndry=new_polylist1(_,layerbndry);
if (ui->debug&4 && ui->nhatch)
  {
  switch (ui->nhatch)
    {
    case 1:  DUMP("\n*011: HATCHBNDRY=LAYER[1]:\n");
    case 2:  DUMP("\n*011: HATCHBNDRY=LAYER[1]-DOWNBNDRY:\n");
    case 3:  DUMP("\n*011: HATCHBNDRY=LAYER[1]-DOWNBNDRY-UPBNDRY:\n");
    default:  errexit("ERROR #0008:  Bad value of nhatch");
    }
  DUMP_POLYLIST(hatchbndry);
  DUMP("\n*013: LAYERBNDRY=LAYER[1]-DOWNBNDRY-UPBNDRY:\n");
  DUMP_POLYLIST(layerbndry);
  }

write_polylist(ui->output,layerbndry,LB);
layerbndry=delete_polylist(layerbndry);
write_polylist(ui->output,upbndry,UB);
if (ui->nhatch==1) write_polylist(ui->output,downbndry,DB);

if (ui->nhatch && hatchbndry->first && ui->layerhatch->first)
```

```
    {
    dump("Hatching layer %d (%.3lf-%.3lf, %.0lf-%.0lf) at %s\n",
    layerno,stoc(z[1],Z),stoc(z[2],Z),z[1],z[2],get_time(time_str));
    for (hi=ui->layerhatch->first; hi; hi=hi->next)
      {
      if (hi->spacing<=0.) continue;
      hatchfill=hatch_polylist(hatchbndry,hi,1);
      write_hatchlinelist(ui->output,hatchfill,LH);
      hatchfill=delete_hatchlinelist(hatchfill);
      } /* hi */
    }
  if (ui->nhatch) hatchbndry=delete_polylist(hatchbndry);

  if (ui->nhatch==3 && upbndry->first)
    {
    if (ui->uphatch->first)
      {
      dump("Hatching up layer %d (%.3lf-%.3lf, %.0lf-%.0lf) at %s\n",
      layerno,stoc(z[1],Z),stoc(z[2],Z),z[1],z[2],get_time(time_str));
      for (hi=ui->uphatch->first; hi; hi=hi->next)
        {
        if (hi->spacing<=0.) continue;
        hatchfill=hatch_polylist(upbndry,hi,1);
        write_hatchlinelist(ui->output,hatchfill,UH);
        hatchfill=delete_hatchlinelist(hatchfill);
        } /* hi */
      }
    }

  if (ui->nhatch>1) write_polylist(ui->output,downbndry,DB);

  if (ui->nhatch>1 && downbndry->first)
    {
    if (ui->downhatch->first)
      {
      dump("Hatching down layer %d (%.3lf-%.3lf, %.0lf-%.0lf) at %s\n",
      layerno,stoc(z[1],Z),stoc(z[2],Z),z[1],z[2],get_time(time_str));
      for (hi=ui->downhatch->first; hi; hi=hi->next)
        {
        if (hi->spacing<=0.) continue;
        hatchfill=hatch_polylist(downbndry,hi,1);
        write_hatchlinelist(ui->output,hatchfill,DH);
        hatchfill=delete_hatchlinelist(hatchfill);
        } /* hi */
      }
    }

  if (upbndry->first && ui->upfill->first)
    {
    if (ui->ufoalg && range[1]->ufo)
      {
      dump("Retracting up layer %d (%.3lf-%.3lf, %.0lf-%.0lf) at %s\n",
```

```
    layerno,stoc(z[1],Z),stoc(z[2],Z),z[1],z[2],get_time(time_str));
    upbndry=fill_retract(upbndry,range[1]->ufo,ui->ufoalg
    ,sqrt2*range[1]->ufo);
    if (ui->debug&4)
      {
      DUMP("\n*016: RETRACTED UPBNDRY:\n");
      DUMP_POLYLIST(upbndry);
      }
    }
  dump("Filling up layer %d (%.3lf-%.3lf, %.0lf-%.0lf) at %s\n",
  layerno,stoc(z[1],Z),stoc(z[2],Z),z[1],z[2],get_time(time_str));
  for (hi=ui->upfill->first; hi; hi=hi->next)
    {
    if (hi->spacing<=0.) continue;
/*  hatchfill=hatch_polylist(upbndry,hi,range[1]->ufo==0?1:2);*/
    hatchfill=hatch_polylist(upbndry,hi,1);
    write_hatchlinelist(ui->output,hatchfill,UF);
    hatchfill=delete_hatchlinelist(hatchfill);
    } /* hi */
  }

upbndry=delete_polylist(upbndry);

if (downbndry->first && ui->downfill->first)
  {
  if (ui->dfoalg && range[1]->dfo)
    {
    dump("Retracting down layer %d (%.3lf-%.3lf, %.0lf-%.0lf) at %s\n",
    layerno,stoc(z[1],Z),stoc(z[2],Z),z[1],z[2],get_time(time_str));
    downbndry=fill_retract(downbndry,range[1]->dfo,ui->dfoalg
    ,sqrt2*range[1]->dfo);
    if (ui->debug&4)
      {
      DUMP("\n*015: RETRACTED DOWNBNDRY:\n");
      DUMP_POLYLIST(downbndry);
      }
    }
  dump("Filling down layer %d (%.3lf-%.3lf, %.0lf-%.0lf) at %s\n",
  layerno,stoc(z[1],Z),stoc(z[2],Z),z[1],z[2],get_time(time_str));
  for (hi=ui->downfill->first; hi; hi=hi->next)
    {
    if (hi->spacing<=0.) continue;
/*  hatchfill=hatch_polylist(downbndry,hi,range[1]->dfo==0.?1:2);*/
    hatchfill=hatch_polylist(downbndry,hi,1);
    write_hatchlinelist(ui->output,hatchfill,DF);
    hatchfill=delete_hatchlinelist(hatchfill);
    } /* hi */
  }
downbndry=delete_polylist(downbndry);

range[0]=range[1];
z[0]=z[1];                /* bottom of previous layer            */
```

```
      range[1]=range[2];
      z[1]=z[2];                  /* bottom of current layer              */
      z[2]=z[3];                  /* top of current layer                 */
      layer[0]=layer[1];
      layer[1]=layer[2];
      }
    layer[0]=delete_polylist(layer[0]);
    layer[1]=delete_polylist(layer[1]);
    }

  done:
  if (part)
    {
    if (part->missing>0 || part->misoriented) dump("\n");
    if (part->missing>0)
      dump("WARNING #0000:  Missing segments recreated on %d slice layer%s\n",

      part->missing,part->missing==1?"":"s");
    if (part->misoriented>0)
      dump("WARNING #0001:  Misoriented segments reoriented on %d slice
layer%s\n"
      ,part->misoriented,part->misoriented==1?"":"s");
    delete_part(part);
    }
  if (ui->timing) write_timing(timing);
  delete_timing(timing);
  delete_userinfo(ui);
  if (memory_allocated(memory)) dump_memory(memory);

  dump("\nMaximum memory allocation = %ld bytes", memory->maxtotal);
  dump("\nTotal memory allocation = %ld bytes", memory->supermaxtotal);

  delete_stream(ui->parameter);
  delete_stream(ui->internal);
  delete_stream(ui->material);
  delete_stream(ui->security);
  delete_stream(ui->input);
  delete_stream(ui->output);
  dump("\nSLICE TERMINATED NORMALLY AT %s!\n",get_time(time_str));
  delete_stream(ui->message);
  delete_stream(ui->screen);
  free(ui);
  }

/***************************************************************************

MISCELLANEOUS:  miscellaneous functions.
***************************************************************************/


/***************************************************************************
```

```
help_screen:  Displays the help screen with version number "version".
******************************************************************************/

VOID help_screen (version)
CHAR *version;                /* schleiss version number                    */

  {
  printf("\nSLICE version %s\n",version);
  printf("\nTo activate slice in command line mode type:\n");
  printf("\nschleiss -option1 value1 -option2 value2 ....\n");
  printf("\nwhere -option is the name of an option and value is its value\n");

  printf("\nExample:\n");
  printf("\nschleiss -r part.stl -w part.sli -m part.msg -s\n");
  printf("\ntells slice to read (-r) the input from file part.stl,\n");
  printf("write (-w) the output to file part.sli,\n");
  printf("write a list of messages (-m) to file part.msg\n");
  printf("as well as to the screen (-s)\n");
  printf("\nThe full list of options with their ranges of values and:\n");
  printf("default values (the value when the option is absent) is:\n");

  printf("Press <ENTER> to continue\n\n");
  getchar();
  printf("MISCELLANEOUS OPTIONS:  -option <values> description (default)\n");
  printf("-help < |T|F>      full help screens? (F)\n");
  printf("-debug <int>       debug flags (0)\n");
  printf("-timing < |T|F>    show elapsed time for key functions? (F)\n");
  printf("-data <T|P|S>      data: triangles, segments, polygons
(triangles)\n");
  printf("-warn < |T|F>      keep going after warnings? (T)\n");
  printf("-xmin <float>      minimum x value of data window (-infinity)\n");
  printf("-xmax <float>      maximum x value of data window (infinity)\n");
  printf("-ymin <float>      minimum y value of data window (-infinity)\n");
  printf("-ymax <float>      maximum y value of data window (infinity)\n");
  printf("-zmin <float>      bottom of initial layer (bottom of part)\n");
  printf("-zmax <float>      top of final layer (top of part)\n");
  printf("-lmin <float>      initial layer number (first layer of part)\n");
  printf("-lmax <float>      final layer number (last layer of part)\n");
  printf("-res <float>       resolution scale factor (5000/in)\n");
  printf("-resratio <float> finer res factor for intermediate calculations
(3))\n");
  printf("-unit <I|M|C|float>  CAD unit (in)\n");
  printf("-reorient < |T|F> reorient misoriented boundaries? (T)\n");
  printf("-overcure <float> overcure amount? (.006 in)\n");

  printf("Press <ENTER> to continue\n\n");
  getchar();
  printf("FILE AND ERROR TOLERANCE OPTIONS:  -option <values> description
(default)\n");
  printf("-r <file> < |a|b> < |0|1> input file, ascii or binary (b), byte order
(0)\n");
```

```
  printf("-w < |file> < |a|b> < |0|1> output file: ascii or binary (b), byte
order (0)\n");
  printf("-m < |file>       message file\n");
  printf("-p < |F|file>     parameter file (F)\n");
  printf("-s < |T|F>        screen messages? (T)\n");
  printf("-i < |file>       internal data file (slice.tmp)\n");
  printf("-mat < |file>     material file\n");
  printf("-sec < |file>     security file containing password\n");
  printf("-eps <float>      spatial error tolerance (.5/res)\n");
  printf("-byteorder <0|1>  machine byte order: 0)low 1st 1)low last (if IRIS?
1 else 0)\n");
  printf("-carriage < |T|F> add carriage return to new line? (if DOS? T, else
F)\n");

  printf("Press <ENTER> to continue\n\n");
  getchar();
  printf("SLICING, HATCH, AND FILL OPTIONS:  -option <values> description
(default)\n");
  printf("-slcalg <0|1>     slicing algorithm (1)\n");
  printf("-style <U|L|M|H|O>  slicing style: under,low,mid,high,over
(over)\n");
  printf("-raw < |T|F>       raw cuts of triangle file only (F)?\n");
  printf("-bo < |T|F>       borders only (no hatch or fill)? (F)\n");
  printf("-lo < |T|F>       layers only (no layer differencing)? (F)\n");
  printf("-hx 3*<float>     horizontal hatch spacing, offset, shift (0. 0.
0.)\n");
  printf("-hy 3*<float>     vertical hatch spacing, offset, shift (0. 0.
0.)\n");
  printf("-ha 3*<float>     60/120 hatch spacing, offset, shift (0. 0. 0.)\n");

  printf("-ht 3*<float>     0/60/120 hatch spacing, offset, shift (0. 0.
0.)\n");
  printf("-fx 3*<float>     horizontal fill spacing, offset, shift (0. 0.
0.)\n");
  printf("-fy 3*<float>     vertical fill spacing, offset, shift (0. 0.
0.)\n");
  printf("-lh 4*<float>     layer hatch angle, spacing, offset, shift (0. 0. 0.
0.)\n");
  printf("-dh 4*<float>     down hatch angle, spacing, offset, shift (0. 0. 0.
0.)\n");
  printf("-uh 4*<float>     up hatch angle, spacing, offset, shift (0. 0. 0.
0.)\n");
  printf("-h  4*<float>     combined -lh, -dh, and -uh (0. 0. 0. 0.)\n");
  printf("-df 4*<float>     down fill angle, spacing, offset, shift (0. 0. 0.
0.)\n");
  printf("-uf 4*<float>     up fill angle, spacing, offset, shift (0. 0. 0.
0.)\n");
  printf("-f  4*<float>     combined -df and -uf (0. 0. 0. 0.)\n");
  printf("-tile 4*<float>   tile size, gap, offset, shift (0. 0. 0. 0.)\n");
  printf("-nhatch <0|1|2|3> number of hatch types (2)\n");

  printf("Press <ENTER> to continue\n\n");
```

```
getchar();
printf("TRANSFORMATION OPTIONS:  -option <values> description (default)\n");

printf("-axis <X|Y|Z>       slice axis (z) \n");
printf("-x < |T|F>          slice axis is x? (F)\n");
printf("-y < |T|F>          slice axis is y? (F)\n");
printf("-z < |T|F>          slice axis is z? (T)\n");
printf("-mirror < |T|F>     mirror image? (if axis is z? F, else T)\n");
printf("-rx <float>         rotation about x axis (0) \n");
printf("-ry <float>         rotation about y axis (0) \n");
printf("-rz <float>         rotation about z axis (0) \n");
printf("-tx <float>         translation along x axis (0) \n");
printf("-ty <float>         translation along y axis (0) \n");
printf("-tz <float>         translation along z axis (0) \n");
printf("-sx <float>         scaling along x axis (1) \n");
printf("-sy <float>         scaling along y axis (1) \n");
printf("-sz <float>         scaling along z axis (1) \n");
printf("-scl <float>        scaling along x, y, and z axes (1) \n");

printf("Press <ENTER> to continue\n\n");
getchar();
printf("RANGE OPTIONS:  -option <values> description (default)\n");
printf("-range <float>      minimum z value of range\n");
printf("-zs <float>         layer thickness (.01)\n");
printf("-lbo <float>        layer border offset (0)\n");
printf("-dfo <float>        down fill border offset (0)\n");
printf("-ufo <float>        up fill border offset (0)\n");
printf("-fo <float>         combined -dfo and -ufo (0)\n");
printf("-lboalg <0|1|2|3> layer border offset alg (1:slow 2:max 3:min)
(1)\n");
printf("-dfoalg <0|1>       down fill border offset algorithm (1)\n");
printf("-ufoalg <0|1>       up fill border offset algorithm (1)\n");
printf("-foalg <0|1>        combined -dfoalg and -ufoalg (1)\n");

printf("Press <ENTER> to continue\n\n");
getchar();
printf("PARAMETER INPUT ORDER:\n");
printf("A < B means parameters in set A must preceed those in set B\n\n");
printf("Occur anywhere:\n");
printf("{help,debug,timing,reorient,bo,lo,style,raw,\n");
printf("slcalg,lboalg,dfoalg,ufoalg,foalg,r,w,m,p,s,i,mirror\n");
printf("lmin,lmax,rz,sx,sy,tx,ty,tz,warn,nhatch}\n\n");
printf("{data} < {sz,scl,rx,ry,axis,x,y,z}\n\n");
printf("{unit,resratio} < {res}\n");
printf("  < {hx,hy,ha,ht,fx,fy,h,lh,dh,f,df,uf,xmin,xmax,ymin,ymax}\n\n");
printf("{unit,resratio} < {res} < {eps,overcure,mat}\n");
printf("  < {range,zs,lbo,dfo,ufo,fo}\n");
printf("  < {zmin,zmax}\n\n");
return;
}
```

```
/*****************************************************************************
MEMORY:  memory manager
*****************************************************************************/

/*****************************************************************************
new_memory:  Allocates and initializes the memory manager "m" with "maxbytes"
count bins and returns "m".
*****************************************************************************/

MEMORY *new_memory (m, maxbytes)
MEMORY *m;                    /* memory manager                               */

INT maxbytes;                 /* number of count bins                         */

  {
  INT i;
  if (!m) m=(MEMORY*)malloc(sizeof(MEMORY));
  if (!m) errexit("ERROR #0001:  Memory exhausted");
  m->total=0L;
  m->maxbytes=maxbytes;
  m->count=(INT*)malloc((maxbytes+1)*sizeof(INT));
  for (i=0; i<=m->maxbytes; i++) m->count[i]=0;
  m->maxtotal=0L;
  m->supermaxtotal=0L;
  return m;
  }

/*****************************************************************************
delete_memory:  Deletes the memory manager "m" and returns NULL.
*****************************************************************************/

MEMORY *delete_memory (m)
MEMORY *m;                    /* memory manager                               */

  {
  if (!m) return NULL;
  free(m->count);
  free(m);
  return NULL;
  }

/*****************************************************************************
allocate_memory:  Allocates a block of "nbytes" bytes from the memory manager
"m" and returns a pointer to it.
*****************************************************************************/

CHAR *allocate_memory (m, nbytes)
```

```
MEMORY *m;                      /* memory manager                          */

INT nbytes;                     /* number of bytes to allocate             */

  {
  CHAR *p;
  INT i;                        /* count bin index                         */

  p=(VOID*)malloc(nbytes);
  if (!p)
    {
    dump("ERROR #0002:  Memory exhausted! %ld byte%s currently allocated!\n"
    , m->total,m->total==1?"":"s");
    for (i=0; i<m->maxbytes; i++)
      {
      if (m->count[i]) dump("%d %d-byte block%s\n",
        m->count[i],i,m->count[i]==1?"":"s");
      if (i==sizeof(CURE)) dump("CURE?\n");
      if (i==sizeof(CURELIST)) dump("CURELIST?\n");
      if (i==sizeof(HATCHINFO)) dump("HATCHINFO?\n");
      if (i==sizeof(HATCHINFOLIST)) dump("HATCHINFOLIST?\n");
      if (i==sizeof(HATCHLINE)) dump("HATCHLINE?\n");
      if (i==sizeof(HATCHLINELIST)) dump("HATCHLINELIST?\n");
      if (i==sizeof(HATCHSEGMENT)) dump("HATCHSEGMENT?\n");
      if (i==sizeof(MEMORY)) dump("MEMORY?\n");
      if (i==sizeof(PARAMETER)) dump("PARAMETER?\n");
      if (i==sizeof(PARAMETERLIST)) dump("PARAMETERLIST?\n");
      if (i==sizeof(PART)) dump("PART?\n");
      if (i==sizeof(POLYLINE)) dump("POLYLINE?\n");
      if (i==sizeof(POLYLIST)) dump("POLYLIST?\n");
      if (i==sizeof(RANGE)) dump("RANGE?\n");
      if (i==sizeof(RANGELIST)) dump("RANGELIST?\n");
      if (i==sizeof(SEGMENT)) dump("SEGMENT?\n");
      if (i==sizeof(SEGLIST)) dump("SEGLIST?\n");
      if (i==sizeof(STREAM)) dump("STREAM?\n");
      if (i==sizeof(TILEINFO)) dump("TILEINFO?\n");
      if (i==sizeof(TIMING)) dump("TIMING?\n");
      if (i==sizeof(TRANSFORMATION)) dump("TRANSFORMATION?\n");
      if (i==sizeof(TRIANGLE)) dump("TRIANGLE?\n");
      if (i==sizeof(USERINFO)) dump("USERINFO?\n");
      if (i==sizeof(VERTEX)) dump("VERTEX?\n");
      }
#ifdef UNIX
  i=0;
  i=1./i;
#endif
    errexit("");
    }
  if (nbytes>m->maxbytes)
    {
    m->count=(INT*)realloc(m->count,(nbytes+1)*sizeof(INT));
    for (i=m->maxbytes+1; i<=nbytes; i++) m->count[i]=0;
```

```
    m->maxbytes=nbytes;
    }
  m->total+=nbytes;
  m->count[nbytes]++;
  if (m->total>m->maxtotal) m->maxtotal=m->total;
  m->supermaxtotal+=nbytes;
  return p;
  }

/*******************************************************************************

free_memory:  Deallocates "nbytes" bytes at position "p" from the memory
manager "m".
*******************************************************************************/

VOID free_memory (m, p, nbytes)
MEMORY *m;                    /* memory manager                          */

CHAR *p;                      /* pointer to memory to free               */

INT nbytes;                   /* number of bytes to free                 */

  {
  if (!p) errexit("ERROR #0003:  Attempt to free location 0");
  m->total-=nbytes;
  m->count[nbytes]--;
  if (m->total>=0 && m->count[nbytes]>=0)
    {
    free(p);
    return ;
    }
  dump("%ld byte%s currently allocated!\n",m->total,m->total==1?"":"s");
  dump("%d-byte blocks overdeallocated!\n",nbytes);
  if (nbytes==sizeof(CURE)) dump("CURE?\n");
  if (nbytes==sizeof(CURELIST)) dump("CURELIST?\n");
  if (nbytes==sizeof(HATCHINFO)) dump("HATCHINFO?\n");
  if (nbytes==sizeof(HATCHINFOLIST)) dump("HATCHINFOLIST?\n");
  if (nbytes==sizeof(HATCHLINE)) dump("HATCHLINE?\n");
  if (nbytes==sizeof(HATCHLINELIST)) dump("HATCHLINELIST?\n");
  if (nbytes==sizeof(HATCHSEGMENT)) dump("HATCHSEGMENT?\n");
  if (nbytes==sizeof(MEMORY)) dump("MEMORY?\n");
  if (nbytes==sizeof(PARAMETER)) dump("PARAMETER?\n");
  if (nbytes==sizeof(PARAMETERLIST)) dump("PARAMETERLIST?\n");
  if (nbytes==sizeof(PART)) dump("PART?\n");
  if (nbytes==sizeof(POLYLINE)) dump("POLYLINE?\n");
  if (nbytes==sizeof(POLYLIST)) dump("POLYLIST?\n");
  if (nbytes==sizeof(RANGE)) dump("RANGE?\n");
  if (nbytes==sizeof(RANGELIST)) dump("RANGELIST?\n");
  if (nbytes==sizeof(SEGMENT)) dump("SEGMENT?\n");
  if (nbytes==sizeof(SEGLIST)) dump("SEGLIST?\n");
  if (nbytes==sizeof(STREAM)) dump("STREAM?\n");
  if (nbytes==sizeof(TILEINFO)) dump("TILEINFO?\n");
```

```
  if (nbytes==sizeof(TIMING)) dump("TIMING?\n");
  if (nbytes==sizeof(TRANSFORMATION)) dump("TRANSFORMATION?\n");
  if (nbytes==sizeof(TRIANGLE)) dump("TRIANGLE?\n");
  if (nbytes==sizeof(USERINFO)) dump("USERINFO?\n");
  if (nbytes==sizeof(VERTEX)) dump("VERTEX?\n");
#ifdef UNIX
  nbytes=0;
  nbytes=1./nbytes;
#endif
  errexit("");
  }

/******************************************************************************

dump_memory:  Dumps out the memory manager "m".
******************************************************************************/

VOID dump_memory (m)
MEMORY *m;                    /* memory manager                              */

  {
  INT i;                      /* memory count bin number                     */

  BOOLEAN ok=TRUE;            /* memory ok?                                  */

  if (m->total<0L)
    {
    dump("ERROR #0004:  %ld byte%s of memory overdeallocated\n"
    ,m->total,m->total==1?"":"s");
    ok=FALSE;
    }
  if (m->total>0L)
    {
    dump("ERROR #0005:  %ld byte%s of memory not deallocated\n"
    ,m->total,m->total==1?"":"s");
    ok=FALSE;
    }
  for (i=0; i<m->maxbytes; i++)
    {
    if (m->count[i]==0) continue;
    dump("ERROR #0006:  %d %d-byte block%s not deallocated\n"
    ,m->count[i],i,m->count[i]==1?"":"s");
    ok=FALSE;
    if (i==sizeof(CURE)) dump("CURE?\n");
    if (i==sizeof(CURELIST)) dump("CURELIST?\n");
    if (i==sizeof(HATCHINFO)) dump("HATCHINFO?\n");
    if (i==sizeof(HATCHINFOLIST)) dump("HATCHINFOLIST?\n");
    if (i==sizeof(HATCHLINE)) dump("HATCHLINE?\n");
    if (i==sizeof(HATCHLINELIST)) dump("HATCHLINELIST?\n");
    if (i==sizeof(HATCHSEGMENT)) dump("HATCHSEGMENT?\n");
    if (i==sizeof(MEMORY)) dump("MEMORY?\n");
    if (i==sizeof(PARAMETER)) dump("PARAMETER?\n");
```

```
    if (i==sizeof(PARAMETERLIST)) dump("PARAMETERLIST?\n");
    if (i==sizeof(PART)) dump("PART?\n");
    if (i==sizeof(POLYLINE)) dump("POLYLINE?\n");
    if (i==sizeof(POLYLIST)) dump("POLYLIST?\n");
    if (i==sizeof(RANGE)) dump("RANGE?\n");
    if (i==sizeof(RANGELIST)) dump("RANGELIST?\n");
    if (i==sizeof(SEGMENT)) dump("SEGMENT?\n");
    if (i==sizeof(SEGLIST)) dump("SEGLIST?\n");
    if (i==sizeof(STREAM)) dump("STREAM?\n");
    if (i==sizeof(TILEINFO)) dump("TILEINFO?\n");
    if (i==sizeof(TIMING)) dump("TIMING?\n");
    if (i==sizeof(TRANSFORMATION)) dump("TRANSFORMATION?\n");
    if (i==sizeof(TRIANGLE)) dump("TRIANGLE?\n");
    if (i==sizeof(USERINFO)) dump("USERINFO?\n");
    if (i==sizeof(VERTEX)) dump("VERTEX?\n");
    }
  if (!ok) errexit("");
  }

/****************************************************************************

memory_allocated:  Return TRUE if any memory is allocated by the memory manager

"m", FALSE otherwise.
****************************************************************************/

BOOLEAN memory_allocated (m)
MEMORY *m;                    /* memory manager                          */

  {
  INT i;                      /* memory count bin number                 */

  if (m->total) return TRUE;
  for (i=0; i<m->maxbytes; i++) if (m->count[i]) return TRUE;
  return FALSE;
  }

/****************************************************************************

TIMING:  function timing.
****************************************************************************/


/****************************************************************************

new_timing:  Allocates and initializes the timing structure "t" and returns it.

****************************************************************************/

TIMING *new_timing (t)
TIMING *t;
```

```
  {
  if (!t) t=allocate(TIMING);
  if (!t) errexit("ERROR #0007:  Memory exhausted");
  t->start=time(_);
  t->stop=t->start;
  t->main=0;
  t->get_userinfo=0;
  t->get_part=0;
  t->slice_part=0;
  t->boolean_seglist=0;
  t->reorient_seglist=0;
  t->split_seglist=0;
  t->new_polylist2=0;
  t->degap_polylist=0;
  t->boolean_polylists=0;
  t->reorient_polylist=0;
  t->union_polylists=0;
  t->intersect_polylists=0;
  t->difference_polylists=0;
  t->layer_compensate=0;
  t->fill_retract=0;
  t->hatch_polylist=0;
  t->sort_tripart=0;
  t->sort_seglist=0;
  return t;
  }

/*****************************************************************************

delete_timing:  Deallocates a timing structure "t" and returns NULL;
*****************************************************************************/

TIMING *delete_timing (t)
TIMING *t;                      /* timing                                    */

  {
  if (!t) return NULL;
  deallocate(t);
  return NULL;
  }

/*****************************************************************************

write_timing:  Writes the timing structure "t".
*****************************************************************************/

VOID write_timing (t)
TIMING *t;                      /* timing                                    */

  {
  DOUBLE percent;               /* percent                                   */
  t->stop=time(_);
```

```
t->main=difftime(t->stop,t->start);
dump("\nTIMING:\n",t);
dump("main = %lf s (%lf %%)\n",t->main,100.);
if (t->main==0.) return;
percent=100./t->main;
dump("get_userinfo = %lf s (%lf %%)\n",t->get_userinfo
,percent*t->get_userinfo);
dump("get_part = %lf s (%lf %%)\n",t->get_part
,percent*t->get_part);
dump("slice_part = %lf s (%lf %%)\n",t->slice_part
,percent*t->slice_part);
dump("boolean_seglist = %lf s (%lf %%)\n",t->boolean_seglist
,percent*t->boolean_seglist);
dump("reorient_seglist = %lf s (%lf %%)\n",t->reorient_seglist
,percent*t->reorient_seglist);
dump("split_seglist = %lf s (%lf %%)\n",t->split_seglist
,percent*t->split_seglist);
dump("new_polylist2 = %lf s (%lf %%)\n",t->new_polylist2
,percent*t->new_polylist2);
dump("degap_polylist = %lf s (%lf %%)\n",t->degap_polylist
,percent*t->degap_polylist);
dump("boolean_polylists = %lf s (%lf %%)\n",t->boolean_polylists
,percent*t->boolean_polylists);
dump("reorient_polylist = %lf s (%lf %%)\n",t->reorient_polylist
,percent*t->reorient_polylist);
dump("union_polylists = %lf s (%lf %%)\n",t->union_polylists
,percent*t->union_polylists);
dump("intersect_polylists = %lf s (%lf %%)\n",t->intersect_polylists
,percent*t->intersect_polylists);
dump("difference_polylists = %lf s (%lf %%)\n",t->difference_polylists
,percent*t->difference_polylists);
dump("layer_compensate = %lf s (%lf %%)\n",t->layer_compensate
,percent*t->layer_compensate);
dump("fill_retract = %lf s (%lf %%)\n",t->fill_retract
,percent*t->fill_retract);
dump("hatch_polylist = %lf s (%lf %%)\n",t->hatch_polylist
,percent*t->hatch_polylist);
dump("sort_tripart = %lf s (%lf %%)\n",t->sort_tripart
,percent*t->sort_tripart);
dump("sort_seglist = %lf s (%lf %%)\n",t->sort_seglist
,percent*t->sort_seglist);
return;
}

/*******************************************************************************

dump_timing:  Dumps the timing structure "t".
*******************************************************************************/

VOID dump_timing (t)
```

```
TIMING *t;                      /* timing                                            */
  {
  dump("TIMING %08lx: ",t);
  if (!t) {dump("\n"); return;}
  dump("main = %lf\n",t->main);
  dump("get_userinfo = %lf\n",t->get_userinfo);
  dump("get_part = %lf\n",t->get_part);
  dump("slice_part = %lf\n",t->slice_part);
  dump("boolean_seglist = %lf\n",t->boolean_seglist);
  dump("reorient_seglist = %lf\n",t->reorient_seglist);
  dump("split_seglist = %lf\n",t->split_seglist);
  dump("new_polylist2 = %lf\n",t->new_polylist2);
  dump("degap_polylist = %lf\n",t->degap_polylist);
  dump("boolean_polylists = %lf\n",t->boolean_polylists);
  dump("reorient_polylist = %lf\n",t->reorient_polylist);
  dump("union_polylists = %lf\n",t->union_polylists);
  dump("intersect_polylists = %lf\n",t->intersect_polylists);
  dump("difference_polylists = %lf\n",t->difference_polylists);
  dump("layer_compensate = %lf\n",t->layer_compensate);
  dump("fill_retract = %lf\n",t->fill_retract);
  dump("hatch_polylist = %lf\n",t->hatch_polylist);
  dump("sort_tripart = %lf\n",t->sort_tripart);
  dump("sort_seglist = %lf\n",t->sort_seglist);
  return;
  }


/*****************************************************************************

STRING:  string
*****************************************************************************/


/*****************************************************************************

get_time:  Puts the elapsed time into a string "s".  Call with NULL to
initialize.  String length must be at least 9 bytes long.  Returns "s".
*****************************************************************************/

CHAR *get_time (s)
CHAR *s;
  {
  static TIME_T time0;          /* intital time                                      */

  LONG secs;                    /* elapsed time in seconds                           */

  LONG mins;                    /* elapsed time in minutes                           */

  LONG hrs;                     /* elapsed time in hours                             */

  if (!s) time0=time(_);
```

```
  else
    {
    secs=(LONG)(difftime(time(_),time0)+.5);
    mins=secs/60;
    secs%=60;
    hrs=mins/60;
    mins%=60;
    sprintf(s,"%021d:%021d:%021d",hrs,mins,secs);
    }
  return s;
  }

/*******************************************************************************

strget:  Returns a copy of the string "s0".
*******************************************************************************/

CHAR *strget (s0)
CHAR *s0;                       /* old string                                   */

  {
  CHAR *s;                      /* new string                                   */

  s=allocate_string(strlen(s0));
  if (!s) errexit("ERROR #0008:  Memory exhausted");
  strcpy(s,s0);
  return s;
  }

/*******************************************************************************

strtail:  Replaces tail of string "s" with a new tail "tail" beginning at
character "c" and returns "s".
*******************************************************************************/

CHAR *strtail (s, c, tail)
CHAR *s;                        /* string                                       */

CHAR c;                         /* first character of old tail                  */

CHAR *tail;                     /* new tail                                     */

  {
  CHAR *p;
  p=strchr(s,c);
  if (!p) strcat(s,tail);
  else strcpy(p,tail);
  return s;
  }
```

```
#ifdef METAWARE_OR_UNIX
/****************************************************************************
strieq:  Returns TRUE if two strings "s" and "t" are equal irrespective of
case, FALSE otherwise.
****************************************************************************/

BOOLEAN strieq (s, t)
CHAR *s;                    /* 1st string                                    */

CHAR *t;                    /* 2nd string                                    */

  {
  for (; *s || *t; s++, t++)
    if (tolower(*s)!=tolower(*t)) return FALSE;
  return TRUE;
  }

/****************************************************************************

strlwr:  Converts a string "s" to lower case and returns it.
****************************************************************************/

CHAR *strlwr (s)
CHAR *s;                    /* string                                        */

  {
  CHAR *t;                  /* lower case string                             */

  if (!s) return s;
  for (t=s; *t; t++) *t=tolower(*t);
  return s;
  }

/****************************************************************************

strupr:  Converts a string "s" to upper case and returns it.
****************************************************************************/

CHAR *strupr (s)
CHAR *s;                    /* string                                        */

  {
  CHAR *t;                  /* upper case string                             */

  if (!s) return s;
  for (t=s; *t; t++) *t=toupper(*t);
  return s;
  }
#endif
```

```
/*******************************************************************************

S1.C:  PARAMETER, PARAMETERLIST, USERINFO, TILEINFO, HATCHINFO,
HATCHINFOLIST, RANGE, RANGELIST, CURE, CURELIST.
*******************************************************************************/

#include "s.h"

/*******************************************************************************

PARAMETER:  command line or argument file parameter
*******************************************************************************/


/*******************************************************************************

new_parameter:  Allocates and initializes a new parameter "p" and returns it.
*******************************************************************************/

PARAMETER *new_parameter (p)
PARAMETER *p;                /* user information block                    */

  {
  INT i;                      /* value index                               */

  if (!p) p=allocate(PARAMETER);
  if (!p) errexit("ERROR #1011:  Memory exhausted");
  p->name=NULL;
  for (i=0; i<10; i++) p->value[i]=NULL;
  p->prev=NULL;
  p->next=NULL;
  p->parent=NULL;
  return p;
  }

/*******************************************************************************

delete_parameter:  Deletes a parameter "p" and returns NULL.
*******************************************************************************/

PARAMETER *delete_parameter (p)
PARAMETER *p;
  {
  PARAMETERLIST *list;
  INT i;                      /* parameter value index                     */

  if (!p) return NULL;
  if (list=p->parent)
    {
    if (p->prev) p->prev->next=p->next;
    else list->first=p->next;
    if (p->next) p->next->prev=p->prev;
```

```
    else list->last=p->prev;
    }
  deallocate_string(p->name);
  for (i=0; p->value[i]; i++) deallocate_string(p->value[i]);
  deallocate(p);
  return NULL;
  }

/*******************************************************************************

get_parameter:  Returns the next parameter from the command line "argv".
*******************************************************************************/

PARAMETER *get_parameter (argv)
CHAR **argv;                  /* command line arguments                        */

  {
  PARAMETER *p;               /* parameter                                     */

  static INT j=1;             /* argument number                               */

  INT i=0;                    /* initial value index                           */

  if (!argv[j]) return NULL;
  if (argv[j][0]!='-')
    errexit("ERROR #1012:  Option \"%s\" missing leading \"-\"", argv[j]);
  if (!isalpha(argv[j][1]))
    errexit("ERROR #1013:  Option \"%s\" does not begin with a letter"
    ,argv[j]);
  p=new_parameter(_);
  p->name=strget(argv[j]+1);
  while (argv[++j])
    {
    if (!argv[j] || argv[j][0]=='-'
      && isalpha(argv[j][1])) break;
    p->value[i++]=strget(argv[j]);
    }
  p->value[i]=NULL;
  return p;
  }

/*******************************************************************************

read_parameter:  Returns the next parameter from a stream "stream".
*******************************************************************************/

PARAMETER *read_parameter (stream)
STREAM *stream;               /* file                                          */

  {
  static CHAR buffer[81]={0};
```

```
  PARAMETER *p;                /* parameter                                  */

  INT i;                       /* value index                                */

  if (!stream) return NULL;
  if (buffer[0]==EOF || buffer[0]==CTRLZ) return NULL;
  if (!buffer[0] && !read_word(stream,buffer)) return NULL;
  if (buffer[0]!='-')
    errexit("ERROR #1014:  Option \"%s\" missing leading \"-\"", buffer);
  if (!isalpha(buffer[1]))
    errexit("ERROR #1015:  Option \"%s\" does not begin with a letter",
buffer);
  p=new_parameter(_);
  p->name=strget(buffer+1);
  for (i=0; ; i++)
    {
    if (!read_word(stream,buffer)) break;
    if (buffer[0]=='-' && isalpha(buffer[1])) break;
    p->value[i]=strget(buffer);
    }
  p->value[i]=NULL;
  return p;
  }

/*****************************************************************************

dump_parameter:  Dumps a parameter "p".
*****************************************************************************/

VOID dump_parameter (p)
PARAMETER *p;                  /* parameter                                  */

  {
  INT i;                       /* parameter index                            */

  dump("PARAMETER %08lx: ",p);
  if (!p) {dump("\n"); return;}
  dump("parent=%lx name=%s\n",p->parent,p->name);
  for (i=0; p->value[i]; i++) dump("value[%d]=%s\n",i,p->value[i]);

  if (p->parent && (p->prev && p!=p->prev->next
  || p->next && p!=p->next->prev))
    errexit("ERROR #1016:  Corrupted list:  prev=%08lx next=%08lx"
    ,p->prev,p->next);
  return;
  }

/*****************************************************************************

write_parameter:  Writes a parameter "p" to a stream "stream" and returns "p".
```

```
*****************************************************************************/

PARAMETER *write_parameter (stream, p)
STREAM *stream;               /* stream                                    */

PARAMETER *p;                 /* parameter                                 */

  {
  INT i;                      /* value index                               */

  INT len;                    /* length of stuff to write                  */

  len=strlen(p->name)+2;
  for (i=0; p->value[i]; i++) len+=strlen(p->value[i])+1;
  if (stream->count+len>79)
    {
    if (ui->carriage && stream->format==BINARY)
      fwrite("\r\n",sizeof(CHAR),2,stream->file);
    else fwrite("\n",sizeof(CHAR),1,stream->file);
    stream->count=0;
    }
  if (stream->count==0)
    {
    fwrite("!",sizeof(CHAR),1,stream->file);
    stream->count=2;
    }
  fwrite("-",sizeof(CHAR),1,stream->file);
  fwrite(p->name,sizeof(CHAR),strlen(p->name),stream->file);
  fwrite(" ",sizeof(CHAR),1,stream->file);
  for (i=0; p->value[i]; i++)
    {
    fwrite(p->value[i],sizeof(CHAR),strlen(p->value[i]),stream->file);
    fwrite(" ",sizeof(CHAR),1,stream->file);
    }
  stream->count+=len;
  return p;
  }

/*****************************************************************************

append_parameter:  Appends a parameter "p" to a parameter list "list" and
returns "list".
*****************************************************************************/

PARAMETERLIST *append_parameter (list, p)
PARAMETERLIST *list;          /* parameter list                            */

PARAMETER *p;                 /* parameter                                 */

  {
  if (!p) return list;
  if (!list->first)
```

```
    {
    list->first=p;
    list->last=p;
    p->prev=NULL;
    }
  else
    {
    p->prev=list->last;
    list->last->next=p;
    list->last=p;
    }
  p->next=NULL;
  p->parent=list;
  return list;
  }

/*****************************************************************************

PARAMETERLIST:  List of command line parameter
*****************************************************************************/


/*****************************************************************************

new_parameterlist:  Allocates and initializes a new parameter
list "list" and returns it.
*****************************************************************************/

PARAMETERLIST *new_parameterlist (list)
PARAMETERLIST *list;              /* parameter information list          */

  {
  if (!list) list=allocate(PARAMETERLIST);
  if (!list) errexit("ERROR #1017:  Memory exhausted");
  list->first=NULL;
  list->last=NULL;
  return list;
  }

/*****************************************************************************

delete_parameterlist:  Deallocates a parameter list "list" and returns NULL.
*****************************************************************************/

PARAMETERLIST *delete_parameterlist (list)
PARAMETERLIST *list;            /* parameter list                        */

  {
  PARAMETER *p;                /* parameter                              */

  if (!list) return NULL;
```

```
  for (p=list->first; p; p=p->next)
    {
    p->parent=NULL;
    delete_parameter(p);
    }
  deallocate(list);
  return NULL;
  }

/*******************************************************************************

dump_parameterlist:  Dumps the parameter list "pl".
*******************************************************************************/

VOID dump_parameterlist (pl)
PARAMETERLIST *pl;              /* parameter list                              */

  {
  PARAMETER *p;                 /* parameter in list                           */

  INT index=0;                  /* parameter index                             */

  dump("PARAMETERLIST %08lx:\n",pl);
  if (!pl) return;
  if (pl->first && !pl->last || pl->last && !pl->first)
    errexit("ERROR #1018:  Corrupted list:  first=%lx last=%lx\n"
    ,pl->first,pl->last);
  if (!pl->first) return;
  if (pl->first->prev || pl->last->next)
    errexit("ERROR #1019:  Corrupted list:  first->prev=%lx first=%lx last=%lx
last->next=%lx\n"
    ,pl->first->prev,pl->first,pl->last,pl->last->next);
  dump("first=%lx last=%lx\n",pl->first,pl->last);
  for (p=pl->first; p; p=p->next)
    {
    dump("#%d ",index++);
    dump_parameter(p);
    if (!p->parent) errexit("ERROR #1020:  Missing parent:  p=%lx\n",p);
    if (p->prev && p!=p->prev->next || p->next &&
      p!=p->next->prev)
      errexit("ERROR #1021:  Corrupted list:  prev=%08lx next=%08lx"
      ,p->prev,p->next);
    if (!p->next && p!=pl->last)
      errexit("ERROR #1022:  Corrupted list:  p=%lx last=%lx\n",p,pl->last);
    } /* p */
  return;
  }


/*******************************************************************************

write_parameterlist:  Writes the parameter list "pl" to a stream "stream" and
```

```
returns "pl".
*****************************************************************************/

PARAMETERLIST *write_parameterlist (stream, pl)
STREAM *stream;               /* stream                                     */

PARAMETERLIST *pl;            /* parameter list                             */

  {
  PARAMETER *p;               /* parameter in list                          */

  if (!stream->file) return pl;
  for (p=pl->first; p; p=p->next) write_parameter(stream,p);
  if (ui->carriage && stream->format==BINARY)
    fwrite("\r\n",sizeof(CHAR),2,stream->file);
  fwrite("\n",sizeof(CHAR),1,stream->file);
  return pl;
  }


/*****************************************************************************

USERINFO:  Specifications for slicing
*****************************************************************************/


/*****************************************************************************

new_userinfo:  Allocates and initializes a new user information
specification "ui" and returns it.
*****************************************************************************/

USERINFO *new_userinfo (ui)
USERINFO *ui;               /* user information block                       */

  {
  RANGE *r;
  if (!ui) ui=(USERINFO*)malloc(sizeof(USERINFO));
  if (!ui) errexit("ERROR #1023:  Memory exhausted");
  ui->version=VERSION;        /* schleiss version number                    */

  ui->data=TRIANGLES;         /* triangle input data                        */

  ui->warn=TRUE;              /* keep running after warnings                */

#ifdef IRIS
  ui->byteorder=1;              /* byte order of machine
*/
#else
  ui->byteorder=0;              /* byte order of machine
*/
#endif
```

```
#ifdef DOS
  ui->carriage=TRUE;          /* carriage return                          */

#else
  ui->carriage=FALSE;         /* carriage return                          */

#endif
  ui->timing=FALSE;           /* do timing study                          */

  ui->reorient=TRUE;          /* reorient misoriented boundaries          */

  ui->debug=0;                /* no debug intermediate results            */

  ui->slcalg=1;               /* slice algorithm                          */

  ui->lboalg=1;               /* layer border offset algorithm no.        */

  ui->dfoalg=1;               /* down fill offset algorithm no.           */

  ui->ufoalg=1;               /* up fill offset algorithm no.             */

  ui->axis=2;                 /* z axis                                   */

  ui->mirror=UNDEF_BOOL;      /* depends on axis                          */

  ui->nz=UNDEF_INT;           /* number of layers                         */

  ui->lmin=1;                 /* initial layer number                     */

  ui->lmax=MAX_INT;           /* final layer number                       */

  ui->resratio=3.;            /* internal resolution ratio                */

  ui->maxdim.z=(DOUBLE)MAX_USHORT; /* max slice units in z dimension      */

  ui->maxdim.xy=ui->resratio*ui->maxdim.z; /* max slice units in x dimension */

  ui->min.x=0.;               /* minimum x of data window                 */

  ui->min.y=0.;               /* minimum y of data window                 */

  ui->min.z=0.;               /* minimum z of data window                 */

  ui->max.x=ui->maxdim.xy;    /* maximum x of data window                 */

  ui->max.y=ui->maxdim.xy;    /* maximum y of data window                 */

  ui->max.z=ui->maxdim.z;     /* maximum z of data window                 */

  ui->window=NULL;            /* bounding rectangle                       */
```

```
ui->res.z=5000.;             /* resolution                               */
ui->res.xy=ui->resratio*ui->res.z;  /* resolution                        */
ui->unit=1.;                 /* units are inches                         */
ui->eps.z=.5;                /* spatial error tolerance in SU            */
ui->eps.xy=ui->resratio*ui->eps.z; /* spatial error tolerance in SU      */
ui->overcure=.006;           /* overcure                                 */
ui->layeronly=FALSE;         /* no fill or fill borders?                 */
ui->bordersonly=FALSE;       /* no fill or hatch?                        */
ui->style=2;                 /* oversize                                 */
ui->raw=FALSE;               /* no processing of triangle cuts?          */
ui->transformation=new_transformation(_);
ui->input=NULL;              /* input file                               */
ui->output=NULL;             /* output file                              */
ui->message=NULL;            /* message file                             */
ui->screen=NULL;             /* screen                                   */
ui->parameter=NULL;          /* parameter file                           */
ui->internal=NULL;           /* internal file                            */
ui->material=NULL;           /* material file                            */
ui->security=NULL;           /* password file                            */
ui->password=0;              /* password                                 */
ui->tileinfo=NULL;           /* tile information                         */
ui->nhatch=2;                /* number of hatch types                    */
ui->layerhatch=new_hatchinfolist(_);
ui->downhatch=new_hatchinfolist(_);
ui->uphatch=new_hatchinfolist(_);
ui->downfill=new_hatchinfolist(_);
ui->upfill=new_hatchinfolist(_);
ui->rangelist=new_rangelist(_);
r=new_range(_,0,0.,.01,0.,0.,0.);
append_range(ui->rangelist,r);
ui->curelist=NULL;
```

```
  ui->parameterlist=NULL;
  return ui;
  }

/*****************************************************************************
delete_userinfo:  Deletes the user information "ui" except streams and returns
"ui".
*****************************************************************************/

USERINFO *delete_userinfo (ui)
USERINFO *ui;                /* user information block                       */

  {
  if (!ui) return NULL;
  delete_polylist(ui->window);
  delete_tileinfo(ui->tileinfo);
  delete_transformation(ui->transformation);
  delete_hatchinfolist(ui->layerhatch);
  delete_hatchinfolist(ui->downhatch);
  delete_hatchinfolist(ui->uphatch);
  delete_hatchinfolist(ui->downfill);
  delete_hatchinfolist(ui->upfill);
  delete_rangelist(ui->rangelist);
  delete_curelist(ui->curelist);
  delete_parameterlist(ui->parameterlist);
  return NULL;
  }

/*****************************************************************
dump_userinfo:  Dumps the user information "ui".
*****************************************************************/
VOID dump_userinfo (ui)
USERINFO *ui;                 /* user information                            */

  {
  dump("USERINFO %08lx:\n",ui);
  if (!ui) return;
  dump("version=%s\n",ui->version);
  dump("password=%lu\n",ui->password);
  dump("data=%s\n",ui->data==TRIANGLES?"triangles"
  :ui->data==SEGMENTS?"segments":ui->data==POLYLINES?"polylines":"?");
  dump("warn=%s\n",btoa(ui->warn));
  dump("byteorder=%d\n",ui->byteorder);
  dump("carriage=%s\n",btoa(ui->carriage));
  dump("timing=%s\n",btoa(ui->timing));
  dump("reorient=%s\n",btoa(ui->reorient));
  dump("debug=%d\n",ui->debug);
  dump("slcalg=%d\n",ui->slcalg);
  dump("lboalg=%d\n",ui->lboalg);
  dump("dfoalg=%d\n",ui->dfoalg);
```

```
  dump("ufoalg=%d\n",ui->ufoalg);
  dump("axis=%s\n",ui->axis==0?"x":ui->axis==1?"y":"z");
  dump("mirror=%s\n",btoa(ui->mirror));
  dump("nz=%d\n",ui->nz);
  dump("lmin=%d\n",ui->lmin);
  dump("lmax=%d\n",ui->lmax);
  dump("min=%lg %lg %lg\n",ui->min);
  dump("max=%lg %lg %lg\n",ui->max);
  dump("window:  ");
  dump_polylist(ui->window);
  dump("maxdim=%lg %lg\n",ui->maxdim);
  dump("res=%lg %lg\n",ui->res);
  dump("resratio=%lg\n",ui->resratio);
  dump("unit=%lg\n",ui->unit);
  dump("eps=%lg %lg\n",ui->eps);
  dump("overcure=%lg\n",ui->overcure);
  dump("layeronly=%s\n",btoa(ui->layeronly));
  dump("bordersonly=%s\n",btoa(ui->bordersonly));
  dump("style=%s\n",ui->style==-2?"undersize":ui->style==-1?"lowcut":
    ui->style==0?"midcut":ui->style==1?"highcut":ui->style==2?"oversize":
    "?");
  dump("raw=%s\n",btoa(ui->raw));
  dump_tileinfo(ui->tileinfo);
  dump("nhatch=%d\n",ui->nhatch);
  dump_transformation(ui->transformation);
  dump_stream(ui->input);
  dump_stream(ui->output);
  dump_stream(ui->message);
  dump_stream(ui->screen);
  dump_stream(ui->parameter);
  dump_stream(ui->internal);
  dump_stream(ui->material);
  dump_stream(ui->security);
  dump_hatchinfolist(ui->layerhatch);
  dump_hatchinfolist(ui->downhatch);
  dump_hatchinfolist(ui->uphatch);
  dump_hatchinfolist(ui->downfill);
  dump_hatchinfolist(ui->upfill);
  dump_rangelist(ui->rangelist);
  dump_curelist(ui->curelist);
  dump_parameterlist(ui->parameterlist);
  return;
  }

/*****************************************************************************

get_userinfo:  Allocates and initializes a new userinfo specification
from the command line "argv" and argument file and returns it.
The parameter input order is:
Occur anywhere:
(help,debug,timing,reorient,bo,lo,style,raw,
slcalg,lboalg,dfoalg,ufoalg,foalg,r,w,m,p,s,i,mirror,
```

```
lmin,lmax,rz,sx,sy,tx,ty,tz,warn,nhatch)
(data) < (sz,scl,rx,ry,axis,x,y,z)
(unit,resratio) < (res)
  < (hx,hy,ha,ht,fx,fy,h,lh,dh,uh,f,df,uf,xmin,xmax,ymin,ymax)
(unit,resratio) < (res) < (eps,overcure,mat)
  < (range,zs,lbo,dfo,ufo,fo)
  < (zmin,zmax)
*****************************************************************************/

USERINFO *get_userinfo (argv)
CHAR **argv;                /* arguments                                    */

  {
  INT format;               /* file format                                  */

  INT byteorder;            /* byte order                                   */

  HATCHINFO *hi;            /* hatch/fill information                       */

  DOUBLE angle;             /* hatch/fill angle                             */

  DOUBLE spacing;           /* hatch/fill spacing                           */

  DOUBLE offset;             /* hatch/fill initial layer offset
*/
  DOUBLE shift;             /* hatch/fill interlayer shift                  */

  DOUBLE size;              /* tile size                                    */

  DOUBLE gap;               /* tile gap                                     */

  DOUBLE value;             /* parameter value                              */

  RANGE *r;                 /* range                                        */

  PARAMETER *p;             /* parameter                                    */

  INT ch;                   /* 1st character of value                       */

  DOUBLE depth;             /* cure depth                                   */

  DOUBLE zmin;              /* minimum z                                    */

  INT lmin;                 /* minimum layer                                */

  POLYLINE *window;         /* bounding window                              */

  BOOLEAN res_state=FALSE;  /* any res_args yet?                            */

  BOOLEAN sz_state=FALSE;   /* any sz_args yet?                             */
```

```
BOOLEAN sec_state=FALSE;     /* any sec_args yet?                                   */
BOOLEAN hx_state=FALSE;      /* any hx_args yet?                                    */
BOOLEAN eps_state=FALSE;     /* any eps_args yet?                                   */
BOOLEAN range_state=FALSE;   /* any range_args yet?                                 */
BOOLEAN zmin_state=FALSE;    /* any zmin_args yet?                                  */
CHAR file_name[81];          /* default file name                                   */
CHAR *res_args="res";
CHAR *sz_args="sz,scl,rx,ry,axis";
CHAR *sec_args="sec";
CHAR *hx_args="hx,hy,ha,ht,fx,fy,h,lh,dh,uh,f,df,uf,xmin,xmax,ymin,ymax";
CHAR *eps_args="eps,overcure,mat";
CHAR *range_args="range,zs,lbo,dfo,ufo";
CHAR *zmin_args="zmin,zmax";
TIME_T time0;                   /* start time for function                          */

time0=time(_);

file_name[0]='\0';
ui=new_userinfo(_);
ui->parameterlist=new_parameterlist(_);
p=new_parameter (_);
append_parameter(ui->parameterlist,p);
p->name=strget("ver");
p->value[0]=strget(ui->version);
r=ui->rangelist->last;
while ((p=read_parameter(ui->parameter)) || (p=get_parameter(argv)))
  {
  append_parameter(ui->parameterlist,p);

  /* MISCELLANEOUS */

  if (strieq(p->name,"help"))
    {
    if (!p->value[0]) {help_screen(ui->version); exit(0);}
    ch=tolower(p->value[0][0]);
    if (ch=='t') help_screen(ui->version);
    else if (ch=='f') exit(0);
    else errexit("ERROR #1024:  Option \"%s\" has a bad value of \"%s\""
    ,p->name,p->value[0]);
    exit(0);
    }
  if (strieq(p->name,"debug"))
    {
    if (!p->value[0]) ui->debug=-1;
    ui->debug=atoi(p->value[0]);
    continue;
```

```
  }
if (strieq(p->name,"timing"))
  {
  if (!p->value[0]) {ui->timing=TRUE; continue;}
  ch=tolower(p->value[0][0]);
  if (ch=='t') ui->timing=TRUE;
  else if (ch=='f') ui->timing=FALSE;
  else errexit("ERROR #1027:  Option \"%s\" has a bad value of \"%s\""
  ,p->name,p->value[0]);
  continue;
  }
if (strieq(p->name,"data"))
  {
  if (sz_state) errexit("ERROR #1028:  Option \"%s\" must preceed %s",
    p->name, sz_args);
  if (!p->value[0])
    errexit("ERROR #1029:  Option \"%s\" needs a value",p->name);
  ch=tolower(p->value[0][0]);
  if (ch=='t') ui->data=TRIANGLES;
  else if (ch=='s') ui->data=SEGMENTS;
  else if (ch=='p') ui->data=POLYLINES;
  else errexit("ERROR #1030:  Option \"%s\" has a bad value of \"%s\""
    ,p->name,p->value[0]);
  continue;
  }
if (strieq(p->name,"warn"))
  {
  if (!p->value[0]) {ui->warn=TRUE; continue;}
  ch=tolower(p->value[0][0]);
  if (ch=='t') ui->warn=TRUE;
  else if (ch=='f') ui->warn=FALSE;
  else errexit("ERROR #1200:  Option \"%s\" has a bad value of \"%s\""
    ,p->name,p->value[0]);
  continue;
  }
if (strieq(p->name,"byteorder"))
  {
  if (!p->value[0])
    errexit("ERROR #1031:  Option \"%s\" needs a value",p->name);
  ui->byteorder=(INT)(atoi(p->value[0])!=0);
  continue;
  }
if (strieq(p->name,"carriage"))
  {
  if (!p->value[0]) {ui->carriage=TRUE; continue;}
  ch=tolower(p->value[0][0]);
  if (ch=='t') ui->carriage=TRUE;
  else if (ch=='f') ui->carriage=FALSE;
  else errexit("ERROR #1035:  Option \"%s\" has a bad value of \"%s\""
    ,p->name,p->value[0]);
  continue;
  }
```

```
if (strieq(p->name,"reorient"))
  {
  if (!p->value[0]) {ui->reorient=TRUE; continue;}
  ch=tolower(p->value[0][0]);
  if (ch=='t') ui->reorient=TRUE;
  else if (ch=='f') ui->reorient=FALSE;
  else errexit("ERROR #1036:  Option \"%s\" has a bad value of \"%s\""
    ,p->name,p->value[0]);
  continue;
  }
if (strieq(p->name,"bo"))
  {
  if (!p->value[0]) {ui->bordersonly=TRUE; continue;}
  ch=tolower(p->value[0][0]);
  if (ch=='t') ui->bordersonly=TRUE;
  else if (ch=='f') ui->bordersonly=FALSE;
  else errexit("ERROR #1037:  Option \"%s\" has a bad value of \"%s\""
    ,p->name,p->value[0]);
  continue;
  }
if (strieq(p->name,"lo"))
  {
  if (!p->value[0]) {ui->layeronly=TRUE; continue;}
  ch=tolower(p->value[0][0]);
  if (ch=='t') ui->layeronly=TRUE;
  else if (ch=='f') ui->layeronly=FALSE;
  else errexit("ERROR #1038:  Option \"%s\" has a bad value of \"%s\""
    ,p->name,p->value[0]);
  continue;
  }
if (strieq(p->name,"xmin"))
  {
  hx_state=TRUE;
  if (!p->value[0])
    errexit("ERROR #1039:  Option \"%s\" needs a value",p->name);
  ui->min.x=ctos(atof(p->value[0]),X);
  continue;
  }
if (strieq(p->name,"xmax"))
  {
  hx_state=TRUE;
  if (!p->value[0])
    errexit("ERROR #1040:  Option \"%s\" needs a value",p->name);
  ui->max.x=ctos(atof(p->value[0]),X);
  continue;
  }
if (strieq(p->name,"ymin"))
  {
  hx_state=TRUE;
  if (!p->value[0])
    errexit("ERROR #1041:  Option \"%s\" needs a value",p->name);
  ui->min.y=ctos(atof(p->value[0]),Y);
```

```
      continue;
    }
  if (strieq(p->name,"ymax"))
    {
    hx_state=TRUE;
    if (!p->value[0])
      errexit("ERROR #1042:  Option \"%s\" needs a value",p->name);
    ui->max.y=ctos(atof(p->value[0]),Y);
    continue;
    }
  if (strieq(p->name,"zmin"))
    {
    zmin_state=TRUE;
    if (!p->value[0])
      errexit("ERROR #1043:  Option \"%s\" needs a value",p->name);
    ui->min.z=ctos(atof(p->value[0]),Z,TRUE);
    continue;
    }
  if (strieq(p->name,"zmax"))
    {
    zmin_state=TRUE;
    if (!p->value[0])
      errexit("ERROR #1044:  Option \"%s\" needs a value",p->name);
    ui->max.z=ctos(atof(p->value[0]),Z,TRUE);
    continue;
    }
  if (strieq(p->name,"lmin"))
    {
    if (!p->value[0])
      errexit("ERROR #1045:  Option \"%s\" needs a value",p->name);
    ui->lmin=atoi(p->value[0]);
    if (ui->lmin<1) ui->lmin=1;
    continue;
    }
  if (strieq(p->name,"lmax"))
    {
    if (!p->value[0])
      errexit("ERROR #1046:  Option \"%s\" needs a value",p->name);
    ui->lmax=atoi(p->value[0]);
    continue;
    }
  if (strieq(p->name,"nhatch"))
    {
    if (!p->value[0])
      errexit("ERROR #1046:  Option \"%s\" needs a value",p->name);
    ui->nhatch=atoi(p->value[0]);
    continue;
    }
  if (strieq(p->name,"style"))
    {
    if (!p->value[0])
      errexit("ERROR #1047:  Option \"%s\" needs a value",p->name);
```

```
  ch=tolower(p->value[0][0]);
  if (ch=='u') ui->style=-2;
  else if (ch=='l') ui->style=-1;
  else if (ch=='m') ui->style=0;
  else if (ch=='h') ui->style=1;
  else if (ch=='o') ui->style=2;
  else errexit("ERROR #1048:  Option \"%s\" has a bad value of \"%s\""
    ,p->name,p->value[0]);
  continue;
  }
if (strieq(p->name,"raw"))
  {
  if (!p->value[0]) {ui->raw=TRUE; continue;}
  ch=tolower(p->value[0][0]);
  if (ch=='t') ui->raw=TRUE;
  else if (ch=='f') ui->raw=FALSE;
  else errexit("ERROR #1049:  Option \"%s\" has a bad value of \"%s\""
    ,p->name,p->value[0]);
  continue;
  }
if (strieq(p->name,"res"))
  {
  res_state=TRUE;
  if (hx_state || eps_state || range_state || zmin_state)
    errexit("ERROR #1050:  Option \"%s\" must preceed %s,%s,%s,%s",
    p->name, hx_args, eps_args, range_args, zmin_args);
  if (!p->value[0])
    errexit("ERROR #1051:  Option \"%s\" needs a value",p->name);
  ui->res.z=ui->unit*atof(p->value[0]);
  ui->res.xy=ui->resratio*ui->res.z;
  ui->overcure*=ui->res.z;
  continue;
  }
if (strieq(p->name,"tile"))
  {
  if (p->value[0]) size=ctos(atof(p->value[0]),X);
  else size=0.;
  if (p->value[1]) gap=ctos(atof(p->value[1]),X);
  else gap=0.;
  if (p->value[2]) offset=ctos(atof(p->value[2]),X);
  else offset=0.;
  if (p->value[3]) shift=ctos(atof(p->value[3]),X);
  else shift=0.;
  ui->tileinfo=new_tileinfo(_,size,gap,offset,shift);
  continue;
  }
if (strieq(p->name,"resratio"))
  {
  if (res_state || hx_state || eps_state || range_state || zmin_state)
    errexit("ERROR #1052:  Option \"%s\" must preceed %s,%s,%s,%s,%s",
    p->name, res_args, hx_args, eps_args, range_args, zmin_args);
  if (!p->value[0])
```

```
    errexit("ERROR #1053:  Option \"%s\" needs a value",p->name);
  value=ui->resratio;     /* previous resolution ratio                          */

  ui->resratio=atof(p->value[0]);
  ui->maxdim.xy*=ui->resratio/value;
  ui->res.xy*=ui->resratio/value;
  ui->eps.xy*=ui->resratio/value;
  ui->max.x=ui->maxdim.xy;
  ui->max.y=ui->maxdim.xy;
  continue;
  }
if (strieq(p->name,"overcure"))
  {
  eps_state=TRUE;
  if (range_state || zmin_state)
    errexit("ERROR #1054:  Option \"%s\" must preceed %s,%s"
    , p->name, range_args, zmin_state);
  if (!p->value[0])
    errexit("ERROR #1055:  Option \"%s\" needs a value",p->name);
  continue;
  }
if (strieq(p->name,"unit"))
  {
  if (res_state || hx_state || eps_state || range_state || zmin_state)
    errexit("ERROR #1056:  Option \"%s\" must preceed %s,%s,%s,%s,%s",
    p->name, res_args, hx_args, eps_args, range_args, zmin_args);
  if (!p->value[0])
    errexit("ERROR #1057:  Option \"%s\" needs a value",p->name);
  ch=tolower(p->value[0][0]);
  if (ch=='i') ui->unit=1.;
  else if (ch=='m') ui->unit=.0254;
  else if (ch=='c') ui->unit=.254;
  else ui->unit=atof(p->value[0]);
  continue;
  }
if (strieq(p->name,"eps"))
  {
  eps_state=TRUE;
  if (range_state || zmin_state)
    errexit("ERROR #1058:  Option \"%s\" must preceed %s,%s"
    , p->name, range_args, zmin_state);
  if (!p->value[0])
    errexit("ERROR #1059:  Option \"%s\" needs a value",p->name);
  ui->eps.z=ui->res.z*atof(p->value[0]);
  ui->eps.xy=ui->res.xy*atof(p->value[0]);
  continue;
  }
if (strieq(p->name,"slcalg"))
  {
  if (!p->value[0])
    errexit("ERROR #1060:  Option \"%s\" needs a value",p->name);
  ui->slcalg=atoi(p->value[0]);
```

```
continue;
}
if (strieq(p->name,"lboalg"))
{
if (!p->value[0])
errexit("ERROR #1060:  Option \"%s\" needs a value",p->name);
ui->lboalg=atoi(p->value[0]);
continue;
}
if (strieq(p->name,"dfoalg"))
{
if (!p->value[0])
errexit("ERROR #1061:  Option \"%s\" needs a value",p->name);
ui->dfoalg=atoi(p->value[0]);
continue;
}
if (strieq(p->name,"ufoalg"))
{
if (!p->value[0])
errexit("ERROR #1062:  Option \"%s\" needs a value",p->name);
ui->ufoalg=atoi(p->value[0]);
continue;
}
if (strieq(p->name,"foalg"))
{
if (!p->value[0])
errexit("ERROR #1062:  Option \"%s\" needs a value",p->name);
ui->dfoalg=ui->ufoalg=atoi(p->value[0]);
continue;
}
/* FILES */

if (strieq(p->name,"r"))
{
if (!p->value[0])
errexit("ERROR #1063:  Option \"%s\" needs a value",p->name);
if (ui->input && streq(ui->input->name,p->value[0]))
errexit("ERROR #1064:  \"%s\" is a duplicate file name",p->value[0]);
if (p->value[1])
{
if (tolower(*p->value[1])=='a') format=ASCII;
else format=BINARY;
}
else format=0;
if (p->value[2]) byteorder=(INT)(atoi(p->value[2])!=0);
else byteorder=-1;
ui->input=new_stream(_,p->value[0],TRUE,format,byteorder);
strcpy(file_name,p->value[0]);
continue;
}
if (strieq(p->name,"mat"))
{
```

```
      eps_state=TRUE;
      if (range_state || zmin_state)
        errexit("ERROR #1065:  Option \"%s\" must preceed %s,%s"
        , p->name, range_args, zmin_state);
      if (!p->value[0])
        errexit("ERROR #1066:  Option \"%s\" needs a value",p->name);
      if (ui->material && streq(ui->material->name,p->value[0]))
        errexit("ERROR #1067:  \"%s\" is a duplicate file name",p->value[0]);
      ui->material=new_stream(_,p->value[0],TRUE,ASCII,0);
      ui->curelist=read_curelist(ui->material);
      continue;
      }
    if (strieq(p->name,"sec"))
      {
      sec_state=TRUE;
      if (!p->value[0])
        errexit("ERROR #1068:  Option \"%s\" needs a value",p->name);
      if (ui->security && streq(ui->security->name,p->value[0]))
        errexit("ERROR #1069:  \"%s\" is a duplicate file name",p->value[0]);
      ui->security=new_stream(_,p->value[0],TRUE,ASCII,0);
      if (fscanf(ui->security->file,"%lu",&ui->password)<1)
        errexit("ERROR #1071:  Error reading from security file %s"
        ,ui->security->name);
      continue;
      }
    if (strieq(p->name,"w"))
      {
      if (!p->value[0])
        {
        if (!*file_name) errexit("ERROR #1072:  Option \"%s\" needs a
value",p->name);
        ui->output=new_stream(_,strtail(file_name,'.',".sli"),FALSE,BINARY,0);

        continue;
        }
      else
        {
        if (ui->output && streq(ui->output->name,p->value[0]))
          errexit("ERROR #1073:  \"%s\" is a duplicate file name",p->value[0]);

        if (p->value[1] && tolower(*p->value[1])=='a') format=ASCII;
        else format=BINARY;
        if (p->value[2]) byteorder=(INT)(atoi(p->value[2])!=0);
        else byteorder=0;
        ui->output=new_stream(_,p->value[0],FALSE,format,byteorder);
        }
      continue;
      }
    if (strieq(p->name,"m"))
      {
      if (!p->value[0])
        {
```

```
        if (!*file_name)
          errexit("ERROR #1074:  Option \"%s\" needs a value",p->name);
        ui->message=new_stream(_,strtail(file_name,'.',".msg"),FALSE,ASCII,0);

        }
      else
        {
        if (ui->message && streq(ui->message->name,p->value[0]))
          errexit("ERROR #1075:  \"%s\" is a duplicate file name",p->value[0]);

        ui->message=new_stream(_,p->value[0],FALSE,ASCII,0);
        }
      continue;
      }
    if (strieq(p->name,"p"))
      {
      if (!p->value[0])
        {
        if (!*file_name) errexit("ERROR #1076:  Option \"%s\" needs a
value",p->name);
        ui->parameter=new_stream(_,strtail(file_name,'.',".arg"),TRUE,ASCII,0);

        }
      else
        {
        ch=tolower(p->value[0][0]);
        if (ch=='f')
          {if (ui->parameter) ui->parameter=delete_stream(ui->parameter);}
        else if (ui->parameter && streq(ui->parameter->name,p->value[0]))
          errexit("ERROR #1077:  \"%s\" is a duplicate file name",p->value[0]);

        else ui->parameter=new_stream(_,p->value[0],TRUE,ASCII,0);
        }
      continue;
      }
    if (strieq(p->name,"s"))
      {
      if (!p->value[0])
        {
        ui->screen=new_stream(_,"stdout",FALSE,ASCII,0);
        continue;
        }
      ch=tolower(p->value[0][0]);
      if (ch=='t') ui->screen=new_stream(_,"stdout",FALSE,ASCII,0);
      else if (ch=='f') {if (ui->screen) ui->screen=delete_stream(ui->screen);}

      else errexit("ERROR #1078:  Option \"%s\" has a bad value of \"%s\""
      ,p->name,p->value[0]);
      continue;
      }
    if (strieq(p->name,"i"))
      {
```

```
  if (!p->value[0])
    {
    if (ui->internal) delete_stream(ui->internal);
    ui->internal=new_stream(_,"slice.tmp",FALSE,BINARY,ui->byteorder);
    }
  else
    {
    if (ui->internal && streq(ui->internal->name,p->value[0]))
      errexit("ERROR #1080:  \"%s\" is a duplicate file name",p->value[0]);

    ui->internal=new_stream(_,p->value[0],FALSE,BINARY,ui->byteorder);
    }
  continue;
  }

/* HATCH AND FILL */

if (strieq(p->name,"hx") || strieq(p->name,"hy")
|| strieq(p->name,"ha") || strieq(p->name,"ht")
|| strieq(p->name,"fx") || strieq(p->name,"fy"))
  {
  hx_state=TRUE;
  if (p->value[0]) spacing=atof(p->value[0]);
  else if (p->name[0]=='h') spacing=.05; /* hatch */
  else spacing=.005;                     /* fill */
  spacing=ctos(spacing,X);
  if (p->value[1]) offset=ctos(atof(p->value[1]),X);
  else offset=0.;
  if (p->value[2]) shift=ctos(atof(p->value[2]),X);
  else shift=0.;
  if (strieq(p->name,"hx"))
    {
    hi=new_hatchinfo(_,0.,spacing,offset,shift);
    append_hatchinfo(ui->layerhatch,hi);
    hi=new_hatchinfo1(_,hi);
    append_hatchinfo(ui->downhatch,hi);
    hi=new_hatchinfo1(_,hi);
    append_hatchinfo(ui->uphatch,hi);
    continue;
    }
  if (strieq(p->name,"hy"))
    {
    hi=new_hatchinfo(_,90.,spacing,offset,shift);
    append_hatchinfo(ui->layerhatch,hi);
    hi=new_hatchinfo1(_,hi);
    append_hatchinfo(ui->downhatch,hi);
    hi=new_hatchinfo1(_,hi);
    append_hatchinfo(ui->uphatch,hi);
    continue;
    }
  if (strieq(p->name,"ha"))
    {
```

```
  hi=new_hatchinfo(_,60.,spacing,offset,shift);
  append_hatchinfo(ui->layerhatch,hi);
  hi=new_hatchinfo1(_,hi);
  append_hatchinfo(ui->downhatch,hi);
  hi=new_hatchinfo1(_,hi);
  append_hatchinfo(ui->uphatch,hi);
  hi=new_hatchinfo(_,120.,spacing,offset,shift);
  append_hatchinfo(ui->layerhatch,hi);
  hi=new_hatchinfo1(_,hi);
  append_hatchinfo(ui->downhatch,hi);
  hi=new_hatchinfo1(_,hi);
  append_hatchinfo(ui->uphatch,hi);
  continue;
  }
if (strieq(p->name,"ht"))
  {
  hi=new_hatchinfo(_,0.,spacing,offset,shift);
  append_hatchinfo(ui->layerhatch,hi);
  hi=new_hatchinfo1(_,hi);
  append_hatchinfo(ui->downhatch,hi);
  hi=new_hatchinfo1(_,hi);
  append_hatchinfo(ui->uphatch,hi);
  hi=new_hatchinfo(_,60.,spacing,offset,shift);
  append_hatchinfo(ui->layerhatch,hi);
  hi=new_hatchinfo1(_,hi);
  append_hatchinfo(ui->downhatch,hi);
  hi=new_hatchinfo1(_,hi);
  append_hatchinfo(ui->uphatch,hi);
  hi=new_hatchinfo(_,120.,spacing,offset,shift);
  append_hatchinfo(ui->layerhatch,hi);
  hi=new_hatchinfo1(_,hi);
  append_hatchinfo(ui->downhatch,hi);
  hi=new_hatchinfo1(_,hi);
  append_hatchinfo(ui->uphatch,hi);
  continue;
  }
if (strieq(p->name,"fx"))
  {
  hi=new_hatchinfo(_,0.,spacing,offset,shift);
  append_hatchinfo(ui->downfill,hi);
  hi=new_hatchinfo1(_,hi);
  append_hatchinfo(ui->upfill,hi);
  continue;
  }
if (strieq(p->name,"fy"))
  {
  hi=new_hatchinfo(_,90.,spacing,offset,shift);
  append_hatchinfo(ui->downfill,hi);
  hi=new_hatchinfo1(_,hi);
  append_hatchinfo(ui->upfill,hi);
  continue;
  }
```

```
  }
if (strieq(p->name,"h") || strieq(p->name,"lh") ||
  strieq(p->name,"dh") || strieq(p->name,"uh") ||
  strieq(p->name,"f") || strieq(p->name,"df") ||
  strieq(p->name,"uf"))
  {
  hx_state=TRUE;
  if (p->value[0]) angle=atof(p->value[0]);
  else angle=0.;
  if (p->value[1]) spacing=atof(p->value[1]);
  else if (p->name[0]=='h' || p->name[1]=='h') spacing=.05;
  else spacing=.005;
  spacing=ctos(spacing,X);
  if (p->value[2]) offset=ctos(atof(p->value[2]),X);
  else offset=0.;
  if (p->value[3]) shift=ctos(atof(p->value[3]),X);
  else shift=0.;
  if (strieq(p->name,"h"))
    {
    hi=new_hatchinfo(_,angle,spacing,offset,shift);
    append_hatchinfo(ui->layerhatch,hi);
    hi=new_hatchinfo1(_,hi);
    append_hatchinfo(ui->downhatch,hi);
    hi=new_hatchinfo1(_,hi);
    append_hatchinfo(ui->uphatch,hi);
    continue;
    }
  if (strieq(p->name,"lh"))
    {
    hi=new_hatchinfo(_,angle,spacing,offset,shift);
    append_hatchinfo(ui->layerhatch,hi);
    continue;
    }
  if (strieq(p->name,"dh"))
    {
    hi=new_hatchinfo(_,angle,spacing,offset,shift);
    append_hatchinfo(ui->downhatch,hi);
    continue;
    }
  if (strieq(p->name,"uh"))
    {
    hi=new_hatchinfo(_,angle,spacing,offset,shift);
    append_hatchinfo(ui->uphatch,hi);
    continue;
    }
  if (strieq(p->name,"f"))
    {
    hi=new_hatchinfo(_,angle,spacing,offset,shift);
    append_hatchinfo(ui->downfill,hi);
    hi=new_hatchinfo1(_,hi);
    append_hatchinfo(ui->upfill,hi);
    continue;
```

```
        }
      if (strieq(p->name,"df"))
        {
        hi=new_hatchinfo(_,angle,spacing,offset,shift);
        append_hatchinfo(ui->downfill,hi);
        continue;
        }
      if (strieq(p->name,"uf"))
        {
        hi=new_hatchinfo(_,angle,spacing,offset,shift);
        append_hatchinfo(ui->upfill,hi);
        continue;
        }
      }

    /* TRANSFORMATIONS */

    if (strieq(p->name,"axis"))
      {
      sz_state=TRUE;
      if (!p->value[0])
        errexit("ERROR #1082:  Option \"%s\" needs a value",p->name);
      ch=tolower(p->value[0][0]);
      if (ch=='x') ui->axis=0;
      else if (ch=='y') ui->axis=1;
      else if (ch=='z') ui->axis=2;
      else errexit("ERROR #1083:  Option \"%s\" has a bad value of \"%s\""
        ,p->name,p->value[0]);
      if (ui->data!=TRIANGLES && ui->axis!=2)
        errexit("ERROR #1084:  Only z slice axis permitted for nontriangular
data\n");
      continue;
      }
    if (strieq(p->name,"x"))  /* same as -axis x                     */
      {
      sz_state=TRUE;
      ui->axis=0;
      if (ui->data!=TRIANGLES)
        errexit("ERROR #1085:  Only z slice axis permitted for nontriangular
data\n");
      continue;
      }
    if (strieq(p->name,"y"))  /* same as -axis y                     */
      {
      sz_state=TRUE;
      ui->axis=1;
      if (ui->data!=TRIANGLES)
        errexit("ERROR #1086:  Only z slice axis permitted for nontriangular
data\n");
      continue;
      }
    if (strieq(p->name,"z"))  /* same as -axis z                     */
```

```
      {
      sz_state=TRUE;
      ui->axis=2;
      continue;
      }
    if (strieq(p->name,"mirror"))
      {
      if (!p->value[0]) {ui->mirror=TRUE; continue;}
      ch=tolower(p->value[0][0]);
      if (ch=='t') ui->mirror=TRUE;
      else if (ch=='f') ui->mirror=FALSE;
      else errexit("ERROR #1087:  Option \"%s\" has a bad value of \"%s\""
        ,p->name,p->value[0]);
      continue;
      }
    if (strieq(p->name,"rx"))
      {
      sz_state=TRUE;
      if (!p->value[0])
        errexit("ERROR #1088:  Option \"%s\" needs a value",p->name);
      if (ui->data!=TRIANGLES)
        errexit("ERROR #1089:  Option \"rx\" not allowed with nontriangular
data\n");
      update_transformation(ui->transformation,
        atof(p->value[0]),0.,0.,1.,1.,1.,0.,0.,0.);
      continue;
      }
    if (strieq(p->name,"ry"))
      {
      sz_state=TRUE;
      if (!p->value[0])
        errexit("ERROR #1090:  Option \"%s\" needs a value",p->name);
      if (ui->data!=TRIANGLES)
        errexit("ERROR #1091:  Option \"ry\" not allowed with nontriangular
data\n");
      update_transformation(ui->transformation,
        0.,atof(p->value[0]),0.,1.,1.,1.,0.,0.,0.);
      continue;
      }
    if (strieq(p->name,"rz"))
      {
      if (!p->value[0])
        errexit("ERROR #1092:  Option \"%s\" needs a value",p->name);
      update_transformation(ui->transformation,
        0.,0.,atof(p->value[0]),1.,1.,1.,0.,0.,0.);
      continue;
      }
    if (strieq(p->name,"sx"))
      {
      if (!p->value[0])
        errexit("ERROR #1093:  Option \"%s\" needs a value",p->name);
      update_transformation(ui->transformation,
```

```
        0.,0.,0.,atof(p->value[0]),1.,1.,0.,0.,0.);
      continue;
      }
    if (strieq(p->name,"sy"))
      {
      if (!p->value[0])
        errexit("ERROR #1094:  Option \"%s\" needs a value",p->name);
      update_transformation(ui->transformation,
        0.,0.,0.,1.,atof(p->value[0]),1.,0.,0.,0.);
      continue;
      }
    if (strieq(p->name,"sz"))
      {
      sz_state=TRUE;
      if (!p->value[0])
        errexit("ERROR #1095:  Option \"%s\" needs a value",p->name);
      value=atof(p->value[0]);
      if (value<0. && ui->data!=TRIANGLES)
        errexit("ERROR #1096:  Negative \"sz\" not allowed with nontriangular
data");
      update_transformation(ui->transformation
      ,0.,0.,0.,1.,1.,value,0.,0.,0.);
      continue;
      }
    if (strieq(p->name,"scl"))
      {
      sz_state=TRUE;
      if (!p->value[0])
        errexit("ERROR #1095:  Option \"%s\" needs a value",p->name);
      value=atof(p->value[0]);
      if (value<0. && ui->data!=TRIANGLES)
        errexit("ERROR #1096:  Negative \"scl\" not allowed with nontriangular
data");
      update_transformation(ui->transformation
      ,0.,0.,0.,value,value,value,0.,0.,0.);
      continue;
      }
    if (strieq(p->name,"tx"))
      {
      if (!p->value[0])
        errexit("ERROR #1097:  Option \"%s\" needs a value",p->name);
      update_transformation(ui->transformation,
        0.,0.,0.,1.,1.,1.,atof(p->value[0]),0.,0.);
      continue;
      }
    if (strieq(p->name,"ty"))
      {
      if (!p->value[0])
        errexit("ERROR #1098:  Option \"%s\" needs a value",p->name);
      update_transformation(ui->transformation,
        0.,0.,0.,1.,1.,1.,0.,atof(p->value[0]),0.);
      continue;
```

```
  }
if (strieq(p->name,"tz"))
  {
  if (!p->value[0])
    errexit("ERROR #1099:  Option \"%s\" needs a value",p->name);
  update_transformation(ui->transformation,
    0.,0.,0.,1.,1.,1.,0.,0.,atof(p->value[0]));
  continue;
  }

/* RANGE */

if (strieq(p->name,"range"))
  {
  range_state=TRUE;
  if (zmin_state) errexit("ERROR #1100:  Option \"%s\" must preceed %s",
    p->name, zmin_args);
  zmin=ctos(atof(p->value[0]),Z,TRUE);
  if (zmin<r->zmin)
    errexit("ERROR #1101:  Range \"%s\" is out of order\n",p->value[0]);
  lmin=r->lmin+(INT)round((zmin-r->zmin)/r->zs);
  r=new_range(_,lmin,zmin,r->zs,r->lbo,r->dfo,r->ufo);
  append_range(ui->rangelist,r);
  continue;
  }
if (strieq(p->name,"zs"))
  {
  range_state=TRUE;
  if (zmin_state)
     errexit("ERROR #1102:  Option \"%s\" must preceed %s"
     , p->name, zmin_args);
  if (!p->value[0])
    errexit("ERROR #1103:  Option \"%s\" needs a value",p->name);
  r->zs=ctos(atof(p->value[0]),Z,FALSE);
  continue;
  }
if (strieq(p->name,"lbo"))
  {
  range_state=TRUE;
  if (zmin_state)
     errexit("ERROR #1104:  Option \"%s\" must preceed %s"
     , p->name, zmin_args);
  if (!p->value[0])
    {
    if (!ui->material) errexit("ERROR #1105:  No material file");
    depth=r->zs+ui->overcure;
    r->lbo=.5*get_cure_width(ui->curelist,depth);
    }
  else r->lbo=ctos(atof(p->value[0]),X);
  continue;
  }
if (strieq(p->name,"dfo"))
```

```
      {
      range_state=TRUE;
      if (zmin_state)
         errexit("ERROR #1106:  Option \"%s\" must preceed %s"
         , p->name, zmin_args);
      if (!p->value[0])
        {
        if (!ui->material) errexit("ERROR #1107:  No material file");
        depth=r->zs+ui->overcure;
        r->dfo=.5*get_cure_width(ui->curelist,depth);
        }
      else r->dfo=ctos(atof(p->value[0]),X);
      continue;
      }
    if (strieq(p->name,"ufo"))
      {
      range_state=TRUE;
      if (zmin_state)
         errexit("ERROR #1108:  Option \"%s\" must preceed %s"
         , p->name, zmin_args);
      if (!p->value[0])
        {
        if (!ui->material) errexit("ERROR #1109:  No material file");
        depth=r->zs+ui->overcure;
        r->ufo=.5*get_cure_width(ui->curelist,depth);
        }
      else r->ufo=ctos(atof(p->value[0]),X);
      continue;
      }
    if (strieq(p->name,"fo"))
      {
      range_state=TRUE;
      if (zmin_state)
         errexit("ERROR #1108:  Option \"%s\" must preceed %s"
         , p->name, zmin_args);
      if (!p->value[0])
        {
        if (!ui->material) errexit("ERROR #1109:  No material file");
        depth=r->zs+ui->overcure;
        r->dfo=r->ufo=.5*get_cure_width(ui->curelist,depth);
        }
      else r->dfo=r->ufo=ctos(atof(p->value[0]),X);
      continue;
      }
    errexit("ERROR #1110:  Option \"%s\" is unknown",p->name);
    }

#ifdef SEC
  if (!ui->password)
    {
    ui->security=new_stream(_,"/usr/bin/T1",TRUE,ASCII,0);
    if (fscanf(ui->security->file,"%lu",&ui->password)<1)
```

```
      errexit("ERROR #1111:  Error reading password file %s"
      ,ui->security->name);
    }
  else if (!ui->security)
    {
    ui->security=new_stream(_,"/usr/bin/T1",FALSE,ASCII,0);
    if (fprintf(ui->security->file,"%lu",ui->password)<1)
      errexit("ERROR #1112:  Error writing to security file %s"
      ,ui->security->name);
    }
#endif
  if (ui->raw)
    {
    ui->layeronly=TRUE;
    ui->bordersonly=TRUE;
    if (ui->style< -1 || ui->style>1) ui->style=-1;
    ui->reorient=FALSE;
    ui->lboalg=0;
    ui->dfoalg=0;
    ui->ufoalg=0;
    }

  if (r->zs==UNDEF_DBL) r->zs=.01/ui->unit;
  if (ui->mirror==UNDEF_BOOL) ui->mirror=(ui->axis!=2);

  if (!ui->screen) ui->screen=new_stream(_,"stdout",FALSE,ASCII,0);
  if (!ui->input) errexit("ERROR:  No input file");
  if (ui->input->byteorder<0 && ui->data==TRIANGLES) ui->input->byteorder=0;
  if (!ui->output)
    ui->output=new_stream(_,strtail(file_name,'.',".sli"),FALSE,ASCII,0);
  if (!ui->message)
    ui->message=new_stream(_,strtail(file_name,'.',".msg"),FALSE,ASCII,0);
  if (!ui->internal)
    ui->internal=new_stream(_,"slice.tmp",FALSE,BINARY,ui->byteorder);


  if (ui->layerhatch->first && ui->bordersonly)
    {
    delete_hatchinfolist(ui->layerhatch);
    ui->layerhatch=new_hatchinfolist(_);
    }
  if (ui->downhatch->first && (ui->bordersonly || ui->layeronly))
    {
    delete_hatchinfolist(ui->downhatch);
    ui->downhatch=new_hatchinfolist(_);
    }
  if (ui->uphatch->first && (ui->bordersonly || ui->layeronly))
    {
    delete_hatchinfolist(ui->uphatch);
    ui->uphatch=new_hatchinfolist(_);
    }
  if (ui->downfill->first && (ui->bordersonly || ui->layeronly))
```

```
    {
    delete_hatchinfolist(ui->downfill);
    ui->downfill=new_hatchinfolist(_);
    }
  if (ui->upfill->first && (ui->bordersonly || ui->layeronly))
    {
    delete_hatchinfolist(ui->upfill);
    ui->upfill=new_hatchinfolist(_);
    }
  if (ui->min.x>0. || ui->min.y>0. || ui->max.x<ui->maxdim.xy
  || ui->max.y<ui->maxdim.xy)
    {
    ui->window=new_polylist(_,0.,0.,0.);
    window=new_polyline(_);
    append_vertex(window,new_vertex(_,ui->min.x,ui->min.y,_,0),TRUE);
    append_vertex(window,new_vertex(_,ui->max.x,ui->min.y,_,0),TRUE);
    append_vertex(window,new_vertex(_,ui->max.x,ui->max.y,_,0),TRUE);
    append_vertex(window,new_vertex(_,ui->min.x,ui->max.y,_,0),TRUE);
    close_polyline(window);
    append_polyline(ui->window,window);
    }
  if (ui->timing) timing->get_userinfo+=difftime(time(_),time0);
  return ui;
  }

/*****************************************************************************

update_userinfo:  Updates the start and stop layer in the user information
block "ui" using the extents of the part "part" and returns "ui".
*****************************************************************************/

USERINFO *update_userinfo (ui, part)
USERINFO *ui;                /* user information block                      */

PART *part;                  /* part                                        */

  {
  RANGE *r;                  /* range block                                 */

  DOUBLE zmin;               /* minimum z in range                          */

  DOUBLE zmax;               /* maximum z in range                          */

  INT lmin;                  /* low layer number cutoff                     */


  zmin=part->min.z;
  lmin=get_layer_number(ui->rangelist,zmin,1);
  for (r=ui->rangelist->first; r; r=r->next) r->lmin-=lmin-1;

  if (ui->min.z<zmin) ui->min.z=zmin;
```

```
  zmin=get_zlevel(ui->rangelist,ui->lmin,0.);
  if (ui->min.z<zmin) ui->min.z=zmin;
  ui->lmin=get_layer_number(ui->rangelist,ui->min.z,1);

  zmax=part->max.z;
  if (ui->max.z>zmax) ui->max.z=zmax;
  zmax=get_zlevel(ui->rangelist,ui->lmax,1.);
  if (ui->max.z>zmax) ui->max.z=zmax;
  ui->lmax=get_layer_number(ui->rangelist,ui->max.z,-1);
  ui->nz=ui->lmax-ui->lmin+1;
  return ui;
  }

/*******************************************************************************

write_userinfo:  Writes out the user information "ui" needed by the MERGE
program to the output file "stream" and returns "ui".
*******************************************************************************/

USERINFO *write_userinfo (stream, ui)
STREAM *stream;              /* stream                                        */

USERINFO *ui;                /* user information block                        */

  {
  char buffer[81];           /* string buffer                                 */

  fwrite("!SLICE=",sizeof(CHAR),7,stream->file);
  fwrite(" -VER ",sizeof(CHAR),6,stream->file);
  fwrite(ui->version,sizeof(CHAR),strlen(ui->version),stream->file);
  fwrite(" -RES ",sizeof(CHAR),6,stream->file);
  sprintf(buffer,"%.01f",ui->res.z);
  fwrite(buffer,sizeof(CHAR),strlen(buffer),stream->file);
  fwrite(" -ZS ",sizeof(CHAR),5,stream->file);
  sprintf(buffer,"%.01f",ui->rangelist->first->zs);
  fwrite(buffer,sizeof(CHAR),strlen(buffer),stream->file);
  if (ui->axis==X) fwrite(" -X",sizeof(CHAR),3,stream->file);
  else if (ui->axis==Y) fwrite(" -Y",sizeof(CHAR),3,stream->file);
  if (ui->carriage && stream->format==BINARY)
    fwrite("\r\n",sizeof(CHAR),2,stream->file);
  else fwrite("\n",sizeof(CHAR),1,stream->file);
  stream->count=0;
  return ui;
  }

/*******************************************************************************

verify_password:  Verifies that the password "password" is good, returning
TRUE or FALSE.
*******************************************************************************/

BOOLEAN verify_password (password)
```

```
ULONG password;              /* password from user                  */
  {
  ULONG password0;           /* password from id                    */
  CHAR long_id[16];
  ULONG key0=0x3298b075L;     /* digits of sqrt(10)                  */
  CHAR *key="aaa";            /* user modifiable encryption key      */
  ULONG hexkey=0L;           /* hex equivalent of "key"             */
  CHAR *hexbyte=(CHAR*)&hexkey;  /* byte access to "hexkey"          */
  ULONG id;                   /* system id                           */
  INT i;
  for (i=0; key[i]; i++) hexbyte[i%4]^=key[i];
#ifdef SEC
  id=sysid(long_id);
#else
  id=0;
#endif
  password0=(id*key0^key0)*id*~hexkey+key0;
  return password==password0;
  }

/****************************************************************************

TILEINFO:  Tile information block.
****************************************************************************/


/****************************************************************************

new_tileinfo:  Allocates and initializes a new tile information specification
"ti" with the tile size "size", intertile gap "gap", initial offset of tile
pattern "offset", and successive layer tile pattern shift "shift".  Returns
"ti".
****************************************************************************/

TILEINFO *new_tileinfo (ti, size, gap, offset, shift)
TILEINFO *ti;                /* tile information                         */

DOUBLE size;                 /* size of tile                             */

DOUBLE gap;                  /* gap between tiles                        */

DOUBLE offset;               /* offset of tile pattern                   */

DOUBLE shift;                /* shift adjacent layer tile                */

  {
  if (!ti) ti=allocate(TILEINFO);
  if (!ti) errexit("ERROR #1113:  Memory exhausted");
  ti->size=size;
  ti->gap=gap;
  ti->offset=offset;
  ti->shift=shift;
```

```
  ti->spacing=ti->size+ti->gap;
  return ti;
  }

/******************************************************************************

delete_tileinfo:  Deletes the tile information block "ti" and returns NULL.
******************************************************************************/

TILEINFO *delete_tileinfo (ti)
TILEINFO *ti;            /* tile information block                        */
  {
  if (!ti) return NULL;
  deallocate(ti);
  return NULL;
  }

/******************************************************************************

dump_tileinfo:  Dumps the tileing information block "ti".
******************************************************************************/

VOID dump_tileinfo (ti)
TILEINFO *ti;              /* tile information block                        */
  {
  dump("TILEINFO %08lx:\n",ti);
  if (!ti) return;
  dump("size=%lg\n",ti->size);
  dump("gap=%lg\n",ti->gap);
  dump("offset=%lg\n",ti->offset);
  dump("shift=%lg\n",ti->shift);
  dump("spacing=%lg\n",ti->spacing);
  return;
  }

/******************************************************************************

tile_polylist:  Tiles a layer of polylines "pla" with the tile information
"ti" and returns "pla".
******************************************************************************/

POLYLIST *tile_polylist (pla, ti)
POLYLIST *pla;              /* list of polygons on layer to be tiled       */

TILEINFO *ti;               /* tile information block                      */

  {
  POLYLIST *plb;            /* list of tiles                               */

  POLYLINE *p;              /* polygon                                  */
  DOUBLE2 a,b,c,d;          /* corners of tile                             */
```

```
  INT ix,iy;                    /* tile indices in x and y directions        */
  INT nx,ny;                    /* number of tiles in x and y directions     */
  INT xmin;                     /* minimum x for first tile                  */
  INT xmax;                     /* minimum x for last tile                   */
  INT ymin;                     /* minimum y for first tile                  */
  INT ymax;                     /* minimum y for last tile                   */
  DOUBLE offset;                /* offset of tile pattern                    */

  if (!pla->first) return pla;
  offset=fmod(ti->offset+(pla->layerno-1)*ti->shift,ti->spacing);

xmin=offset+(floor2((pla->min.x-offset-ti->size)/ti->spacing)+1.)*ti->spacing;

  xmax=ti->offset+(ceil2((pla->max.x-offset)/ti->spacing)-1.)*ti->spacing;

ymin=offset+(floor2((pla->min.y-offset-ti->size)/ti->spacing)+1.)*ti->spacing;

  ymax=ti->offset+(ceil2((pla->max.y-offset)/ti->spacing)-1.)*ti->spacing;
  nx=(INT)((xmax-xmin)/ti->spacing+1.5);
  ny=(INT)((ymax-ymin)/ti->spacing+1.5);
  plb=new_polylist(_,pla->layerno,pla->min.z,pla->max.z);
  for (ix=0; ix<nx; ix++)
    {
    a.x=d.x=xmin+ix*ti->spacing;
    b.x=c.x=a.x+ti->size;
    for (iy=0; iy<ny; iy++)
      {
      a.y=b.y=ymin+iy*ti->spacing;
      c.y=d.y=a.y+ti->size;
      p=new_polygon(_,&a,&b,&c,&d,_);
      if (p->first) append_polyline(plb,p);
      else delete_polyline(p);
      }
    }
  pla=intersect_polylists(pla,plb,0);
  return pla;
  }

/*****************************************************************************

HATCHINFO:  Specifications for hatching
*****************************************************************************/


/*****************************************************************************
```

```
new_hatchinfo:  Allocates and initializes a new hatch information
specification "hi" with hatch angle "angle", spacing "spacing",
inital hatch pattern offset "offset", and successive layer hatch pattern shift

"shift".   Returns "hi".
******************************************************************************/

HATCHINFO *new_hatchinfo (hi, angle, spacing, offset, shift)
HATCHINFO *hi;              /* hatch information                            */

DOUBLE angle;               /* angle of hatch                               */

DOUBLE spacing;             /* spacing of hatch                             */

DOUBLE offset;              /* offset of hatch pattern on initial layer     */

DOUBLE shift;               /* shift adjacent layer hatch                   */

  {
  if (!hi) hi=allocate(HATCHINFO);
  if (!hi) errexit("ERROR #1113:  Memory exhausted");
  hi->angle=angle;
  angle*=RADIANS_PER_DEGREE;
  hi->vector.x=cos(angle);
  hi->vector.y=sin(angle);
  if (fmod(angle,90.)==0.) hi->vector=round2(hi->vector);
  hi->spacing=spacing;
  hi->offset=offset;
  hi->shift=shift;
  hi->next=NULL;
  hi->prev=NULL;
  hi->parent=NULL;
  return hi;
  }

/******************************************************************************

new_hatchinfo1:  Allocates and initializes a new hatch information
specification "hia" by copying another specification "hib" and returns "hia".
******************************************************************************/

HATCHINFO *new_hatchinfo1 (hia, hib)
HATCHINFO *hia;             /* hatch information                            */

HATCHINFO *hib;             /* hatch info to copy                           */

  {
  if (!hia) hia=allocate(HATCHINFO);
  if (!hia) errexit("ERROR #1114:  Memory exhausted");
  hia->angle=hib->angle;
  hia->vector=hib->vector;
  hia->spacing=hib->spacing;
```

```
 hia->offset=hib->offset;
 hia->shift=hib->shift;
 hia->prev=NULL;
 hia->next=NULL;
 hia->parent=NULL;
 return hia;
 }

/*****************************************************************************

delete_hatchinfo:  Deletes the hatching information block "hi" and returns
NULL.
*****************************************************************************/

HATCHINFO *delete_hatchinfo (hi)
HATCHINFO *hi;              /* hatch information block                     */

  {
  HATCHINFOLIST *list;      /* hatch information list                      */

  if (!hi) return NULL;
  if (list=hi->parent)
    {
    if (hi->prev) hi->prev->next=hi->next;
    else list->first=hi->next;
    if (hi->next) hi->next->prev=hi->prev;
    else list->last=hi->prev;
    }
  deallocate(hi);
  return NULL;
  }

/*****************************************************************************

dump_hatchinfo:  Dumps the hatching information block "hi".
*****************************************************************************/

VOID dump_hatchinfo (hi)
HATCHINFO *hi;              /* hatch information block                     */

  {
  dump("HATCHINFO %08lx:\n",hi);
  if (!hi) return;
  dump("parent=%lx\n",hi->parent);
  dump("angle=%lg\n",hi->angle);
  dump("vector=%lg %lg\n",hi->vector);
  dump("spacing=%lg\n",hi->spacing);
  dump("offset=%lg\n",hi->offset);
  dump("shift=%lg\n",hi->shift);
  if (hi->parent && (hi->prev && hi!=hi->prev->next || hi->next &&
    hi!=hi->next->prev))
    errexit("ERROR #1115:  Corrupted list:  prev=%08lx next=%08lx"
```

```
    ,hi->prev,hi->next);
  return;
  }

/*****************************************************************************

append_hatchinfo:  Appends a hatching information block "hi" to the
hatching information list "list" and returns "list".
*****************************************************************************/

HATCHINFOLIST *append_hatchinfo (list, hi)
HATCHINFOLIST *list;          /* list of hatch information blocks           */

HATCHINFO *hi;                /* hatch information block                    */

  {
  if (!hi) return list;
  if (!list->first)
    {
    list->first=hi;
    list->last=hi;
    hi->prev=NULL;
    }
  else
    {
    hi->prev=list->last;
    list->last->next=hi;
    list->last=hi;
    }
  hi->next=NULL;
  hi->parent=list;
  return list;
  }

/*****************************************************************************

HATCHINFOLIST:  List of hatch information blocks.
*****************************************************************************/

/*****************************************************************************

new_hatchinfolist:  Allocates and initializes a new hatching information list
"list" and returns it.
*****************************************************************************/

HATCHINFOLIST *new_hatchinfolist (list)
HATCHINFOLIST *list;          /* list of hatch information blocks           */

  {
  if (!list) list=allocate(HATCHINFOLIST);
```

```
 if (!list) errexit("ERROR #1116:  Memory exhausted");
 list->first=NULL;
 list->last=NULL;
 return list;
 }

/*****************************************************************************

delete_hatchinfolist:  Deallocates a hatchinfo list "list" and returns NULL.
*****************************************************************************/

HATCHINFOLIST *delete_hatchinfolist (list)
HATCHINFOLIST *list;          /* list of hatch information blocks           */

  {
  HATCHINFO *hi;              /* hatch information block                    */

  if (!list) return NULL;
  for (hi=list->first; hi; hi=hi->next)
    {
    hi->parent=NULL;
    delete_hatchinfo(hi);
    }
  deallocate(list);
  return NULL;
  }

/*****************************************************************************

dump_hatchinfolist:  Dumps a hatching information list "list".
*****************************************************************************/

VOID dump_hatchinfolist (list)
HATCHINFOLIST *list;          /* list of hatch information blocks           */

  {
  HATCHINFO *item;            /* hatch information block                    */

  INT index=0;                /* hatch information block index              */

  dump("HATCHINFOLIST %08lx:\n",list);
  if (!list) return;
  if (list->first && !list->last || list->last && !list->first)
    errexit("ERROR #1117:  Corrupted list:  first=%lx last=%lx\n"
    ,list->first,list->last);
  if (!list->first) return;
  if (list->first->prev || list->last->next)
    errexit("ERROR #1118:  Corrupted list:  first->prev=%lx first=%lx last=%lx
last->next=%lx\n",
      list->first->prev,list->first,list->last,list->last->next);
  dump("first=%lx last=%lx\n",list->first,list->last);
  for (item=list->first; item; item=item->next)
```

```
    {
    dump("#%d ",index++);
    dump_hatchinfo(item);
    if (!item->parent)
      errexit("ERROR #1119:  Missing parent:  item=%lx\n",item);
    if (item->prev && item!=item->prev->next || item->next
    && item!=item->next->prev)
      errexit("ERROR #1120:  Corrupted list:  prev=%08lx next=%08lx"
       ,item->prev,item->next);
    if (!item->next && item!=list->last)
      errexit("ERROR #1121:  Corrupted list:  item=%lx last=%lx\n"
         ,item,list->last);
    } /* item */
  return;
  }

/*****************************************************************************

RANGE:  Range information block
*****************************************************************************/


/*****************************************************************************

new_range:  Allocates and initializes a new range information block "r" with a

minimum layer index "lmin", minimum z value "zmin", layer thickness "zs", line

width compensation "lbo", down fill retraction "dfo", and up fill retraction
"ufo".  Returns "r".
*****************************************************************************/

RANGE *new_range (r, lmin, zmin, zs, lbo, dfo, ufo)
RANGE *r;                     /* range information block                     */

INT lmin;                     /* layer number                                */

DOUBLE zmin;                  /* minimum z value                             */

DOUBLE zs;                    /* layer thickness                             */

DOUBLE lbo;                   /* layer compensation                          */

DOUBLE dfo;                   /* down fill compensation                      */

DOUBLE ufo;                   /* up fill compensation                        */

  {
  if (!r) r=allocate(RANGE);
  if (!r) errexit("ERROR #1122:  Memory exhausted");
  r->lmin=lmin;
  r->zmin=zmin;
```

```
  r->zs=zs;
  r->lbo=lbo;
  r->dfo=dfo;
  r->ufo=ufo;
  r->prev=NULL;
  r->next=NULL;
  r->parent=NULL;
  return r;
  }

/*****************************************************************************

delete_range:  Deletes a range information block "r" and returns NULL.
*****************************************************************************/

RANGE *delete_range (r)
RANGE *r;                    /* range block                                 */

  {
  RANGELIST *list;           /* list of range blocks                        */

  if (!r) return NULL;
  if (list=r->parent)
    {
    if (r->prev) r->prev->next=r->next;
    else list->first=r->next;
    if (r->next) r->next->prev=r->prev;
    else list->last=r->prev;
    }
  deallocate(r);
  return NULL;
  }

/*****************************************************************************

dump_range:  Dumps a range information block "r".
*****************************************************************************/

VOID dump_range (r)
RANGE *r;                    /* range information block                     */

  {
  dump("RANGE %08lx:\n",r);
  if (!r) return;
  dump("parent=%lx\n",r->parent);
  dump("zmin=%lg\n",r->zmin);
  dump("lmin=%d\n",r->lmin);
  dump("zs=%lg\n",r->zs);
  dump("lbo=%lg\n",r->lbo);
  dump("dfo=%lg\n",r->dfo);
  dump("ufo=%lg\n",r->ufo);
```

```
  if (r->parent && (r->prev && r!=r->prev->next
  || r->next && r!=r->next->prev))
    errexit("ERROR #1123:  Corrupted list:  prev=%08lx next=%08lx"
    ,r->prev,r->next);
  return;
  }

/******************************************************************************

append_range:  Adds a new range information block "r" to the range information

list "rl" and returns "rl".
******************************************************************************/

RANGELIST *append_range (rl, r)
RANGELIST *rl;                /* range list                                    */

RANGE *r;                     /* range to add                                  */

  {
  if (!r) return rl;
  if (rl->first)
    {
    if (rl->last->zmin>r->zmin)
      errexit("ERROR #1124:  Misordered range list");
    if (rl->last->zmin==r->zmin) delete_range(rl->last);
    }
  if (!rl->first)
    {
    rl->first=r;
    rl->last=r;
    r->prev=NULL;
    }
  else
    {
    r->prev=rl->last;
    rl->last->next=r;
    rl->last=r;
    }
  r->next=NULL;
  r->parent=rl;
  return rl;
  }

/******************************************************************************

get_rangel:  Returns the range information block for a given layer index "n"
from the range list "rl".
******************************************************************************/

RANGE *get_rangel (rl, n)
```

```
RANGELIST *rl;                  /* range list                                    */

INT n;                          /* level number                                  */

  {
  RANGE *r;                     /* range information block                       */

  for (r=rl->first; r; r=r->next)
    {
    if (!r->next) break;
    if (n<r->next->lmin) break;
    }
  return r;
  }

/*****************************************************************************

get_range2:  Returns the range information block for a given z value "z" from
the range list "rl".  The sign "sign" indicates that the actual z value is just

below or just above the input z value "z".
*****************************************************************************/

RANGE *get_range2 (rl, z, sign)
RANGELIST *rl;                  /* range list                                    */

DOUBLE z;                       /* z value                                       */

SIGN sign;                      /* range at: 1)z+ -1)z-                          */

  {
  RANGE *r;                     /* range information block                       */

  for (r=rl->first; r; r=r->next)
    {
    if (!r->next) break;
    if (z<r->next->zmin) break;
    }
  if (sign<0 && z==r->zmin && r->prev) r=r->prev;
  return r;
  }

/*****************************************************************************

get_zlevel:  Returns the z value at a fraction "frac" into layer number "n"
(from bottom) from the range list "rl".
*****************************************************************************/

DOUBLE get_zlevel (rl, n, frac)
RANGELIST *rl;                  /* range list                                    */
```

```
INT n;                      /* layer number                              */

DOUBLE frac;                /* fraction (0. - 1.) into layer             */

  {
  DOUBLE z;                 /* original value                            */

  RANGE *r;                 /* range information block                   */

  if (n>=MAX_INT) return MAX_DBL;
  for (r=rl->first; r; r=r->next)
    {
    if (!r->next) break;
    if (n<r->next->lmin) break;
    }
  z=round(r->zmin+(n-r->lmin+frac)*r->zs);
  return z;
  }

/*****************************************************************************

get_layer_number:  Returns the layer number for a given z value "z" from the
range list "rl".  The sign "sign" indicates that the actual z value is just
below or just above the input z value "z".
*****************************************************************************/

INT get_layer_number (rl, z, sign)
RANGELIST *rl;              /* range list                                */

DOUBLE z;                   /* level value                               */

SIGN sign;                  /* -1) at z- 1) at z+                        */

  {
  RANGE *r;                 /* range                                     */

  DOUBLE n;                 /* layer number                              */

  if (z<0.)
    errexit("ERROR #1125:  Negative z: %lg",z);
  if (z>=MAX_DBL) return MAX_INT;
  if (sign>0) z+=.5;
  else if (sign<0) z-=.5;
  for (r=rl->first; r; r=r->next)
    {
    if (!r->next) break;
    if (z<r->next->zmin) break;
    }
  n=(DOUBLE)r->lmin+(z-r->zmin)/r->zs;
  if (n>=(DOUBLE)MAX_INT) return MAX_INT;
  return (INT)n;
  }
```

```
/*****************************************************************************

RANGELIST:  List of range blocks.
*****************************************************************************/

/*****************************************************************************

new_rangelist:  Allocates and initializes a new range information list "rl and

returns it.
*****************************************************************************/

RANGELIST *new_rangelist (rl)
RANGELIST *rl;                  /* range information list                  */

  {
  if (!rl) rl=allocate(RANGELIST);
  if (!rl) errexit("ERROR #1126:  Memory exhausted");
  rl->first=NULL;
  rl->last=NULL;
  return rl;
  }
/*****************************************************************************

delete_rangelist:  Deallocates a range information list "rl" and returns NULL.

*****************************************************************************/

RANGELIST *delete_rangelist (rl)
RANGELIST *rl;                  /* range information list                  */

  {
  RANGE *r;                     /* range information block                 */

  if (!rl) return NULL;
  for (r=rl->first; r; r=r->next) delete_range(r);
  deallocate(rl);
  return NULL;
  }
/*****************************************************************************

dump_rangelist:  Dumps a range information list "rl".
*****************************************************************************/

VOID dump_rangelist (rl)
RANGELIST *rl;                  /* list                                    */

  {
```

```
  RANGE *r;                   /* r in list                                          */

  INT index=0;                /* index of r                                         */

  dump("RANGELIST %08lx:\n",rl);
  if (!rl) return;
  if (rl->first && !rl->last || rl->last && !rl->first)
    errexit("ERROR #1127:  Corrupted list:  first=%lx last=%lx\n"
    ,rl->first,rl->last);
  if (!rl->first) return;
  if (rl->first->prev || rl->last->next)
    errexit("ERROR #1128:  Corrupted list:  first->prev=%lx first=%lx last=%lx
last->next=%lx\n",
      rl->first->prev,rl->first,rl->last,rl->last->next);
  dump("first=%lx last=%lx\n",rl->first,rl->last);
  for (r=rl->first; r; r=r->next)
    {
    dump("#%d ",index++);
    dump_range(r);
    if (!r->parent) errexit("ERROR #1129:  Missing parent:  r=%lx\n",r);
    if (r->prev && r!=r->prev->next ||  r->next &&
      r!=r->next->prev)
      errexit("ERROR #1130:  Corrupted list:  prev=%08lx next=%08lx"
      ,r->prev,r->next);
    if (!r->next && r!=rl->last)
      errexit("ERROR #1131:  Corrupted list:  r=%lx last=%lx\n",r,rl->last);
    }
  return;
  }

/*******************************************************************************

CURE:  Specifications for curing
*******************************************************************************/


/*******************************************************************************

new_cure:  Allocates and initializes a new cure information block "cure" given

a cure depth "depth" and a cure width "width".  Returns "cure".
*******************************************************************************/

CURE *new_cure (cure, depth, width)
CURE *cure;                   /* cure information                                   */

DOUBLE depth;                 /* cure depth                                         */

DOUBLE width;                 /* width                                              */

  {
  if (!cure) cure=allocate(CURE);
```

```
  if (!cure) errexit("ERROR #1133:  Memory exhausted");
  cure->depth=depth;
  cure->width=width;
  cure->prev=NULL;
  cure->next=NULL;
  cure->parent=NULL;
  return cure;
  }

/*******************************************************************************

delete_cure:  Deletes a cure information block "cure" and returns NULL.
*******************************************************************************/

CURE *delete_cure (cure)
CURE *cure;                    /* cure information block                        */

  {
  CURELIST *curelist;          /* cure information list                         */

  if (!cure) return NULL;
  if (curelist=cure->parent)
    {
    if (cure->prev) cure->prev->next=cure->next;
    else curelist->first=cure->next;
    if (cure->next) cure->next->prev=cure->prev;
    else curelist->last=cure->prev;
    }
  deallocate(cure);
  return NULL;
  }

/*******************************************************************************

dump_cure:  Dumps a cure information block "cure".
*******************************************************************************/

VOID dump_cure (cure)
CURE *cure;                    /* cure information block              */
  {
  dump("CURE %08lx:\n",cure);
  if (!cure) return;
  dump("parent=%lx\n",cure->parent);
  dump("depth=%lg\n",cure->depth);
  dump("width=%lg\n",cure->width);
  if (cure->parent && (cure->prev && cure!=cure->prev->next
  || cure->next && cure!=cure->next->prev))
    errexit("ERROR #1134:  Corrupted list:  prev=%08lx next=%08lx"
    ,cure->prev,cure->next);
  return;
  }
```

```
/*******************************************************************************
add_cure:  Adds a cure information block "ca" to the cure list "list" and
returns "list".
*******************************************************************************/

CURELIST *add_cure (list, ca)
CURELIST *list;              /* list of cure information blocks              */

CURE *ca;                    /* cure information block                       */

  {
  CURE *cb;                  /* cure information block                       */

  ca->parent=list;
  if (!list->first)
    {
    list->first=ca;
    list->last=ca;
    ca->prev=NULL;
    ca->next=NULL;
    return list;
    }
  if (ca->depth<=list->first->depth)
    {
    cb=list->first;
    if (ca->width>=cb->width)
      errexit("ERROR #1135:  Cure depth and width must be positively
correlated");
    ca->prev=NULL;
    ca->next=cb;
    cb->prev=ca;
    list->first=ca;
    return list;
    }
  if (ca->depth>=list->last->depth)
    {
    cb=list->last;
    if (ca->width<=cb->width)
        errexit("ERROR #1136:  Cure depth and width must be positively
correlated");
    ca->prev=cb;
    ca->next=NULL;
    cb->next=ca;
    list->last=ca;
    return list;
    }
  for (cb=list->first; cb; cb=cb->next)
    if (ca->depth<=cb->depth) break;
  if (ca->width>=cb->width)
    errexit("ERROR #1137:  Cure depth and width must be positively
correlated");
```

```
  ca->prev=cb->prev;
  ca->next=cb;
  cb->prev->next=ca;
  cb->prev=ca;
  return list;
  }

/*****************************************************************************

get_cure_width:  Returns the cure width from the cure depth "depth" in the cure

information list "curelist".
*****************************************************************************/

DOUBLE get_cure_width (curelist, depth)
CURELIST *curelist;
DOUBLE depth;
  {
  CURE *cure;
  DOUBLE width;
  if (curelist->first==curelist->last) return curelist->first->width;
  for (cure=curelist->first->next; cure; cure=cure->next)
    if (depth<=cure->depth) break;
  if (!cure) cure=curelist->last;
  width=cure->prev->width+(cure->width-cure->prev->width)*
    (depth-cure->prev->depth)/(cure->depth-cure->prev->depth);
  width=round(width);
  return width;
  }

/*****************************************************************************

CURELIST:  List of cure information blocks.
*****************************************************************************/


/*****************************************************************************

new_curelist:  Allocates and initializes a new cure information list
"curelist" and returns it.
*****************************************************************************/

CURELIST *new_curelist (curelist)
CURELIST *curelist;            /* list of cure information blocks           */

  {
  if (!curelist) curelist=allocate(CURELIST);
  if (!curelist) errexit("ERROR #1138:  Memory exhausted");
  curelist->first=NULL;
  curelist->last=NULL;
  return curelist;
  }
```

```
/****************************************************************************

delete_curelist:  Deallocates the cure information list "curelist" and returns

NULL.
****************************************************************************/

CURELIST *delete_curelist (curelist)
CURELIST *curelist;          /* list of cure information blocks   */
  {
  CURE *cure;                /* cure information block            */
  if (!curelist) return NULL;
  for (cure=curelist->first; cure; cure=cure->next)
    {
    cure->parent=NULL;
    delete_cure(cure);
    }
  deallocate(curelist);
  return NULL;
  }

/****************************************************************************

dump_curelist:  Dumps a cure information list "curelist".
****************************************************************************/

VOID dump_curelist (curelist)
CURELIST *curelist;          /* list of cure information blocks              */

  {
  CURE *cure;                /* cure information block                       */

  INT index=0;               /* cure information block index                 */

  dump("CURELIST %08lx:\n",curelist);
  if (!curelist) return;
  if (curelist->first && !curelist->last || curelist->last && !curelist->first)

    errexit("ERROR #1139:  Corrupted list:  first=%lx last=%lx\n"
    ,curelist->first,curelist->last);
  if (!curelist->first) return;
  if (curelist->first->prev || curelist->last->next)
    errexit("ERROR #1140:  Corrupted list:  first->prev=%lx first=%lx last=%lx
last->next=%lx\n",

curelist->first->prev,curelist->first,curelist->last,curelist->last->next);
  dump("first=%lx last=%lx\n",curelist->first,curelist->last);
  for (cure=curelist->first; cure; cure=cure->next)
    {
    dump("#%d ",index++);
    dump_cure(cure);
```

```
    if (!cure->parent)
      errexit("ERROR #1141:  Missing parent:  cure=%lx\n",cure);
    if (cure->prev && cure!=cure->prev->next || cure->next
    && cure!=cure->next->prev)
      errexit("ERROR #1142:  Corrupted list:  prev=%08lx next=%08lx"
      ,cure->prev,cure->next);
    if (!cure->next && cure!=curelist->last)
      errexit("ERROR #1143:  Corrupted list:  cure=%lx last=%lx\n"
      ,cure,curelist->last);
    } /* cure */
  return;
  }

/*******************************************************************************

read_curelist:  Returns a cure information list read from the material file
"stream".
*******************************************************************************/

CURELIST *read_curelist (stream)
STREAM *stream;
  {
  CURELIST *curelist;
  INT i;                      /* block number                                */

  CHAR line[82];              /* input line                                  */

  DOUBLE power;               /* laser power                                 */

  DOUBLE period;              /* step period                                 */

  DOUBLE depth;               /* line depth                                  */

  DOUBLE minwidth;            /* minimum line width                          */

  DOUBLE maxwidth;            /* maximum line width                          */

  DOUBLE width;               /* line width                                  */

  INT block_count;            /* number of cure information blocks           */

  do
    {
    if (!fgets(line,81,stream->file))
      errexit("ERROR #1144:  Material file \"%s\" is empty",stream->name);
    }
  while (line[0]=='!');
  curelist=new_curelist(_);
  sscanf(line,"%lg\n",&power);
  fscanf(stream->file,"%d\n",&block_count);
  for (i=0; i<block_count; i++)
    {
```

```
  fscanf(stream->file,"%lg\n",&period);
  fscanf(stream->file,"%lg\n",&depth);
  fscanf(stream->file,"%lg\n",&minwidth);
  fscanf(stream->file,"%lg\n",&maxwidth);
  depth=ctos(depth,Z,FALSE);
  width=ctos(.5*(minwidth+maxwidth),Z,FALSE);
  add_cure(curelist,new_cure(_,depth,width));
  }
return curelist;
}
```

```
/*****************************************************************************

S2.C:  DOUBLE, DOUBLE2, FILE, STREAM, TRANSFORMATION
*****************************************************************************/

#include "s.h"

/*****************************************************************************

DOUBLE:  double precision floating point number.
*****************************************************************************/


/*****************************************************************************

floor2:  Returns the largest integer less than then the argument "a".
*****************************************************************************/

DOUBLE floor2 (a)
DOUBLE a;
  {
  DOUBLE b;
  b=floor(a);
  if (a==b) return b-1.;
  return b;
  }

/*****************************************************************************

ceil2:  Returns the smallest integer greater than the argument "a".
*****************************************************************************/

DOUBLE ceil2 (a)
DOUBLE a;
  {
  DOUBLE b;
  b=ceil(a);
  if (a==b) return b+1.;
  return b;
  }

/*****************************************************************************

sq:  Returns the square of a number "x".
*****************************************************************************/

DOUBLE sq (x)
DOUBLE x;                       /* input                                  */

  {
  return x*x;
  }
```

```
/*****************************************************************************

round:  Rounds a number "a" to the nearest integer values.
*****************************************************************************/

DOUBLE round (a)
DOUBLE a;
  {
  if (a<0.) a=(DOUBLE)(LONG)(a-.5);
  else a=(DOUBLE)(LONG)(a+.5);
  return a;
  }


/*****************************************************************************

transform_z_extents:  Applies a coordinate transformation "f" to two z numbers

"zmin" and "zmax".
*****************************************************************************/

VOID transform_z_extents (zmin, zmax, f)
DOUBLE *zmin;
DOUBLE *zmax;
TRANSFORMATION *f;
  {
  *zmin=f->matrix[2][2]**zmin+f->matrix[2][3];
  *zmax=f->matrix[2][2]**zmax+f->matrix[2][3];
  return;
  }

/*****************************************************************************

ctos:  Converts value in cad units "cad_value" along x, y, or z axis "axis" to

slice units, and additionally if "layer_roundoff" is TRUE and "axis" is Z,
rounds off z value to nearest layer boundary.
*****************************************************************************/

DOUBLE ctos (cad_value, axis, layer_roundoff)
DOUBLE cad_value;               /* CAD value to convert               */

INT axis;                  /* axis                                    */

BOOLEAN layer_roundoff;    /* round off to nearest layer boundary?    */

  {
  DOUBLE slice_value;
  RANGE *r;                /* range                                   */
```

```
 slice_value=ui->res.z*cad_value;
 if (slice_value>ui->maxdim.z)
   {
   dump("ERROR #2000:  Part value of %lg CAD units\n",cad_value);
   dump("exceeds the maximum of %lg SLICE units:\n",ui->maxdim.z);
   dump("Try downscaling the part or reducing the resolution\n");
   errexit("");
   }
 if (slice_value<=-.5)
   {
   dump("ERROR #2001:  Part value of %lg CAD units is negative:\n",cad_value);

   dump("Try translating the part\n");
   errexit("");
   }
 if (slice_value<0.) slice_value=0.;
 if (axis!=Z) return round(ui->resratio*slice_value);
 slice_value=round(slice_value);
 if (!layer_roundoff) return slice_value;
 for (r=ui->rangelist->first; r; r=r->next)
   {
   if (!r->next) break;
   if (slice_value<r->next->zmin) break;
   }
 return round(r->zmin+round((slice_value-r->zmin)/r->zs)*r->zs);
 }
/*****************************************************************************

DOUBLE2:  point in 2 space.
*****************************************************************************/


/*****************************************************************************

distsq:  Returns the squared distance between two points "a" and "b".
*****************************************************************************/

DOUBLE distsq (a, b)
DOUBLE2 a;                  /* first point                                  */

DOUBLE2 b;                  /* second point                                 */

  {
  a.x-=b.x;
  a.y-=b.y;
  return a.x*a.x+a.y*a.y;
  }
/*****************************************************************************

round2:  Rounds a point "a" to nearest integer value and returns it.
```

```
*****************************************************************************/

DOUBLE2 round2 (a)
DOUBLE2 a;
  {
  if (a.x<0.) a.x=(DOUBLE)(LONG)(a.x-.5);
  else a.x=(DOUBLE)(LONG)(a.x+.5);
  if (a.y<0.) a.y=(DOUBLE)(LONG)(a.y-.5);
  else a.y=(DOUBLE)(LONG)(a.y+.5);
  return a;
  }

/*****************************************************************************

add:  Returns the sum of vectors "a" and "b".
*****************************************************************************/

DOUBLE2 add (a, b)
DOUBLE2 a;
DOUBLE2 b;
  {
  a.x+=b.x;
  a.y+=b.y;
  return a;
  }

/*****************************************************************************

neg:  Returns the negative of vector "a".
*****************************************************************************/

DOUBLE2 neg (a)
DOUBLE2 a;
  {
  a.x=-a.x;
  a.y=-a.y;
  return a;
  }

/*****************************************************************************

sub:  Returns the difference of vectors "a" and "b".
*****************************************************************************/

DOUBLE2 sub (a, b)
DOUBLE2 a;
DOUBLE2 b;
  {
  a.x-=b.x;
  a.y-=b.y;
  return a;
  }
```

```
/*********************************************************************************
mul:  Returns the product of scalar "a" and vector "b".
*********************************************************************************/

DOUBLE2 mul (a, b)
DOUBLE a;
DOUBLE2 b;
  {
  b.x*=a;
  b.y*=a;
  return b;
  }

/*********************************************************************************
dvd:  Returns the quotient of vector "a" and scalar "b".
*********************************************************************************/

DOUBLE2 dvd (a, b)
DOUBLE2 a;
DOUBLE b;
  {
  a.x/=b;
  a.y/=b;
  return a;
  }

/*********************************************************************************
dot:  Returns the dot product of two vectors "a" and "b".
*********************************************************************************/

DOUBLE dot (a, b)
DOUBLE2 a;
DOUBLE2 b;
  {
  return a.x*b.x+a.y*b.y;
  }

/*********************************************************************************
cross:  Returns the cross product of two vectors
"a" and "b".
*********************************************************************************/

DOUBLE cross (a, b)
DOUBLE2 a;
DOUBLE2 b;
  {
  return a.x*b.y-a.y*b.x;
```

```
  }

/*****************************************************************************

normalize:  Returns the unit vector corresponding to "a".
*****************************************************************************/

DOUBLE2 normalize (a)
DOUBLE2 a;
  {
  DOUBLE d;
  d=sqrt(a.x*a.x+a.y*a.y);
  if (d==0.0) return a;
  a.x/=d;
  a.y/=d;
  return a;
  }

/*****************************************************************************

average:  Returns the average of points "a" and "b".
*****************************************************************************/

DOUBLE2 average (a, b)
DOUBLE2 a;
DOUBLE2 b;
  {
  a.x=.5*(a.x+b.x);
  a.y=.5*(a.y+b.y);
  return a;
  }

/*****************************************************************************

distplsq:  Returns the squared distance from point "o" to a line thru points
"a" and "b".
*****************************************************************************/

DOUBLE distplsq (o, a, b)
DOUBLE2 o;
DOUBLE2 a;
DOUBLE2 b;
  {
  DOUBLE cross;                /* cross product                              */

  a.x-=b.x;
  a.y-=b.y;
  b.x-=o.x;
  b.y-=o.y;
  cross=a.x*b.y-b.x*a.y;
  return cross*cross/(a.x*a.x+a.y*a.y);
  }
```

```
/*******************************************************************************

nonparallel_intersection:  Returns the rounded off point of intersection of a
segment from point "a0" to point "a1" with a segment from point "b0" to point
"b1" if the intersection point is interior to one (and only one) of the
segments.  Returns NULL otherwise or if the segments are exactly parallel.
*******************************************************************************/

DOUBLE2 *nonparallel_intersection (a0, a1, b0, b1, o)
DOUBLE2 a0;                    /* tail of 1st segment                          */

DOUBLE2 a1;                    /* head of 1st segment                          */

DOUBLE2 b0;                    /* tail of 2nd segment                          */

DOUBLE2 b1;                    /* head of 2nd segment                          */

DOUBLE2 *o;                    /* intersect_nonparallelion point               */

  {
  DOUBLE cross,dx0,dy0,dx1,dy1;
  dx0=a0.x-a1.x; dy0=a0.y-a1.y;
  dx1=b0.x-b1.x; dy1=b0.y-b1.y;
  cross=dy0*dx1-dx0*dy1;
  if (cross==0.) return NULL;
  o->x=round(-(a0.y*dx0*dx1-a0.x*dy0*dx1-dx0*b0.y*dx1+dx0*b0.x*dy1)/cross);
  o->y=round(-(a0.y*dx0*dy1-a0.x*dy0*dy1-dy0*b0.y*dx1+dy0*b0.x*dy1)/cross);
  if (exbetween(a0,*o,a1) && inbetween(b0,*o,b1)
  || inbetween(a0,*o,a1) && exbetween(b0,*o,b1)) return o;
  return NULL;
  }

/*******************************************************************************

parallel_intersection:  Returns one of the endpoints "o0" of the region of
intersection of a line segment from "a0" to "a1" with a line segment
from "b0" to "b1" which are assumed parallel.  Calculates both endpoints
of the intersection region if "o1" is not NULL.  Intersection points
must be interior to at least one of the segments or NULL is returned.
*******************************************************************************/

DOUBLE2 *parallel_intersection (a0, a1, b0, b1, eps, o0, o1)
DOUBLE2 a0;                    /* tail of 1st segment                          */

DOUBLE2 a1;                    /* head of 1st segment                          */

DOUBLE2 b0;                    /* tail of 2nd segment                          */

DOUBLE2 b1;                    /* head of 2nd segment                          */
```

```
DOUBLE eps;                 /* spatial error tolerance                  */
DOUBLE2 *o0;                /* first endpoint of intersection region     */
DOUBLE2 *o1;                /* second endpoint of intersection region    */
  {
  DOUBLE dx0,dy0,dx1,dy1;   /* differences                              */
  DOUBLE cross;             /* cross product                            */
  DOUBLE epssq;             /* error tolerance of cross product         */
  INT n;                    /* number of intersections found            */
  dx0=a1.x-a0.x;
  dy0=a1.y-a0.y;
  dx1=b1.x-b0.x;
  dy1=b1.y-b0.y;
  cross=dx0*dy1-dy0*dx1;
  epssq=2*eps*eps*(4*eps*eps+dx0*dx0+dy0*dy0+dx1*dx1+dy1*dy1);
  if (cross*cross>epssq) return NULL;
  dx0=a1.x-a0.x;
  dy0=a1.y-a0.y;
  dx1=b0.x-a0.x;
  dy1=b0.y-a0.y;
  cross=dx0*dy1-dy0*dx1;
  epssq=2*eps*eps*(3*eps*eps+dx0*dx0+dy0*dy0+dx1*dx1+dy1*dy1
  -dx0*dx1-dy0*dy1);
  if (cross*cross>epssq) return NULL;
  dx0=b0.x-b1.x;
  dy0=b0.y-b1.y;
  dx1=a1.x-b1.x;
  dy1=a1.y-b1.y;
  cross=dx0*dy1-dy0*dx1;
  epssq=2*eps*eps*(3*eps*eps+dx0*dx0+dy0*dy0+dx1*dx1+dy1*dy1
  -dx0*dx1-dy0*dy1);
  if (cross*cross>epssq) return NULL;
  if (!o1)
    {
    if (exbetween(a0,b0,a1)) {*o0=b0; return o0;}
    if (exbetween(a0,b1,a1)) {*o0=b1; return o0;}
    if (exbetween(b0,a0,b1)) {*o0=a0; return o0;}
    if (exbetween(b0,a1,b1)) {*o0=a1; return o0;}
    return NULL;
    }
  n=0;
  if (exbetween(a0,b0,a1)) {*o0=b0; n++;}
  if (exbetween(a0,b1,a1))
    {
    if (n==0) {*o0=b1; n++;}
    else if (!eq2(*o0,b1)) {*o1=b1; n++;}
```

```
    }
  if (exbetween(b0,a0,b1))
    {
    if (n==0) {*o0=a0; n++;}
    else if (!eq2(*o0,a0))
      {
      if (n==1) {*o1=a0; n++;}
      else if (!eq2(*o1,a0))
        errexit("ERROR #2002:  Error in parallel segment intersection");
      }
    }
  if (exbetween(b0,a1,b1))
    {
    if (n==0) {*o0=a1; n++;}
    else if (!eq2(*o0,a1))
      {
      if (n==1) {*o1=a1; n++;}
      else if (!eq2(*o1,a1))
        errexit("ERROR #2003:  Error in parallel segment intersection");
      }
    }
  if (n==0) return NULL;
  if (n==1) *o1=*o0;
  return o0;
  }

/******************************************************************************

twoline_intersection:  Returns the rounded off point of intersection "o" of a
line through points "a0" and "a1" with a line through points "b0" and "b1".
******************************************************************************/

DOUBLE2 *twoline_intersection (a0, a1, b0, b1, o)
DOUBLE2 a0;                   /* 1st point on 1st line                        */

DOUBLE2 a1;                   /* 2nd point on 1st line                        */

DOUBLE2 b0;                   /* 1st point on 2nd line                        */

DOUBLE2 b1;                   /* 2nd point on 2nd line                        */

DOUBLE2 *o;                   /* intersection point                           */

  {
  DOUBLE cross,dx0,dy0,dx1,dy1;
  dx0=a0.x-a1.x; dy0=a0.y-a1.y;
  dx1=b0.x-b1.x; dy1=b0.y-b1.y;
  cross=dy0*dx1-dx0*dy1;
  if (cross==0.) return NULL;
  o->x=round(-(a0.y*dx0*dx1-a0.x*dy0*dx1-dx0*b0.y*dx1+dx0*b0.x*dy1)/cross);
  o->y=round(-(a0.y*dx0*dy1-a0.x*dy0*dy1-dy0*b0.y*dx1+dy0*b0.x*dy1)/cross);
  return o;
```

```
  }
/******************************************************************************

ptline_intersection: Returns the rounded off point of intersection "o" of a
line through point "a" with a line through points "b" and "c" where the line
through "a" is parallel to a line through points "c" and "d".
******************************************************************************/

DOUBLE2 *ptline_intersection (a, b, c, d, o)
DOUBLE2 a;
DOUBLE2 b;
DOUBLE2 c;
DOUBLE2 d;
DOUBLE2 *o;                    /* intersection point                         */

  {
  DOUBLE cross,dx0,dy0,dx1,dy1;
  dx0=b.x-c.x; dy0=b.y-c.y;
  dx1=c.x-d.x; dy1=c.y-d.y;
  cross=dy1*dx0-dx1*dy0;
  if (cross==0.) return NULL;
  o->x=round(-(a.y*dx1*dx0-a.x*dy1*dx0-dx1*b.y*dx0+dx1*b.x*dy0)/cross);
  o->y=round(-(a.y*dx1*dy0-a.x*dy1*dy0-dy1*b.y*dx0+dy1*b.x*dy0)/cross);
  return o;
  }

/******************************************************************************

between: Returns a point "o" if it lies between points "a" and "b" inclusive
of "a" and "b" with spatial tolerance "eps". Returns NULL otherwise.
******************************************************************************/

BOOLEAN between (a, o, b, eps)
DOUBLE2 a;                     /* potential outer point                      */

DOUBLE2 o;                     /* potential inner point                      */

DOUBLE2 b;                     /* potential outer point                      */

DOUBLE eps;                    /* spatial error tolerance                    */

  {
  DOUBLE cross;                /* cross product                              */

  DOUBLE epssq;                /* variance tolerance of dot and cross        */

  if (!inbetween(a,o,b)) return FALSE;
  a.x-=o.x; a.y-=o.y;
  b.x-=o.x; b.y-=o.y;
  cross=a.x*b.y-a.y*b.x;
  if (cross==0.) return TRUE;
```

```
  epssq=2*eps*eps*(3*eps*eps+a.x*a.x+a.y*a.y+b.x*b.x+b.y*b.y-a.x*b.x-a.y*b.y);

  return cross*cross<=epssq;
  }

/*****************************************************************************

exbetween:  Returns TRUE if a point "o" lies within a rectangle formed by
points "a" and "b" at its opposite corners.  Returns FALSE otherwise.  The
point "o" may lie on the boundary of the rectangle, but may not be equal to
either "a" or "b".
*****************************************************************************/

BOOLEAN exbetween (a, o, b)
DOUBLE2 a;                    /* potential outer point                      */

DOUBLE2 o;                    /* potential inner point                      */

DOUBLE2 b;                    /* potential outer point                      */

  {
  if ((a.x<=o.x && o.x<=b.x || b.x<=o.x && o.x<=a.x)
  && (a.y<=o.y && o.y<=b.y || b.y<=o.y && o.y<=a.y)
  && !(a.x==o.x && a.y==o.y) && !(b.x==o.x && b.y==o.y)) return TRUE;
  return FALSE;
  }

/*****************************************************************************

inbetween:  Returns TRUE if a point "o" lies within or on the boundary of a
rectangle formed by points "a" and "b" at its opposite corners.  Returns FALSE

otherwise.
*****************************************************************************/

BOOLEAN inbetween (a, o, b)
DOUBLE2 a;                    /* potential outer point                      */

DOUBLE2 o;                    /* potential inner point                      */

DOUBLE2 b;                    /* potential outer point                      */

  {
  if ((a.x<=o.x && o.x<=b.x || b.x<=o.x && o.x<=a.x)
  && (a.y<=o.y && o.y<=b.y || b.y<=o.y && o.y<=a.y)) return TRUE;
  return FALSE;
  }

/*****************************************************************************
```

```
aside:  Returns 0 if the three points "a", "o", and "b" lie on a straight line

with spatial tolerance "eps", -1 if "o" lies to the right of a directed line
thru "a" and "b", 1 if "o" lies to the left of a directed line thru "a" and
"b".
********************************************************************************/

SIGN aside (a, o, b, eps)
DOUBLE2 a;                    /* potential outer point                         */

DOUBLE2 o;                    /* potential inner point                         */

DOUBLE2 b;                    /* potential outer point                         */

DOUBLE eps;                   /* spatial error tolerance                       */

  {
  DOUBLE cross;               /* cross product                                 */

  DOUBLE epssq;               /* tolerance squared of cross product  */
  a.x-=o.x; a.y-=o.y;
  b.x-=o.x; b.y-=o.y;
  cross=a.x*b.y-a.y*b.x;
  if (cross==0.) return 0;
  if (eps==0.) return cross<0.?-1:1;
  epssq=2*eps*eps*(3*eps*eps+a.x*a.x+a.y*a.y+b.x*b.x+b.y*b.y-a.x*b.x-a.y*b.y);

  if (cross*cross<=epssq) return 0;
  return cross<0.?-1:1;
  }

/********************************************************************************

FILE:  file
********************************************************************************/


/********************************************************************************

fread_:  Reads up to "count" items of "size" bytes from the intput file "file"

and stores them in "buffer".  The byte order is reversed if "reverse" is TRUE.

Returns the number of full items actually read.
********************************************************************************/

INT fread_ (buffer, size, count, file, reverse)
PTR buffer;                   /* pointer to first item                         */

INT size;                     /* size of item in bytes                         */
```

```
INT count;                    /* number of items to read                    */

FILE *file;                   /* file                                       */

BOOLEAN reverse;              /* reverse byte order?                        */

  {
  CHAR *s;
  INT halfsize;
  CHAR temp;
  INT i,j,k;
  INT n;                      /* number of items read                */
  n=fread(buffer,size,count,file);
  if (!reverse || n<count || size<2) return n;
  halfsize=size/2;
  s=(CHAR*)buffer;
  for (i=0; i<count; i++,s+=size)
    {
    for (j=0; j<halfsize; j++)
      {
      k=size-j-1;
      temp=s[j];
      s[j]=s[k];
      s[k]=temp;
      }
    }
  }

/*******************************************************************************

fwrite_:  Writes up to "count" items of length "size" from "buffer" to the
output "file".  Reverses the bytes order if "reverse" is TRUE.  Returns the
number of full items actually written.
*******************************************************************************/

INT fwrite_ (buffer, size, count, file, reverse)
PTR buffer;                   /* pointer to first item                      */

INT size;                     /* size of item in bytes                      */

INT count;                    /* number of items to write                   */

FILE *file;                   /* file                                       */

BOOLEAN reverse;              /* reverse byte order?                        */

  {
  CHAR *s;
  CHAR temp;
  INT halfsize;
  INT i,j,k;
```

```
  INT n;                          /* number of items written                              */

  if (!reverse || size<2)
    {
    n=fwrite(buffer,size,count,file);
    return n;
    }
  halfsize=size/2;
  s=(CHAR*)buffer;
  for (i=0; i<count; i++,s+=size)
    {
    for (j=0; j<halfsize; j++)
      {
      k=size-j-1;
      temp=s[j];
      s[j]=s[k];
      s[k]=temp;
      }
    }
  n=fwrite(buffer,size,count,file);
  s=(CHAR*)buffer;
  for (i=0; i<count; i++,s+=size)
    {
    for (j=0; j<halfsize; j++)
      {
      k=size-j-1;
      temp=s[j];
      s[j]=s[k];
      s[k]=temp;
      }
    }
  return n;
  }

/*******************************************************************************

STREAM:  input/output
*******************************************************************************/


/*******************************************************************************

new_stream:  Allocates and initializes a new stream "stream" with a given file

name "name", a read status "read", format (ASCII, BINARY) "format", and byte
order "byteorder".  Bypasses the memory manager.
*******************************************************************************/

STREAM *new_stream (stream, name, read, format, byteorder)
STREAM *stream;               /* stream                                             */
```

```
CHAR *name;                   /* file name                                    */
BOOLEAN read;                 /* read? (not write?)                           */
INT format;                   /* format                                       */
INT byteorder;                /* byte order of numbers 0) low 1st 1) low last*/
  {
  INT i;                      /* index                                        */
  CHAR block[256];            /* first 256 characters from file               */

  if (!stream) stream=(STREAM*)malloc(sizeof(STREAM));
  if (!stream) errexit("ERROR #1000:  Memory exhausted");
  stream->read=read;
  stream->format=format;
  stream->byteorder=byteorder;
  stream->count=0;
  if (!*name)
    {
    stream->file=NULL;
    return stream;
    }
  if (read)
    {
    if (streq(name,"stdout"))
      errexit("ERROR #1001:  \"stdout\" specified as read file");
    if (streq(name,"stderr"))
      errexit("ERROR #1002:  \"stderr\" specified as read file");
    if (streq(name,"stdin")) stream->file=stdin;
    else
      {
      if (!format)
        {
        stream->file=fopen(name,"rb");
        if (!stream->file)
          errexit("ERROR #1003:  Cannot open file \"%s\" for reading",name);
        i=fread(block,sizeof(CHAR),256,stream->file);
        while (--i>=0) if (!isascii(block[i])) break;
        if (i<0) format=ASCII;
        else format=BINARY;
        fclose(stream->file);
        }
      if (format==ASCII) stream->file=fopen(name,"r");
      else stream->file=fopen(name,"rb");
      if (!stream->file)
        errexit("ERROR #1004:  Cannot open file \"%s\" for reading",name);
      }
    }
  else
```

```
    {
    if (streq(name,"stdin"))
      errexit("ERROR #1005:  \"stdin\" specified as read file");
    if (streq(name,"stdout")) stream->file=stdout;
    else
      {
      if (!format)
        errexit("ERROR #1006:  Format unspecified for file \"%s\"",name);
      if (format==ASCII) stream->file=fopen(name,"w");
      else stream->file=fopen(name,"wb");
      if (!stream->file)
        errexit("ERROR #1007:  Cannot open file \"%s\" for writing",name);
      }
    }
  stream->name=(CHAR*)malloc(strlen(name)+1);
  if (!stream->name) errexit("ERROR #1008:  Memory exhausted");
  strcpy(stream->name,name);
  stream->format=format;
  return stream;
  }

/*****************************************************************************

delete_stream:  Deallocates a stream "stream".
*****************************************************************************/

STREAM *delete_stream (stream)
STREAM *stream;                  /* stream                                   */

  {
  if (!stream) return NULL;
  if (stream->file && stream->file!=stdin && stream->file!=stdout &&
    stream->file!=stderr)
    {
    free(stream->name);
    fclose(stream->file);
    }
  free(stream);
  return NULL;
  }

/*****************************************************************************

dump_stream:  Dumps the stream information from "stream".
*****************************************************************************/

VOID dump_stream (stream)
STREAM *stream;                  /* stream                             */
  {
  dump("STREAM %08lx:\n",stream);
  if (!stream) return;
  dump("name=%s\n",stream->name);
```

```
 dump("file=%lx\n",stream->file);
 dump("read=%s\n",btoa(stream->read));
 dump("format=%s\n",stream->format==0?"0":
   stream->format==1?"ascii":stream->format==2?"binary":"?");
 dump("byteorder=%d\n",stream->byteorder);
 dump("count=%d\n",stream->count);
 return;
 }
/*****************************************************************************
rewind_stream:  Rewinds a write stream "stream" and changes read/write status.
*****************************************************************************/

STREAM *rewind_stream (stream)                                              */
STREAM *stream;                /* stream

 {
 if (!stream) return NULL;
 if (!stream->file)
   errexit("ERROR #1009:  Attemp to rewind nonfile \"%s\"",stream->name);
 if (stream->file==stdin || stream->file==stdout || stream->file==stderr)
   errexit("ERROR #1010:  Attempt to rewind \"%s\"",stream->name);
 fclose(stream->file);
 if (stream->read)
   {
   if (stream->format==ASCII) stream->file=fopen(stream->name,"w");
   else stream->file=fopen(stream->name,"wb");
   stream->read=FALSE;
   }
 else
   {
   if (stream->format==ASCII) stream->file=fopen(stream->name,"r");
   else stream->file=fopen(stream->name,"rb");
   stream->read=TRUE;
   }
 return stream;
 }
/*****************************************************************************
read_word:  Retruns the next word of text "word" from file "stream".  If there

are no more words in the file, a NULL is returned.  Skips over comments which
are delimited by / * ...  * / or / / ...  \n (same as C and C++).
*****************************************************************************/

CHAR *read_word (stream, word)                                              */
STREAM *stream;                /* stream
```

```
CHAR *word;                   /* word to read                              */

  {
  INT c;                      /* character read                            */

  CHAR *s=word;               /* pointer to word of text                   */

  INT state=0;                /* state                                     */

  while (1)
    {
    c=getc(stream->file);
    switch (state)
      {
      case 0:                 /* blank state                               */

        if (c==EOF || c==CTRLZ) goto done;
        if (c=='\n' || isspace(c)) break;
        if (c=='/') {state=2; break;}
        state=1; *s++=c; break;
      case 1:                 /* inside entry                              */

        if (c==EOF || c==CTRLZ) goto done;
        if (c=='\n' || isspace(c)) goto done;
        if (c=='/') {state=2; break;}
        *s++=c; break;
      case 2:                 /* possible start of comment                 */

        if (c==EOF || c==CTRLZ) {*s++='/'; goto done;}
        if (c=='\n' || isspace(c)) {*s++='/'; goto done;}
        if (c=='*') {state=3; break;}
        if (c=='/') {state=5; break;}
        state=s==word?0:1; *s++='/'; *s++=c; break;
      case 3:                 /* inside / * comment                        */

        if (c==EOF || c==CTRLZ) goto done;
        if (c=='*') {state=4; break;}
        break;
      case 4:                 /* possible end of * / comment               */

        if (c==EOF || c==CTRLZ) goto done;
        if (c=='/') {if (s!=word) goto done; state=0; break;}
        state=3; break;
      case 5:                 /* inside / / comment                        */

        if (c==EOF || c==CTRLZ) goto done;
        if (c=='\n') {if (s!=word) goto done; state=0; break;}
        break;
      }
    }
 done:
 *s='\0';
```

```
  if (s==word) return NULL;
  return word;
  }

/******************************************************************************

read_line:  Returns the next line of text "line" from file "stream".  Returns
a blank line if end of file is reached.
******************************************************************************/

CHAR *read_line (stream, line)
STREAM *stream;              /* stream                                        */

CHAR *line;                  /* line to read                                  */

  {
  INT c;
  CHAR *s=line;              /* line to read                                  */

  do
    {
    c=getc(stream->file);
    if (c=='\n') {*line=0; return line;}
    if (c==EOF || c==CTRLZ) return NULL;
    }
  while (isspace(c));
  do
    {
    *s++=c;
    c=getc(stream->file);
    }
  while (c!='\n' && c!=EOF && c!=CTRLZ);
  do *s=0;
  while (isspace(*--s));
  return line;
  }

/******************************************************************************

dump:  Same as printf but writes to the screen and message files.
******************************************************************************/

#ifdef DOS
VOID dump (CHAR *s,...)
/*CHAR *s;                      format string                                 */

  {
  va_list p;                 /* parameter pointer                             */

  va_start(p,s);
  if (!ui || !ui->screen && !ui->message)
    vfprintf(stdout,s,p);
```

```
  else
    {
    if (ui->screen) vfprintf(ui->screen->file,s,p);
    if (ui->message) vfprintf(ui->message->file,s,p);
    }
  return;
  }
#else
VOID dump (s,va_alist)
CHAR *s;                        /* format string                                   */

va_dcl
  {
  va_list p;                    /* parameter pointer                               */

  va_start(p);
  if (!ui || !ui->screen && !ui->message)
    vfprintf(stdout,s,p);
  else
    {
    if (ui->screen) vfprintf(ui->screen->file,s,p);
    if (ui->message) vfprintf(ui->message->file,s,p);
    }
  return;
  }
#endif

/*****************************************************************************

errexit:  Displays an error message and exits (argument list is the
same as that of printf).
*****************************************************************************/


#ifdef DOS
VOID errexit (CHAR *s,...)
/*CHAR *s;                         format string                                   */

  {
  CHAR time_str[9];
  va_list p;                    /* parameter pointer                               */

  va_start(p,s);
  get_time(time_str);
  if (!ui)
    {
    vfprintf(stdout,s,p);
    fprintf(stdout,"\nSLICE ABORTED AT %s!\n",time_str);
    exit(1);
    }
  if (!ui->screen) vfprintf(stdout,s,p);
  else vfprintf(ui->screen->file,s,p);
```

```
  if (ui->message) vfprintf(ui->message->file,s,p);
  if (!ui->screen) fprintf(stdout,"\nSLICE ABORTED AT %s!\n",time_str);
  else fprintf(ui->screen->file,"\nSLICE ABORTED AT %s!\n",time_str);
  if (ui->message)
    fprintf(ui->message->file,"\nSLICE ABORTED AT %s!\n",time_str);
  delete_stream(ui->parameter);
  delete_stream(ui->internal);
  delete_stream(ui->material);
  delete_stream(ui->security);
  delete_stream(ui->input);
  delete_stream(ui->output);
  delete_stream(ui->message);
  delete_stream(ui->screen);
  exit(1);
  }
#else
VOID errexit (s,va_alist)
CHAR *s;                        /* format string                                         */

va_dcl
  {
  CHAR time_str[9];
  va_list p;                    /* parameter pointer                                     */

  va_start(p);
  get_time(time_str);
  if (!ui)
    {
    vfprintf(stdout,s,p);
    fprintf(stdout,"\nSLICE ABORTED AT %s!\n",time_str);
    exit(1);
    exit(1);
    }
  if (!ui->screen) vfprintf(stdout,s,p);
  else vfprintf(ui->screen->file,s,p);
  if (ui->message) vfprintf(ui->message->file,s,p);
  if (!ui->screen) fprintf(stdout,"\nSLICE ABORTED AT %s!\n",time_str);
  else fprintf(ui->screen->file,"\nSLICE ABORTED AT %s!\n",time_str);
  if (ui->message)
    fprintf(ui->message->file,"\nSLICE ABORTED AT %s!\n",time_str);
  delete_stream(ui->parameter);
  delete_stream(ui->internal);
  delete_stream(ui->material);
  delete_stream(ui->security);
  delete_stream(ui->input);
  delete_stream(ui->output);
  delete_stream(ui->message);
  delete_stream(ui->screen);
  exit(1);
  }
#endif
```

```
/*****************************************************************************
TRANSFORMATION:  coordinate transformation.
*****************************************************************************/

/*****************************************************************************
new_transformation:  Allocates and initializes a data coordinate
transformation "t".
*****************************************************************************/

TRANSFORMATION *new_transformation (t)
TRANSFORMATION *t;              /* coordinate transformation                */

  {
  INT i;                        /* coordinate index                         */

  INT j;                        /* coordinate index                         */

  if (!t) t=allocate(TRANSFORMATION);
  if (!t) errexit("ERROR #1132:  Memory exhausted");
  t->unit=TRUE;
   for (i=0; i<4; i++) for (j=0; j<4; j++)
     t->matrix[i][j]=(DOUBLE)(i==j);
   return t;
   }

/*****************************************************************************
delete_transformation:  Deletes a coordinate transformation "t" and returns
NULL.
*****************************************************************************/

TRANSFORMATION *delete_transformation (t)
TRANSFORMATION *t;              /* coordinate transformation                */

  {
  if (t) deallocate(t);
  return NULL;
  }

/*****************************************************************************
dump_transformation:  Dumps a coordinate transformation "t".
*****************************************************************************/

VOID dump_transformation (t)
TRANSFORMATION *t;              /* coordinate transformation                */

  {
```

```
 INT i;                         /* coordinate index                          */

 dump("TRANSFORMATION %08lx:\n",t);
 if (!t) return;
 dump("unit=%d\n",t->unit);
 for (i=0; i<4; i++)
   {
   dump("  %9.9lg %9.9lg %9.9lg %9.9lg\n",
     t->matrix[i][0],t->matrix[i][1],t->matrix[i][2],t->matrix[i][3]);
   }
 return;
 }

/*****************************************************************************

update_transformation:  Updates the coordinate transformation "t" with rotation

"rx", "ry", "rz", scaling "sx", "sy", "sz", and translation "tx", "ty", and
"tz" in the x, y, and z directions respectively.
*****************************************************************************/

TRANSFORMATION *update_transformation (t, rx, ry, rz, sx, sy, sz,
  tx, ty, tz)
TRANSFORMATION *t;              /* coordinate transformation                 */

DOUBLE rx;                      /* rotation about x axis                     */

DOUBLE ry;                      /* rotation about y axis                     */

DOUBLE rz;                      /* rotation about z axis                     */

DOUBLE sx;                      /* scaling along x axis                      */

DOUBLE sy;                      /* scaling along y axis                      */

DOUBLE sz;                      /* scaling along z axis                      */

DOUBLE tx;                      /* translation along x axis                  */

DOUBLE ty;                      /* translation along y axis                  */

DOUBLE tz;                      /* translation along z axis                  */

  {
  TRANSFORMATION dt;            /* incremental transformation                */

  TRANSFORMATION p;             /* product matrix                            */

  DOUBLE costh;                 /* cosine of rotation angle                  */

  DOUBLE sinth;                 /* sine of rotation angle                    */
```

```
DOUBLE rpd;                  /* radians per degree                              */

INT i,j,k;                   /* coordinate indices                              */

new_transformation(&dt);
if (sx!=1.) dt.matrix[0][0]=sx;
if (sy!=1.) dt.matrix[1][1]=sy;
if (sz!=1.) dt.matrix[2][2]=sz;
if (tx!=0.) dt.matrix[0][3]=tx;
if (ty!=0.) dt.matrix[1][3]=ty;
if (tz!=0.) dt.matrix[2][3]=tz;
if (rx!=0.)
  {
  rpd=atan(1.)/45.;
  costh=cos(rx*rpd);
  sinth=sin(rx*rpd);
  dt.matrix[1][1]=costh;
  dt.matrix[1][2]=-sinth;
  dt.matrix[2][1]=sinth;
  dt.matrix[2][2]=costh;
  }
if (ry!=0.)
  {
  rpd=atan(1.)/45.;
  costh=cos(ry*rpd);
  sinth=sin(ry*rpd);
  dt.matrix[0][0]=costh;
  dt.matrix[0][2]=sinth;
  dt.matrix[2][0]=-sinth;
  dt.matrix[2][2]=costh;
  }
if (rz!=0.)
  {
  rpd=atan(1.)/45.;
  costh=cos(rz*rpd);
  sinth=sin(rz*rpd);
  dt.matrix[0][0]=costh;
  dt.matrix[0][1]=-sinth;
  dt.matrix[1][0]=sinth;
  dt.matrix[1][1]=costh;
  }
p.unit=TRUE;
for (i=0; i<4; i++)
  {
  for (j=0; j<4; j++)
    {
    p.matrix[i][j]=0.0;
    for (k=0; k<4; k++)
      p.matrix[i][j]+=dt.matrix[i][k]*t->matrix[k][j];
    if (p.matrix[i][j]!=(DOUBLE)(i==j)) p.unit=FALSE;
    }
  }
```

```
*t=p;
return t;
)
```

```
/*****************************************************************************

S3.C:  TRIANGLE, PART.
*****************************************************************************/

#include "s.h"

/*****************************************************************************

TRIANGLE:  triangle.
*****************************************************************************/

/*****************************************************************************

new_triangle:  Allocates and initializes a new triangle "t".
*****************************************************************************/

TRIANGLE *new_triangle (t)
TRIANGLE *t;                    /* triangle                              */

  {
  if (!t) t=allocate(TRIANGLE);
  if (!t) errexit("ERROR #3000:  Memory exhausted");
  t->orient=1;
  t->znorm=0;
  t->prev=NULL;
  t->next=NULL;
  t->parent=NULL;
  return t;
  }

/*****************************************************************************

delete_triangle:  Deallocates the triangle "t" and returns NULL.
*****************************************************************************/

TRIANGLE *delete_triangle (t)
TRIANGLE *t;                    /* triangle to delete                    */

  {
  PART *part;                   /* part                                  */

  if (!t) return NULL;
  if (part=t->parent)
    {
    if (t->prev) t->prev->next=t->next;
    else part->tfirst=t->next;
    if (t->next) t->next->prev=t->prev;
    else part->tlast=t->prev;
    }
```

```
  deallocate(t);
  return NULL;
  }

/*****************************************************************************

dump_triangle:  Dumps the triangle "t".
*****************************************************************************/

VOID dump_triangle (t)
TRIANGLE *t;                  /* triangle                                   */

  {
  INT i;                      /* triangle vertex index                      */

  dump("TRIANGLE %08lx: ",t);
  if (!t) {dump("\n"); return;}
  dump("parent=%lx orient=%d znorm=%d\n",t->parent,t->orient,t->znorm);
  for (i=0; i<3; i++)
    dump("%9.9lg %9.9lg %9.9lg\n",(DOUBLE)t->pt[i].x,
    (DOUBLE)t->pt[i].y, (DOUBLE)t->pt[i].z);
  if (t->parent && (t->prev && t!=t->prev->next
  || t->next && t!=t->next->prev))
    errexit("ERROR #3001:  Corrupted list:  prev=%08lx next=%08lx"
    ,t->prev,t->next);
  return;
  }

/*****************************************************************************

read_triangle:  Returns one triangle read from the input stream "stream" with
user information "ui".
*****************************************************************************/

TRIANGLE *read_triangle (stream, ui)
STREAM *stream;               /* triangle input file                        */

USERINFO *ui;
  {
  DOUBLE o[3][3];
  TRIANGLE *t;
  SIGN orient=1;
  if (!stream || !stream->file) return NULL;
  if (stream->format==ASCII)
    {
    if (!read_ascii_triangle(stream,o)) return NULL;
    }
  else
    {
    if (!read_binary_triangle(stream,o)) return NULL;
    }
  transform_triangle(o,ui->transformation);
```

```
  reorder_coordinates(o,ui->axis,ui->mirror,&orient);
  reorder_vertices(o,&orient);
  t=round_triangle(o);
  t->orient=orient;
  calculate_znormal(t);
  return t;
  }

/******************************************************************************

read_ascii_triangle:  Returns the triangle vertices "o" read in from the ascii

input file "stream".
******************************************************************************/

DOUBLE *read_ascii_triangle (stream, o)
STREAM *stream;                  /* ascii input stream                    */

DOUBLE o[3][3];                  /* triangle buffer                       */

  {
  INT i;                         /* vertes index                          */

  static INT line_count=1;       /* line number                           */

  CHAR line[81];                 /* input line                            */

  CHAR token[2][20];             /* tokens on input line                  */

  static BOOLEAN read_header=TRUE;   /* state of input file              */

  static FILE *oldfile=NULL;     /* last file read                        */

  start: if (read_header)
    {
    if (stream->file!=oldfile)
      {
      oldfile=stream->file;
      if (!read_line(stream,line))
        errexit("ERROR #3002:  Input file \"%s\" is empty",stream->name);
      if (!*strlwr(line)) errexit("ERROR #3003:  line 1 is blank");
      }
    else
      {
      if (!read_line(stream,line)) return NULL;
      if (!*strlwr(line)) return NULL;
      }
    sscanf(line,"%s",token[0]);
    if (!streq(token[0],"solid"))
      errexit("ERROR #3004:  solid missing on line 1");
```

```
    read_header=FALSE;
    }
  line_count++;
  if (!read_line(stream,line))
    errexit("ERROR #3005:  endsolid missing on line %d", line_count);
  if (!*strlwr(line)) errexit("ERROR #3006:  blank line %d", line_count);
  sscanf(line,"%s %s",token[0],token[1]);
  if (streq(token[0],"endsolid")
  || streq(token[0],"end") && streq(token[1],"solid"))
    {
    read_header=TRUE;
    goto start;
    }
  if (!streq(token[0],"facet") || !streq(token[1],"normal"))
    errexit("ERROR #3007:  facet normal missing on line %d", line_count);

  line_count++;
  if (!read_line(stream,line) || !*strlwr(line)
    || !sscanf(line,"%s %s",token[0],token[1])
    || !streq(token[0],"outer") || !streq(token[1],"loop"))
    errexit("ERROR #3008:  outer loop missing on line %d", line_count);

  for (i=0; i<3; i++)
    {
    line_count++;
    if (!read_line(stream,line) || !*strlwr(line))
      errexit("ERROR #3009:  vertex missing on line %d", line_count);
    sscanf(line,"%*s %lg %lg %lg",&o[i][X],&o[i][Y],&o[i][Z]);
    }

  line_count++;
  if (!read_line(stream,line) || !*strlwr(line)
    || !sscanf(line,"%s",token[0]) || !streq(token[0],"endloop"))
    errexit("ERROR #3010:  endloop missing on line %d", line_count);

  line_count++;
  if (!read_line(stream,line) || !*strlwr(line)
    || !sscanf(line,"%s",token[0]) || !streq(token[0],"endfacet"))
    errexit("ERROR #3011:  endfacet missing on line %d", line_count);
  return &o[0][0];
  }

/******************************************************************************

read_binary_triangle:  Returns the triangle vertices "o" read in from the
binary input file "stream".
******************************************************************************/

DOUBLE *read_binary_triangle (stream, o)
STREAM *stream;              /* input stream                                 */
```

```
DOUBLE o[3][3];                /* triangle buffer                                */

  {
  static LONG facet_count=0L; /* number of facets left to read      */
  CHAR buffer[50];             /* triangle info buffer               */
  CHAR header[80];           /* header info                      */
  INT i;                     /* vertex index                     */
  INT k;                     /* coordinate index               */
  FLOAT f[3][3];

  if (facet_count<=0)
    {
    if
(fread_(header,sizeof(CHAR),80,stream->file,stream->byteorder!=ui->byteorder)<8
0 ||

fread_(&facet_count,sizeof(LONG),1,stream->file,stream->byteorder!=ui->byteorde
r)<1)
        return NULL;
    if (facet_count<=0) return NULL;
    }
  if
(fread_(buffer,sizeof(FLOAT),3,stream->file,stream->byteorder!=ui->byteorder)<3
||

fread_(&f[0][X],sizeof(FLOAT),9,stream->file,stream->byteorder!=ui->byteorder)<
9 ||

fread_(buffer,sizeof(USHORT),1,stream->file,stream->byteorder!=ui->byteorder)<1
)
    {
    dump("%ld more triangles expected\n",facet_count);
    facet_count=0;
    return NULL;
    }
  for (i=0; i<3; i++)
    {
    for (k=0; k<3; k++)
      {
      if (nan(&f[i][k]))
        errexit("ERROR #3012:  Hexadecimal %08lx is not a valid floating point
number",
        *(LONG*)&f[i][k]);
      o[i][k]=(DOUBLE)f[i][k];
      }
    }
  facet_count--;
  return &o[0][0];
  }

/*****************************************************************************
```

```
transform_triangle:  Returns the triangle vertices "o" after the application of
a coordinate transformation "f".
*******************************************************************************/

DOUBLE *transform_triangle (o, f)
DOUBLE o[3][3];                /* triangle vertices                           */
TRANSFORMATION *f;
  {
  INT i;                       /* point index                                 */
  INT j;                       /* coordinate index                            */
  INT k;
  DOUBLE newpt[3];             /* result                                      */

  for (i=0; i<3; i++)
    {
    for (j=0; j<3; j++)
      {
      newpt[j]=0.;
      for (k=0; k<3; k++)
        newpt[j]+=f->matrix[j][k]*o[i][k];
      newpt[j]+=f->matrix[j][3];
      }  /* j */
    for (j=0; j<3; j++) o[i][j]=newpt[j];
    }  /* i */
  return &o[0][0];
  }

/*******************************************************************************

reorder_coordinates:  Returns the reordered vertex coordinates of triangle
"o" so that the slice axis "axis" is z (mirrored if "mirror" is TRUE).  If
reflection takes place, the sign of "orient" is reversed.
*******************************************************************************/

DOUBLE *reorder_coordinates (o, axis, mirror, orient)
DOUBLE o[3][3];                /* triangle vertices                           */
INT axis;                      /* slice axis                                  */
BOOLEAN mirror;                /* mirror image                                */
SIGN *orient;                  /* orientation                                 */
  {
  INT i;                       /* point2 index                                */
  DOUBLE *p;                   /* point                                       */
```

```
  DOUBLE swap;                /* swap location                                   */

  if (axis==2 && !mirror) return &o[0][0];
  for (i=0; i<3; i++)
    {
    p=&o[i][X];
    if (axis==0) {swap=p[0]; p[0]=p[1]; p[1]=p[2]; p[2]=swap;}
    else if (axis==1) {swap=p[1]; p[1]=p[0]; p[0]=p[2]; p[2]=swap;}
    if (mirror) {swap=p[0]; p[0]=p[1]; p[1]=swap;}
    }
  if (mirror) *orient=-*orient;
  return &o[0][0];
  }


/******************************************************************************

round_triangle:  Rounds off the triangle vertices "o" to to the nearest slice
layer and returns the associated triangle.
******************************************************************************/

TRIANGLE *round_triangle (o)
DOUBLE o[3][3];
  {
  TRIANGLE *t;
  INT i;                      /* vertex index                                    */

  t=new_triangle(_);
  for (i=0; i<3; i++)
    {
    t->pt[i].x=ctos(o[i][X],X);
    t->pt[i].y=ctos(o[i][Y],Y);
    t->pt[i].z=ctos(o[i][Z],Z,TRUE);
    }
  return t;
  }

/******************************************************************************

reorder_vertices:  Reorders the triangle vertices "o" in ascending z value
where "orient" gives the vertex order (1: counterclockwise, -1:  clockwise)
******************************************************************************/

DOUBLE *reorder_vertices (o, orient)
DOUBLE o[3][3];
SIGN *orient;
  {
  INT i,j;                    /* vertex indices                                  */

  INT k;                      /* coordinate index                                */
```

```
  DOUBLE swap;                  /* swap location                                       */

  for (i=0; i<3; i++)
    {
    for (j=i+1; j<3; j++)
      {
      if (o[i][Z]<=o[j][Z]) continue;
      for (k=0; k<3; k++)
        {
        swap=o[i][k];
        o[i][k]=o[j][k];
        o[j][k]=swap;
        }
      *orient=-*orient;
      }
    }
  return &o[0][0];
  }

/******************************************************************************

calculate_znormal:  Calculates the sign of the z component of the normal of
triangle "t".
******************************************************************************/

TRIANGLE *calculate_znormal (t)
TRIANGLE *t;                    /* triangle                                 */
  {
  DOUBLE cross;                 /* cross product                            */
  cross=((DOUBLE)t->pt[1].x-(DOUBLE)t->pt[0].x)
  *((DOUBLE)t->pt[2].y-(DOUBLE)t->pt[0].y)
  -((DOUBLE)t->pt[2].x-(DOUBLE)t->pt[0].x)
  *((DOUBLE)t->pt[1].y-(DOUBLE)t->pt[0].y);
  if (t->orient<0) cross=-cross;
  if (cross<0.) t->znorm=-1;
  else if (cross>0.) t->znorm=1;
  else t->znorm=0;
  return t;
  }

/******************************************************************************

single_slice_triangle:  Slices the given triangle "t" and adds the resulting
segment to the list "seglist".  Zero length segments are suppressed.
"where" determines the z value of the slice.
-1) just above "zmin"
 0) average of "zmin" and "zmax".
-1) just below "zmax"
******************************************************************************/

TRIANGLE *single_slice_triangle (zmin, zmax, t, seglist, where)
```

```
DOUBLE zmin;                /* top of layer                          */
DOUBLE zmax;                /* top of layer                          */
TRIANGLE *t;                /* triangle                              */
SEGLIST *seglist;           /* segment list                          */
INT where;                  /* -1)low 0)mid 1)high                   */
  {
  DOUBLE z;                 /* cut level                             */
  DOUBLE2 s[2];             /* segment                               */
  BOOLEAN above;            /* slice conceptually above z?           */
  if (where<0) {z=zmin; above=TRUE;}
  else if (where>0) {z=zmax; above=FALSE;}
  else {z=round(.5*(zmin+zmax)); above=TRUE;}
  if (slice_triangle(z,t,above,s) && !eq2(s[0],s[1]))
    append_segment(seglist,new_segment2(_,&s[0],&s[1],1,1,0),TRUE);
  return t;
  }

/*****************************************************************************
double_slice_triangle:  Slices the given triangle "t" at the bottom and top of
a layer ("zmin" and "zmax", respectively).  The segment from the bottom slice
is added to the segment list "sla".  The bottom and top slices are used to form
a polygon, the projection of which onto a plane of constant z is decomposed
into its constituent segments and added to the segment list "slb".  Zero length
segments are suppressed.
*****************************************************************************/

TRIANGLE *double_slice_triangle (zmin, zmax, t, sla, slb)
DOUBLE zmin;                /* bottom of layer                       */
DOUBLE zmax;                /* top of layer                          */
TRIANGLE *t;                /* triangle                              */
SEGLIST *sla;               /* segment list from bottom cut          */
SEGLIST *slb;               /* segment list from projections         */
  {
  DOUBLE2 a[2];             /* points from bottom cut                */
```

```
DOUBLE2 b[3];                  /* triangle vertex projections                  */

DOUBLE2 c[2];                  /* points from top cut                          */


b[0].x=(DOUBLE)t->pt[0].x;
b[0].y=(DOUBLE)t->pt[0].y;
b[1].x=(DOUBLE)t->pt[1].x;
b[1].y=(DOUBLE)t->pt[1].y;
b[2].x=(DOUBLE)t->pt[2].x;
b[2].y=(DOUBLE)t->pt[2].y;

if (slice_triangle(zmin,t,TRUE,a))
  {
  if (!eq2(a[0],a[1]))
    append_segment(sla,new_segment2(_,&a[0],&a[1],1,1,0),TRUE);
  if (slice_triangle(zmax,t,FALSE,c)) /* both top and bottom slices        */

    {
    if (t->znorm>0) append_polygon(slb,&a[0],&a[1],&c[1],&c[0],_);
    else if (t->znorm<0) append_polygon(slb,&a[0],&c[0],&c[1],&a[1],_);
    }
  else                                  /* bottom slice only                   */

    {
    if (t->znorm>0) append_polygon(slb,&a[0],&a[1],&b[2],_);
    else if (t->znorm<0) append_polygon(slb,&a[0],&b[2],&a[1],_);
    }
  }
else if (slice_triangle(zmax,t,FALSE,c)) /* top slice only                    */

  {
  if (t->znorm>0) append_polygon(slb,&b[0],&c[1],&c[0],_);
  else if (t->znorm<0) append_polygon(slb,&b[0],&c[0],&c[1],_);
  }
else errexit ("ERROR #3013:  Triangle failed to slice");
return t;
}

/******************************************************************************

slice_triangle:  Returns the rounded off two point segment at which a given z
level "z" slices through a triangle "t".  If "above" is TRUE, triangle is
sliced just above "z", else triangle is sliced just below "z".  Returns the
slice segment "s".  If z is above or below the triangle or cuts only one point

of the triangle at the top or bottom, a NULL is returned.
******************************************************************************/

DOUBLE2 *slice_triangle (z, t, above, s)
```

```
DOUBLE z;                   /* slice level                          */
TRIANGLE *t;                /* triangle to slice                    */
BOOLEAN above;              /* slice slightly above z?              */
DOUBLE2 s[2];               /* cut segment                          */
  {
  DOUBLE frac;              /* fraction of triangle side            */
  FLOAT3 *o;                /* triangle vertex                      */
  DOUBLE2 swap;             /* swap space                           */

  o=t->pt;
  if (z<(DOUBLE)o[0].z) return NULL;
  if (z>(DOUBLE)o[2].z) return NULL;
  if (z==(DOUBLE)o[2].z)
    {
    if (above || z>(DOUBLE)o[1].z) return NULL;
    s[0].x=(DOUBLE)o[2].x;
    s[0].y=(DOUBLE)o[2].y;
    s[1].x=(DOUBLE)o[1].x;
    s[1].y=(DOUBLE)o[1].y;
    }
  else if (z==(DOUBLE)o[0].z)
    {
    if (!above || z<(DOUBLE)o[1].z) return NULL;
    s[0].x=(DOUBLE)o[0].x;
    s[0].y=(DOUBLE)o[0].y;
    s[1].x=(DOUBLE)o[1].x;
    s[1].y=(DOUBLE)o[1].y;
    }
  else
    {
    if (z>(DOUBLE)o[1].z)
      {
      frac=(z-(DOUBLE)o[0].z)/((DOUBLE)o[2].z-(DOUBLE)o[0].z);
      s[0].x=(DOUBLE)o[0].x+frac*((DOUBLE)o[2].x-(DOUBLE)o[0].x);
      s[0].y=(DOUBLE)o[0].y+frac*((DOUBLE)o[2].y-(DOUBLE)o[0].y);
      frac=(z-(DOUBLE)o[1].z)/((DOUBLE)o[2].z-(DOUBLE)o[1].z);
      s[1].x=(DOUBLE)o[1].x+frac*((DOUBLE)o[2].x-(DOUBLE)o[1].x);
      s[1].y=(DOUBLE)o[1].y+frac*((DOUBLE)o[2].y-(DOUBLE)o[1].y);
      }
    else if (z<(DOUBLE)o[1].z)
      {
      frac=(z-(DOUBLE)o[0].z)/((DOUBLE)o[2].z-(DOUBLE)o[0].z);
      s[0].x=(DOUBLE)o[0].x+frac*((DOUBLE)o[2].x-(DOUBLE)o[0].x);
      s[0].y=(DOUBLE)o[0].y+frac*((DOUBLE)o[2].y-(DOUBLE)o[0].y);
      frac=(z-(DOUBLE)o[0].z)/((DOUBLE)o[1].z-(DOUBLE)o[0].z);
```

```
      s[1].x=(DOUBLE)o[0].x+frac*((DOUBLE)o[1].x-(DOUBLE)o[0].x);
      s[1].y=(DOUBLE)o[0].y+frac*((DOUBLE)o[1].y-(DOUBLE)o[0].y);
      }
    else
      {
      frac=(z-(DOUBLE)o[0].z)/((DOUBLE)o[2].z-(DOUBLE)o[0].z);
      s[0].x=(DOUBLE)o[0].x+frac*((DOUBLE)o[2].x-(DOUBLE)o[0].x);
      s[0].y=(DOUBLE)o[0].y+frac*((DOUBLE)o[2].y-(DOUBLE)o[0].y);
      s[1].x=(DOUBLE)o[1].x;
      s[1].y=(DOUBLE)o[1].y;
      }
    }
  if (t->orient<0)
    {
    swap=s[0];
    s[0]=s[1];
    s[1]=swap;
    }
  s[0]=round2(s[0]);
  s[1]=round2(s[1]);
  return s;
  }

/******************************************************************************

sort_triangles:  Sorts the circularly linked triangle list "ta".
******************************************************************************/

TRIANGLE *sort_triangles (ta)
TRIANGLE *ta;                  /* first triangle in list                     */

  {
  TRIANGLE *tb=ta->next;       /* second triangle in list                    */

  if (ta==tb) return ta;
  if (tb==ta->prev)
    {
    if (compare_triangles(ta,tb)<=0) return ta;
    return tb;
    }
  tb=bisect_triangles(ta);
  ta=sort_triangles(ta);
  tb=sort_triangles(tb);
  ta=merge_triangles(ta,tb);
  return ta;
  }

/******************************************************************************

bisect_triangles:  Splits the circularly linked triangle list "ta" into two
lists "ta" and "tb".  "ta" is altered, "tb" is returned.
```

```
*****************************************************************************/

TRIANGLE *bisect_triangles (ta)
TRIANGLE *ta;                   /* 1st half of split list                  */

  {
  TRIANGLE *ta0;               /* initial triangle of "ta" list            */

  TRIANGLE *tb;                /* 2nd half of split list                   */

  TRIANGLE *tb_last;           /* last triangle in 2nd list                */

  if (ta->next==ta) return NULL;
  ta0=ta;
  tb=ta;
  tb_last=tb->prev;
  while (1)
    {
    tb=tb->prev;
    if (ta==tb) break;
    ta=ta->next;
    if (ta==tb) break;
    }
  ta=ta->prev;
  ta->next=ta0;
  ta0->prev=ta;
  tb->prev=tb_last;
  tb_last->next=tb;
  return tb;
  }

/*****************************************************************************

merge_triangles: Merges the two sorted circularly linked triangle lists "ta"
and "tb" which are subsequenty destroyed.
*****************************************************************************/

TRIANGLE *merge_triangles (ta, tb)
TRIANGLE *ta;                  /* 1st triangle list to merge               */

TRIANGLE *tb;                  /* 2nd triangle list to merge               */

  {
  TRIANGLE *ta_last;           /* last triangle in "ta" list               */

  TRIANGLE *tb_last;           /* last triangle in "tb" list               */

  TRIANGLE *temp;              /* swap location                            */

  TRIANGLE *tc;                /* triangle in one list                     */
```

```
  TRIANGLE *td;               /* triangle in other list                         */

  if (compare_triangles(ta,tb)>0) (temp=ta; ta=tb; tb=temp;)
  ta_last=ta->prev;
  tb_last=tb->prev;
  tc=ta;
  td=tb;
  while (tc=tc->next,tc!=ta && tc!=tb)
    {
    if (compare_triangles(tc,td)<=0) continue;
    tc->prev->next=td;
    td->prev=tc->prev;
    temp=tc; tc=td; td=temp;
    }
  if (tc==ta)
    {
    ta_last->next=td;
    td->prev=ta_last;
    tb_last->next=ta;
    ta->prev=tb_last;
    }
  else
    {
    tb_last->next=td;
    td->prev=tb_last;
    }
  return ta;
  }

/*****************************************************************************

compare_triangles:  Returns -1, 0, or 1 if triangle "ta" should
come before, at same spot, or after triangle "tb" in triangle list.
*****************************************************************************/

SIGN compare_triangles (ta, tb)
TRIANGLE *ta;
TRIANGLE *tb;
  {
  if (ta->pt[0].z<tb->pt[0].z) return -1;
  if (ta->pt[0].z>tb->pt[0].z) return 1;
  if (ta->pt[2].z<tb->pt[2].z) return -1;
  if (ta->pt[2].z>tb->pt[2].z) return 1;
  if (ta->znorm>tb->znorm) return -1;
  if (ta->znorm<tb->znorm) return 1;
  return 0;
  }

/*****************************************************************************

PART:
```

```
*******************************************************************************/

/*******************************************************************************

new_part: Allocates and initializes a new part "part" with the data type
"type" (TRIANGLES, SEGMENTS, or POLYLINES) and intermediate part file "file".
*******************************************************************************/

PART *new_part (part, type, file)
PART *part;                  /* part                                          */

INT type;                    /* type of data                                  */

STREAM *file;                /* internal file                                 */

  {
  if (!part) part=allocate(PART);
  if (!part) errexit("ERROR #3014:  Memory exhausted");
  part->triangles=0;
  part->downflats=0;
  part->upflats=0;
  part->downtilteds=0;
  part->uptilteds=0;
  part->verticals=0;
  part->layers=0;
  part->min.x=MAX_DBL;
  part->min.y=MAX_DBL;
  part->min.z=MAX_DBL;
  part->max.x=0.;
  part->max.y=0.;
  part->max.z=0.;
  part->missing=0;
  part->misoriented=0;
  part->type=type;
  part->inwindow=FALSE;
  part->file=file;
  part->tfirst=NULL;
  part->tlast=NULL;
  part->plfirst=NULL;
  part->pllast=NULL;
  return part;
  }

/*******************************************************************************

delete_part:  Deallocates the part "part" and returns NULL.
*******************************************************************************/

PART *delete_part (part)
PART *part;                  /* part to delete                                */
```

```
  {
  if (!part) return NULL;
  if (part->type==TRIANGLES) delete_tripart(part);
  else delete_polypart(part);
  deallocate(part);
  return NULL;
  }

/*****************************************************************************

delete_tripart:  Deallocates the triangle list defining the part "part" and
returns NULL.
*****************************************************************************/

PART *delete_tripart (part)
PART *part;
  {
  TRIANGLE *t;                  /* triangle to delete                        */

  if (!part) return NULL;
  for (t=part->tfirst; t; t=t->next)
    {
    t->parent=NULL;
    delete_triangle(t);
    }
  part->tfirst=NULL;
  part->tlast=NULL;
  return NULL;
  }

/*****************************************************************************

delete_polypart:  Deallocates the list of polyline lists defining the part
"part" and return NULL.
*****************************************************************************/

PART *delete_polypart (part)
PART *part;
  {
  POLYLIST *pl;                /* list of polylines to delete                */

  if (!part) return NULL;
  for (pl=part->plfirst; pl; pl=pl->next)
    {
    pl->parent=NULL;
    delete_polylist(pl);
    }
  part->plfirst=NULL;
  part->pllast=NULL;
  return NULL;
  }
```

```
/******************************************************************************

dump_part:  Dumps the part "part".
******************************************************************************/

VOID dump_part (part)
PART *part;                     /* part                                        */

  {
  dump("PART %08lx: ",part);
  if (!part) {dump("\n"); return;}
  dump("type=%s file=%lx\n",part->type==TRIANGLES?"triangles"
  :part->type==POLYLINES?"polylines":"?",part->file);
  dump("triangles=%ld\n",part->triangles);
  dump("downflats=%ld\n",part->downflats);
  dump("upflats=%ld\n",part->upflats);
  dump("downtilteds=%ld\n",part->downtilteds);
  dump("uptilteds=%ld\n",part->uptilteds);
  dump("verticals=%ld\n",part->verticals);
  dump("layers=%d\n",part->layers);
  dump("min=%lg %lg %lg\n",part->min);
  dump("max=%lg %lg %lg\n",part->max);
  dump("missing=%d\n",part->missing);
  dump("misoriented=%d\n",part->misoriented);
  if (part->type==TRIANGLES) dump_tripart(part);
  else dump_polypart(part);
  return;
  }


/******************************************************************************

dump_tripart:  Dumps the triangle list defining the part "part".
******************************************************************************/

VOID dump_tripart (part)
PART *part;                     /* part                                        */

  {
  TRIANGLE *t;                  /* triangle                                    */

  INT index=0;
  dump("PART %08lx:\n",part);
  if (!part) return;
  if (part->tfirst && !part->tlast || part->tlast && !part->tfirst)
    errexit("ERROR #3015:  Corrupted list:  first=%lx last=%lx\n"
    ,part->tfirst,part->tlast);
  if (!part->tfirst) return;
  if (part->tfirst->prev && (part->tfirst!=part->tlast || !part->tlast->next)
    || part->tlast->next && (part->tfirst!=part->tlast || !part->tfirst->prev))
```

```
    errexit("ERROR #3016:  Corrupted list:  first->prev=%lx first=%lx last=%lx
last->next=%lx\n",
      part->tfirst->prev,part->tfirst,part->tlast,part->tlast->next);
  dump("first=%lx last=%lx\n",part->tfirst,part->tlast);
  for (t=part->tfirst; t; t=t->next)
    {
    dump("#%d ",index++);
    dump_triangle(t);
    if (!t->parent) errexit("ERROR #3017:  Missing parent:  t=%lx\n",t);
    if (t->prev && t!=t->prev->next || t->next &&
      t!=t->next->prev)
      errexit("ERROR #3018:  Corrupted list:  prev=%08lx next=%08lx"
      ,t->prev,t->next);
    if (!t->next && t!=part->tlast)
      errexit("ERROR #3019:  Corrupted list:  t=%lx last=%lx\n",t,part->tlast);

    }
  return;
  }

/*****************************************************************************

dump_polypart:  Dumps the list of polyline lists defining the part "part".
*****************************************************************************/

VOID dump_polypart (part)
PART *part;                 /* part                                          */

  {
  POLYLIST *pl;             /* list of polylines                             */

  INT index=0;
  dump("PART %08lx:\n",part);
  if (!part) return;
  if (part->plfirst && !part->pllast || part->pllast && !part->plfirst)
    errexit("ERROR #3020:  Corrupted list:  first=%lx last=%lx\n"
    ,part->plfirst,part->pllast);
  if (!part->plfirst) return;
  if (part->plfirst->prev
  && (part->plfirst!=part->pllast || !part->pllast->next)
  || part->pllast->next
  && (part->plfirst!=part->pllast || !part->plfirst->prev))
    errexit("ERROR #3021:  Corrupted list:  first->prev=%lx first=%lx last=%lx
last->next=%lx\n"
    ,part->plfirst->prev,part->plfirst,part->pllast,part->pllast->next);
  dump("first=%lx last=%lx\n",part->plfirst,part->pllast);
  for (pl=(POLYLIST*)part->plfirst; pl; pl=pl->next)
    {
    dump("#%d ",index++);
    dump_polylist(pl);
    if (!pl->parent) errexit("ERROR #3022:  Missing parent:  pl=%lx\n",pl);
    if (pl->prev && pl!=pl->prev->next || pl->next &&
```

```
    pl!=pl->next->prev)
      errexit("ERROR #3023:  Corrupted list:  prev=%08lx next=%08lx"
      ,pl->prev,pl->next);
    if (!pl->next && pl!=(POLYLIST*)part->pllast)
      errexit("ERROR #3024:  Corrupted list:  pl=%lx last=%lx\n"
      ,pl,part->pllast);
    }
  return;
  }

/*****************************************************************************

get_part:  Returns the part read from the input file "stream" using the user
information "ui".
*****************************************************************************/

PART *get_part (stream, ui)
STREAM *stream;                /* input stream                              */

USERINFO *ui;                  /* user information                          */

  {
  PART *part;                  /* triangle list                             */

  DOUBLE zlow;                 /* low z cutoff                              */

  DOUBLE zhigh;                /* high z cutoff                             */

  RANGE *range;                /* range                                     */

  TIME_T time0;                  /* start time for function                 */

  if (ui->timing) time0=time(_);

  if (ui->layeronly) zlow=ui->min.z;
  else if (ui->min.z>0.)
    {
    range=get_range2(ui->rangelist,ui->min.z,-1);
    zlow=round(ui->min.z-range->zs);
    }
  else ui->min.z=0.;

  if (ui->layeronly) zhigh=ui->max.z;
  else if (ui->max.z<MAX_DBL)
    {
    range=get_range2(ui->rangelist,ui->max.z,1);
    zhigh=round(ui->max.z+range->zs);
    }
  else zhigh=MAX_DBL;

  switch (ui->data)
    {
```

```
    case TRIANGLES:
      part=get_tripart(stream,ui,zlow,zhigh);
      break;
    case SEGMENTS:
      part=get_segpart(stream,ui,zlow,zhigh);
      break;
    case POLYLINES:
      part=get_polypart(stream,ui,zlow,zhigh);
      break;
    }
  if (ui->timing) timing->get_part+=difftime(time(_),time0);
  return part;
  }

/*****************************************************************************

get_tripart:  Reads the triangle defined part from the input file "stream"
between the z values of "zlow" and "zhigh" using the user information "ui".
Writes the part to the internal file in sorted order and deletes the triangle
list of the part.  Returns the part.
*****************************************************************************/

PART *get_tripart (stream, ui, zlow, zhigh)
STREAM *stream;              /* input stream                              */

USERINFO *ui;                /* user information                          */

DOUBLE zlow;                 /* low z cutoff                              */

DOUBLE zhigh;                /* high z cutoff                             */

  {
  PART *part;                /* part                                      */

  TRIANGLE *t=NULL;          /* triangle                                  */

  FLOAT3 *o;                 /* triangle vertex                           */

  INT i;                     /* triangle vertex index                     */


  part=new_part(_,TRIANGLES,ui->internal);
  while (t=read_triangle(stream,ui))
    {
    part->layers++;
    o=t->pt;
    part->triangles++;
    if (o[0].z==o[2].z)
      {
      if (t->znorm<0) part->downflats++;
      else part->upflats++;
      }
```

```
    else if (t->znorm<0) part->downtilteds++;
    else if (t->znorm>0) part->uptilteds++;
    else part->verticals++;

    for (i=0; i<3; i++)
      {
      if (o[i].x<part->min.x) part->min.x=o[i].x;
      if (o[i].x>part->max.x) part->max.x=o[i].x;
      if (o[i].y<part->min.y) part->min.y=o[i].y;
      if (o[i].y>part->max.y) part->max.y=o[i].y;
      }

    if (o[0].z<part->min.z) part->min.z=o[0].z;
    if (o[2].z>part->max.z) part->max.z=o[2].z;
    if (o[0].z==o[2].z || o[2].z<=zlow || o[0].z>=zhigh)
      delete_triangle(t);
    else append_triangle(part,t);
    }
  if (!part->tfirst) part->inwindow=FALSE;
  else
    {
    part->inwindow=TRUE;
    sort_tripart(part);
    if (ui->debug&2) {DUMP("\n*300\n"); DUMP_PART(part);}
    write_tripart(part->file,part);
    rewind_stream(part->file);
    delete_tripart(part);
    }
  return part;
  }

/*******************************************************************************

get_segpart:  Reads the segment defined part from the input file "stream"
between the z values of "zlow" and "zhigh" using the user information "ui" and

converts the part to a list of polyline lists.  Writes the part to the internal

file and deletes the list of polyline lists of the part.  Returns the part.
*******************************************************************************/

PART *get_segpart (stream, ui, zlow, zhigh)
STREAM *stream;             /* input stream                                    */

USERINFO *ui;               /* user information                                */

DOUBLE zlow;                /* low z cutoff                                    */

DOUBLE zhigh;               /* high z cutoff                                   */

  {
```

```
PART *part;                 /* part                                    */

SEGLIST *sl;                /* segment list                            */

POLYLIST *pl=NULL;          /* polyline list                           */

BOOLEAN missing=FALSE;      /* any missing segments?                   */

BOOLEAN misoriented=FALSE;  /* any misoriented segments?               */

part=new_part(_,POLYLINES,ui->internal);
while (sl=stream->format==ASCII?read_ascii_seglist(stream)
:read_binary_seglist(stream))
  {
  part->layers++;
  if (sl->min.x<part->min.x) part->min.x=sl->min.x;
  if (sl->max.x>part->max.x) part->max.x=sl->max.x;
  if (sl->min.y<part->min.y) part->min.y=sl->min.y;
  if (sl->max.y>part->max.y) part->max.y=sl->max.y;
  if (sl->min.z<part->min.z) part->min.z=sl->min.z;
  if (sl->max.z>part->max.z) part->max.z=sl->max.z;
  if (sl->min.z==sl->max.z || sl->max.z<=zlow || sl->min.z>=zhigh)
    {
    delete_seglist(sl);
    continue;
    }
  sl=sort_seglist(sl);
  sl=condense_seglist(sl);
  pl=new_polylist2(_,sl,ui->reorient,ui->warn?&misoriented:_,FALSE);
  if (!ui->raw)
    {
    pl=degap_polylist(pl,ui->reorient,ui->warn?&missing:_
    ,ui->warn?&misoriented:_);
    if (ui->reorient) pl=reorient_polylist(pl,ui->warn?&misoriented:_);
    else pl=boolean_polylists(pl,_,1,0);
    }
  if (missing)
    {
    dump("WARNING #3000:  Missing segments recreated on layer %lg\n"
    ,stoc(pl->min.z,Z));
    part->missing++;
    }
  if (misoriented)
    {
    dump("WARNING #3001:  Misoriented segments reoriented on layer %lg\n"
    ,stoc(pl->min.z,Z));
    part->misoriented++;
    }
  write_polylist2(part->file,pl);
  delete_polylist(pl);
  }
```

```
  if (ui->debug&2) {DUMP("\n*301\n"); DUMP_PART(part);}
  if (part->inwindow) rewind_stream(part->file);
  return part;
  }

/*****************************************************************************

get_polypart:  Reads the polyline defined part from the input file "stream"
between the z values of "zlow" and "zhigh" using the user information "ui".
Writes the part to the internal file and deletes the list of polyline lists of

the part.  Returns the part.
*****************************************************************************/

PART *get_polypart (stream, ui, zlow, zhigh)
STREAM *stream;               /* input stream                                */

USERINFO *ui;                 /* user information                            */

DOUBLE zlow;                  /* low z cutoff                                */

DOUBLE zhigh;                 /* high z cutoff                               */

  {
  PART *part;                 /* part                                        */

  POLYLIST *pl=NULL;          /* polyline list                               */

  BOOLEAN missing=FALSE;      /* any missing segments?                       */

  BOOLEAN misoriented=FALSE;  /* any misoriented segments?                   */


  part=new_part(_,POLYLINES,ui->internal);
  while (pl=stream->format==ASCII?read_ascii_polylist(stream)
  :read_binary_polylist(stream))
    {
    part->layers++;
    if (pl->min.x<part->min.x) part->min.x=pl->min.x;
    if (pl->max.x>part->max.x) part->max.x=pl->max.x;
    if (pl->min.y<part->min.y) part->min.y=pl->min.y;
    if (pl->max.y>part->max.y) part->max.y=pl->max.y;
    if (pl->min.z<part->min.z) part->min.z=pl->min.z;
    if (pl->max.z>part->max.z) part->max.z=pl->max.z;
    if (pl->min.z==pl->max.z || pl->max.z<=zlow || pl->min.z>=zhigh)
      {
      delete_polylist(pl);
      continue;
      }
    part->inwindow=TRUE;
    close_polylist(pl);
    if (!ui->raw)
```

```
      {
      pl=degap_polylist(pl,ui->reorient,ui->warn?&missing:_
      ,ui->warn?&misoriented:_);
      if (ui->reorient) pl=reorient_polylist(pl,ui->warn?&misoriented:_);
      else pl=boolean_polylists(pl,_,1,0);
      }
    if (missing)
      {
      dump("WARNING #3002:  Missing polylines recreated on layer %lg\n"
      ,stoc(pl->min.z,Z));
      part->missing++;
      }
    if (misoriented)
      {
      dump("WARNING #3003:  Misoriented polylines reoriented on layer %lg\n"
      ,stoc(pl->min.z,Z));
      part->misoriented++;
      }
    write_polylist2(part->file,pl);
    delete_polylist(pl);
    }
  if (ui->debug&2) {DUMP("\n*309\n"); DUMP_PART(part);}
  if (part->inwindow) rewind_stream(part->file);
  return part;
  }

/*****************************************************************************

slice_part:  Slices through the part "part" at a given layer number "layerno"
between the z values of "zmin" and "zmax" using the user information "ui".
Returns a list of polylines which represent the boundaries on the given layer.

*****************************************************************************/

POLYLIST *slice_part (layerno, zmin, zmax, part, ui)
INT layerno;                 /* absolute layer number                      */

DOUBLE zmin;                 /* bottom of layer                            */

DOUBLE zmax;                 /* top of layer                               */

PART *part;                  /* input part                                 */

USERINFO *ui;                /* user information                           */

  {
  POLYLIST *pl;              /* polyline list                              */

  TIME_T time0;                /* start time for function                  */

  if (ui->timing) time0=time(_);
  if (part->type==TRIANGLES) pl=slice_tripart(layerno,zmin,zmax,part,ui);
```

```
  else pl=slice_polypart(layerno,zmin,zmax,part,ui);
  if (ui->window && (ui->min.x>pl->min.x || ui->min.y>pl->min.y
  || ui->max.x<pl->max.x || ui->max.y<pl->max.y))
    pl=intersect_polylists(pl,ui->window,2);
  if (ui->raw) return pl;
  if (ui->timing) timing->slice_part+=difftime(time(_),time0);
  return pl;
  }

/*****************************************************************************

slice_tripart:  Slices through the triangle list of the part "part" on a given

layer "layerno" of the slice axis between "zmin" and "zmax" using the user
information "ui" and returns a list of polylines representing the boundaries of

the given layer.
The output layer depends on the style:
-2:  undersize.
-1:  low cut.
 0:  mid cut.
 1:  high cut.
 2:  oversize.
*****************************************************************************/

POLYLIST *slice_tripart (layerno, zmin, zmax, part, ui)
INT layerno;                  /* layer number                                  */

DOUBLE zmin;                  /* bottom of layer                               */

DOUBLE zmax;                  /* top of layer                                  */

PART *part;                   /* part                                          */

USERINFO *ui;                 /* user information                              */

  {
  SEGLIST *sla;               /* segment list from bottom slice                */

  SEGLIST *slb;               /* segment list from projections                 */

  POLYLIST *pla;              /* polyline list from bottom slice               */

  POLYLIST *plb;              /* polygon list from projections                 */

  TRIANGLE *t;                /* triangle in list                              */

  INT style=ui->style;        /* slice style -2)under -1)low 0)mid 1)high 2)o*/

  BOOLEAN missing=FALSE;      /* any missing segments?                         */
```

```
BOOLEAN misoriented=FALSE;  /* any misoriented segments?                  */

read_tripart(part->file,part,zmax);
if (!part->tfirst || zmax<0.)
  return new_polylist(_,layerno,zmin,zmax);
sla=new_seglist(_,layerno,zmin,zmax);
if (style>-2 && style<2)
  {
  for (t=part->tfirst; t; t=t->next)
    {
    if ((DOUBLE)t->pt[0].z>=zmax) break;
    if ((DOUBLE)t->pt[2].z<=zmin) delete_triangle(t);
    else single_slice_triangle(zmin,zmax,t,sla,style);
    }  /* t */
  sla=sort_seglist(sla);
  sla=condense_seglist(sla);
  if (ui->raw)
    {
    pla=new_polylist2(_,sla,ui->reorient,ui->warn?&misoriented:_,FALSE);
    goto done;
    }
  pla=new_polylist2(_,sla,ui->reorient,ui->warn?&misoriented:_,FALSE);
  pla=degap_polylist(pla,ui->reorient,ui->warn?&missing:_
  ,ui->warn?&misoriented:_);
  if (ui->reorient) pla=reorient_polylist(pla,ui->warn?&misoriented:_);
  else pla=boolean_polylists(pla,_,1,0);
  }
else
  {
  slb=new_seglist(_,layerno,zmin,zmax);
  for (t=part->tfirst; t; t=t->next)
    {
    if ((DOUBLE)t->pt[0].z>=zmax) break;
    if ((DOUBLE)t->pt[2].z<=zmin) delete_triangle(t);
    else double_slice_triangle(zmin,zmax,t,sla,slb);
    }  /* t */
  sort_seglist(sla);
  condense_seglist(sla);
  pla=new_polylist2(_,sla,ui->reorient,ui->warn?&misoriented:_,FALSE);
  pla=degap_polylist(pla,ui->reorient,ui->warn?&missing:_
  ,ui->warn?&misoriented:_);
  if (ui->reorient) pla=reorient_polylist(pla,ui->warn?&misoriented:_);
  else pla=boolean_polylists(pla,_,1,0);
  slb=sort_seglist(slb);
  slb=condense_seglist(slb);
  slb=split_seglist(slb);
  slb=boolean_seglist(slb,1,0);
  plb=new_polylist2(_,slb,FALSE,_,TRUE);
  if (style==-2) pla=intersect_polylists(pla,plb,0);
  else /*if (style==2)*/ pla=union_polylists(pla,plb,0);
  }
done:
```

```
  if (missing)
    {
    dump("WARNING #3004:  Missing segments recreated on layer %d\n",layerno);
    part->missing++;
    }
  if (misoriented)
    {
    dump("WARNING #3005:  Misoriented segments reoriented on layer %d\n"
    ,layerno);
    part->misoriented++;
    }
  return pla;
  }

/*****************************************************************************

slice_polypart:  Using the user information "ui", reads in the input layers of

the part "part" from the intermediate file which impinge on the z interval
between "zmin" and "zmax" and combines them to form the output layer
numbered "layerno".  Returns the output layer as a polyline list.
The combining of the input layers to make an output layer depends on the style:

-2:  undersize -- intersect input layers.
-1:  low cut   -- first input layer.
 0:  mid size -- mean input layer.
 1:  high cut -- last input layer.
 2:  oversize -- union input layers.
*****************************************************************************/

POLYLIST *slice_polypart (layerno, zmin, zmax, part, ui)
INT layerno;                 /* layer number                                  */

DOUBLE zmin;                 /* bottom of layer                               */

DOUBLE zmax;                 /* top of layer                                  */

PART *part;                  /* part                                          */

USERINFO *ui;                /* user information                              */

  {
  POLYLIST *pla;             /* polyline list in buffer                       */

  POLYLIST *plb;             /* polyline list after cut                       */

  INT style=ui->style;       /* slice style -2)under -1)low 0)mid 1)high 2)o*/

  read_polypart(part->file,part,zmax);
  for (pla=part->plfirst; pla; pla=pla->next)
    {
    if (pla->min.z>=zmax) break;
```

```
    if (pla->max.z<=zmin)
      {
      delete_polylist(pla);
      continue;
      }
    plb=new_polylist1(_,pla);
    plb->layerno=layerno;
    plb->min.z=zmin;
    plb->max.z=zmax;
    return plb;
    }
  return new_polylist(_,layerno,zmin,zmax);
  }

/*****************************************************************************

read_tripart:  Reads in all triangles from the intermediate file "stream" of
sorted triangles containing a given z level "z" and appends them to the
triangle list of the part "part".  Returns "part".
*****************************************************************************/

PART *read_tripart (stream, part, z)
STREAM *stream;
PART *part;
DOUBLE z;
  {
  TRIANGLE *t;                /* triangle read in                            */

  CHAR chr[2];                /* character buffer                            */

  do
    {
    t=new_triangle(_);
    if (fread(t->pt,sizeof(FLOAT),9,stream->file)!=9
    || fread(chr,sizeof(CHAR),2,stream->file)!=2)
      {
      delete_triangle(t);
      break;
      }
    t->orient=(SIGN)chr[0];
    t->znorm=(SIGN)chr[1];
    append_triangle(part,t);
    }
  while ((DOUBLE)t->pt[0].z<z || ((DOUBLE)t->pt[2].z<=z && t->znorm>0));
  return part;
  }

/*****************************************************************************

write_tripart:  Writes out the triangle list of the part "part" to the
intermediate file "stream" of sorted triangles.  Returns "part".
```

```
*******************************************************************************/

PART *write_tripart (stream, part)
STREAM *stream;              /* internal file                                  */

PART *part;                  /* triangle list                                  */

  {
  TRIANGLE *t;               /* triangle in list "part"                        */

  CHAR chr[2];               /* character buffer                               */

  if (!part->tfirst) return part;
  for (t=part->tfirst; t; t=t->next)
    {
    chr[0]=(CHAR)t->orient;
    chr[1]=(CHAR)t->znorm;
    if (fwrite(t->pt,sizeof(FLOAT),9,stream->file)!=9
    || fwrite(chr,sizeof(CHAR),2,stream->file)!=2)
      errexit("ERROR #3025:  Error writing intermediate triangle file \"%s\""
      ,stream->name);
    }
  return part;
  }

/*******************************************************************************

read_polypart:  Reads in all polyline lists from the intermediate data file
"stream" whose z values are less than a given z level "z" and appends them to
the list of polyline lists of the part "part".  Returns "part".
*******************************************************************************/

PART *read_polypart (stream, part, z)
STREAM *stream;              /* file                                           */

PART *part;                  /* part                                           */

DOUBLE z;                    /* upper bound on z value                         */

  {
  POLYLIST *pl=NULL;         /* polyline list                                  */

  POLYLINE *p;               /* polyline in list                               */

  BOOLEAN pclosed;           /* closed polyline?                               */

  INT pcount;                /* number of polylines in list                    */

  INT vcount;                /* number of vertices in polyline                 */

  INT i;                     /* polyline index                                 */
```

```
  INT j;                    /* vertex index                                */
  VERTEX *v;                /* vertex                                      */
  FLOAT flt[2];             /* floating point buffer                       */
  CHAR chr;                 /* character buffer                            */
  do
    {
    pl=new_polylist(_,0,0.,0.);
    if (fread(flt,sizeof(FLOAT),2,stream->file)!=2
    || fread(&pcount,sizeof(INT),1,stream->file)!=1)
      {
      delete_polylist(pl);
      break;
      }
    pl->min.z=(DOUBLE)flt[0];
    pl->max.z=(DOUBLE)flt[1];
    for (i=0; i<pcount; i++)
      {
      p=new_polyline(_);
      if (fread(&chr,sizeof(CHAR),1,stream->file)!=1)
        errexit("ERROR #3026:  Error reading polyline closure from internal
file\n");
      pclosed=(BOOLEAN)chr;
      append_polyline(pl,p);
      if (fread(&vcount,sizeof(INT),1,stream->file)!=1)
        errexit("ERROR #3027:  Error reading vertex count from internal
file\n");
      for (j=0; j<vcount; j++)
        {
        v=new_vertex(_,0.,0.,_,0);
        if (fread(flt,sizeof(FLOAT),2,stream->file)!=2)
          errexit("ERROR #3028:  Error reading vertex from internal file\n");
        v->pt.x=(DOUBLE)flt[0];
        v->pt.y=(DOUBLE)flt[1];
        append_vertex(p,v,TRUE);
        }
      if (pclosed) close_polyline(p);
      }
    append_polylist(part,pl);
    }
  while (pl->min.z<z);
  return part;
  }

/*****************************************************************************

append_triangle:  Appends triangle "t" to the part "part".
*****************************************************************************/
```

```
PART *append_triangle (part, t)
PART *part;
TRIANGLE *t;
  {
  if (!t) return part;
  if (!part->tfirst)
    {
    part->tfirst=t;
    part->tlast=t;
    t->prev=NULL;
    }
  else
    {
    t->prev=part->tlast;
    part->tlast->next=t;
    part->tlast=t;
    }
  t->next=NULL;
  t->parent=part;
  return part;
  }

/*******************************************************************************

append_polylist:  Appends polyline list "pl" to the part "part".
*******************************************************************************/

PART *append_polylist (part, pl)
PART *part;
POLYLIST *pl;
  {
  if (!pl) return part;
  if (!part->plfirst)
    {
    part->plfirst=pl;
    part->pllast=pl;
    pl->prev=NULL;
    }
  else
    {
    pl->prev=part->pllast;
    part->pllast->next=pl;
    part->pllast=pl;
    }
  pl->next=NULL;
  pl->parent=part;
  return part;
  }
```

```
/*******************************************************************************
sort_tripart:  Sorts the triangle list defining the part "part" by minimum z.
*******************************************************************************/

PART *sort_tripart (part)
PART *part;                    /* part                                        */

  {
  TIME_T time0;                  /* start time for function
*/
  if (ui->timing) time0=time(_);
  if (!part->tfirst || !part->tfirst->next) return part;
  part->tfirst->prev=part->tlast;
  part->tlast=part->tlast->next=part->tfirst;
  part->tfirst=part->tlast=sort_triangles(part->tfirst);
  part->tlast=part->tlast->prev;
  part->tfirst->prev=NULL;
  part->tlast->next=NULL;
  if (ui->timing) timing->sort_tripart+=difftime(time(_),time0);
  return part;
  }
```

```
/*****************************************************************************
S4.C:  SEGMENT, SEGLIST.
*****************************************************************************/

#include "s.h"

/*****************************************************************************
SEGMENT:  Polygonal segment.
*****************************************************************************/


/*****************************************************************************
new_segment:  Allocates and initializes a new segment "s" and returns it.
*****************************************************************************/

SEGMENT *new_segment (s, x0, y0, x1, y1, orient, biorient, mark)
SEGMENT *s;                   /* segment                                    */

DOUBLE x0,y0;                 /* tail of segment                            */

DOUBLE x1,y1;                 /* head of segment                            */

INT orient;                   /* orientation 1)tail is tail -1)tail is head */

INT biorient;                 /* bigon orientation 1)ccw -1)cw              */

FLAGS mark;                   /* bit flags                                  */

  {
  if (!s) s=allocate(SEGMENT);
  if (!s) errexit("ERROR #4000:  Memory exhausted");
  s->mark=mark;
  s->biorient=biorient;
  if (y0<y1 || y0==y1 && x0<=x1)
    {
    s->orient=orient;
    s->pt[0].x=x0;
    s->pt[0].y=y0;
    s->pt[2].x=x1;
    s->pt[2].y=y1;
    }
  else
    {
    s->orient=-orient;
    s->pt[0].x=x1;
    s->pt[0].y=y1;
    s->pt[2].x=x0;
    s->pt[2].y=y0;
    }
```

```
  s->pt[1]=s->pt[0];
  s->prev=NULL;
  s->next=NULL;
  s->parent=NULL;
  return s;
  }

/*****************************************************************************

new_segment1:  Allocates and initializes a new segment "sa" from an old segment

"sb".
*****************************************************************************/

SEGMENT *new_segment1 (sa, sb)
SEGMENT *sa;                   /* new segment                                */

SEGMENT *sb;                   /* old segment                                */

  {
  if (!sa) sa=allocate(SEGMENT);
  if (!sa) errexit("ERROR #4001:  Memory exhausted");
  sa->orient=sb->orient;
  sa->biorient=sb->biorient;
  sa->mark=sb->mark;
  sa->pt[0]=sb->pt[0];
  sa->pt[1]=sb->pt[1];
  sa->pt[2]=sb->pt[2];
  sa->prev=NULL;
  sa->next=NULL;
  sa->parent=NULL;
  return sa;
  }

/*****************************************************************************

new_segment2:  Allocates and initializes a new segment "s" from two points
representing the "tail" and "head" of the segment, an oriention "orient", a
biorientation "biorient", and bit flags "mark".  If "orient" is positive, the
tail of the segment is assumed to be "tail" and head "head"; if "orient" is
negative the tail of the segment is assumed to be "head" and the head "tail".
*****************************************************************************/

SEGMENT *new_segment2 (s, tail, head, orient, biorient, mark)
SEGMENT *s;                    /* new segment                                */

DOUBLE2 *tail;                 /* tail of segment                            */

DOUBLE2 *head;                 /* head of segment                            */
```

```
INT orient;                  /* orientation 1)tail is tail -1)tail is head  */

INT biorient;                /* bigon orientation 1)ccw -1)cw               */

FLAGS mark;                  /* bit flags                                   */

  {
  if (!s) s=allocate(SEGMENT);
  if (!s) errexit("ERROR #4002:  Memory exhausted");
  s->mark=mark;
  s->biorient=biorient;
  if (tail->y<head->y || tail->y==head->y && tail->x<=head->x)
    {
    s->orient=orient;
    s->pt[0]=*tail;
    s->pt[2]=*head;
    }
  else
    {
    s->orient=-orient;
    s->pt[0]=*head;
    s->pt[2]=*tail;
    }
  s->pt[1]=s->pt[0];
  s->prev=NULL;
  s->next=NULL;
  s->parent=NULL;
  return s;
  }

/******************************************************************************

renew_segment:  Returns segment "s" after ensuring that the endpoints are
correctly ordered.
******************************************************************************/

SEGMENT *renew_segment (s)
SEGMENT *s;
  {
  if (s->pt[0].y<s->pt[2].y
  || s->pt[0].y==s->pt[2].y && s->pt[0].x<s->pt[2].x) return s;
  s->pt[0]=s->pt[2];      /* note that s->pt[0]==s->pt[1]    */
  s->pt[2]=s->pt[1];
  s->pt[1]=s->pt[0];
  s->orient=-s->orient;
  return s;
  }

/******************************************************************************

delete_segment:  Deallocates a segment "s" and returns NULL.
```

```
********************************************************************************/

SEGMENT *delete_segment (s)
SEGMENT *s;
  {
  SEGLIST *sl;
  if (!s) return NULL;
  if (sl=s->parent)
    {
    if (s==s->next) s->prev=s->next=NULL;
    else
      {
      if (s->prev) s->prev->next=s->next;
      if (s->next) s->next->prev=s->prev;
      }
    if (sl->first==s)
      {
      sl->first=s->next;
      if (sl->last==s) sl->last=sl->first;
      }
    else if (sl->last==s) sl->last=s->prev;
    }
  deallocate(s);
  return NULL;
  }

/********************************************************************************

deplete_segment:  Deletes a simple segment of orientation "orient" from a
compound segment "s".
********************************************************************************/

SEGMENT *deplete_segment (s, orient)
SEGMENT *s;                     /* segment                                     */

INT orient;                     /* orientation count                           */

  {
  s->orient-=orient;
  if (s->biorient>0) s->biorient--;
  else if (s->biorient<0) s->biorient++;
  if (!s->orient && !s->biorient) s=delete_segment(s);
  return s;
  }

/********************************************************************************

dump_segment:  Dumps a segment "s".
********************************************************************************/

VOID dump_segment (s)
```

```
SEGMENT *s;                         /* segment                                      */

  {
  dump("SEGMENT %08lx: ",s);
/*dump("%08lx: ",s);*/
  if (!s) {dump("\n"); return;}
/*dump("%7.7lg %7.7lg %7.7lg %7.7lg %7.7lg %7.7lg   ",
    s->pt[0],s->pt[1],s->pt[2]);*/
  dump("%7.7lg %7.7lg %7.7lg %7.7lg %7.7lg %7.7lg\n",
    s->pt[0],s->pt[1],s->pt[2]);
  dump("parent=%lx orient=%d biorient=%d mark=%d\n"
  ,s->parent,s->orient,s->biorient,s->mark);
/*dump("%2d %2d %d
%21x\n",s->orient,s->biorient,s->mark,(LONG)s->parent&256);*/
  if (s->parent && (s->prev && s!=s->prev->next
  || s->next && s!=s->next->prev))
    errexit("ERROR #4003:  Corrupted list:  prev=%08lx next=%08lx"
    ,s->prev,s->next);
  return;
  }

/**************************************************************************

dump_segment_view:  Dumps a segment "s" suitable for the view program.
**************************************************************************/

VOID dump_segment_view (s)
SEGMENT *s;                         /* segment                                      */

  {
/*dump("SEGMENT %08lx: ",s);*/
/*  dump("%08lx: ",s);  */
  if (!s) {dump("\n"); return;}
  dump("%7.7lg %7.7lg %7.7lg %7.7lg  ",
    s->pt[0],s->pt[2]);
/*dump("orient=%d biorient=%d mark=%d\n"
  ,s->orient,s->biorient,s->mark);*/
/*  dump("%2d %2d %d\n",s->orient,s->biorient,s->mark);   */
  if (s->parent && (s->prev && s!=s->prev->next
  || s->next && s!=s->next->prev))
    errexit("ERROR #4004:  Corrupted list:  prev=%08lx next=%08lx"
    ,s->prev,s->next);
  return;
  }

/**************************************************************************

delink_segment:  Removes a segment "s" from its segment list.
**************************************************************************/

SEGMENT *delink_segment (s)
```

```
SEGMENT *s;                      /* segment to remove                          */

  {
  SEGLIST *sl=s->parent;         /* segment list                               */

  if (s==s->next) s->prev=s->next=NULL;
  else
    {
    if (s->prev) s->prev->next=s->next;
    if (s->next) s->next->prev=s->prev;
    }
  if (sl->first==s)
    {
    sl->first=s->next;
    if (sl->last==s) sl->last=sl->first;
    }
  else if (sl->last==s) sl->last=s->prev;
  s->parent=NULL;
  return s;
  }

/******************************************************************************

transform_segment:  Applies a coordinate transformation "f" to a
segment represented by two points "o".
******************************************************************************/

DOUBLE *transform_segment (o, f)
DOUBLE o[2][2];
TRANSFORMATION *f;
  {
  INT i;                         /* point index                      */
  INT j;                         /* coordinate index                 */
  INT k;                         /* coordinate index                 */
  DOUBLE newpt[2];               /* result                           */
  for (i=0; i<2; i++)
    {
    for (j=0; j<2; j++)
      {
      newpt[j]=0.;
      for (k=0; k<2; k++)
        newpt[j]+=f->matrix[j][k]*o[i][k];
      newpt[j]+=f->matrix[j][3];
      }  /* j */
    for (j=0; j<2; j++) o[i][j]=newpt[j];
    }  /* i */
  return &o[0][0];
  }

/******************************************************************************

insert_segment:  Inserts segment "sb" into a segment list just after "sa".
```

```
******************************************************************************/

SEGMENT *insert_segment (sa, sb)
SEGMENT *sa;                    /* new segment                                  */

SEGMENT *sb;                    /* segment in list                              */

  {
  SEGLIST *sl=sa->parent;
  sb->parent=sl;
  sb->prev=sa;
  sb->next=sa->next;
  if (sa->next) sa->next->prev=sb;
  sa->next=sb;
  if (sl->last==sa) sl->last=sb;
  return sb;
  }

/******************************************************************************

preorder_segment:  Inserts segment "sa" into segment list somewhere
before "sb" maintaining the proper order of the segment list.
******************************************************************************/

SEGMENT *preorder_segment (sa, sb)
SEGMENT *sa;                    /* earlier segment in list                      */

SEGMENT *sb;                    /* later segment in list                        */

  {
  SIGN comp;                    /* segment order                                */

  SEGLIST *sl=sb->parent;       /* segment list                                 */

  sa->parent=sl;
  while (sb=sb->prev)
    {
    comp=compare_segments(sb,sa);
    if (comp>0) continue;
    if (comp<0)
      {
      sa->prev=sb;
      sa->next=sb->next;
      sa->next->prev=sa;
      sb->next=sa;
      }
    else sa=combine_segments(sb,sa);
    return sa;
    }
  sa->prev=NULL;
  sa->next=sl->first;
  sl->first->prev=sa;
```

```
  sl->first=sa;
  return sa;
  }
/*****************************************************************************

postorder_segment:  inserts segment "sb" into segment list somewhere
after "sa" maintaining the proper order of the segment list.
*****************************************************************************/

SEGMENT *postorder_segment (sa, sb)
SEGMENT *sa;                 /* earlier segment in list                    */

SEGMENT *sb;                 /* later segment in list                      */

  {
  SIGN comp;                 /* segment order                              */

  SEGLIST *sl=sa->parent;    /* segment list                               */

  sb->parent=sl;
  while (sa=sa->next)
    {
    comp=compare_segments(sb,sa);
    if (comp>0) continue;
    if (comp<0)
      {
      sb->next=sa;
      sb->prev=sa->prev;
      sb->prev->next=sb;
      sa->prev=sb;
      }
    else sb=combine_segments(sa,sb);
    return sb;
    }
  sb->next=NULL;
  sb->prev=sl->last;
  sl->last->next=sb;
  sl->last=sb;
  return sb;
  }
/*****************************************************************************

split_segment:  Splits a segment "sa" at a given point "o" into two segments
and reorders the two segments into the segment list.  Returns the
earliest segment in the list impacted by the split.
*****************************************************************************/

SEGMENT *split_segment (sa, o)
SEGMENT *sa;                 /* segment to split                           */
```

```
DOUBLE2 *o;                    /* split point                                  */

  {
  SEGMENT *sb;                 /* earlier part of "sa"                         */

  SEGMENT *sc;                 /* earliest segment impacted by split           */

  SIGN comp;                   /* segment order                                */

  sa->mark|=SPLIT_FLAG;
  sb=new_segment2(_,o,&sa->pt[2],sa->orient,sa->biorient,sa->mark);
  sa->pt[2]=*o;
  renew_segment(sa);
  if (sa->prev && (comp=compare_segments(sa,sa->prev))<=0)
    {
    delink_segment(sa);
    if (comp<0) sc=preorder_segment(sa,sa->prev);
    else sc=combine_segments(sa->prev,sa);
    }
  else if (sa->next && (comp=compare_segments(sa,sa->next))>=0)
    {
    sc=sa->next;
    delink_segment(sa);
    if (comp>0) postorder_segment(sa->next,sa);
    else combine_segments(sa->next,sa);
    }
  else sc=sa;
  comp=compare_segments(sc,sb);
  if (comp<0) postorder_segment(sc,sb);
  else if (comp>0) sc=preorder_segment(sb,sc);
  else errexit("ERROR #4005:  Identical segments");
  return sc;
  }

/*****************************************************************************

combine_segments:  Combines two coincident segments "sa" and "sb" into the
first segment "sa" and returns "sa".
*****************************************************************************/

SEGMENT *combine_segments (sa, sb)
SEGMENT *sa;                   /* first segment to combine                     */

SEGMENT *sb;                   /* second segment to combine                    */

  {
  sa->orient+=sb->orient;
  sa->biorient+=sb->biorient;
  delete_segment(sb);
  return sa;
  }
```

```
/*****************************************************************************
sort_segments:  Sorts the circular segment list starting at segment "sa" and
return "sa".
*****************************************************************************/

SEGMENT *sort_segments (sa)
SEGMENT *sa;                    /* first segment in list                      */

  {
  SEGMENT *sb=sa->next;         /* second segment in list                     */

  if (sa==sb) return sa;
  if (sb==sa->prev)
    {
    if (compare_segments(sa,sb)<=0) return sa;
    return sb;
    }
  sb=bisect_segments(sa);
  sa=sort_segments(sa);
  sb=sort_segments(sb);
  sa=merge_segments(sa,sb);
  return sa;
  }

/*****************************************************************************
bisect_segments:  Splits the circular segment list starting at segment "sa"
into two lists "sa" and "sb".  The list starting at "sa" is altered; the list
starting at "sb" is returned.
*****************************************************************************/

SEGMENT *bisect_segments (sa)
SEGMENT *sa;                    /* 1st half of split list                     */

  {
  SEGMENT *sa0;                 /* initial segment of "sa" list               */

  SEGMENT *sb;                  /* 2nd half of split list                     */

  SEGMENT *sb_last;             /* last segment in 2nd list                   */

  if (sa->next==sa) return NULL;
  sa0=sa;
  sb=sa;
  sb_last=sb->prev;
  while (1)
    {
    sb=sb->prev;
    if (sa==sb) break;
    sa=sa->next;
    if (sa==sb) break;
```

```
    }
  sa=sa->prev;
  sa->next=sa0;
  sa0->prev=sa;
  sb->prev=sb_last;
  sb_last->next=sb;
  return sb;
  }

/******************************************************************************

merge_segments:  Merges the two sorted circular segment lists starting
at "sa" and "sb" which are subsequenty destroyed.  Returns the merged list.
******************************************************************************/

SEGMENT *merge_segments (sa, sb)
SEGMENT *sa;                    /* 1st segment list to merge                    */

SEGMENT *sb;                    /* 2nd segment list to merge                    */

  {
  SEGMENT *sa_last;             /* last segment in "sa" list                    */

  SEGMENT *sb_last;             /* last segment in "sb" list                    */

  SEGMENT *temp;                /* swap location                                */

  SEGMENT *sc;                  /* segment in one list                          */

  SEGMENT *sd;                  /* segment in other list                        */

  if (compare_segments(sa,sb)>0) {temp=sa; sa=sb; sb=temp;}
  sa_last=sa->prev;
  sb_last=sb->prev;
  sc=sa;
  sd=sb;
  while (sc=sc->next,sc!=sa && sc!=sb)
    {
    if (compare_segments(sc,sd)<=0) continue;
    sc->prev->next=sd;
    sd->prev=sc->prev;
    temp=sc; sc=sd; sd=temp;
    }
  if (sc==sa)
    {
    sa_last->next=sd;
    sd->prev=sa_last;
    sb_last->next=sa;
    sa->prev=sb_last;
    }
  else
    {
```

```
    sb_last->next=sd;
    sd->prev=sb_last;
    }
  return sa;
  }

/*******************************************************************************

compare_segments:  Returns -1, 0, or 1 if segment "sa" should be earlier, at
same location, or later in list than segment "sb".  Return of 0 indicates
identical segments.  The segments are ordered by the lesser y value of an
intermediate point on the segment, or if equal by the lesser x value, or if
equal by the greater segment slope, of if equal by the lesser y value of the
2nd endpoint, or if equal by the lesser x value of the 2nd endpoint.
*******************************************************************************/

SIGN compare_segments (sa, sb)
SEGMENT *sa;
SEGMENT *sb;
  {
  DOUBLE cross;                /* cross product                              */

  if (sa->pt[1].y<sb->pt[1].y) return -1;
  if (sa->pt[1].y>sb->pt[1].y) return 1;
  if (sa->pt[1].x<sb->pt[1].x) return -1;
  if (sa->pt[1].x>sb->pt[1].x) return 1;
  cross=(sa->pt[2].x-sa->pt[0].x)*(sb->pt[2].y-sb->pt[0].y)
  -(sa->pt[2].y-sa->pt[0].y)*(sb->pt[2].x-sb->pt[0].x);
  if (cross<0.) return -1;
  if (cross>0.) return 1;
  if (sa->pt[2].y<sb->pt[2].y) return -1;
  if (sa->pt[2].y>sb->pt[2].y) return 1;
  if (sa->pt[2].x<sb->pt[2].x) return -1;
  if (sa->pt[2].x>sb->pt[2].x) return 1;
  return 0;
  }

/*******************************************************************************

compare_segments1:  Returns -1, 0, or 1 if segment "sa" should be earlier, at
same location, or later in list than segment "sb".  The segments are ordered by

the lesser x value of an intermediate point on the segment, or if equal by the

greater segment slope.
*******************************************************************************/

SIGN compare_segments1 (sa, sb)
SEGMENT *sa;
SEGMENT *sb;
  {
```

```
  DOUBLE cross;              /* cross product                                    */

  if (sa->pt[1].x<sb->pt[1].x) return -1;
  if (sa->pt[1].x>sb->pt[1].x) return 1;
  cross=(sa->pt[2].x-sa->pt[0].x)*(sb->pt[2].y-sb->pt[0].y)
  -(sa->pt[2].y-sa->pt[0].y)*(sb->pt[2].x-sb->pt[0].x);
  if (cross<0.) return -1;
  if (cross>0.) return 1;
  return 0;
  }

/******************************************************************************

compare_segments2:  Returns -1, 0, or 1 if segment "sa" should be earlier, at
same location, or later in list than segment "sb".  The segments are ordered by

the lesser x value of an intermediate point on the segment.
******************************************************************************/

SIGN compare_segments2 (sa, sb)
SEGMENT *sa;
SEGMENT *sb;
  {
  if (sa->pt[1].x<sb->pt[1].x) return -1;
  if (sa->pt[1].x>sb->pt[1].x) return 1;
  return 0;
  }

/******************************************************************************

SEGLIST:  list of polygonal segments
******************************************************************************/


/******************************************************************************

new_seglist:  Allocates and initializes the segment list "sl" with
the layer number "layerno" and bottom and top z values "zmin" and "zmax".
******************************************************************************/

SEGLIST *new_seglist (sl, layerno, zmin, zmax)
SEGLIST *sl;                 /* segment list                                     */

INT layerno;                 /* absolute layer number                            */

DOUBLE zmin;                 /* minimum z value of layer                         */

DOUBLE zmax;                 /* maximum z value of layer                         */

  {
  if (!sl) sl=allocate(SEGLIST);
  if (!sl) errexit("ERROR #4006:  Memory exhausted");
```

```
  sl->first=NULL;
  sl->last=NULL;
  sl->layerno=layerno;
  sl->min.x=MAX_DBL;
  sl->min.y=MAX_DBL;
  sl->min.z=zmin;
  sl->max.x=0.;
  sl->max.y=0.;
  sl->max.z=zmax;
  return sl;
  }

/*****************************************************************************

new_seglist1:  Allocates and initializes the segment list "sla" by copying the

segment list "slb".
*****************************************************************************/

SEGLIST *new_seglist1 (sla, slb)
SEGLIST *sla;                  /* new segment list                            */

SEGLIST *slb;                  /* segment list to copy                        */

  {
  SEGMENT *s;                  /* segment of "slb"                            */

  if (!sla) sla=allocate(SEGLIST);
  if (!sla) errexit("ERROR #4007:  Memory exhausted");
  sla->first=NULL;
  sla->last=NULL;
  sla->layerno=slb->layerno;
  sla->min=slb->min;
  sla->max=slb->max;
  if (!slb->first) return sla;
  for (s=slb->first; s; s=s->next)
    append_segment(sla,new_segment1(_,s),FALSE);
  return sla;
  }

/*****************************************************************************

new_seglist2:  Allocates and initializes the segment list "sl" with
the polyline list "pl".   Points are rotated by the rotation vector "rot" and
if "orient" is -1, the point order of the polylines is reversed.  Returns "sl".

*****************************************************************************/

SEGLIST *new_seglist2 (sl, pl, rot, orient)
SEGLIST *sl;                   /* segment list                                */
```

```
POLYLIST *pl;                /* new polyline list                               */
DOUBLE2 rot;                 /* rotation vector                                 */
SIGN orient;                 /* orientation: 1)vert order -1)reverse vert       */
  {
  POLYLINE *p;               /* polyline                                        */
  VERTEX *v0;                /* initial vertex of "p"                           */
  VERTEX *v1;                /* vertex of "p"                                   */
  VERTEX *v2;                /* vertex after "v2"                               */
  DOUBLE2 o0;                /* rotated value of "v1"                           */
  DOUBLE2 o1;                /* rotated value of "v2"                           */
  SEGMENT *s;                /* segment                                         */
  if (!pl) return NULL;
  if (!sl) sl=allocate(SEGLIST);
  if (!sl) errexit("ERROR #4008:  Memory exhausted");
  sl->first=NULL;
  sl->last=NULL;
  sl->layerno=pl->layerno;
  sl->min=pl->min;
  sl->max=pl->max;
  if (rot.x==1. && rot.y==0.)
    {
    for (p=pl->first; p; p=p->next)
      {
      if (!p->first) continue;
      v0=p->first;
      if (v0->next==v0) continue;      /* monogons
      */
      v1=v0;
      do
        {
        v2=v1->next;
        if (!v2) break;
        if (eq2(v1->pt,v2->pt)) continue;
        s=new_segment2(_,&v1->pt,&v2->pt,orient,orient,0);
        append_segment(sl,s,FALSE);
        }
      while ((v1=v2)!=v0);
      }
    return sl;
    }
  for (p=pl->first; p; p=p->next)
    {
```

```
    if (!p->first) continue;
    v1=v0=p->first;
    o0.x= rot.x*v1->pt.x+rot.y*v1->pt.y;
    o0.y=-rot.y*v1->pt.x+rot.x*v1->pt.y;
    o0=round2(o0);
    do
      {
      v2=v1->next;
      if (!v2) break;
      o1.x= rot.x*v2->pt.x+rot.y*v2->pt.y;
      o1.y=-rot.y*v2->pt.x+rot.x*v2->pt.y;
      o1=round2(o1);
      if (!eq2(o0,o1))
        {
        s=new_segment2(_,&o0,&o1,orient,orient,0);
        append_segment(sl,s,FALSE);
        }
      o0=o1;
      }
    while ((v1=v2)!=v0);
    }
  return sl;
  }

/*******************************************************************************

delete_seglist:  Deallocates the segment list "sl".
*******************************************************************************/

SEGLIST *delete_seglist (sl)
SEGLIST *sl;                    /* segment list                                */

  {
  SEGMENT *s;                   /* segment to delete                           */

  if (!sl) return NULL;
  if (sl->first)
    {
    for (s=sl->first; s; s=s->next)
      {
      s->parent=NULL;
      delete_segment(s);
      }
    }
  deallocate(sl);
  return NULL;
  }

/*******************************************************************************

dump_seglist:  Dumps a segment list "sl".
```

```
*******************************************************************************/

VOID dump_seglist (sl)
SEGLIST *sl;                 /* segment list                                  */

  {
  SEGMENT *s;                /* segment in list                               */

  SEGMENT *s0;               /* initial segment in list                       */

  INT index=0;               /* index of segmet                               */

  dump("SEGLIST %08lx:\n",sl);
  if (!sl) return;
  dump("min=%lg %lg %lg max=%lg %lg %lg\n",sl->min,sl->max);
  dump("layerno=%d",sl->layerno);
  if (sl->first && !sl->last || sl->last && !sl->first)
    errexit("ERROR #4009:  Corrupted list:  first=%lx last=%lx\n"
    ,sl->first,sl->last);
  if (!sl->first) return;
  if (sl->first->prev && (sl->first!=sl->last || !sl->last->next)
    || sl->last->next && (sl->first!=sl->last || !sl->first->prev))
    errexit("ERROR #4010:  Corrupted list:  first->prev=%lx first=%lx last=%lx
last->next=%lx\n",
      sl->first->prev,sl->first,sl->last,sl->last->next);
  dump("first=%lx last=%lx %s\n",sl->first,sl->last,
    sl->first->prev?"closed":"open");
  s0=sl->first;
  s=sl->first;
  do
    {
    dump("#%2d ",index++);
    dump_segment(s);
    if (!s->parent) errexit("ERROR #4011:  Missing parent:  s=%lx\n",s);
    if (!s->next && s!=sl->last)
      errexit("ERROR #4012:  Corrupted list:  s=%lx last=%lx\n",s,sl->last);
    }  /* s */
  while ((s=s->next) && s!=s0);
  return;
  }

/*******************************************************************************

dump_partial_seglist:  Dumps a segment list "sl" up to (but not including)
segment "s1".
*******************************************************************************/

VOID dump_partial_seglist (sl, s1)
SEGLIST *sl;                 /* segment list                                  */

SEGMENT *s1;                 /* dump up to (but not including) this segment */
```

```
  {
  SEGMENT *s;                 /* segment in list                                    */

  SEGMENT *s0;                /* initial segment in list                            */

  INT index=0;                /* index of segmet                                    */

  dump("SEGLIST %08lx:\n",sl);
  if (!sl) return;
  dump("min=%lg %lg %lg max=%lg %lg %lg\n",sl->min,sl->max);
  dump("layerno=%d",sl->layerno);
  if (sl->first && !sl->last || sl->last && !sl->first)
    errexit("ERROR #4009:  Corrupted list:  first=%lx last=%lx\n"
    ,sl->first,sl->last);
  if (!sl->first) return;
  if (sl->first->prev && (sl->first!=sl->last || !sl->last->next)
    || sl->last->next && (sl->first!=sl->last || !sl->first->prev))
    errexit("ERROR #4010:  Corrupted list:  first->prev=%lx first=%lx last=%lx
last->next=%lx\n",
      sl->first->prev,sl->first,sl->last,sl->last->next);
  dump("first=%lx last=%lx %s\n",sl->first,sl->last,
    sl->first->prev?"closed":"open");
  s0=sl->first;
  s=sl->first;
  do
    {
    dump("#%2d ",index++);
    dump_segment(s);
    if (!s->parent) errexit("ERROR #4011:  Missing parent:  s=%lx\n",s);
    if (!s->next && s!=sl->last)
      errexit("ERROR #4012:  Corrupted list:  s=%lx last=%lx\n",s,sl->last);
    } /* s */
  while ((s=s->next) && s!=sl && s!=s0);
  return;
  }

/*****************************************************************************

dump_seglist_view:  Dumps a segment list "sl" suitable for the view program.
*****************************************************************************/

VOID dump_seglist_view (sl)
SEGLIST *sl;                  /* segment list                                       */

  {
  SEGMENT *s;                 /* segment in list                                    */

  SEGMENT *s0;                /* initial segment in list                            */

  INT index=0;                /* index of segmet                                    */

/*  dump("SEGLIST %08lx:\n",sl); */
```

```
  if (!sl) return;
/*  dump("layerno=%d zmin=%lg zmax=%lg\n",
    sl->layerno,sl->zmin,sl->zmax);       */
  if (sl->first && !sl->last || sl->last && !sl->first)
    errexit("ERROR #4013:  Corrupted list:  first=%lx last=%lx\n"
    ,sl->first,sl->last);
  if (!sl->first) return;
  if (sl->first->prev && (sl->first!=sl->last || !sl->last->next)
    || sl->last->next && (sl->first!=sl->last || !sl->first->prev))
    errexit("ERROR #4014:  Corrupted list:  first->prev=%lx first=%lx last=%lx
last->next=%lx\n",
      sl->first->prev,sl->first,sl->last,sl->last->next);
/*  dump("first=%lx last=%lx %s\n",sl->first,sl->last,
    sl->first->prev?"closed":"open");     */
  s0=sl->first;
  s=sl->first;
  do
    {
    dump("#%2d ",index++);
    dump_segment_view(s);
    dump("\n");
    if (!s->parent) errexit("ERROR #4015:  Missing parent:  s=%lx\n",s);
    if (!s->next && s!=sl->last)
      errexit("ERROR #4016:  Corrupted list:  s=%lx last=%lx\n",s,sl->last);
    }  /* s */
  while ((s=s->next) && s!=s0);
  return;
  }

/*****************************************************************************

read_ascii_seglist:  Reads in list of segments in ascii format for one layer
from the input stream "stream".
*****************************************************************************/

SEGLIST *read_ascii_seglist (stream)
STREAM *stream;                /* input file                                 */

  {
  static CHAR line[81]={0};    /* input line                                 */

  DOUBLE zmin;
  static DOUBLE zmax=UNDEF_DBL;
  SEGLIST *sl;                 /* segment list                               */

  SEGMENT *s;                  /* segment                                    */

  static DOUBLE o[2][2];
  if (zmax==UNDEF_DBL)
    {
    do if (!read_line(stream,line)) return NULL;
    while (!*line || *line=='!' || line[0]=='/' && line[1]=='/');
```

```
    if (*line!='L' && *line!='l' || sscanf(line,"%*s %lf",&zmin)<1)
      errexit("ERROR #4017:  Bad input line: %s",line);
    }
  else zmin=zmax;
  do if (!read_line(stream,line)) return NULL;
  while (!*line);
  sl=new_seglist(_,0,zmin,0.);
  do
    {
    if (sscanf(line,"%lg %lg %lg %lg",&o[0][X],&o[0][Y],&o[1][X],&o[1][Y])<4)
      errexit("ERROR #4018:  Bad input line: %s",line);
    transform_segment(o,ui->transformation);
    o[0][X]=ctos(o[0][X],X);
    o[0][Y]=ctos(o[0][Y],Y);
    o[1][X]=ctos(o[1][X],X);
    o[1][Y]=ctos(o[1][Y],Y);
    if (o[0][X]!=o[1][X] && o[0][Y]!=o[1][Y])
      {
      s=new_segment(_,o[0][X],o[0][Y],o[1][X],o[1][Y],1,1,0);
      append_segment(sl,s,TRUE);
      }
    do if (!read_line(stream,line))
      errexit("ERROR #4019:  No upper limit for data\n");
    while (!*line);
    }
  while (!isalpha(*line));
  if (sscanf(line,"%*s %lf",&zmax)<1)
    errexit("ERROR #4020:  Bad input line: %s",line);
  transform_z_extents(&zmin,&zmax,ui->transformation);
  sl->min.z=ctos(zmin,Z,TRUE);
  sl->max.z=ctos(zmax,Z,TRUE);
  return sl;
  }

/*****************************************************************************

read_binary_seglist:  Reads in list of segments in binary format for one layer

from the input stream "stream".
*****************************************************************************/

SEGLIST *read_binary_seglist (stream)
STREAM *stream;               /* input file                                  */

  {
  SEGLIST *sl=NULL;           /* segment list                                */

  errexit("ERROR #4021:  Binary segment input inoperative");
  return sl;
  }
```

```
/******************************************************************************
segment_count:  Returns the number of segments in a segment list "sl".
******************************************************************************/

INT segment_count (sl)
SEGLIST *sl;
  {
  INT n=0;                    /* number of segments                          */

  SEGMENT *s;                 /* segment                                     */

  if (!sl->first) return 0;
  for (s=sl->first; s; s=s->next) n++;
  return n;
  }

/******************************************************************************

close_seglist:  Circularizes a segment list "sl" by linking the first and
last segments.
******************************************************************************/

SEGLIST *close_seglist (sl)
SEGLIST *sl;                  /* segment list                                */

  {
  if (!sl->first || sl->first->prev) return sl;
  sl->first->prev=sl->last;
  sl->last=sl->last->next=sl->first;
  return sl;
  }


/******************************************************************************

open_seglist:  Opens a closed segment list "sl" by deleting the link between
the first and last segments.
******************************************************************************/

SEGLIST *open_seglist (sl)
SEGLIST *sl;                  /* segment list                                */

  {
  if (!sl->first || !sl->first->prev) return sl;
  sl->last=sl->last->prev;
  sl->first->prev=NULL;
  sl->last->next=NULL;
  return sl;
  }
```

```
/*****************************************************************************

resort_seglist1:  Resorts a sublist of segment list "sla" starting at segment
"sy" at a y value which maximizes the size of this sublist.  Any segments prior

to "sy" which do not impinge on this y value are deleted if they have been
marked for deletion by the "boolean_seglist" routine, otherwise they are
moved to segment list "slb".  Returns "sla" and computes a new "sy" just beyond

the aforementioned sublist.
*****************************************************************************/

SEGLIST *resort_seglist1 (sla, slb, sy)
SEGLIST *sla;                  /* decretion list                              */

SEGLIST *slb;                  /* accretion list                              */

SEGMENT **sy;                  /* 1st segment with a new y min                */

  {
  DOUBLE ymin;                 /* lower bound for boolean y level             */

  DOUBLE ymax;                 /* upper bound for boolean y level             */

  SEGMENT *sa;                 /* segment                                     */

  SEGMENT *sa_next;            /* segment                                     */

  SEGMENT *sb;                 /* earlier segment than "sa"                   */

  sa=*sy;
  if (!sa)                     /* finish off list                             */

    {
    for (sa=sla->first; sa; sa=sa_next)
      {
      sa_next=sa->next;
      if (sa->mark&DELETE_FLAG) delete_segment(sa);
      else
        {
        delink_segment(sa);
        sa->pt[1]=sa->pt[0];
        append_segment(slb,sa,TRUE);
        }
      }
    sla->first=NULL;
    delete_seglist(sla);
    return NULL;
    }
  ymin=sa->pt[0].y;
  ymax=sa->pt[2].y;
  *sy=NULL;
```

```
  while (sa=sa->next)
    {
    if (sa->pt[0].y>ymax || sa->pt[0].y==ymax && ymax>ymin)
      {
      *sy=sa;
      break;
      }
    ymin=sa->pt[0].y;
    if (sa->pt[2].y<ymax) ymax=sa->pt[2].y;
    }
  for (sa=sla->first; sa!=*sy; sa=sa_next)
    {
    sa_next=sa->next;
    if (ymin>sa->pt[2].y || ymin==sa->pt[2].y
    && (ymin<ymax || sa->pt[0].y<ymin))
      {
      if (sa->mark&DELETE_FLAG) delete_segment(sa);
      else
        {
        delink_segment(sa);
        sa->pt[1]=sa->pt[0];
        append_segment(slb,sa,TRUE);
        }
      continue;
      }
    sa->pt[1].y=ymin;
    if (ymin==sa->pt[0].y) sa->pt[1].x=sa->pt[0].x;
    else if (ymin==sa->pt[2].y) sa->pt[1].x=sa->pt[2].x;
    else
      sa->pt[1].x=sa->pt[0].x+(ymin-sa->pt[0].y)/(sa->pt[2].y-sa->pt[0].y)
      *(sa->pt[2].x-sa->pt[0].x);
    sb=sa->prev;
    if (!sb || compare_segments1(sb,sa)<=0) continue;
    delink_segment(sa);
    preorder_segment(sa,sb);
    } /* sa */
  return sla;
  }

/*******************************************************************************

resort_seglist2:  Resorts those segments at the front of the segment list "sla"

which impinge on a given y value "y".  Segments are sorted by the x value of
the point of intersection of the segment and this y line.  Recomputes "sy" --
the first segment in the list just higher than "y".  Returns "sla".
*******************************************************************************/

SEGLIST *resort_seglist2 (sla, y, sy)
SEGLIST *sla;                   /* decretion list                               */
```

```
DOUBLE y;                       /* new y value                             */

SEGMENT **sy;                   /* 1st segment with a new y min            */

  {
  SEGMENT *sa;                  /* segment                                 */

  SEGMENT *sa_next;             /* segment                                 */

  SEGMENT *sb;                  /* earlier segment than "sa"               */

  *sy=NULL;
  for (sa=sla->first; sa; sa=sa_next)
    {
    if (y<sa->pt[0].y)
      {
      *sy=sa;
      break;
      }
    sa_next=sa->next;
    if (y>sa->pt[2].y)
      {
      delete_segment(sa);
      continue;
      }
    sa->pt[1].y=y;
    if (y==sa->pt[0].y) sa->pt[1].x=sa->pt[0].x;
    else if (y==sa->pt[2].y) sa->pt[1].x=sa->pt[2].x;
    else
      sa->pt[1].x=sa->pt[0].x+(y-sa->pt[0].y)/(sa->pt[2].y-sa->pt[0].y)
      *(sa->pt[2].x-sa->pt[0].x);
    sb=sa->prev;
    if (!sb || compare_segments2(sb,sa)<=0) continue;
    delink_segment(sa);
    preorder_segment(sa,sb);
    }  /* sa */
  return sla;
  }

/*******************************************************************************

sort_seglist:  Returns the sorted segment list "sl".
The segments are ordered by the lesser y value of an
intermediate point on the segment, or if equal by the lesser x value, or if
equal by the greater segment slope, of if equal by the lesser y value of the
2nd endpoint, or if equal by the lesser x value of the 2nd endpoint.
*******************************************************************************/

SEGLIST *sort_seglist (sl)
SEGLIST *sl;                    /* segment list                            */

  {
```

```
  TIME_T time0;                 /* start time for function
*/
  if (ui->timing) time0=time(_);
  if (!sl->first || !sl->first->next) return sl;
  sl=close_seglist(sl);
  sl->first=sl->last=sort_segments(sl->first);
  sl=open_seglist(sl);
  if (ui->timing) timing->sort_seglist+=difftime(time(_),time0);
  return sl;
  }

/*****************************************************************************

condense_seglist:  Condenses the segment list "sl" by combining
equal segments into compound segments.
*****************************************************************************/

SEGLIST *condense_seglist (sl)
SEGLIST *sl;                  /* segment list                              */

  {
  SEGMENT *sa;                /* segment in list                           */

  SEGMENT *sb;                /* later segment in list                     */

  for (sa=sl->first; sa; sa=sa->next)
    {
    for (sb=sa->next; sb; sb=sb->next)
      {
      if (!eq2(sa->pt[0],sb->pt[0]) || !eq2(sa->pt[2],sb->pt[2])) break;
      sa=combine_segments(sa,sb);
      if (sa->orient || sa->biorient) continue;
      delete_segment(sa);
      break;
      }
    }
  return sl;
  }

/*****************************************************************************

append_segment:  Appends a segment "s" to the segment list "sl" and updates the

extents of the segment list if "update" is TRUE.
*****************************************************************************/

SEGLIST *append_segment (sl, s, update)
SEGLIST *sl;                  /* segment list                              */

SEGMENT *s;                   /* segment                                   */
```

```
BOOLEAN update;                /* update extents?                                */

  {
  if (!s) return sl;
  if (!sl->first)
    {
    sl->first=s;
    s->prev=NULL;
    }
  else
    {
    if (sl->first->prev)
      errexit("ERROR #4022:  Appending to closed segment list");
    s->prev=sl->last;
    sl->last->next=s;
    }
  s->next=NULL;
  sl->last=s;
  s->parent=sl;
  if (!update) return sl;
  if (s->pt[0].x<sl->min.x) sl->min.x=s->pt[0].x;
  else if (s->pt[0].x>sl->max.x) sl->max.x=s->pt[0].x;
  if (s->pt[0].y<sl->min.y) sl->min.y=s->pt[0].y;
  else if (s->pt[0].y>sl->max.y) sl->max.y=s->pt[0].y;
  if (s->pt[2].x<sl->min.x) sl->min.x=s->pt[2].x;
  else if (s->pt[2].x>sl->max.x) sl->max.x=s->pt[2].x;
  if (s->pt[2].y<sl->min.y) sl->min.y=s->pt[2].y;
  else if (s->pt[2].y>sl->max.y) sl->max.y=s->pt[2].y;
  return sl;
  }

/*******************************************************************************

append_polygon:  Makes segments from a list of points which represent the
vertices of a polygon and appends them to a segment list "sl".  Zero length
segments are suppressed.  The segment list "sl" is returned.
*******************************************************************************/

#ifdef DOS
SEGLIST *append_polygon (SEGLIST *sl, ...)
  {
  DOUBLE2 *head0;              /* head of last segment                          */

  DOUBLE2 *tail;               /* tail of segment                               */

  DOUBLE2 *head;               /* head of segment                               */

  va_list arg;                 /* parameter pointer                             */

  va_start(arg,sl);
  head=head0=va_arg(arg,DOUBLE2*);
  if (!head0) return sl;
```

```
  while (tail=head,head=va_arg(arg,DOUBLE2*))
    if (!eq2(*tail,*head))
    append_segment(sl,new_segment2(_,tail,head,1,1,0),TRUE);
  if (!eq2(*tail,*head0))
    append_segment(sl,new_segment2(_,tail,head0,1,1,0),TRUE);
  return sl;
  }
#else
SEGLIST *append_polygon (sl, va_alist)
SEGLIST *sl;                  /* segment list                                  */

va_dcl
  {
  DOUBLE2 *head0;             /* head of last segment                          */

  DOUBLE2 *tail;              /* tail of segment                               */

  DOUBLE2 *head;              /* head of segment                               */

  va_list arg;                /* parameter pointer                             */

  va_start(arg);
  head=head0=va_arg(arg,DOUBLE2*);
  if (!head0) return sl;
  while (tail=head,head=va_arg(arg,DOUBLE2*))
    if (!eq2(*tail,*head))
      append_segment(sl,new_segment2(_,tail,head,1,1,0),TRUE);
  if (!eq2(*tail,*head0))
    append_segment(sl,new_segment2(_,tail,head0,1,1,0),TRUE);
  return sl;
  }
#endif

/******************************************************************************

boolean_seglist:  Returns the boolean of a segment list "sla" with transition
quantitative volume "op" and quantitative volume at infinity of "qvinf".
Segments separating regions of quantitative volume less than "op" and greater
or equal to "op" are kept, the others are deleted.
******************************************************************************/

SEGLIST *boolean_seglist (sla, op, qvinf)
SEGLIST *sla;                 /* segment list to boolean                       */

INT op;                       /* operation: 1)union 2)intersection             */

INT qvinf;                    /* quantitative volume at infinity               */

  {
  SEGLIST *slb;               /* booleaned segment list                        */
```

```
  SEGMENT *sa;              /* segment in list                        */
  SEGMENT *sy;              /* first segment with a new y min         */
  INT qvleft;               /* quantitative area before segment       */
  INT qvright;              /* quantitative area after segment        */
  TIME_T time0;               /* start time for function
*/
  if (ui->timing) time0=time(_);
  slb=new_seglist(_,sla->layerno,sla->min.z,sla->max.z);
  for (sy=sla->first; resort_seglist1(sla,slb,&sy);)
    {
    qvleft=qvinf;
    for (sa=sla->first; sa!=sy; sa=sa->next)
      {
      if (sa->orient==0) qvright=qvleft+sa->biorient/2;
      else qvright=qvleft-sa->orient;
      if (qvleft<op && qvright>=op || qvleft>=op && qvright<op)
        {
        if (sa->mark&DELETE_FLAG)
          errexit("ERROR #4023:  Inconsistent segment status");
        sa->mark|=KEEP_FLAG;
        }
      else
        {
        if (sa->mark&KEEP_FLAG)
          {
          DUMP("\n*424\n"); DUMP_SEGMENT(sa); DUMP_SEGLIST(sla);
DUMP_SEGLIST(slb);
          errexit("ERROR #4024:  Inconsistent segment status");
          }
        sa->mark|=DELETE_FLAG;
        }
      if (sa->pt[0].y!=sa->pt[2].y && sa->orient!=0) qvleft=qvright;
      }
    }
  for (sa=slb->first; sa; sa=sa->next)
    {
    sa->mark&=~KEEP_FLAG;
    if (sa->orient>0) {sa->orient=1; sa->biorient=1;}
    else if (sa->orient<0) {sa->orient=-1; sa->biorient=1;}
    else if (sa->biorient<=0) delete_segment(sa);
    else sa->biorient=2;
    }
  if (ui->timing) timing->boolean_seglist+=difftime(time(_),time0);
  slb=sort_seglist(slb);
  return slb;
  }
```

```
/******************************************************************************

reorient_seglist:  Ensures alternate segment orientations when crossing the
segment list "sla" with horizontal lines.  If any segments are reoriented,
"misoriented" is set to TRUE.  The quantative volume at infinity is 0.
The corrected segment list "sla" is returned.
******************************************************************************/

SEGLIST *reorient_seglist (sla, misoriented)
SEGLIST *sla;                 /* segment list to boolean                    */

BOOLEAN *misoriented;
  {
  SEGLIST *slb;               /* booleaned segment list                     */

  SEGMENT *sa;                /* segment in list                            */

  SEGMENT *sy;                /* first segment with a new y min             */

  INT qvleft;                 /* quantitative area before segment           */

  INT dqv;                    /* change in quantitative volume              */

  TIME_T time0;                 /* start time for function                  */

  if (ui->timing) time0=time(_);
  slb=new_seglist(_,sla->layerno,sla->min.z,sla->max.z);
  for (sa=sla->first; sa; sa=sa->next)
    {
    if (sa->orient!=sa->orient%2)
      {
      if (!misoriented)
        errexit("ERROR #4100:  Misoriented segment on layer %d\n"
        ,sla->layerno);
      *misoriented=TRUE;
      sa->orient%=2;
      }
    }
  for (sy=sla->first; resort_seglist1(sla,slb,&sy); )
    {
    qvleft=0;
    for (sa=sla->first; sa!=sy; sa=sa->next)
      {
      dqv=qvleft==0?1:-1;
      if (sa->orient==0 && dqv<0)
        {
        if (sa->mark&KEEP_FLAG)
          errexit("ERROR #4025:  Inconsistent segment status");
        sa->biorient=dqv;
        sa->mark|=DELETE_FLAG;
        }
      else
```

```
        {
        if (sa->mark&DELETE_FLAG)
          errexit("ERROR #4026:  Inconsistent segment status");
        if (sa->orient==0 && sa->biorient!=2*dqv
        || sa->orient!=0 && sa->orient!=-dqv)
          {
          if (!misoriented)
            errexit("ERROR #4101:  Misoriented segment on layer %d\n"
            ,sla->layerno);
          *misoriented=TRUE;
          if (sa->mark&KEEP_FLAG)
            errexit("ERROR #4027:  Inconsistent segment status");
          }
        sa->mark|=KEEP_FLAG;
        if (sa->orient==0) sa->biorient=2*dqv;
        else sa->orient=-dqv;
        }
      if (sa->pt[0].y!=sa->pt[2].y) qvleft-=sa->orient;
      }
    }
  for (sa=slb->first; sa; sa=sa->next) sa->mark&=~KEEP_FLAG;
  if (ui->timing) timing->reorient_seglist+=difftime(time(_),time0);
  slb=sort_seglist(slb);
  return slb;
  }

/*****************************************************************************

split_seglist:  Splits all segments in a list "sl" at their intersection with
each other.  Segments overlapping over a region are split at the endpoints of
the region.  Combines equal segments into compound segments.  Returns a list of

noncrossing segments "sl".
*****************************************************************************/

SEGLIST *split_seglist (sl)
SEGLIST *sl;                    /* list of segments                          */

  {
  SEGMENT *sa;                  /* segment in list "sl"                      */

  SEGMENT *sb;                  /* segment in list "sl"                      */

  DOUBLE2 oa0;                  /* low endpoint of "sa"                      */

  DOUBLE2 oa1;                  /* high endpoint of "sa"                     */

  DOUBLE2 ob0;                  /* low endpoint of "sb"                      */

  DOUBLE2 ob1;                  /* high endpoint of "sb"                     */
```

```
DOUBLE2 o;                /* first intersection point             */
TIME_T time0;             /* start time for function              */
BOOLEAN split=TRUE;       /* split has occurred somewhere?        */
DOUBLE eps;               /* spatial error tolerance              */

eps=ui->eps.xy;

if (ui->timing) time0=time(_);
if (!sl->first) return sl;

for (sa=sl->first; sa; sa=sa->next) sa->mark|=SPLIT_FLAG;
while (split && sl->first)
  {
  split=FALSE;
  for (sa=sl->first; sa; )
    {
    if (!sa->orient && !sa->biorient)
      {
      delete_segment(sa);
      sa=sa->next;
      continue;
      }
    if (!(sa->mark&SPLIT_FLAG)) {sa=sa->next; continue;}
    oa0=sa->pt[0];
    oa1=sa->pt[2];
    for (sb=sl->first; sb; )
      {
      if (sa==sb) {sb=sb->next; continue;}
      if (!sb->orient && !sb->biorient)
        {
        delete_segment(sb);
        sb=sb->next;
        continue;
        }
      ob0=sb->pt[0];
      ob1=sb->pt[2];
      if (oa1.y<ob0.y) break;
      if (ob1.y<oa0.y
      || ob0.x<oa0.x && ob0.x<oa1.x && ob1.x<oa0.x && ob1.x<oa1.x
      || ob0.x>oa0.x && ob0.x>oa1.x && ob1.x>oa0.x && ob1.x>oa1.x)
        {
        sb=sb->next;
        continue;
        }
      if (!parallel_intersection(oa0,oa1,ob0,ob1,eps,&o,_)
      && !nonparallel_intersection(oa0,oa1,ob0,ob1,&o))
        {
        sb=sb->next;
        continue;
```

```
          }
        if (!eq2(o,ob0) && !eq2(o,ob1))
          {
          sb=split_segment(sb,&o);
          split=TRUE;
          }
        else sb=sb->next;
        if (!eq2(o,oa0) && !eq2(o,oa1))
          {
          sa=split_segment(sa,&o);
          split=TRUE;
          goto continue2;
          }
        }  /* sb */
      sa->mark&=~SPLIT_FLAG;
      sa=sa->next;
      continue2:;
      }  /* sa */
    }  /* split && sl->first */
  if (ui->timing) timing->split_seglist+=difftime(time(_),time0);
  return sl;
  }

/*****************************************************************************

deflat_seglist:  Replaces all horizontal segments by two zero
length segments equal to the endpoints of the original segments in the segment

list "sl"
*****************************************************************************/

SEGLIST *deflat_seglist (sl)
SEGLIST *sl;                    /* segment list                              */

  {
  SEGMENT *sa;                  /* tail point of "s"                         */

  SEGMENT *sb;                  /* head point of "s"                         */

  for (sa=sl->first; sa; sa=sa->next)
    {
    if (sa->pt[0].y!=sa->pt[2].y) continue;
    sb=new_segment2(_,&sa->pt[2],&sa->pt[2],-abs(sa->orient),sa->biorient
    ,sa->mark);
    sa->pt[2]=sa->pt[0];
    sa->orient=abs(sa->orient);
    insert_segment(sa,sb);
    sa=sb;
    }
  }
```

```
/*****************************************************************************

merge_seglists:  Merges two segment lists "sla" and "slb" into one
segment list "sla" and destroys the original lists.  Returns "sla".
*****************************************************************************/

SEGLIST *merge_seglists (sla, slb)
SEGLIST *sla;                /* 1st segment list                            */
SEGLIST *slb;                /* 2nd segment list                            */
  (
  SEGMENT *s;
  for (s=slb->first; s; s=s->next) s->parent=sla;
  sla->last->next=slb->first;
  slb->first->prev=sla->last;
  sla->last=slb->last;
  slb->first=NULL;
  slb->last=NULL;
  delete_seglist(slb);
  return sla;
  )
```

```
/*******************************************************************************

S5.C:  VERTEX, POLYLINE, POLYLIST.
*******************************************************************************/

#include "s.h"

/*******************************************************************************

VERTEX:  vertex of a polyline or polygon
*******************************************************************************/

/*******************************************************************************

new_vertex:  Allocates and initializes a new polyline vertex "v" and returns
it.
*******************************************************************************/

VERTEX *new_vertex (v, x, y, sibling, mark)
VERTEX *v;                  /* new vertex                                    */

DOUBLE x,y;                 /* vertex value                                  */

VERTEX *sibling;            /* sibling vertex                                */

FLAGS mark;                 /* bit flags                                     */

  {
  if (!v) v=allocate(VERTEX);
  if (!v) errexit("ERROR #5000:  Memory exhausted");
  v->pt.x=x;
  v->pt.y=y;
  v->mark=mark;
  v->prev=NULL;
  v->next=NULL;
  v->sibling=sibling;
  v->parent=NULL;
  return v;
  }

/*******************************************************************************

new_vertex1:  Allocates and initializes a new polyline vertex "va" by
copying an old one "vb".  Returns "va".
*******************************************************************************/

VERTEX *new_vertex1 (va, vb)
VERTEX *va;                 /* new vertex                                    */
```

```
VERTEX *vb;                  /* old vertex                                 */

  {
  if (!va) va=allocate(VERTEX);
  if (!va) errexit("ERROR #5001:  Memory exhausted");
  va->pt=vb->pt;
  va->mark=vb->mark;
  va->prev=NULL;
  va->next=NULL;
  va->sibling=vb;
  va->parent=NULL;
  return va;
  }

/*****************************************************************************

new_vertex2:  Allocates and initializes a new polyline vertex "v" with
a value "value", bit information "mark", and associated uncompensated vertex
"sibling".
*****************************************************************************/

VERTEX *new_vertex2 (v, value, sibling, mark)
VERTEX *v;                   /* new vertex                                 */

DOUBLE2 *value;              /* coordinate value                           */

VERTEX *sibling;             /* sibling vertex                             */

FLAGS mark;                  /* bit flags                                  */

  {
  if (!v) v=allocate(VERTEX);
  if (!v) errexit("ERROR #5002:  Memory exhausted");
  v->pt=*value;
  v->mark=mark;
  v->prev=NULL;
  v->next=NULL;
  v->sibling=sibling;
  v->parent=NULL;
  return v;
  }

/*****************************************************************************

delete_vertex:  Deallocates the polyline vertex "v" and returns NULL.
*****************************************************************************/

VERTEX *delete_vertex (v)
VERTEX *v;
  {
  POLYLINE *p;
  if (!v) return NULL;
```

```
  if (p=v->parent)
    {
    if (v==v->next) v->prev=v->next=NULL;
    else
      {
      if (v->prev) v->prev->next=v->next;
      if (v->next) v->next->prev=v->prev;
      }
    if (p->first==v)
      {
      p->first=v->next;
      if (p->last==v) p->last=p->first;
      }
    else if (p->last==v) p->last=v->prev;
    }
  deallocate(v);
  return NULL;
  }

/*******************************************************************************

dump_vertex:  dumps the polyline vertex "v".
*******************************************************************************/

VOID dump_vertex (v)
VERTEX *v;
  {
  dump("VERTEX %08lx: ",v);
  if (!v) {dump("\n"); return;}
  dump("%9.9lg %9.9lg sibling=%lx parent=%lx mark=%d\n"
  ,v->pt,v->sibling,v->parent,v->mark);
  if (v->parent && (v->prev && v!=v->prev->next
  || v->next && v!=v->next->prev))
    errexit("ERROR #5003:  Corrupted list:  prev=%08lx next=%08lx"
    ,v->prev,v->next);
  return;
  }

/*******************************************************************************

write_two_vertices:  Writes the two vertices "va" and "vb" of a polyline
scaleed by the resolution ratio.  to a stream "stream".
*******************************************************************************/

VERTEX *write_two_vertices (stream, va, vb)
STREAM *stream;              /* output stream                                 */

VERTEX *va;                  /* 1st vertex                                    */
```

```
VERTEX *vb;                   /* 2st vertex                                    */

  {
  USHORT2 tail;               /* tail of segment                               */

  USHORT2 head;               /* head of segment                               */

  LONG temp;                  /* round off value                               */

  temp=(LONG)(va->pt.x/ui->resratio+.5);
    if (temp<0.) tail.x=0;
    else tail.x=(USHORT)temp;
  temp=(LONG)(va->pt.y/ui->resratio+.5);
    if (temp<0.) tail.y=0;
    else tail.y=(USHORT)temp;
  temp=(LONG)(vb->pt.x/ui->resratio+.5);
    if (temp<0.) head.x=0;
    else head.x=(USHORT)temp;
  temp=(LONG)(vb->pt.y/ui->resratio+.5);
    if (temp<0.) head.y=0;
    else head.y=(USHORT)temp;
  if (stream->format==ASCII)
    fprintf(stream->file," %u %u %u %u\n",tail.x,tail.y,head.x,head.y);
  else
    {

fwrite_(&tail,sizeof(USHORT),2,stream->file,stream->byteorder!=ui->byteorder);


fwrite_(&head,sizeof(USHORT),2,stream->file,stream->byteorder!=ui->byteorder);

    }
  return va;
  }

/*****************************************************************************

transform_vertex:  applies a coordinate transformation "f" to the
vertex value "o".
*****************************************************************************/

DOUBLE *transform_vertex (o, f)
DOUBLE o[2];
TRANSFORMATION *f;
  {
  INT j;                      /* coordinate index                              */

  INT k;                      /* coordinate index                              */

  DOUBLE newpt[2];            /* result                                        */

  for (j=0; j<2; j++)
```

```
    {
    newpt[j]=0.;
    for (k=0; k<2; k++)
      newpt[j]+=f->matrix[j][k]*o[k];
    newpt[j]+=f->matrix[j][3];
    }
  for (j=0; j<2; j++) o[j]=newpt[j];
  return o;
  }

/*****************************************************************************

prepend_vertex:  Prepends a vertex "v" to the beginning of a polyline
"p" and updates the polyline extents if "update" is TRUE.  Returns "p".
*****************************************************************************/

POLYLINE *prepend_vertex (p, v, update)
POLYLINE *p;                  /* polygon to append vertex to              */

VERTEX *v;                    /* initial vertex to append to "p"          */

BOOLEAN update;               /* update vertex extents?                   */

  {
  if (!v) return p;
  if (!p->first)
    {
    p->last=v;
    v->next=NULL;
    }
  else
    {
    if (p->first->prev)
      errexit("ERROR #5004:  Prepending to closed polyline");
    v->next=p->first;
    p->first->prev=v;
    }
  v->prev=NULL;
  p->first=v;
  v->parent=p;
  if (!update) return p;
  if (v->pt.x<p->min.x) p->min.x=v->pt.x;
  if (v->pt.y<p->min.y) p->min.y=v->pt.y;
  if (v->pt.x>p->max.x) p->max.x=v->pt.x;
  if (v->pt.y>p->max.y) p->max.y=v->pt.y;
  return p;
  }

/*****************************************************************************

append_vertex:  Appends a vertex "v" to the end of a polyline "p"
and updates the polyline extents if "update" is TRUE.  Returns "p".
```

```
******************************************************************************/

POLYLINE *append_vertex (p, v, update)
POLYLINE *p;                    /* polygon to append vertex to                */

VERTEX *v;                      /* initial vertex to append to "p"            */

BOOLEAN update;                 /* update vertex extents?                     */

  {
  if (!v) return p;
  if (!p->first)
    {
    p->first=v;
    v->prev=NULL;
    }
  else
    {
    if (p->first->prev)
      errexit("ERROR #5005:  Appending to closed polyline");
    v->prev=p->last;
    p->last->next=v;
    }
  v->next=NULL;
  p->last=v;
  v->parent=p;
  if (!update) return p;
  if (v->pt.x<p->min.x) p->min.x=v->pt.x;
  else if (v->pt.x>p->max.x) p->max.x=v->pt.x;
  if (v->pt.y<p->min.y) p->min.y=v->pt.y;
  else if (v->pt.y>p->max.y) p->max.y=v->pt.y;
  return p;
  }

/******************************************************************************

POLYLINE:  polyline or polygon
******************************************************************************/


/******************************************************************************

new_polyline:  Allocates and initializes a new polyline "p".
******************************************************************************/

POLYLINE *new_polyline (p)
POLYLINE *p;                    /* new polyline                               */

  {
  if (!p) p=allocate(POLYLINE);
  if (!p) errexit("ERROR #5006:  Memory exhausted");
  p->first=NULL;
```

```
  p->last=NULL;
  p->prev=NULL;
  p->next=NULL;
  p->parent=NULL;
  p->min.x=MAX_DBL;
  p->min.y=MAX_DBL;
  p->max.x=0.;
  p->max.y=0.;
  return p;
  }

/*****************************************************************************

new_polyline1:  Allocates and initializes a new polyline "pa" from an
old polyline "pb" and returns "pa".
*****************************************************************************/

POLYLINE *new_polyline1 (pa, pb)
POLYLINE *pa;                /* new polyline                              */

POLYLINE *pb;                /* old polyline                              */

  {
  VERTEX *va;                /* vertex of "pa"                            */

  VERTEX *vb0;               /* 1st vertex of "pb"                        */

  VERTEX *vb;                /* vertex of "pb"                            */

  if (!pa) pa=allocate(POLYLINE);
  if (!pa) errexit("ERROR #5007:  Memory exhausted");
  pa->first=NULL;
  pa->last=NULL;
  pa->prev=NULL;
  pa->next=NULL;
  pa->parent=NULL;
  pa->min=pb->min;
  pa->max=pb->max;
  if (!pb->first) return pb;
  vb=vb0=pb->first;
  do
    {
    va=new_vertex1(_,vb);
    append_vertex(pa,va,FALSE);
    }
  while ((vb=vb->next) && vb!=vb0);
  if (vb)
    {
    va->next=pa->first;
    pa->first->prev=va;
    pa->last=pa->first;
    }
```

```
  return pa;
  }

/*****************************************************************************

new_polygon:  Makes a polygon "p" from a NULL terminated set of points and
returns "p".
*****************************************************************************/

#ifdef DOS
POLYLINE *new_polygon (POLYLINE *p, ...)
  {
  VERTEX *v;                  /* vertex                                    */

  DOUBLE2 *o;                 /* point                                     */

  va_list arg;                /* parameter pointer                         */

  if (!p) p=allocate(POLYLINE);
  if (!p) errexit("ERROR #5008:  Memory exhausted");
  p->first=NULL;
  p->last=NULL;
  p->prev=NULL;
  p->next=NULL;
  p->parent=NULL;
  p->min.x=MAX_DBL;
  p->min.y=MAX_DBL;
  p->max.x=0.;
  p->max.y=0.;
  va_start(arg,p);
  while (o=va_arg(arg,DOUBLE2*))
    {
    v=new_vertex2(_,o,_,0);
    append_vertex(p,v,TRUE);
    }
  close_polyline(p);
  return p;
  }
#else
POLYLINE *new_polygon (p, va_alist)
POLYLINE *p;                    /* new polyline                      */
va_dcl
  {
  VERTEX *v;                  /* vertex                          */
  DOUBLE2 *o;                 /* point                           */
  va_list arg;                  /* parameter pointer               */
  if (!p) p=allocate(POLYLINE);
  if (!p) errexit("ERROR #5009:  Memory exhausted");
  p->first=NULL;
  p->last=NULL;
  p->prev=NULL;
  p->next=NULL;
```

```
  p->parent=NULL;
  p->min.x=MAX_DBL;
  p->min.y=MAX_DBL;
  p->max.x=0.;
  p->max.y=0.;
  va_start(arg);
  while (o=va_arg(arg,DOUBLE2*))
    {
    v=new_vertex2(_,o,_,0);
    append_vertex(p,v,TRUE);
    }
  close_polyline(p);
  return p;
  }
#endif

/*****************************************************************************

delete_polyline:  Deallocates the polyline "p" and returns NULL.
*****************************************************************************/

POLYLINE *delete_polyline (p)
POLYLINE *p;                  /* polyline to delete                          */

  {
  POLYLIST *pl;               /* list of polylines                           */

  VERTEX *v0;                 /* initial vertex of polyline                  */

  VERTEX *v;                  /* vertex of polyline                          */

  if (!p) return NULL;
  if (pl=p->parent)
    {
    if (p->prev) p->prev->next=p->next;
    else pl->first=p->next;
    if (p->next) p->next->prev=p->prev;
    else pl->last=p->prev;
    }
  if (p->first)
    {
    v=v0=p->first;
    do
      {
      v->parent=NULL;
      delete_vertex(v);
      }
    while ((v=v->next) && v!=v0);
    }
  deallocate(p);
  return NULL;
  }
```

```
/*****************************************************************************

dump_polyline:  dumps the polyline "p".
*****************************************************************************/

VOID dump_polyline (p)
POLYLINE *p;                 /* polyline                                    */

  {
  VERTEX *v0;                /* initial vertex of polyline "p"              */

  VERTEX *v;                 /* vertex of polyline "p"                      */

  INT index=0;               /* polyline number                             */

  dump("POLYLINE %08lx:\n",p);
  if (!p) return;
  dump("min=%lg %lg max=%lg %lg parent=%lx\n",p->min,p->max,p->parent);
  if (p->first && !p->last || p->last && !p->first)
    errexit("ERROR #5010:  Corrupted list:  first=%lx last=%lx\n"
    ,p->first,p->last);
  if (!p->first) return;
  if (p->parent && (p->first->prev && (p->first!=p->last || !p->last->next)
  || p->last->next && (p->first!=p->last || !p->first->prev)))
    errexit("ERROR #5011:  Corrupted list:  first->prev=%lx first=%lx last=%lx
last->next=%lx\n",
      p->first->prev,p->first,p->last,p->last->next);
  dump("first=%lx last=%lx %s\n",p->first,p->last,
    p->first->prev?"closed":"open");
  v=v0=p->first;
  do
    {
    dump("#%2d ",index++);
    dump_vertex(v);
    if (!v->parent) errexit("ERROR #5012:  Missing parent:  v=%lx\n",v);
    if (!v->next && v!=p->last)
      errexit("ERROR #5013:  Corrupted list:  v=%lx last=%lx\n",v,p->last);
    } /* v */
  while ((v=v->next) && v!=v0);
  if (p->prev && p!=p->prev->next || p->next &&
    p!=p->next->prev)
    errexit("ERROR #5014:  Corrupted list:  prev=%08lx next=%08lx"
    ,p->prev,p->next);
  return;
  }

/*****************************************************************************

vertex_count:  Returns the number of vertices in a polyline "p".
*****************************************************************************/
```

```
INT vertex_count (p)
POLYLINE *p;
  {
  VERTEX *v;
  VERTEX *v0;
  INT i;
  v=v0=p->first;
  if (!v0) return 0;
  i=0;
  do i++;
  while ((v=v->next) && v!=v0);
  return i;
  }

/*****************************************************************************

close_polyline:  Closes a polyline "p" by linking its first and last vertices
to form a polygon.
*****************************************************************************/

POLYLINE *close_polyline (p)
POLYLINE *p;                /* polygon to append vertex to                   */

  {
  if (p->first!=p->last && eq2(p->first->pt,p->last->pt))
    delete_vertex(p->last);
  p->first->prev=p->last;
  p->last=p->last->next=p->first;
  return p;
  }

/*****************************************************************************

delink_polyline:  Decouples a polyline "p" from its polyline list.
*****************************************************************************/

POLYLINE *delink_polyline (p)
POLYLINE *p;                /* polyline to move                              */

  {
  POLYLIST *pl;             /* recipient polyline list                       */

  pl=p->parent;
  if (p->prev) p->prev->next=p->next;
  else pl->first=p->next;
  if (p->next) p->next->prev=p->prev;
  else pl->last=p->prev;
  p->prev=NULL;
  p->next=NULL;
  p->parent=NULL;
  }
```

```
/*****************************************************************************
join_polylines:  Merges two nonempty open polylines "pa" and "pb"
into one polyline "pa".  Deletes one of the endpoints if "ident" is TRUE
to avoid point duplication.
*****************************************************************************/

POLYLINE *join_polylines (pa, pb, ident)
POLYLINE *pa;                  /* 1st polyline                              */

POLYLINE *pb;                  /* 2nd polyline                              */

BOOLEAN ident;                 /* last pt of pa and 1st pt of pb same?      */

  {
  VERTEX *v;                   /* vertex                                    */

  if (ident) delete_vertex(pb->first);
  if (!pb->first)              /* pb is empty                               */

    {
    delete_polyline(pb);
    return pa;
    }
  if (pa->first)               /* pa is nonempty                            */

    {
    pa->last->next=pb->first;
    pb->first->prev=pa->last;
    }
  else pa->first=pb->first;    /* pa is empty                         */
  pa->last=pb->last;
  if (pa==pb) return pa;
  for (v=pb->first; v; v=v->next) v->parent=pa;
  pb->first=NULL;
  delete_polyline(pb);
  return pa;
  }

/*****************************************************************************
merge_polygons:  Merges two polygons "pa" and "pb" at the respective vertices
"va" and "vb" into one polygon "pa".  Returns "pa".
*****************************************************************************/

POLYLINE *merge_polygons (pa, pb, va, vb)
POLYLINE *pa;                  /* 1st polygon                               */

POLYLINE *pb;                  /* 2nd polygon                               */

VERTEX *va;                    /* vertex of "pa"                            */
```

```
VERTEX *vb;                    /* vertex of "pb"                                  */

  {
  VERTEX *v0;                  /* first vertex of "pb"                            */

  VERTEX *v;                   /* vertex                                          */

  v=v0=pb->first;
  do v->parent=pa;
  while ((v=v->next)!=v0);
  va->next->prev=vb;
  vb->next->prev=va;
  v=va->next;
  va->next=vb->next;
  vb->next=v;
  pb->first=NULL;
  delete_polyline(pb);
  return pa;
  }

/********************************************************************************

reverse_polyline:  Reverses the vertex order in a polygon "p".
********************************************************************************/

POLYLINE *reverse_polyline (p)
POLYLINE *p;
  {
  VERTEX *v0;                  /* initial vertex of "p"                           */

  VERTEX *v;                   /* vertex of "p"                                   */

  VERTEX *vnext;               /* vertex of "p"                                   */

  VERTEX *vswap;               /* vertex swap space                               */

  FLAGS mswap;                 /* mark swap space                                 */

  FLAGS mark;                  /* bit flags                                       */

  if (!p->first) return;
  v=v0=p->first;
  if (v0->prev) mark=v0->prev->mark;
  else mark=0;
  do  /* v */
    {
    vswap=v->prev;
    v->prev=vnext=v->next;
    v->next=vswap;
    mswap=mark;
    mark=v->mark;
    v->mark=mswap;
```

```
  }
while ((v=vnext) && v!=v0);
if (v) return p;            /* closed polyline                              */

vswap=p->first;
p->first=p->last;
p->last=vswap;
return p;
}

/*******************************************************************************

adjust0_polygon:  Establishes the initial displacement vectors for beam
compensation along the angular bisector of each vertex of the uncompensated
polygon "pu" of length equal to the distance from the original vertex to the
center of an imaginary circle of radius "rb" tangent to the two lines formed by

extending the two adjacent border segments (but limited to "maxadj").  If
"clip" is TRUE, two displacement vectors are drawn for angles greater then 180

degrees, perpendicular to each of the adjacent border segments of length "rb".

Returns the compensated polygon derived from "pu".
*******************************************************************************/

POLYLINE *adjust0_polygon (pu, rb, maxadj, clip)
POLYLINE *pu;                /* uncompensated polygon                       */

DOUBLE rb;                   /* effective beam radius                       */

DOUBLE maxadj;               /* max adjustment is sqrt(2.)*rb?              */

BOOLEAN clip;                /* clip corners greater than 180 deg?          */

  {
  POLYLINE *pc;              /* compensated polygon                         */

  VERTEX *vu0;               /* first vertex of "pu"                        */

  VERTEX *vu;                /* vertex of "pu"                              */

  VERTEX *vc;                /* compensated vertex                          */

  DOUBLE2 o,oa,ob;           /* points                                      */

  DOUBLE w;                  /* displacement distance                       */

  DOUBLE d;                  /* dot product                                 */

  DOUBLE dmin;               /* minimum dot product for maxadj              */
```

```
vu0=pu->first;
if (!vu0 || rb==0. || vu0->next==vu0) return new_polyline1(_,pu);
dmin=2.*sq(rb/maxadj)-1.;
pc=new_polyline(_);
vu=vu0;
do  /* vu */
  {
  if (vu->mark&DUPLICATE_FLAG)
    {
    vc=new_vertex2(_,&vu->pt,vu,vu->mark&~DUPLICATE_FLAG);
    append_vertex(pc,vc,TRUE);
    continue;
    }
  oa=normalize(sub(vu->pt,vu->prev->pt));
  ob=normalize(sub(vu->next->pt,vu->pt));
  if (clip && cross(oa,ob)<0.)
    {
    o.x=-oa.y; o.y=oa.x;
    o=round2(add(vu->pt,mul(rb,o)));
    vc=new_vertex2(_,&o,vu,vu->mark&~DUPLICATE_FLAG);
    append_vertex(pc,vc,TRUE);
    o=round2(add(vu->pt,mul(2.,sub(o,vu->pt))));
    if (o.x<pc->min.x) pc->min.x=o.x;
    if (o.y<pc->min.y) pc->min.y=o.y;
    if (o.x>pc->max.x) pc->max.x=o.x;
    if (o.y>pc->max.y) pc->max.y=o.y;
    o.x=-ob.y; o.y=ob.x;
    o=round2(add(vu->pt,mul(rb,o)));
    vc=new_vertex2(_,&o,vu,vu->mark&~DUPLICATE_FLAG);
    append_vertex(pc,vc,TRUE);
    o=round2(add(vu->pt,mul(2.,sub(o,vu->pt))));
    if (o.x<pc->min.x) pc->min.x=o.x;
    if (o.y<pc->min.y) pc->min.y=o.y;
    if (o.x>pc->max.x) pc->max.x=o.x;
    if (o.y>pc->max.y) pc->max.y=o.y;
    }
  else
    {
    o.x=-(oa.y+ob.y); o.y=oa.x+ob.x;
    if (o.x==0. && o.y==0.) o=ob;  /* 0 degree vertex                         */
    o=normalize(o);
    d=dot(oa,ob);
    if (d<=dmin) w=maxadj;
    else w=rb/sqrt((1.0+d)/2.0);
    o=round2(add(vu->pt,mul(w,o)));
    vc=new_vertex2(_,&o,vu,vu->mark&~DUPLICATE_FLAG);
    append_vertex(pc,vc,TRUE);
    o=round2(add(vu->pt,mul(2.,sub(o,vu->pt))));
    if (o.x<pc->min.x) pc->min.x=o.x;
    if (o.y<pc->min.y) pc->min.y=o.y;
    if (o.x>pc->max.x) pc->max.x=o.x;
    if (o.y>pc->max.y) pc->max.y=o.y;
```

```
    }
   }
  while ((vu=vu->next)!=vu0);
  close_polyline(pc);
  if (pu->min.x<pc->min.x) pc->min.x=pu->min.x;
  if (pu->min.y<pc->min.y) pc->min.y=pu->min.y;
  if (pu->max.x>pc->max.x) pc->max.x=pu->max.x;
  if (pu->max.y>pc->max.y) pc->max.y=pu->max.y;
  return pc;
  }

/*********************************************************************************

adjust1_polygons:  If the double of any displacement vector of the
compensated polygon "pca" crosses a segment of the uncompensated counterpart
of the compensated polygon "pcb", the displacement vector is
shrunk to half the distance to the crossing point.  This adjusts "pca".
*********************************************************************************/

VOID adjust1_polygons (pca, pcb)
POLYLINE *pca;                /* 1st compensated polygon                    */

POLYLINE *pcb;                /* 2nd compensated polygon                    */

  {
  VERTEX *vca0;               /* initial vertex of "pca"                     */

  VERTEX *vca;                /* vertex of "pca"                             */

  VERTEX *vua;              . /* uncompensated "vca"                         */

  VERTEX *vcb0;               /* initial vertex of "pcb"                     */

  VERTEX *vcb;                /* vertex of "pcb"                             */

  VERTEX *vub;                /* uncompensated "vcb"                         */

  DOUBLE2 oa0;                /* tail of displacement vector                 */

  DOUBLE2 oa1;                /* head of displacement vector                 */

  DOUBLE2 ob0;                /* tail of displacement vector                 */

  DOUBLE2 ob1;                /* head of displacement vector                 */

  DOUBLE2 o;                  /* first intersection point                    */

  DOUBLE2 oo;                 /* second intersection point                   */

  DOUBLE eps;                 /* spatial error tolerance                     */
```

```
eps=ui->eps.xy;
vca=vca0=pca->first;
vcb0=pcb->first;
do /* vca */
  {
  vua=vca->sibling;
  if (eq2(vca->pt,vua->pt)) continue;
  oa0=vua->pt;
  oa1=add(oa0,mul(2.0,sub(vca->pt,oa0)));
  vcb=vcb0;
  do /* vcb */
    {
    if (vca==vcb || vca==vcb->next) continue;
    vub=vcb->sibling;
    ob0=vub->pt;
    ob1=vub->next->pt;
    if (parallel_intersection(oa0,oa1,ob0,ob1,eps,&o,&oo))
      {
      if (distsq(oa0,oo)<distsq(oa0,o)) o=oo;
      }
    else if (!nonparallel_intersection(oa0,oa1,ob0,ob1,&o)) continue;
    if (eq2(o,oa1)) continue;
    vca->pt=round2(add(oa0,dvd(sub(o,oa0),2.0)));
    if (eq2(vca->pt,oa0)) break;
    oa1=add(oa0,mul(2.0,sub(vca->pt,oa0)));
    }
  while ((vcb=vcb->next)!=vcb0);
  }
while ((vca=vca->next)!=vca0);
return;
}

/*******************************************************************************

adjust2_polygons:  If any displacement vector of the compensated polygon "pca"

compensated polygon "pca" crosses a displacement vector of the compensated
polygon "pcb", both displacement vectors are shrunk to their intersection
point.  This adjusts "pca".
*******************************************************************************/

VOID adjust2_polygons (pca, pcb)
POLYLINE *pca;              /* 1st compensated polygon                    */

POLYLINE *pcb;              /* 2nd compensated polygon                    */

{
VERTEX *vca0;               /* initial vertex of "pca"                    */

VERTEX *vca;                /* vertex of "pca"                            */
```

```
VERTEX *vua;            /* vertex of "pua"                    */

VERTEX *vcb0;           /* initial vertex of "pcb"            */

VERTEX *vcb;            /* vertex of "pcb"                    */

VERTEX *vub;            /* vertex of "pub"                    */

DOUBLE2 oa0;            /* tail of displacement vector        */

DOUBLE2 oa1;            /* head of displacement vector        */

DOUBLE2 ob0;            /* tail of displacement vector        */

DOUBLE2 ob1;            /* head of displacement vector        */

DOUBLE2 o;              /* first intersection point           */

DOUBLE2 oo;             /* second intersection point          */

DOUBLE eps;             /* spatial error tolerance            */

eps=ui->eps.xy;

vca=vca0=pca->first;
vcb0=pcb->first;
do  /* vca */
  {
  vua=vca->sibling;
  if (eq2(vca->pt,vua->pt)) continue;
  oa0=vua->pt;
  oa1=vca->pt;
  vcb=vcb0;
  do  /* vcb */
    {
    if (pca==pcb && vca>=vcb) continue;
    vub=vcb->sibling;
    if (eq2(vcb->pt,vub->pt)) continue;
    ob0=vub->pt;
    ob1=vcb->pt;
    if (parallel_intersection(oa0,oa1,ob0,ob1,eps,&o,&oo)) o=average(o,oo);
    else if (!nonparallel_intersection(oa0,oa1,ob0,ob1,&o)) continue;
    vca->pt=round2(o);
    vcb->pt=round2(o);
    }
  while ((vcb=vcb->next)!=vcb0);
  }
while ((vca=vca->next)!=vca0);
return;
}
```

```
/*****************************************************************************

adjust3_polygons:  If any displacement vector of the compensated polygon "pca"

crosses a segment of the compensated polygon "pcb", the two displacment vectors

which give rise to this segment are shrunk so that the segment passes through
the head of the intrusive displacement vector and the compensated segment is as

parallel as possible to its uncompensated counterpart.  This adjusts "pca".
*****************************************************************************/

VOID adjust3_polygons (pca, pcb)
POLYLINE *pca;                /* 1st compensated polygon                    */

POLYLINE *pcb;                /* 2nd compensated polygon                    */

  {
  VERTEX *vca0;               /* initial vertex of "pca"                     */

  VERTEX *vca;                /* vertex of "pca"                             */

  VERTEX *vcb0;               /* initial vertex of "pcb"                     */

  VERTEX *vcb;                /* vertex of "pcb"                             */

  VERTEX *vub;                /* vertex of "pub"                             */

  DOUBLE2 oa1;                /* value of vertex "vca"                       */

  DOUBLE2 ob0;                /* value of vertex "vub"                       */

  DOUBLE2 ob1;                /* value of vertex "vcb"                       */

  DOUBLE2 oc0;                /* value of vertex following "vub"             */

  DOUBLE2 oc1;                /* value of vertex following "vcb"             */

  DOUBLE2 o;                  /* first intersection point                    */

  DOUBLE dbsq,dcsq,dosq;      /* square distances                            */

  DOUBLE eps;                 /* spatial error tolerance                     */

  eps=ui->eps.xy;
  vca=vca0=pca->first;
  vcb0=pcb->first;
  do  /* vca */
    {
    oa1=vca->pt;
    vcb=vcb0;
    do  /* vcb */
```

```
      {
      if (vca==vcb || vca==vcb->next) continue;
      vub=vcb->sibling;
      ob0=vub->pt;
      ob1=vcb->pt;
      oc0=vub->next->pt;
      oc1=vcb->next->pt;
      if (aside(ob0,oa1,oc0,ui->eps.xy)<0
      || !eq2(ob1,oc1) && aside(ob1,oa1,oc1,ui->eps.xy)>=0
      || !eq2(ob0,ob1) && aside(ob0,oa1,ob1,ui->eps.xy)>0
      || !eq2(oc0,oc1) && aside(oc0,oa1,oc1,ui->eps.xy)<0) continue;
      dbsq=distplsq(ob1,ob0,oc0);
      dcsq=distplsq(oc1,ob0,oc0);
      dosq=distplsq(oa1,ob0,oc0);
      if (dosq<=eps*eps)
        {
        vcb->pt=ob0;
        vcb->next->pt=oc0;
        }
      else if (dbsq<=dosq && dbsq<=dcsq)
        {
        if (twoline_intersection(ob1,oa1,oc0,oc1,&o)) vcb->next->pt=o;
        }
      else if (dcsq<=dosq)
        {
        if (twoline_intersection(oc1,oa1,ob0,ob1,&o)) vcb->pt=o;
        }
      else
        {
        if (ptline_intersection(oa1,ob1,ob0,oc0,&o)) vcb->pt=o;
        if (ptline_intersection(oa1,oc1,oc0,ob0,&o)) vcb->next->pt=o;
        }
      }
    while ((vcb=vcb->next)!=vcb0);
    }
  while ((vca=vca->next)!=vca0);
  return;
  }

/*****************************************************************************

POLYLIST:  List of polylines or polygons.
*****************************************************************************/


/*****************************************************************************

new_polylist:  Allocates and initializes the polyline list "pl" with a layer
index "layerno", a bottom z value of "zmin" and a top z value of "zmax".
Returns "pl".
*****************************************************************************/
```

```
POLYLIST *new_polylist (pl, layerno, zmin, zmax)
POLYLIST *pl;                  /* new polyline list                          */

INT layerno;                   /* absolute layer number                      */

DOUBLE zmin;                   /* minimum z value of layer                   */

DOUBLE zmax;                   /* maximum z value of layer                   */

  {
  if (!pl) pl=allocate(POLYLIST);
  if (!pl) errexit("ERROR #5015:  Memory exhausted");
  pl->first=NULL;
  pl->last=NULL;
  pl->layerno=layerno;
  pl->next=NULL;
  pl->prev=NULL;
  pl->parent=NULL;
  pl->min.x=MAX_DBL;
  pl->min.y=MAX_DBL;
  pl->min.z=zmin;
  pl->max.x=0.;
  pl->max.y=0.;
  pl->max.z=zmax;
  return pl;
  }

/******************************************************************************

new_polylist1:  Allocates and initializes the polyline list "pla" with the
polyline list "plb" and returns "pla".
******************************************************************************/

POLYLIST *new_polylist1 (pla, plb)
POLYLIST *pla;                 /* new polyline list                          */

POLYLIST *plb;                 /* polyline list to copy                      */

  {
  POLYLINE *pb;                /* polyline in "plb"                          */

  if (!pla) pla=allocate(POLYLIST);
  if (!pla) errexit("ERROR #5016:  Memory exhausted");
  pla->first=NULL;
  pla->last=NULL;
  pla->layerno=plb->layerno;
  pla->min=plb->min;
  pla->max=plb->max;
  pla->next=NULL;
  pla->prev=NULL;
  pla->parent=NULL;
  pla->min=plb->min;
```

```
  pla->max=plb->max;
  for (pb=plb->first; pb; pb=pb->next)
    append_polyline(pla,new_polyline1(_,pb));
  return pla;
  }

/*****************************************************************************

new_polylist2:  Allocates and initializes the polyline list "pl" with the
segment list "sl" and empties "sl" in the process.  The segment directions are

ignored if "ignorient" is TRUE.  If "closed" is TRUE, the segment list is
certified gap free.  If any misoriented segments are found, "misoriented" is
set to TRUE.  Returns "pl".
*****************************************************************************/

POLYLIST *new_polylist2 (pl, sl, ignorient, misoriented, closed)
POLYLIST *pl;                 /* new polyline list                         */

SEGLIST *sl;                  /* segment list to copy
*/
BOOLEAN ignorient;            /* ignore segment orientation?               */

BOOLEAN *misoriented;         /* any misoriented segments?                 */

BOOLEAN closed;               /* segment list is gap free?                 */

  {
  POLYLINE *p;                /* new polyline                              */

  VERTEX *v;                  /* vertex                                    */

  DOUBLE2 tail;               /* first point of "p"                        */

  DOUBLE2 head;               /* last point of "p"                         */

  SEGMENT *s;                 /* segment                                   */

  TIME_T time0;                 /* start time for function
*/
  SEGMENT *s0;                /* segment                                   */

  SEGMENT *s1;                /* segment                                   */

  DOUBLE2 new_tail;           /* next tail value                           */

  DOUBLE2 new_head;           /* next head value                           */

  BOOLEAN orient0;            /* orientation of next tail segment used     */

  BOOLEAN orient1;            /* orientation of next head segment used     */
```

```
if (ui->timing) time0=time(_);

if (!pl) pl=allocate(POLYLIST);
if (!pl) errexit("ERROR #5017:  Memory exhausted");
pl->first=NULL;
pl->last=NULL;
pl->layerno=sl->layerno;
pl->min=sl->min;
pl->max=sl->max;
pl->next=NULL;
pl->prev=NULL;
pl->parent=NULL;
while (s=sl->first)        /* loop until segment list exhausted */
  {
  p=new_polyline(_);
  if (s->orient>=0)
    {
    v=new_vertex2(_,&s->pt[0],_,0);
    append_vertex(p,v,FALSE);
    v=new_vertex2(_,&s->pt[2],_,0);
    append_vertex(p,v,FALSE);
    deplete_segment(s,1);
    }
  else /* if (s->orient<0) */
    {
    v=new_vertex2(_,&s->pt[2],_,0);
    append_vertex(p,v,FALSE);
    v=new_vertex2(_,&s->pt[0],_,0);
    append_vertex(p,v,FALSE);
    deplete_segment(s,-1);
    }
  tail=p->first->pt;
  head=p->last->pt;
  if (eq2(tail,head))        /* catches point segments                     */

    {
    p=close_polyline(p);
    append_polyline(pl,p);
    continue;
    }
  do                         /* loop until polyline is complete            */

    {
    s0=s1=NULL;
    for (s=sl->first; s; s=s->next) /* new correctly oriented tail         */

      {
      if (tail.y<s->pt[0].y) break;
      if (eq2(tail,s->pt[0]) && s->orient<=0)
        {
        s0=s;
        new_tail=s->pt[2];
```

```
    orient0=-1;
    break;
    }
  if (eq2(tail,s->pt[2]) && s->orient>=0)
    {
    s0=s;
    new_tail=s->pt[0];
    orient0=1;
    break;
    }
  }  /* s */
for (s=sl->first; s; s=s->next) /* new correctly oriented head         */

  {
  if (head.y<s->pt[0].y) break;
  if (eq2(head,s->pt[0]) && s->orient>=0)
    {
    s1=s;
    new_head=s->pt[2];
    orient1=1;
    break;
    }
  if (eq2(head,s->pt[2]) && s->orient<=0)
    {
    s1=s;
    new_head=s->pt[0];
    orient1=-1;
    break;
    }
  }  /* s */
if (!s0 && ignorient)
  {
  for (s=sl->first; s; s=s->next) /* any new tail                       */

    {
    if (tail.y<s->pt[0].y) break;
    if (eq2(tail,s->pt[0]))
      {
      if (!misoriented)
        errexit("ERROR #5100:  Misoriented segment on layer %d\n"
        ,pl->layerno);
      *misoriented=TRUE;
      s0=s;
      new_tail=s->pt[2];
      orient0=1;
      break;
      }
    if (eq2(tail,s->pt[2]))
      {
      if (!misoriented)
        errexit("ERROR #5101:  Misoriented segment on layer %d\n"
        ,pl->layerno);
```

```
        *misoriented=TRUE;
        s0=s;
        new_tail=s->pt[0];
        orient0=-1;
        break;
        }
      }  /* s */
    }
  if (!s1 && ignorient)
    {
    for (s=s1->first; s; s=s->next) /* any new head                    */

      {
      if (head.y<s->pt[0].y) break;
      if (eq2(head,s->pt[0]))
        {
        if (!misoriented)
          errexit("ERROR #5102:  Misoriented segment on layer %d\n"
          ,pl->layerno);
        *misoriented=TRUE;
        s1=s;
        new_head=s->pt[2];
        orient1=-1;
        break;
        }
      if (eq2(head,s->pt[2]))
        {
        if (!misoriented)
          errexit("ERROR #5103:  Misoriented segment on layer %d\n"
          ,pl->layerno);
        *misoriented=TRUE;
        s1=s;
        new_head=s->pt[0];
        orient1=1;
        break;
        }
      }  /* end s loop */
    }
  if (closed && (!s0 || !s1))
    errexit("ERROR #5018:  Segment list has gaps");
  if (s0)
    {
    deplete_segment(s0,orient0);
    if (s0==s1)
      {
      close_polyline(p);
      break;
      }
    v=new_vertex2(_,&new_tail,_,0);
    prepend_vertex(p,v,FALSE);
    if (s1 && eq2(new_tail,new_head))
      {
```

```
          deplete_segment(s1,orient1);
          close_polyline(p);
          break;
          }
        tail=new_tail;
        }
      if (s1)
        {
        deplete_segment(s1,orient1);
        v=new_vertex2(_,&new_head,_,0);
        append_vertex(p,v,FALSE);
        head=new_head;
        }
      }
    while (s0 || s1);
    append_polyline(pl,p);
    } /* s1->first */
  delete_seglist(s1);
  if (ui->timing) timing->new_polylist2+=difftime(time(_),time0);
  return pl;
  }

/*****************************************************************************

delete_polylist:  Deallocates list of polylines "pl" and returns NULL.
*****************************************************************************/

POLYLIST *delete_polylist (pl)
POLYLIST *pl;                   /* polyline pl                              */

  {
  PART *part;                   /* part polylist belongs to                 */

  POLYLINE *p;                  /* polyline to delete                       */

  if (!pl) return NULL;
  if (part=pl->parent)
    {
    if (pl->prev) pl->prev->next=pl->next;
    else part->plfirst=pl->next;
    if (pl->next) pl->next->prev=pl->prev;
    else part->pllast=pl->prev;
    }
  for (p=pl->first; p; p=p->next)
    {
    p->parent=NULL;
    delete_polyline(p);
    }
  deallocate(pl);
  return NULL;
  }
```

```
/******************************************************************************

dump_polylist:  Dumps the polyline list "pl".
******************************************************************************/

VOID dump_polylist (pl)
POLYLIST *pl;                   /* polyline list                                  */

  {
  POLYLINE *p;                  /* polyline                                       */

  INT index=0;                  /* polyline count                                 */

  dump("POLYLIST %08lx:\n",pl);
  if (!pl) return;
  dump("min=%lg %lg %lg max=%lg %lg %lg\n",pl->min,pl->max);
  dump("parent=%lx layerno=%d\n",pl->parent,pl->layerno);
  if (pl->first && !pl->last || pl->last && !pl->first)
    errexit("ERROR #5019:  Corrupted list:  first=%lx last=%lx\n"
    ,pl->first,pl->last);
  if (!pl->first) return;
  if (pl->first && pl->first->prev || pl->last && pl->last->next)
    errexit("ERROR #5020:  Corrupted list:  first->prev=%lx first=%lx last=%lx
last->next=%lx\n",
      pl->first->prev,pl->first,pl->last,pl->last->next);
  dump("first=%lx last=%lx %s\n",pl->first,pl->last,
    pl->first->prev?"closed":"open");
  for (p=pl->first; p; p=p->next)
    {
    dump("#%d ",index++);
    dump_polyline(p);
    if (!p->parent) errexit("ERROR #5021:  Missing parent:  p=%lx\n",p);
    if (p->prev && p!=p->prev->next || p->next &&
      p!=p->next->prev)
      errexit("ERROR #5022:  Corrupted list:  prev=%08lx next=%08lx"
      ,p->prev,p->next);
    if (!p->next && p!=pl->last)
      errexit("ERROR #5023:  Corrupted list:  p=%lx last=%lx\n",p,pl->last);
    } /* p */
  return;
  }

/******************************************************************************

read_ascii_polylist:  Reads in polyline list in ASCII format for one data layer

from the input stream "stream".
******************************************************************************/

POLYLIST *read_ascii_polylist (stream)
```

```
STREAM *stream;              /* input file                                    */
  {
  static CHAR line[81]={0};  /* input line                                    */

  DOUBLE zmin;
  static DOUBLE zmax=UNDEF_DBL;
  POLYLIST *pl;
  POLYLINE *p;
  VERTEX *v;                 /* vertex                                        */

  static DOUBLE o[2];
  if (zmax==UNDEF_DBL)
    {
    do if (!read_line(stream,line)) return NULL;
    while (!*line || *line=='!' || line[0]=='/' && line[1]=='/');
    if (*line!='L' && *line!='l' || sscanf(line,"%*s %lf",&zmin)<1)
      errexit("ERROR #5024:  Bad input line: %s",line);
    }
  else zmin=zmax;
  do if (!read_line(stream,line)) return NULL;
  while (!*line);
  pl=new_polylist(_,0,zmin,0.);
  while (TRUE)
    {
    p=new_polyline(_);
    v=NULL;
    while (TRUE)
      {
      if (sscanf(line,"%lg %lg",&o[X],&o[Y])<2)
        errexit("ERROR #5025:  Bad input line: %s",line);
      transform_vertex(o,ui->transformation);
      o[X]=ctos(o[X],X);
      o[Y]=ctos(o[Y],Y);
      if (!v || o[X]!=v->pt.x || o[Y]!=v->pt.y)
        {
        v=new_vertex(_,o[X],o[Y],_,0);
        append_vertex(p,v,TRUE);
        }
      if (!read_line(stream,line))
        errexit("ERROR #5026:  No upper limit for data\n");
      if (!*line) break;
      if (isalpha(*line)) goto break2;
      }
    while (!*line)
      {
      if (!read_line(stream,line))
        errexit("ERROR #5027:  No upper limit for data\n");
      if (isalpha(*line)) goto break2;
      }
    append_polyline(pl,p);
    }
```

```
  break2:
  append_polyline(pl,p);
  if (sscanf(line,"%*s %lf",&zmax)<1)
    errexit("ERROR #5028:  Bad input line: %s",line);
  transform_z_extents(&zmin,&zmax,ui->transformation);
  pl->min.z=ctos(zmin,Z,TRUE);
  pl->max.z=ctos(zmax,Z,TRUE);
  return pl;
  }

/*****************************************************************************

read_binary_polylist:  Reads in polyline list in binary format for one layer
from the input stream "stream".
*****************************************************************************/

POLYLIST *read_binary_polylist (stream)
STREAM *stream;              /* input file                                  */

  {
  DOUBLE zmin;
  static DOUBLE zmax=UNDEF_DBL;
  FLOAT fzmin;
  FLOAT fzmax;
  POLYLIST *pl;
  POLYLINE *p;
  VERTEX *v;                 /* vertex                                      */

  INT ivalue;                /* integer value                               */

  FLOAT fvalue;              /* floating point value                        */

  DOUBLE o[2];               /* data point                                  */

  if (zmax==UNDEF_DBL)       /* read header                                 */

    {
    do
      {
      ivalue=getc(stream->file);
      if (ivalue==-1) errexit("ERROR #5029:  Header missing terminal 0x1a");
      }
    while (ivalue!=0x1a);
    ivalue=getc(stream->file);
    if (ivalue<0 || ivalue>1)
      errexit("ERROR #5030:  Bad data format:  %d",ivalue);
    if (stream->byteorder<0) stream->byteorder=ivalue;
    ivalue=getc(stream->file);
    if (ivalue==0) ui->unit=1.;
    else if (ivalue==1) ui->unit=.0254;
    else if (ivalue==2) ui->unit=.254;
    else errexit("ERROR #5031:  Bad data unit:  %d",ivalue);
```

```
    ivalue=getc(stream->file);
    if (ivalue==0) ui->data=POLYLINES;
    else if (ivalue==1) ui->data=SEGMENTS;
    else if (ivalue==2) ui->data=TRIANGLES;
    else errexit("ERROR #5032:  Bad data type:  %d",ivalue);
    if (fread_(&fzmin,sizeof(FLOAT),1,stream->file,stream->byteorder
    !=ui->byteorder)<1)
      errexit("ERROR #5033:  Error reading z level");
    zmin=(DOUBLE)fzmin;
    }
  else zmin=zmax;
  pl=new_polylist(_,0,zmin,0.);
  while (TRUE)
    {
    p=new_polyline(_);
    v=NULL;
    while (TRUE)
      {
      if
(fread_(&fvalue,sizeof(FLOAT),1,stream->file,stream->byteorder!=ui->byteorder)<
1)
        errexit("ERROR #5034:  Failure reading x coordinate");
      if (*(LONG*)&fvalue==0xffffffffL) break;
      if (nan(&fvalue))
        errexit("ERROR #5035:  Hexadecimal %08lx is not a valid floating point
number"
         ,*(LONG*)&fvalue);
      o[X]=(DOUBLE)fvalue;
      if
(fread_(&fvalue,sizeof(FLOAT),1,stream->file,stream->byteorder!=ui->byteorder)<
1)
        errexit("ERROR #5036:  Failure reading y coordinate");
      if (nan(&fvalue))
        errexit("ERROR #5037:  Hexadecimal %08lx is not a valid floating point
number"
         ,*(LONG*)&fvalue);
      o[Y]=(DOUBLE)fvalue;
      transform_vertex(o,ui->transformation);
      o[X]=ctos(o[X],X);
      o[Y]=ctos(o[Y],Y);
      if (!v || o[X]!=v->pt.x || o[Y]!=v->pt.y)
        {
        v=new_vertex(_,o[X],o[Y],_,0);
        append_vertex(p,v,TRUE);
        }
      }
    if (!p->first)
      {
      delete_polyline(p);
      break;
      }
    append_polyline(pl,p);
```

```
    }
  if (!pl->first)
    {
    delete_polylist(pl);
    return NULL;
    }
  if (fread_(&fzmax,sizeof(FLOAT),1,stream->file,stream->byteorder
  !=ui->byteorder)<1)
    errexit("ERROR #5038:  Error reading z level");
  zmax=fzmax;
  transform_z_extents(&zmin,&zmax,ui->transformation);
  pl->min.z=ctos(zmin,Z,TRUE);
  pl->max.z=ctos(zmax,Z,TRUE);
  return pl;
  }

/******************************************************************************

write_polylist:  Writes out the polyline list "pl" as a list of segments
in *.sli segment format to a file "stream" with block type header "type".
Retruns "pl".
******************************************************************************/

POLYLIST *write_polylist (stream, pl, type)
STREAM *stream;                /* output stream                             */

POLYLIST *pl;                  /* list of polylines                         */

UCHAR type;                    /* block type                                */

  {
  POLYLINE *p;                 /* polyline in list                          */

  VERTEX *v0;                  /* initial vertex                            */

  VERTEX *v;                   /* vertex                                    */

  USHORT n;                    /* number of values in polyline              */

  if (!pl->first) return NULL;
  if (stream->format==ASCII)
    fprintf(stream->file,"%s\n",block_type[type]);
  else
    {
fwrite_(&type,sizeof(UCHAR),1,stream->file,stream->byteorder!=ui->byteorder);
    n=0;
    for (p=pl->first; p; p=p->next)
      {
      n+=vertex_count(p);
      if (!p->first->prev) n--;  /* open polyline */
      }
```

```
    n*=4;
    fwrite_(&n,sizeof(USHORT),1,stream->file,stream->byteorder!=ui->byteorder);

    }
  for (p=pl->first; p; p=p->next)
    {
    v=v0=p->last;
#ifdef UNDEF
    if (!v->prev || v==v->prev)                     /* monoline, monogon       */

      write_two_vertices(stream,v,v);
    if (v->next && v->prev==v->next)                /* bigon                   */

      write_two_vertices(stream,v,v->prev);
#endif
    do                                          /* biline, other polygon       */

      {
      if (!v->prev) break;
      write_two_vertices(stream,v,v->prev);
      }
    while ((v=v->prev) && v!=v0);
    }
  return pl;
  }

/*******************************************************************************

write_polylist2:  Writes out the polygon list "pl" to the intermediate stream
"stream" and returns "pl".
*******************************************************************************/

POLYLIST *write_polylist2 (stream, pl)
STREAM *stream;              /* internal file                                   */

POLYLIST *pl;                /* list of polygons                                */

  {
  POLYLINE *p;               /* polyline in list                                */

  BOOLEAN pclosed;           /* closed polyline?                                */

  INT pcount;                /* number of polylines in list                     */

  INT vcount;                /* number of vertices in polyline                  */

  VERTEX *v;                 /* vertex                                          */

  VERTEX *v0;                /* initial vertex                                  */
```

```
FLOAT flt[2];               /* floating point buffer                            */

CHAR chr;                   /* character buffer                                 */

flt[0]=(FLOAT)pl->min.z;
flt[1]=(FLOAT)pl->max.z;
if (fwrite(flt,sizeof(FLOAT),2,stream->file)!=2)
  errexit("ERROR #5039:  Error writing z levels to internal file");
pcount=polyline_count(pl);
if (fwrite(&pcount,sizeof(INT),1,stream->file)!=1)
  errexit("ERROR #5041:  Error writing polyline count to internal file");
for (p=pl->first; p; p=p->next)
  {
  pclosed=p->first->prev!=NULL;
  chr=(CHAR)pclosed;
  if (fwrite(&chr,sizeof(CHAR),1,stream->file)!=1)
    errexit("ERROR #5042:  Error writing polyline closure to internal file");

  vcount=vertex_count(p);
  if (fwrite(&vcount,sizeof(INT),1,stream->file)!=1)
    errexit("ERROR #5043:  Error writing vertex count to internal file");
  v=v0=p->first;
  if (!v0) continue;
  do
    {
    flt[0]=(FLOAT)v->pt.x;
    flt[1]=(FLOAT)v->pt.y;
    if (fwrite(flt,sizeof(FLOAT),2,stream->file)!=2)
      errexit("ERROR #5044:  Error writing vertex to internal file");
    }
  while ((v=v->next) && v!=v0);
  }
return pl;
}

/*******************************************************************************

polyline_count:  Returns the number of polylines in a list "pl".
*******************************************************************************/

INT polyline_count (pl)
POLYLIST *pl;
  {
  POLYLINE *p;
  INT i=0;
  for (p=pl->first; p; p=p->next) i++;
  return i;
  }

/*******************************************************************************
```

```
close_polylist:  Closes all polylines in a list "pl" by linking their first and

last vertices.  Deletes any duplicate endpoints.  Returns "pl".
*****************************************************************************/

POLYLIST *close_polylist (pl)
POLYLIST *pl;
  {
  POLYLINE *p;
  for (p=pl->first; p; p=p->next)
    {
    if (p->first->prev) continue;  /* closed already              */
    if (eq2(p->first->pt,p->last->pt)) close_polyline(p);
    }
  return pl;
  }

/*****************************************************************************

append_polyline:  Appends the polyline "p" to the polyline list "pl" and
returns "pl".
*****************************************************************************/

POLYLIST *append_polyline (pl, p)
POLYLIST *pl;               /* polyline list to append polylines to       */

POLYLINE *p;                /* first polyline to append to "list"         */

  {
  if (!p) return pl;
  if (!pl->first)
    {
    pl->first=p;
    pl->last=p;
    p->prev=NULL;
    }
  else
    {
    if (pl->first->prev)
      errexit("ERROR #5045:  Circular polyline list");
    p->prev=pl->last;
    pl->last->next=p;
    pl->last=p;
    }
  p->next=NULL;
  p->parent=pl;
  if (p->min.x<pl->min.x) pl->min.x=p->min.x;
  if (p->max.x>pl->max.x) pl->max.x=p->max.x;
  if (p->min.y<pl->min.y) pl->min.y=p->min.y;
  if (p->max.y>pl->max.y) pl->max.y=p->max.y;
  return pl;
  }
```

```
/*****************************************************************************

degap_polylist:  Convertes a list of polylines "pla" to a list of
polygons by closing gaps in order of their size (smallest first).  Returns
the list of polygons.
*****************************************************************************/

POLYLIST *degap_polylist (pla, ignorient, missing, misoriented)
POLYLIST *pla;               /* input list of polylines                    */

BOOLEAN ignorient;           /* ignore segment orientation?                */

BOOLEAN *missing;            /* any segments missing?                      */

BOOLEAN *misoriented;        /* any segments misoriented?                  */

  {
  POLYLIST *plb;             /* output list of polylines                   */

  POLYLINE *pa;              /* polyline                                   */

  POLYLINE *pb;              /* polyline                                   */

  POLYLINE *pa0;             /* "pa" with minimum gap                      */

  POLYLINE *pb0;             /* "pb" with mimimum gap                      */

  DOUBLE dsq;                /* square of gap                              */

  DOUBLE dsq0;               /* square of mimimum gap;                     */

  DOUBLE2 oa;                /* end point of "pa"                          */

  DOUBLE2 ob;                /* end point of "pb"                          */

  TIME_T time0;                /* start time for function
*/
  INT gaptype;               /* -1) tails 0) head/tail 1) heads            */

  if (ui->timing) time0=time(_);

  plb=new_polylist(_,pla->layerno,pla->min.z,pla->max.z);
  for (pa=pla->first; pa; pa=pb)
    {
    pb=pa->next;
    if (!pa->first->prev) continue;
    delink_polyline(pa);
    append_polyline(plb,pa);
    }
```

```
while (pla->first)
  {
  dsq0=MAX_DBL;
  for (pa=pla->first; pa; pa=pa->next)
    {
    oa=pa->last->pt;
    for (pb=pla->first; pb; pb=pb->next)
      {
      ob=pb->first->pt;
      dsq=sq(oa.x-ob.x)+sq(oa.y-ob.y);
      if (dsq>=dsq0) continue;
      dsq0=dsq;
      pa0=pa;
      pb0=pb;
      gaptype=0;
      }
    }
  if (ignorient)
    {
    for (pa=pla->first; pa; pa=pa->next)
      {
      oa=pa->first->pt;
      for (pb=pa->next; pb; pb=pb->next)
        {
        if (pa==pb) continue;
        ob=pb->first->pt;
        dsq=sq(oa.x-ob.x)+sq(oa.y-ob.y);
        if (dsq>=dsq0) continue;
        dsq0=dsq;
        pa0=pa;
        pb0=pb;
        gaptype=-1;
        }
      oa=pa->last->pt;
      for (pb=pa->next; pb; pb=pb->next)
        {
        if (pa==pb) continue;
        ob=pb->last->pt;
        dsq=sq(oa.x-ob.x)+sq(oa.y-ob.y);
        if (dsq>=dsq0) continue;
        dsq0=dsq;
        pa0=pa;
        pb0=pb;
        gaptype=1;
        }
      }
    }
  if (dsq0==MAX_DBL) break;
  if (!missing)
    errexit("ERROR #5104:  Missing segment on layer %d\n",pla->layerno);
  *missing=TRUE;
  if (pa0==pb0)
```

```
      {
      delink_polyline(pa0);
      close_polyline(pa0);
      append_polyline(plb,pa0);
      continue;
      }
    if (gaptype<0)
      {
      if (!misoriented)
        errexit("ERROR #5105:  Misoriented segment on layer %d\n"
        ,pla->layerno);
      *misoriented=TRUE;
      pa0=reverse_polyline(pa0);
      }
    else if (gaptype>0)
      {
      if (!misoriented)
        errexit("ERROR #5106:  Misoriented segment on layer %d\n"
        ,pla->layerno);
      *misoriented=TRUE;
      pb0=reverse_polyline(pb0);
      }
    join_polylines(pa0,pb0,FALSE);
    }  /* pla->first */
  if (pla->first)
    errexit("ERROR #5107:  Degap routine failed to close all gaps on layer
%d\n"
    ,pla->layerno);
  delete_polylist(pla);
  if (ui->timing) timing->degap_polylist+=difftime(time(_),time0);
  for (pb=plb->first; pb; pb=pb->next)
    {
    if (pb->first->prev) continue;
    errexit("ERROR #5046:  Fails to close gaps");
    }
  return plb;
  }

/******************************************************************************

smooth_polylist:  Gets rid of unnecessary vertices in the polygons of
a list "pl" by eliminating the middle point in any set of three collinear
successive vertices.  "eps" is the spatial error tolerance.  Returns "pl".
******************************************************************************/

POLYLIST *smooth_polylist (pl, eps)
POLYLIST *pl;               /* list of polygons                          */

DOUBLE eps;                 /* spatial error tolerance                   */

  {
```

```
  POLYLINE *p;                /* polygon to smooth                          */

  VERTEX *va;                 /* vertex of "p"                              */

  VERTEX *vb;                 /* vertex of "p"                              */

  VERTEX *v0;                 /* first vertex of "p"                        */

  if (!pl->first) return pl;
  for (p=pl->first; p; p=p->next)
    {
    va=v0=p->first;
    do  /* va */
      {
      for (vb=va->next; vb!=va; vb=vb->next)
        {
        if (!eq2(va->pt,vb->pt) && !between(va->pt,vb->pt,vb->next->pt,eps))
          break;
        delete_vertex(vb);
        v0=p->first;
        }  /* vb */
      }
    while ((va=va->next)!=v0);
    }
  return pl;
  }

/*****************************************************************************

compact_polylist:  Combines intersecting polygons into one and gets rid of
unnecessary vertices in the polygons of a list "pl".  Returns "pl".
*****************************************************************************/

POLYLIST *compact_polylist (pl)
POLYLIST *pl;                 /* list of polygons                           */

  {
  POLYLINE *pa;               /* polygon of "pl"                            */

  POLYLINE *pb;               /* polygon of "pl"                            */

  VERTEX *va0;                /* initial vertex of "pa"                     */

  VERTEX *vb0;                /* initial vertex of "pb"                     */

  VERTEX *va;                 /* vertex of "pa"                             */

  VERTEX *vb;                 /* vertex of "pb"                             */

  if (!pl->first) return pl;
  for (pa=pl->first; pa; pa=pa->next)
    {
```

```
  va=va0=pa->first;
  do  /* va */
    {
    pb_loop:;
    for (pb=pa->next; pb; pb=pb->next)
      {
      vb=vb0=pb->first;
      do
        {
        if (!eq2(va->pt,vb->pt)) continue;
        pa=merge_polygons(pa,pb,va,vb);
        goto pb_loop;
        }
      while ((vb=vb->next)!=vb0);
      }  /* pb */
    }
  while ((va=va->next)!=va0);
  }  /* pa */
return pl;
}
/**********************************************************************************

boolean_polylists:  Returns the boolean union if "op"==1 and "qvinf"==0,
intersection if "op"==2 and "qvinf"==0, or difference if "op"==2 and
"qvinf"==1 of two lists of polygons "pla" and "plb".
**********************************************************************************/

POLYLIST *boolean_polylists (pla, plb, op, qvinf)
POLYLIST *pla;              /* 1st polygon list                              */

POLYLIST *plb;              /* 2nd polygon list                              */

INT op;                     /* operation: 1)union 2)intersection             */

INT qvinf;                  /* quantitative volume at infinity               */

  {
  SEGLIST *sla;             /* segment list from "pla"                       */

  SEGLIST *slb;             /* segment list from "plb"                       */

  DOUBLE2 rot;              /* unit rotation vector                          */

  TIME_T time0;               /* start time for function
*/
  if (ui->timing) time0=time(_);
  rot.x=1.; rot.y=0.;
  sla=new_seglist2(_,pla,rot,1);
  delete_polylist(pla);
  if (plb)
    {
```

```
    slb=new_seglist2(_,plb,rot,qvinf==0?1:-1);
    delete_polylist(plb);
    sla=merge_seglists(sla,slb);
    }
  sla=sort_seglist(sla);
  sla=condense_seglist(sla);
  sla=split_seglist(sla);
  sla=boolean_seglist(sla,op,qvinf);
  pla=new_polylist2(_,sla,FALSE,_,TRUE);
  pla=compact_polylist(pla);
  pla=smooth_polylist(pla,ui->eps.xy);
  if (ui->timing) timing->boolean_polylists+=difftime(time(_),time0);
  return pla;
  }


/******************************************************************************

reorient_polylist:  Returns the boolean union of a set of polygons "pl" which
get redirected in order to keep all of them in the union.  If any
reorientations occur, "misoriented" is set to TRUE.
******************************************************************************/

POLYLIST *reorient_polylist (pl, misoriented)
POLYLIST *pl;                /* segment list                              */

BOOLEAN *misoriented;        /* any misoriented segments?                 */

  {
  SEGLIST *sl;               /* segment list                              */

  DOUBLE2 rot;               /* rotation                                  */

  TIME_T time0;                /* start time for function
*/
  if (ui->timing) time0=time(_);
  rot.x=1.; rot.y=0.;
  sl=new_seglist2(_,pl,rot,1);
  delete_polylist(pl);
  sl=sort_seglist(sl);
  sl=condense_seglist(sl);
  sl=split_seglist(sl);
  sl=reorient_seglist(sl,misoriented);
  pl=new_polylist2(_,sl,FALSE,_,TRUE);
  pl=compact_polylist(pl);
  pl=smooth_polylist(pl,ui->eps.xy);
  if (ui->timing) timing->reorient_polylist+=difftime(time(_),time0);
  return pl;
  }
```

```
/*****************************************************************************
union_polylists:  Returns the union of two polygon lists "pla" and "plb".  The
original polygon lists are destroyed unless the 1st and 2nd bits of "save" are
set.
*****************************************************************************/

POLYLIST *union_polylists (pla, plb, save)
POLYLIST *pla;               /* 1st polygon list                             */
POLYLIST *plb;               /* 2nd polygon list                             */
FLAGS save;                  /* 1) save old "pla" 2) save old "plb"          */

  {
  TIME_T time0;                /* start time for function
*/
  if (ui->timing) time0=time(_);
  if (!pla->first)             /* A is the null set                          */
    {
    if (!(save&1)) delete_polylist(pla);
    if (save&2) plb=new_polylist1(_,plb);
    return plb;
    }
  else if (!plb->first)        /* B is the null set                          */
    {
    if (save&1) pla=new_polylist1(_,pla);
    if (!(save&2)) delete_polylist(plb);
    return pla;
    }
  if (save&1) pla=new_polylist1(_,pla);
  if (save&2) plb=new_polylist1(_,plb);
  pla=boolean_polylists(pla,plb,1,0);
  if (ui->timing) timing->union_polylists+=difftime(time(_),time0);
  return pla;
  }

/*****************************************************************************
intersect_polylists:  Returns the intersection of two polygon lists "pla" and
"plb".  The original polygon lists are destroyed unless the 1st and 2nd bits of
save are set.
*****************************************************************************/

POLYLIST *intersect_polylists (pla, plb, save)
```

```
POLYLIST *pla;                /* 1st polylist                                  */

POLYLIST *plb;                /* 2nd polylist                                  */

FLAGS save;                   /* 1) save old "pla" 2) save old "plb"           */

  {
  TIME_T time0;                 /* start time for function
*/
  if (ui->timing) time0=time(_);
  if (!pla->first)            /* A is the null set                             */

    {
    if (save&1) pla=new_polylist1(_,pla);
    if (!(save&2)) delete_polylist(plb);
    return pla;
    }
  else if (!plb->first)         /* B is the null set                           */

    {
    if (!(save&1)) delete_polylist(pla);
    if (save&2) plb=new_polylist1(_,plb);
    return plb;
    }
  if (save&1) pla=new_polylist1(_,pla);
  if (save&2) plb=new_polylist1(_,plb);
  pla=boolean_polylists(pla,plb,2,0);
  if (ui->timing) timing->intersect_polylists+=difftime(time(_),time0);
  return pla;
  }

/*******************************************************************************

difference_polylists:  Returns the difference of two polygon lists "pla" and
"plb".  The original polygon lists are destroyed unless the 1st and 2nd bits of

save are set.
*******************************************************************************/

POLYLIST *difference_polylists (pla, plb, save)
POLYLIST *pla;                /* 1st boundary                                  */

POLYLIST *plb;                /* 2nd boundary                                  */

FLAGS save;                   /* 1) save old "pla" 2) save old "plb"           */

  {
  TIME_T time0;                 /* start time for function
*/
  if (ui->timing) time0=time(_);
  if (!pla->first)            /* A is the null set                             */
```

```
    {
    if (save&1) pla=new_polylist1(_,pla);
    if (!(save&2)) delete_polylist(plb);
    return pla;
    }
  else if (!plb->first)       /* B is the null set                                   */

    {
    if (save&1) pla=new_polylist1(_,pla);
    if (!(save&2)) delete_polylist(plb);
    return pla;
    }
  if (save&1) pla=new_polylist1(_,pla);
  if (save&2) plb=new_polylist1(_,plb);
  pla=boolean_polylists(pla,plb,2,1);
  if (ui->timing) timing->difference_polylists+=difftime(time(_),time0);
  return pla;
  }

/*****************************************************************************

dupmark_polylist:  Marks duplicate vertices in a list of polygons "pl".
*****************************************************************************/

POLYLIST *dupmark_polylist (pl)
POLYLIST *pl;                 /* list of polygons                                  */

  {
  POLYLINE *pa;               /* polygon of "pl"                                   */

  POLYLINE *pb;               /* polygon of "pl"                                   */

  VERTEX *va0;                /* initial vertex of "pa"                            */

  VERTEX *vb0;                /* initial vertex of "pb"                            */

  VERTEX *va;                 /* vertex of "pa"                                    */

  VERTEX *vb;                 /* vertex of "pb"                                    */

  if (!pl->first) return pl;
  for (pa=pl->first; pa; pa=pa->next)
    {
    va0=pa->first;
    for (pb=pa; pb; pb=pb->next)
      {
      if (pa->max.x<pb->min.x) continue;
      if (pa->max.y<pb->min.y) continue;
      if (pb->max.x<pa->min.x) continue;
      if (pb->max.y<pa->min.y) continue;
      vb0=pb->first;
      va=va0;
```

```
      do  /* va */
        {
        if (va->mark&DUPLICATE_FLAG) continue;
        if (pa==pb) {vb=va->next; if (vb==vb0) break;}
        else vb=vb0;
        do
          {
          if (!eq2(va->pt,vb->pt)) continue;
          va->mark|=DUPLICATE_FLAG;
          vb->mark|=DUPLICATE_FLAG;
          }
        while ((vb=vb->next)!=vb0);
        }
      while ((va=va->next)!=va0);
      }  /* pb */
    }  /* pa */
  return pl;
  }

/*******************************************************************************

layer_compensate:  Line width compensates a polygon list "plu" an amount "r"
using algorithm "alg" and maximum adjustment "maxadj".  The input list is
destroyed.  The compensated polygon list is returned.
*******************************************************************************/

POLYLIST *layer_compensate (plu, r, alg, maxadj)
POLYLIST *plu;              /* uncompensated polygon list               */

DOUBLE r;                   /* beam compensation amount                 */

INT alg;                    /* algorithm                                */

DOUBLE maxadj;              /* maximum offset adjustment                */

  {
  POLYLIST *plc;            /* compensated polygon list                */

  BOOLEAN crossover;        /* border segments cross during compensation?  */

  TIME_T time0;               /* start time for function
*/
  if (ui->timing) time0=time(_);
  if (alg==1)
    {
    plu=dupmark_polylist(plu);
    plc=adjust0_polylist(plu,r,maxadj,FALSE);
    plc=adjust1_polylist(plc);
    plc=adjust2_polylist(plc);
    plc=adjust3_polylist(plc);
    plc=compact_polylist(plc);
    plc=smooth_polylist(plc,ui->eps.xy);
```

```
    delete_polylist(plu);
    }
  else if (alg==2)
    {
    plc=adjust0_polylist(plu,r,maxadj,FALSE);
    plc=reorient_polylist (plc,&crossover);
    plc=intersect_polylists(plc,plu,0);
    }
  else if (alg==3)
    {
    plc=adjust0_polylist(plu,r,maxadj,FALSE);
    plc=boolean_polylists(plc,_,1,0);
    plc=intersect_polylists(plc,plu,0);
    }
  else errexit("ERROR #5050:  Layer compensation algorithm #%d is inoperative"

    ,alg);
  if (ui->timing) timing->layer_compensate+=difftime(time(_),time0);
  return plc;
  }

/******************************************************************************

fill_retract:  Retracts a polygon list "plu" an amount "r" using
algorithm "alg" and maximum adjustment "maxadj".  The input list is destroyed.

The retracted polygon list is returned.
******************************************************************************/

POLYLIST *fill_retract (plu, r, alg, maxadj)
POLYLIST *plu;                /* polygon list                              */

DOUBLE r;                     /* beam compensation                         */

INT alg;                      /* algorithm                                 */

DOUBLE maxadj;                /* maximum offset adjustment                 */

  {
  POLYLIST *plc;              /* compensated polygon list          */
  TIME_T time0;                 /* start time for function          */
  if (ui->timing) time0=time(_);
  if (alg!=1)
    errexit("ERROR #5051:  Fill compensation algorithm #%d is inoperative"
    ,alg);
  plc=adjust0_polylist(plu,r,maxadj,TRUE);
/*plc=merge_polylists(plc,plu);*/
  plc=intersect_polylists(plc,plu,0);
  if (ui->timing) timing->fill_retract+=difftime(time(_),time0);
  return plc;
  }
```

```
/*****************************************************************************
adjust0_polylist:  Establishes the initial displacement vector for beam
compensation along the angular bisector of each vertex of the uncompensated
polygons of polygon list "pl" at distance "rb" (but limited if "maxadj" is
TRUE).  Returns the compensated polygon "pc".  Returns the list of compensated

polygons.
*****************************************************************************/

POLYLIST *adjust0_polylist (plu, r, maxadj, clip)
POLYLIST *plu;                 /* uncompensated polygon list                */

DOUBLE r;                      /* beam radius                                */

DOUBLE maxadj;                 /* max adjustment is sqrt(2.)*rb?             */

BOOLEAN clip;                  /* clip corners greater than 180 deg?         */

  {
  POLYLIST *plc;               /* compensated polygon list                  */

  POLYLINE *pc;                /* compensated polygon                       */

  POLYLINE *pu;                /* uncompensated polygon                     */

  plc=new_polylist(_,plu->layerno,plu->min.z,plu->max.z);
  for (pu=plu->first; pu; pu=pu->next)
    {
    pc=adjust0_polygon(pu,r,maxadj,clip);
    append_polyline(plc,pc);
    }
  return plc;
  }

/*****************************************************************************

adjust1_polylist:  If the double of any displacement vector in the polygon list

"pl" crosses an uncompensated segment, the displacement vector is shrunk to
half the distance to the crossing point.  Returns the compensated polygon list.

*****************************************************************************/

POLYLIST *adjust1_polylist (pl)
POLYLIST *pl;                  /* compensated polygon list                  */

  {
  POLYLINE *p0;                /* initial polygon of "pl"                   */

  POLYLINE *pa;                /* polygon of "pl"                           */
```

```
  POLYLINE *pb;                /* polygon of "pl"                                  */

  p0=pl->first;
  for (pa=p0; pa; pa=pa->next) adjust1_polygons(pa,pa);
  for (pa=p0; pa; pa=pa->next)
    for (pb=p0; pb; pb=pb->next)
      {
      if (pa==pb) continue;
      if (pa->max.x<=pb->min.x) continue;
      if (pa->max.y<=pb->min.y) continue;
      if (pb->max.x<=pa->min.x) continue;
      if (pb->max.y<=pa->min.y) continue;
      adjust1_polygons(pa,pb);
      }
  return pl;
  }
/*****************************************************************************

adjust2_polylist:  If two displacement vectors of the compensated polygon list,

both displacement vectors are shrunk to their intersection point.  Returns the

compensated list of polygons.
*****************************************************************************/

POLYLIST *adjust2_polylist (pl)
POLYLIST *pl;                  /* compensated polygon list                          */

  {
  POLYLINE *p0;                /* first polygon of "plc"                            */

  POLYLINE *pa;                /* polygon of "plc"                                  */

  POLYLINE *pb;                /* polygon of "plc"                                  */

  p0=pl->first;
  for (pa=p0; pa; pa=pa->next) adjust2_polygons(pa,pa);
  for (pa=p0; pa; pa=pa->next)
    for (pb=p0; pb; pb=pb->next)
      {
      if (pa==pb) continue;
      if (pa->max.x<=pb->min.x) continue;
      if (pa->max.y<=pb->min.y) continue;
      if (pb->max.x<=pa->min.x) continue;
      if (pb->max.y<=pa->min.y) continue;
      adjust2_polygons(pa,pb);
      }
  return pl;
  }
```

```
/*******************************************************************************

adjust3_polylist:  If a displacement vector of the compensated polygon list
crosses an compensated segment, the two displacment vectors
which give rise to this segment are shrunk so that the segment passes through
the head of the intrusive displacement vector and the compensated segment is as

parallel as possible to its uncompensated counterpart.  Returns the
compensated list of polygons.
*******************************************************************************/

POLYLIST *adjust3_polylist (pl)
POLYLIST *pl;                  /* compensated polygon list                  */

  {
  POLYLINE *p0;               /* first polygon of "plc"                    */

  POLYLINE *pa;               /* polygon of "plc"                          */

  POLYLINE *pb;               /* polygon of "plc"                          */

  p0=pl->first;
  for (pa=p0; pa; pa=pa->next) adjust3_polygons(pa,pa);
  for (pa=p0; pa; pa=pa->next)
    for (pb=p0; pb; pb=pb->next)
      {
      if (pa==pb) continue;
      if (pa->max.x<=pb->min.x) continue;
      if (pa->max.y<=pb->min.y) continue;
      if (pb->max.x<=pa->min.x) continue;
      if (pb->max.y<=pa->min.y) continue;
      adjust3_polygons(pa,pb);
      }
  return pl;
  }

/*******************************************************************************

merge_polylists:  Merges two polyline lists "pla" and "plb" into one
polyline list and destroys the original lists.
*******************************************************************************/

POLYLIST *merge_polylists (pla, plb)
POLYLIST *pla;                 /* 1st polyline list                          */

POLYLIST *plb;                 /* 2nd polyline list                          */

  {
  if (pla->min.x>plb->min.x) pla->min.x=plb->min.x;
  if (pla->min.y>plb->min.y) pla->min.y=plb->min.y;
  if (pla->max.x<plb->max.x) pla->max.x=plb->max.x;
  if (pla->max.y<plb->max.y) pla->max.y=plb->max.y;
```

```
pla->last->next=plb->first;
plb->first->prev=pla->last;
pla->last=plb->last;
plb->first=NULL;
plb->last=NULL;
delete_polylist(plb);
return pla;
}
```

```
/*****************************************************************************
S6.C:  HATCHSEGMENT, HATCHLINE, HATCHLINELIST.
*****************************************************************************/

#include "s.h"

/*****************************************************************************
HATCHSEGMENT:  hatch segment
*****************************************************************************/

/*****************************************************************************
new_hatchsegment:  Allocates and initializes a new hatch segment "s" with the
tail and head values "tail" and "head".
*****************************************************************************/

HATCHSEGMENT *new_hatchsegment (s, tail, head)
HATCHSEGMENT *s;              /* new segment                                 */

DOUBLE tail;                  /* tail of segment                             */

DOUBLE head;                  /* head of segment                             */

  {
  if (!s) s=allocate(HATCHSEGMENT);
  if (!s) errexit("ERROR #6000:  Memory exhausted");
  s->tail=tail;
  s->head=head;
  s->prev=NULL;
  s->next=NULL;
  s->parent=NULL;
  return s;
  }

/*****************************************************************************
delete_hatchsegment:  Deallocates the hatch segment "s" and returns NULL.
*****************************************************************************/

HATCHSEGMENT *delete_hatchsegment (s)
HATCHSEGMENT *s;              /* hatch segment                               */

  {
  HATCHLINE *hl;              /* line of hatch segments                      */

  if (!s) return NULL;
  if (hl=s->parent)
    {
```

```
    if (s->prev) s->prev->next=s->next;
    else hl->first=s->next;
    if (s->next) s->next->prev=s->prev;
    else hl->last=s->prev;
    }
  deallocate(s);
  return NULL;
  }

/*****************************************************************************

dump_hatchsegment:  Dumps the hatch segment "s" and returns NULL.
*****************************************************************************/

VOID dump_hatchsegment (s)
HATCHSEGMENT *s;              /* hatch segment                              */

  {
  dump("HATCHSEGMENT %08lx: ",s);
  if (!s) {dump("\n"); return;}
  dump("%9.9lg %9.9lg %lx\n",s->tail,s->head,s->parent);
  if (s->parent && (s->prev && s!=s->prev->next || s->next &&
    s!=s->next->prev))
    errexit("ERROR #6001:  Corrupted list:  prev=%08lx next=%08lx"
    ,s->prev,s->next);
  return;
  }

/*****************************************************************************

append_hatchsegment:  Appends a hatch segment "s" to the hatch line
"hl".
*****************************************************************************/

HATCHLINE *append_hatchsegment (hl, s)
HATCHLINE *hl;                /* hatch line                                 */

HATCHSEGMENT *s;              /* hatch segment                              */

  {
  if (!s) return hl;
  if (!hl->first)
    {
    hl->first=s;
    hl->last=s;
    s->prev=NULL;
    }
  else
    {
    s->prev=hl->last;
    hl->last->next=s;
    hl->last=s;
```

```
    }
  s->next=NULL;
  s->parent=hl;
  return hl;
  }

/*****************************************************************************

HATCHLINE:  hatch line (list of hatch segments).
*****************************************************************************/


/*****************************************************************************

new_hatchline:  Generates the hatch segments corresponding to a given "y" level

from a set of boundary segments "sl" at a given boolean level "op" (1: union,
2: intersection).  The hatch segments are linked together into a hatchline
"hl" which is returned.
*****************************************************************************/

HATCHLINE *new_hatchline (hl, y, sl, op)
HATCHLINE *hl;               /* hatch line                                  */

DOUBLE y;                    /* y value                                     */

SEGLIST *sl;                 /* segment list                                */

INT op;                      /* operation: 1)union 2)intersection           */

  {
  INT dqv=0;                 /* half quantitative volume                    */

  DOUBLE tail;               /* tail of segment                             */

  DOUBLE head;               /* head of segment                             */

  INT mindqv;                /* minimum count for hatching                  */

  SEGMENT *s;                /* segment in "sl"                             */

  SEGMENT *sy;               /* segment with new min y                      */

  if (!hl) hl=allocate(HATCHLINE);
  if (!hl) errexit("ERROR #6002:  Memory exhausted");
  hl->first=NULL;
  hl->last=NULL;
  hl->y=y;
  hl->prev=NULL;
  hl->next=NULL;
  hl->parent=NULL;
  mindqv=2*op;
```

```
sl=resort_seglist2(sl,y,&sy);
for (s=sl->first; s!=sy; s=s->next)
  {
  do
    {
    if (s->pt[1].y==s->pt[0].y || s->pt[1].y==s->pt[2].y) dqv-=s->orient;
    else dqv-=2*s->orient;
    }
  while (dqv<mindqv && (s=s->next)!=sy);
  if (dqv<mindqv) break;
  tail=s->pt[1].x;
  if ((s=s->next)==sy) break;
  do
    {
    if (s->pt[1].y==s->pt[0].y || s->pt[1].y==s->pt[2].y) dqv-=s->orient;
    else dqv-=2*s->orient;
    }
  while (dqv>=mindqv && (s=s->next)!=sy);
  if (dqv>=mindqv) break;
  head=s->pt[1].x;
  if (head-tail<=ui->eps.xy) continue;
  append_hatchsegment(hl,new_hatchsegment(_,tail,head));
  } /* o */
return hl;
}

/*****************************************************************************

delete_hatchline:  Deallocates a hatchline "hl" and returns NULL.
*****************************************************************************/

HATCHLINE *delete_hatchline (hl)
HATCHLINE *hl;                /* hatch line                                  */

{
HATCHLINELIST *hll;           /* list of hatch lines                         */

if (!hl) return NULL;
if (hll=hl->parent)
  {
  if (hl->prev) hl->prev->next=hl->next;
  else hll->first=hl->next;
  if (hl->next) hl->next->prev=hl->prev;
  else hll->last=hl->prev;
  }
deallocate(hl);
return NULL;
}

/*****************************************************************************

dump_hatchline:  Dumps the hatch line "hl".
```

```
*****************************************************************************/

VOID dump_hatchline (hl)
HATCHLINE *hl;              /* hatch line                                    */

  {
  HATCHSEGMENT *s;          /* hatch segment                                 */

  INT index=0;              /* hatch point index                             */

  dump("HATCHLINE %08lx:\n",hl);
  if (!hl) return;
  dump("y=%lg parent=%lx\n",hl->y,hl->parent);
  if (hl->parent && (hl->prev && hl!=hl->prev->next || hl->next &&
    hl!=hl->next->prev))
    errexit("ERROR #6003:  Corrupted list:  prev=%08lx next=%08lx"
    ,hl->prev,hl->next);
  for (s=hl->first; s; s=s->next)
    {
    dump("#%d ",index++);
    dump_hatchsegment(s);
    } /* s */
  if (!hl->parent) return;
  if (hl->prev && hl!=hl->prev->next || hl->next &&
    hl!=hl->next->prev)
    errexit("ERROR #6004:  Corrupted list:  prev=%08lx next=%08lx"
    ,hl->prev,hl->next);
  return;
  }

/*****************************************************************************

write_hatchline:  Writes out the hatch line "hl" in *.sli segment format to
stream "stream" with a given rotation characterized by the unit hatch vector
"rot" and scaling "scale" and endpoint reversed if "reverse" is TRUE.  Deletes

the hatch segments which are written out.
*****************************************************************************/

HATCHLINE *write_hatchline (stream, hl, rot, reverse)
STREAM *stream;             /* output stream                                 */

HATCHLINE *hl;              /* hatch line                                    */

DOUBLE2 rot;                /* unit hatch vector                             */

BOOLEAN reverse;            /* write hatchline head first?                   */

  {
  HATCHSEGMENT *s;          /* hatch segment                                 */
```

```
 USHORT2 tail;               /* tail of segment                          */
 USHORT2 head;               /* head of segment                          */
 USHORT2 swap;               /* swap location                            */
 LONG value;                 /* round off value                          */
 if (!hl->first) return hl;
 if (s=hl->first)
   {
   value=(LONG)(s->tail*rot.x-hl->y*rot.y+.5);
   if (value<0L) tail.x=0;
   else tail.x=(USHORT)value;
   value=(LONG)(s->tail*rot.y+hl->y*rot.x+.5);
   if (value<0L) tail.y=0;
   else tail.y=(USHORT)value;
   value=(LONG)(s->head*rot.x-hl->y*rot.y+.5);
   if (value<0L) head.x=0;
   else head.x=(USHORT)value;
   value=(LONG)(s->head*rot.y+hl->y*rot.x+.5);
   if (value<0L) head.y=0;
   else head.y=(USHORT)value;
   if (reverse) {swap=tail; tail=head; head=swap;}
   if (stream->format==ASCII)
     fprintf(stream->file," %d %d %d %d\n",tail.x,tail.y,head.x,head.y);
   else
     {
fwrite_(&tail,sizeof(USHORT),2,stream->file,stream->byteorder!=ui->byteorder);
fwrite_(&head,sizeof(USHORT),2,stream->file,stream->byteorder!=ui->byteorder);
     }
   delete_hatchsegment(s);
   }
  return hl;
  }

/*******************************************************************************
size_hatchline:  Returns the number of segments in the hatchline "hl".
*******************************************************************************/

INT size_hatchline (hl)
HATCHLINE *hl;               /* hatch line                               */
  {
  HATCHSEGMENT *s;           /* hatch segment                            */
  INT n=0;
```

```
  for (s=hl->first; s; s=s->next) n++;
  return n;
  }

/******************************************************************************

append_hatchline:  Appends hatchline "hl" to the hatchline list "hll" and
returns "hll".
******************************************************************************/

HATCHLINELIST *append_hatchline (hll, hl)
HATCHLINELIST *hll;            /* hatch line list                              */

HATCHLINE *hl;                 /* hatch line                                   */

  {
  if (!hl) return hll;
  if (!hll->first)
    {
    hll->first=hl;
    hll->last=hl;
    hl->prev=NULL;
    }
  else
    {
    hl->prev=hll->last;
    hll->last->next=hl;
    hll->last=hl;
    }
  hl->next=NULL;
  hl->parent=hll;
  return hll;
  }

/******************************************************************************

HATCHLINELIST:  list of hatch lines.
******************************************************************************/

/******************************************************************************

new_hatchlinelist:  Allocates and initializes the hatchline list "hll"
with a rotation "rot", line spacing "spacing", and hatch line pattern
offset "offset".  Returns "hll".
******************************************************************************/

HATCHLINELIST *new_hatchlinelist (hll, rot, spacing, offset)
HATCHLINELIST *hll;            /* hatch line list                              */
```

```
DOUBLE2 rot;                /* unit hatch vector                          */
DOUBLE spacing;             /* y spacing of hatch lines                   */
DOUBLE offset;              /* hatch line offset
*/
  {
  if (!hll) hll=allocate(HATCHLINELIST);
  if (!hll) errexit("ERROR #6005:  Memory exhausted");
  hll->rot.x=rot.x;
  hll->rot.y=rot.y;
  hll->spacing=spacing;
  hll->offset=offset;
  hll->first=NULL;
  hll->last=NULL;
  return hll;
  }

/*******************************************************************************

delete_hatchlinelist:  Deallocates the hatch line list "hll" and returns NULL.

*******************************************************************************/

HATCHLINELIST *delete_hatchlinelist (hll)
HATCHLINELIST *hll;         /* hatch line list                            */

  {
  HATCHLINE *hl;            /* hatch line to delete                       */

  if (!hll) return NULL;
  for (hl=hll->first; hl; hl=hl->next)
    {
    hl->parent=NULL;
    delete_hatchline(hl);
    }
  deallocate(hll);
  return NULL;
  }

/*******************************************************************************

dump_hatchlinelist:  Dumps the hatchline list "hll".
*******************************************************************************/

VOID dump_hatchlinelist (hll)
HATCHLINELIST *hll;         /* hatch line list                            */

  {
  HATCHLINE *hl;            /* hatch line in list                         */
```

```
  INT index=0;                /* index of hatch line                             */

  dump("HATCHLINELIST %08lx:\n",hll);
  if (!hll) return;
  dump("rot=(%lg,%lg) spacing=%lg offset=%lg\n"
  ,hll->rot,hll->spacing,hll->offset);
  if (hll->first && !hll->last || hll->last && !hll->first)
    errexit("ERROR #6006:  Corrupted list:  first=%lx last=%lx\n"
    ,hll->first,hll->last);
  if (!hll->first) return;
  if (hll->first->prev || hll->last->next)
    errexit("ERROR #6007:  Corrupted list:  first->prev=%lx first=%lx last=%lx
last->next=%lx\n",
      hll->first->prev,hll->first,hll->last,hll->last->next);
  dump("first=%lx last=%lx\n",hll->first,hll->last);
  for (hl=hll->first; hl; hl=hl->next)
    {
    dump("#%d ",index++);
    dump_hatchline(hl);
    if (!hl->parent) errexit("ERROR #6008:  Missing parent:  hl=%lx\n",hl);
    if (hl->prev && hl!=hl->prev->next || hl->next &&
      hl!=hl->next->prev)
      errexit("ERROR #6009:  Corrupted list:  prev=%08lx next=%08lx"
      ,hl->prev,hl->next);
    if (!hl->next && hl!=hll->last)
      errexit("ERROR #6010:  Corrupted list:  hl=%lx last=%lx\n",hl,hll->last);

    }  /* hl */
  return;
  }

/*****************************************************************************

hatch_polylist:  Generates a list of hatchlines given a list of
polylines "pl", some hatching information "hi", and a binary boolean operation

"op" (1:union; 2:intersection).  Returns the list of hatchlines.
*****************************************************************************/

HATCHLINELIST *hatch_polylist (pl, hi, op)
POLYLIST *pl;                 /* polyline list                                   */

HATCHINFO *hi;                /* hatching information                            */

INT op;                       /* operation: 1)union 2)intersection               */

  {
  HATCHLINELIST *hll;         /* list of hatch lines                             */

  SEGLIST *sl;                /* list of polygonal segments                      */
```

```
  DOUBLE offset;              /* initial offset
*/
  TIME_T time0;               /* start time for function                  */

  if (ui->timing) time0=time(_);
  offset=fmod(hi->offset+(pl->layerno-1)*hi->shift,hi->spacing);
  if (!pl->first) return new_hatchlinelist(_,hi->vector,hi->spacing,offset);
  sl=new_seglist2(_,pl,hi->vector,1);
  sl=sort_seglist(sl);
  deflat_seglist(sl);
  hll=hatch_seglist(sl,op,hi->vector,hi->spacing,offset);
  if (ui->timing) timing->hatch_polylist+=difftime(time(_),time0);
  return hll;
  }

/****************************************************************************

write_hatchlinelist:  Writes out the hatchline list "hll" as segments in *.sli

segment format to the file "stream" with a given block type "type".  Returns
"hll".
****************************************************************************/

HATCHLINELIST *write_hatchlinelist (stream, hll, type)
STREAM *stream;               /* output stream                            */

HATCHLINELIST *hll;           /* hatch line list                          */

UCHAR type;                   /* block type                               */

  {
  HATCHLINE *hl;              /* hatch line                               */

  BOOLEAN reverse=FALSE;      /* reverse segment endpoints?               */

  USHORT n;                   /* no. of coordinates in hatch line list    */

  DOUBLE2 rotscale;           /* rotation and scaling factor              */

  rotscale.x=hll->rot.x/ui->resratio;
  rotscale.y=hll->rot.y/ui->resratio;
  if (!hll->first) return hll;
  if (stream->format==ASCII) fprintf(stream->file,"%s\n",block_type[type]);
  else
    {
fwrite_(&type,sizeof(UCHAR),1,stream->file,stream->byteorder!=ui->byteorder);
    n=4*size_hatchlinelist(hll);
    fwrite_(&n,sizeof(USHORT),1,stream->file,stream->byteorder!=ui->byteorder);

    }
  while (hll->first)
```

```
    {
    for (hl=hll->first; hl; hl=hl->next)
      {
      write_hatchline(stream,hl,rotscale,reverse);
      reverse=!reverse;
      if (!hl->first) delete_hatchline(hl);
      }  /* hl */
    for (hl=hll->last; hl; hl=hl->prev)
      {
      write_hatchline(stream,hl,rotscale,reverse);
      reverse=!reverse;
      if (!hl->first) delete_hatchline(hl);
      }  /* hl */
    }  /* hll */
  return hll;
  }

/*****************************************************************************

size_hatchlinelist:  Returns the number of segments in a hatch line
list "hll".
*****************************************************************************/

INT size_hatchlinelist (hll)
HATCHLINELIST *hll;            /* hatch line list                            */

  {
  INT n=0;
  HATCHLINE *hl;
  for (hl=hll->first; hl; hl=hl->next) n+=size_hatchline(hl);
  return n;
  }

/*****************************************************************************

hatch_seglist:  Hatches the boundary segment list "sl" with the operation "op"

(1:union, 2:intersection).  The hatch direction is "rot", the hatch spacing is

"spacing", and the offset of the hatch pattern is "offset".  "sl" is decimated

in the process.  The generated hatchline list is returned.
*****************************************************************************/

HATCHLINELIST *hatch_seglist (sl, op, rot, spacing, offset)
SEGLIST *sl;                   /* segment list                               */

INT op;                        /* operation: 1)union 2)intersection          */

DOUBLE2 rot;                   /* unit hatch vector                          */
```

```
DOUBLE spacing;              /* y spacing of hatch lines                    */
DOUBLE offset;               /* hatch line offset
*/
  {
  HATCHLINELIST *hll;        /* hatch line list                             */
  HATCHLINE *hl;             /* hatch line list                             */
  DOUBLE y;                  /* hatch y level                               */
  DOUBLE ymin;               /* minimum y                                   */
  hll=new_hatchlinelist(_,rot,spacing,offset);
  if (!sl->first)
    {
    delete_seglist(sl);
    return hll;
    }
  if (rot.x<rot.y || rot.x==rot.y && rot.x<0.) offset=-offset;
  ymin=offset+(floor((sl->first->pt[1].y-offset)/hll->spacing)+1.)
  *hll->spacing;
  for (y=ymin; ; y+=hll->spacing)
    {
    if (!sl->first) break;
    hl=new_hatchline(_,y,sl,op);
    if (hl->first) append_hatchline(hll,hl);
    else delete_hatchline(hl);
    }
  delete_seglist(sl);
  return hll;
  }
```

```
/*******************************************************************************
S.H:  Header definitions for schleiss.c.
*******************************************************************************/

#ifdef MSC                      /* Microsoft C                                */

#define DOS
#define MSC_OR_TURBOC
#endif

#ifdef TURBOC                   /* Borland Turbo C                            */

#define DOS
#define MSC_OR_TURBOC
#endif

#ifdef METAWARE                 /* Metaware High C                            */

#define DOS
#define METAWARE_OR_UNIX
#define METAWARE_OR_INTERACTIVE
#endif

#ifdef INTERACTIVE              /* Interactive UNIX                           */

#define UNIX
#define METAWARE_OR_UNIX
#define METAWARE_OR_INTERACTIVE
#endif

#ifdef IRIS                     /* Silicon Graphics Iris                      */

#define UNIX
#define METAWARE_OR_UNIX
#endif

#include <ctype.h>
#include <math.h>
#include <stdio.h>
#include <string.h>
#ifdef DOS
#include <stdlib.h>
#include <stdarg.h>
#include <time.h>
#else  /* ifdef UNIX */
#include <malloc.h>
#include <varargs.h>
#endif

#ifdef METAWARE_OR_INTERACTIVE
```

```
#define signed
#endif

#ifdef IRIS
#define FLAGS unsigned long   /* bit flags                                              */

#define BOOLEAN unsigned long /* 0, 1                                                   */

#define SIGN signed long      /* -1, 0, 1                                               */

#define USIGN unsigned long   /* 0, 1, 2                                                */

#define INT signed long
#define UINT unsigned long
#define PTR char *
#else  /* ifdef DOS OR INTERACTIVE */
#define FLAGS unsigned int    /* bit flags                                              */

#define BOOLEAN signed int    /* 0, 1                                                   */

#define SIGN signed int       /* -1, 0, 1                                               */

#define USIGN unsigned int    /* 0, 1, 2                                                */

#define INT signed int
#define UINT unsigned int
#define PTR void *
#endif

#ifdef DOS
#define TIME_T time_t
#else
#define TIME_T signed long
#endif

#define CHAR signed char
#define UCHAR unsigned char
#define SHORT signed short
#define USHORT unsigned short
#define LONG signed long
#define ULONG unsigned long
#define FLOAT float
#define DOUBLE double
#define VOID void
#define STRING char *
#define FALSE 0
#define TRUE 1
#define _ NULL
#define ASCII 1
#define BINARY 2
#define TRIANGLES 0
#define SEGMENTS 1
```

```
#define POLYLINES 2
#define UNION 1
#define INTERSECTION 2
#define UNDEF_INT -1
#define UNDEF_BOOL -1
#define UNDEF_DBL -1.
#define MAX_INT 0x3fff
#define MAX_LONG 0x3fffffffL
#define MAX_USHORT (USHORT)0xffff
#define MAX_DBL 1.e100
#define CTRLZ '\032'
#define RADIANS_PER_DEGREE .01745329252
#define DELETE_FLAG 1          /* delete segment?                              */

#define KEEP_FLAG 2            /* keep segment?                                */

#define SPLIT_FLAG 4           /* see if segment can be split?                 */

#define DUPLICATE_FLAG 8       /* vertex is repeated?                          */

#define VERSION "47"
#define NONNULL ((DOUBLE*)!NULL)
#define X 0
#define Y 1
#define Z 2

#define USHORT2 struct uSHORT
#define FLOAT3 struct fLOAT3
#define DOUBLE2 struct dOUBLE2
#define DOUBLE2_ struct dOUBLE2_
#define DOUBLE3 struct dOUBLE3

#define CURE struct cURE
#define CURELIST struct cURELIST
#define HATCHINFO struct hATCHINFO
#define HATCHINFOLIST struct hATCHINFOLIST
#define HATCHLINE struct hATCHLINE
#define HATCHLINELIST struct hATCHLIST
#define HATCHPOINT struct hATCHPOINT
#define HATCHPOINTLIST struct hATCHPOINTLIST
#define HATCHSEGMENT struct hATCHSEGMENT
#define LONG2 struct lONG2
#define MEMORY struct mEMORY
#define PARAMETER struct pARAMETER
#define PARAMETERLIST struct pARAMETERLIST
#define PART struct pART
#define POLYLINE struct pOLYLINE
#define POLYLIST struct pOLYLIST
#define RANGE struct rANGE
#define RANGELIST struct rANGELIST
#define SEGMENT struct sEGMENT
#define SEGLIST struct sEGLIST
```

```
#define STREAM struct sTREAM
#define TILEINFO struct tILEINFO
#define TIMING struct tIMING
#define TRANSFORMATION struct tRANSFORMATION
#define TRIANGLE struct tRIANGLE
#define USERINFO struct uSERINFO
#define VERTEX struct vERTEX

#define L    (UCHAR)0      /* layer number ("L")      */

#define LB   (UCHAR)1      /* layer border ("LB")     */

#define LH   (UCHAR)2      /* layer hatch ("LH")      */

#define LF   (UCHAR)5      /* layer fill ("NFUF")     */

#define UB   (UCHAR)12     /* up border ("FUB")       */

#define UH   (UCHAR)4      /* up hatch ("NFUH")       */

#define UF   (UCHAR)14     /* up fill ("FUF")         */

#define DB   (UCHAR)9      /* down border ("FDB")     */

#define DH   (UCHAR)7      /* down hatch ("NFDH")     */

#define DF   (UCHAR)11     /* down fill ("FDF")       */

USHORT2 {USHORT x; USHORT y;};
FLOAT3 {FLOAT x; FLOAT y; FLOAT z;};
DOUBLE2 {DOUBLE x; DOUBLE y;};
DOUBLE2_ {DOUBLE xy; DOUBLE z;};
DOUBLE3 {DOUBLE x; DOUBLE y; DOUBLE z;};

/*****************************************************************************

S0.C:  MAIN, MISCELLANEOUS, MEMORY, TIMING, STRING.
*****************************************************************************/

#ifdef DOS
VOID main (INT argc, CHAR **argv);
#else
VOID main ();
#endif

/*****************************************************************************

MISCELLANEOUS:  Command line, help screen.
```

```
*****************************************************************************/

#define nan(a) (((*(LONG*)a)&0x7f800000L)==0x7f800000L) /*nonnumber*/
#ifdef DOS
VOID help_screen (CHAR *version);
#else
VOID help_screen ();
#endif

/*****************************************************************************

MEMORY:  Memory manager.
*****************************************************************************/

MEMORY
  {
  LONG total;            /* number of bytes currently allocated            */

  INT maxbytes;          /* size of largest allocation so far              */

  INT *count;            /* allocations per block size                     */

  LONG maxtotal;         /* max number of bytes simultaneously allocated   */

  LONG supermaxtotal;    /* number of bytes ever allocated                 */

  };
#define allocate(type) (type*)allocate_memory(memory,sizeof(type))
                          /* allocate structure of "type"                  */

#define allocate_string(n) (CHAR*)allocate_memory(memory,n+1)
                          /* allocate a string of length "n"               */

#define deallocate(p) free_memory(memory,(CHAR*)p,sizeof(*p))
                          /* free structure at "p"                         */

#define deallocate_string(s) free_memory(memory,s,strlen(s)+1)
                          /* free string "s"                               */

#define DUMP_MEMORY dump_memory
#ifdef DOS
MEMORY *new_memory (MEMORY *m, INT nbins);
MEMORY *delete_memory (MEMORY *m);
CHAR *allocate_memory (MEMORY *m, INT nbytes);
VOID free_memory (MEMORY *m, CHAR *p, INT nbytes);
VOID dump_memory (MEMORY *m);
BOOLEAN memory_allocated (MEMORY *m);
#else
MEMORY *new_memory ();
MEMORY *delete_memory ();
CHAR *allocate_memory ();
VOID free_memory ();
```

```
VOID dump_memory ();
BOOLEAN memory_allocated ();
#endif

/*****************************************************************************

TIMING:  Timing for major routines.
*****************************************************************************/

TIMING
  {
  TIME_T start;                    /* start time of program                       */

  TIME_T stop;                     /* stop time of program                        */

  DOUBLE main;                     /* duration of main routine                    */

  DOUBLE get_userinfo;             /* duration of get_userinfo routine            */

  DOUBLE get_part;                 /* duration of get_part routine                */

  DOUBLE slice_part;               /* duration of slice_part routine              */

  DOUBLE boolean_seglist;          /* duration of boolean_seglist routine         */

  DOUBLE reorient_seglist;         /* duration of reorient_seglist routine        */

  DOUBLE split_seglist;            /* duration of split_seglist routine           */

  DOUBLE new_polylist2;            /* duration of new_polylist2 routine           */

  DOUBLE degap_polylist;           /* duration of degap_polylist routine          */

  DOUBLE boolean_polylists;        /* duration of boolean_polylists routine       */

  DOUBLE reorient_polylist;        /* duration of reorient_polylist routine       */

  DOUBLE union_polylists;          /* duration of union_polylists routine         */

  DOUBLE intersect_polylists;      /* duration of intersect_polylists routine     */

  DOUBLE difference_polylists;     /* duration of difference_polylists routine    */

  DOUBLE layer_compensate;         /* duration of layer_compensate routine        */

  DOUBLE fill_retract;             /* duration of fill_retract routine            */

  DOUBLE hatch_polylist;           /* duration of hatch_polylist routine          */

  DOUBLE sort_tripart;             /* duration of sort_tripart routine            */
```

```
  DOUBLE sort_seglist;          /* duration of sort_seglist routine          */

  );
#ifdef DOS
TIMING *new_timing (TIMING *t);
TIMING *delete_timing (TIMING *t);
VOID write_timing (TIMING *t);
VOID dump_timing (TIMING *t);
#else
TIMING *new_timing ();
TIMING *delete_timing ();
VOID write_timing ();
VOID dump_timing ();
#define difftime(stop,start) (DOUBLE)(stop-start)
                              /* time duration from "start" to "stop"       */

#endif

/********************************************************************************

STRING:  String.
********************************************************************************/

#define streq(s,t) (strcmp(s,t)==0)
                              /* tests for equality of strings "s" and "t"
*/
#define btoa(n) ((n)==0?"false":(n)==1?"true":"?")
                              /* converts boolean "n" to ascii string       */

#define fgets_(buffer,nchars,file)\
  {fgets(buffer,nchars,file); *strchr(buffer,'\n')=0;}
  /* gets a NULL terminated string "buffer" of "nchars" chars from file
"file"*/

#ifdef MSC_OR_TURBOC
#define strieq(s,t) (stricmp(s,t)==0)
CHAR *get_time (CHAR *s);
CHAR *strget (CHAR *s0);
CHAR *strtail (CHAR *s, CHAR c, CHAR *tail);
#endif

#ifdef METAWARE
BOOLEAN strieq (CHAR *s, CHAR *t);
CHAR *get_time (CHAR *s);
CHAR *strget (CHAR *s0);
CHAR *strtail (CHAR *s, CHAR c, CHAR *tail);
CHAR *strlwr (CHAR *s);
CHAR *strupr (CHAR *s);
#endif

#ifdef UNIX
BOOLEAN strieq ();
```

```
CHAR *get_time ();
CHAR *strget ();
CHAR *strtail ();
CHAR *strlwr ();
CHAR *strupr ();
#endif

/******************************************************************************

S1.C:  PARAMETER, PARAMETERLIST, USERINFO, TILEINFO, HATCHINFO,
HATCHINFOLIST, RANGE, RANGELIST, CURE, CURELIST.
******************************************************************************/


/******************************************************************************

PARAMETER:  User input parameter.
******************************************************************************/

PARAMETER
  {
  CHAR *name;              /* name                                          */

  CHAR *value[10];         /* values                                        */

  PARAMETER *prev;         /* previous parameter in list                    */

  PARAMETER *next;         /* next parameter in list                        */

  PARAMETERLIST *parent;   /* parent list                                   */

  };
#define DUMP_PARAMETER dump_parameter
#ifdef DOS
PARAMETER *new_parameter (PARAMETER *p);
PARAMETER *delete_parameter (PARAMETER *p);
VOID dump_parameter (PARAMETER *p);
PARAMETER *get_parameter (CHAR **argv);
PARAMETER *read_parameter (STREAM *stream);
PARAMETER *write_parameter (STREAM *stream, PARAMETER *p);
PARAMETERLIST *append_parameter (PARAMETERLIST *pl, PARAMETER *p);
#else
PARAMETER *new_parameter ();
PARAMETER *delete_parameter ();
VOID dump_parameter ();
PARAMETER *write_parameter ();
PARAMETER *get_parameter ();
PARAMETER *read_parameter ();
PARAMETERLIST *append_parameter ();
#endif
```

```
/*****************************************************************************

PARAMETERLIST:  List of command line parameters.
*****************************************************************************/

PARAMETERLIST
  {
  PARAMETER *first;             /* first parameter in list
*/
  PARAMETER *last;              /* last parameter in list                      */

  );
#define DUMP_PARAMETERLIST dump_parameterlist
#ifdef DOS
PARAMETERLIST *new_parameterlist (PARAMETERLIST *pl);
PARAMETERLIST *delete_parameterlist (PARAMETERLIST *pl);
VOID dump_parameterlist (PARAMETERLIST *pl);
PARAMETERLIST *write_parameterlist (STREAM *stream, PARAMETERLIST *pl);
#else
PARAMETERLIST *new_parameterlist ();
PARAMETERLIST *delete_parameterlist ();
VOID dump_parameterlist ();
PARAMETERLIST *write_parameterlist ();
#endif

/*****************************************************************************

USERINFO:  Specifications for slicing.
*****************************************************************************/

USERINFO
  {
  CHAR *version;                /* program version number                      */

  ULONG password;               /* password                                    */

  BOOLEAN timing;               /* do timing of key functions?                 */

  INT data;                     /* 0)tris 1)segs 2)polylines 3) polygons       */

  BOOLEAN warn;                 /* keep going after warnings?                  */

  INT byteorder;                /* machine format 0)386 1)IRIS                 */

  BOOLEAN carriage;             /* carriage return after new line?             */

  BOOLEAN reorient;             /* reorient segments if necessary?             */

  INT debug;                    /* debugging flags                             */

  INT slcalg;                   /* slice algorithm no.                         */
```

```
INT lboalg;             /* layer border offset algorithm no.           */
INT dfoalg;             /* down fill offset algorithm no.              */
INT ufoalg;             /* up fill offset algorithm no.                */
INT axis;               /* slice axis                                  */
BOOLEAN mirror;         /* mirror image?                               */
INT nz;                 /* number of layers                            */
INT lmin;               /* initial layer number                        */
INT lmax;               /* final layer number                          */
DOUBLE3 min;            /* first slice level                           */
DOUBLE3 max;            /* last slice level                            */
POLYLIST *window;       /* bounding polylist data window               */
POLYLIST *tile;         /* bounding polylist data window               */
DOUBLE2_ maxdim;        /* maximum slice units                         */
DOUBLE2_ res;           /* horizontal resolution                       */
DOUBLE resratio;        /* finer res factor for intermediate calcs     */
DOUBLE unit;            /* CAD unit as fraction of inch                */
DOUBLE2_ eps;           /* spatial error tolerance                     */
DOUBLE overcure;        /* overcure amount                             */
BOOLEAN layeronly;      /* no up or down borders or fill?              */
BOOLEAN bordersonly;    /* no hatch or fill?                           */
INT style;              /* -2)undersize -1)lowcut 0)midcut             */
                        /*  1)highcut 2)oversize                       */
BOOLEAN raw;            /* raw cuts only?                              */
TRANSFORMATION *transformation;/* coordinate transformation            */
STREAM *input;          /* input .STL file                             */
STREAM *output;         /* output .SLI file                            */
```

```
STREAM *message;            /* message .MSG file                    */
STREAM *screen;             /* screen                               */
STREAM *parameter;          /* parameter .ARG file                  */
STREAM *internal;           /* internal .TMP triangle file          */
STREAM *material;           /* material .MAT file                   */
STREAM *security;           /* password file                        */
TILEINFO *tileinfo;         /* tiling information                   */
INT nhatch;                 /* number of different hatch types      */
HATCHINFOLIST *layerhatch;  /* specs for layer hatch                */
HATCHINFOLIST *downhatch;   /* specs for down hatch                 */
HATCHINFOLIST *uphatch;     /* specs for up hatch                   */
HATCHINFOLIST *downfill;    /* specs for down fill                  */
HATCHINFOLIST *upfill;      /* specs for up fill                    */
RANGELIST *rangelist;       /* range information                    */
CURELIST *curelist;         /* cure information                     */
PARAMETERLIST *parameterlist;/*input parameter list                 */

  );
#define DUMP_USERINFO dump_userinfo
#ifdef DOS
USERINFO *new_userinfo (USERINFO *ui);
USERINFO *delete_userinfo (USERINFO *ui);
VOID dump_userinfo (USERINFO *ui);
USERINFO *get_userinfo (CHAR **argv);
USERINFO *update_userinfo (USERINFO *ui, PART *part);
USERINFO *write_userinfo (STREAM *stream, USERINFO *ui);
BOOLEAN verify_password (ULONG password);
#else
USERINFO *new_userinfo ();
USERINFO *delete_userinfo ();
VOID dump_userinfo ();
USERINFO *get_userinfo ();
USERINFO *update_userinfo ();
USERINFO *write_userinfo ();
BOOLEAN verify_password ();
#endif
```

```
/*****************************************************************************

TILEINFO:  Specifications for tiling.
*****************************************************************************/

TILEINFO
  {
  DOUBLE size;              /* dimension of one tile                       */

  DOUBLE gap;               /* size of gap between tiles                   */

  DOUBLE offset;            /* offset of initial tile pattern              */

  DOUBLE shift;             /* shift in tile pattern for next layer        */

  DOUBLE spacing;           /* distance between tile centers               */

  };
#define DUMP_TILEINFO dump_tileinfo
#ifdef DOS
TILEINFO *new_tileinfo (TILEINFO *ti, DOUBLE size, DOUBLE gap, DOUBLE offset
, DOUBLE shift);
TILEINFO *delete_tileinfo (TILEINFO *ti);
VOID dump_tileinfo (TILEINFO *ti);
POLYLIST *tile_polylist (POLYLIST *pla, TILEINFO *ti);
#else
TILEINFO *new_tileinfo ();
TILEINFO *delete_tileinfo ();
VOID dump_tileinfo ();
POLYLIST *tile_polylist ();
#endif

/*****************************************************************************

HATCHINFO:  Specification for hatching.
*****************************************************************************/

HATCHINFO
  {
  DOUBLE angle;             /* hatch direction angle                       */

  DOUBLE2 vector;           /* unit vector in hatch direction              */

  DOUBLE spacing;           /* spacing of hatch lines                      */

  DOUBLE offset;            /* offset of hatch line pattern                */

  DOUBLE shift;             /* shift in hatch pattern for next layer       */

  HATCHINFO *prev;          /* previous hatch information block in list    */
```

```
  HATCHINFO *next;            /* next hatch information block in list       */

  HATCHINFOLIST *parent;      /* parent list                                */

  };
#define DUMP_HATCHINFO dump_hatchinfo
#ifdef DOS
HATCHINFO *new_hatchinfo (HATCHINFO *hi, DOUBLE angle
, DOUBLE spacing, DOUBLE offset, DOUBLE shift);
HATCHINFO *new_hatchinfo1 (HATCHINFO *hia, HATCHINFO *hib);
HATCHINFO *delete_hatchinfo (HATCHINFO *item);
VOID dump_hatchinfo (HATCHINFO *hi);
HATCHINFOLIST *append_hatchinfo (HATCHINFOLIST *list, HATCHINFO *hi);
#else
HATCHINFO *new_hatchinfo ();
HATCHINFO *new_hatchinfo1 ();
HATCHINFO *delete_hatchinfo ();
VOID dump_hatchinfo ();
HATCHINFOLIST *append_hatchinfo ();
#endif

/*******************************************************************************

HATCHINFOLIST:  List of hatch information blocks.
*******************************************************************************/

HATCHINFOLIST
  {
  HATCHINFO *first;             /* first hatch information block            */

  HATCHINFO *last;              /* last hatch information block             */

  };
#define DUMP_HATCHINFOLIST dump_hatchinfolist
#ifdef DOS
HATCHINFOLIST *new_hatchinfolist (HATCHINFOLIST *list);
HATCHINFOLIST *delete_hatchinfolist (HATCHINFOLIST *list);
VOID dump_hatchinfolist (HATCHINFOLIST *list);
#else
HATCHINFOLIST *new_hatchinfolist ();
HATCHINFOLIST *delete_hatchinfolist ();
VOID dump_hatchinfolist ();
#endif

/*******************************************************************************

RANGE:  Range information block.
*******************************************************************************/

RANGE
  {
```

```
  DOUBLE zmin;              /* layer commensurate minimum z value        */
  INT lmin;                 /* first layer number in range               */
  DOUBLE zs;                /* layer thickness                           */
  DOUBLE lbo;               /* layer beam width compensation             */
  DOUBLE ufo;               /* up fill beam offset                       */
  DOUBLE dfo;               /* down fill beam offset                     */
  RANGE *prev;              /* previous range information block in list  */
  RANGE *next;              /* next range information block in list      */
  RANGELIST *parent;        /* parent list                               */
  );
#define DUMP_RANGE dump_range
#ifdef DOS
RANGE *new_range (RANGE *r, INT lmin, DOUBLE zmin, DOUBLE zs, DOUBLE lbo
, DOUBLE dfo, DOUBLE ufo);
RANGE *delete_range (RANGE *r);
VOID dump_range (RANGE *r);
RANGE *update_range (RANGE *r, USERINFO *ui);
RANGELIST *append_range (RANGELIST *rl, RANGE *ra);
RANGE *get_range1 (RANGELIST *rl, INT n);
RANGE *get_range2 (RANGELIST *rl, DOUBLE z, SIGN sign);
DOUBLE get_zlevel (RANGELIST *rl, INT n, DOUBLE frac);
INT get_layer_number (RANGELIST *rl, DOUBLE z, SIGN sign);
#else
RANGE *new_range ();
RANGE *delete_range ();
VOID dump_range ();
RANGE *update_range ();
RANGELIST *append_range ();
RANGE *get_range1 ();
RANGE *get_range2 ();
DOUBLE get_zlevel ();
INT get_layer_number ();
#endif

/*******************************************************************************

RANGELIST:  List of range blocks.
*******************************************************************************/

RANGELIST
  (
  RANGE *first;             /* first range                               */
```

```
  RANGE *last;                /* last range                                  */

  };
#define DUMP_RANGELIST dump_rangelist
#ifdef DOS
RANGELIST *new_rangelist (RANGELIST *list);
RANGELIST *delete_rangelist (RANGELIST *list);
VOID dump_rangelist (RANGELIST *list);
RANGELIST *update_rangelist (RANGELIST *list, DOUBLE eps);
#else
RANGELIST *new_rangelist ();
RANGELIST *delete_rangelist ();
VOID dump_rangelist ();
RANGELIST *update_rangelist ();
#endif

/*****************************************************************************

CURE:  Specification for curing.
*****************************************************************************/

CURE
  {
  DOUBLE depth;               /* cure depth                                  */

  DOUBLE width;               /* cure width                                  */

  CURE *prev;                 /* previous cure information block in list     */

  CURE *next;                 /* next cure information block in list         */

  CURELIST *parent;           /* parent list                                 */

  };
#define DUMP_CURE dump_cure
#ifdef DOS
CURE *new_cure (CURE *cure, DOUBLE depth, DOUBLE width);
CURE *delete_cure (CURE *item);
VOID dump_cure (CURE *cure);
CURELIST *add_cure (CURELIST *list, CURE *cure);
DOUBLE get_cure_width (CURELIST *curelist, DOUBLE width);
#else
CURE *new_cure ();
CURE *delete_cure ();
VOID dump_cure ();
CURELIST *add_cure ();
DOUBLE get_cure_width ();
#endif

/*****************************************************************************

CURELIST:  List of cure information blocks.
```

```
*****************************************************************************/

CURELIST
  {
  CURE *first;            /* first cure information block                    */

  CURE *last;             /* last cure information block                     */

  };
#define DUMP_CURELIST dump_curelist
#ifdef DOS
CURELIST *new_curelist (CURELIST *list);
CURELIST *delete_curelist (CURELIST *list);
VOID dump_curelist (CURELIST *list);
CURELIST *read_curelist (STREAM *stream);
#else
CURELIST *new_curelist ();
CURELIST *delete_curelist ();
VOID dump_curelist ();
CURELIST *read_curelist ();
#endif


/*****************************************************************************

S2.C:  DOUBLE, DOUBLE2, FILE, STREAM, TRANSFORMATION
*****************************************************************************/


/*****************************************************************************

DOUBLE:  Double.
*****************************************************************************/

#define equal(x,y,eps) (fabs((x)-(y))<=(eps))
#define stoc(a,axis) ((a)/(axis==Z?ui->res.z:ui->res.xy))
#ifdef DOS
DOUBLE floor2 (DOUBLE a);
DOUBLE ceil2 (DOUBLE a);
DOUBLE sq (DOUBLE a);
DOUBLE round (DOUBLE a);
VOID transform_z_extents (DOUBLE *zmin, DOUBLE *zmax, TRANSFORMATION *f);
DOUBLE ctos (/*DOUBLE cad_value, INT axis, BOOLEAN layer_roundoff*/);
#else
DOUBLE floor2 ();
DOUBLE ceil2 ();
DOUBLE sq ();
DOUBLE round ();
VOID transform_z_extents ();
DOUBLE ctos ();
#endif
```

```
/*****************************************************************************

DOUBLE2:  Two doubles.
*****************************************************************************/

#define collinear(a,b,c,eps) !aside(a,b,c,eps)
#define eq2(a,b) ((a).x==(b).x && (a).y==(b).y)
#ifdef DOS
DOUBLE distsq (DOUBLE2 a, DOUBLE2 b);
DOUBLE2 round2 (DOUBLE2 a);
DOUBLE2 add (DOUBLE2 a, DOUBLE2 b);
DOUBLE2 neg (DOUBLE2 a);
DOUBLE2 sub (DOUBLE2 a, DOUBLE2 b);
DOUBLE2 mul (DOUBLE a, DOUBLE2 b);
DOUBLE2 dvd (DOUBLE2 a, DOUBLE b);
DOUBLE dot (DOUBLE2 a, DOUBLE2 b);
DOUBLE cross (DOUBLE2 a, DOUBLE2 b);
DOUBLE2 normalize (DOUBLE2 a);
DOUBLE2 average (DOUBLE2 a, DOUBLE2 b);
DOUBLE distplsq (DOUBLE2 o, DOUBLE2 a, DOUBLE2 b);
DOUBLE2 *nonparallel_intersection (DOUBLE2 a0, DOUBLE2 a1, DOUBLE2 b0
, DOUBLE2 b1, DOUBLE2 *o);
DOUBLE2 *parallel_intersection (DOUBLE2 a0, DOUBLE2 a1, DOUBLE2 b0
, DOUBLE2 b1, DOUBLE eps, DOUBLE2 *o0, DOUBLE2 *o1);
DOUBLE2 *twoline_intersection (DOUBLE2 a0, DOUBLE2 a1, DOUBLE2 b0
, DOUBLE2 b1, DOUBLE2 *o);
DOUBLE2 *ptline_intersection (DOUBLE2 a0, DOUBLE2 a1, DOUBLE2 b0
, DOUBLE2 b1, DOUBLE2 *o);
BOOLEAN between (DOUBLE2 a, DOUBLE2 o, DOUBLE2 b, DOUBLE eps);
BOOLEAN exbetween (DOUBLE2 a, DOUBLE2 o, DOUBLE2 b);
BOOLEAN inbetween (DOUBLE2 a, DOUBLE2 o, DOUBLE2 b);
SIGN aside (DOUBLE2 a, DOUBLE2 o, DOUBLE2 b, DOUBLE eps);
#else
DOUBLE distsq ();
DOUBLE2 round2 ();
DOUBLE2 add ();
DOUBLE2 neg ();
DOUBLE2 sub ();
DOUBLE2 mul ();
DOUBLE2 dvd ();
DOUBLE dot ();
DOUBLE cross ();
DOUBLE2 normalize ();
DOUBLE2 average ();
DOUBLE distplsq ();
DOUBLE2 *nonparallel_intersection ();
DOUBLE2 *parallel_intersection ();
DOUBLE2 *twoline_intersection ();
DOUBLE2 *ptline_intersection ();
BOOLEAN between ();
BOOLEAN exbetween ();
BOOLEAN inbetween ();
```

```
#endif

/*****************************************************************************

FILE:  File.
*****************************************************************************/

#ifdef DOS
INT fread_ (PTR buffer, INT size, INT count, FILE *file, BOOLEAN reverse);
INT fwrite_ (PTR buffer, INT size, INT count, FILE *file, BOOLEAN reverse);
#else
INT fread_ ();
INT fwrite_ ();
#endif

/*****************************************************************************

STREAM:  Input and output.
*****************************************************************************/

STREAM
  {
  CHAR *name;                  /* name of file                                */

  FILE *file;                  /* pointer to file                             */

  BOOLEAN read;                /* read? (not write?)                          */

  INT format;                  /* 0,ASCII,BINARY                              */

  INT byteorder;               /* byte order (0:low first, 1:low last)        */

  INT count;                   /* number of character written on line         */

  };
#define DUMP_STREAM dump_stream
#define DUMP dump
#ifdef DOS
STREAM *new_stream (STREAM *stream, CHAR *name, BOOLEAN read, INT format
 , INT byteorder);
STREAM *delete_stream (STREAM *stream);
VOID dump_stream (STREAM *stream);
STREAM *rewind_stream (STREAM *stream);
CHAR *read_word (STREAM *stream, CHAR *word);
CHAR *read_line (STREAM *stream, CHAR *line);
VOID dump (CHAR *s, ...);
VOID errexit (CHAR *s, ...);
#else
STREAM *new_stream ();
STREAM *delete_stream ();
VOID dump_stream ();
STREAM *rewind_stream ();
```

```
CHAR *read_line ();
VOID dump ();
VOID errexit ();
#endif

/*****************************************************************************

TRANSFORMATION:  Coordinate transformation.
*****************************************************************************/

TRANSFORMATION
  {
  BOOLEAN unit;                /* unit matrix?                                 */

  DOUBLE matrix[4][4];         /* matrix components                            */

  };
#define DUMP_TRANSFORMATION dump_transformation
#ifdef DOS
TRANSFORMATION *new_transformation (TRANSFORMATION *t);
TRANSFORMATION *delete_transformation (TRANSFORMATION *t);
VOID dump_transformation (TRANSFORMATION *t);
TRANSFORMATION *update_transformation (TRANSFORMATION *t,
  DOUBLE rx, DOUBLE ry, DOUBLE rz, DOUBLE sx, DOUBLE sy, DOUBLE sz,
  DOUBLE tx, DOUBLE ty, DOUBLE tz);
#else
TRANSFORMATION *new_transformation ();
TRANSFORMATION *delete_transformation ();
VOID dump_transformation ();
TRANSFORMATION *update_transformation ();
#endif

/*****************************************************************************

S3.C:  TRIANGLE, PART.
*****************************************************************************/

/*****************************************************************************

TRIANGLE:  Triangle.
*****************************************************************************/

TRIANGLE
  {
  FLOAT3 pt[3];                /* vertices                                     */

  SIGN orient;                 /* vertex order (1:ccw, -1:cw)                  */

  SIGN znorm;                  /* sign of z component of normal                */
```

```
  TRIANGLE *prev;              /* previous triangle in list                    */

  TRIANGLE *next;              /* next triangle in list                        */

  PART *parent;                /* parent list                                  */

  };
#define DUMP_TRIANGLE dump_triangle
#ifdef DOS
TRIANGLE *new_triangle (TRIANGLE *t);
TRIANGLE *delete_triangle (TRIANGLE *t);
VOID dump_triangle (TRIANGLE *t);
TRIANGLE *read_triangle (STREAM *stream, USERINFO *ui);
DOUBLE *read_ascii_triangle (STREAM *stream, DOUBLE o[3][3]);
DOUBLE *read_binary_triangle (STREAM *stream, DOUBLE o[3][3]);
DOUBLE *transform_triangle (DOUBLE o[3][3], TRANSFORMATION *f);
DOUBLE *reorder_coordinates (DOUBLE o[3][3], INT axis, BOOLEAN mirror
, SIGN *orient);
TRIANGLE *round_triangle (DOUBLE o[3][3]);
DOUBLE *reorder_vertices (DOUBLE o[3][3], SIGN *orient);
TRIANGLE *calculate_znormal (TRIANGLE *t);
TRIANGLE *single_slice_triangle (DOUBLE zmin, DOUBLE zmax, TRIANGLE *t
, SEGLIST *sl, INT where);
TRIANGLE *double_slice_triangle (DOUBLE zmin, DOUBLE zmax, TRIANGLE *t
, SEGLIST *sla, SEGLIST *slb);
DOUBLE2 *slice_triangle (DOUBLE z, TRIANGLE *t, BOOLEAN above, DOUBLE2 s[2]);
TRIANGLE *sort_triangles (TRIANGLE *t);
TRIANGLE *bisect_triangles (TRIANGLE *ta);
TRIANGLE *merge_triangles (TRIANGLE *ta, TRIANGLE *tb);
SIGN compare_triangles (TRIANGLE *ta, TRIANGLE *tb);
#else
TRIANGLE *new_triangle ();
TRIANGLE *delete_triangle ();
VOID dump_triangle ();
TRIANGLE *read_triangle ();
DOUBLE *read_ascii_triangle ();
DOUBLE *read_binary_triangle ();
DOUBLE *transform_triangle ();
DOUBLE *reorder_coordinates ();
TRIANGLE *round_triangle ();
DOUBLE *reorder_vertices ();
TRIANGLE *calculate_znormal ();
TRIANGLE *single_slice_triangle ();
TRIANGLE *double_slice_triangle ();
DOUBLE2 *slice_triangle ();
TRIANGLE *sort_triangles ();
TRIANGLE *bisect_triangles ();
TRIANGLE *merge_triangles ();
SIGN compare_triangles ();
#endif
```

```
/*****************************************************************************

PART:  Input part.
*****************************************************************************/

PART
  {
  INT type;                   /* input data type                            */

  STREAM *file;               /* internal data file                         */

  DOUBLE3 min;                /* minimum x,y,z                              */

  DOUBLE3 max;                /* maximum x,y,z                              */

  LONG triangles;             /* number of triangles                        */

  LONG downflats;             /* number of horizontal downfacing triangles  */

  LONG upflats;               /* number of horizontal upfacing triangles    */

  LONG downtilteds;         /* number of tilted downfacing triangles      */
  LONG uptilteds;           /* number of tilted upfacing triangles        */
  LONG verticals;               /* number of vertical triangles
*/
  INT layers;                 /* number of layers                           */

  INT missing;                /* number of layers with missing segments     */

  INT misoriented;            /* number of layers with misoriented segments */

  BOOLEAN inwindow;           /* any section of part within data window?    */

  TRIANGLE *tfirst;           /* initial triangle in list                   */

  TRIANGLE *tlast;            /* final triangle in list                     */

  POLYLIST *plfirst;          /* initial polylist in list                   */

  POLYLIST *pllast;           /* final polylist in list                     */

  };
#define DUMP_PART dump_part
#ifdef DOS
PART *new_part (PART *part, INT type, STREAM *file);
PART *delete_part (PART *part);
PART *delete_tripart (PART *part);
PART *delete_polypart (PART *part);
VOID dump_part (PART *part);
VOID dump_tripart (PART *part);
VOID dump_polypart (PART *part);
PART *get_part (STREAM *stream, USERINFO *ui);
```

```
PART *get_tripart (STREAM *stream, USERINFO *ui, DOUBLE zlow, DOUBLE zhigh);
PART *get_segpart (STREAM *stream, USERINFO *ui, DOUBLE zlow, DOUBLE zhigh);
PART *get_polypart (STREAM *stream, USERINFO *ui, DOUBLE zlow, DOUBLE zhigh);
POLYLIST *slice_part (INT layerno, DOUBLE zmin, DOUBLE zmax, PART *part
, USERINFO *ui);
POLYLIST *slice_tripart (INT layerno, DOUBLE zmin, DOUBLE zmax, PART *part
, USERINFO *ui);
POLYLIST *slice_polypart (INT layerno, DOUBLE zmin, DOUBLE zmax, PART *part
, USERINFO *ui);
PART *read_tripart (STREAM *stream, PART *part, DOUBLE z);
PART *write_tripart (STREAM *stream, PART *part);
PART *read_polypart (STREAM *stream, PART *part, DOUBLE z);
PART *append_triangle (PART *part, TRIANGLE *t);
PART *append_polylist (PART *part, POLYLIST *pl);
PART *sort_tripart (PART *part);
#else
PART *new_part ();
PART *delete_part ();
PART *delete_tripart ();
PART *delete_polypart ();
VOID dump_part ();
VOID dump_tripart ();
VOID dump_polypart ();
PART *get_part ();
PART *get_tripart ();
PART *get_segpart ();
PART *get_polypart ();
POLYLIST *slice_part ();
POLYLIST *slice_tripart ();
POLYLIST *slice_polypart ();
PART *read_tripart ();
PART *write_tripart ();
PART *read_polypart ();
PART *append_triangle ();
PART *append_polylist ();
PART *sort_tripart ();
#endif

/*****************************************************************************

S4.C:  SEGMENT, SEGLIST.
*****************************************************************************/

/*****************************************************************************

SEGMENT:  Segment of a polyline.
*****************************************************************************/

SEGMENT
  {
```

```
DOUBLE2 pt[3];          /* low, intermediate, and high pts of segment  */
FLAGS mark;             /* bit flags                                   */
INT orient;             /* orientation count (<0:down, >0:up)          */
INT biorient;           /* biorientation count (<0:cw, >0:ccw)         */
SEGMENT *prev;          /* previous segment in segment list            */
SEGMENT *next;          /* next segment in segment list                */
SEGLIST *parent;        /* parent list                                 */
};
#define DUMP_SEGMENT dump_segment
#define DUMP_SEGMENT_VIEW dump_segment_view
#ifdef DOS
SEGMENT *new_segment (SEGMENT *s1, DOUBLE x0, DOUBLE y0, DOUBLE x1, DOUBLE y1
, INT orient, INT biorient, FLAGS mark);
SEGMENT *new_segment1 (SEGMENT *sa, SEGMENT *sb);
SEGMENT *new_segment2 (SEGMENT *s, DOUBLE2 *tail, DOUBLE2 *head
, INT orient, INT biorient, FLAGS mark);
SEGMENT *renew_segment (SEGMENT *s);
SEGMENT *delete_segment (SEGMENT *s);
SEGMENT *deplete_segment (SEGMENT *s, INT orient);
VOID dump_segment (SEGMENT *s);
VOID dump_segment_view (SEGMENT *s);
SEGMENT *delink_segment (SEGMENT *s);
DOUBLE *transform_segment (DOUBLE o[2][2], TRANSFORMATION *f);
SEGMENT *insert_segments (SEGMENT *sa, SEGMENT *sb);
SEGMENT *preorder_segment (SEGMENT *sa, SEGMENT *sb);
SEGMENT *postorder_segment (SEGMENT *sa, SEGMENT *sb);
SEGMENT *split_segment (SEGMENT *sa, DOUBLE2 *o);
SEGMENT *combine_segments (SEGMENT *sa, SEGMENT *sb);
SEGMENT *sort_segments (SEGMENT *sa);
SEGMENT *bisect_segments (SEGMENT *sa);
SEGMENT *merge_segments (SEGMENT *sa, SEGMENT *sb);
SIGN compare_segments (SEGMENT *sa, SEGMENT *sb);
SIGN compare_segments1 (SEGMENT *sa, SEGMENT *sb);
SIGN compare_segments2 (SEGMENT *sa, SEGMENT *sb);
#else
SEGMENT *new_segment ();
SEGMENT *new_segment1 ();
SEGMENT *new_segment2 ();
SEGMENT *delete_segment ();
SEGMENT *deplete_segment ();
VOID dump_segment ();
VOID dump_segment_view ();
SEGMENT *delink_segment ();
DOUBLE *transform_segment ();
SEGMENT *insert_segments ();
```

```
SEGMENT *preorder_segment ();
SEGMENT *postorder_segment ();
SEGMENT *split_segment ();
SEGMENT *combine_segments ();
SEGMENT *sort_segments ();
SEGMENT *bisect_segments ();
SEGMENT *merge_segments ();
SIGN compare_segments ();
SIGN compare_segments1 ();
SIGN compare_segments2 ();
#endif

/*****************************************************************************

SEGLIST:  List of polygonal segments.
*****************************************************************************/

SEGLIST
  {
  SEGMENT *first;              /* first segment in list                         */

  SEGMENT *last;               /* last segment in list                          */

  INT layerno;                 /* layer number (starts at 1)                    */

  DOUBLE3 min;                 /* minimum x,y,z for layer                       */

  DOUBLE3 max;                 /* maximum x,y,z for layer                       */

  };
#define DUMP_SEGLIST dump_seglist
#define DUMP_SEGLIST_VIEW dump_seglist_view
#ifdef DOS
SEGLIST *new_seglist (SEGLIST *sl, INT layerno, DOUBLE zmin, DOUBLE zmax);
SEGLIST *new_seglist1 (SEGLIST *sla, SEGLIST *slb);
SEGLIST *new_seglist2 (SEGLIST *sl, POLYLIST *pl, DOUBLE2 rot, INT orient);
SEGLIST *delete_seglist (SEGLIST *sl);
VOID dump_seglist (SEGLIST *sl);
VOID dump_seglist_view (SEGLIST *sl);
SEGLIST *read_ascii_seglist (STREAM *stream);
SEGLIST *read_binary_seglist (STREAM *stream);
INT segment_count (SEGLIST *sl);
SEGLIST *round_seglist (SEGLIST *sl);
SEGLIST *transform_seglist (SEGLIST *sl, TRANSFORMATION *f);
SEGLIST *close_seglist (SEGLIST *sl);
SEGLIST *open_seglist (SEGLIST *sl);
SEGLIST *resort_seglist1 (SEGLIST *sla, SEGLIST *slb, SEGMENT **sy);
SEGLIST *resort_seglist2 (SEGLIST *sla, DOUBLE y, SEGMENT **sy);
SEGLIST *sort_seglist (SEGLIST *sl);
SEGLIST *condense_seglist (SEGLIST *sl);
SEGLIST *append_segment (SEGLIST *sl, SEGMENT *s, BOOLEAN update);
SEGLIST *append_polygon (SEGLIST *sl, ...);
```

```
SEGLIST *boolean_seglist (SEGLIST *sl, INT op, INT qvinf);
SEGLIST *reorient_seglist (SEGLIST *sl, BOOLEAN *misoriented);
SEGLIST *split_seglist (SEGLIST *sl);
SEGLIST *deflat_seglist (SEGLIST *sl);
SEGLIST *merge_seglists (SEGLIST *sla, SEGLIST *slb);
#else
SEGLIST *new_seglist ();
SEGLIST *new_seglist1 ();
SEGLIST *new_seglist2 ();
SEGLIST *delete_seglist ();
VOID dump_seglist ();
VOID dump_seglist_view ();
SEGLIST *read_ascii_seglist ();
SEGLIST *read_binary_seglist ();
INT segment_count ();
SEGLIST *round_seglist ();
SEGLIST *transform_seglist ();
SEGLIST *close_seglist ();
SEGLIST *open_seglist ();
SEGLIST *resort_seglist ();
SEGLIST *sort_seglist ();
SEGLIST *condense_seglist ();
SEGLIST *append_segment ();
SEGLIST *append_polygon ();
SEGLIST *boolean_seglist ();
SEGLIST *orient_seglist ();
SEGLIST *yorient_seglist ();
SEGLIST *deflat_seglist ();
SEGLIST *merge_seglists ();
#endif

/*****************************************************************************

S5.C:  VERTEX, POLYLINE, POLYLIST.
*****************************************************************************/

/*****************************************************************************

VERTEX:  Vertex of a polyline in 2 space.
*****************************************************************************/

VERTEX
  {
  DOUBLE2 pt;                /* value of vertex                              */

  FLAGS mark;                /* bit flags                                    */

  VERTEX *sibling;           /* link to uncompensated vertex                 */

  VERTEX *prev;              /* previous vertex in list                      */
```

```
  VERTEX *next;                /* next vertex in list                       */

  POLYLINE *parent;            /* parent list                               */

  };
#define DUMP_VERTEX dump_vertex
#ifdef DOS
VERTEX *new_vertex (VERTEX *v, DOUBLE x, DOUBLE y, VERTEX *sibling, FLAGS
mark);
VERTEX *new_vertex1 (VERTEX *va, VERTEX *vb);
VERTEX *new_vertex2 (VERTEX *v, DOUBLE2 *value, VERTEX *sibling, FLAGS mark);
VERTEX *delete_vertex (VERTEX *v);
VOID dump_vertex (VERTEX *v);
VERTEX *write_two_vertices (STREAM *stream, VERTEX *va, VERTEX *vb);
VERTEX *round_vertex (DOUBLE o[2]);
DOUBLE *transform_vertex (DOUBLE o[2], TRANSFORMATION *f);
POLYLINE *prepend_vertex (POLYLINE *p, VERTEX *v, BOOLEAN update);
POLYLINE *append_vertex (POLYLINE *p, VERTEX *v, BOOLEAN update);
VERTEX *insert_vertex (VERTEX *va, DOUBLE2 *o);
#else
VERTEX *new_vertex ();
VERTEX *new_vertex1 ();
VERTEX *new_vertex2 ();
VERTEX *delete_vertex ();
VOID dump_vertex ();
VERTEX *write_two_vertices ();
VERTEX *round_vertex ();
DOUBLE *transform_vertex ();
POLYLINE *prepend_vertex ();
POLYLINE *append_vertex ();
VERTEX *insert_vertex ();
#endif

/*******************************************************************************

POLYLINE:  Polyline or polygon.
*******************************************************************************/

POLYLINE
  {
  VERTEX *first;               /* first vertex of polyline                  */

  VERTEX *last;                /* last vertex of polyline                   */

  DOUBLE2 min;                 /* minimum x and y of polyline               */

  DOUBLE2 max;                 /* maximum x and y of polyline               */

  POLYLINE *prev;              /* previous polyline in list                 */

  POLYLINE *next;              /* next polyline in list                     */
```

```
  POLYLIST *parent;          /* parent list                                          */

  );
#define DUMP_POLYLINE dump_polyline
#ifdef DOS
POLYLINE *new_polyline (POLYLINE *p);
POLYLINE *new_polyline1 (POLYLINE *pa, POLYLINE *pb);
POLYLINE *new_polygon (POLYLINE *p, ...);
POLYLINE *delete_polyline (POLYLINE *p);
VOID dump_polyline (POLYLINE *p);
POLYLINE *write_polyline (STREAM *stream, POLYLINE *p, UCHAR type);
INT vertex_count (POLYLINE *p);
POLYLINE *close_polyline (POLYLINE *p);
POLYLINE *delink_polyline (POLYLINE *p);
POLYLINE *join_polylines (POLYLINE *pa, POLYLINE *pb, BOOLEAN ident);
POLYLINE *merge_polygons (POLYLINE *pa, POLYLINE *pb, VERTEX *va, VERTEX *vb);

POLYLINE *reverse_polyline (POLYLINE *p);
POLYLINE *adjust0_polygon (POLYLINE *pu, DOUBLE rb, DOUBLE maxadj
, BOOLEAN clip);
VOID adjust1_polygons (POLYLINE *pca, POLYLINE *pcb);
VOID adjust2_polygons (POLYLINE *pca, POLYLINE *pcb);
VOID adjust3_polygons (POLYLINE *pca, POLYLINE *pcb);
#else
POLYLINE *new_polyline ();
POLYLINE *new_polyline1 ();
POLYLINE *new_polygon ();
POLYLINE *delete_polyline ();
VOID dump_polyline ();
POLYLINE *write_polyline ();
INT vertex_count ();
POLYLINE *close_polyline ();
POLYLINE *delink_polyline ();
POLYLINE *join_polylines ();
POLYLINE *merge_polygons ();
POLYLINE *reverse_polyline ();
POLYLINE *adjust0_polygon ();
VOID adjust1_polygons ();
VOID adjust2_polygons ();
VOID adjust3_polygons ();
#endif

/*****************************************************************************

POLYLIST:  List of polylines or polygons.
*****************************************************************************/

POLYLIST
  {
  POLYLINE *first;           /* first polyline in list                               */
```

```
POLYLINE *last;             /* last polyline in list                    */
INT layerno;                /* absolute layer number or layer index     */
DOUBLE3 min;                /* minimum x,y,z for layer                  */
DOUBLE3 max;                /* maximum x,y,z for layer                  */
POLYLIST *prev;             /* previous polylist in list                */
POLYLIST *next;             /* next polylist in list                    */
PART *parent;               /* parent list                              */
 };
#define DUMP_POLYLIST dump_polylist
#ifdef DOS
POLYLIST *new_polylist (POLYLIST *pl, INT layerno, DOUBLE zmin, DOUBLE zmax);
POLYLIST *new_polylist1 (POLYLIST *pla, POLYLIST *plb);
POLYLIST *new_polylist2 (POLYLIST *pl, SEGLIST *sl, BOOLEAN ignorient
, BOOLEAN *misoriented, BOOLEAN closed);
POLYLIST *delete_polylist (POLYLIST *pl);
VOID dump_polylist (POLYLIST *pl);
POLYLIST *read_ascii_polylist (STREAM *stream);
POLYLIST *read_binary_polylist (STREAM *stream);
POLYLIST *write_polylist (STREAM *stream, POLYLIST *pl, UCHAR type);
POLYLIST *write_polylist2 (STREAM *stream, POLYLIST *pl);
INT polyline_count (POLYLIST *pl);
POLYLIST *round_polylist (POLYLIST *pl);
POLYLIST *close_polylist (POLYLIST *pl);
POLYLIST *append_polyline (POLYLIST *pl, POLYLINE *p);
POLYLIST *degap_polylist (POLYLIST *pl, BOOLEAN ignorient
, BOOLEAN *missing, BOOLEAN *misoriented);
POLYLIST *smooth_polylist (POLYLIST *pl, DOUBLE eps);
POLYLIST *compact_polylist (POLYLIST *pl);
POLYLIST *decouple_polylist (POLYLIST *pl, BOOLEAN reorient);
POLYLIST *boolean_polylists (POLYLIST *pla, POLYLIST *plb, INT op, INT qvinf);

POLYLIST *reorient_polylist (POLYLIST *pl, BOOLEAN *misoriented);
POLYLIST *union_polylists (POLYLIST *pla, POLYLIST *plb, FLAGS save);
POLYLIST *intersect_polylists (POLYLIST *pla, POLYLIST *plb, FLAGS save);
POLYLIST *difference_polylists (POLYLIST *pla, POLYLIST *plb, FLAGS save);
POLYLIST *dupmark_polylist (POLYLIST *pl);
POLYLIST *layer_compensate (POLYLIST *pl, DOUBLE r, INT alg, DOUBLE maxadj);
POLYLIST *fill_retract (POLYLIST *pl, DOUBLE r, INT alg, DOUBLE maxadj);
POLYLIST *adjust0_polylist (POLYLIST *plu, DOUBLE r, DOUBLE maxadj
, BOOLEAN clip);
POLYLIST *adjust1_polylist (POLYLIST *pl);
POLYLIST *adjust2_polylist (POLYLIST *pl);
POLYLIST *adjust3_polylist (POLYLIST *pl);
POLYLIST *merge_polylists (POLYLIST *pla, POLYLIST *plb);
#else
```

```
POLYLIST *new_polylist ();
POLYLIST *new_polylist1 ();
POLYLIST *new_polylist2 ();
POLYLIST *delete_polylist ();
VOID dump_polylist ();
POLYLIST *read_ascii_polylist ();
POLYLIST *read_binary_polylist ();
INT polyline_count ();
POLYLIST *round_polylist ();
POLYLIST *write_polylist ();
POLYLIST *write_polylist2 ();
POLYLIST *round_polylist ();
POLYLIST *close_polylist ();
POLYLIST *append_polyline ();
POLYLIST *degap_polylist ();
POLYLIST *smooth_polylist ();
POLYLIST *compact_polylist ();
POLYLIST *decouple_polylist ();
POLYLIST *boolean_polylists ();
POLYLIST *reorient_polylist ();
POLYLIST *union_polylists ();
POLYLIST *intersect_polylists ();
POLYLIST *difference_polylists ();
POLYLIST *dupmark_polylist ();
POLYLIST *layer_compensate ();
POLYLIST *fill_retract ();
POLYLIST *adjust0_polylist ();
POLYLIST *adjust1_polylist ();
POLYLIST *adjust2_polylist ();
POLYLIST *adjust3_polylist ();
POLYLIST *split_polylist ();
POLYLIST *prune_polylist ();
POLYLIST *merge_polylists ();
#endif

/*****************************************************************************

S6.C:  HATCHSEGMENT, HATCHLINE, HATCHLINELIST.
*****************************************************************************/

/*****************************************************************************

HATCHSEGMENT:  Hatch segment (component of hatch line).
*****************************************************************************/

HATCHSEGMENT
  {
  DOUBLE tail;              /* tail of hatch segment                         */
```

```
  DOUBLE head;                /* head of hatch segment                  */
  HATCHSEGMENT *prev;         /* previous hatch segment in list         */
  HATCHSEGMENT *next;         /* next hatch segment in list             */
  HATCHLINE *parent;          /* parent hatch line                      */
  };
#define DUMP_HATCHSEGMENT dump_hatchsegment
#ifdef DOS
HATCHSEGMENT *new_hatchsegment (HATCHSEGMENT *s, DOUBLE tail, DOUBLE head);
HATCHSEGMENT *delete_hatchsegment (HATCHSEGMENT *s);
VOID dump_hatchsegment (HATCHSEGMENT *s);
HATCHLINE *append_hatchsegment (HATCHLINE *hl, HATCHSEGMENT *s);
#else
HATCHSEGMENT *new_hatchsegment ();
HATCHSEGMENT *delete_hatchsegment ();
VOID dump_hatchsegment ();
HATCHLINE *append_hatchsegment ();
#endif
/*****************************************************************************

HATCHLINE:  Hatch line (list of hatch segments).
*****************************************************************************/

HATCHLINE
  {
  HATCHSEGMENT *first;        /* first hatch segment                    */
  HATCHSEGMENT *last;         /* last hatch segment                     */
  DOUBLE y;                   /* y value                                */
  HATCHLINE *prev;            /* previous hatch line in list            */
  HATCHLINE *next;            /* next hatch line in list                */
  HATCHLINELIST *parent;      /* parent list                            */
  };
#define DUMP_HATCHLINE dump_hatchline
#ifdef DOS
HATCHLINE *new_hatchline (HATCHLINE *hl, DOUBLE y, SEGLIST *sl, INT op);
HATCHLINE *delete_hatchline (HATCHLINE *hl);
VOID dump_hatchline (HATCHLINE *hl);
HATCHLINE *write_hatchline (STREAM *stream, HATCHLINE *hl
, DOUBLE2 rot, BOOLEAN reverse);
INT size_hatchline (HATCHLINE *hl);
HATCHLINELIST *append_hatchline (HATCHLINELIST *list, HATCHLINE *h);
```

```
#else
HATCHLINE *new_hatchline ();
HATCHLINE *delete_hatchline ();
VOID dump_hatchline ();
HATCHLINE *write_hatchline ();
INT size_hatchline ();
HATCHLINELIST *append_hatchline ();
#endif

/*****************************************************************************

HATCHLINELIST:  List of hatch lines.
*****************************************************************************/

HATCHLINELIST
  {
  DOUBLE2 rot;              /* unit hatch vector                              */

  DOUBLE spacing;           /* spacing of hatch lines                         */

  DOUBLE offset;            /* offset of hatch line pattern                   */

  HATCHLINE *first;         /* first hatch line in list                       */

  HATCHLINE *last;          /* first hatch line in list                       */

  };
#define DUMP_HATCHLINELIST dump_hatchlinelist
#ifdef DOS
HATCHLINELIST *new_hatchlinelist (HATCHLINELIST *hll, DOUBLE2 rot
, DOUBLE spacing, DOUBLE offset);
HATCHLINELIST *delete_hatchlinelist (HATCHLINELIST *hll);
VOID dump_hatchlinelist (HATCHLINELIST *hll);
HATCHLINELIST *hatch_polylist (POLYLIST *bndry, HATCHINFO *hi, INT op);
HATCHLINELIST *write_hatchlinelist (STREAM *stream,
  HATCHLINELIST *hll, UCHAR type);
INT size_hatchlinelist (HATCHLINELIST *hll);
HATCHLINELIST *hatch_seglist (SEGLIST *sl, INT op, DOUBLE2 rot
, DOUBLE spacing, DOUBLE offset);
#else
HATCHLINELIST *new_hatchlinelist ();
HATCHLINELIST *delete_hatchlinelist ();
VOID dump_hatchlinelist ();
HATCHLINELIST *hatch_polylist ();
HATCHLINELIST *write_hatchlinelist ();
INT size_hatchlinelist ();
HATCHLINELIST *hatch_seglist ();
#endif

/*****************************************************************************
```

```
GLOBAL VARIABLES:  global variables
*******************************************************************************/

#ifdef MAIN
MEMORY *memory=NULL;          /* bytes of memory dynamically allocated       */

USERINFO *ui=NULL;            /* user information                            */

TIMING *timing=NULL;          /* timing information                          */

INT DEBUG=0;                  /* debug flag                                  */

CHAR *block_type[15]={"L","LB","LH","","NFUH","NFUF","","NFDH","","FDB",""
,"FDF","FUB","","FUF"};       /* output vector block types                   */


#else
extern MEMORY *memory;
extern USERINFO *ui;
extern TIMING *timing;
extern CHAR *block_type[];
extern INT DEBUG;
#endif
```

```
#SCHLEISS.MAK compiles and links the UNIX ss files.

schleiss:  s0.o s1.o s2.o s3.o s4.o s5.o s6.o;\
  cc s0.o s1.o s2.o s3.o s4.o s5.o s6.o -lm -o schleiss

s0.o: s0.c s.h;\
  cc -DUNIX -float -signed -g -p  -DIRIS  -c   s0.c

s1.o: s1.c s.h;\
  cc -DUNIX -float -signed -g -p  -DIRIS  -c   s1.c

s2.o: s2.c s.h;\
  cc -DUNIX -float -signed -g -p  -DIRIS  -c   s2.c

s3.o: s3.c s.h;\
  cc -DUNIX -float -signed -g -p  -DIRIS  -c   s3.c

s4.o: s4.c s.h;\
  cc -DUNIX -float -signed -g -p  -DIRIS  -c   s4.c

s5.o: s5.c s.h;\
  cc -DUNIX -float -signed -g -p  -DIRIS  -c   s5.c

s6.o: s6.c s.h;\
  cc -DUNIX -float -signed -g -p  -DIRIS  -c   s6.c
```

```
make  -f schiris.mak
```

What is claimed is:

1. A method for forming a plurality of layer representations of layers of a three-dimensional object from layer boundary representations of those layers, for use in forming the object on a layer-by-layer basis, comprising the following steps:

supplying a layer boundary representation of a first layer spaced below a second layer;

supplying a layer boundary representation of the second layer;

forming a modified boundary representation for a first selected one of the first and second layers comprising forming a Boolean difference between the layer boundary representation of the first selected one and the layer boundary representation of a second selected one of the first and second layers different from the first selected one;

using the modified boundary representation in forming the layer representation of the first selected one; and supplying the layer representation for forming the object on a layer-by-layer basis.

2. The method of claim 1 wherein the object is formed from a material capable of physical transformation upon exposure to synergistic stimulation, comprising the steps of:

forming successive layers of material adjacent to a previously formed layer of the object in preparation for forming successive layers of the object;

selectively exposing the layers of material to the synergistic stimulation to form the layers of the object; and adhering the layers of the object together to form the object from a plurality of layers.

3. The method of claim 2 wherein the material is selected from the group consisting of powder material, liquid polymer material and sheet material.

4. A method for forming a plurality of layer representations of layers of a three-dimensional object from layer boundary representations of those layers, for use in forming the object on a layer-by-layer basis, comprising the following steps:

supplying a layer boundary representation of a first layer spaced below a second layer;

supplying a layer boundary representation of the second layer;

forming a modified boundary representation for a first selected one of the first and second layers comprising forming a Boolean intersection between the layer boundary representation of the first selected one and the layer boundary representation of a second selected one of the first and second layers different from the first selected one;

using the modified boundary representation in forming the layer representation of the first selected one; and supplying the layer representation for forming the object on a layer-by-layer basis.

5. The method of claim 4 wherein the object is formed from a material capable of physical transformation upon exposure to synergistic stimulation, comprising the steps of:

forming successive layers of material adjacent to a previously formed layer of the object in preparation for forming successive layers of the object;

selectively exposing the layers of material to the synergistic stimulation to form the layers of the object; and adhering the layers of the object together to form the object from a plurality of layers.

6. The method of claim 5 wherein the material is selected from the group consisting of powder material, liquid polymer material and sheet material.

7. A method for forming a plurality of layer representations of layers of a three-dimensional object from layer boundary representations of those layers, for use in forming the object on a layer-by-layer basis, comprising the following steps:

supplying a layer boundary representation of a first layer spaced below a second layer;

supplying a layer boundary representation of the second layer;

forming a modified boundary representation for a first selected one of the first and second layers comprising forming a Boolean union between the layer boundary representation of the first selected one and the layer boundary representation of a second selected one of the first and second layers different from the first selected one;

using the modified boundary representation in forming the layer representation of the first selected one; and supplying the layer representation for forming the object on a layer-by-layer basis.

8. The method of claim 7 wherein the object is formed from a material capable of physical transformation upon exposure to synergistic stimulation, comprising the steps of:

forming successive layers of material adjacent to a previously formed layer of the object in preparation for forming successive layers of the object;

selectively exposing the layers of material to the synergistic stimulation to form the layers of the object; and adhering the layers of the object together to form the object from a plurality of layers.

9. The method of claim 8 wherein the material is selected from the group consisting of powder material, liquid polymer material and sheet material.

10. A method for forming a plurality of layer representations of layers of a three-dimensional object from layer boundary representations of those layers, for use in forming the object on a layer-by-layer basis, comprising the following steps:

supplying a layer boundary representation of a first layer spaced below a second layer;

supplying a layer boundary representation of the second layer;

supplying a layer boundary representation of a third layer spaced above the second layer;

forming a non-outward-facing boundary representation for the second layer comprising forming a Boolean intersection between the layer boundary representation of the second layer and the layer boundary representation of a first selected one of the first and third layers to form an intermediate boundary, and forming a Boolean intersection between the intermediate boundary and a second selected one of the layer boundary representations of the first and third layers;

using the non-outward-facing boundary representation in forming the layer representation of the second layer; and supplying the layer representation for forming the object on a layer-by-layer basis.

11. The method of claim 10 wherein the object is formed from a material capable of physical transformation upon exposure to synergistic stimulation, comprising the steps of:

forming successive layers of material adjacent to a previously formed layer of the object in preparation for forming successive layers of the object;

selectively exposing the layers of material to the synergistic stimulation to form the layers of the object; and adhering the layers of the object together to form the object from a plurality of layers.

12. The method of claim 11 wherein the material is selected from the group consisting of powder material, liquid polymer material and sheet material.

13. An apparatus for forming a plurality of layer representations of layers of a three-dimensional object from layer boundary representations of those layers, for use in forming the object on a layer-by-layer basis, comprising:

means for supplying a layer boundary representation of a first layer spaced below a second layer;

means for supplying a layer boundary representation of the second layer;

means for forming a modified boundary representation for a first selected one of the first and second layers comprising means for forming a Boolean difference between the layer boundary representation of the first selected one and the layer boundary representation of a second selected one of the first and second layers different from the first selected one;

means for using the modified boundary representation in forming the layer representation of the first selected one; and means for supplying the layer representation for forming the object on a layer-by-layer basis.

14. The apparatus of claim 13 further comprising:

a source of synergistic stimulation;

means for forming successive layers of material adjacent to a previously formed layer of the object in preparation for forming successive layers of the object;

means for selectively exposing the layers of material to the synergistic stimulation to form the layers of the object; and means for adhering the layers of the object together to form the object from a plurality of layers.

15. The apparatus of claim 14 wherein the means for adhering the layers of the object together is the means for selectively exposing.

16. The apparatus of claim 15 wherein the material is selected from the group consisting of powder material, photopolymer material and sheet material, and wherein the source of synergistic stimulation is selected from the group consisting of sources of electromagnetic radiation and a reactive chemical agent.

17. An apparatus for forming a plurality of layer representations of layers of a three-dimensional object from layer boundary representations of those layers, for use in forming the object on a layer-by-layer basis, comprising:

means for supplying a layer boundary representation of a first layer spaced below a second layer;

means for supplying a layer boundary representation of the second layer;

means for forming a modified boundary representation for a first selected one of the first and second layers comprising means for forming a Boolean intersection between the layer boundary representation of the first selected one and the layer boundary representation of a second selected one of the first and second layers different from the first selected one;

means for using the modified boundary representation in forming the layer representation of the first selected one; and means for supplying the layer representation for forming the object on a layer-by-layer basis.

18. The apparatus of claim 17 further comprising:

a source of synergistic stimulation;

means for forming successive layers of material adjacent to a previously formed layer of the object in preparation for forming successive layers of the object;

means for selectively exposing the layers of the material to the synergistic stimulation to form the layers of the object;

means for adhering the layers of the object together to form the object from a plurality of layers.

19. The apparatus of claim 18 wherein the means for adhering the layers of the object together is the means for selectively exposing.

20. An apparatus for forming a plurality of layer representations of layers of a three-dimensional object from layer boundary representations of those layers, for use in forming the object on a layer-by-layer basis, comprising:

means for supplying a layer boundary representation of a first layer spaced below a second layer;

means for supplying a layer boundary representation of the second layer;

means for forming a modified boundary representation for a first selected one of the first and second layers comprising means for forming a Boolean union between the layer boundary representation of the first selected one and the layer boundary representation of a second selected one of the first and second layers different from the first selected one;

means for using the modified boundary representation in forming the layer representation of the first selected one; and means for supplying the layer representation for forming the object on a layer-by-layer basis.

21. The apparatus of claim 20 further comprising:

a source of synergistic stimulation;

means for forming successive layers of material adjacent to a previously formed layer of the object in preparation for forming successive layers of the object;

means for selectively exposing the layers of material to the synergistic stimulation to form the layers of the object;

means for adhering the layers of the object together to form the object from a plurality of layers.

22. The apparatus of claim 21 wherein the means for adhering the layers of the object together is the means for selectively exposing.

23. The apparatus of claim 22 wherein the material is selected from the group consisting of powder material, photopolymer material and sheet material, and the source of synergistic stimulation is selected from the group consisting of sources of electromagnetic radiation and a reactive chemical agent.

24. An apparatus for forming a plurality of layer representations of layers of a three-dimensional object from layer boundary representations of those layers, for use in forming the object on a layer-by-layer basis, comprising:

means for supplying a layer boundary representation of a first layer spaced below a second layer;

means for supplying a layer boundary representation of the second layer;

means for supplying a layer boundary representation of a third layer spaced above the second layer;

means for forming a non-outward-facing boundary representation for the second layer comprising means for forming a Boolean intersection between the layer boundary representation of the second layer and the layer boundary representation of a first selected one of the first and third layers to form an intermediate boundary, and means for forming a Boolean intersection between the intermediate boundary and a second selected one of the layer boundary representations of the first and third layers;

means for using the non-outward-facing boundary representation in forming the layer representation of the second layer; and means for supplying the layer representation for forming the object on a layer-by-layer basis.

25. The apparatus of claim 24 further comprising:

a source of synergistic stimulation;

means for forming successive layers of material adjacent to a previously formed layer of the object in preparation for forming successive layers of the object;

means for selectively exposing the layers of material to the synergistic stimulation to form the layers of the object; and means for adhering the layers of the object together to form the object from a plurality of layers.

26. The apparatus of claim 25 wherein the means for adhering the layers of the object together is the means for selectively exposing.

27. The apparatus of claim 26 wherein the material is selected from the group consisting of powder material, photopolymer material and sheet material, and the source of synergistic stimulation is selected from the group consisting of sources of electromagnetic radiation and a reactive chemical agent.

* * * * *

UNITED STATES PATENT AND TRADEMARK OFFICE
CERTIFICATE OF CORRECTION

PATENT NO. : 5,481,470
DATED : Jan. 2, 1996
INVENTOR(S) : Snead, et al.

It is certified that error appears in the above-indentified patent and that said Letters Patent is hereby corrected as shown below:

IN THE DRAWINGS

Figure 1A:
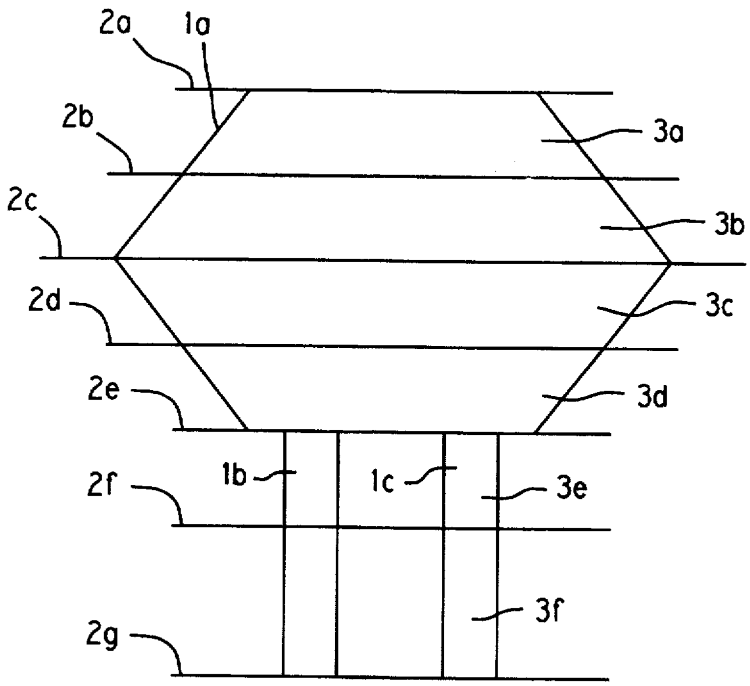
FIGS. 1a–1b illustrate the vertical misregistration problem.
Figure 1B:
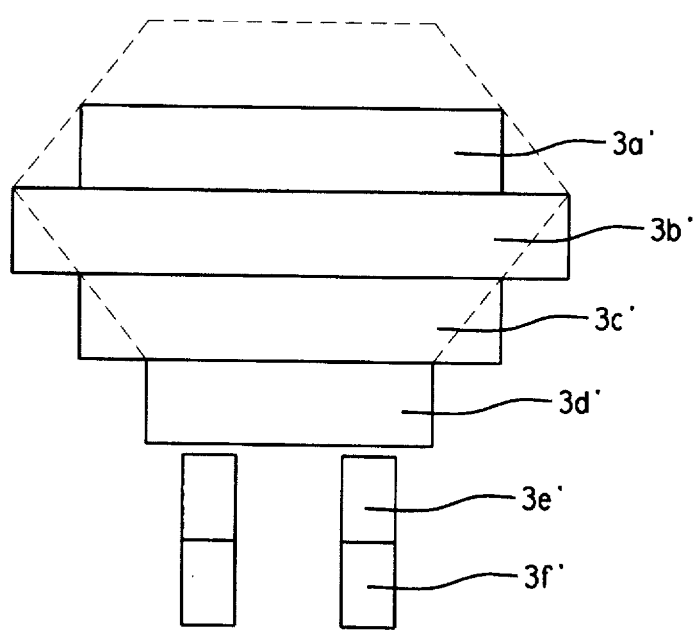
Figure 2:
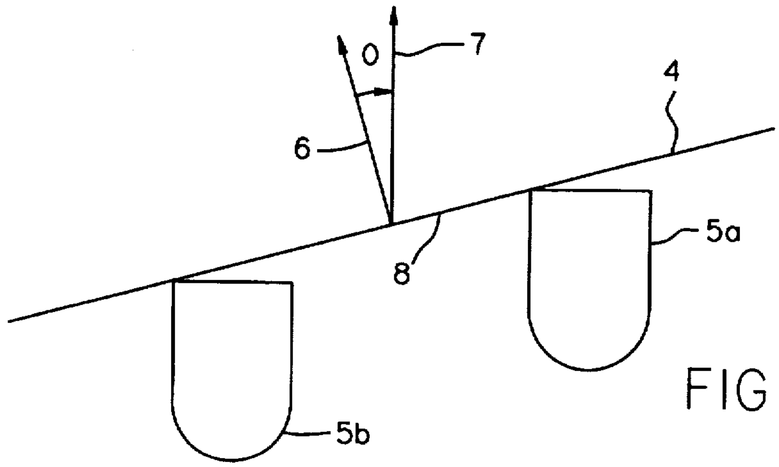
FIGS. 2–3 illustrates the use of the MSA in generating near-flat skin.
Figure 3:
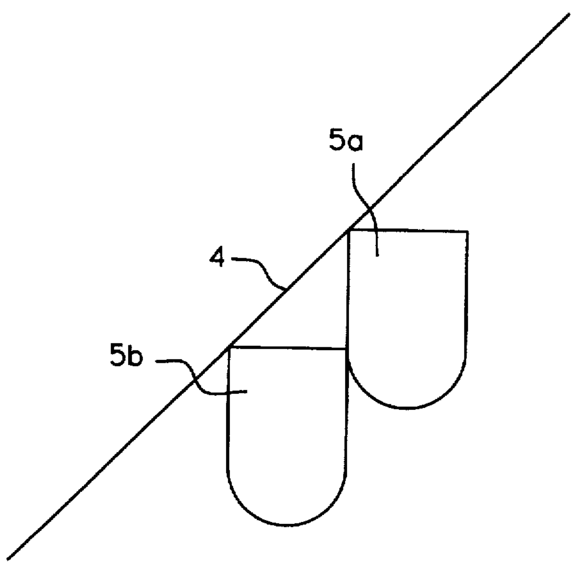

Sheet 2, please replace Fig. 2 as follows:

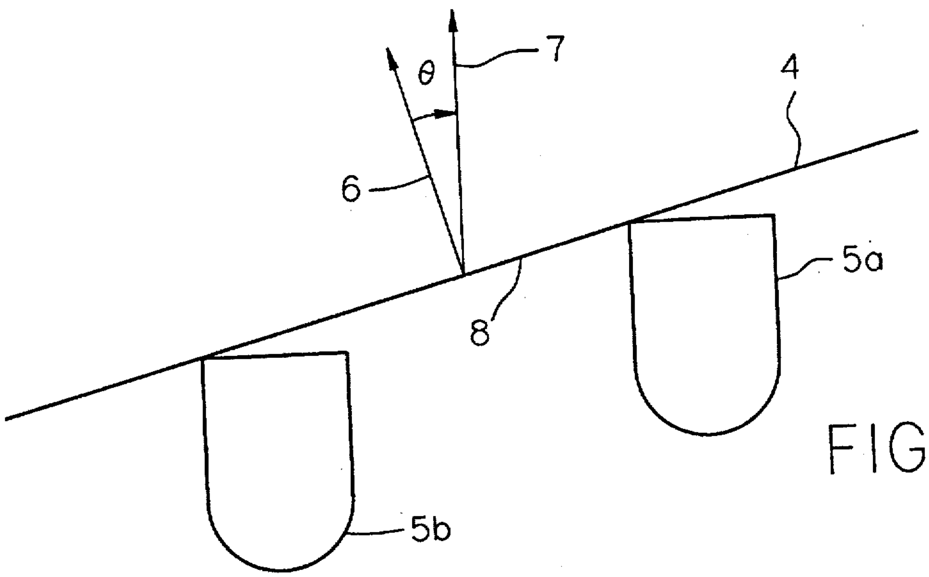

FIG. 2

UNITED STATES PATENT AND TRADEMARK OFFICE

CERTIFICATE OF CORRECTION

PATENT NO. : 5,481,470
DATED : Jan. 2, 1996
INVENTOR(S) : Snead, et al.

It is certified that error appears in the above-indentified patent and that said Letters Patent is hereby corrected as shown below:

IN THE DRAWINGS

Sheet 3, Fig. 5a, Box 11, change the text to read --CLASSIFY TRIANGLES AS " +", AND/OR, "-", OR "NEITHER"--.

Figure 5B:
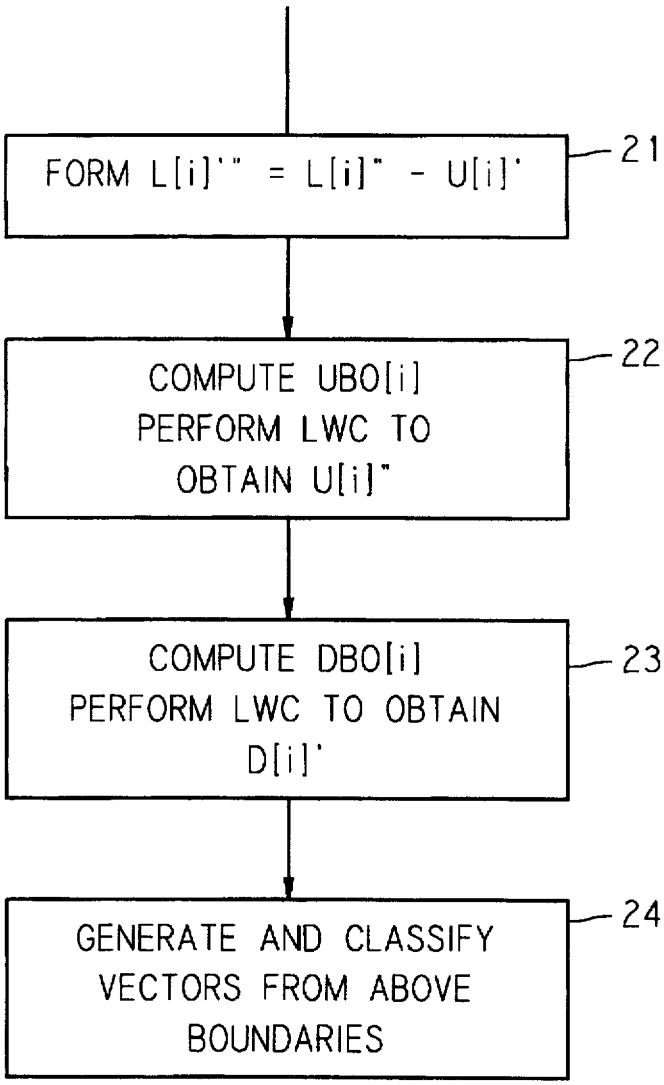

Sheet 4, Fig. 5b, Box 21 change "L[i]' " " to --L[i]'''--.

Sheet 9, Fig. 16, Box 52, change "MINIMUN" to --MINIMUM--.

Sheet 9, Fig. 16, Box 60, change "OBTAINING" to --RETAINING--.

Signed and Sealed this

Eighth Day of July, 1997

Attest:

BRUCE LEHMAN

Attesting Officer

Commissioner of Patents and Trademarks

UNITED STATES PATENT AND TRADEMARK OFFICE

CERTIFICATE OF CORRECTION

PATENT NO. : 5,481,470
DATED : Jan. 2, 1996
INVENTOR(S) : Snead, et al.

It is certified that error appears in the above-indentified patent and that said Letters Patent is hereby corrected as shown below:

IN THE DRAWINGS

Sheet 5, please replace Fig. 7 as follows:

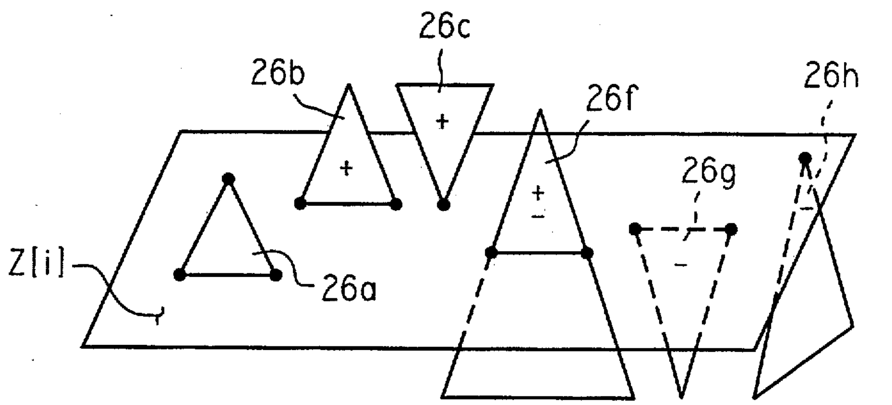

FIG. 7

UNITED STATES PATENT AND TRADEMARK OFFICE

CERTIFICATE OF CORRECTION

PATENT NO. : 5,481,470

DATED : Jan. 2, 1996

INVENTOR(S) : Snead, et al.

It is certified that error appears in the above-indentified patent and that said Letters Patent is hereby corrected as shown below:

IN THE DRAWINGS

Sheet 7, please replace Fig. 11 as follows:

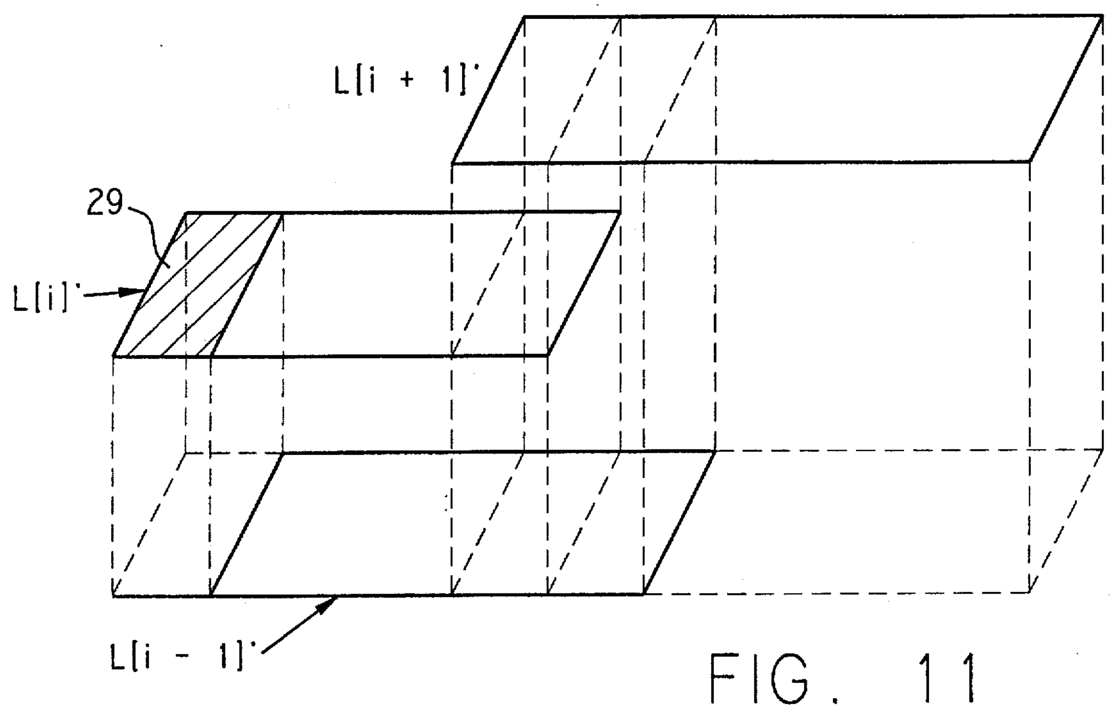

FIG. 11

UNITED STATES PATENT AND TRADEMARK OFFICE

CERTIFICATE OF CORRECTION

PATENT NO. : 5,481,470

DATED : Jan. 2, 1996

INVENTOR(S) : Snead, et al.

It is certified that error appears in the above-indentified patent and that said Letters Patent is hereby corrected as shown below:

IN THE DRAWINGS

Sheet 10, please replace Fig. 18 as follows:

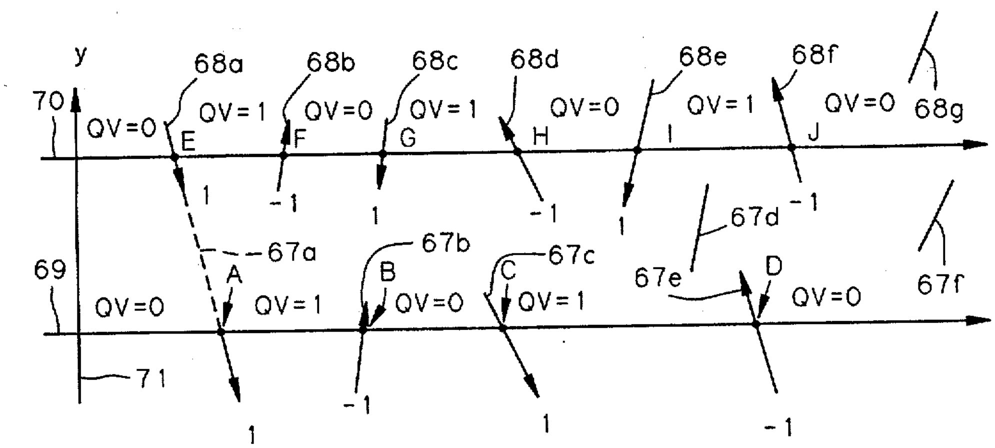

FIG. 18

UNITED STATES PATENT AND TRADEMARK OFFICE

CERTIFICATE OF CORRECTION

PATENT NO. : 5,481,470

DATED : Jan. 2, 1996

INVENTOR(S) : Snead, et al.

It is certified that error appears in the above-indentified patent and that said Letters Patent is hereby corrected as shown below:

IN THE DRAWINGS

Sheet 23, please replace Fig. 30b as follows:

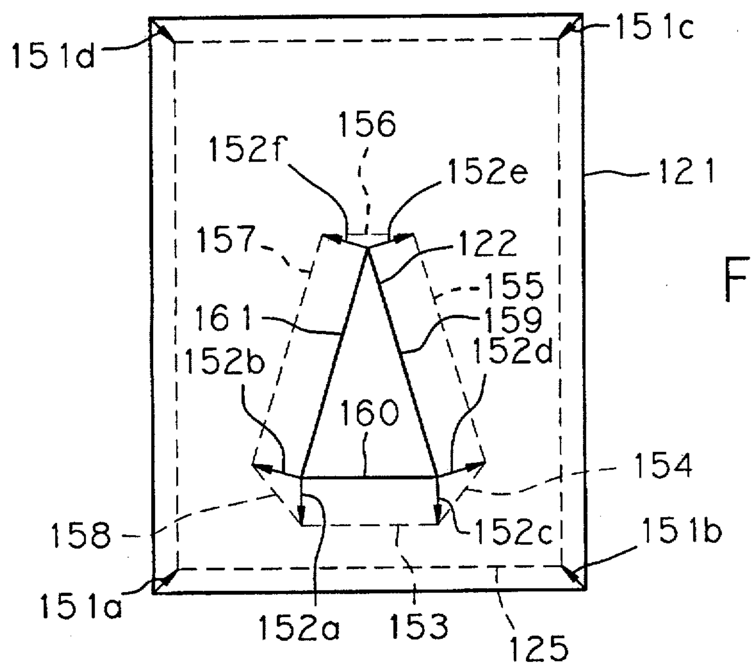

FIG. 30b

UNITED STATES PATENT AND TRADEMARK OFFICE
CERTIFICATE OF CORRECTION

PATENT NO. : 5,481,470

DATED : Jan. 2, 1996

INVENTOR(S) : Snead, et al.

It is certified that error appears in the above-indentified patent and that said Letters Patent is hereby corrected as shown below:

IN THE DRAWINGS

Sheet 24, please replace Fig. 30c as follows:

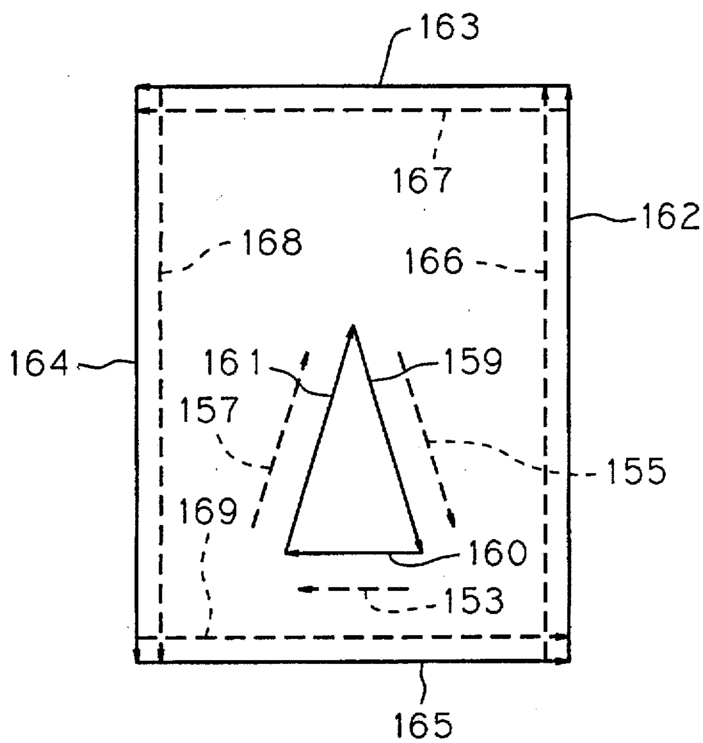

FIG. 30c